US008274841B2

(12) United States Patent
Shimano et al.

(10) Patent No.: US 8,274,841 B2
(45) Date of Patent: Sep. 25, 2012

(54) SEMICONDUCTOR SIGNAL PROCESSING DEVICE

(75) Inventors: Hiroki Shimano, Tokyo (JP); Kazutami Arimoto, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/354,028

(22) Filed: Jan. 19, 2012

(65) Prior Publication Data

US 2012/0113731 A1 May 10, 2012

Related U.S. Application Data

(62) Division of application No. 12/390,213, filed on Feb. 20, 2009, now Pat. No. 8,130,582.

(30) Foreign Application Priority Data

Feb. 20, 2008 (JP) ................................ 2008-039107
Feb. 29, 2008 (JP) ................................ 2008-050484
Mar. 4, 2008 (JP) ................................ 2008-053868
Mar. 27, 2008 (JP) ................................ 2008-084276
Mar. 28, 2008 (JP) ................................ 2008-087776
Mar. 28, 2008 (JP) ................................ 2008-087777
Sep. 16, 2008 (JP) ................................ 2008-236668

(51) Int. Cl.
*G11C 7/00* (2006.01)
*G11C 7/22* (2006.01)

(52) U.S. Cl. ....... 365/189.011; 365/189.15; 365/189.16; 365/230.03

(58) Field of Classification Search ........... 365/189.011, 365/230.03, 189.15, 189.16
See application file for complete search history.

(56) References Cited

U.S. PATENT DOCUMENTS 6,275,407 B1 8/2001 Otsuka
6,523,136 B1 2/2003 Higashida
7,394,717 B2 * 7/2008 Hidaka .................. 365/230.03
7,562,198 B2 7/2009 Noda et al.
7,724,584 B2 5/2010 Lee
7,738,312 B2 * 6/2010 Shimano et al. ......... 365/230.05

(Continued)

FOREIGN PATENT DOCUMENTS

JP 07-182874 7/1995

(Continued)

OTHER PUBLICATIONS

Arimoto, K., et al., "A Configurable Enhanced T$^2$RAM Macro for System-Level Power Management Unified Memory", 2006 Symposium on VLSI Circuits Digest of Technical Papers, Jun. 2006, IEEE.

(Continued)

*Primary Examiner* — Toan Le

(74) *Attorney, Agent, or Firm* — McDermott Will & Emery LLP

(57) ABSTRACT

A unit operator cell includes a plurality of SOI (Silicon on Insulator) transistors, write data is stored in a body region of at least two SOI transistors, and the storage SOI transistors are connected in series with each other to a read port or each of the storage SOI transistors is singly connected to the read port. Therefore, an AND operation result or a NOT operation result of data stored in the unit operator cells can be obtained, and operation processing can be performed only by writing and reading data. A semiconductor signal processing device that can perform logic operation processing and arithmetic operation processing at high speed is implemented with low power consumption and a small occupation area.

10 Claims, 151 Drawing Sheets

U.S. PATENT DOCUMENTS

| | | | | |
|---|---|---|---|---|
| 8,130,582 | B2 * | 3/2012 | Shimano et al. | 365/210.1 |

FOREIGN PATENT DOCUMENTS

| | | |
|---|---|---|
| JP | 07-249290 | 9/1995 |
| JP | 08-031168 | 2/1996 |
| JP | 2000-284943 | 10/2000 |
| JP | 2004-264896 | 9/2004 |
| JP | 2006-099232 | 4/2006 |
| JP | 2007-213747 | 8/2007 |
| JP | 2007-226944 | 9/2007 |

OTHER PUBLICATIONS

Tsuji, T., et al., "A 1.2V 1Mbit Embedded MRAM Core with Folded Bit-Lane Array Architecture", 2004 Symposium on VLSI Circuits Digest of Technical Papers, pp. 450-453, Jun. 2004, IEEE.

* cited by examiner

| NQ1 | NQ2 | SOUT | OPERATION |
|---|---|---|---|
| 0 | 0 | 0 | AND |
| 0 | 1 | 0 | |
| 1 | 0 | 0 | |
| 1 | 1 | 1 | |

| NQ1 | SOUT | OPERATION |
|---|---|---|
| 0 | 0 | BUFFER |
| 1 | 1 | |

→ WRITE DATA INVERSION
↓
NOT

| A | B | Cin | SUM | |
|---|---|---|---|---|
| 0 | 0 | 0 | 0 | |
| 0 | 1 | 0 | 1 | /A・B |
| 1 | 1 | 0 | 0 | |
| 1 | 0 | 0 | 1 | A・/B |
| 0 | 0 | 1 | 1 | /A・/B |
| 0 | 1 | 1 | 0 | |
| 1 | 1 | 1 | 1 | A・B |
| 1 | 0 | 1 | 0 | |

| A | B | Cin | CY | |
|---|---|---|---|---|
| 0 | 0 | 0 | 0 | |
| 0 | 1 | 0 | 0 | |
| 1 | 1 | 0 | 1 | A•B |
| 1 | 0 | 0 | 0 | |
| 0 | 0 | 1 | 0 | |
| 0 | 1 | 1 | 1 | /A•B |
| 1 | 1 | 1 | 1 | A•B |
| 1 | 0 | 1 | 1 | A•/B |

FIG.31

| A | B | BRin | DIFF | |
|---|---|---|---|---|
| 0 | 0 | 0 | 0 | |
| 0 | 1 | 0 | 1 | /A•B |
| 1 | 1 | 0 | 0 | |
| 1 | 0 | 0 | 1 | A•/B |
| 0 | 0 | 1 | 1 | /A•/B |
| 0 | 1 | 1 | 0 | |
| 1 | 1 | 1 | 1 | A•B |
| 1 | 0 | 1 | 0 | |

| A | B | BRin | BRout | |
|---|---|---|---|---|
| 0 | 0 | 0 | 0 | |
| 0 | 1 | 0 | 1 | /A•B |
| 1 | 1 | 0 | 0 | |
| 1 | 0 | 0 | 0 | |
| 0 | 0 | 1 | 1 | /A•/B |
| 0 | 1 | 1 | 1 | /A•B |
| 1 | 1 | 1 | 1 | A•B |
| 1 | 0 | 1 | 0 | |

: FIX CARRY ORDER

FIG.74

| | | | | | | | | |
|---|---|---|---|---|---|---|---|---|
| | | | | X<3> | X<2> | X<1> | X<0> | MULTIPLICAND |
| | | | | Y<3> | Y<2> | Y<1> | Y<0> | MULTIPLIER |
| | | | | X<3>Y<0> | X<2>Y<0> | X<1>Y<0> | X<0>Y<0> | PP0 |
| | | | X<3>Y<1> | X<2>Y<1> | X<1>Y<1> | X<0>Y<1> | | PP1 |
| | | X<3>Y<2> | X<2>Y<2> | X<1>Y<2> | X<0>Y<2> | | | PP2 |
| | X<3>Y<3> | X<2>Y<3> | X<1>Y<3> | X<0>Y<3> | | | | PP3 |
| P<7> | P<6> | P<5> | P<4> | P<3> | P<2> | P<1> | P<0> | MULTIPLICATION |

MINUS-ONE-BIT SHIFT:
:OARA
:OARF
:4UOE
LPC0
LPC1
LPC2
LPC3
LPC4
LPC5
LPC6
LPC7
FDC0
FDC1
FDC2
FDC3
FDC4
FDC5
FDC6
FDC7
AND CELL
FADD CELL
50
450
PP0
PP1
PP0 +PP1
SAME COLUMN

MINUS-ONE-BIT SHIFT :

FIG.91
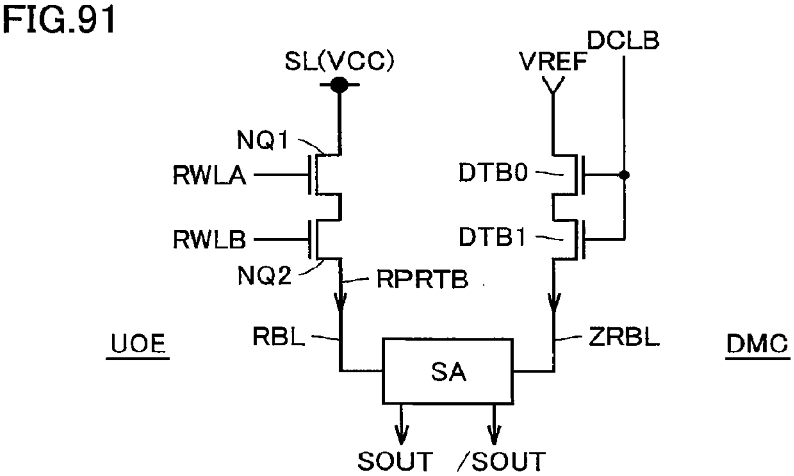
FIG.92
| STATE | NQ1 | NQ2 | SENSE AMPLIFIER OUTPUT VREF1 |
|---|---|---|---|
| S(0,0) | 0 | 0 | 0 |
| S(1,0) | 1 | 0 | 0 |
| S(0,1) | 0 | 1 | 0 |
| S(1,1) | 1 | 1 | 1 |
FIG.93
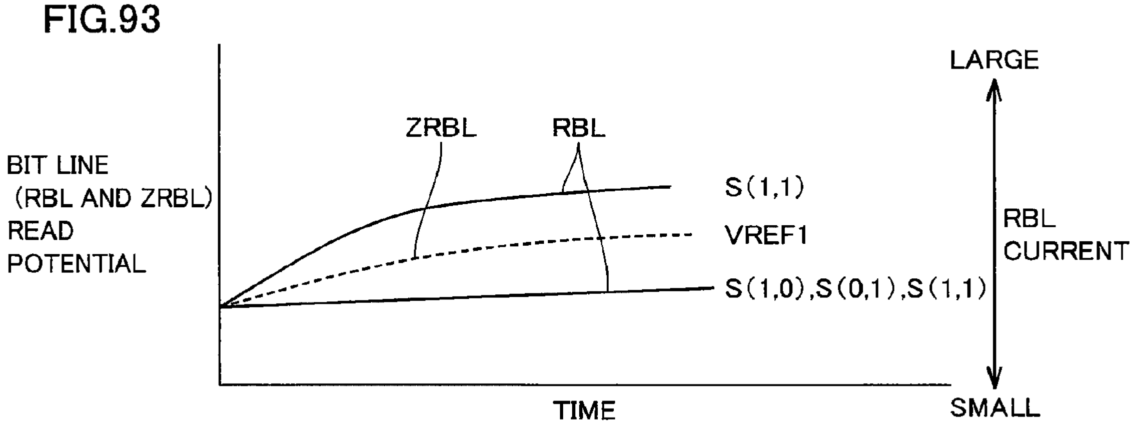

FIG.94
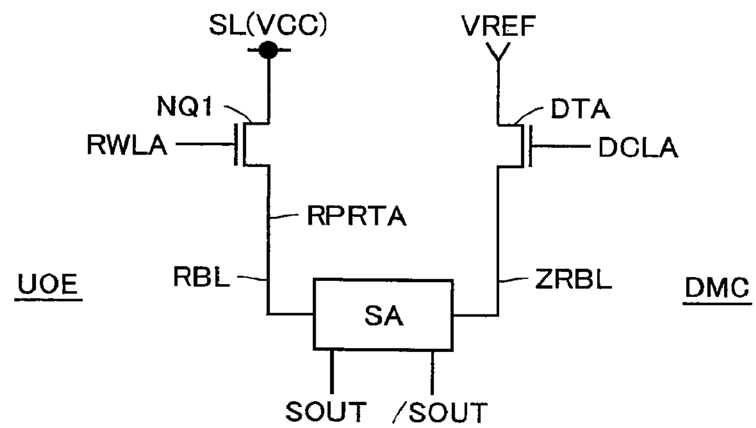
FIG.95
| STATE | NQ1 | SENSE AMPLIFIER OUTPUT |
|---|---|---|
| | | VREF1 |
| S(0) | 0 | 0 |
| S(1) | 1 | 1 |
FIG.96
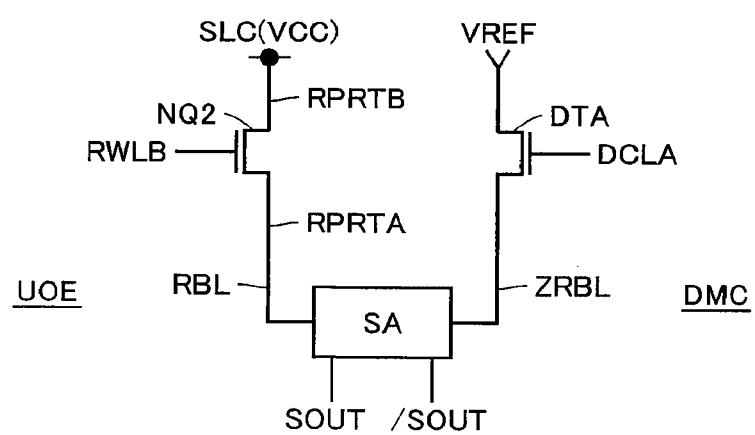

| STATE | NQ2 | SENSE AMPLIFIER OUTPUT |
|---|---|---|
| | | VREF1 |
| S(0) | 0 | 0 |
| S(1) | 1 | 1 |

| STATE | NQ1 (UOEI) | NQ2 (UOEJ) | SENSE AMPLIFIER OUTPUT | |
|---|---|---|---|---|
| | | | VREF1 | VREF2 |
| S(0,0) | 0 | 0 | 0 | 0 |
| S(1,0) | 1 | 0 | 1 | 0 |
| S(0,1) | 0 | 1 | 1 | 0 |
| S(1,1) | 1 | 1 | 1 | 1 |

FIG.100
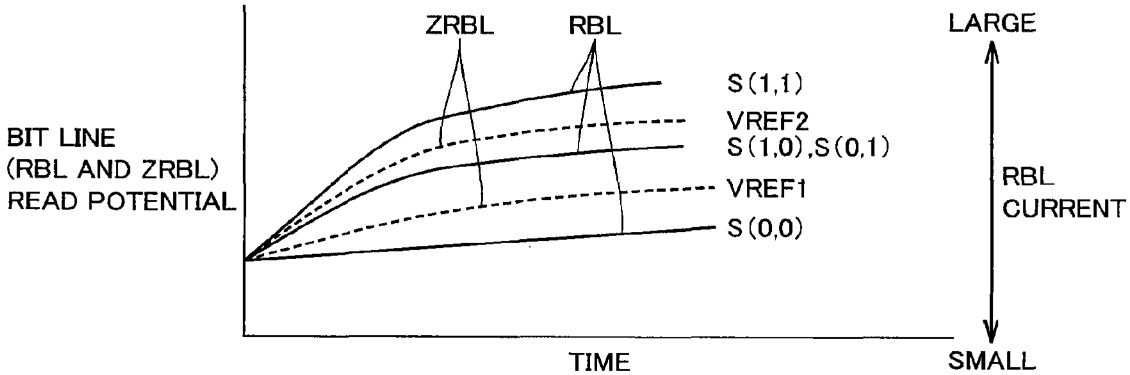
FIG.101
| STATE | NQ1 (UOEI) | NQ1 (UOEJ) | NQ1 (UOEK) | SENSE AMPLIFIER OUTPUT | |
|---|---|---|---|---|---|
| | | | | VREF1 | VREF2 |
| S(0,0,0) | 0 | 0 | 0 | 0 | 0 |
| S(1,0,0) | 1 | 0 | 0 | 1 | 0 |
| S(0,1,0) | 0 | 1 | 0 | 1 | 0 |
| S(1,1,0) | 1 | 1 | 0 | 1 | 0 |
| S(0,0,1) | 0 | 0 | 1 | 1 | 0 |
| S(1,0,1) | 1 | 0 | 1 | 1 | 0 |
| S(0,1,1) | 0 | 1 | 1 | 1 | 0 |
| S(1,1,1) | 1 | 1 | 1 | 1 | 1 |
FIG.102
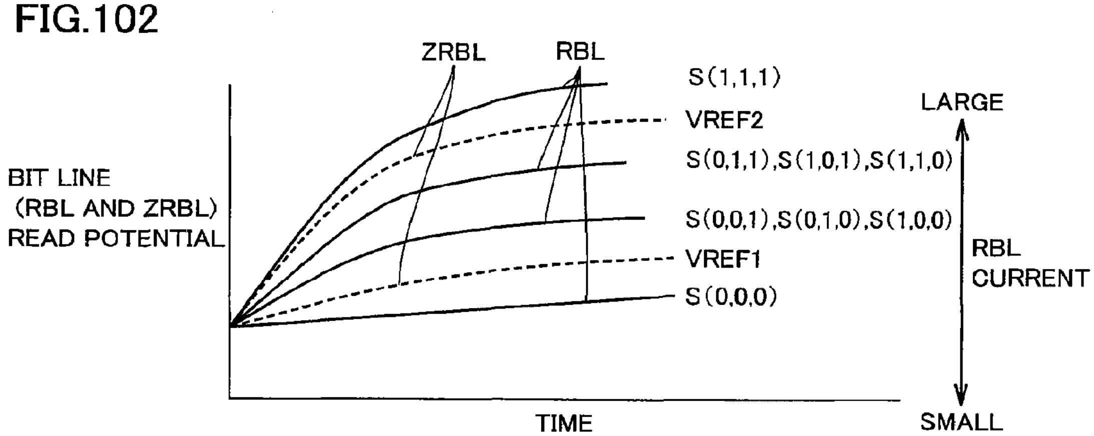

:OUTPUT MAY BE TAKEN OUT
FROM DRAINS OF PP3 AND PP4

FIG.107

| STATE | NQ1 (UOEI0) | NQ1 (UOEJ0) | SENSE AMPLIFIER OUTPUT | | AND GATE OUTPUT |
|---|---|---|---|---|---|
| | | | VREF1 | VREF2 | |
| | | | SAL1 | ZSAL2 | SAL1&ZSAL2 |
| S(0,0) | 0 | 0 | 0 | 1 | 0 |
| S(1,0) | 1 | 0 | 1 | 1 | 1 |
| S(0,1) | 0 | 1 | 1 | 1 | 1 |
| S(1,1) | 1 | 1 | 1 | 0 | 0 |

FIG.114
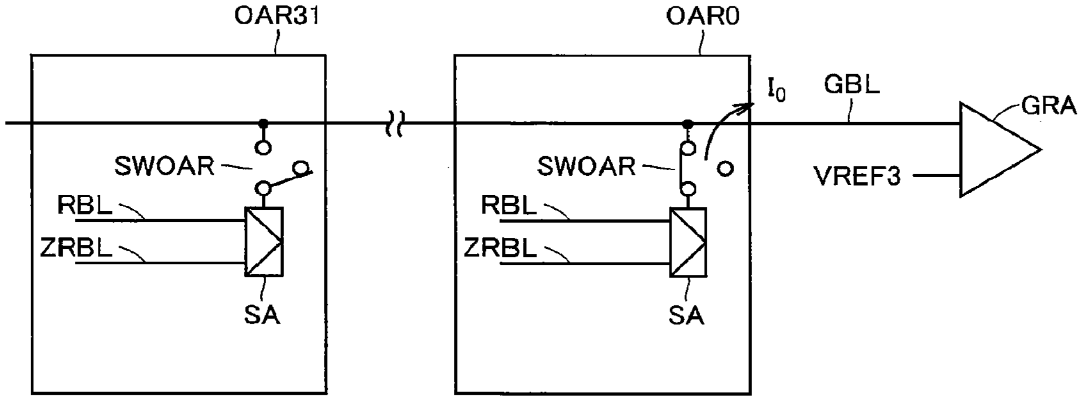
FIG.115
| STATE | SA(#i) OUTPUT |
|---|---|
| ST1 | 1 |
| ST2 | 0 |
FIG.116
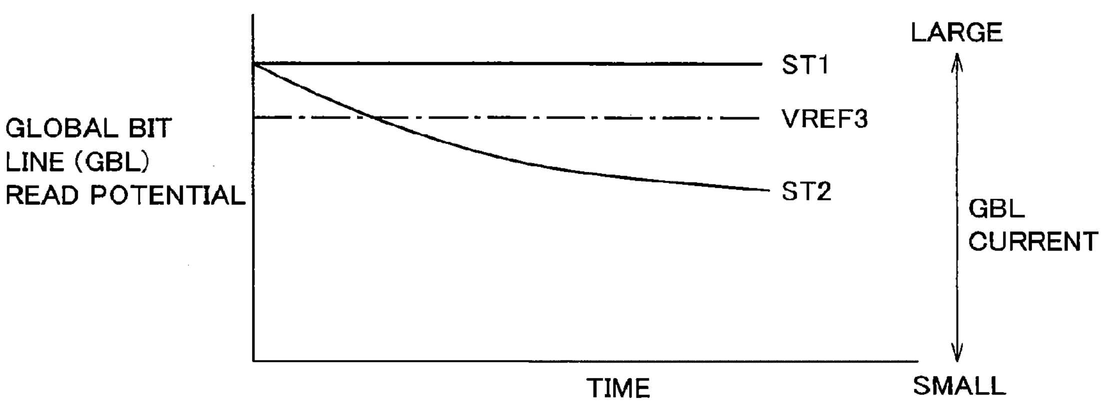

FIG.117
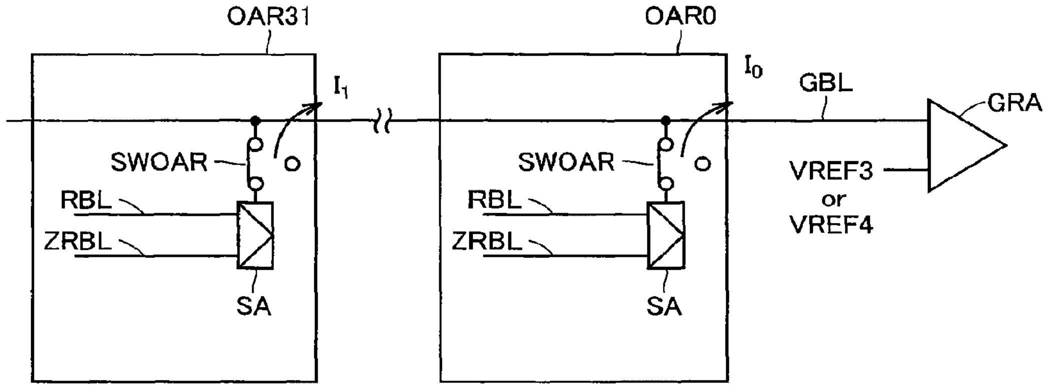
FIG.118
| STATE | SENSE AMPLIFIER OUTPUT (OAR0) | SENSE AMPLIFIER OUTPUT (OAR31) | COMPARISON AND AMPLIFICATION CIRCUIT OUTPUT | |
|---|---|---|---|---|
| | | | VREF3 | VREF4 |
| ST1 | 1 | 1 | 1 | 1 |
| ST2 | 0 | 1 | 0 | 1 |
| ST3 | 1 | 0 | 0 | 1 |
| ST4 | 0 | 0 | 0 | 0 |
FIG.119
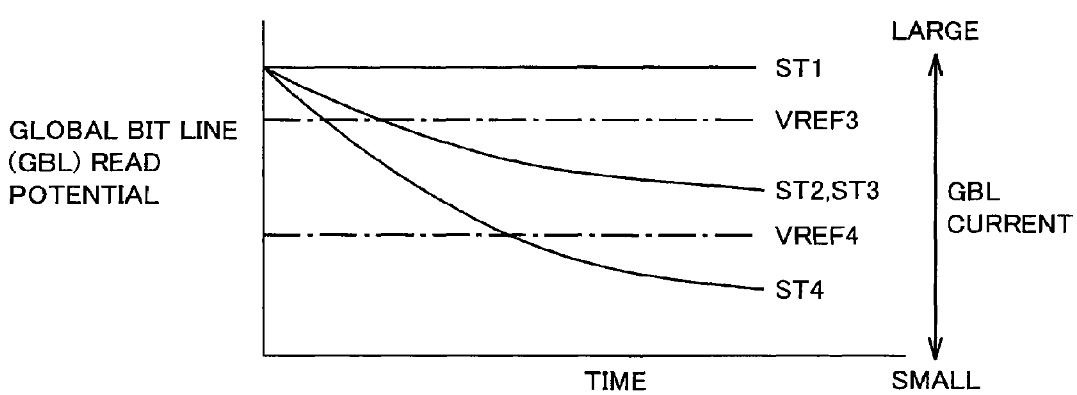

| INPUT | OUTPUT | | | | | |
|---|---|---|---|---|---|---|
| ADDRESS | DATA BIT | FLAG BIT | | | | |
| add | <7:0> | A | B | C | D |
| 0 | 00000001 | 1 | 0 | 0 | 0 |
| ⋮ | ⋮ | ⋮ | ⋮ | ⋮ | ⋮ |
| n | n+1 | 1 | 0 | 0 | 0 |
| ⋮ | ⋮ | ⋮ | ⋮ | ⋮ | ⋮ |
| 253 | 11111110 | 1 | 0 | 0 | 0 |
| 254 | 11111111 | 1 | 1 | 1 | 0 |
| 255 | 00000000 | 0 | 0 | 0 | 0 |

:HIGH-RESISTANCE STATE
Rmax

:LOW-RESISTANCE STATE
Rmin

| STATE | (MCI) MTJI |
|---|---|
| S(0) | H(Rmax) |
| S(1) | L(Rmin) |

| STATE | (MCI) MTJI | SENSE AMPLIFIER OUTPUT |
|---|---|---|
| | | VREF1(≥0) |
| S(0) | H(Rmax):0 | 1 |
| S(1) | L(Rmin):1 | 0 |

FIG.136
| STATE | (MCI) MTJI | (MCJ) MTJJ |
|---|---|---|
| S(0,0) | H(Rmax):0 | H(Rmax):0 |
| S(1,0) | L(Rmin):1 | H(Rmax):0 |
| S(0,1) | H(Rmax):0 | L(Rmin):1 |
| S(1,1) | L(Rmin):1 | L(Rmin):1 |
FIG.137
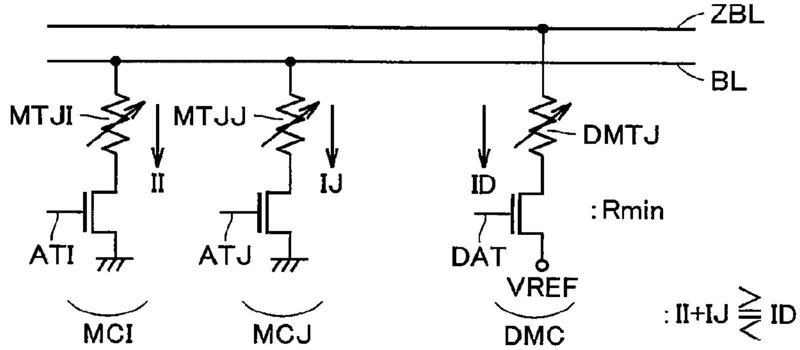
FIG.138
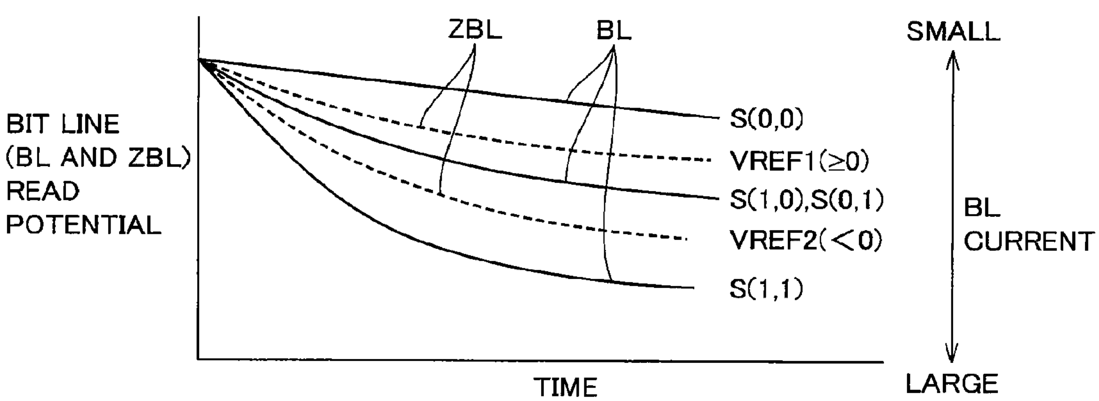

| STATE | (MCI) MTJI | (MCJ) MTJJ | SENSE AMPLIFIER OUTPUT | |
|---|---|---|---|---|
| | | | VREF1(≥0) | VREF2(<0) |
| | | | DMCA | DMCB |
| S(0,0) | H(Rmax):0 | H(Rmax):0 | 1 | 1 |
| S(1,0) | L(Rmin):1 | H(Rmax):0 | 0 | 1 |
| S(0,1) | H(Rmax):0 | L(Rmin):1 | 0 | 1 |
| S(1,1) | L(Rmin):1 | L(Rmin):1 | 0 | 0 |
| | | | (NOR) | (NAND) |

:OUTPUT MAY BE TAKEN OUT
FROM DRAINS OF PP3 AND PP4

| STATE | (MCI) MTJI | (MCJ) MTJJ | (MCK) MTJK |
|---|---|---|---|
| S(0,0,0) | H(Rmax):0 | H(Rmax):0 | H(Rmax):0 |
| S(1,0,0) | L(Rmin):1 | H(Rmax):0 | H(Rmax):0 |
| S(0,1,0) | H(Rmax):0 | L(Rmin):1 | H(Rmin):0 |
| S(1,1,0) | L(Rmin):1 | L(Rmin):1 | H(Rmin):0 |
| S(0,0,1) | H(Rmax):0 | H(Rmax):0 | L(Rmin):1 |
| S(1,0,1) | L(Rmin):1 | H(Rmax):0 | L(Rmin):1 |
| S(0,1,1) | H(Rmax):0 | L(Rmin):1 | L(Rmin):1 |
| S(1,1,1) | L(Rmin):1 | L(Rmin):1 | L(Rmin):1 |

FIG.143

| STATE | (MCI) MTJI | (MCJ) MTJJ | (MCK) MTJK | SENSE AMPLIFIER OUTPUT | |
|---|---|---|---|---|---|
| | | | | VREF3(≥0) | VREF4(<0) |
| | | | | DMC1 | DMC2 |
| S(0,0,0) | H(Rmax):0 | H(Rmax):0 | H(Rmax):0 | 1 | 1 |
| S(1,0,0) | L(Rmin):1 | H(Rmax):0 | H(Rmax):0 | 0 | 1 |
| S(0,1,0) | H(Rmax):0 | L(Rmin):1 | H(Rmax):0 | 0 | 1 |
| S(1,1,0) | L(Rmin):1 | L(Rmin):1 | H(Rmax):0 | 0 | 1 |
| S(0,0,1) | H(Rmax):0 | H(Rmax):0 | L(Rmin):1 | 0 | 1 |
| S(1,0,1) | L(Rmin):1 | H(Rmax):0 | L(Rmin):1 | 0 | 1 |
| S(0,1,1) | H(Rmax):0 | L(Rmin):1 | L(Rmin):1 | 0 | 1 |
| S(1,1,1) | L(Rmin):1 | L(Rmin):1 | L(Rmin):1 | 0 | 0 |
| | | | | (NOR) | (NAND) |

| NQ1 | RBL | CURRENT SOURCE CIRCUIT |
|---|---|---|
| 0 | 0 | OFF |
| 1 | 1 | ON |

FIG.161

| CELL STATE | NQ1 (SNA) | NQ2 (SNB) | SENSE AMPLIFIER OUTPUT | CURRENT SOURCE CIRCUIT |
|---|---|---|---|---|
| | | | RBL | |
| S(0,0) | 0 | 0 | 0 | OFF |
| S(1,0) | 1 | 0 | 0 | OFF |
| S(0,1) | 0 | 1 | 0 | OFF |
| S(1,1) | 1 | 1 | 1 | ON |
| | | OPERATION | AND | AND |

FIG.162

| | | | | | | | | |
|---|---|---|---|---|---|---|---|---|
| | | | | X<3> | X<2> | X<1> | X<0> | |
| | | ×) | | Y<3> | Y<2> | Y<1> | Y<0> | |
| | | | | X<3>Y<0> | X<2>Y<0> | X<1>Y<0> | X<0>Y<0> | :PP1 |
| | | | X<3>Y<1> | X<2>Y<1> | X<1>Y<1> | X<0>Y<1> | | :PP2 |
| | | X<3>Y<2> | X<2>Y<2> | X<1>Y<2> | X<0>Y<2> | | | :PP3 |
| | X<3>Y<3> | X<2>Y<3> | X<1>Y<3> | X<0>Y<3> | | | | :PP4 |
| P<7> | P<6> | P<5> | P<4> | P<3> | P<2> | P<1> | P<0> | |

| | | | |
|---|---|---|---|
| | DIN#1 | : | 1110 |
| + | DIN#2 | : | 1010 |
| − | DIN#3 | : | 0010 |
| + | DIN#4 | : | 0110 |
| | | | 011100 |

(SENSE AMPLIFIER BAND: FIG. 188 OR 192)

SEMICONDUCTOR SIGNAL PROCESSING DEVICE

RELATED APPLICATIONS

This application is a Divisional of U.S. application Ser. No. 12/390,213, filed on Feb. 20, 2009, now U.S. Pat. No. 8,130,582 claiming priority of Japanese Application Nos. 2008-039107, filed on Feb. 20, 2008, 2008-050484, filed on Feb, 29, 2008, 2008-052868, filed Mar. 4, 2008, 2008-84276, filed on Mar. 27, 2008, 2008-08776, filed Mar. 28, 2008, 2008-08777, filed on Mar. 28, 2008, 2008-236668, filed on Sep. 16, 2008, the entire contents of each of which are hereby incorporated by reference.

BACKGROUND OF THE INVENTION

1. Field of the Invention

The present invention relates to a semiconductor signal processing device, and particularly to a configuration of a semiconductor signal processing device including an operational circuit in which a semiconductor memory is used.

2. Description of the Background Art

A system LSI (Large Scale Integration) called SoC (System on Chip) is widely used to achieve down-sizing, weight-lighting and speed-up of a processing system. In SoC, a memory and a logic (processing device) are integrated on a common semiconductor substrate. In the system LSI, because the memory and the logic are connected by on-chip interconnections, a large amount of data can be transferred at high speed to allow the high-speed processing. In an article by K. Arimoto et, al., titled "A Configurable Enhanced $T^2$RAM Macro for System-Level Power Management Unified Memory," 2006 Symposium on VLSI Circuits, Digest of Technical Papers, June 2006 (hereinafter referred to as Non-Patent Document 1), TTRAM (Twin Transistor Random Access Memory) is proposed as a semiconductor memory suitable for embedding in the system LSI.

In Non-Patent Document 1, a transistor having an SOI (Silicon On Insulator) structure is utilized to store data in a nonvolatile manner. A threshold voltage of a data storage transistor is changed by accumulating charges in a body region of the data storage SOI transistor, and the storage data is converted into threshold voltage information. In data reading, an access transistor is set in an on-state, and the data storage transistor is connected between a source line and a bit line. Because an amount of current flowing through the bit line depends on the threshold voltage of the data storage transistor, the data is read by sensing the bit line current.

In the configuration of Non-Patent Document 1, the charges are accumulated in the body region of the transistor having the SOI structure, so that the data can be stored in the nonvolatile manner. Because the charges are retained in the body region, data can be read in a nondestructive manner, a restoring operation in which the storage data is re-written is not required unlike DRAM (Dynamic Random Access Memory), and a read cycle time can be shortened. Data is read by sensing the current, so that the data can be read at high speed even under a low power supply voltage condition.

A memory cell is formed of two transistors, so that an occupied area by the memory cell can be reduced so that the memory cells re arranged in high density. The charges are accumulated in the body region of the transistor of the SOI structure, so that the data can stably be retained even under the low power supply voltage condition.

A need for high-speed digital signal processing for processing large amount of data such as audio and image at high speed is increased in a mobile application such as a mobile terminal equipment. In conventional software-based processing with CPU (Central Processing Unit) and DSP (Digital Signal Processor), a performance required in current multimedia processing cannot be achieved. Therefore, usually the processing with hardware logic is performed.

However, as miniaturization of the semiconductor manufacturing process and complexity of system advance, such problems are caused as cost increase of semiconductor process, and prolonged design and verification periods and resultant cost increase. Therefore, there is a strong demand to perform various kinds of large-scale data processing at high speed through replacement by software. Naturally, from the viewpoint of built-in application, there is a strong demand for high processing capability with low power consumption, that is, high-energy processing capability.

As a configuration for satisfying such demand, Japanese Patent Laying-Open No. 2006-099232, for example, discloses the one, in which an operational processing unit is disposed corresponding to each memory cell column of a semiconductor memory array and operational processing is concurrently performed in plural operational processing units. In the configuration disclosed in Japanese Patent Laying-Open No. 2006-099232, operation processing contents can be set by changing micro program contents. In the configuration disclosed in Japanese Patent Laying-Open No. 2006-099232, a sense amplifier and a write driver are disposed for each memory cell column as a data transfer circuit at a data transfer section between the memory array and the operational processing units. The memory cell is used to store operation target data and operation result data.

In the configuration disclosed in Japanese Patent Laying-Open No. 2006-099232, the SIMD (Single Instruction Multiple Data Stream) operational processing unit and the memory are closely coupled to solve a data transfer bottle neck between a memory and a processor, and operation performance close to hardware is achieved by massive parallel operation.

The configuration disclosed in Japanese Patent Laying-Open No. 2006-099232 is characterized in that fine granularity processing element of one bit or two bits is utilized and the operational processing unit performs the operation based on bit-by-bit data from the memory. That is, in the configuration disclosed in Japanese Patent Laying-Open No. 2006-099232, a plurality of operational processing units concurrently perform the operation in a bit serial fashion, thereby achieving the high-performance operation processing.

Japanese Patent Laying-Open No. 2004-264896 discloses a configuration, in which a memory cell is provided with an operation function without the use of an operational processing unit. In the configuration disclosed in Japanese Patent Laying-Open No. 2004-264896, a storage capacitor storing data and a load capacitor are connected in series between a bit line pair. A reference voltage and operation data are applied at both ends of the series-connected ferroelectric capacitors, and operation result is supplied from a connection node of the ferroelectric capacitors. In Japanese Patent Laying-Open No. 2004-264896, using a hysteresis in polarization of the ferroelectric capacitor, dependency of a moving amount of charges on match/mismatch of logical values of the storage data and operation data is utilized.

Japanese Patent Laying-Open No. 2007-213747 discloses a configuration, in which an operation of the storage data and write data is performed using one ferroelectric capacitor. In the configuration disclosed in Japanese Patent Laying-Open No. 2007-213747, a one-shot pulse signal is applied to a bit line of a bit line pair according to a logical value of the operation data, and a potential at the other of the bit line pair is amplified by a sense amplifier. In Japanese Patent Laying-Open No. 2007-213747, the dependency of the moving amount of charges of the ferroelectric capacitor on match/mismatch of logical values of the storage data and operation data is also utilized.

Japanese Patent Laying-Open No. 07-249290 discloses a configuration, in which an SRAM (Static Random Access Memory) cell is provided with an operation function. In the configuration disclosed in Japanese Patent Laying-Open No. 07-249290, access transistors of the SRAM cell have on-off control made independently of each other, and a high-side cell power supply voltage and a low-side cell power supply voltage are also controlled in a unit of a memory cell row. The bit line connection, the on-off control of the access transistors, and the control of the high-side and low-side cell power supply voltages are combined to perform various logic operations.

Japanese Patent Laying-Open No. 08-031168 discloses a configuration, in which a sense amplifier performs an operation processing of the storage data of a memory cell with the use of a DRAM (Dynamic Random Access Memory) cell. In the configuration disclosed in Japanese Patent Laying-Open No. 08-031168, plural memory cells and plural dummy cells are connected to bit lines of the bit line pair, respectively. A logic operation is performed on storage data of the plural memory cells by setting the respective storage data of the plural dummy cells at one of an intermediate value, "1" and "0".

Japanese Patent Laying-Open No. 07-182874 discloses a configuration, in which an operation is performed with the memory cell. In the configuration disclosed in Japanese Patent Laying-Open No. 07-182874, an operational circuit is connected to a bit line and a static storage circuit, and includes an operation result output terminal. The operational circuit performs a one-bit arithmetic or logic operation on the input data received from the bit line and the data stored in the storage circuit, and supplies the operation result through the operation result output terminal.

Japanese Patent Laying-Open No. 2000-284943 discloses a configuration, in which an operation is performed using a memory cell. In the configuration disclosed in Japanese Patent Laying-Open No. 2000-284943, a semiconductor memory includes plural memory cells, a word line corresponding to an X-address, and a pair of bit lines corresponding to a Y-address. A logic operational circuit is provided for each pair of bit lines, and the plural logic operational circuits are simultaneously activated in response to a logic selection signal. The operation result of the logic operational circuit is simultaneously written in all the Y-addresses on at least one selected X-address. The logic operational circuit is provided for each pair of bit lines, so that data on all the pairs of bit lines can simultaneously be operated and thus the operation can be performed in a short time for a large amount of data.

FPGA (Field Programmable Gate Array) with an LUT (Look Up Table) mounted thereon is a logic device that can implement various logic circuits by programming a logic specification. For example, a memory having a storage capacity of N bits by M bits can implement an LUT operational unit having a function of a logic function, which outputs M-bit data for N-bit input data. A programmable LUT operational processing unit can be implemented with the use of FPGA as the memory. However, in the conventional LUT operational processing unit, the implementable logic function is directly restricted by the memory capacity.

Japanese Patent Laying-Open No. 2007-226944 discloses an LUT (Look Up Table) operational processing unit that realizes plural functions. In the configuration disclosed in Japanese Patent Laying-Open No. 2007-226944, when a control signal line connected to a memory cell is activated, the memory cell performs one of the data read and write and the output of a predetermined value constituting an operation result of the operation target data in response to a mode control signal. An address decoder receives a data write address, a data read address, or operation target data, and activates the control signal line corresponding to the received address/data based on which the mode control signal designates, the data write, the data read, or the operation processing. Therefore, a circuit scale is maintained without preparing the memory cells for storing data of a truth table, and the LUT operational processing unit having two independent operation functions is implemented.

In T. Tsuji, et al., "A 1.2V 1 Mbit Embedded MRAM Core with Folded Bit-Line Array Architecture," 2004 Symposium on VLSI Circuits Digest of Technical Papers, June 2004, pp. 450-453 (hereinafter referred to as Non-Patent Document 2), a configuration in which MRAM is utilized is described as an example of a nonvolatile memory suitable for the built-in application. In Non-Patent Document 2, a magnetic field is induced by a current flowing through a bit line and a write word line, a magnetization direction of a free layer of an MTJ (Magnetic Tunnel Junction) element is set by the magnetic field, and a resistance value is changed due to a magneto-resistance effect. The resistance value of the MTJ element is correlated with the storage data.

In the configurations disclosed in the above-described Japanese Patent Laying-Open Nos. 2004-264896, 2007-213747, 07-249290, 08-031168, 07-182874, and 2000-284943, the logic operation is performed with the memory cell or the sense amplifier. Accordingly, there is no need to read the data stored in the memory cell outside the memory for performing the operation processing with a separately provided operational processing unit, achieving speed-up of a operation processing.

In the configurations disclosed in Japanese Patent Laying-Open Nos. 2004-264896, 2007-213747, 07-249290, and 08-031168, the operation is performed in each memory cell column, so that the operation of a fine granularity can be realized without largely adding hardware.

However, in the configuration where two series-connected ferroelectric capacitors are used as the configuration of Japanese Patent Laying-Open No. 2004-264896, although it is described that the nondestructive data read can be performed, the restoring operation is performed by writing the reverse data of the operation data after the operational processing, in order to avoid a distortion of a hysteresis characteristic of the ferroelectric capacitor during the operational processing. Accordingly, the operation data transfer, the operation, and the restoring are required during the operation. The operation cycle cannot be shortened due to the restoring, and the high-speed processing is hardly realized.

In the configuration disclosed in Japanese Patent Laying-Open No. 2007-213747, although one ferroelectric capacitor and two transfer gates are used as one operator cell, the data stored in the ferroelectric capacitor is destructively read during the operation. Accordingly, the operational processing cannot be performed by combining different operation data with the same data.

Where the ferroelectric capacitor is used as in Japanese Patent Laying-Open Nos. 2004-264896 and 2007-213747, the charge movement is utilized depending on a polarization state of the ferroelectric capacitor. Accordingly, in order to sense the moving amount of charges with the sense amplifier, it is necessary to move some charge amount. Therefore, in order to move the sufficient amount of charges, the capacitor needs to have a significant size, which becomes an obstacle against a high integration.

In Japanese Patent Laying-Open Nos. 07-249290 and 07-182874, because of the use of the SRAM cell, the number of transistor elements is increased and the cell size becomes larger than those of the MRAM cell and DRAM cell. Therefore, the large-capacity memory array is hardly realized in the small occupation area, and the configuration of Japanese Patent Laying-Open Nos. 07-249290 and 07-182874 is difficult to apply to the application in which a large amount of data are processed in a mobile equipment.

In the configuration disclosed in Japanese Patent Laying-Open No. 08-031168, the DRAM cell is used, and therefore, the cell size can be reduced. However, the data is destructively read in the DRAM cell. Particularly the storage data is completely destroyed in cases where plural memory cells are connected in parallel to one bit line as in Japanese Patent Laying-Open No. 08-031168. Accordingly, similarly to the configuration of Japanese Patent Laying-Open No. 2007-213747, the operation cannot be performed by repeatedly utilizing the data stored in the memory cell.

In the configuration disclosed in Japanese Patent Laying-Open No. 2000-284943, when the logic operational circuit is provided for each pair of bit lines, it is difficult to implement a large-capacity memory array in a small occupation area.

In the method for achieving the multifunctional memory cell as in the configuration disclosed in Japanese Patent Laying-Open No. 2007-226944, the occupation area of the memory array is significantly enlarged with the increase in storage capacity.

Where the ferroelectric capacitor and the DRAM cell are used, because a voltage sensing type sense amplifier is used as the sense amplifier that senses and amplifies the data, the sensing operation cannot be performed until a difference in voltage is sufficiently developed between the sense nodes of the sense amplifier. Accordingly, in the voltage sensing type sense amplifier, because the sensing operation is slower than that of a current sensing type sense amplifier, the operation result cannot be produced at high speed, and it is difficult to implement a high-speed operation processing.

The mobile equipment is required to operate under a low power supply voltage condition. Accordingly, where an operational processing is performed by moving the charges through the use of the capacitor, the sufficient amount of charges cannot be moved at a low power supply voltage, which results in a problem that the correct operational processing cannot be ensured.

Non-Patent Document 1 describes that a DFV (Dynamic Frequency and Voltage) control system is applied in system power supply management. However, in Non-Patent Document 1, there is no description on the configuration in which the operation is performed using a memory cell.

In Japanese Patent Laying-Open Nos. 2006-099232, 2004-264896, 2007-213747, 07-249290, and 08-031168 and Non-Patent Document 1, the operation is digitally performed. For example, when addition is digitally performed, the operation of the upper-order bit cannot be performed until a lower-order carry is ascertained. Therefore, the digital arithmetic operation cannot be performed at high speed. In Japanese Patent Laying-Open Nos. 2006-099232, 2004-264896, 2007-213747, 07-249290, and 08-031168 and Non-Patent Document 1, there is no description on a circuit-wise measure for performing the arithmetic operation such as addition and subtraction at high speed.

In Japanese Patent Laying-Open Nos. 2006-099232, 2004-264896, 2007-213747, 07-249290, and 08-031168 and Non-Patent Document 1, an address space of the storage device is uniquely determined, and there is no consideration on the configuration for expanding the address space.

Non-Patent Document 2 merely describes the configuration of the MRAM cell and the configuration of the data read, and fails to describe an internal operational processing of storage data.

SUMMARY OF THE INVENTION

An object of the present invention is to provide a semiconductor signal processing device having a small occupation area, in which the operational processing can be performed at high speed even in the low power supply voltage.

Another object of the invention is to provide a high-density semiconductor signal processing device having an operational function.

Briefly stating, in a semiconductor signal processing device according to the present invention, a nonvolatile memory cell having an amount of current that can be passed set according to storage data, is used to produce internal read data according to the current, and internally necessary processing is performed on the internal read data.

In accordance with a first aspect of the present invention, a semiconductor signal processing device includes a memory array having a plurality of memory cells arranged in rows and columns each being formed on an insulating layer and for storing information in a nonvolatile manner. The plurality of memory cells are disposed such that at least two memory cells constitute one unit operator cell. The unit operator cell includes at least first to fourth SOI transistors. The first SOI transistor has a first gate electrode and is selectively put into a conductive state according to a potential at the first gate electrode to transfer first write data of a first write port when made conductive. The second SOI transistor has a second gate electrode and is selectively put into the conductive state according to a potential at the second gate electrode, to transfer second write data of a second write port when in the conductive state. The third SOI transistor has a third gate electrode and a first body region receiving the first write data transferred through the first SOI transistor. The third SOI transistor is connected between a reference voltage supply and a first read port, and has an amount of current that it can pass set according to a potential at the third gate electrode and an amount of charge accumulated in the first body region. The fourth SOI transistor has a fourth gate electrode and a second body region receiving the second write data transferred through the second SOI transistor. The fourth SOI transistor is connected between the third SOI transistor and a second read port and has an amount of current that it can pass set according to a potential at the fourth gate electrode and an amount of charge accumulated in the second body region. Each of the first and second SOI transistors is a first conductivity type SOI transistor, and each of the third and fourth SOI transistors is a second conductivity type SOI transistor.

In accordance with the first aspect of the present invention, the semiconductor signal processing device further includes a plurality of dummy cells arranged corresponding to columns of the unit operator cells, each for supplying a reference current when data stored in a selected unit operator cell is read, and a plurality of read lines arranged corresponding to the columns of the unit operator cells and each connecting to the unit operator cells of a corresponding column. Each read line includes a first read bit line and a second read bit line. The first read bit line is connected to the first read port of each unit operator cell of the corresponding column, and the second read bit line is connected to the second read port of each unit operator cell of the corresponding column. The semiconductor signal processing device further includes a plurality of dummy read lines arranged corresponding to the columns of the unit operator cells and each connecting to the dummy cell of a corresponding column. The plurality of read lines and dummy read lines are divided into operation unit groups by each predetermined number.

In accordance with the first aspect of the present invention, the semiconductor signal processing device further includes a plurality of sense read bit lines arranged corresponding to the respective columns of the unit operator cells, a port selection/switch circuit for connecting one of the first and second read bit lines to a sense read bit line of a corresponding column according to an operation instruction, a plurality of amplifying circuits arranged corresponding to the respective columns of the unit operator cells, each for producing a signal corresponding to a difference between currents passing through the sense read bit line and the dummy read line of a corresponding column, and a plurality of unit operation processing circuits arranged corresponding to the operation unit groups, each for producing the first and second write data to the unit operator cells of a corresponding operation unit group according to received data in data writing, and for performing operation processing specified by the operation instruction on an output signal of a corresponding amplifying circuit in data reading.

In accordance with a second aspect of the present invention, a semiconductor signal processing device includes a memory array including a plurality of unit cells arranged in rows and columns, each for storing information in a nonvolatile manner, and a plurality of read lines arranged corresponding to the columns of the unit cells and each connecting to the unit cells of a corresponding column. A current passes through the read line according to data stored in the unit cell of a corresponding column in data reading. The memory array is divided into a plurality of entries along a row direction. The semiconductor signal processing device further includes a read operation processing circuit for reading data stored in the unit cells of the addressed entry according to an operation instruction and an address specifying the entry in the memory array, to perform an operation specified by the operation instruction on the read out data in units of unit cell columns, and to supply the operational result as storage information to an entry that is different from the addressed entry. The read operation processing circuit includes a plurality of sense read amplifying circuits arranged corresponding to the columns of the unit cells and each producing internal read data according to a current passing through the read line of a corresponding column when made active.

In accordance with a third aspect of the present invention, a semiconductor signal processing device includes a plurality of unit operator cells arranged in rows and columns and each for storing data in a nonvolatile manner. Each unit operator cell can pass a current of a differ amount according to the storage data. The plurality of unit operator cells are divided into operation unit blocks in a row direction.

In accordance with the third aspect of the present invention, the semiconductor signal processing device further includes a write circuit for expanding each bit of multi-bit numerical data to a number of bits corresponding to a bit position of each bit in the numerical data to produce internal write data for the operation unit block, for concurrently selecting the unit operator cells in the operation unit block, and for concurrently writing bits of the internal write data corresponding to the multi-bit numerical data in corresponding unit operator cells, a plurality of global read data lines arranged corresponding to the columns of the plurality of unit operator cells, a read circuit for concurrently selecting the unit operator cells of a plurality of rows among the plurality of unit operator cells in data reading, to pass a current corresponding to data stored in each selected selection unit operator cell through the corresponding global read data line, and a conversion circuit for adding currents passing through the global read data lines in an analog manner in each operation unit block, and to convert the addition result into a digital signal.

In the semiconductor signal processing device according to the first aspect of the present invention, the unit operator cell is formed by the SOI element, so that the number of components of each cell can be decreased to reduce the layout area of the memory cell compared with an SRAM. The amplifying circuit performs the current sensing operation, so that the amplifying behavior can be performed at high speed to produce the operational result data.

The amplifying circuit can amplify the operational result of the data stored in the unit operator cells by selectively utilizing the first and second read ports. Therefore, not only the data can be stored, but also the AND, OR, and NOT logic operation functions can be implemented. Accordingly, the fine granularity operation can be achieved without separately disposing a computing unit.

In the semiconductor signal processing device according to the second aspect of the present invention, the read operation processing circuit reads the internal data in each column, and the read operation processing circuit has the operational function of performing an operation on the read out data. The selected entry can be converted into another entry by performing the operation to the data stored in the unit operator cells in units of entry columns, and the virtual entry space larger than the real entry space can be produced. Therefore, high-density and large-capacity LUT calculating unit can be implemented.

In the semiconductor signal processing device according to the third aspect of the present invention, the addition and subtraction are performed on the current that is weighted according to the bit position of the bits in the multi-bit numerical data. Accordingly, the addition and subtraction can be performed without waiting for the settlement of the carry/borrow, and the addition and subtraction processing can be achieved at speed. Similarly to the addition and subtraction, the partial product addition can be performed to implement the high-speed multiplication processing.

The current addition is internally performed without transferring the added current to the outside of the device, so that the current addition result can be produced at high speed with the small current even in the low power supply voltage.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 31 shows, in a list form, a correlation between input data and a logical value of an output subtraction value of a subtraction section in the second embodiment of the present invention.

FIG. 74 shows an example of multiplication manipulation in the eighth embodiment of the present invention.

FIG. 91 schematically shows a manner in which a transistor is connected to a sense amplifier when two N-channel SOT transistors are selected in the unit operator cell.

FIG. 92 shows, in a list form, the relationship between storage data and a logical value of an output signal of the sense amplifier in a connection manner of the unit operator cell and dummy cell of FIG. 91.

FIG. 93 shows a relationship between a read potential and a current flowing through bit lines RBL and ZRBL during data read.

FIG. 94 schematically shows a manner in which the transistor is connected to the sense amplifier when one SOI transistor is selected in the unit operator cell.

FIG. 95 shows, in a list form, the relationship between the storage data and the logical value of the output signal of the sense amplifier in the connection manner of the unit operator cell and dummy cell of FIG. 94.

FIG. 96 schematically shows a manner in which the transistor is connected to the sense amplifier when one SOT transistor is selected in the unit operator cell.

FIG. 100 shows a relationship between the read potential and the currents flowing through the bit lines RBL and ZRBL in data read.

FIG. 101 shows, in a list form, the relationship between the storage data and the logical value of the output signal of the sense amplifier when one SOI transistor is selected in each of three unit operator cells on unit operator cell rows <i>, <j>, and <k> and the same unit operator cell column.

FIG. 102 shows a relationship between the read potential and the currents flowing through the bit lines RBL and ZRBL during data read.

FIG. 107 shows, in a list form, the correlation between an output signal of a sense amplifier and an output signal of an AND gate and storage states of unit operator cells UOEI and UOEJ in the semiconductor signal processing device according to the eleventh embodiment of the present invention.

FIG. 114 shows a state in which one operator cell sub-array block is selected in the thirteenth embodiment.

FIG. 115 shows, in a list form, a combination of output signals of sense amplifiers SA connected to a global bit line in the thirteenth embodiment.

FIG. 116 shows a relationship between a read potential and a current flowing through a global bit line during data read in the thirteenth embodiment.

FIG. 117 shows a state in which two operator cell sub-array blocks are selected in the thirteenth embodiment.

FIG. 118 shows in a list form, a combination of the output signals of the sense amplifiers connected to the global bit line in the thirteenth embodiment.

FIG. 119 shows a relationship between the read potential and the current flowing through the global bit line during data read in the thirteenth embodiment.

FIG. 120 shows an example of LUT operation performed in the semiconductor signal processing device according to the thirteenth embodiment of the present invention.

FIG. 121 shows a configuration of a semiconductor signal processing device according to a fourteenth embodiment of the present invention.

FIG. 122 is a flowchart representing an operation sequence when the semiconductor signal processing device according to the fourteenth embodiment of the present invention acts as a counter.

FIG. 123 shows an example of a control flag and storage data when the semiconductor signal processing device according to the fourteenth embodiment of the present invention acts as an eight-bit counter.

FIG. 124 shows an electrically equivalent circuit of a unit operator cell used in a semiconductor signal processing device according to a fifteenth embodiment of the present invention.

Figure 124:
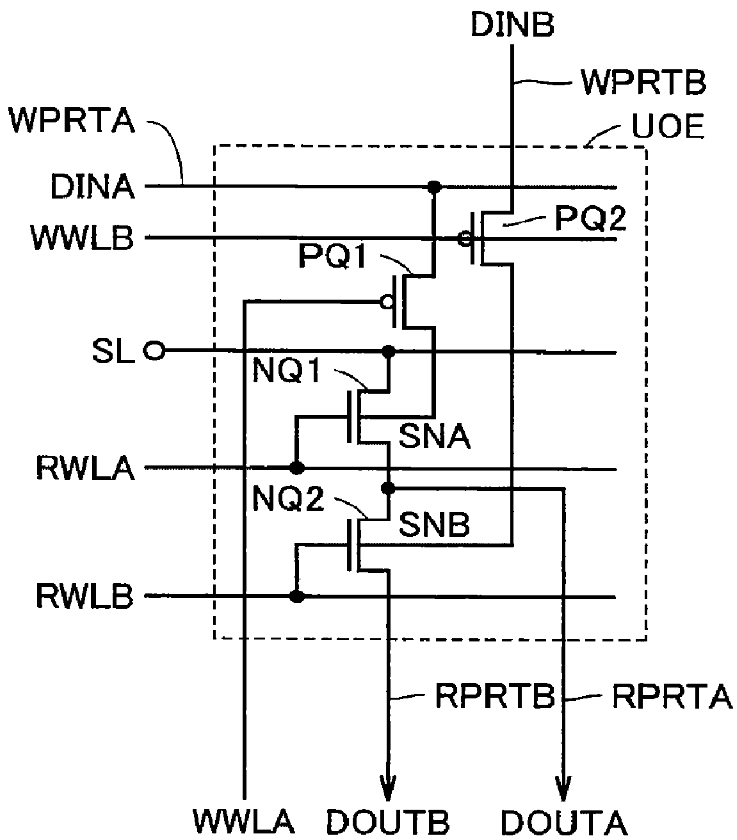
Figure 125:
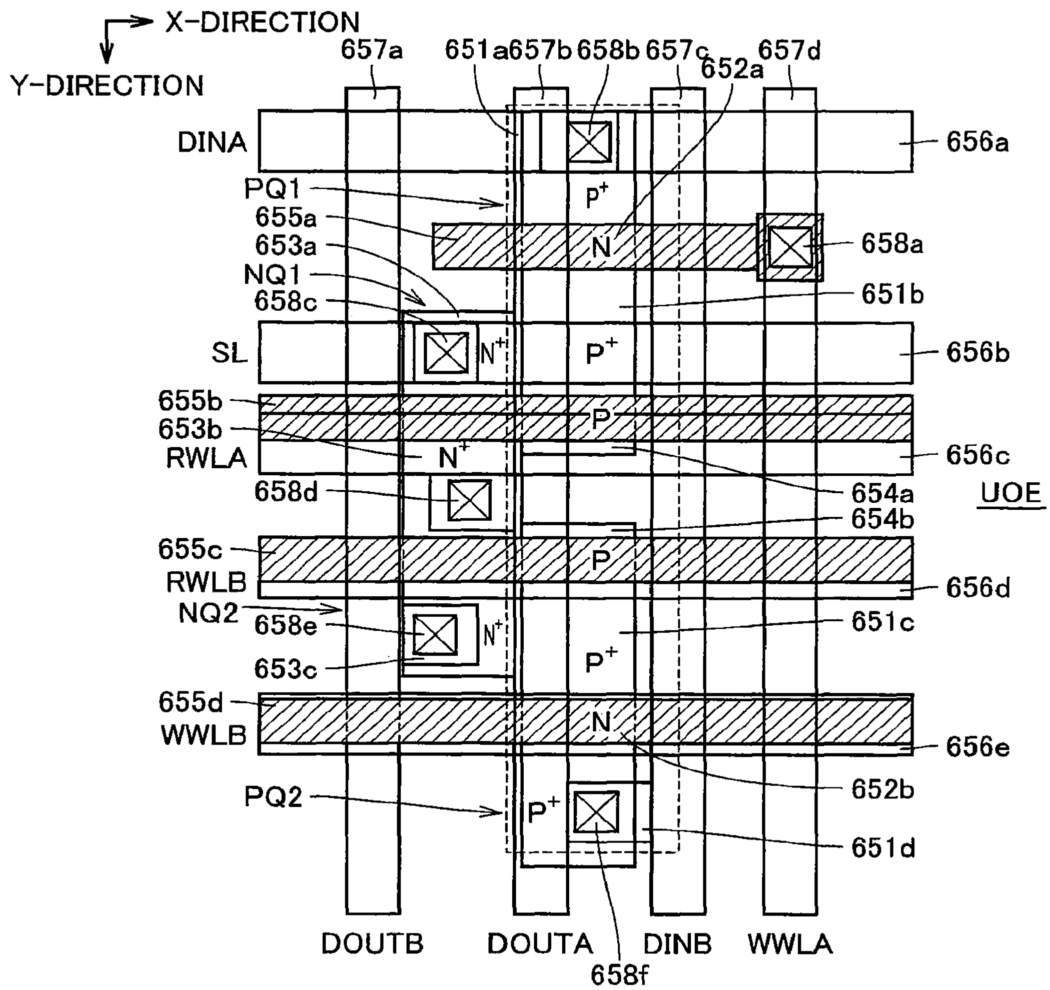

FIG. 125 schematically shows a planar layout of the unit operator cell of FIG. 124.

Figure 126:
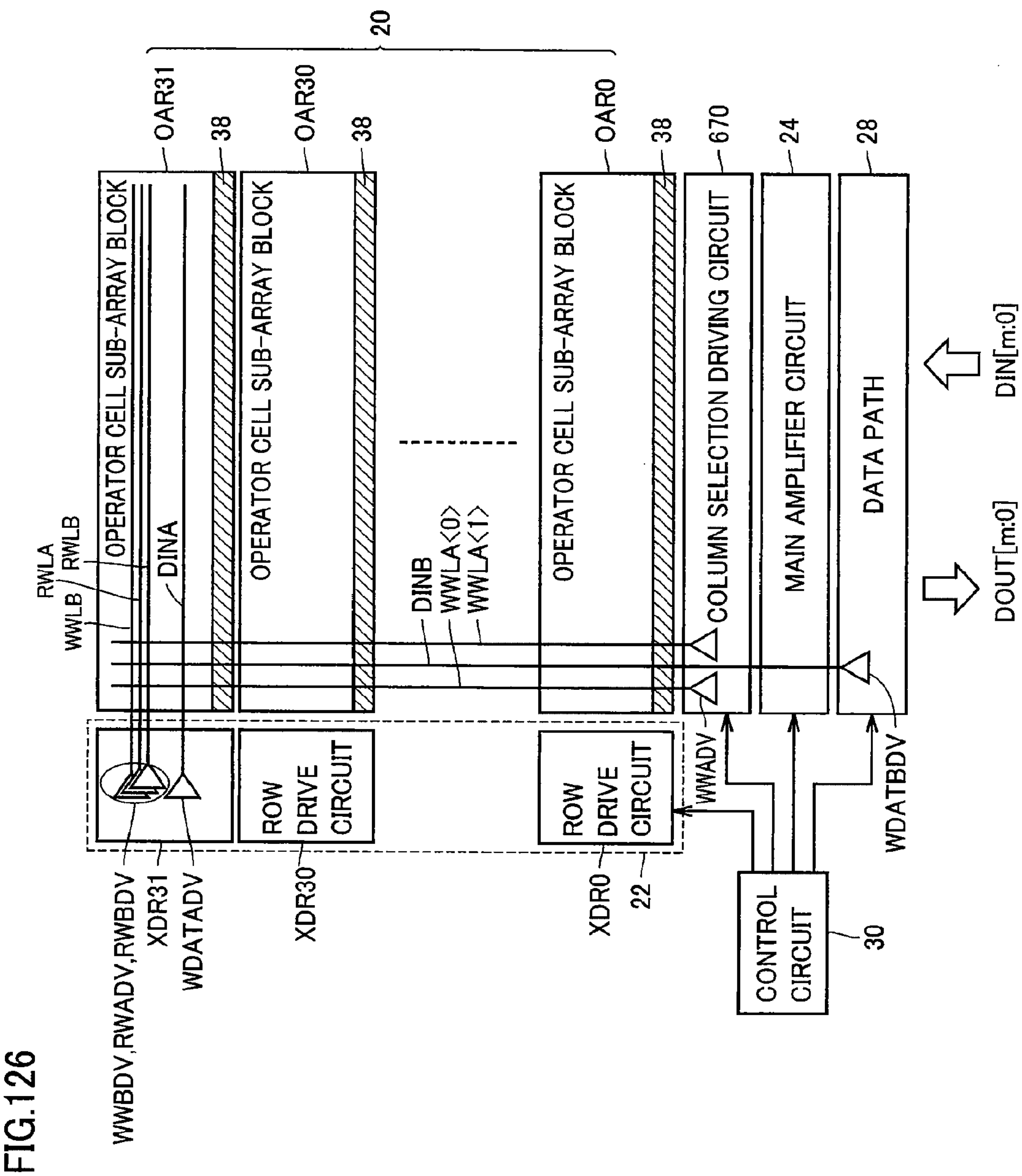

FIG. 126 schematically shows an entire configuration of the semiconductor signal processing device according to the fifteenth embodiment of the present invention.

Figure 127:
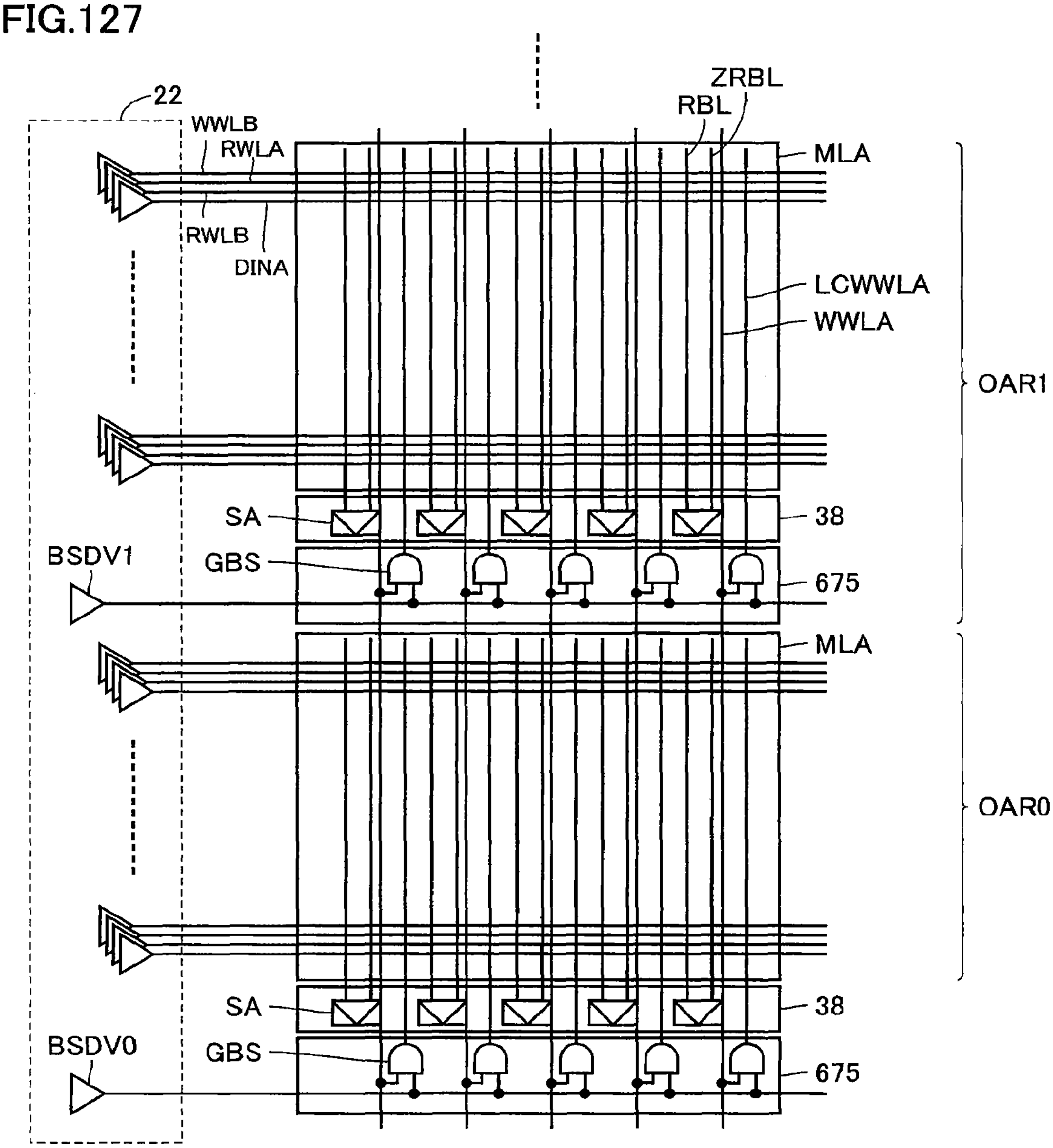

FIG. 127 specifically shows a configuration of an operator cell sub-array block OAR of FIG. 126.

Figure 128:
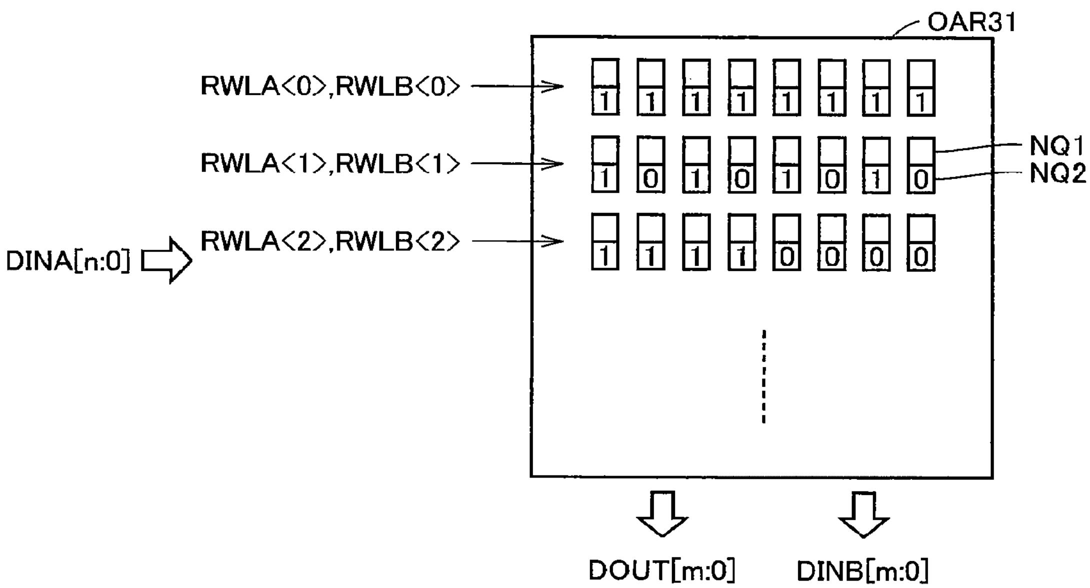

FIG. 128 conceptually shows a data flow in an operation of the semiconductor signal processing device according to the fifteenth embodiment of the present invention.

Figure 129:
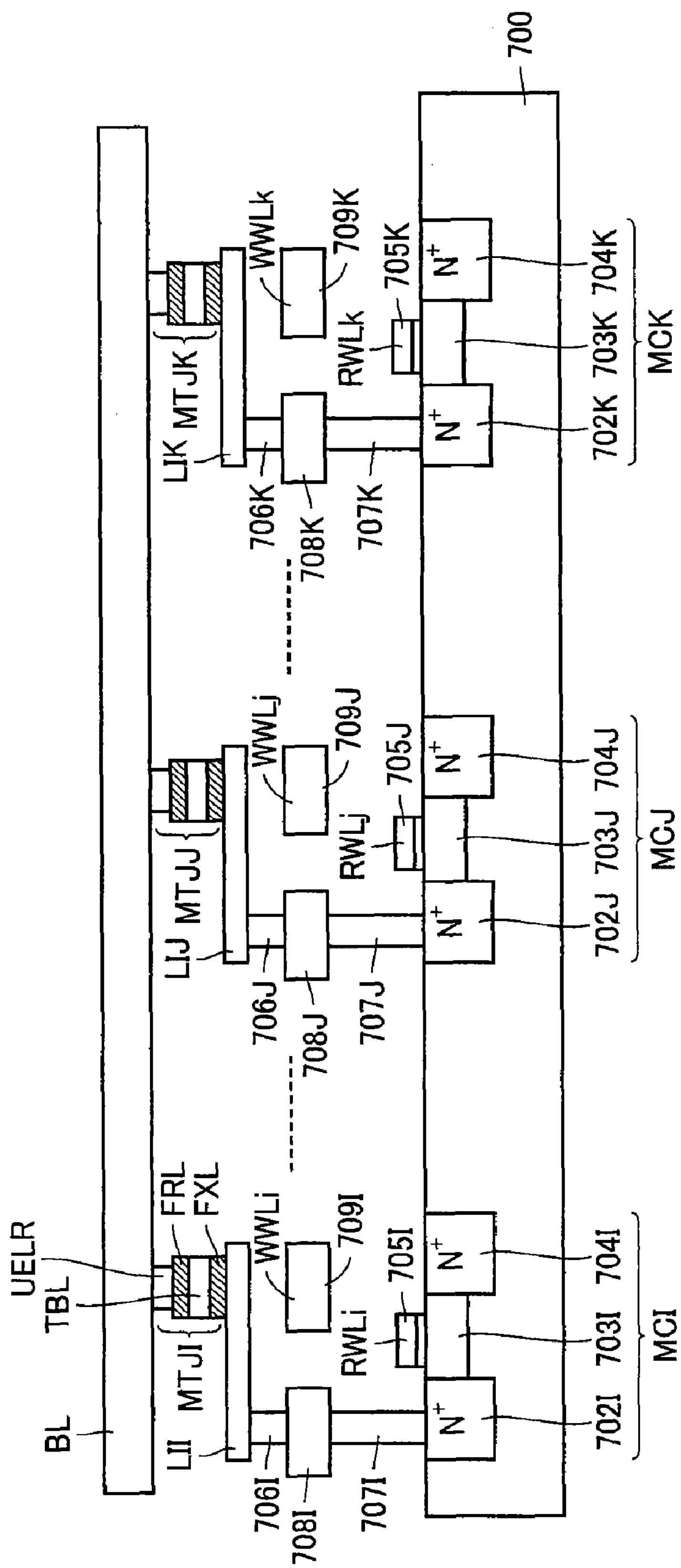

FIG. 129 schematically shows a sectional structure of a memory cell used in a semiconductor signal processing device according to a sixteenth embodiment of the present invention.

Figure 130:
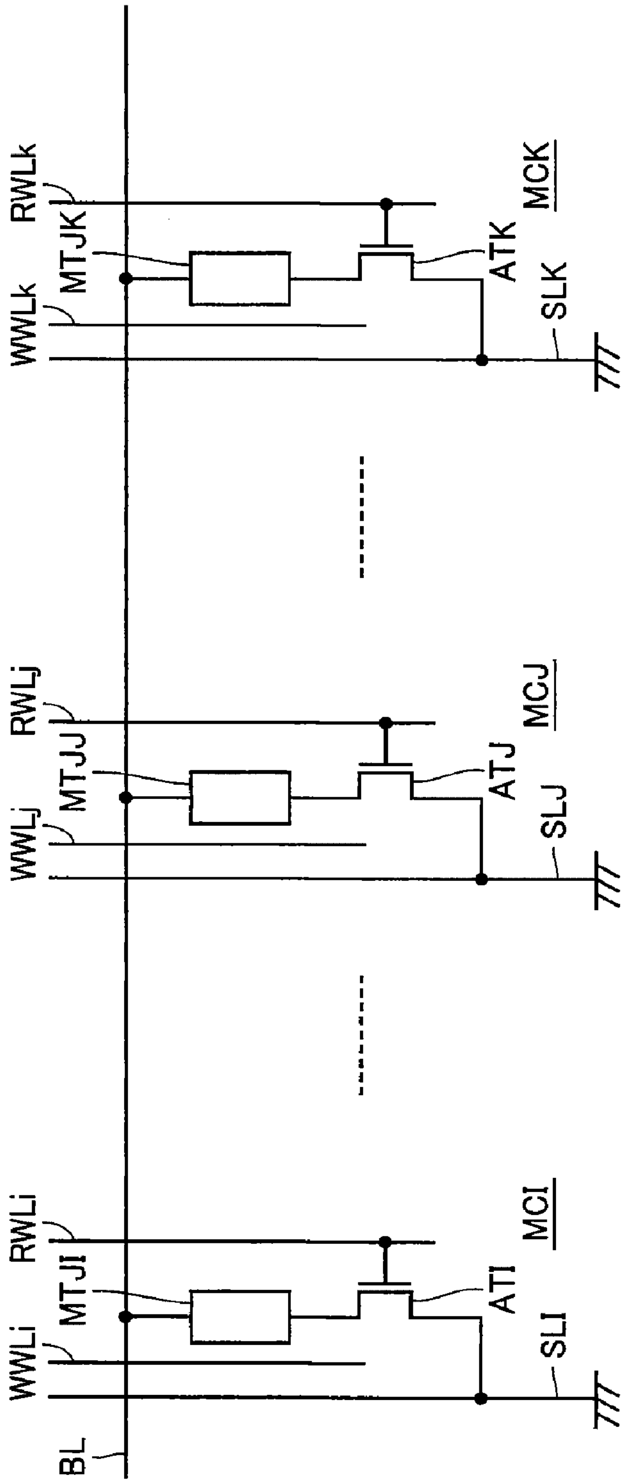

FIG. 130 shows electrically equivalent circuits of memory cells shown in FIG. 129.

Figure 131A:
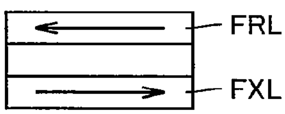
Figure 131B:
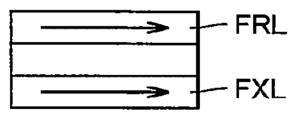

FIGS. 131A and 131B schematically shows a relationship between magnetization directions of a free layer and a fixed layer and resistance values of the free layer and fixed layer in a variable magnetoresistive element.

Figure 132:
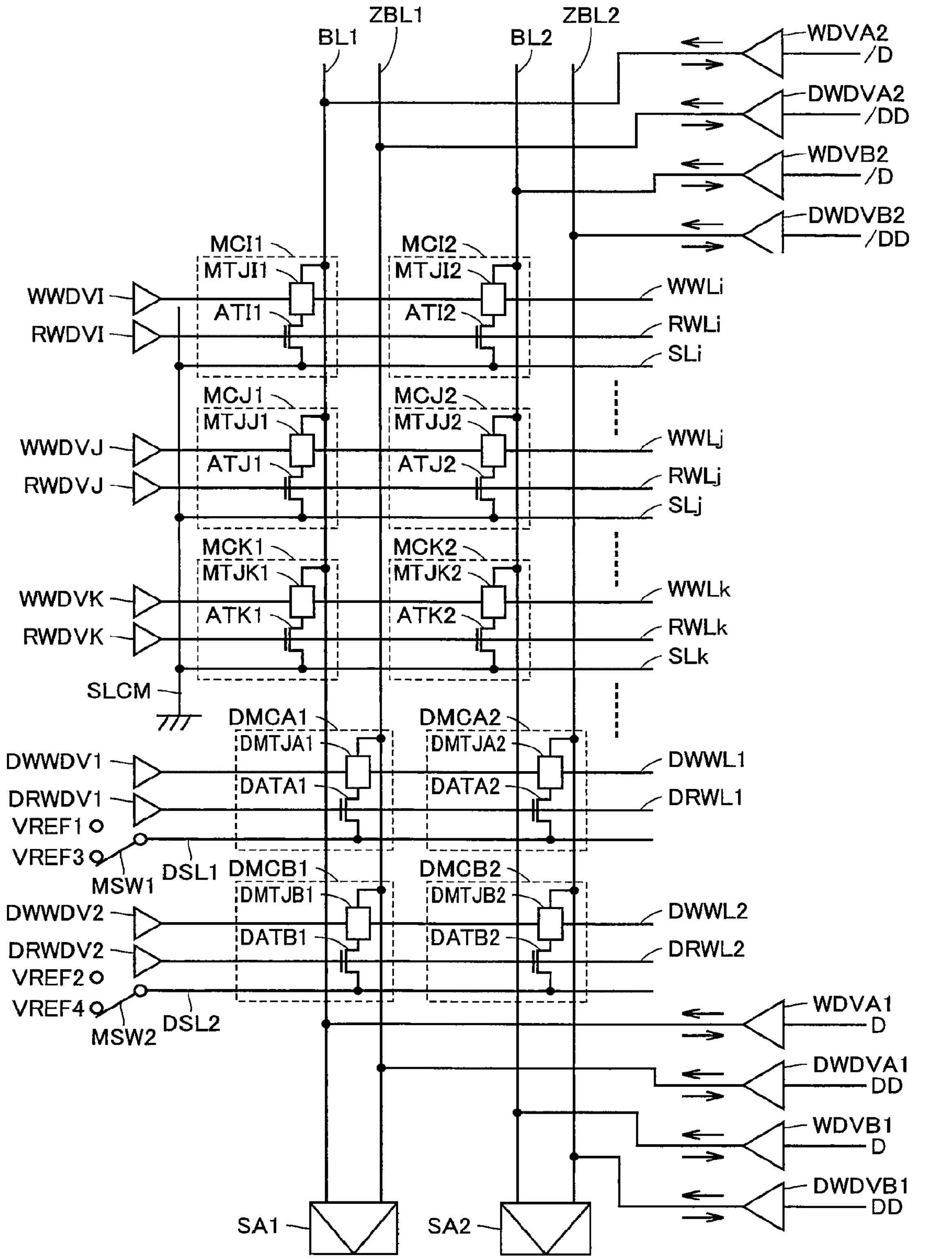

FIG. 132 schematically shows an arrangement of memory cells in a memory array in the semiconductor signal processing device of the sixteenth embodiment.

Figures 133, 134, 135:
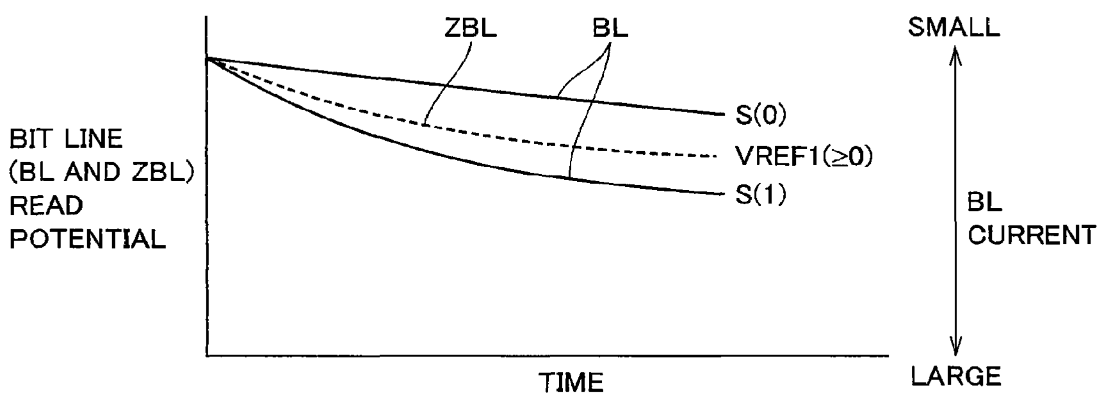

FIG. 133 shows, in a list form, the combination of storage data of a memory cell.

FIG. 134 shows a relationship between a read potential and currents flowing through bit lines during data read in the combination of FIG. 133.

FIG. 135 shows, in a list form, the correlation between an output signal of a sense amplifier and a storage state of the memory cell MCI in the semiconductor signal processing device of the sixteenth embodiment.

FIG. 136 shows, in a list form, the combination of storage data of memory cells MCI and MCJ.

FIG. 137 shows a manner in which the variable magnetoresistive element is connected to a bit line and a complementary bit line during data read.

FIG. 138 shows a relationship between the read potential and the currents flowing through bit lines during data read in the connection manner of FIG. 137.

Figures 139, 140:
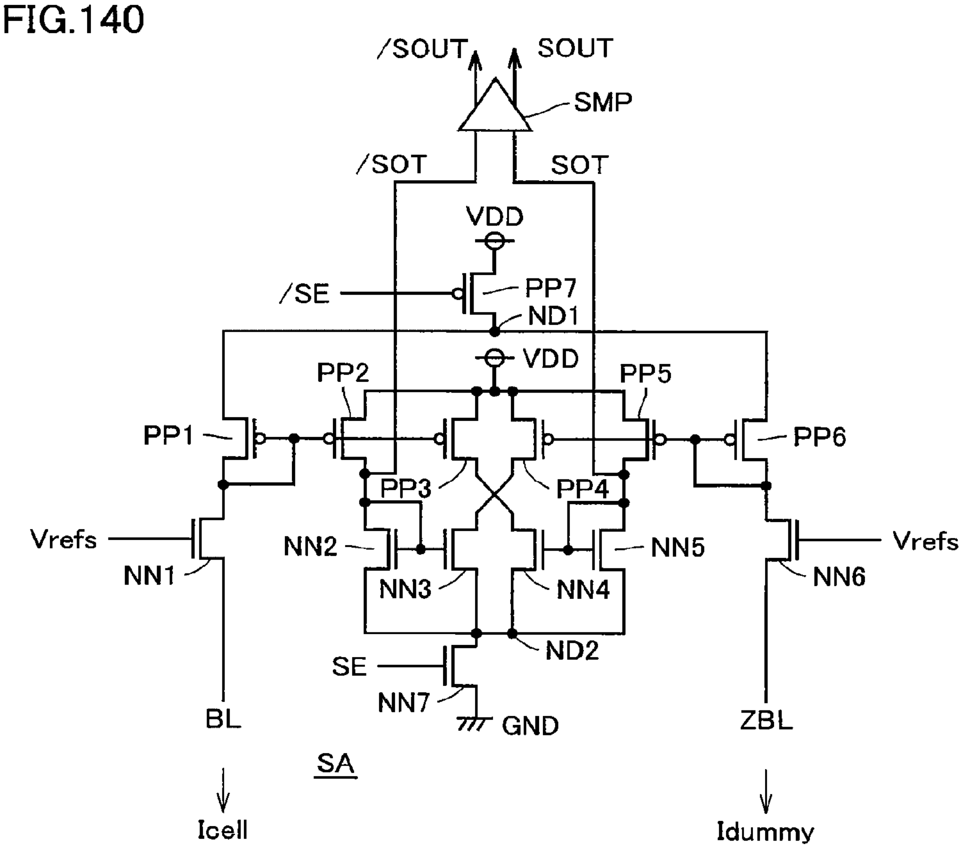

FIG. 139 shows, in a list form, the correlation between the output signal of the sense amplifier and the storage states of the memory cells MCI and MCJ at a bit line potential shown in FIG. 138.

FIG. 140 shows an example of a configuration of a current sensing type sense amplifier used in the sixteenth embodiment.

Figures 141, 142:
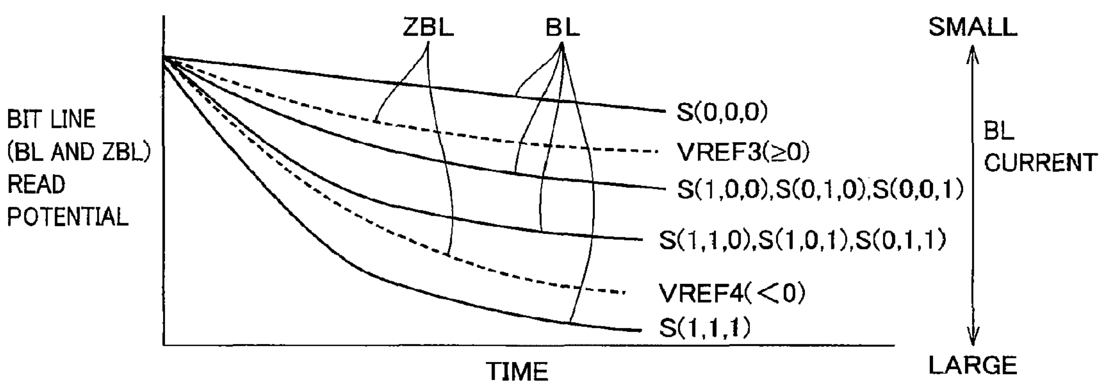

FIG. 141 shows, in a list form, the combinations of storage data of memory cells MCI, MCJ and MCK.

FIG. 142 shows a relationship between the read potential and the currents flowing through bit lines BL and ZBL during data read in connection of FIG. 141.

FIG. 143 shows a list of correlations between the output signal of the sense amplifier and storage states of the memory cells MCI, MCJ, and MCK at a bit line potential shown in FIG. 142.

Figure 144:
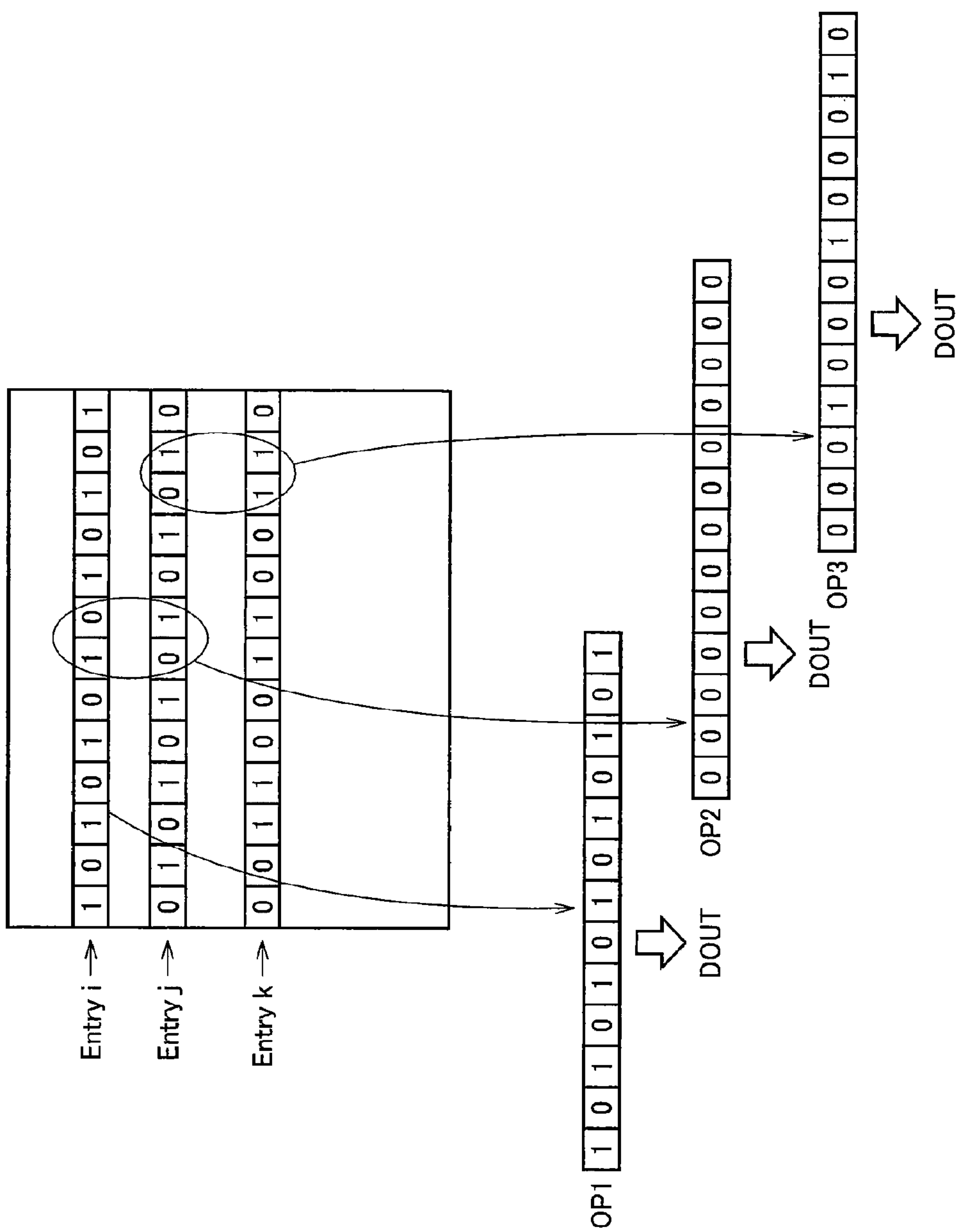

FIG. 144 shows an example of LUT operation performed in the semiconductor signal processing device of the sixteenth embodiment.

Figure 145:
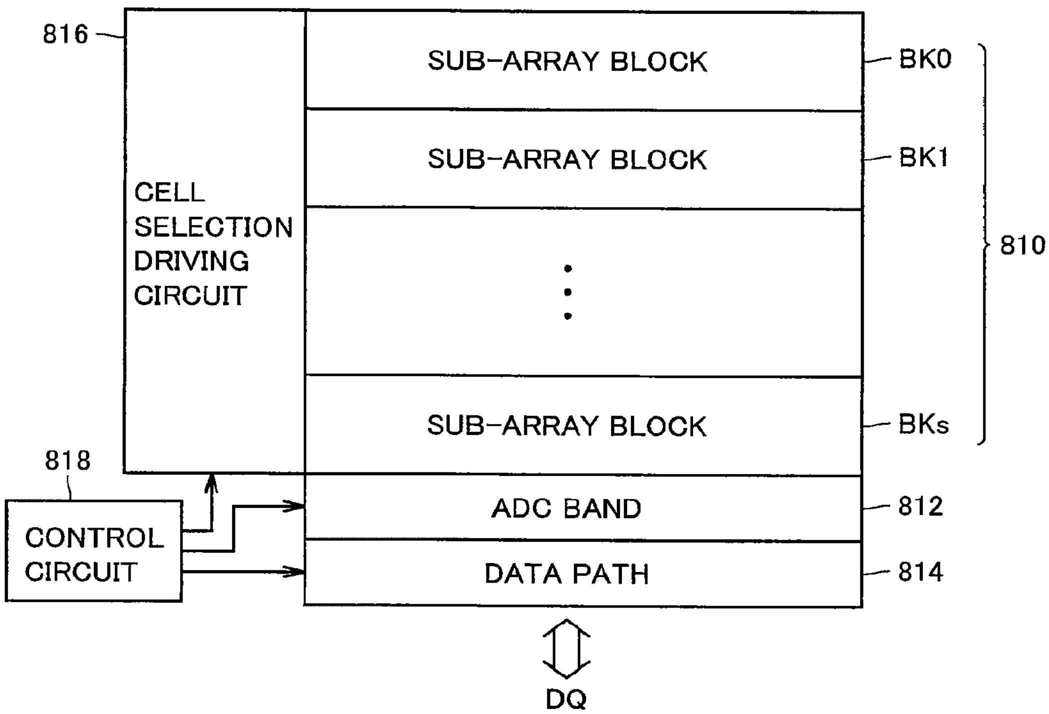

FIG. 145 schematically shows an entire configuration of a semiconductor signal processing device according to a seventeenth embodiment of the present invention.

Figure 146:
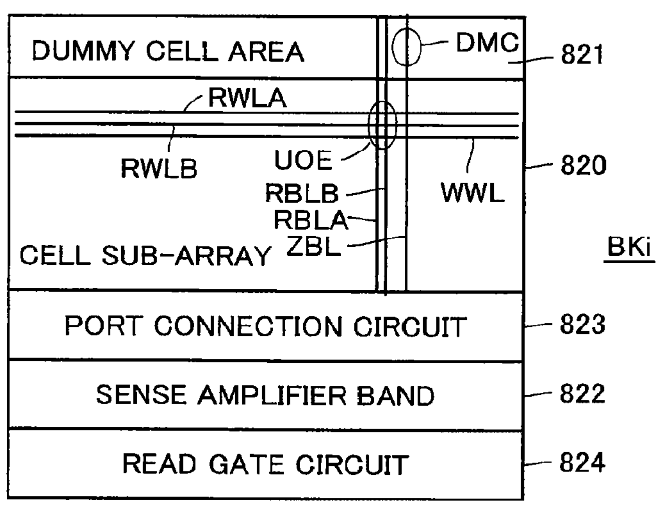

FIG. 146 schematically shows a configuration of a sub-array block of FIG. 145.

Figure 147:
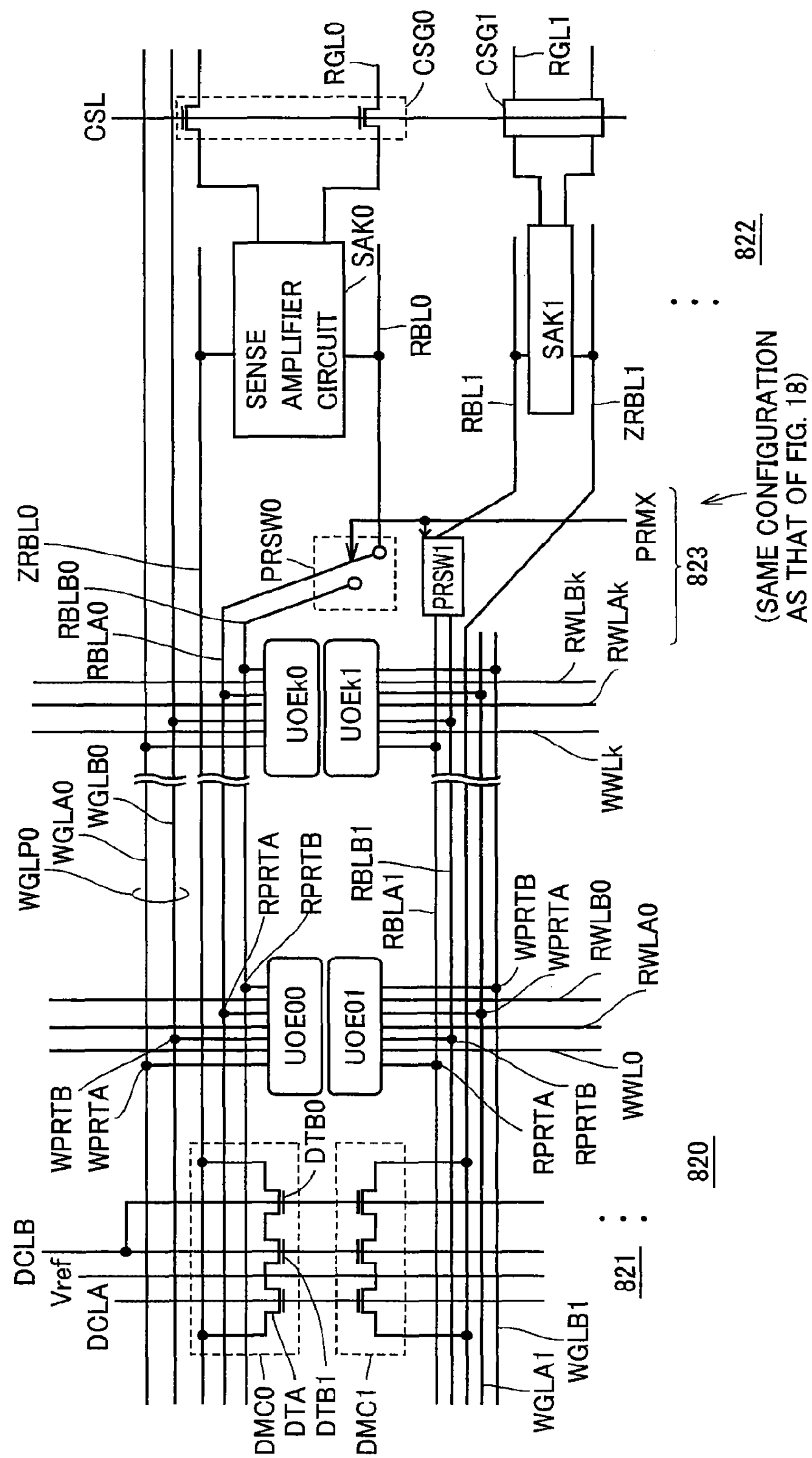

FIG. 147 schematically shows an example of a specific configuration of the sub-array block of FIG. 146.

Figure 148:
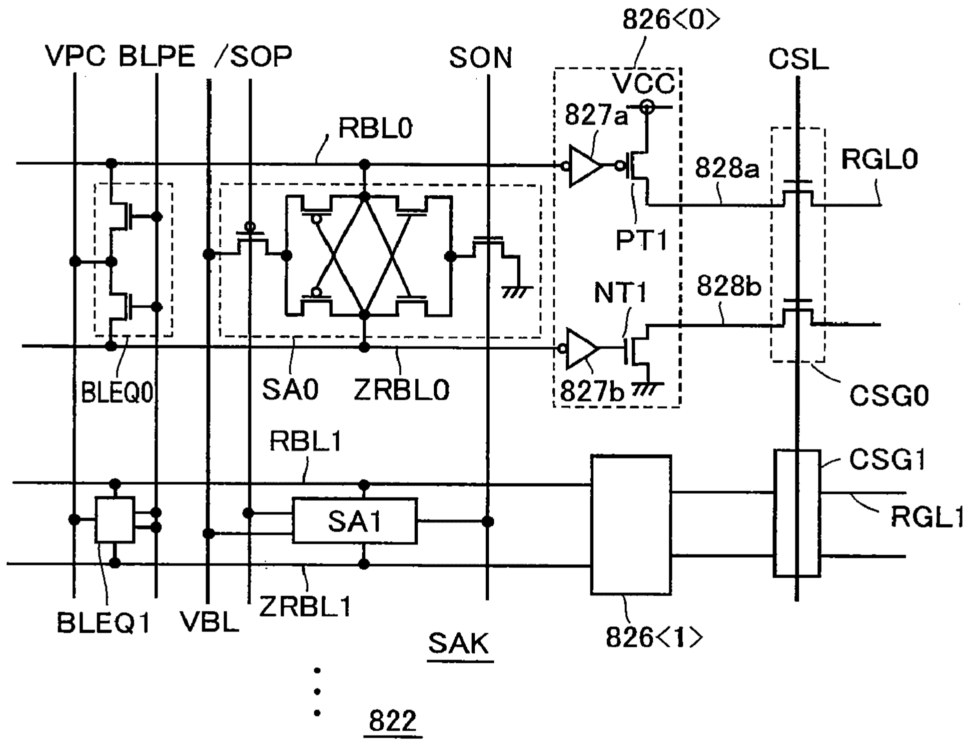

FIG. 148 shows an example of a configuration of a sense amplifier circuit of FIG. 147.

Figures 149, 150:
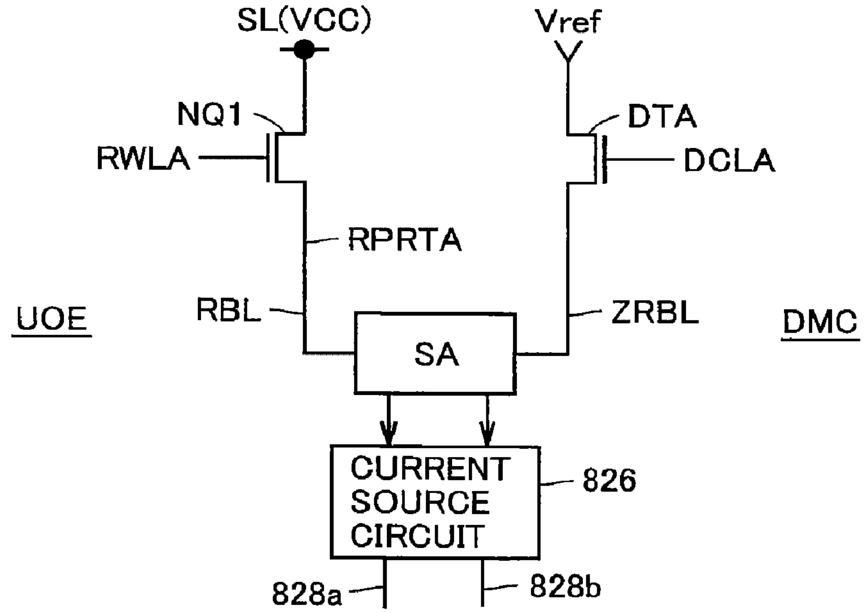

FIG. 149 schematically shows a connection manner of a unit operator cell and a sense amplifier circuit in the seventeenth embodiment of the present invention.

FIG. 150 shows a correlation between storage data of the unit operator cell and an output current of the sense amplifier circuit in an arrangement of FIG. 149.

Figure 151:
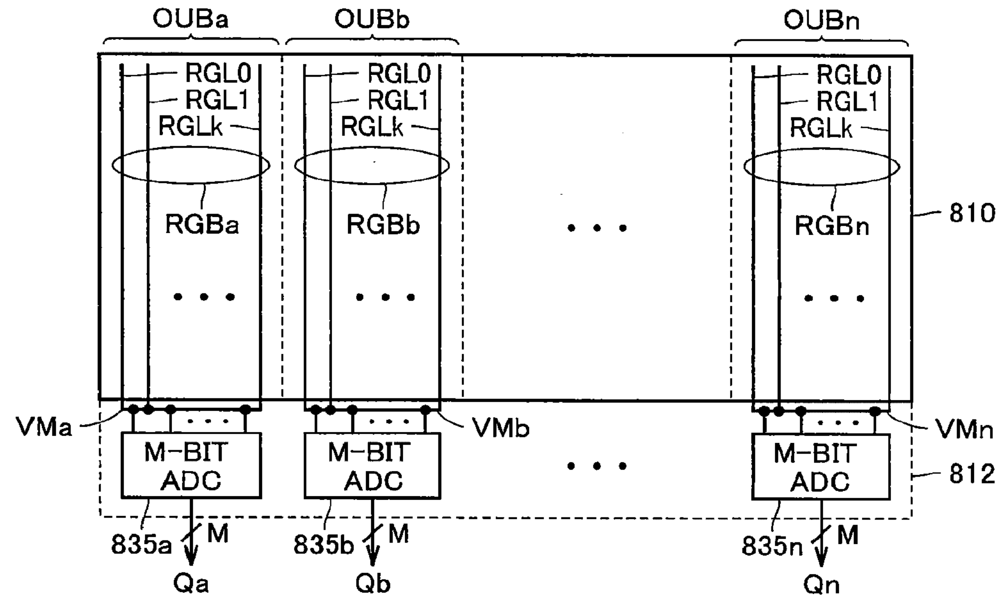

FIG. 151 schematically shows a configuration of an ADC band of FIG. 145.

Figure 152:
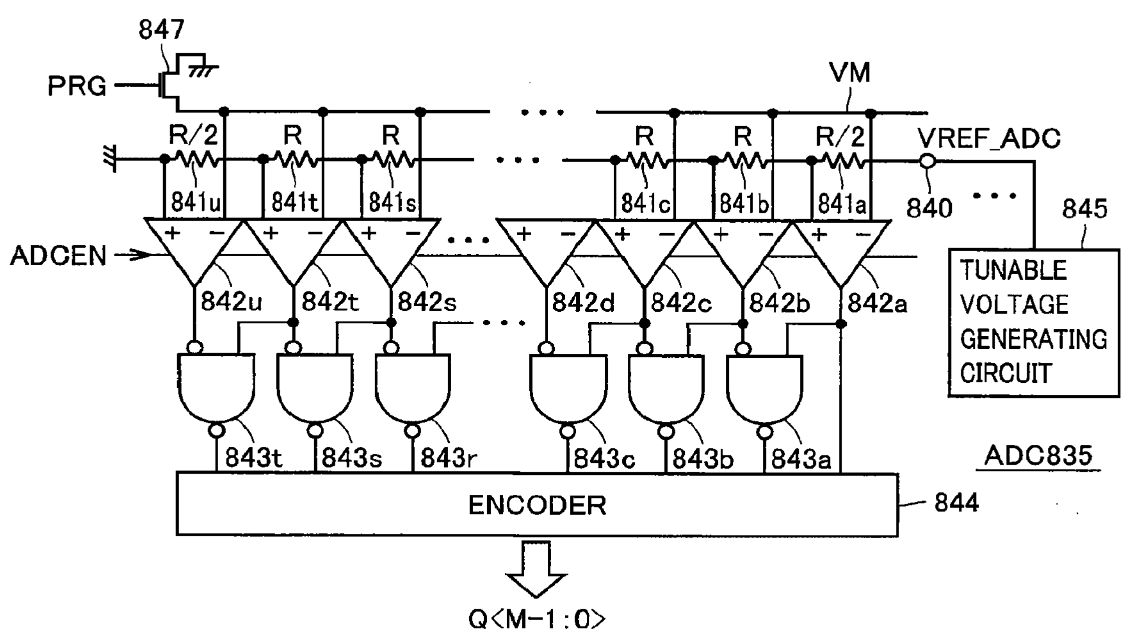

FIG. 152 shows an example of a configuration of ADC included in the ADC band of FIG. 151.

Figure 153:
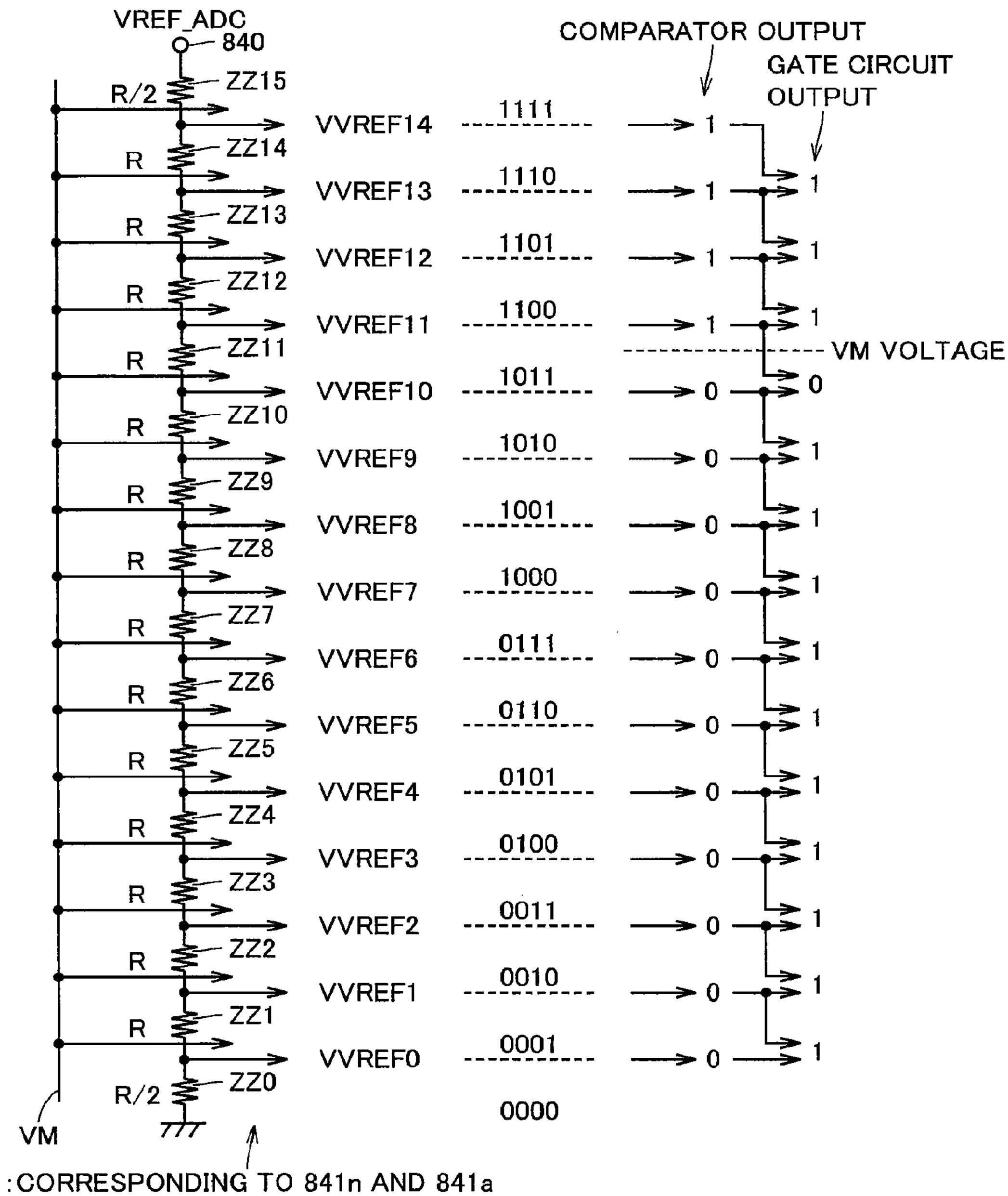

FIG. 153 is a diagram used for explaining an A/D conversion operation of ADC of FIG. 152.

Figure 154:
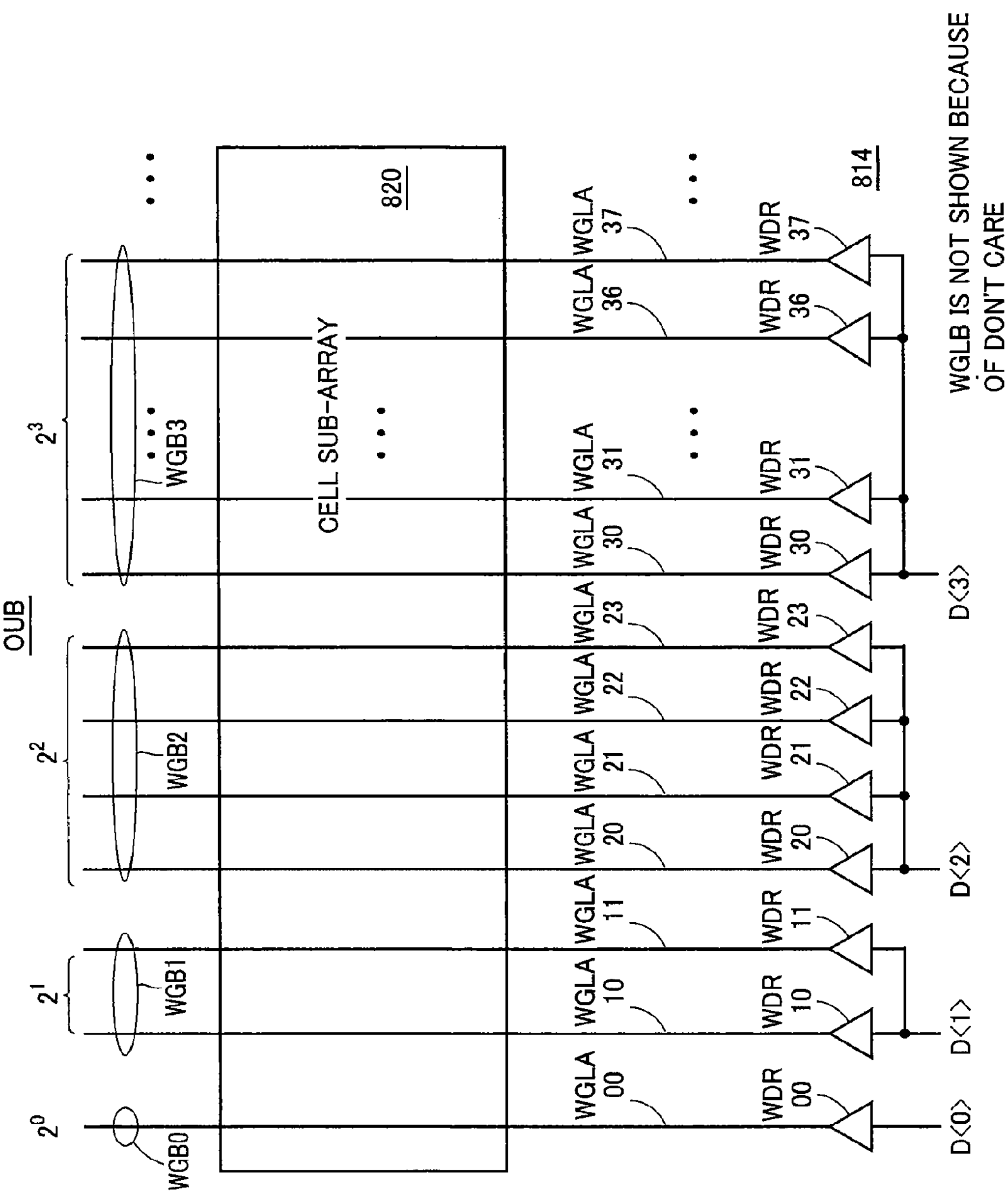

FIG. 154 schematically shows a configuration of a data write unit in a data path of FIG. 145.

Figure 155:
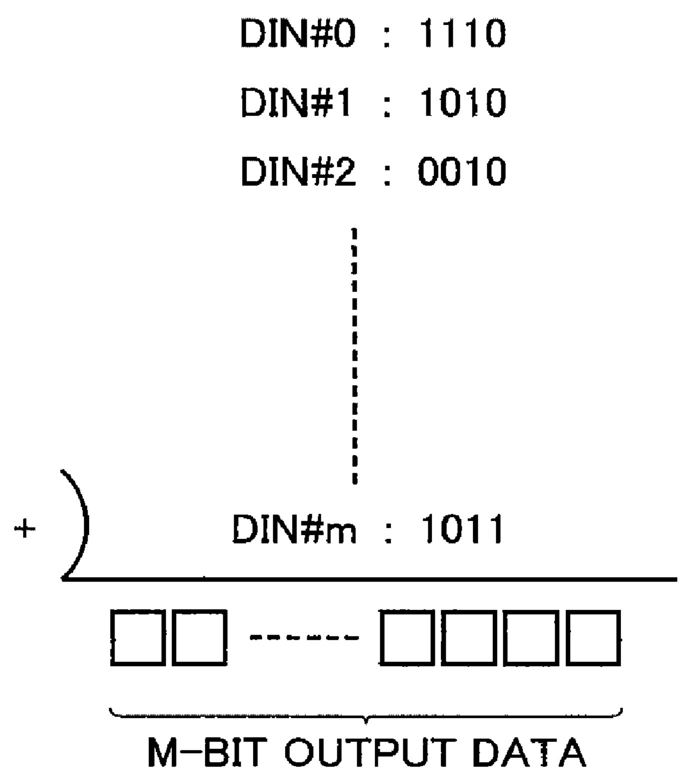

FIG. 155 shows an example of operation performed in the seventeenth embodiment of the present invention.

Figure 156:
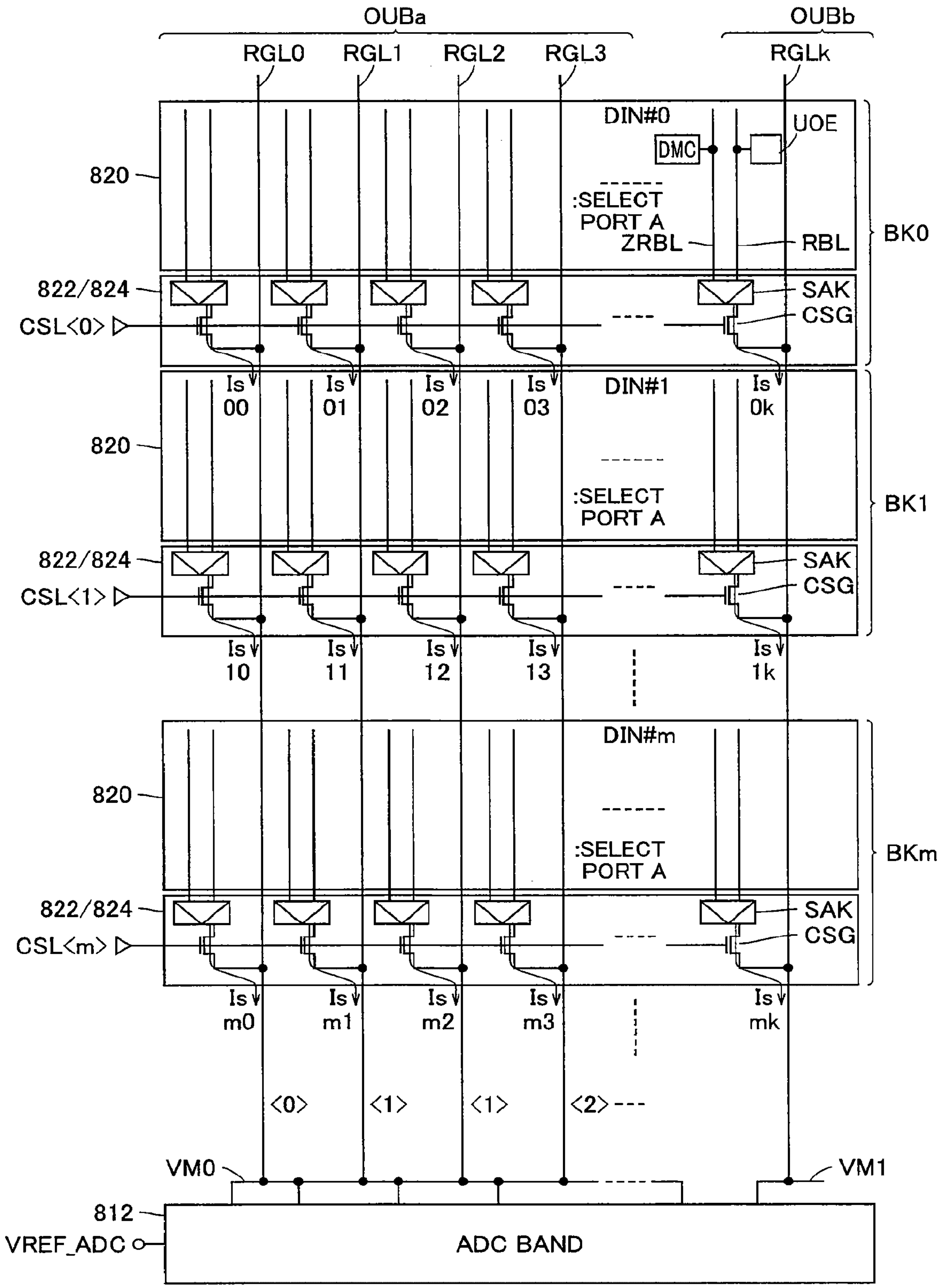

FIG. 156 schematically shows a configuration of a data read unit in the semiconductor signal processing device according to the seventeenth embodiment of the present invention.

Figure 157:
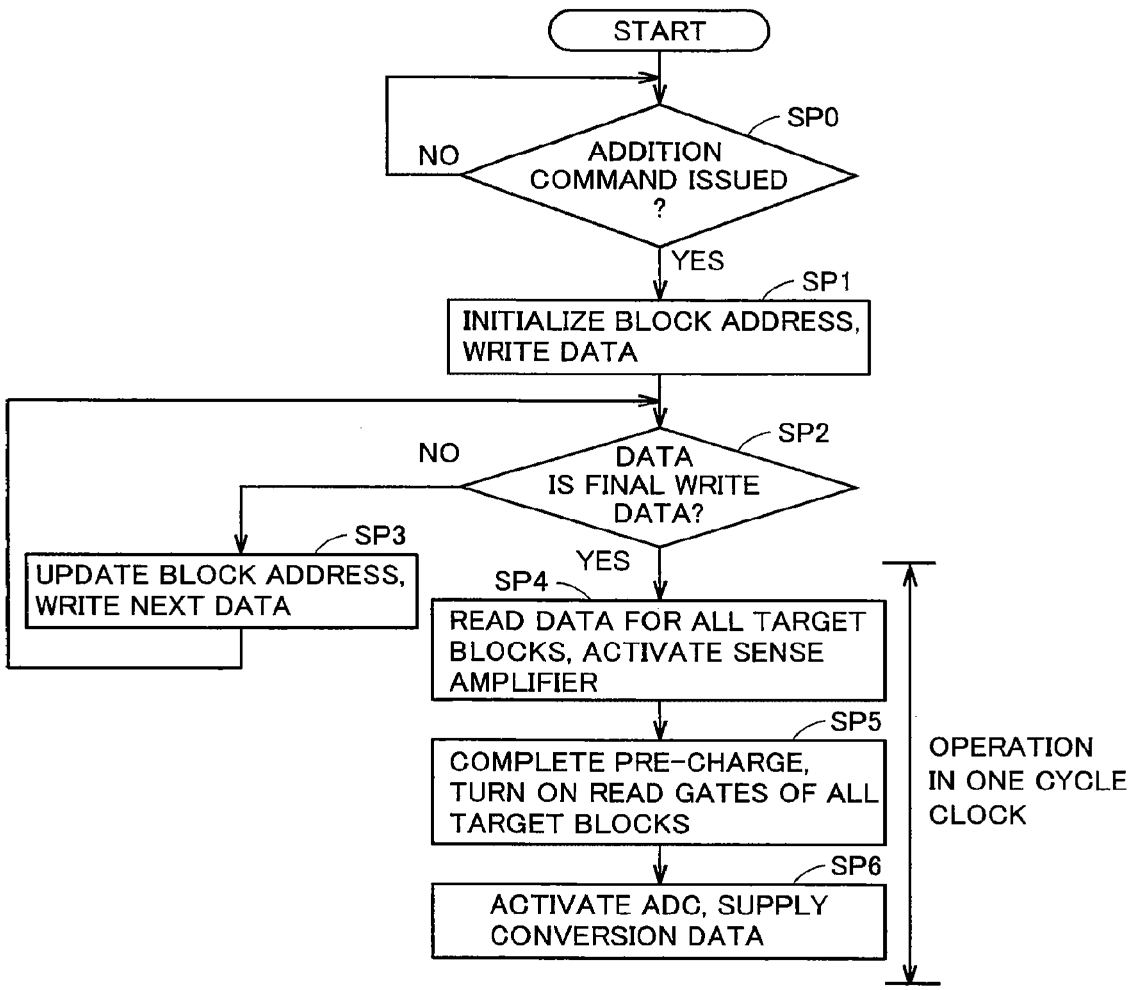

FIG. 157 is a flowchart representing an addition processing of the semiconductor signal processing device according to the seventeenth embodiment of the present invention.

Figure 158:
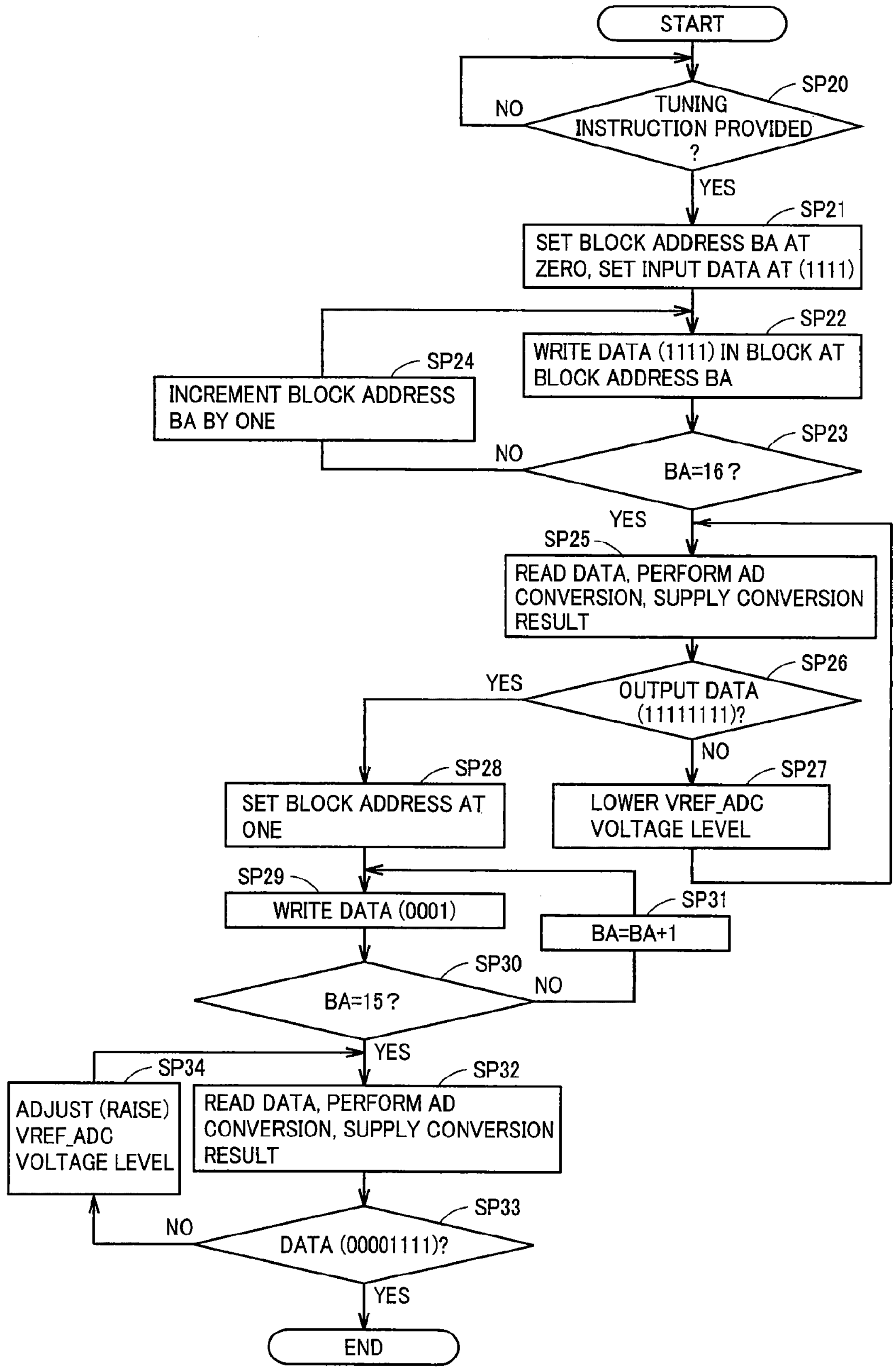

FIG. 158 is a flowchart representing an operation of tuning a conversion reference voltage supplied to ADC of the semiconductor signal processing device according to the seventeenth embodiment of the present invention.

Figure 159:
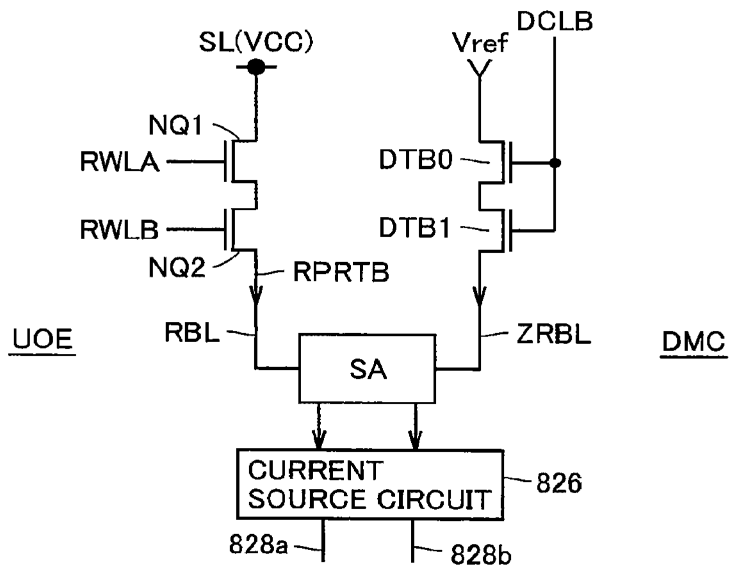

FIG. 159 schematically shows a connection manner of a unit operator cell and sense amplifier circuit in an eighteenth embodiment of the present invention.

Figure 160:
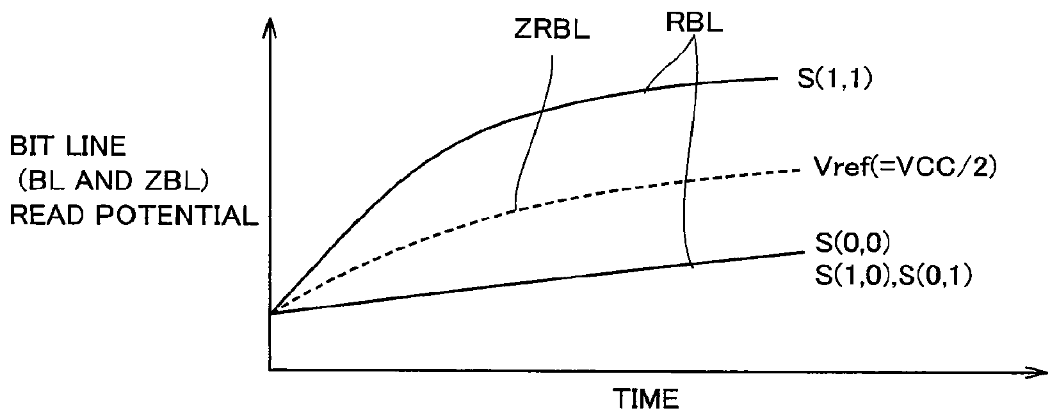

FIG. 160 schematically shows a change of a sense read bit line potential over time during data read in an arrangement of FIG. 159.

FIG. 161 shows, in a list form, the correlation between an output current of the sense amplifier and a storage state of the unit operator cell of FIG. 160.

FIG. 162 represents an example of an operation performed in the eighteenth embodiment of the present invention.

Figure 163:
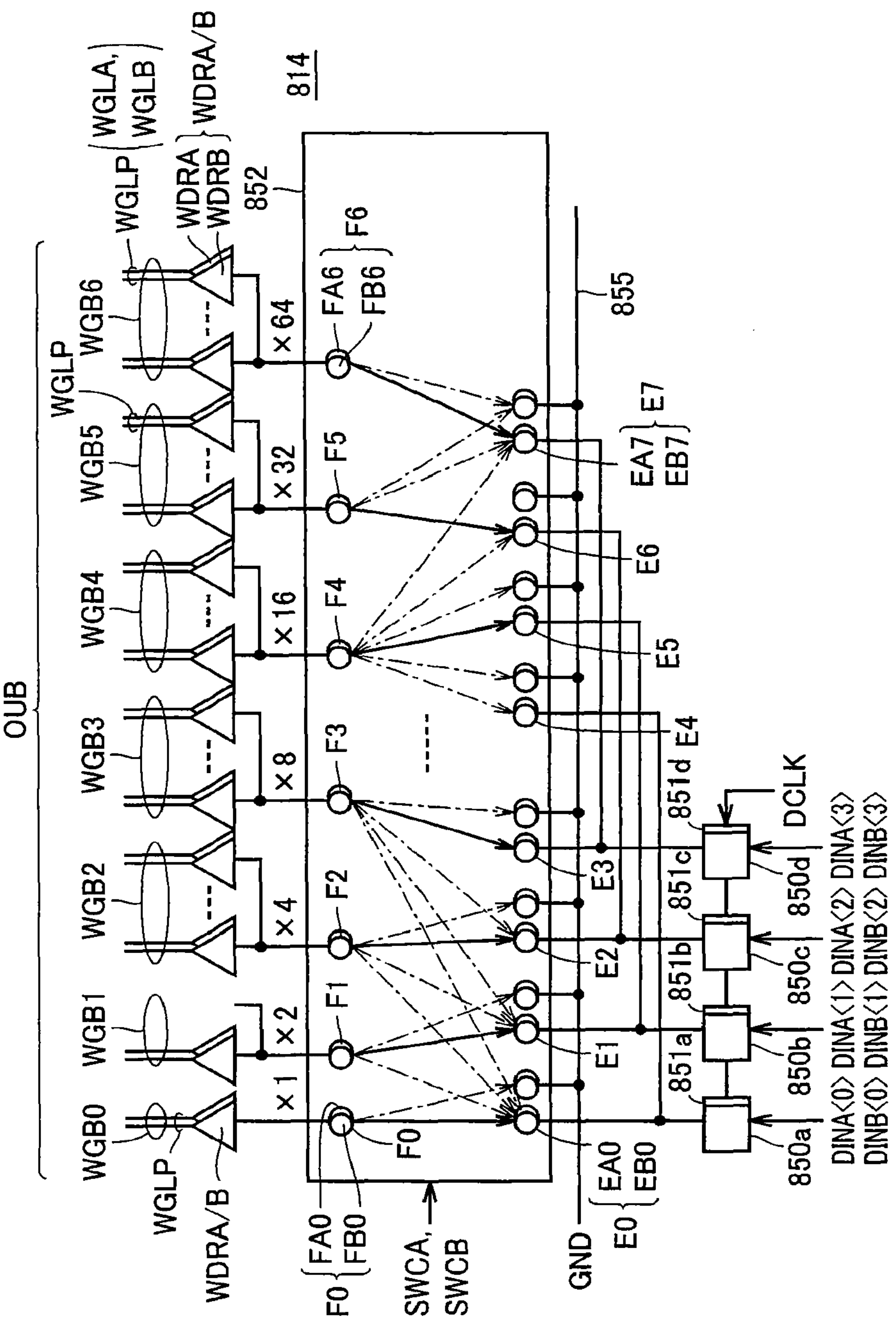

FIG. 163 schematically shows a configuration of a data path in the semiconductor signal processing device according to the eighteenth embodiment of the present invention.

Figure 164:
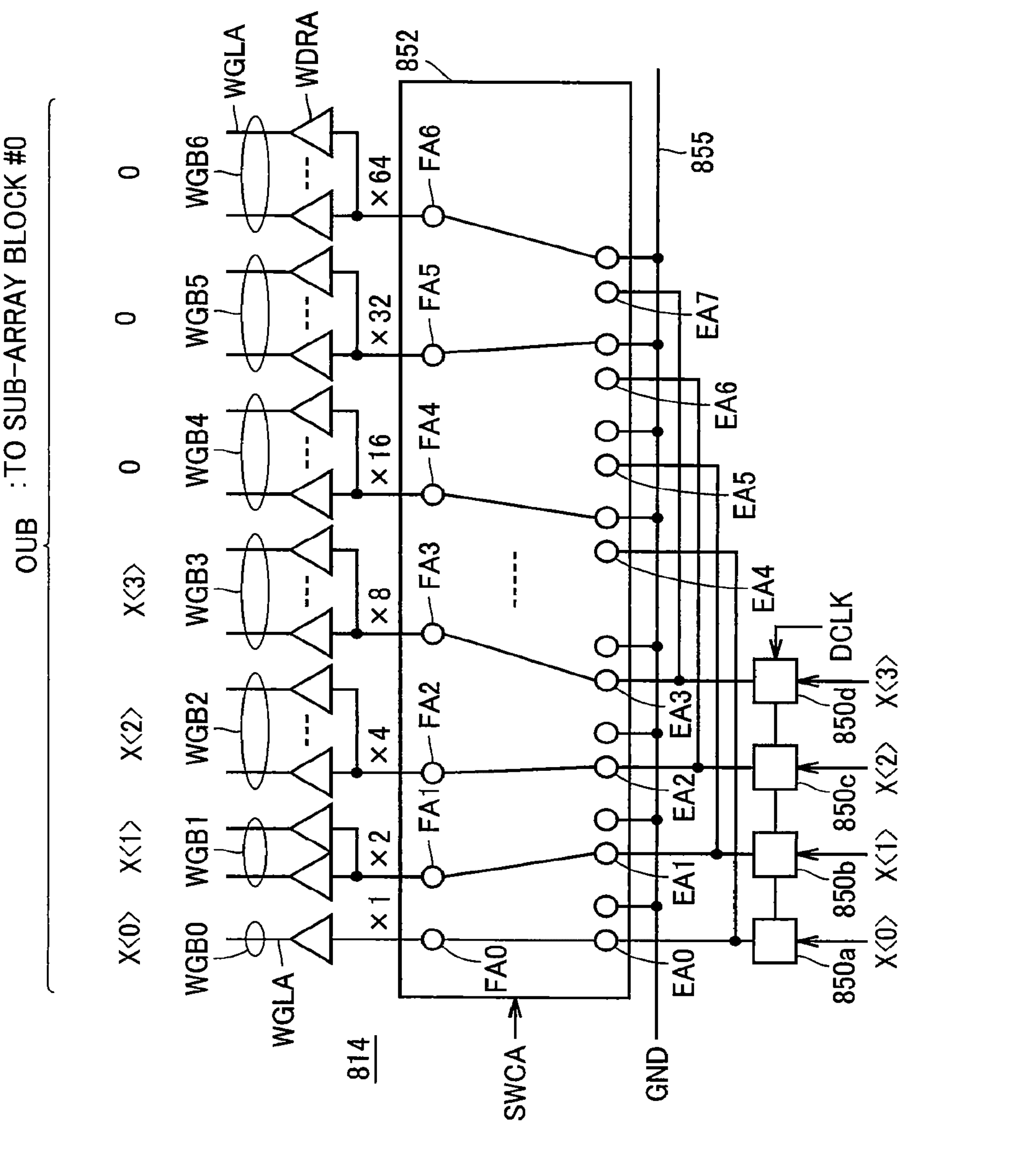

FIG. 164 schematically shows a connection manner for a port A of a switch box at a first stage in performing the operation represented in FIG. 162.

Figure 165:
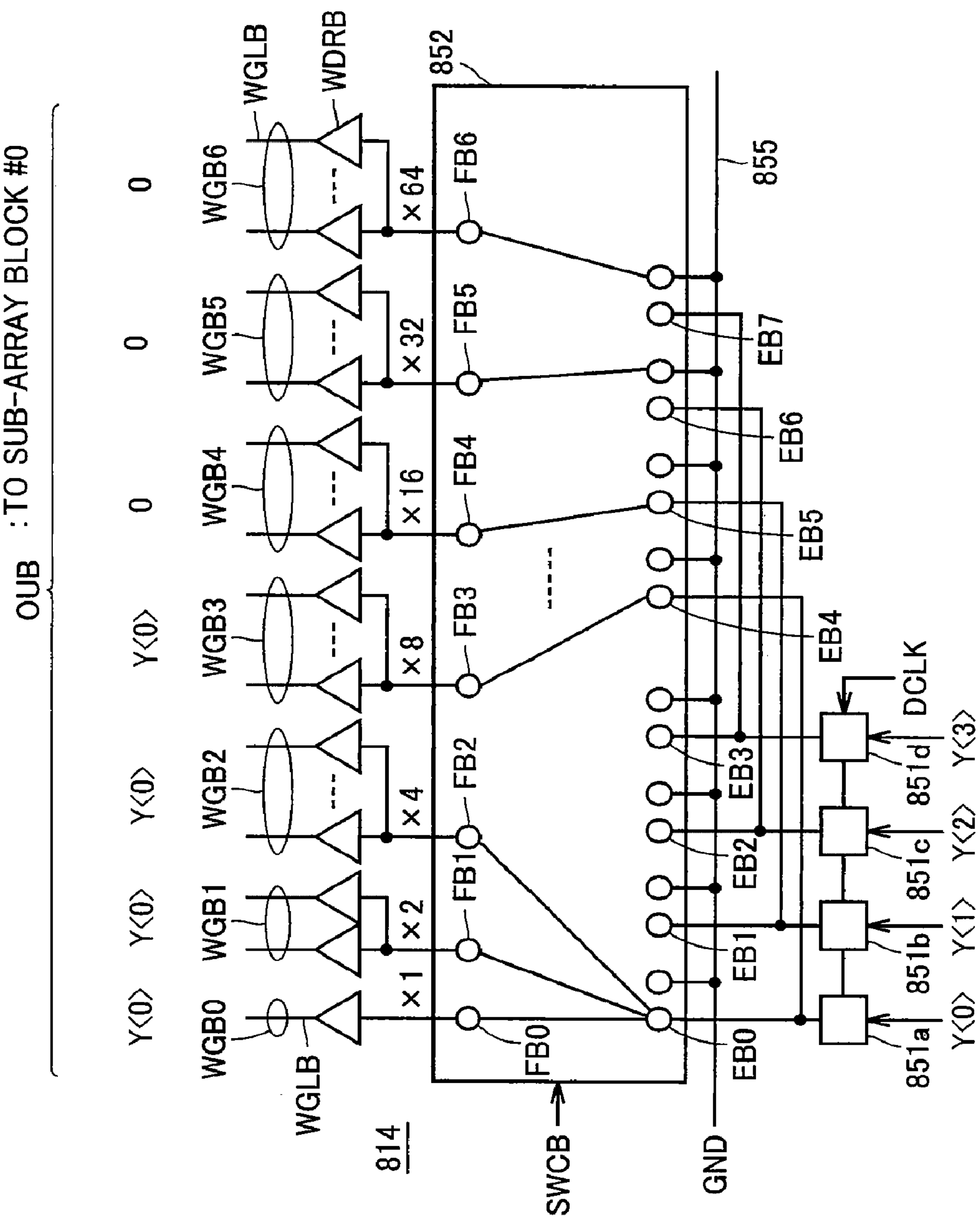

FIG. 165 schematically shows a connection manner for a port B of the switch box at the first stage in performing the operation represented in FIG. 162.

Figure 166:
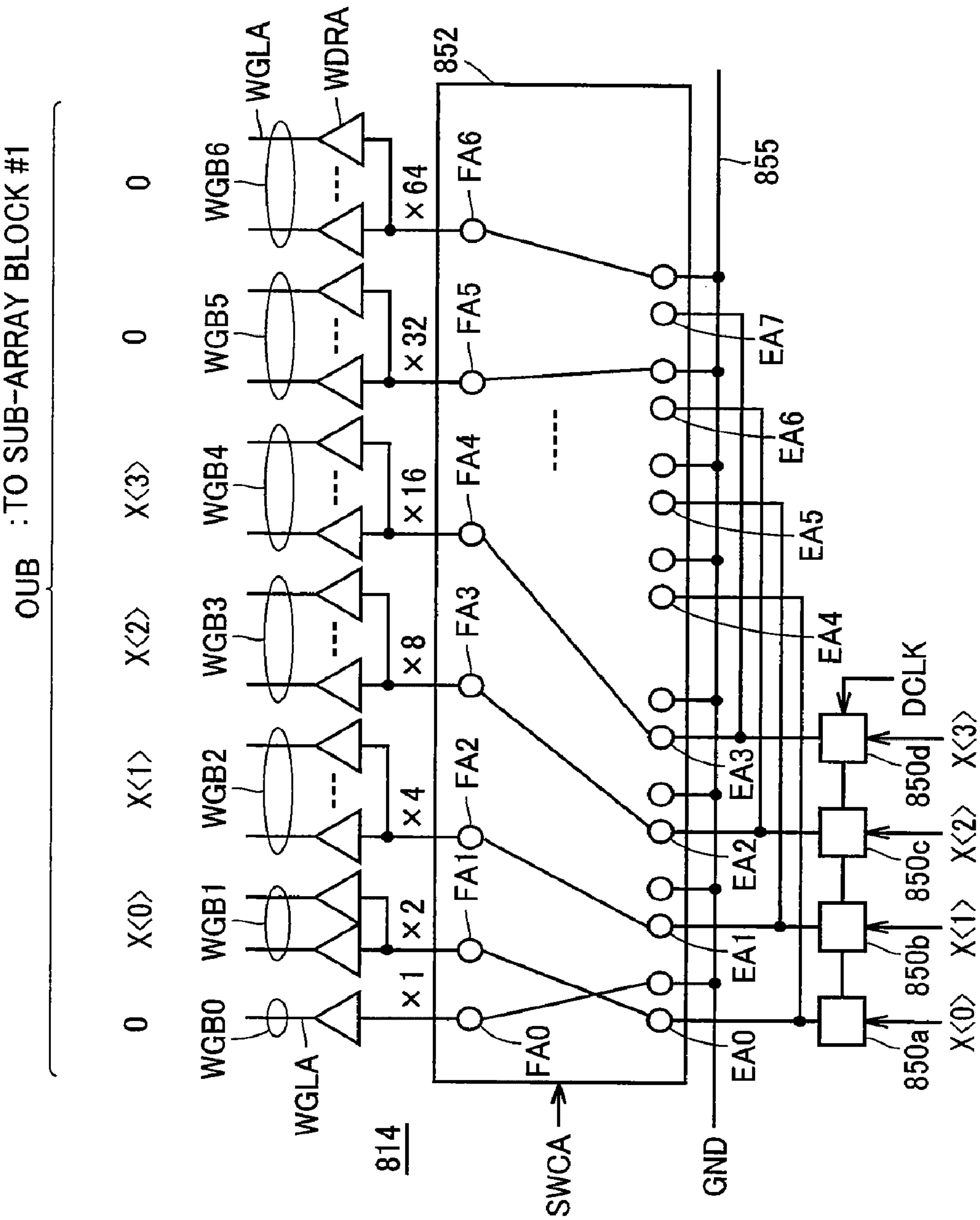

FIG. 166 schematically shows a connection manner for the port A of the switch box when a second partial product is produced in performing the operation of FIG. 162.

Figure 167:
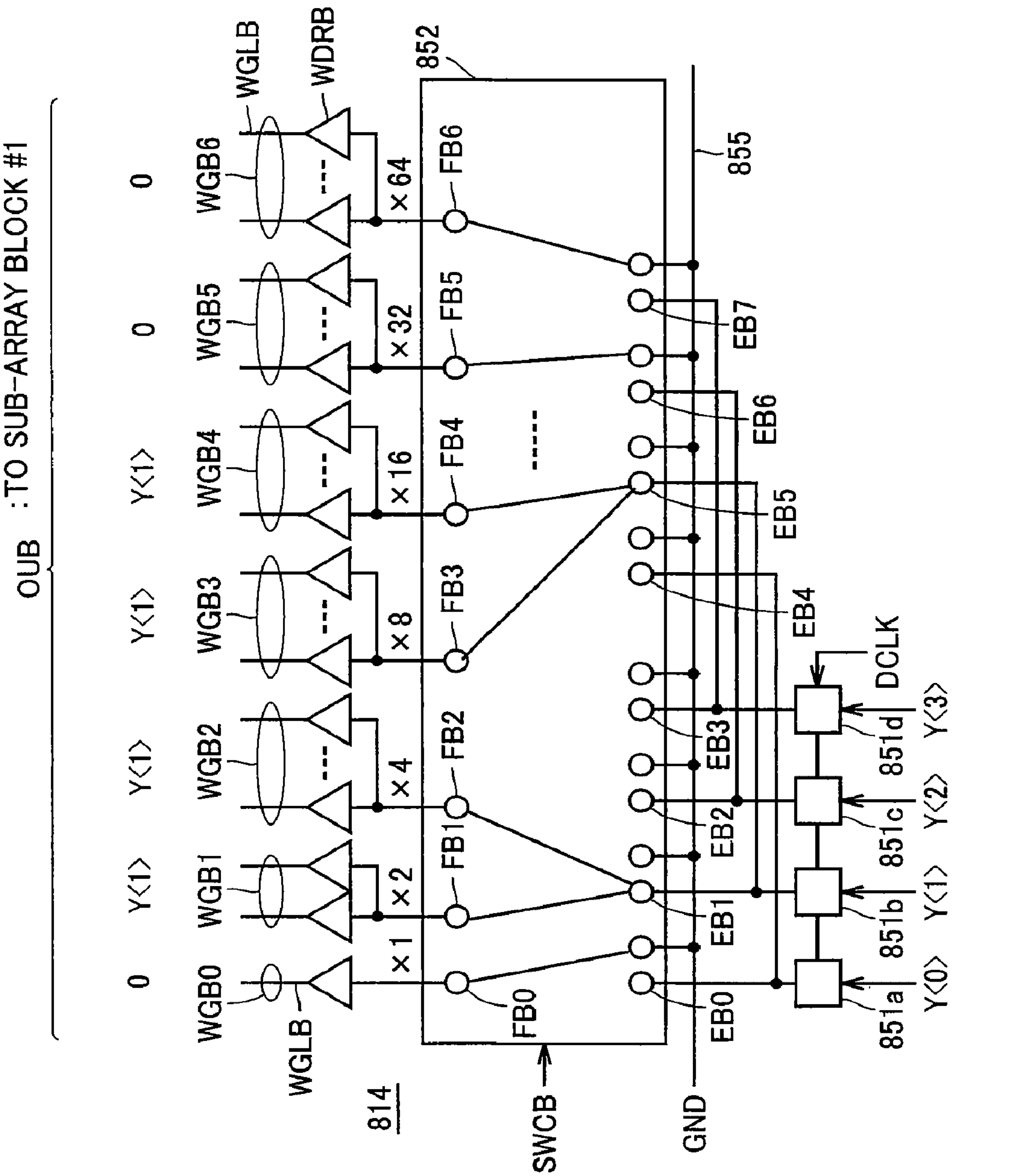

FIG. 167 schematically shows a connection mode for the port B of the switch box when the second partial product is produced in performing the operation represented in FIG. 162.

Figure 168:
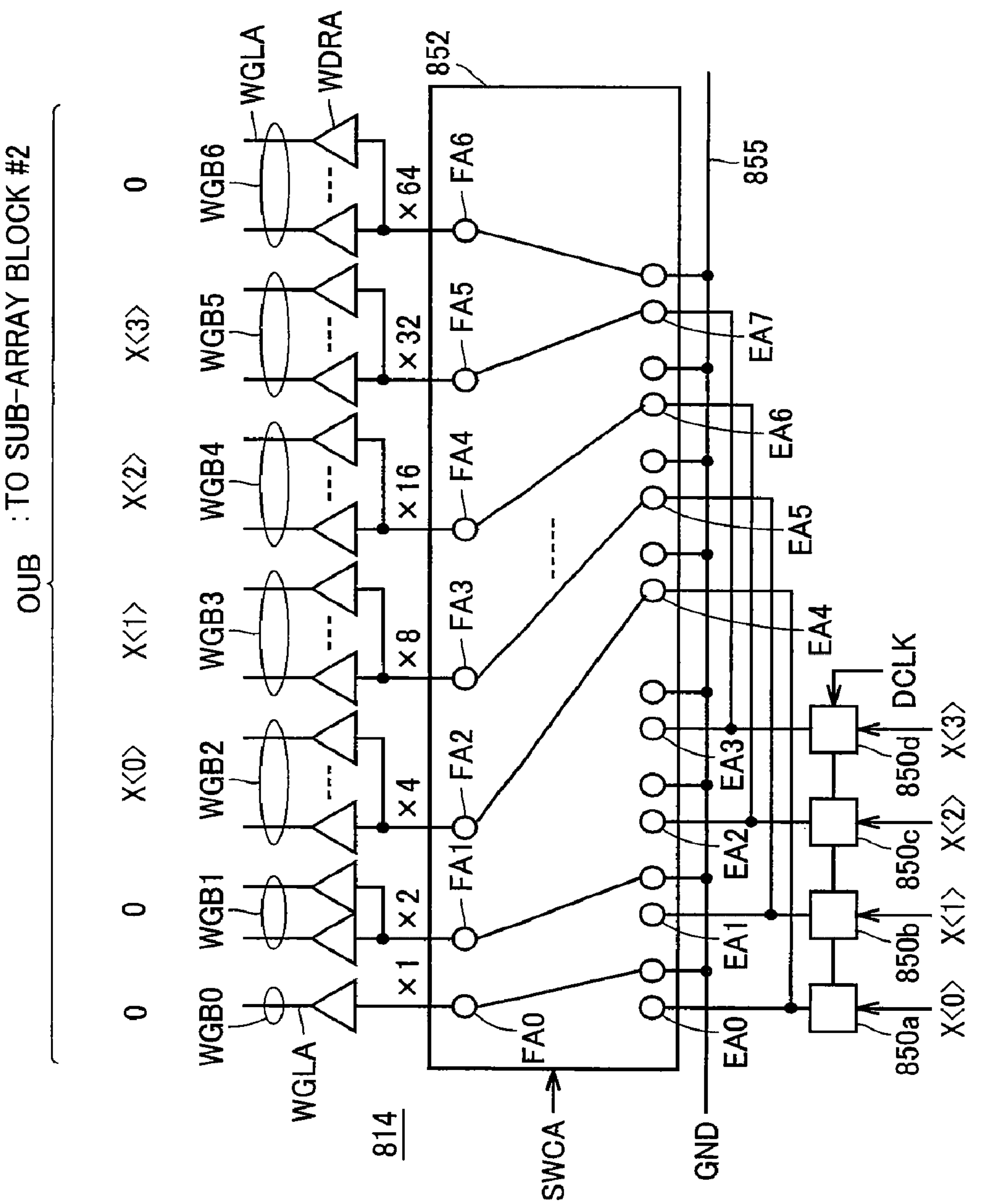

FIG. 168 schematically shows a connection path for the port A of the switch box when a third partial product is produced in performing the operation of FIG. 162.

Figure 169:
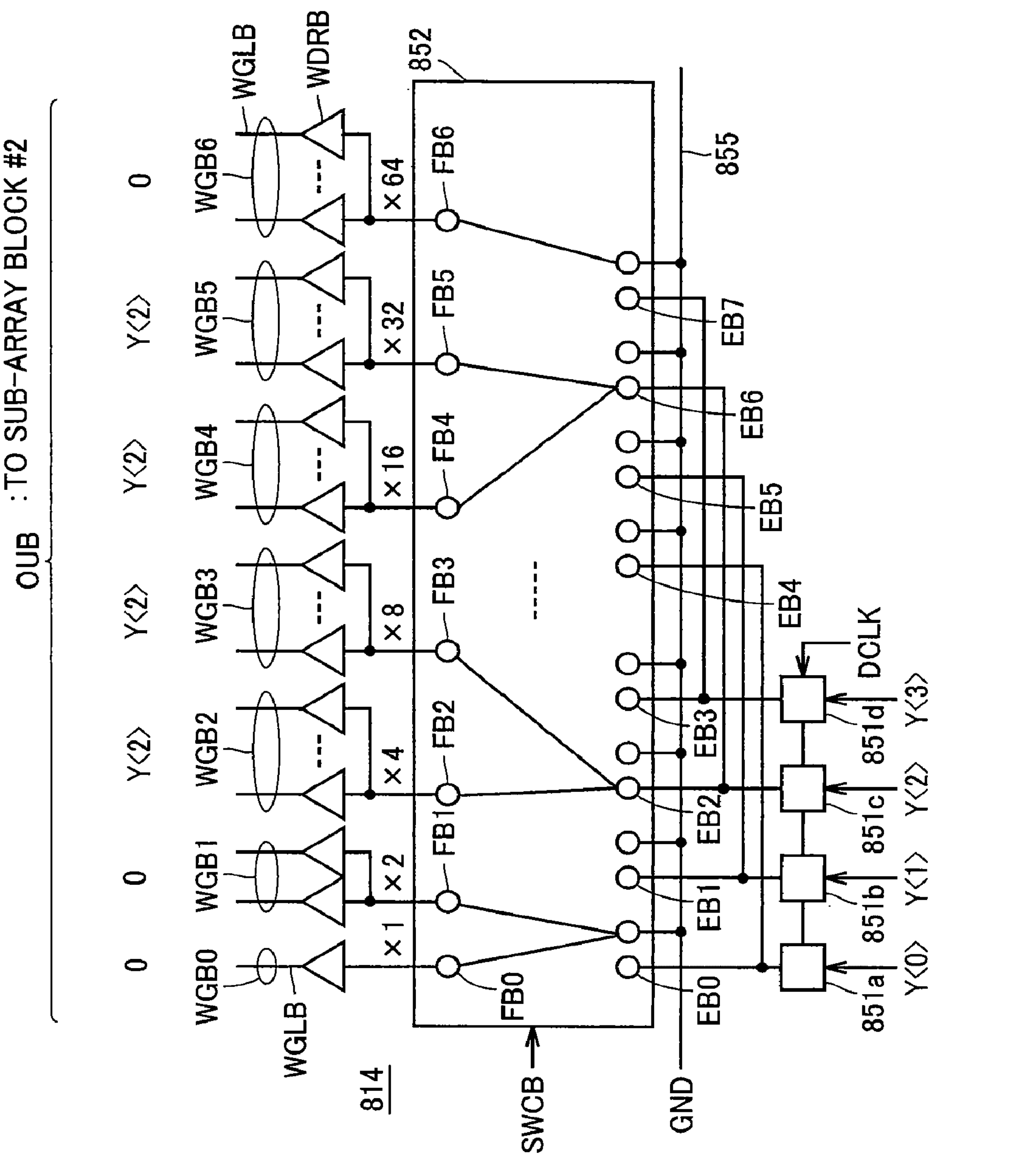

FIG. 169 schematically shows a connection path for the port B of the switch box when the third partial product is produced in performing the operation of FIG. 162.

Figure 170:
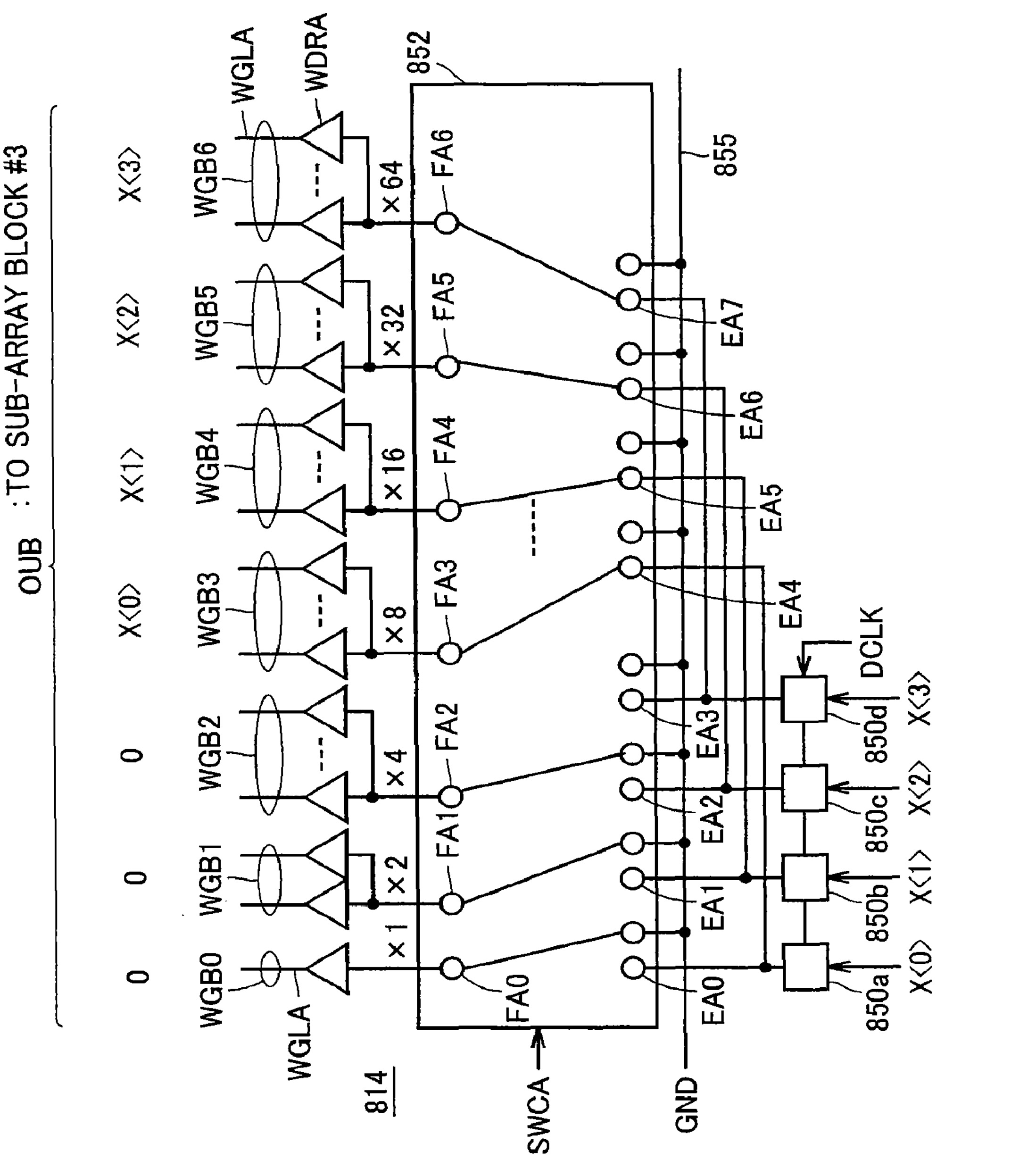

FIG. 170 schematically shows a connection path for the port A of the switch box when a fourth partial product is produced in performing the operation of FIG. 162.

Figure 171:
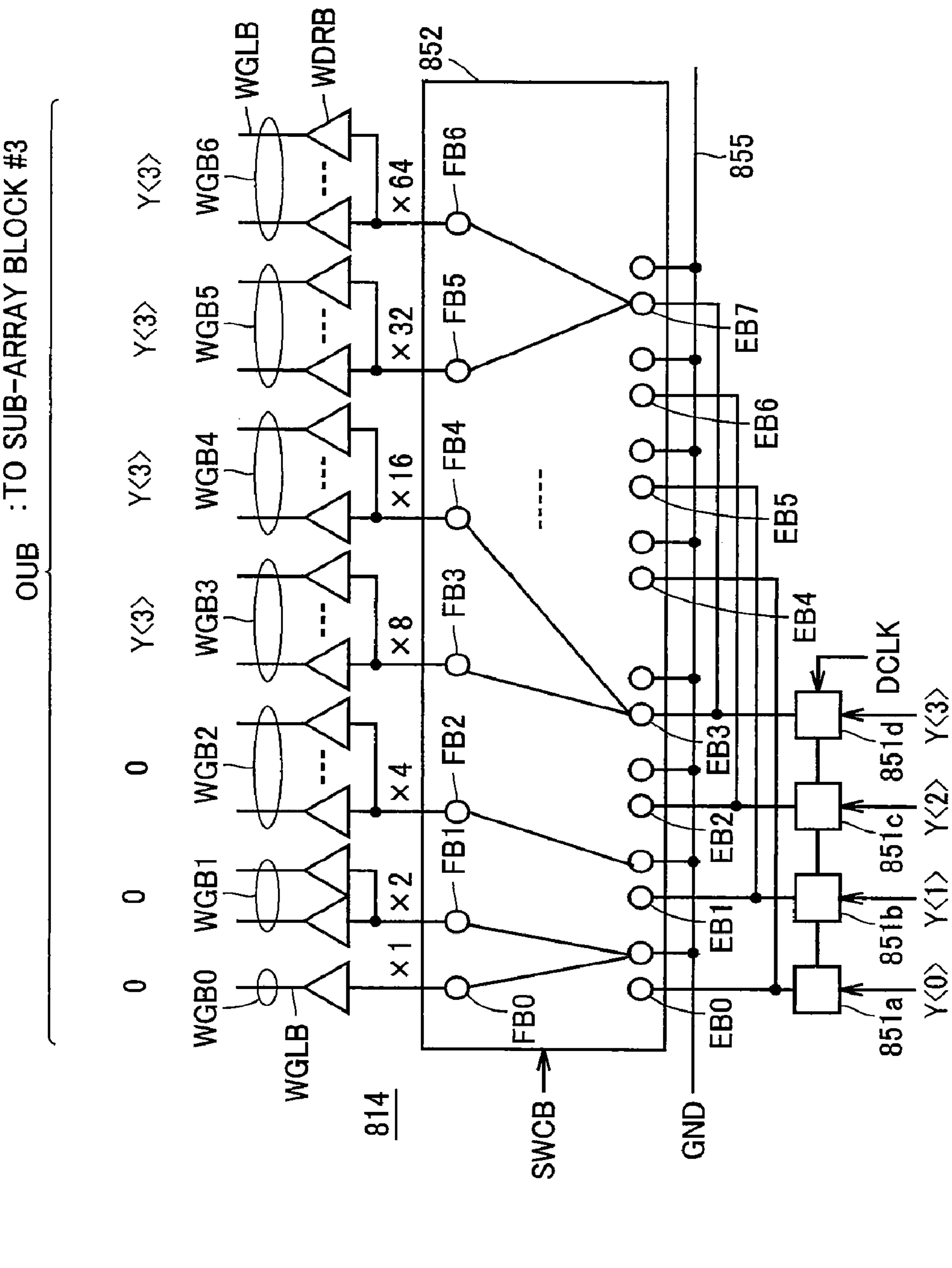

FIG. 171 schematically shows a connection path for the port B of the switch box when the fourth partial product is produced in performing the operation of FIG. 162.

Figure 172:
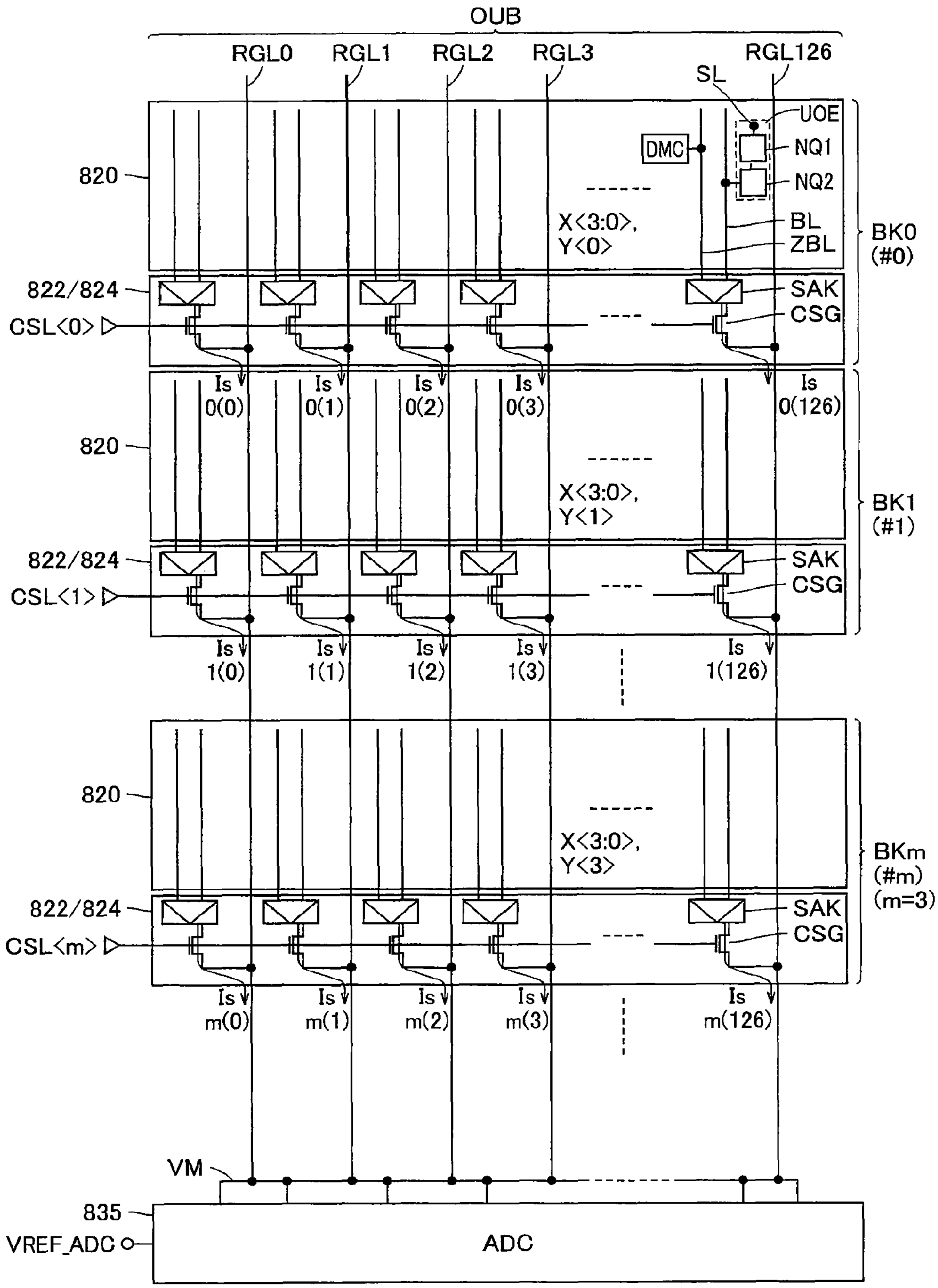

FIG. 172 schematically shows a configuration of a data read section in the semiconductor signal processing device according to the eighteenth embodiment of the present invention.

Figure 173:
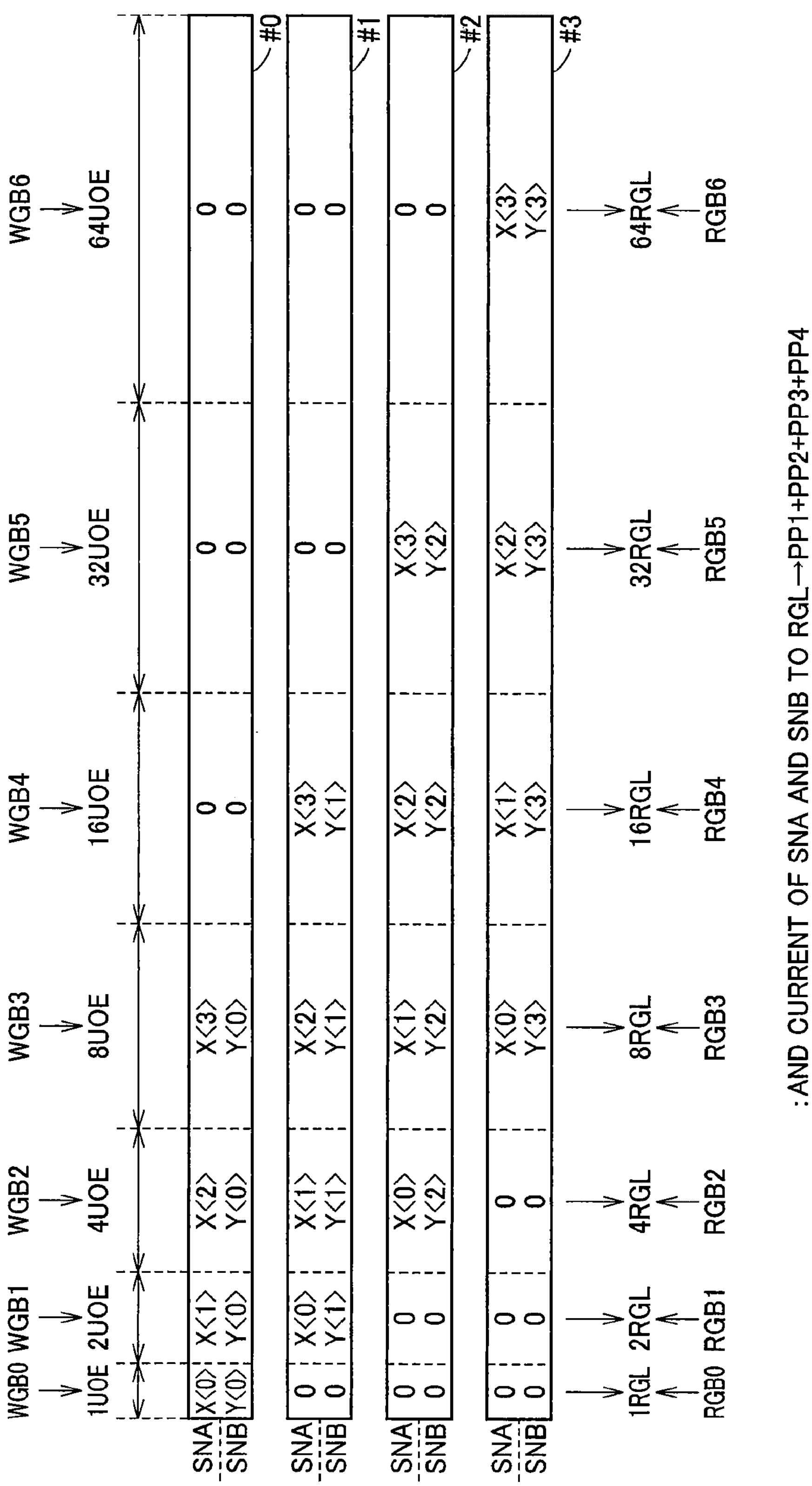

FIG. 173 schematically shows an example of a storage manner of operation data bits in the semiconductor signal processing device according to the eighteenth embodiment of the present invention.

Figure 174:
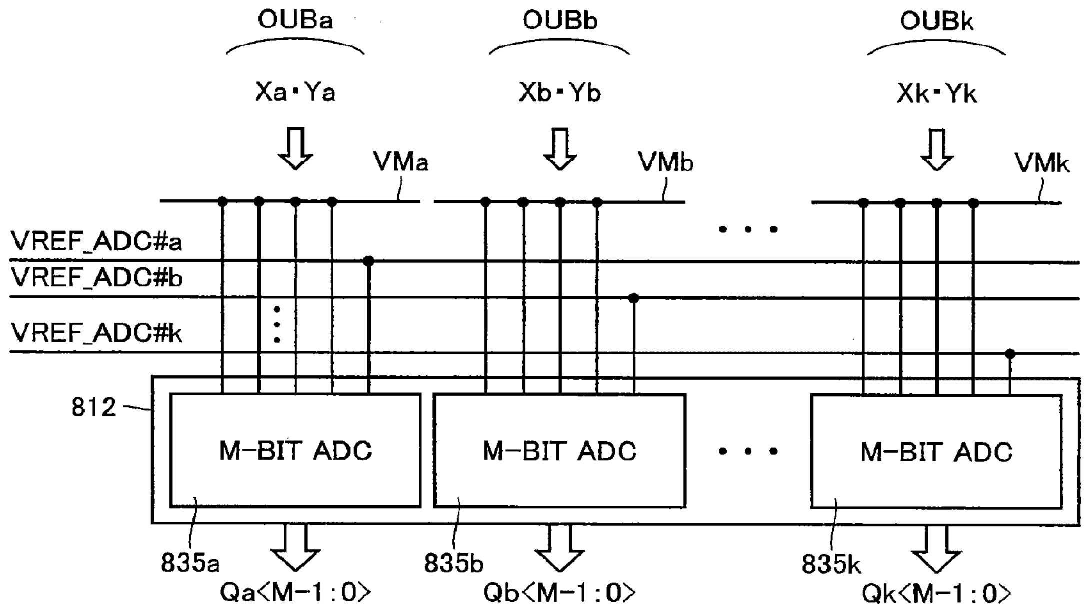

FIG. 174 schematically shows a configuration of an ADC band of the semiconductor signal processing device according to the eighteenth embodiment of the present invention.

Figure 175:
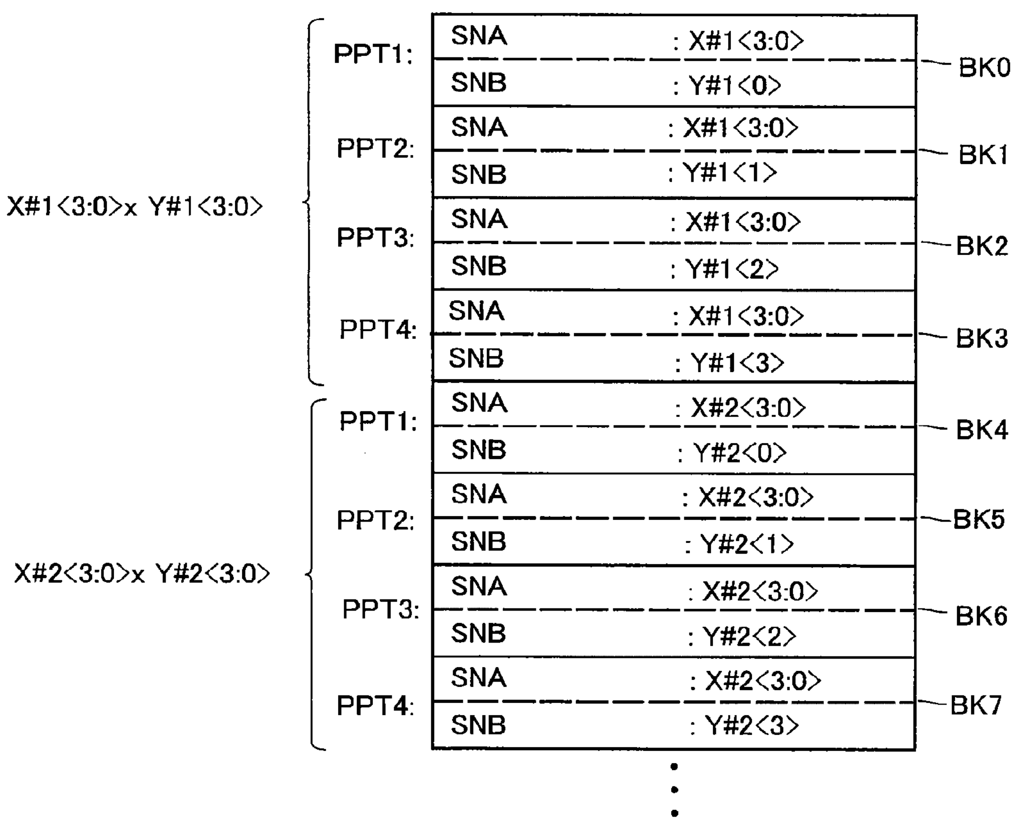

FIG. 175 schematically shows an operation manner in a modification of the semiconductor signal processing device according to the eighteenth embodiment of the present invention.

Figure 176:
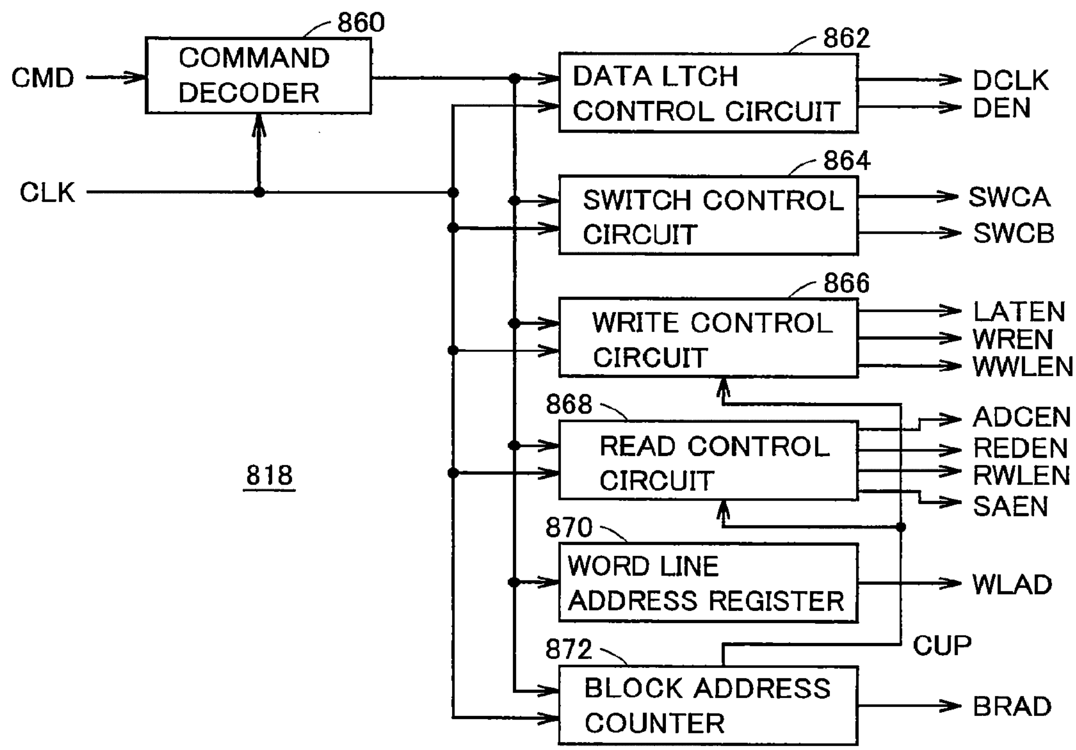

FIG. 176 schematically shows an example of a configuration of a control circuit in the semiconductor signal processing device according to the eighteenth embodiment of the present invention.

Figure 177:
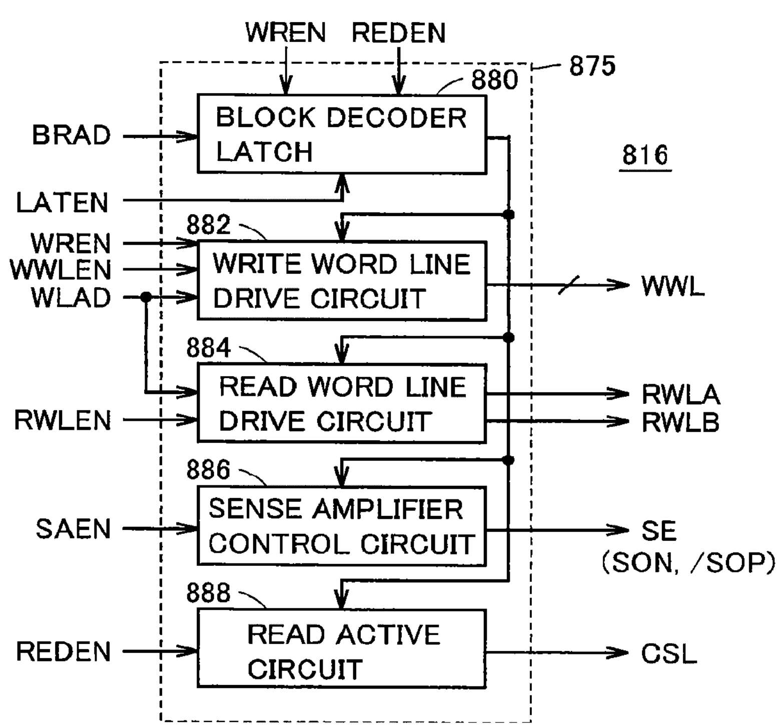

FIG. 177 schematically shows a configuration of a local cell selection circuit included in a cell selection driving circuit of the semiconductor signal processing device according to the second embodiment of the present invention.

Figure 178:
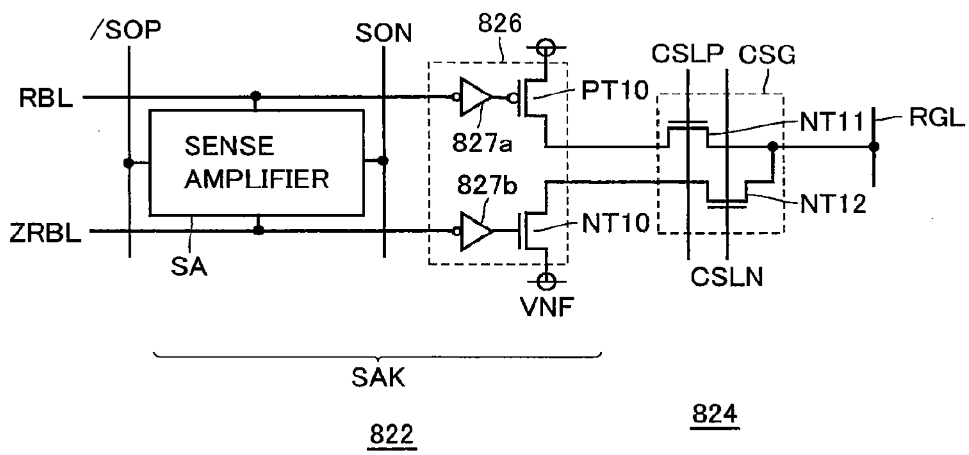

FIG. 178 schematically shows an example of configurations of a sense amplifier circuit and a read gate according to a nineteenth embodiment of the present invention.

Figure 179:
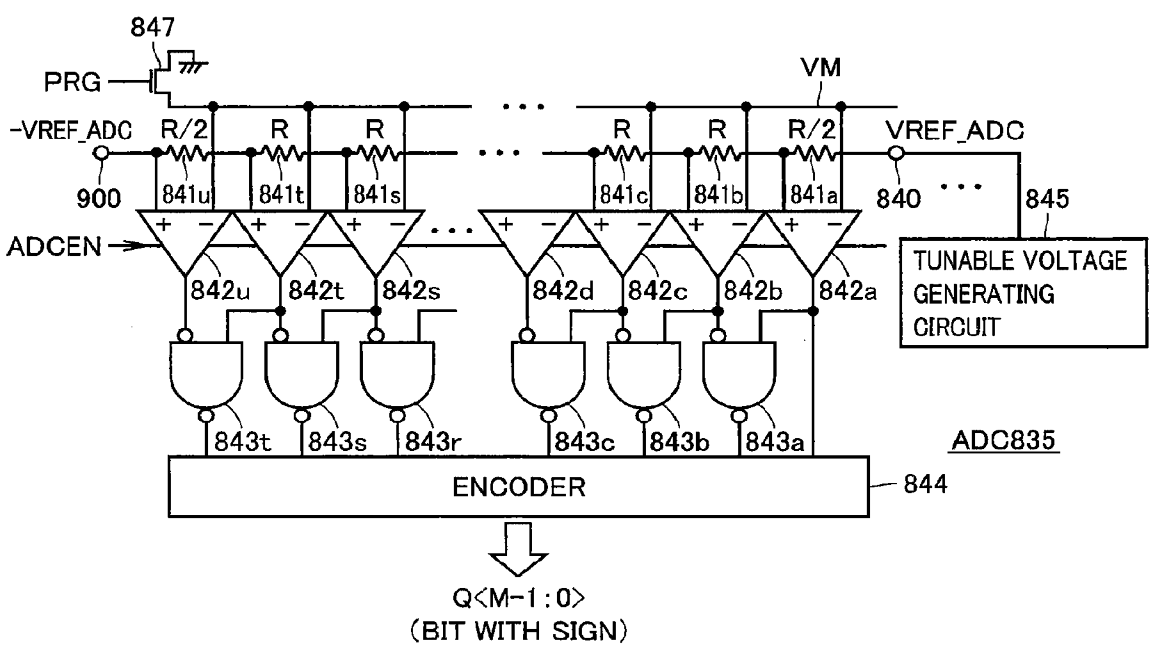

FIG. 179 schematically shows a configuration of ADC in a semiconductor signal processing device according to the nineteenth embodiment of the present invention.

Figure 180:
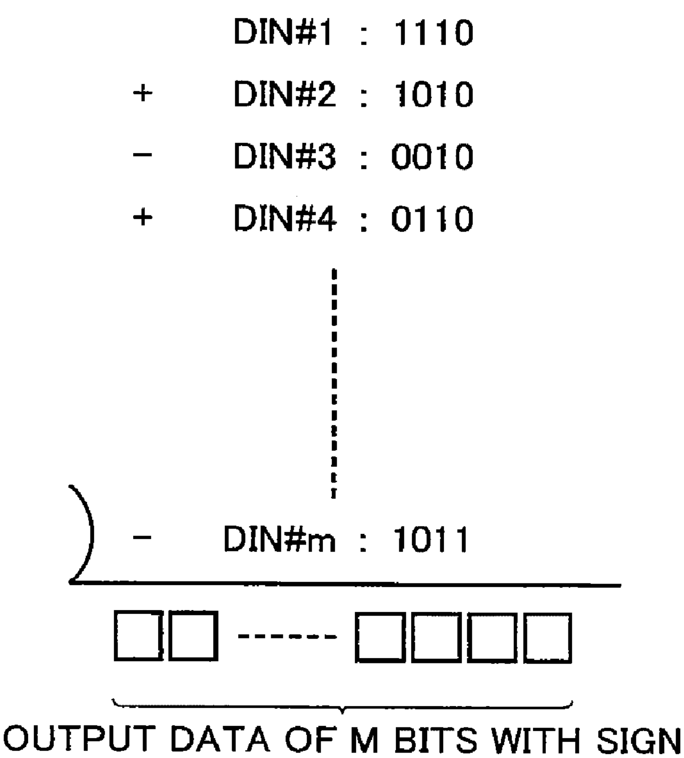

FIG. 180 schematically represents an example of operation performed in the nineteenth embodiment of the present invention.

Figure 181:
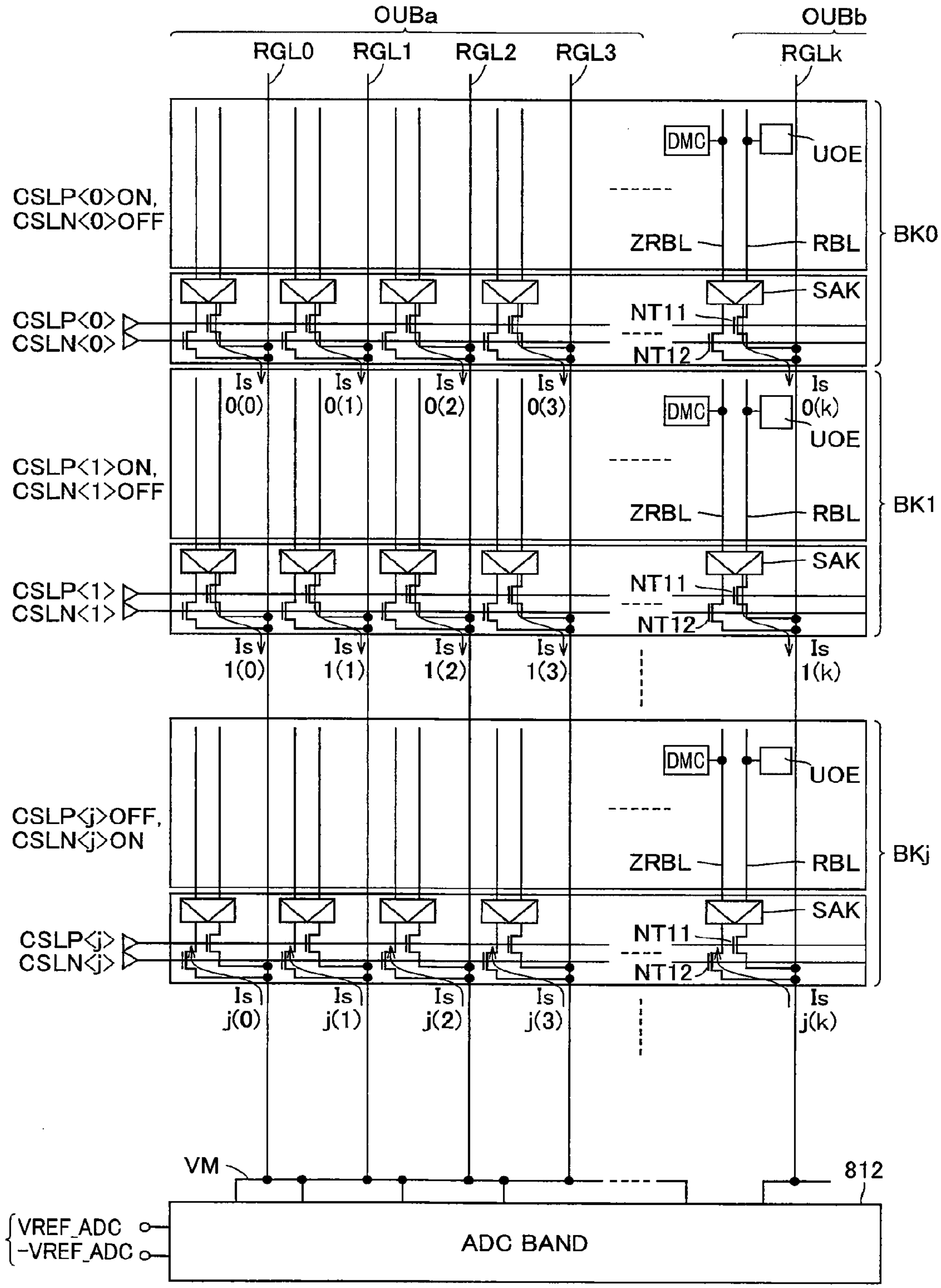

FIG. 181 schematically shows a configuration of a portion related to data read of the semiconductor signal processing device according to the nineteenth embodiment of the present invention.

Figures 182, 183:
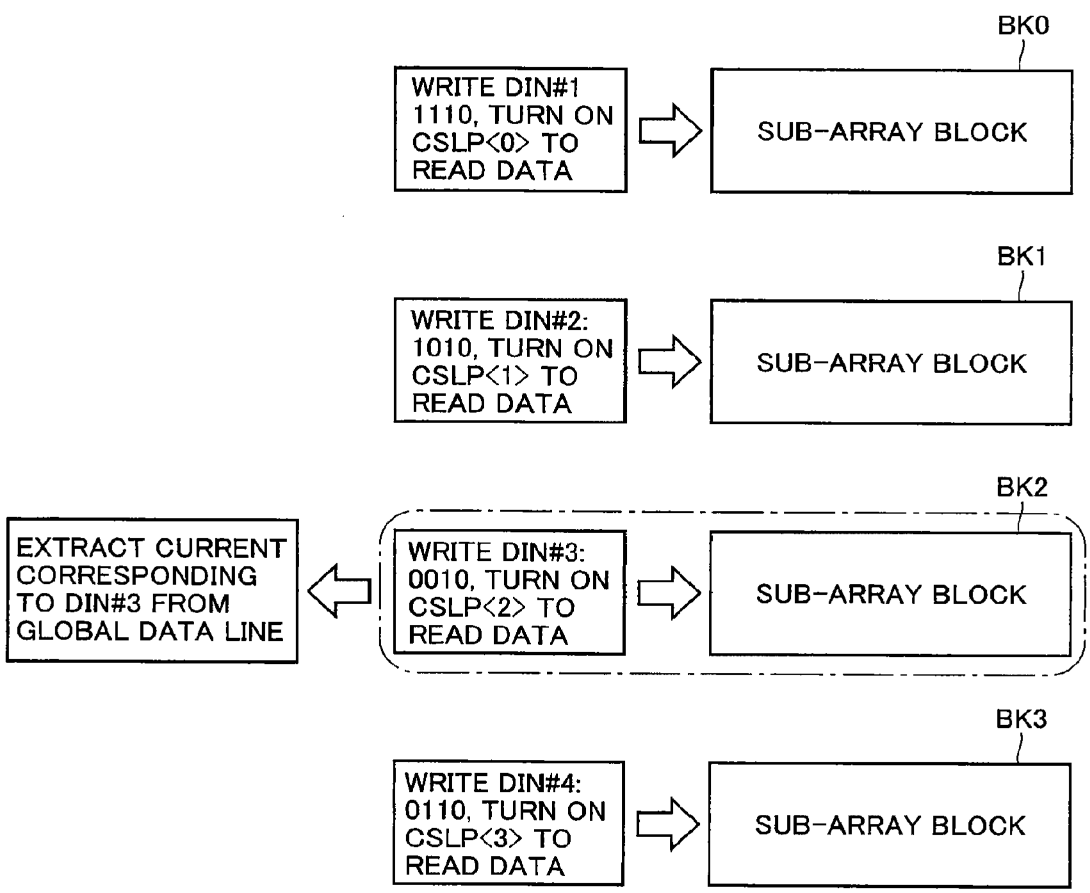

FIG. 182 specifically represents adding and subtracting operations performed in the semiconductor signal processing device according to the nineteenth embodiment of the present invention.

FIG. 183 shows write data and a manner of data read of each sub-array block in performing the adding and subtracting operations of FIG. 182.

Figure 184:
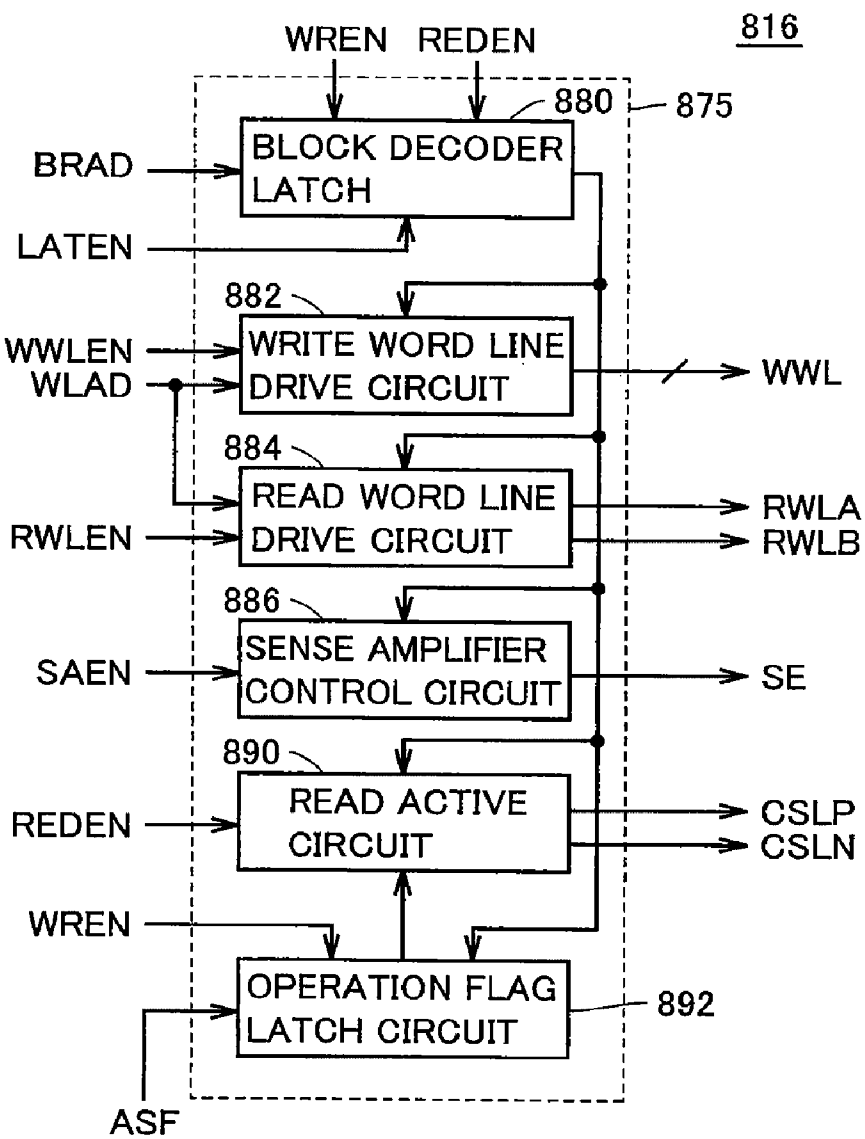

FIG. 184 schematically shows an example of a configuration of a local cell selection circuit in the semiconductor signal processing device according to the nineteenth embodiment of the present invention.

Figure 185:
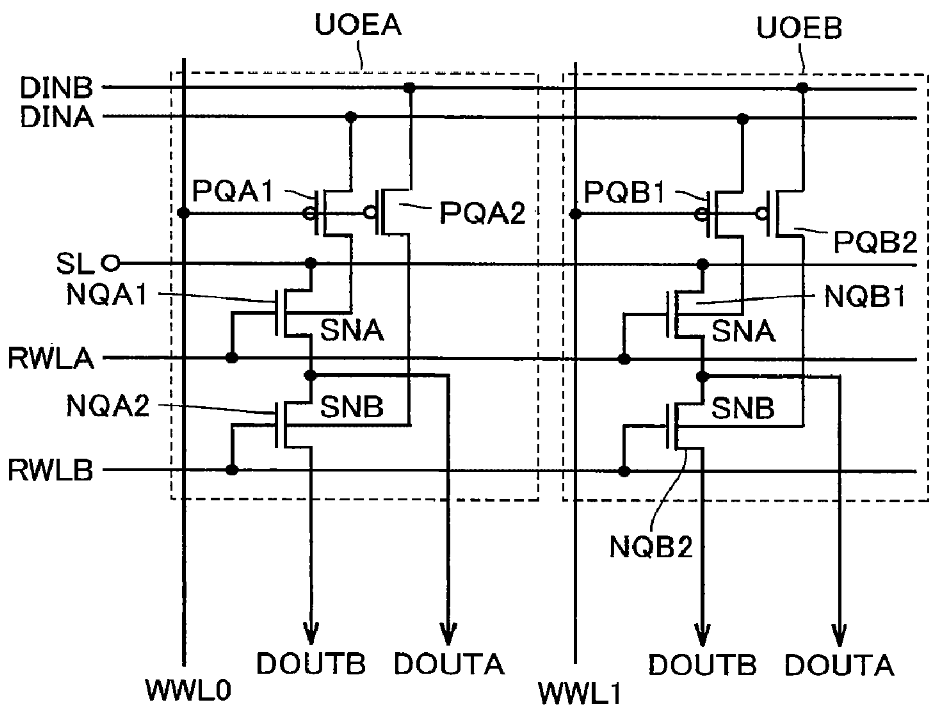

FIG. 185 schematically shows an arrangement of a signal interconnection for a unit operator cell of a semiconductor signal processing device according to a twentieth embodiment of the present invention.

Figure 186:
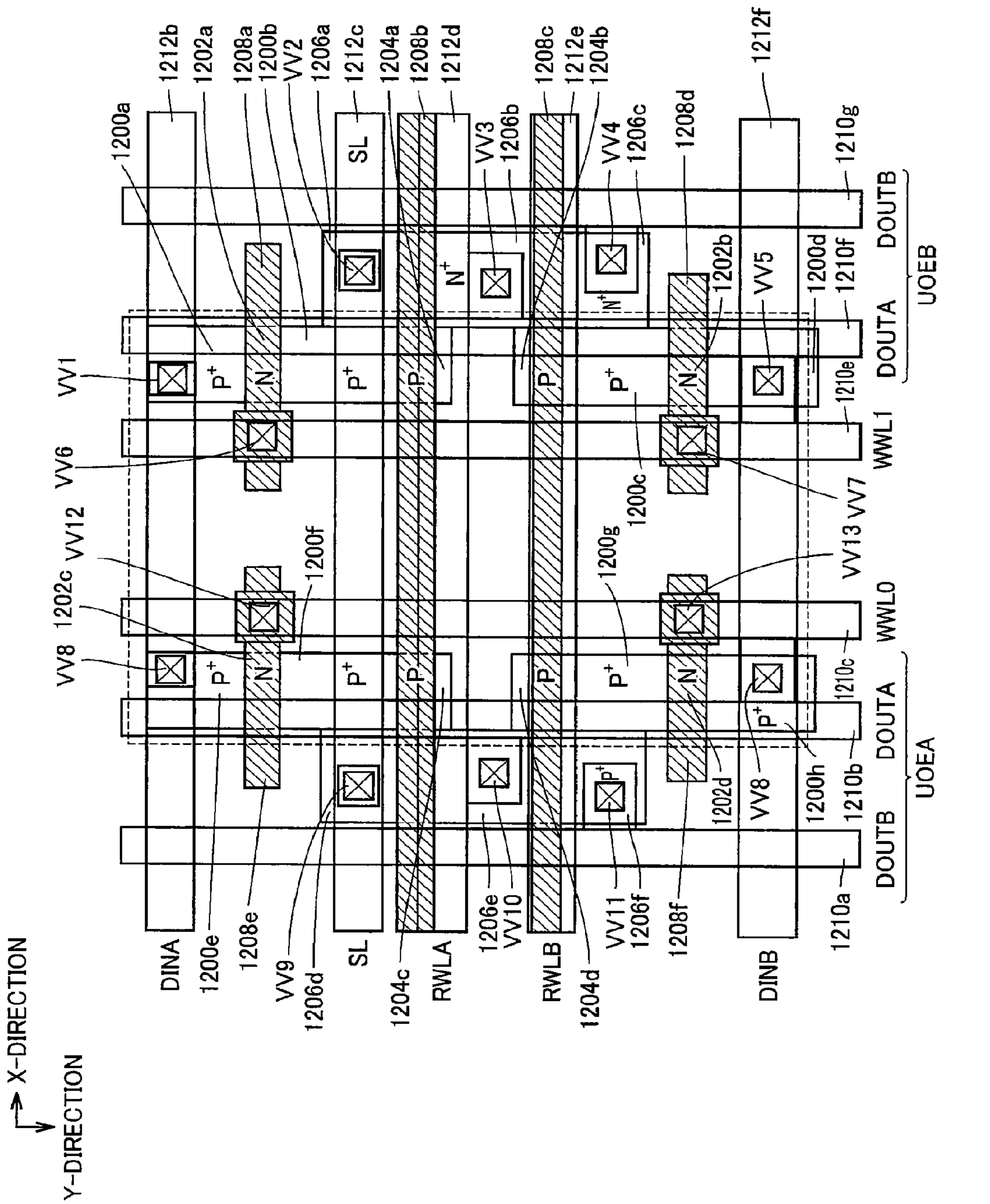

FIG. 186 schematically shows a planar layout of the unit operator cell of FIG. 185.

Figure 187:
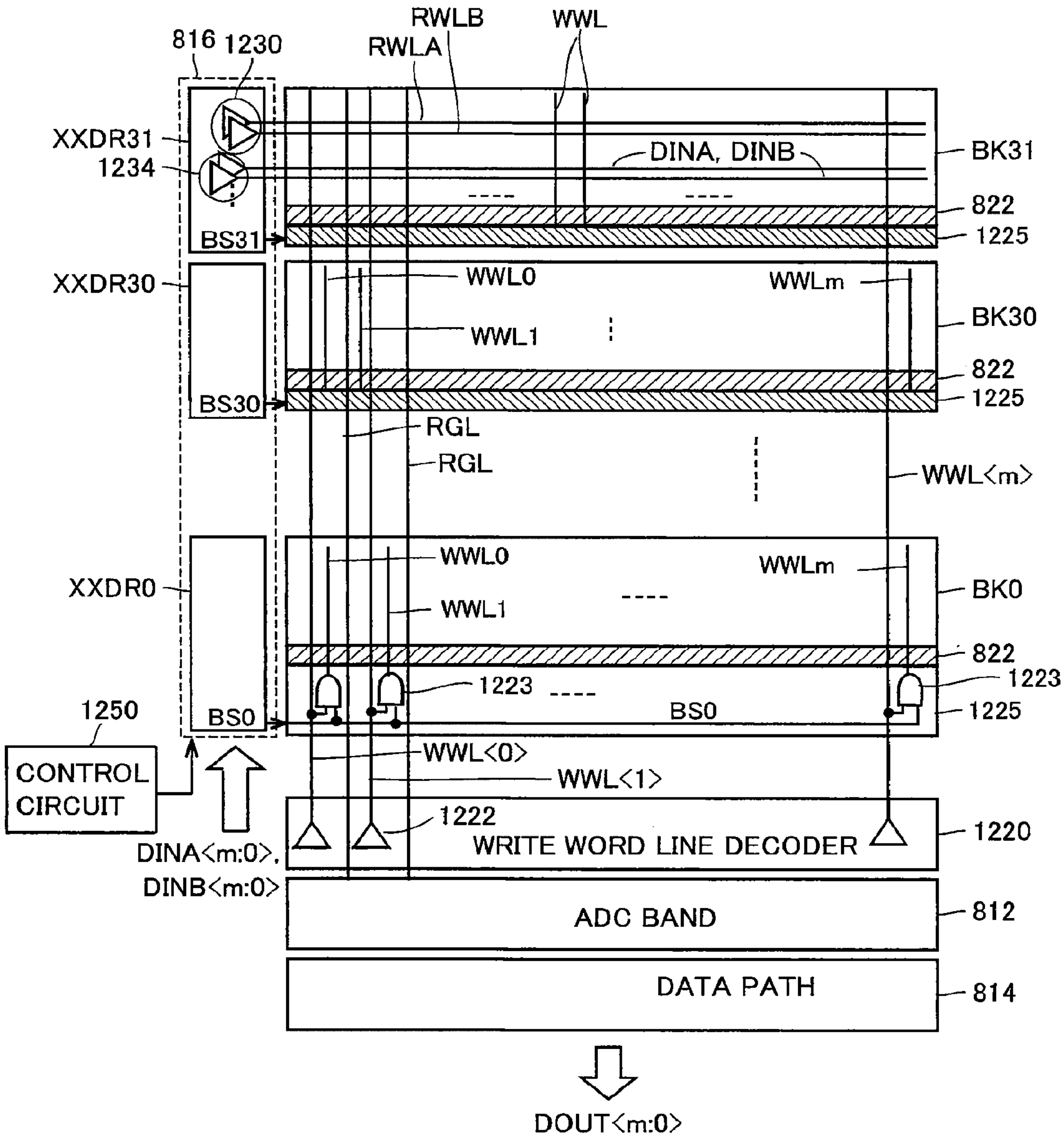

FIG. 187 schematically shows an entire configuration of the semiconductor signal processing device according to the twentieth embodiment of the present invention.

Figure 188:
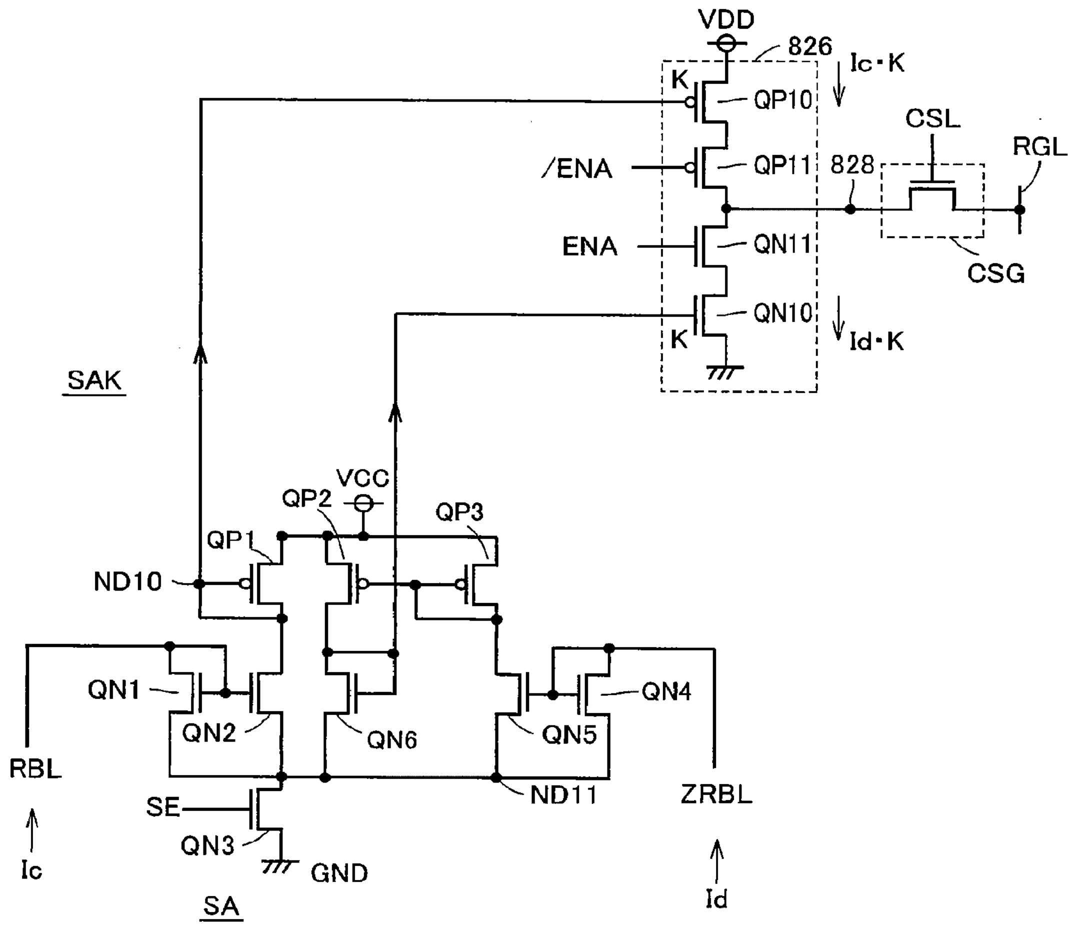

FIG. 188 shows an example of configurations of a sense amplifier circuit and a read gate in the semiconductor signal processing device according to the twentieth embodiment of the present invention.

Figure 189:
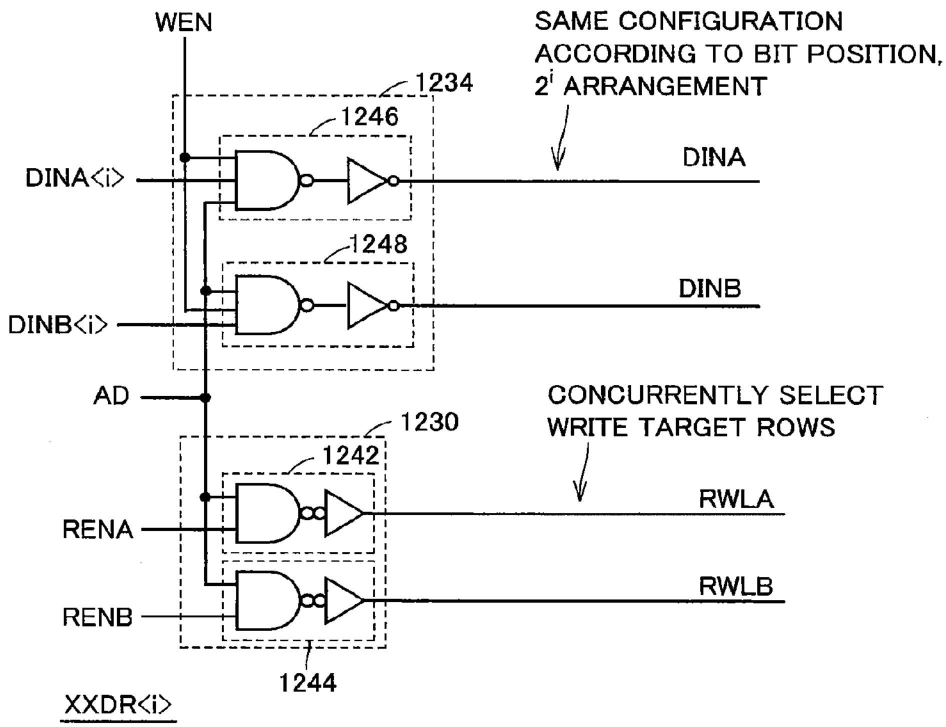

FIG. 189 schematically shows a configuration of a row/data line selection driving circuit of FIG. 188.

Figure 190:
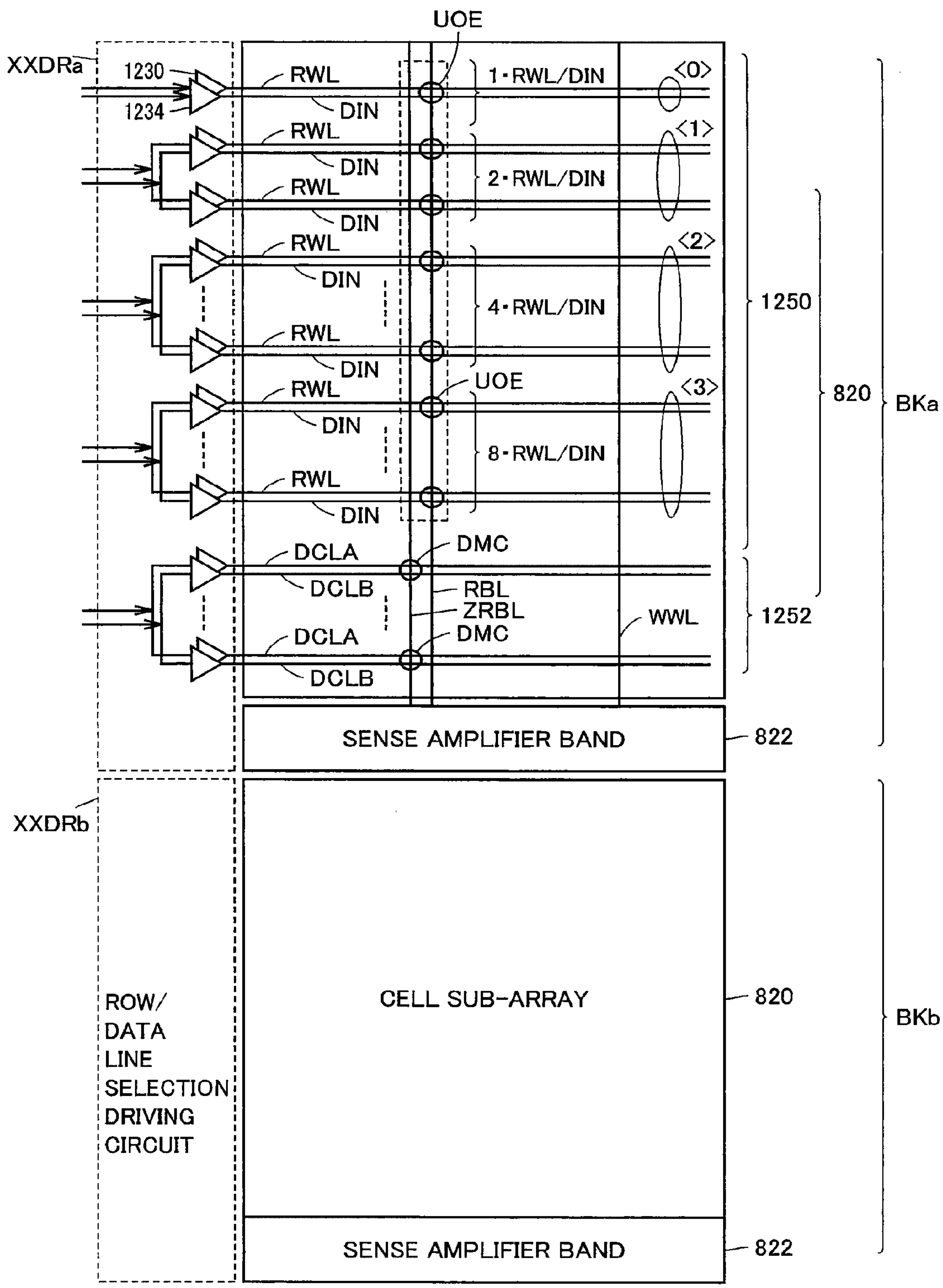

FIG. 190 schematically shows a selection mode of the unit operator cell in the semiconductor signal processing device according to the twentieth embodiment of the present invention.

Figure 191:
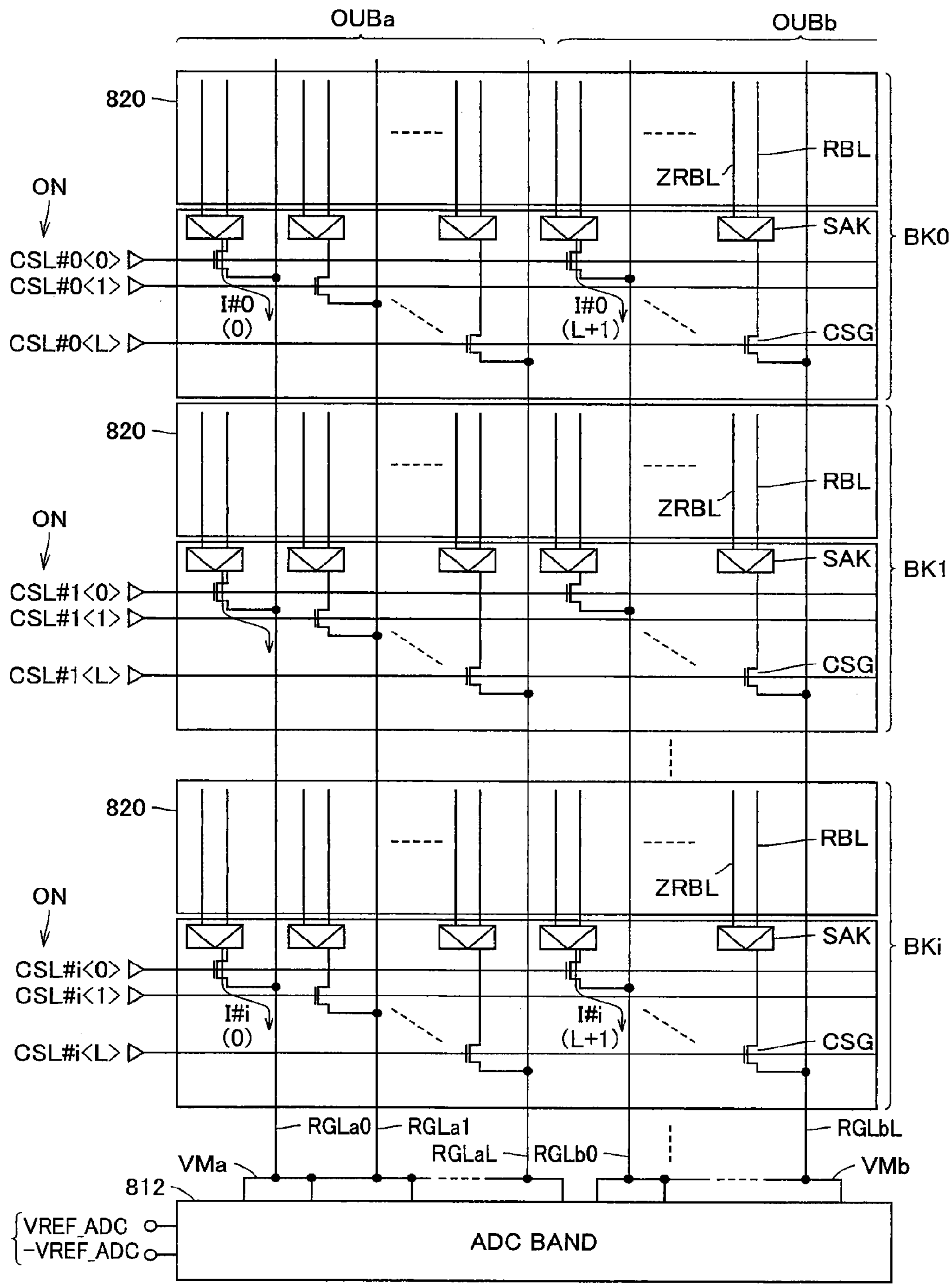

FIG. 191 schematically shows a configuration of a portion relating to data read of the semiconductor signal processing device according to the twentieth embodiment of the present invention.

Figure 192:
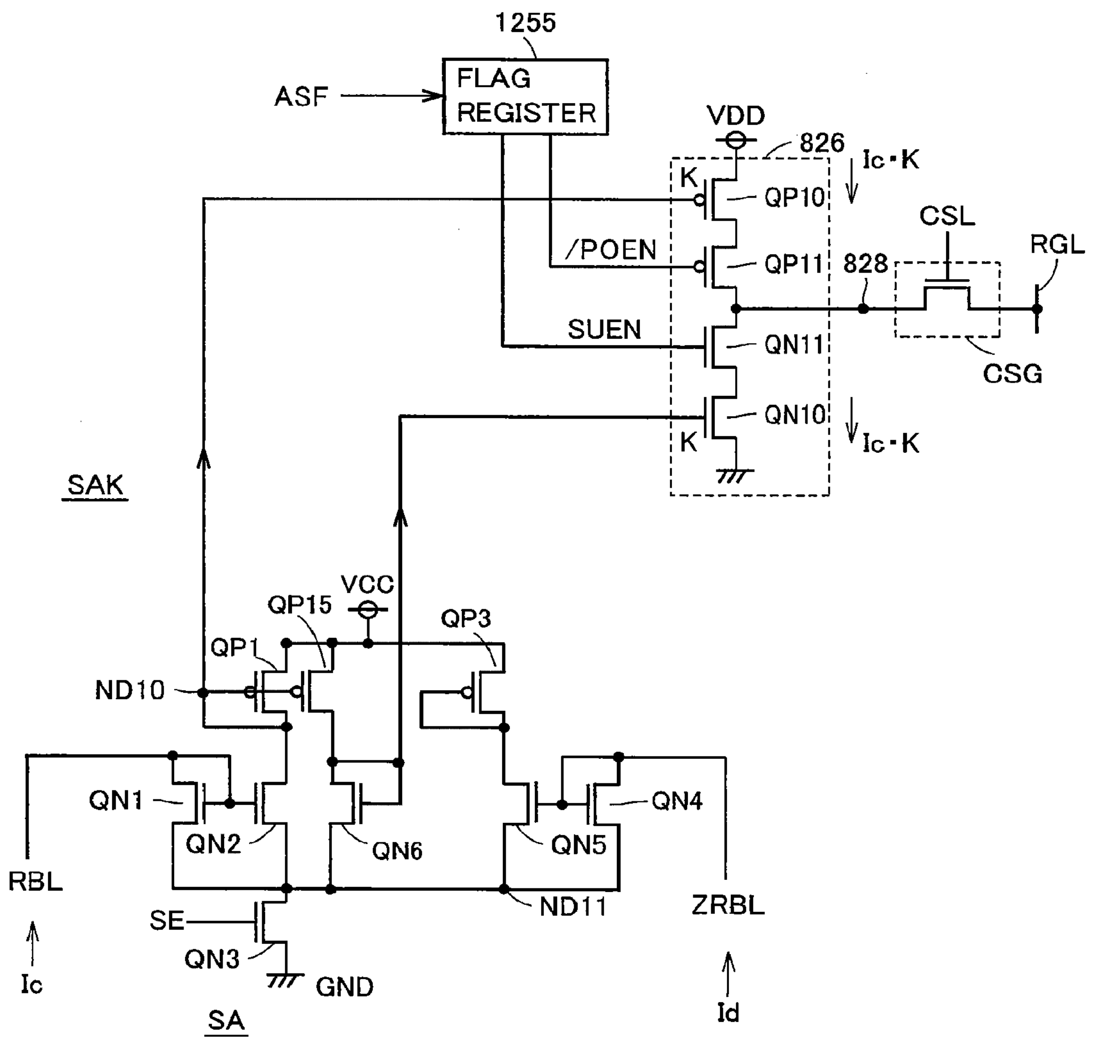

FIG. 192 shows a configuration of a sense amplifier circuit along with a read gate in a modification of the twentieth embodiment of the present invention.

Figure 193:
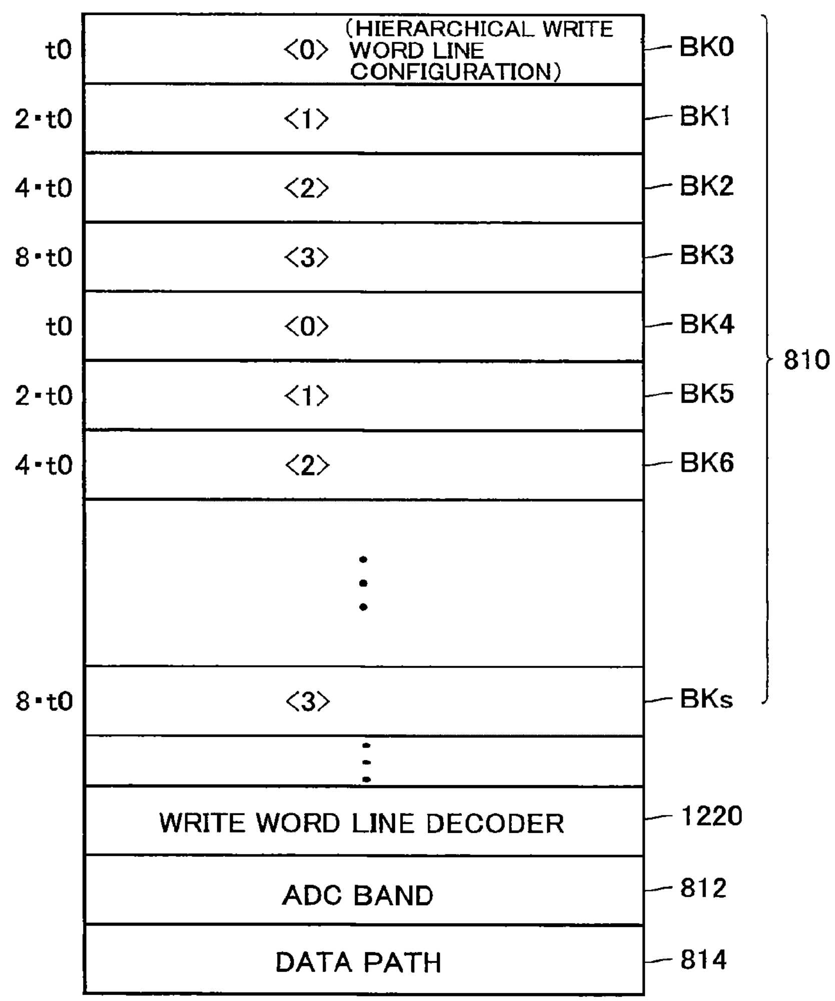

FIG. 193 schematically shows a correlation between a sub-array block and an operation data bit in a semiconductor signal processing device according to a twenty-first embodiment of the present invention.

Figure 194:
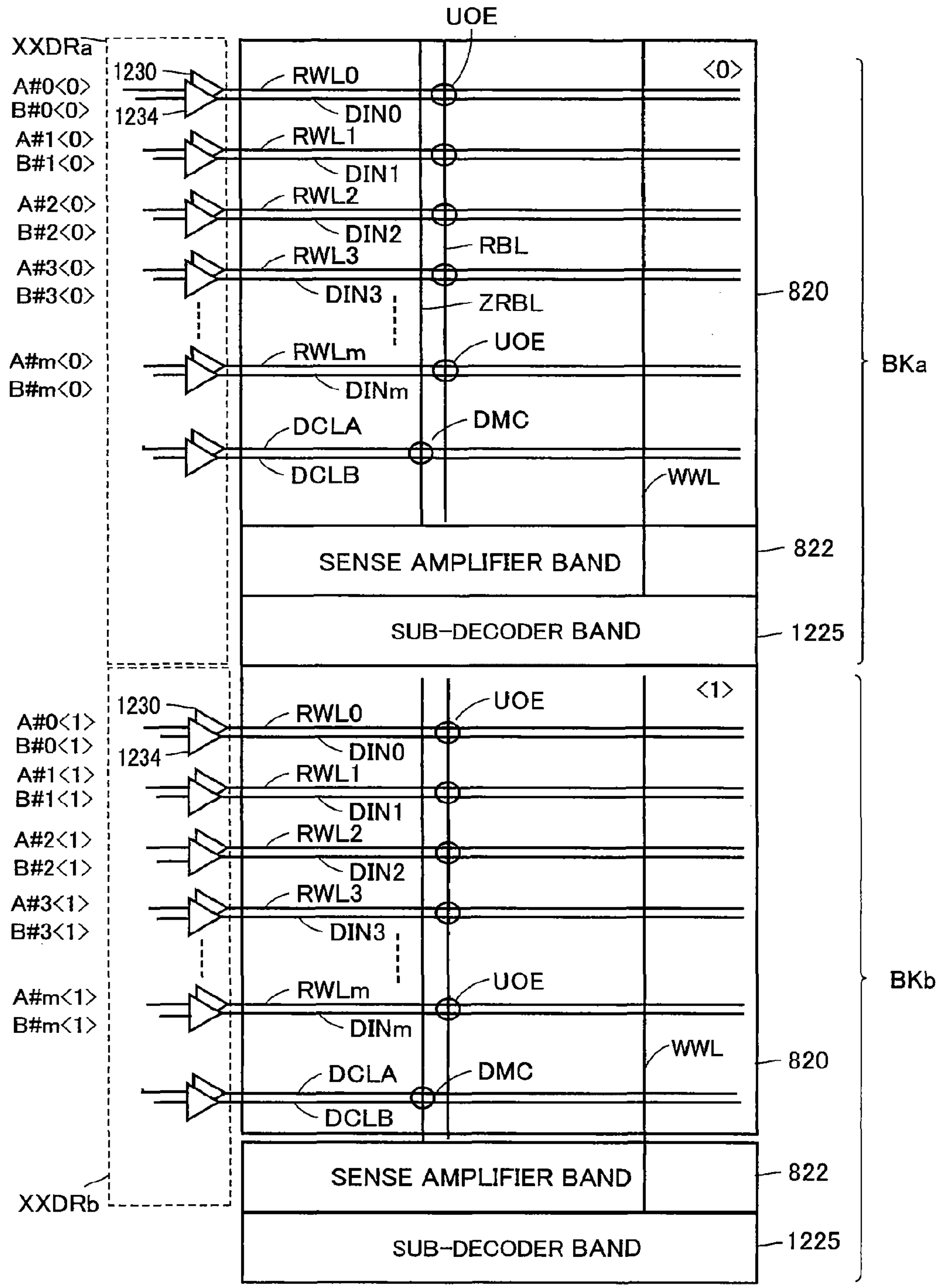

FIG. 194 schematically shows a configuration of a portion related to data write and read of the semiconductor signal processing device according to the twenty-first embodiment of the present invention.

Figure 195:
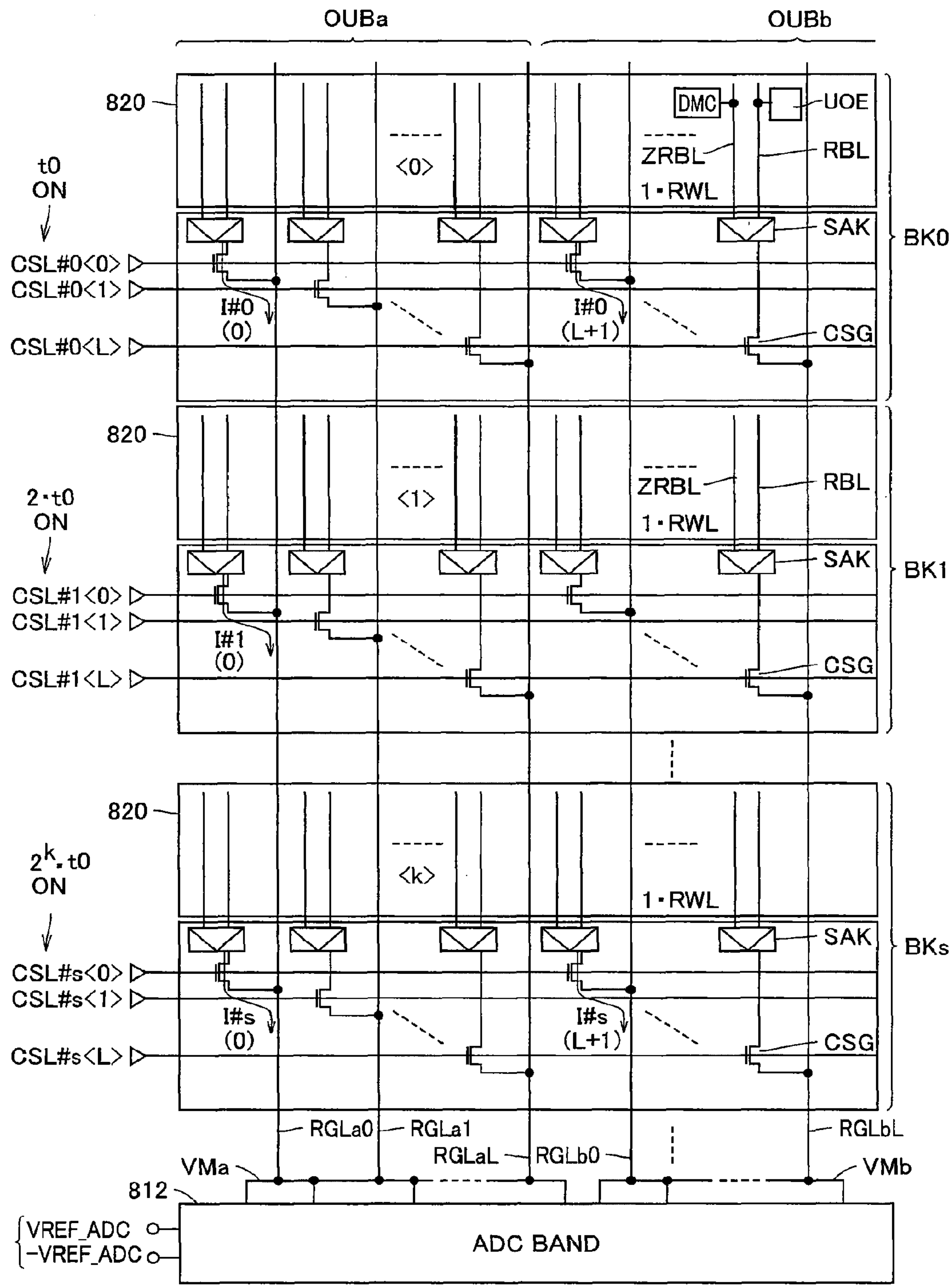

FIG. 195 schematically shows a configuration of a portion related to data read of the semiconductor signal processing device according to the twenty-first embodiment of the present invention.

DETAILED DESCRIPTION OF THE PREFERRED EMBODIMENTS

[First Embodiment]

Figure 1:
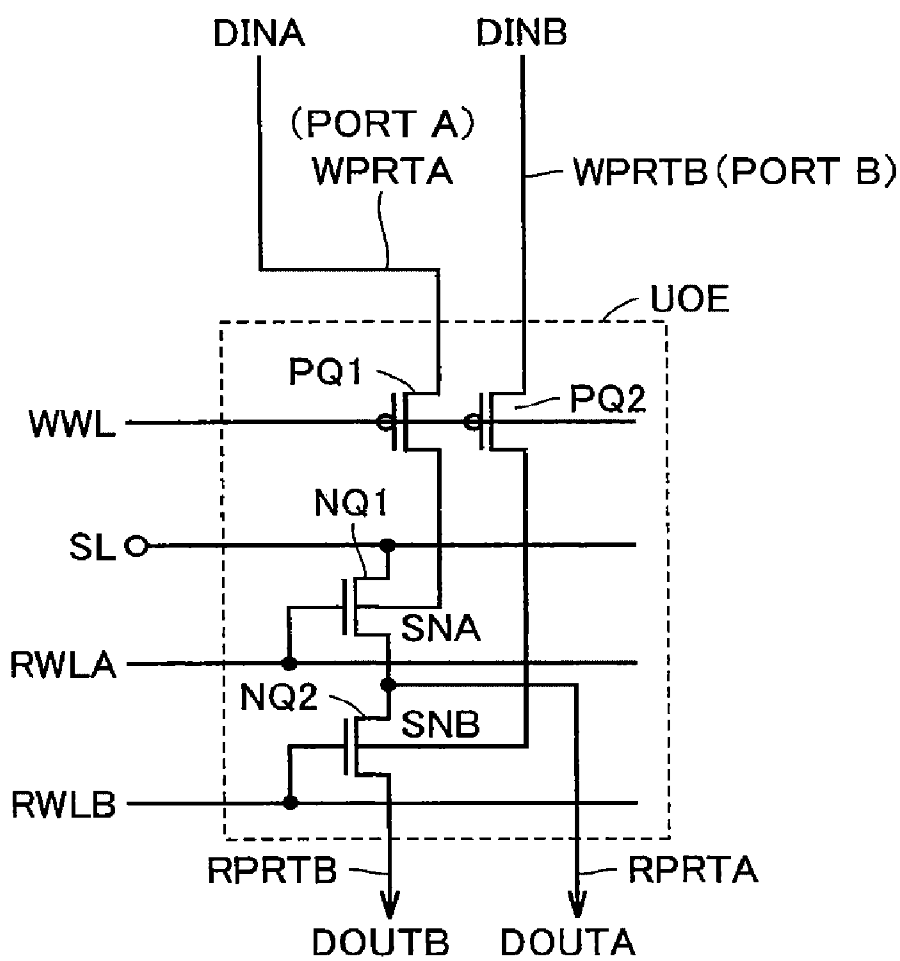
FIG. 1 shows an electrically equivalent circuit of a unit operator cell in a semiconductor signal processing device according to a first embodiment of the present invention.

FIG. 1 shows an electrically equivalent circuit of a unit operator cell in a semiconductor signal processing device according to a first embodiment of the present invention. A unit operator cell UOE includes a transistor (hereinafter referred to as SOI transistor) having an SOI (Silicon On Insulator) structure. Referring to FIG. 1, unit operator cell UOE includes two P-channel SOI transistors PQ1 and PQ2 and two N-channel SOI transistors NQ1-channel NQ2. SOI transistors PQ1 and PQ2 are connected between write ports WPRTA and WPRTB and body regions of SOI transistors NQ1 and NQ2, respectively. Gates of SOI transistors PQ1 and PQ2 are connected to a write word line WWL.

SOI transistor NQ1 is connected between a source line SL and a read port RPRTA, and a gate of SOI transistor NQ1 is connected to a read word line RWLA. SOI transistor NQ2 is connected between SOI transistor NQ1 and a read port RPRTB, and a gate of SOI transistor NQ2 is connected to a read word line RWLB.

Potentials at the body regions of SOI transistors NQ1 and NQ are set according to write data DINA and DINB from write ports WPRTA and WPRTB. In the SOI transistor, a threshold voltage depends on the potential at the body region. Specifically, in SOI transistors NQ1 and NQ2 each, when the body region has a high potential, back gate-source in each of SOI transistors NQ1 and NQ2 is biased in a positive direction at a voltage level that is not higher than a built-in voltage of a PN junction, and the threshold voltages of SOT transistors NQ1 and NQ2 are lowered. When the body region has a low potential, the threshold voltages of SOT transistors NQ1 and NQ are raised. Accordingly, SOT transistors NQ1 and NQ2 can store information according to the potentials at the respective body regions. The body regions of SOT transistors NQ1 and NQ2 are isolated from other regions, so that data can be stored during power-off.

Voltage levels at body regions or storage nodes SNA and SNB can be set, by adjusting a power supply voltage of a write driver or the like, precisely to a level not higher than the built-in voltage of the PN junction, and the threshold voltage of the SOT transistor can reliably be set according to the storage data.

Figure 2:
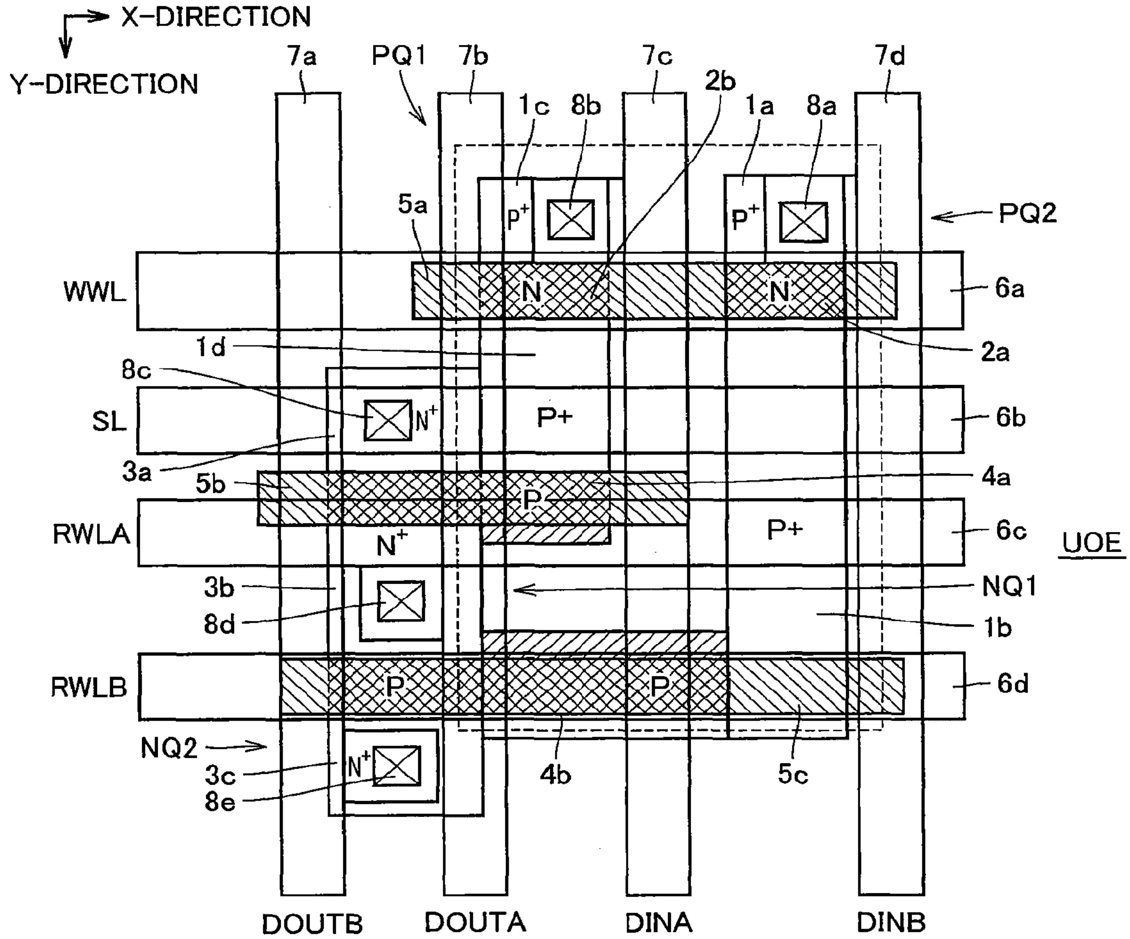
FIG. 2 schematically shows a planar layout of the unit operator cell of FIG. 1.

FIG. 2 schematically shows a planar layout of the unit operator cell of FIG. 1. Referring to FIG. 2, P-type transistors are formed in a region surrounded by a broken line. In the P-type transistor forming region, high-concentration P-type regions of high impurity concentration 1*a* and 1*b* are arranged in alignment along a Y-direction. An N-type region 2*a* is arranged between P-type regions 1*a* and 1*b*.

Similarly, high-concentration P-type regions 1*c* and 1*d* are arranged in alignment along the Y-direction. An N-type region 2*b* is arranged between P-type regions 1*c* and 1*d*. A P-type region 4*a* is arranged in alignment in the Y-direction with P-type region ld.

In the outside of the P-type transistor forming region, high-concentration N-type regions 3*a*, 3*b*, and 3*c* are disposed adjacent to P-type regions 1*d* and 4*a* and in alignment with each other in the Y-direction.

P-type region 4*a* is disposed, between N-type regions 3*a* and 3*b*, extending from the P-type transistor forming region, and P-type region 4*b* is disposed, between N-type regions 3*b* and 3*c*, extending from the P-type transistor forming region.

A gate electrode interconnection line 5*a* is disposed, above N-type regions 2*a* and 2*b*, extending in an X-direction, and a gate electrode interconnection line 5*b* is disposed above P-type region 4*a*. A gate electrode interconnection line 5*c* is disposed, above P-type region 4*b*, extending in the X-direction. In FIG. 2, gate electrode interconnection lines 5*a*, 5*b*, and 5*c* are shown extending only in the region of unit operator cell UOE. However, actually gate electrode interconnection lines 5*a*, 5*b*, and 5*c* are formed continuously extending along the X-direction.

A first metal interconnection line 6*a* is disposed in alignment with gate electrode interconnection line 5*a*, and first metal interconnection line 6*a* is formed continuously extending in the X-direction. A first metal interconnection line 6*d* is disposed in alignment with gate electrode interconnection line 5*c*, and first metal interconnection line 6*d* is arranged continuously extending in the X-direction. First metal interconnection lines 6*b* and 6*c* are disposed, between first metal interconnection lines 6*a* and 6*d*, being isolated from each other, and first metal interconnection lines 6*b* and 6*c* are formed continuously extending in the X-direction. First metal interconnection line 6*a* is electrically connected to gate electrode interconnection line 5*a* in a region (not shown) to constitute a write word line WWL. First metal interconnection line 6*b* is electrically connected to high-concentration N-type region 3*a* of a lower layer through a via/contact 8*c*, and first metal interconnection line 6*b* constitutes a source line SL. First metal interconnection line 6*c* disposed adjacent to gate electrode interconnection line 5*b* is electrically connected to gate electrode interconnection line 4*a* in a region (not shown) to constitute a read word line RWLA. First metal interconnection line 6*d* is electrically connected to gate electrode interconnection line 5*c* in a region (not shown) to constitute read word line RWLB.

In a boundary region between active regions (region where the transistor is formed), second metal interconnection lines 7*a* to 7*d* are disposed continuously extending along the Y-direction. Second metal interconnection line 7*a* is electrically connected to N-type region 3*c* through a via/contact 8*e* and an intermediate first interconnection line. Second metal interconnection line 7*b* is electrically connected to N-type region 3*b* through a via/contact 8*d* and an intermediate first interconnection line. Second metal interconnection line 7*c* is electrically connected to P-type region 1*c* through a via/contact 8*b* and an intermediate first interconnection line. Second metal interconnection line 7*d* is electrically connected to P-type region 1*a* through a via/contact 8*a* and an intermediate first interconnection line.

Second metal interconnection lines 7*a* and 7*b* transmit output data DOUTB and DOUTA through read ports, respectively. Second metal interconnection lines 7*c* and 7*d* transmit input data DINA and DINB through write ports, respectively. That is, second metal interconnection lines 7*c* and 7*d* are connected to write ports WPRTA and WPRTB of FIG. 1, and second metal interconnection lines 7*a* and 7*b* are connected to read ports RPRTB and RPRTA of FIG. 1.

In the planar layout of FIG. 2, P-type regions 1*a* and 1*b*, N-type region 2*a*, and gate electrode interconnection line 5*a* constitute P-channel SOI transistor PQ2, P-type regions 1*c* and 1*d*, N-type region 2*b*, and gate electrode interconnection line 5*a* constitute P-channel SOI transistor PQ1. N-type regions 3*a* and 3*b*, P-type region 4*a*, and gate electrode interconnection line 5*b* constitute N-channel SOI transistor NQ1. N-type regions 3*b* and 3*c*, P-type region 4*b*, and gate electrode interconnection line 5*c* of the upper layer constitute N-channel SOI transistor NQ2.

Figure 3:
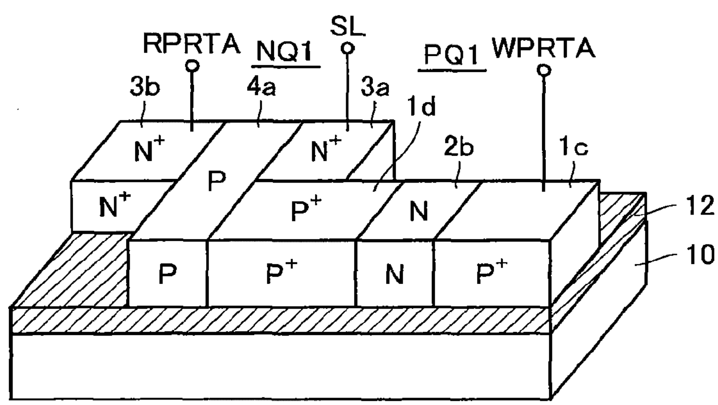
FIG. 3 schematically shows a structure of a transistor of the unit operator cell of FIG. 1.

FIG. 3 is a perspective figure schematically showing the SOI transistors PQ1 and NQ1 of the planar layout of FIG. 2. For the sake of simplification, the gate electrode interconnection lines of SOI transistors PQ1 and NQ1 are not shown in FIG. 3.

As shown in FIG. 3, SOI transistors PQ1 and NQ1 are formed on a buried insulating film 12 formed on a semiconductor substrate 10. P-type region 1*c* is coupled to write port WPRTA, N-type region 3*a* is coupled to source line SL, and N-type region 3*b* is coupled to read port RPRTA. P-type region 4*a* arranged between N-type regions 3*a* and 3*b* constitutes the body region of SOI transistor NQ1. Because P-type region 4*a* is disposed adjacent to high-concentration P-type region ld, P-type regions 1*d* and 4*a* are electrically coupled together. N-type region 2*b* constitutes the body region of SOI transistor PQ1.

In SOI transistor PQ1, a channel is formed at a surface of body region (N-type region) 2*b*, charges transmitted from write port WPRTA are transmitted through P-type region 1*d* to and accumulated in P-type region 4*a*. The voltage at the body region of SOI transistor NQ1 is set at a voltage level according to write data, and the threshold voltage is set at a level corresponding to storage data. N-type region 3*b* constitutes a pre-charge node, and is maintained at a voltage level not causing the PN junction between the regions 4*a* and 3*b* to be conductive, irrespective of the voltage level of P-type region 4*a*. Usually, source line SL is maintained at a power supply voltage VCC level to prevent the PN junction between the body region and the source line from being conductive.

During data read, a high-level voltage is applied to the gate electrode interconnection line formed above the body region of SOI transistor NQ1. The channel is selectively formed at the surface of P-type region 4*a* according to the storage data by the voltage applied to the gate electrode, and a current flows from source line SL to read port RPRTA according to the storage data. The data is read by sensing the current. The charges accumulated in body region (P-type region) 4*a* are retained, so that the data can be stored in a nonvolatile manner.

The data read can be performed at high speed since a current amount from source line SL according to the threshold voltages of SOI transistors NQ1 and NQ2 is merely sensed.

Figure 4:
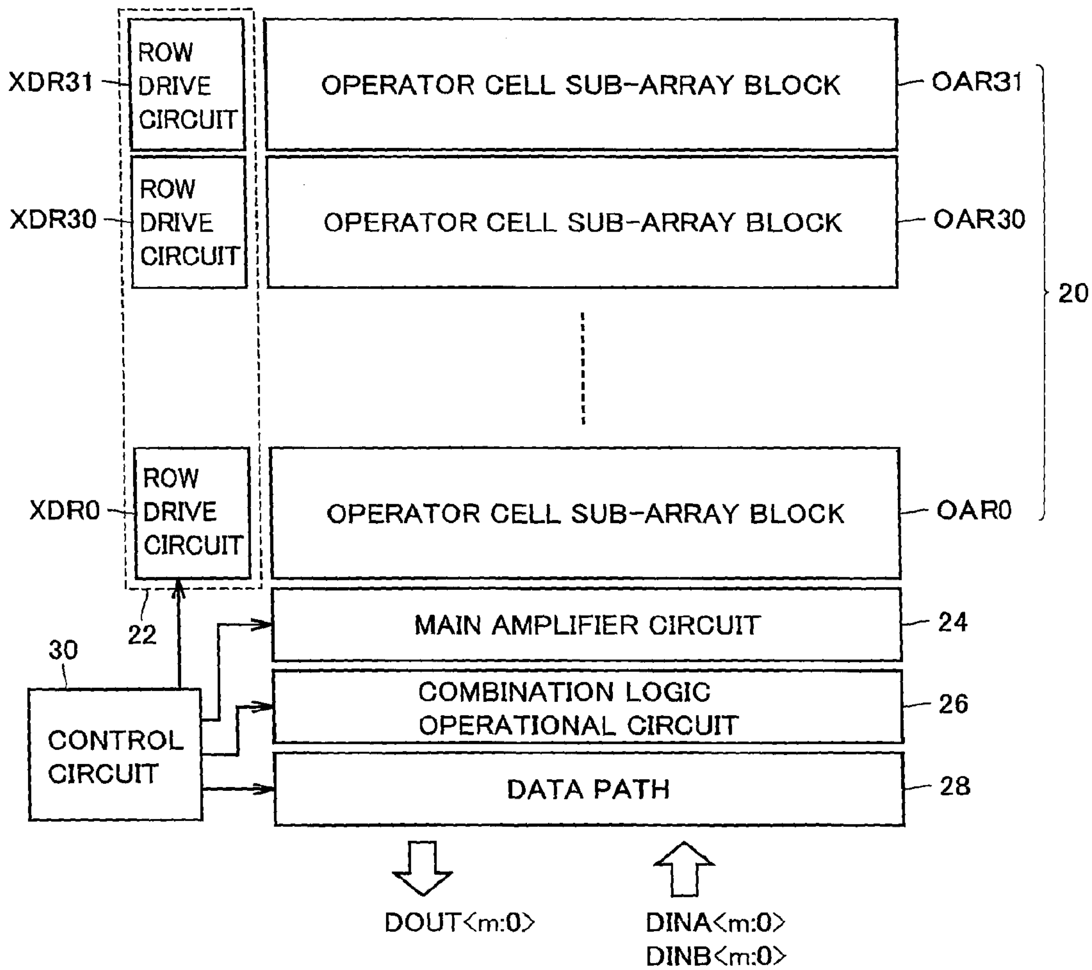
FIG. 4 schematically shows an entire configuration of the semiconductor signal processing device according to the first embodiment of the present invention.

FIG. 4 schematically shows an entire configuration of the semiconductor signal processing device of the first embodiment of the present invention. Referring to FIG. 4, an operator cell array 20 is divided into plural operator cell sub-array blocks OAR0 to OAR31. Although operator cell array 20 is divided into 32 operator cell sub-array blocks in FIG. 4, the number of sub-array blocks is not limited to 32.

In operator cell sub-array blocks OAR0 to OAR31, unit operator cells (UOE) are arranged in rows and columns, and a dummy cell is disposed corresponding to each unit operator cell column. A current supplied from the dummy cell is used as a reference current to read the storage data of a unit operator cell.

A row selection driving circuit 22 is provided for operator cell array 20. Row selection driving circuit 22 includes row drive circuits XDR0 to XDR31 provided corresponding to operator cell sub-array blocks OAR0 to OAR31, respectively. Each of row drive circuits XDR0 to XDR31 selects a unit operator cell row in a corresponding operator cell sub-array block. Each of row drive circuits XDR0 to XDR31 includes a row address decode circuit that decodes a row address signal, a read word line drive circuit that drives a read word line in a selected state in the data read, and a write word line drive circuit that drives a write word line in a selected state in the data write.

Processing of concurrently driving both read word lines RWLA and RWLB of FIG. 1 in the selected state or processing of driving only read word line RWLA in the selected state is performed according to operational contents.

A main amplifier circuit 24, a combination logic operational circuit 26, and a data path 28 are provided in a data input and output path of operator cell array 20. Main amplifier circuit 24 includes a main amplifier that is provided corresponding to a unit operator cell column of each operator cell sub-array blocks OAR0 to OAR31. In main amplifier circuit 24, main amplifiers concurrently amplify data read from the operator cell sub-array block selected in operator cell array 20. Therefore, data of an entry (formed by unit operator cells on one row) of the operator cell sub-array block selected in operator cell array 20 are concurrently amplified for each selected unit operator cell.

Combination logic operational circuit 26 further performs designated logic or arithmetic operation processing on the data of the selected unit operator cell transferred from main amplifier circuit 24. The combination logic operations such as an OR operation, an XOR operation, and an XNOR operation are prepared as the logic operation, and addition and subtraction are prepared as the arithmetic operation processing. Further, combination logic operational circuit 26 can receive the storage data of the selected unit operator cell through the main amplifier to externally supply the received output signal from the main amplifier through a register without changing logic thereof.

Data path 28 sets a path of the transfer data from main amplifier circuit 14 and/or combination logic operational circuit 26. Data path 28 sets a path for supplying data DOUT [m:0] to the outside, and sets a path for producing the write data from input data DINA<m:0> and DINB<m:0> to the unit operator cells, and sets a write data transfer path.

Input data DINA<m:0> and DINB<m:0> are transferred from the outside of the device and are written in the body regions of SOI transistors NQ1 and NQ2 of each unit operator cell after the path is set in the data path. The transfer path setting for the write data and data inversion/non-inversion are selectively performed in data path 28. Therefore, operational processing contents on the external input data, which utilizes the unit operator cells of a selected operator cell sub-array block, is set.

In the semiconductor signal processing device, a control circuit 30 performs setting of internal operation processing, and setting and operation timing control of a data transfer path. Control circuit 30 includes an instruction memory storing program instructions, and produces internal operation designation and internal timing according to the program in the instruction memory. Alternatively, control circuit 30 may performs the setting of the internal data transfer path and generation of internal operation timings in response to an external command.

Figure 5:
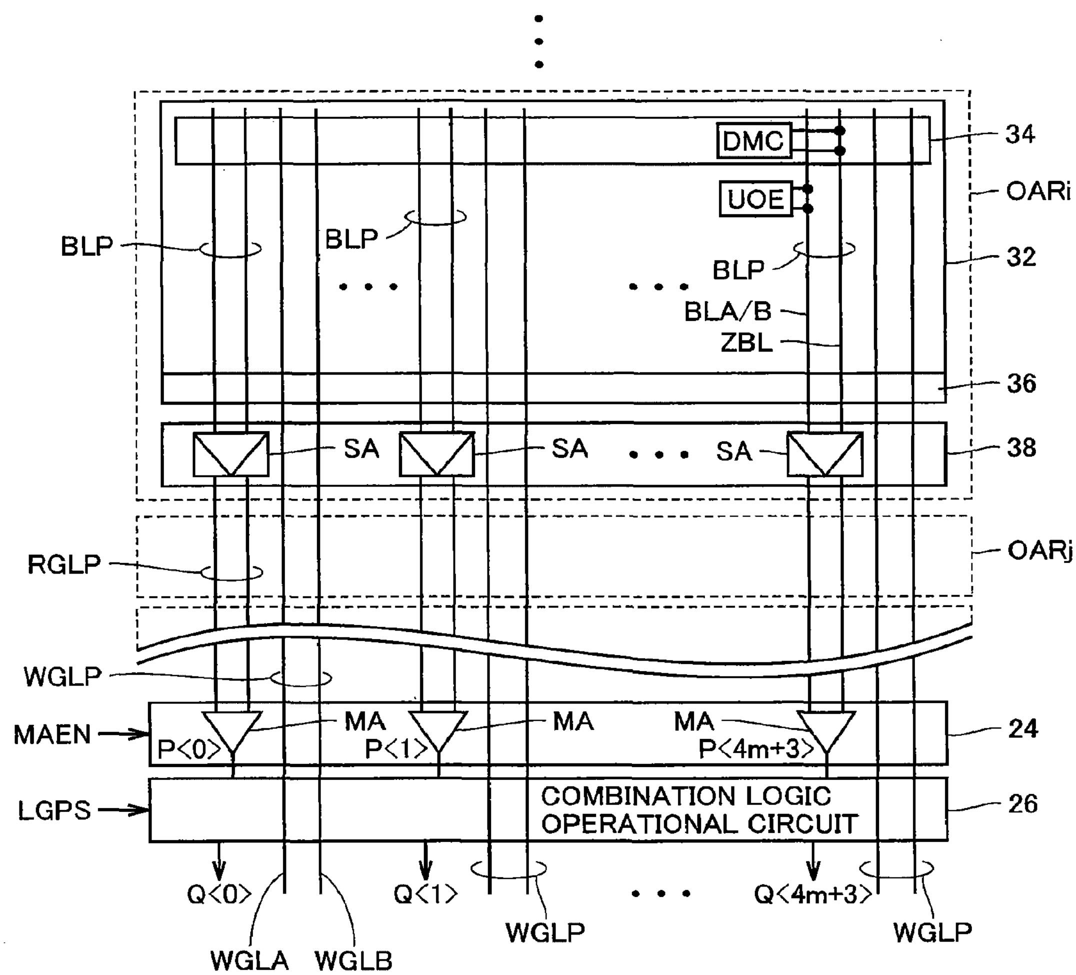
FIG. 5 schematically shows a configuration of a main part of the semiconductor signal processing device of FIG. 4.

FIG. 5 shows a specific configuration of operator cell array 20 and main amplifier circuit 14 of FIG. 4. Operator cell sub-array blocks OARi and OARj included in operator cell array 20 are representatively shown in FIG. 5. Because operator cell sub-array blocks OARi and OARj have the same configuration, only an internal configuration of operator cell sub-array block OARi is shown in FIG. 5.

Referring to FIG. 5, operator cell sub-array block OARi includes a memory cell array 32 in which unit operator cell UOE and dummy cell DMC are arranged and a sense amplifier band 38 in which sense amplifiers SA are disposed. A dummy cell band 34 and a read port selection circuit 36 are provided in memory cell array 32. A dummy cell DMC is disposed in dummy cell band 34, and read port selection circuit 36 selects a read port of unit operator cell UOE.

A bit line pair BLP is disposed corresponding to a unit operator cell row. As described above, unit operator cell UOE includes read ports RPRTA and RPRTB, and each bit line pair BLP includes read bit lines BLA and BLB (BLA/B) and a complementary read bit line ZBL. Read bit lines BLA and BLB (BLA/B) are connected to read ports RPRTA and RPRTB of the unit operator cell of corresponding row, respectively. Dummy cell DMC is connected to complementary read bit line ZBL. Read port selection circuit 36 selects one of read bit lines BLA and BLB.

Each sense amplifier SA of sense amplifier band 38 senses an amount of current flowing through bit line BLAB and complementary bit line ZBL selected by read port selection circuit 36, and produces a signal according to the sensing result.

Each sense amplifier SA of sense amplifier band 38 is connected to a global read data line pair RGLP. Global read data line pair RGLP is commonly disposed for plural operator cell sub-array blocks, and is disposed corresponding to the sense amplifier of each operator cell sub-array block. An output of sense amplifier SA of the selected operator cell sub-array block is transmitted to a main amplifier MA of main amplifier circuit 24 through global read data line pair RGLP.

A global write data line pair WGLP is commonly disposed for operator cell sub-array blocks OAR (OAR0 to OAR31). Global write data line pair WGLP includes global write data lines WGLA and WGLB, and write data lines WGLA and WGLB are connected to write ports WPRTA and WPRTB of the unit operator cell of a selected operator cell sub-array block. Accordingly, the global write data line pair is disposed corresponding to a unit operator cell column of each operator cell sub-array block.

In main amplifier circuit 24, main amplifier MA is provided for each of global read data line pair RGLP. FIG. 5 shows the case in which main amplifier MA produces data P<0> to P<4m+3>, that is, the case in which (4m+4) global read data line pairs RGLP are disposed by way of example. External input data has a (m+1)-bit width (see FIG. 4). That is, in the semiconductor signal processing device (combination logic operational circuit 26), a combination logic operation or arithmetic operation is specified per one bit of the external input data, and the combination logic operation or arithmetic operation is internally performed by utilizing outputs of four sense amplifiers SA.

Figure 6:
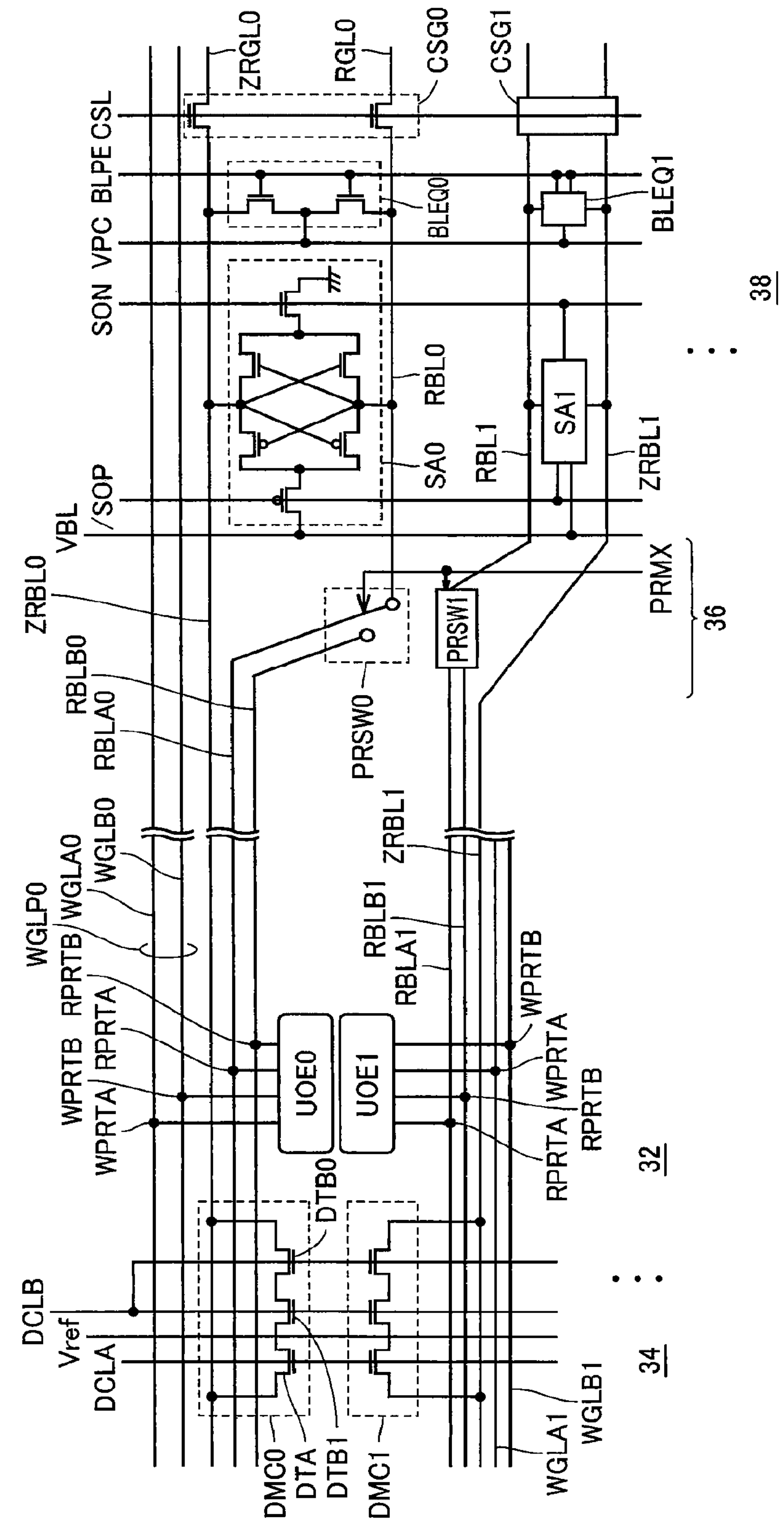
FIG. 6 specifically shows a configuration of a unit operator cell sub-array block of FIG. 5.

FIG. 6 specifically shows a configuration of unit operator cell sub-array block OARi of FIG. 5. The configuration of the portion related to unit operator cells UOE0 and UOE1 is representatively shown in FIG. 6. Referring to FIG. 6, read bit lines RBLA0 and RBLB0 and global write data lines WGLB0 and WGLA0 are provided for unit operator cell UOE0. Global write data lines WGLA0 and WGLB0 are connected to write ports WPRTA and WPRTB of unit operator cell UOE0, respectively. Read ports RPRTA and RPRTB of unit operator cell UOE0 are connected to read bit lines RBLA0 and RBLB0, respectively. Read bit lines RBLA0 and RBLB0 correspond to bit line BLA/B of FIG. 5.

A dummy cell DMC0 is disposed for unit operator cell UOE0. Dummy cell DMC0 includes a dummy transistor DTA and dummy transistors DTB0 and DTB1. Dummy transistor DTA is connected between a complementary read bit line ZRBL0 and a reference voltage source supplying a reference voltage Vref. Dummy transistors DTB0 and DTB1 are connected in series between complementary read bit line ZRBL0 and the reference voltage source. Dummy transistor DTA is made conductive in response to a dummy cell selection signal DCLA, to supply a current to complementary read bit line ZRBL0 from reference voltage source Vref. Dummy transistors DTB0 and DTB1 are made conductive in response to a dummy cell selection signal DCLB, to supply a current to complementary read bit line ZRBL0 from reference voltage source Vref. Each of dummy transistors DTA, DTB0, and DTB1 is formed by an N-channel SOI transistor having a low threshold voltage.

In dummy cells DMC0 and DMC1, dummy transistor DTA is made conductive in selecting port A, and dummy transistors DTB0 and DTB1 are used when port B is selected. The is because, in unit operator cell UOE, each of dummy transistor DTA and dummy transistors DTB0 and DTB1 produces a reference current depending on whether one N-channel SOI transistor or two series-connected SOI transistors are used.

Reference voltage Vref (power supply and supply voltage are designated by the same reference symbol) supplied from reference voltage source Vref supplies a current at a magnitude intermediate between currents supplied in a state of a high-threshold voltage and in a state of a low-threshold voltage of SOI transistors NQ1 and NQ2 included in unit operator cell UOE0. A port connection circuit PRSW0 is provided for read bit lines RBLA0 and RBLB0. Port connection circuit PRSW0 connects one of read bit lines RBLA0 and RBLB0 to a sense read bit line RBL0 in response to a port selection signal PRMX. Complementary read bit line ZRBL0 is connected to sense amplifier SA.

A sense amplifier SA0, a bit line pre-charge/equalize circuit BLEQ0, and a read gate CSG0 are provided between sense read bit lines RBL0 and ZRBL0. Sense amplifier SA0 includes a cross-coupled N-channel SOI transistors, a cross-coupled P-channel SOI transistors, a sense activation P-channel SOI transistor, and a sense activation N-channel SOI transistor. The sense activation P-channel SOI transistor and the sense activation N-channel SOI transistor are selectively turned conductive in response to sense amplifier activation signals /SOP and SON, to supply a sense power supply voltage VBL and a ground voltage to sense power supply nodes (power supply node to which the cross-coupled SOI transistors are connected), respectively. Sense power supply voltage VBL may have a level of power supply voltage VCC or a level of an intermediate voltage. It is only necessary that sense power supply voltage VBL have a voltage level on a selected read word line at lowest.

Sense amplifier SA0 is a cross-coupled sense amplifier that amplifies a potential difference between read bit lines RBL0 and ZRBL0 differentially. Alternatively, as shown in Non-Patent Document 1, sense amplifier SA0 may be formed by the SOI transistors having the gate and the body region connected together. A current sensing type sense amplifier may be used for sense amplifier SA. The current sensing type sense amplifier may be used that performs a current-mirror operation for producing a mirror current of currents flowing through sense read bit lines RBL and ZRBL.

Bit line pre-charge/equalize circuit BLEQ0 supplies a bit line pre-charge voltage VPC to read bit lines ZRBL0 and RBL0 in response to a bit line pre-charge instruction signal BLPE. Bit line pre-charge voltage VPC has a voltage level at which the PN junction between the read port and the body region of N-channel SOI transistors NQ1 and NQ2 in unit operator cell UOE is maintained in a non-conductive state irrespective of a voltage level of the body region.

Read gate CSG0 connects sense read bit lines RBL0 and ZRBL0 to global read data lines RGL0 and ZRGL0 in response to a read gate selection signal (operator cell sub-array block selection signal) CSL.

The transistors constituting sense amplifier SA0, bit line pre-charge/equalize circuits BLEQ0, and read gate CSG0 that are included in sense amplifier band 38 may be formed by not the SOI transistors but usual bulk MOS transistors formed at a surface of a semiconductor substrate region.

Dummy cell DMC1 and a port connection circuit PRSW1 are also provided for unit operator cell UOE1. A sense amplifier SA1, a bit line pre-charge/equalize circuit BLEQ1, and a read gate CSG1 are provided for unit operator cell UOE1. Sense amplifiers SA0 and SA1 are commonly selectively activated in response to sense amplifier activation signals /SOP and SON, and bit line pre-charge/equalize circuits BLEQ0 and BLEQ1 are activated when the bit line pre-charge instruction signal BLPE is activated. Similarly to read gate CSG0, read gate CSG1 is also brought into conductive state in response to read gate selection signal CSL.

As shown in FIG. 6, in memory cell array 32, unit operator cells UOE0, UOE1, . . . are concurrently driven into a selected state, and dummy cells DMC0, DMC1, . . . selectively supply the reference current to corresponding complementary read bit lines ZRBL0 and ZRBL1 in response to one of dummy cell selection signals DCLA and DCLB. Accordingly, in memory cell array 32, the concurrent read or concurrent write of one-entry data is performed in unit operator cell UOE.

Port selection signal PRMX is a multi-bit signal, and the connection of the bit lines can be set for each bit line pair. As described later, an operation is performed by a four-bit line pair. Usually, because the same operation is performed in each operation unit, it is only necessary to prepare a four-bit control signal at the minimum (one-bit selection control signal is prepared per one-bit line pair) for port selection signal PRMX.

Figure 7:
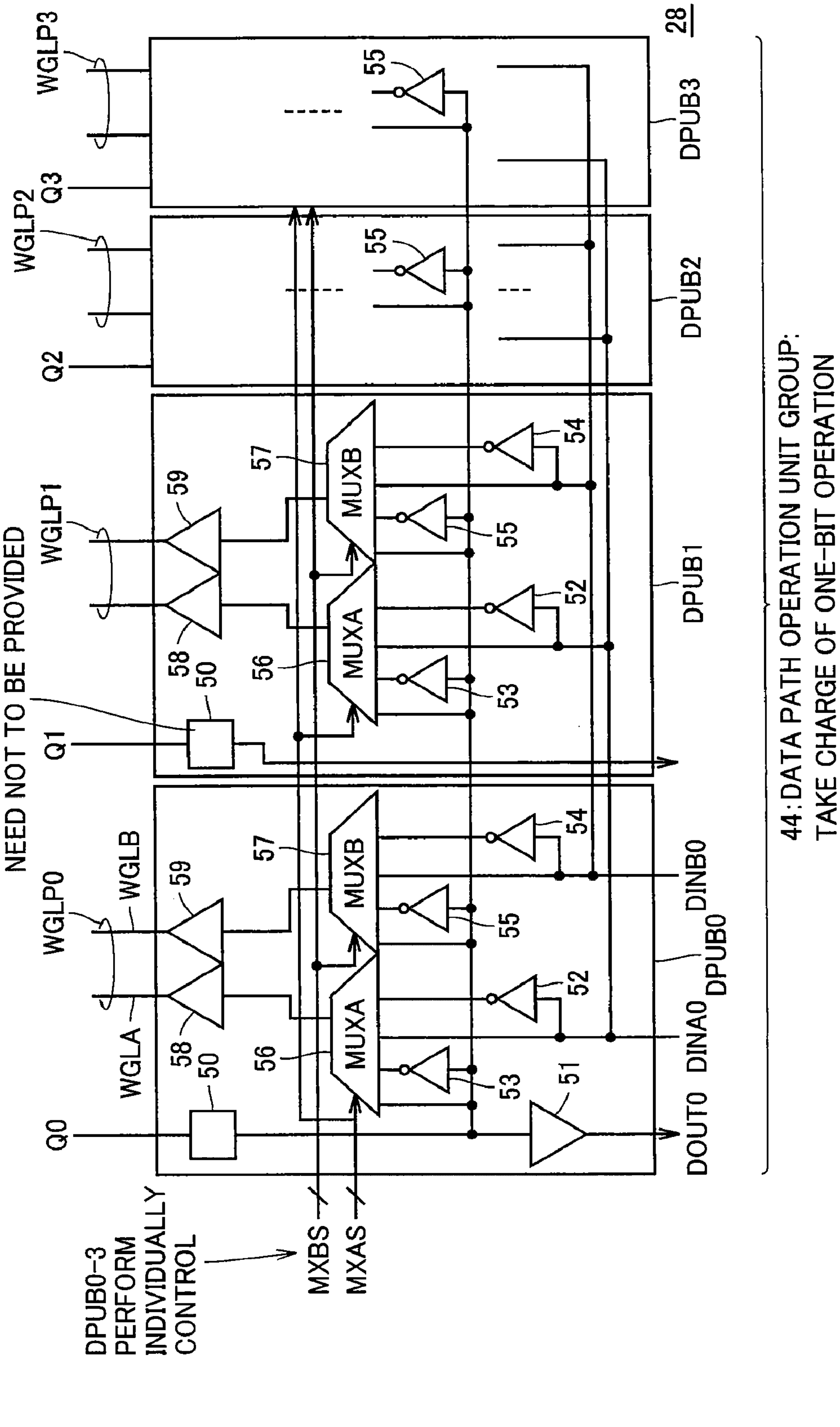
FIG. 7 schematically shows a configuration of a data path of FIG. 4.

FIG. 7 schematically shows a configuration of the data path 28 of FIG. 4. Referring to FIG. 7, data path 28 includes a data path unit block DPUB that is disposed corresponding to each of global write data line pairs WGLP. Data path unit blocks DPUB0 to DPUB3 that are respectively provided corresponding to four global write data line pairs WGLP0 to WGLP3 are representatively shown in FIG. 7. Four data path unit blocks DPUB0 to DPUB3 constitutes a data path operation unit group 44. Data path operation unit group 44 is responsible for the operation for one bit of external data. Data path unit block DPUB0 includes a register 50 in which data bit Q0 from combination logic operational circuit (26) is stored, a buffer 51 that performs buffering processing of the storage data of register 50 to produce external one-bit output data DOUT0, inverters 53 and 55 that invert the storage data of register 50, and inverters 52 and 54 that invert external one-bit write data DINA0 and DINB0, respectively.

Data path unit block DPUB0 also includes a multiplexer (MUXA) 56, a multiplexer (MUXB) 57, and global write drivers 58 and 59. Multiplexer (MUXA) 56 selects one of the storage data of register 50, the output values of inverters 52 and 53, and external one-bit write data DINA0 in response to a switching control signal MXAS. Multiplexer (MUXB) 57 selects one of the storage data of register 50, the output values of inverters 52 and 53, and external one-bit write data DINB0 in response to a switching control signal MXBS. Global write drivers 58 and 59 drive write data lines WGLA and WGLB of global write data line pair GLP0 according to the data selected by multiplexers 56 and 57.

Data path unit block DPUB0 selects one of an inverted value of the external write data bit, a non-inverted value of the external write data bit, and a corresponding output bit Q0 from a combination logic operational circuit to transmit the selected bit to write data line WGLA. Data path unit block DPUB0 selects one of the data bit from register 50, the inverted value of external write data bit DLB0, the non-inverted value of write data bit DLB0 to transmit the selected bit to global write data line WGLB.

Data path unit blocks DPUB1 to DPUB3 have the configuration similar to that of data path unit block DPUB0. However, in data path unit blocks DPUB1 to DPUB3, buffer 51 is not provided at an output of register 50. That is, data bits Q1 to Q3 from the corresponding combination logic operational circuits are not supplied as the data to the outside. Register 50 may be removed in data path unit blocks DPUB1 to DPUB3. The storage value of register 50 of data path unit block DPUB0 is transferred to data path unit blocks DPUB1 to DPUB3.

External one-bit write data DINA0 and DINB0 are commonly supplied to data path unit blocks DPUB0 to DPUB3. The storage value of register 50 is commonly supplied to data path unit blocks DPUB1 to DPUB3.

Switching control signals MXAS and MXBS are applied for each data path unit block, and selection manner of multiplexers 56 and 57 are individually set in each data path unit block. In cases where a common operation is performed in each data path operation unit group 44, it is necessary to prepare four kinds of switching control signals for switching control signals MXAS and MXBS (one kind is allocated to one data path unit block).

Figure 8:
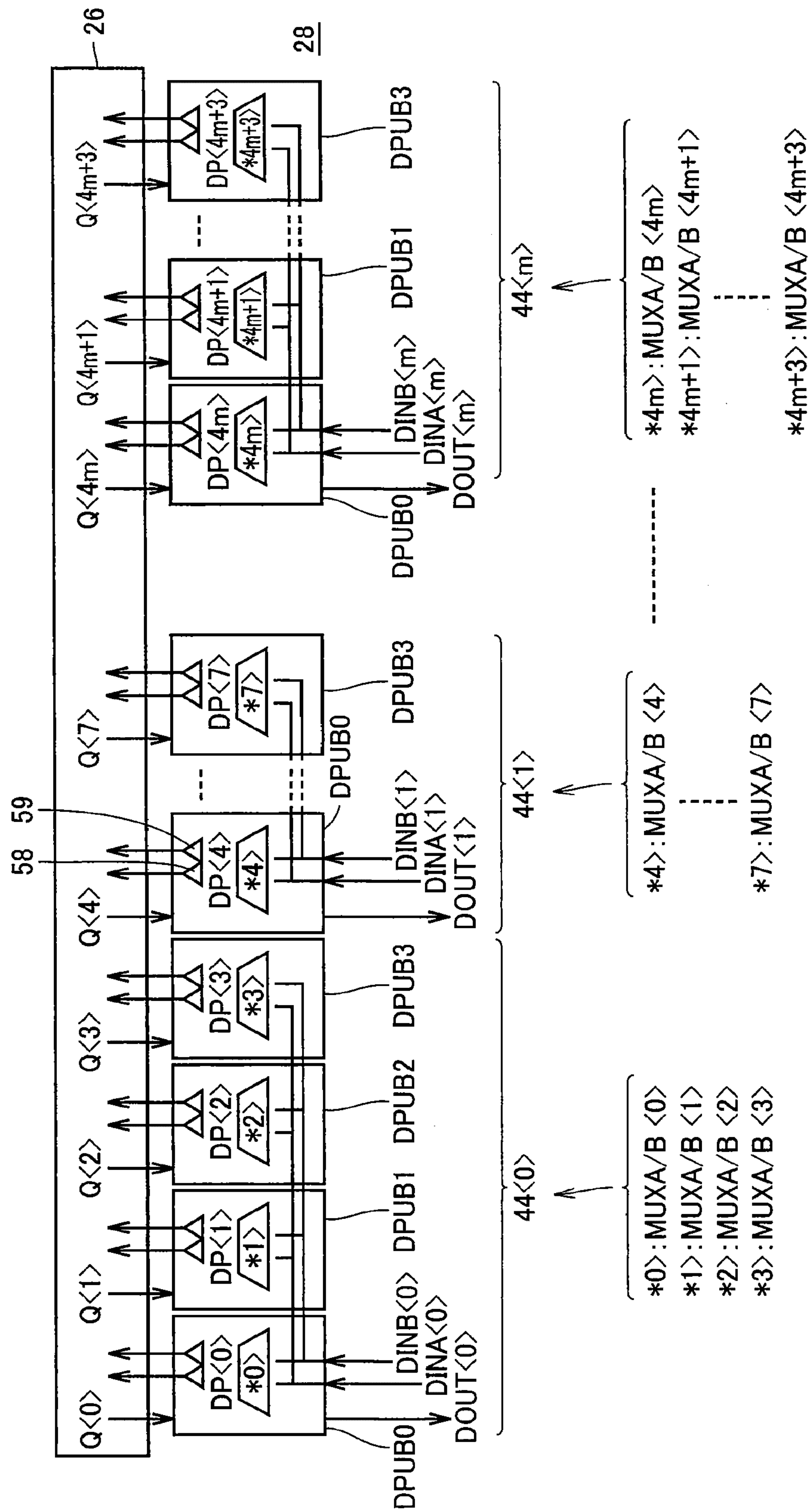
FIG. 8 schematically shows an entire configuration of the data path of FIG. 7.

FIG. 8 schematically shows an entire configuration of the data path 28 of FIG. 7. Referring to FIG. 8, data path operation unit groups 44<0> to 44<*m*> are disposed in data path 28. Each of data path operation unit groups 44<0> to 44<*m*> includes data path unit blocks DPUB0 to DPUB3.

External data bits DINA<0> and DINB<0> are supplied to data path operation unit group 44<0> to produce one-bit output data DOUT<0>. In FIG. 8, "*i>: MUXA/B<i>" indicates multiplexers (MUXA and MUXB) 56 and 57 included in a data path unit block. Data path 28 converts external (m+1)-bit data into internal (4m+4)-bit data. The internal four-bit data is an internal operational unit.

Multiplexer MUXA/B<3:0> (multiplexers 56 and 57) determines a data propagation/conversion path of each of data path unit blocks DPUB0 to DPUB3 in data path operation unit group 44<0>, and internal data bits DP<0> to DP<3> are transmitted to corresponding global write data line through global write drivers 58 and 59.

Similarly, external write data bits DINA<1>, DINB<1>, . . . , and DINA<m> and DIMB<m> are applied to data path operation unit groups 44<1>, . . . , and 44<m>, and write data DP<4> to DP<7>, DP<4m> to DP<4m+3> are produced by each of the internal multiplexer (MUXA and MLTXB) and transmitted to the corresponding global write data line pairs through the corresponding global write drivers (58 and 59).

In data path 28, the data bit from combination logic operational circuit 26 is transmitted to data path unit blocks DPUB0 to DPUB3 of each data path operation unit group. However, in each of data path operation unit groups 44<0> to 44<m>, one data path unit block DPUB4*i* (i=0 to m) supplies output data bits DOUT<0> to DOUT<m> as data bits DOUT<0> to DOUT<m> externally.

Accordingly, in each data path operation unit group, the four-bit data is produced according to the external write data bit, and the operational processing is performed based on storage data of the for unit operator cells per one operation unit group at the maximum, thereby implementing various combination logic operations and arithmetic operations.

Figure 9:
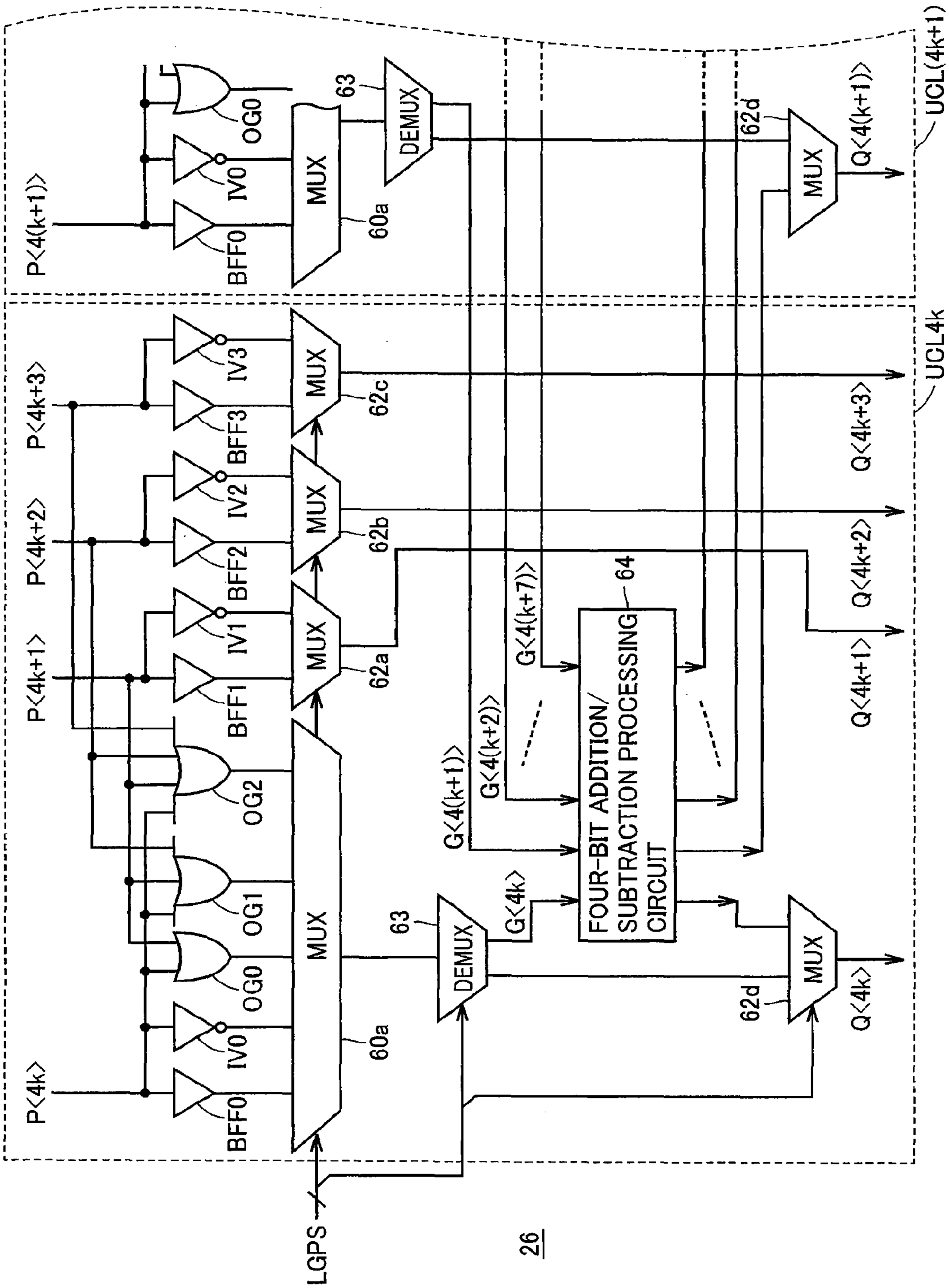
FIG. 9 shows an example of a configuration of a combination logic operational circuit of FIG. 4.

FIG. 9 shows an example of a configuration of the combination logic operational circuit of FIG. 5. In combination logic operational circuit 26, similarly to the configuration of data path 28, one unit operation block UCL is disposed for output signals of four main amplifiers. A configuration of a unit operation block UCL4*k* that is provided for output signals (data) P<4k> to P<4k+3> of the main amplifiers is representatively shown in FIG. 9, wherein k is an integer of 0 to m.

In FIG. 9, unit operation block UCL4*k* includes buffers BFF0 to BFF3 and inverters IV0 to IV3. Buffers BFF0 to BFF3 receive output signals P<4k> to P<4k+3> of corresponding main amplifiers, respectively. Inverters IV0 to IV3 receive output signals (bits) P<4k> to P<4k+3> of the main amplifiers, respectively. Non-inverted signals and inverted signals of output signals P<4k> to P<4k+3> of the main amplifiers can be produced by buffers BFF0 to BFF3 and inverter IV0 to W3.

Unit operation block UCL4*k* also includes a two-input OR gate OG0, a three-input OR gate OG1, and a four-input OR gate OG2. Two-input OR gate OG0 receives output signals P<4k> and P<4k+1> of the main amplifiers. Three-input OR gate OG1 receives output signals P<4k>, P<4k+1>, and P<4k+2> of the main amplifiers. Four-input OR gate OG2 receives output signals P<4k> to P<4k+3> of the main amplifiers.

Unit operation block UCL4*k* further includes a five-input multiplexer 60*a*, two-input multiplexers 62*a* to 62*d*, and a demultiplexer 63. Multiplexer 60*a* receives output signals of buffer BFF0, inverter IV0, and OR gates OG0 to OG2, and selects one of the output signals in response to a logic path instruction signal LGPS.

Multiplexer 62*a* selects one of output signals of buffer BFF1 and inverter IV1 to produce a bit Q<4k>. Multiplexer 62*b* selects one of output signals of buffer BFF2 and inverter IV2 to produce a bit Q<4k+1>. Multiplexer 62*c* selects one of output signals of buffer BFF3 and inverter IV3 to produce a bit Q<4k+3>. The selection manner of multiplexers 62*a* to 62*c* are also set in response to logical path instruction signal LGPS.

Demultiplexer 63 transmits the output signal (data) of multiplexer 60*a* to one of a four-bit addition/subtraction processing circuit 64 and multiplexer 62*d* in response, to logical path instruction signal LGPS. Multiplexer 62*d* selects one of output bits supplied from demultiplexer 63 and four-bit addition/subtraction processing circuit 64, and supplies the selected one bit as output bit Q<4k>.

Four-bit addition/subtraction processing circuit 64 performs addition or subtraction on output bits G<4k> to G<4(k+7)> applied from demultiplexer 63 of the eight unit operation blocks, to produce an five-bit output including carry/borrow in four-bit addition/subtraction. In the configuration of FIG. 9, an eight-bit output is prepared in consideration of the case in which multiplication is performed by product-sum addition (addition of partial product) using four-bit addition/subtraction processing circuit 44.

Figure 10:
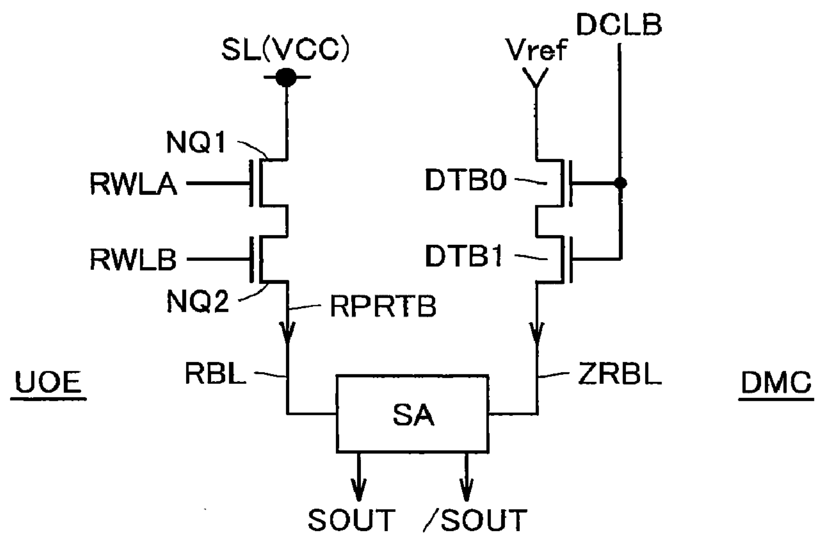
FIG. 10 schematically shows a configuration of a data read section of the unit operator cell in the semiconductor signal processing device according to the first embodiment of the present invention.

FIG. 10 schematically shows a manner in which the transistors are connected to the sense amplifier in selecting a B port of the unit operator cell. Referring to FIG. 10, in the unit operator cell, in selecting read B port RPRTB, N-channel SOI transistors NQ1 and NQ2 are connected in series between source line SL and sense read bit line RBL. Similarly, for dummy cell, dummy transistors DTB0 and DTB1 are connected in series between the reference voltage source and complementary read bit line ZRBL. Sense read bit lines RBL and ZRBL are connected to sense amplifier SA, sense amplifier SA amplifies the potential difference or current difference between sense read bit lines RBL and ZRBL to produce sense output signals SOUT and /SOUT.

Figure 11:
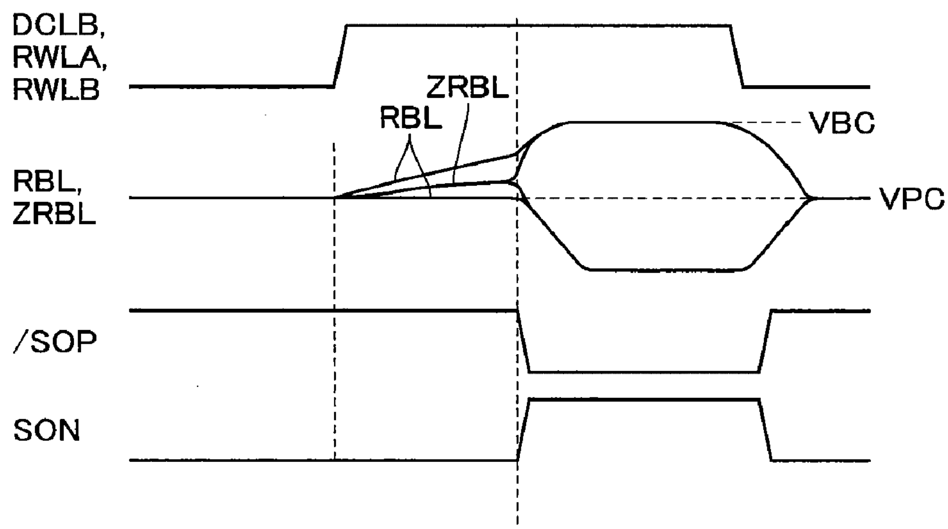
FIG. 11 is a signal waveform diagram representing an operation during data read in the configuration of FIG. 10.

FIG. 11 is a signal waveform diagram representing an operation in data read in the connection manner of the unit operator cell and the dummy cell shown in FIG. 10. Now, referring to FIG. 11, a read operation performed by unit operator cell UOE and dummy cell DMC of FIG. 10 will be described.

In the following description, for SOI transistors NQ1 and NQ2, a high-threshold voltage state corresponds to a state in which data "0" is stored, and a low-threshold voltage corresponds to a state in which data "1" is stored.

In a pre-charge period, read bit line RBL and complementary read bit line ZRBL are pre-charged to a level of a pre-charge voltage VPC by bit line pre-charge/equalize circuit BLEQ of FIG. 6.

When a read cycle is started, read word lines RWLA and RWLB and dummy cell selection signal DCLB are driven to the selected state. A voltage at source line SL has a level of power supply voltage VCC, and is higher than reference voltage Vref supplied to dummy cell DMC. In cases where the data “0” is stored in one of SOI transistors NQ1 and NQ2, the threshold voltage is high and the current amount is small. On the other hand, where the data “1” are stored in both SOI transistors NQ1 and NQ2, the threshold voltage is low and the large amount of current flows.

Accordingly, in cases where the data “1” is stored in both SOI transistors NQ1 and NQ2, the large amount of current is passed from source line SL to sense read bit line RBL through read port RPRTB. In dummy cell DMC, the current is passed from reference voltage source Vref to complementary sense read bit line ZRBL through dummy transistors DTB0 and DTB1. Reference voltage Vref (voltage source and voltage at the voltage source are designated by the same reference symbol) has a voltage level between bit line pre-charge voltage VPC and the voltage (level of power supply voltage VCC) supplied to source line SL. In this case, the amount of current supplied from unit operator cell UOE is larger than the amount of current supplied from dummy cell DMC, and a potential at sense read bit line RBL is higher than a potential at complementary sense read bit line ZRBL.

On the other hand, where the data “0” is stored in at least one of SOI transistors NQ1 and NQ2, the amount of current supplied to complementary sense read bit line ZRBL from dummy cell DMC becomes larger than the amount of current supplied from unit operator cell UOE. The potential at sense read bit line RBL becomes lower than the potential at complementary sense read bit line ZRBL due to the difference in current amount.

At this point, sense amplifier SA is activated by changing sense amplifier active signals /SOP and SON between the L level and the H level. Sense amplifier SA amplifies the data (potential or current amount) read on sense read bit lines RBL and ZRBL differentially.

A high-level output voltage of sense amplifier SA is a voltage level of a sense high-side power supply voltage VBC, and is double the pre-charge voltage VPC in the waveform diagram of FIG. 11. In the PN junction of the body region (storage node), only a voltage that is not higher than a built-in voltage is applied, and destruction of the storage data caused by turn-on of the PN junction of the body region does not occur.

Therefore, even if the voltage level of high-side power supply voltage VBC of sense amplifier SA is transmitted to one of sense read bit lines RBL and ZRBL, the forward bias of the PN junction of each of the body regions of SOI transistors NQ1 and NQ2 and dummy transistor DTB is prevented to prevent the charges from flowing into the body region, and the sensing operation can correctly be performed without causing the destruction of the storage data.

Then read gate CSG of FIG. 6 is selected by read gate selection signal CSL, and the output signal of sense amplifier SA is transmitted to the corresponding main amplifier (MA).

The data read is nondestructive read, a restoring period in which the storage data is re-written is not required. Accordingly, read word lines RWLA and RWLB may be driven to the non-selected state before the sense amplifier operation. The elimination of the restoring period can shorten the read cycle.

Figures 12, 13, 14:
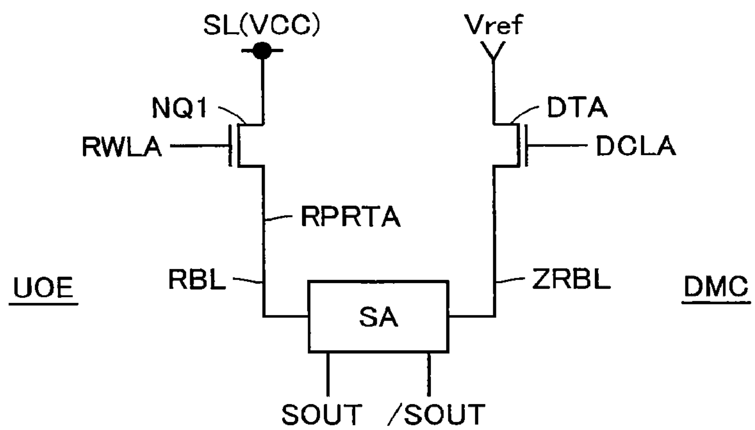
FIG. 12 schematically shows an output signal and an operational result of a sense amplifier in the arrangement shown in FIG. 10.
FIG. 13 schematically shows another configuration in reading storage data of the unit operator cell according to the first embodiment of the present invention.
FIG. 14 schematically shows a correlation between sense amplifier output and operation contents during data read of FIG. 13.

FIG. 12 shows, in a list form, relationships between the storage data and the logical value of the output signal of the sense amplifier in the selected unit operator cell UOE and dummy cell DMC of FIG. 10.

As shown in FIG. 12, only when the data “1” is stored in both SOI transistors NQ1 and NQ2, unit operator cell UOE supplies the current that is larger than that of dummy cell DMC, and output signal SOUT of sense amplifier SA becomes “1”. When the data “0” is stored in one of SOI transistors NQ1 and NQ2, the current supplied from dummy cell DMC becomes larger than the current supplied from unit operator cell UOE, and output signal SOUT of sense amplifier SA becomes “0”. Accordingly, output signal SOUT of sense amplifier SA indicates AND operational result of storage data of SOI transistors NQ1 and NQ2. NAND operational result of the storage data of the unit operator cell is obtained when output signal SOUT of sense amplifier SA is inverted.

Thus, the logic operation on the storage data is performed to obtain the operational result without reading the data externally, only by internally reading the storage data of the unit operator cell.

Referring to FIG. 10, SOI transistor NQ1 is connected to A-port read bit line RBLA through a read port (not shown). Because read bit line RBLA is in n electrically floating state, when read bit line RBLA is charged to the same potential as the charged potential at sense read bit line RBL in the data read, the potential of read bit line RBLA is not changed thereafter, and the data reading on sense read bit line RBL is not influenced.

FIG. 13 schematically shows the connection manner of the unit operator cell and the dummy cell in selecting port A. In the connection of port A, one SOI transistor NQ1 is connected between source line SL and read bit line RBL. In dummy cell DMC, dummy transistor DTA is connected between reference voltage source and complementary read bit line ZRBL in response to dummy cell selection signal DCLA. The sensing operation of sense amplifier SA is similar to the case shown in FIGS. 10 and 11.

In the arrangement of FIG. 13, when the data “0” is stored in SOI transistor NQ1, the amount of current passed from dummy transistor DTA to complementary read bit line ZRBL is larger than the amount of current passed from source line SL through SOI transistor NQ1 to sense read bit line RBL through read port RPRTA. Accordingly, in this case, output signal SOUT of sense amplifier SA becomes an L level (“0”). On the other hand, when the data “1” is stored in SOI transistor NQ1, the amount of current flowing through SOI transistor NQ1 to sense read bit line RBL through read port RPRTA is larger than the amount of current supplied through dummy transistor DTA.

Accordingly, in this case, output signal SOUT of sense amplifier SA becomes an H level (“1”).

Accordingly, as shown in FIG. 14, in the connection of A port, output signal SOUT of sense amplifier SA becomes the data having the same logical value as the storage data of SOI transistor NQ1. When the output signal of sense amplifier SA is inverted, or when the inverted value of the write data is stored in SOI transistor NQ1 and read therefrom, NOT operational result of the write data can be obtained as the output of sense amplifier SA.

Figure 15:
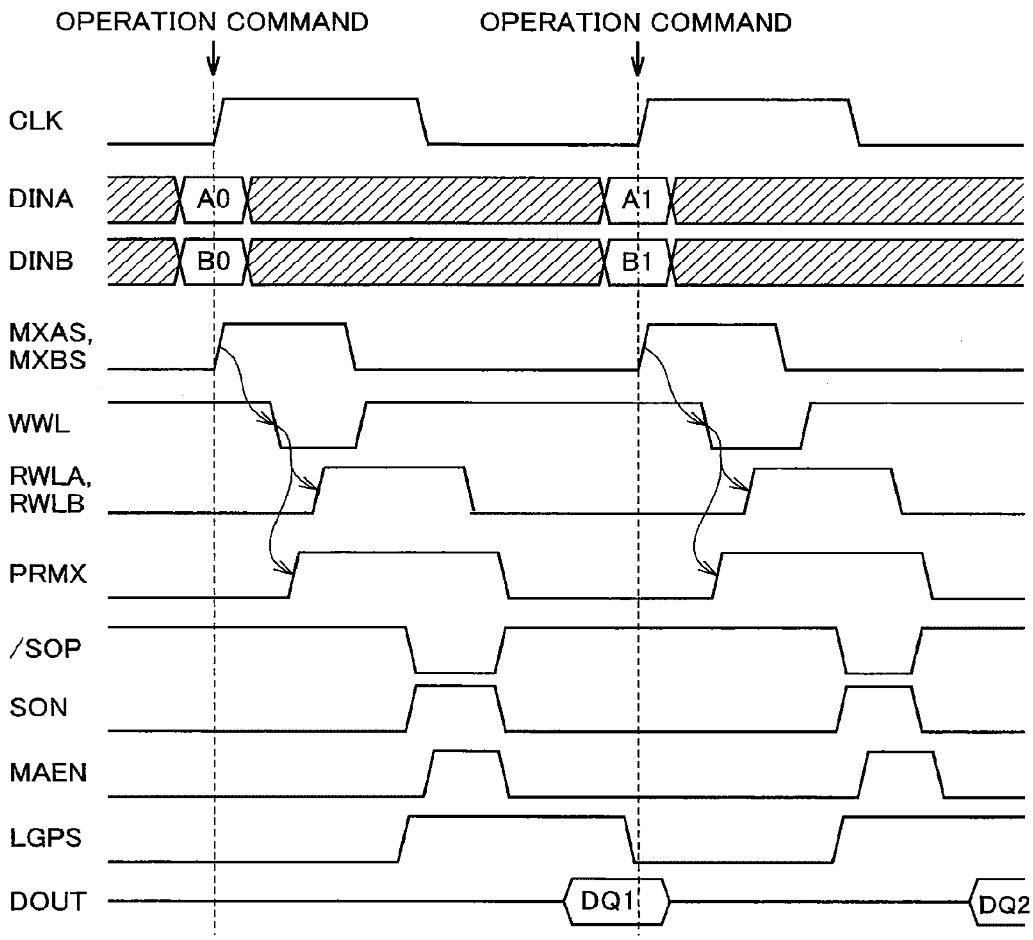
FIG. 15 is a timing chart representing an operation of data write/read of the semiconductor signal processing device according to the first embodiment of the present invention.

FIG. 15 is a timing chart representing a data operation processing sequence of the semiconductor signal processing device of the first embodiment of the present invention. Referring to FIGS. 1 to 8 and 15, an operation of the semiconductor signal processing device of the first embodiment of the present invention will be described below. The operation cycle of the semiconductor signal processing device is defined by an external clock signal CLK. Data DINA and DINB supplied at a rising edge of clock signal CLK is taken in and an operation sequence is started. A command for specifying an operation mode is not shown in FIG. 15. The operation mode is specified by a command externally applied or a command internally generated.

Data A0 and B0 taken in at the rising edge of clock signal CLK are taken into data path 28 of FIG. 4. Switching control signals MXAS and MXBS are applied to data path 28, a data transfer path of data path 28 is set according to operational contents specified by the operation command, and inversion/non-inversion is set for data A0 and B0.

The internal write data is transmitted from data path 28 to the global write data lines through global write drivers 58 and 59 of FIG. 7. In the selected (addressed) operator cell sub-array block, write word line WWL is set in the active state (L level) to turn P-channel SOI transistors PQ1 and PQ2 of FIG. 1 conductive, and charges are injected into body regions SNA and SNB of SOI transistors NQ1 and NQ2 according to the write data.

When the data writing into SOI transistors NQ1 and NQ2 is completed, read word lines RWLA and RWLB or read word line RWLA is driven to the selected state. Referring to FIG. 15, read word line is driven to the selected state when write word line WWL is in the selected state. The data writing is performed to the body region of the SOI transistor, and no particular problem is caused even if the write and the read are concurrently performed. Alternatively, after the data writing is completed and write word line WWL is driven to the non-selected state, the read word line may be driven to the selected state.

In performing the AND operation, read word lines RWLA and RWLB are concurrently driven to the selected state. In performing the NOT operation, read word line RWLA is driven to the selected state and read word line RWLB is maintained in the non-selected state. Before the read word line is driven to the selected state, port selection signal PRMX is set, a port connection switch PRSW (PRSW0 and PRSW1) of read port selection circuit 36 of FIG. 6 selects one of read bit lines RBLA and RBLB to connect the selected bit line to sense read bit line RBL for the sense amplifier. The port selection manner of port selection signal PRMX is set according to operational contents specified by the operation command.

Dummy cell selection signal DCLA/DCLB is also driven to the selected state when read word line RWLA/RWLB is driven to the selected state. Therefore, the current corresponding to the storage data of the unit operator cell and the reference current of the selected dummy cell are passed through read bit lines RBL and ZRBL connected to the sense amplifier, and the potentials at read bit lines RBL and ZRBL are changed. After read word lines RWLA and RWLB are driven to the selected state, sense amplifier activation signals /SOP and SON are activated at a predetermined timing. The voltage levels of read bit lines RBL and ZRBL are changed by the sensing operation of the sense amplifier. The data sensed and amplified by sense amplifier SA is transmitted to corresponding main amplifier MA.

When sense result of sense amplifier SA (see FIG. 6) is settled, a main amplifier activation signal MAEN is activated, and the main amplifier further amplifies the signal (data) produced by the sense amplifier. Logical path instruction signal LGPS is set in a predetermined state (state corresponding to operational contents specified by the operation command). In combination logic operational circuit 26, one of the inverter, the buffer, and the OR gate is selected to supply data DOUT externally. The state of logical path instruction signal LGPS may be set while main amplifier activation signal MAEN is activated or when the path of the data path is specified. In FIG. 15, the state of logical path instruction signal LGPS is set concurrently with the activation of main amplifier activation signal MAEN.

In the next cycle, data A1 and B1 are taken in as input data DINA and DINB along with the operation command again, and the operational processing is performed in response to the operation command. Accordingly, when input data DINA and DINB is imparted, data DQ1, DQ2, . . . indicating the operational result in one clock cycle are produced as output data DOUT by successively performing the data writing and reading, and the operational processing can be performed in one clock cycle.

Accordingly, the operational processing time can be shortened compared with the configuration in which the data is read externally to perform the operational processing by using a separately and externally provided logic gate.

As shown in FIG. 1, the unit operator cell includes the four transistors, and the layout area of the transistors can sufficiently be reduced. The electrically charge amount corresponding to the data is directly injected into the body region of the SOI transistor, the threshold voltage of the data storage SOI transistor can be correctly set at the threshold voltage level corresponding to the storage data, and the variation in threshold voltage can be reduced.

Figure 16:
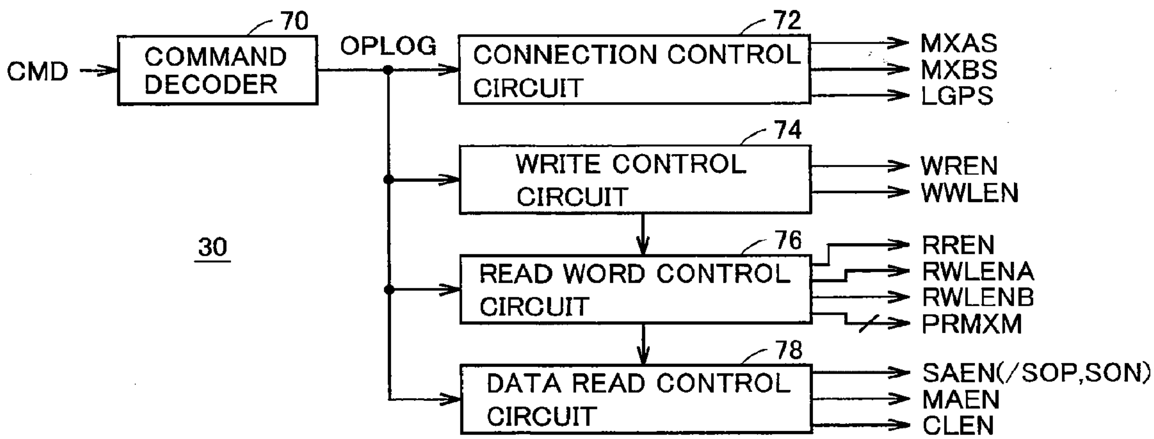
FIG. 16 schematically shows a configuration of a control circuit of FIG. 4.

FIG. 16 schematically shows a configuration of control circuit 30 of FIG. 4. Referring to FIG. 16, control circuit 30 includes a command decoder 70 that decodes an external command CMD, a connection control circuit 72 and a write control circuit 74 and a read word control circuit 76 and a data read control circuit 78 that perform operations according to an operational processing (math operation) instruction OPLOG applied from command decoder 70.

Command decoder 70 takes in command CMD for specifying operation contents externally applied at the rising edge of clock signal CLK (not shown), and produces operation processing instruction OPLOG for specifying operational processing contents.

Connection control circuit 72 produces switching control signals MXAS and MXBS for the data path and logical path instruction signal LGPS for the combination logic operational circuit according to operational processing instruction OPLOG. The data transfer path of the data path is set by switching control signals MXAS and MXBS, and operational contents in the combination logic operational circuit are set according to logical path instruction signal LGPS.

When operational processing instruction OPLOG is applied, write control circuit 74 activates write activation signal WREN and write word line enable signal WWLEN. The circuits related to the data write, such as the global write driver and the write word line decode circuit, which are included in the data path, are activated in response to write activation signal WREN. Write word line enable signal WWLEN provides the timing at which the write word line is driven to the selected state.

Read word control circuit 76 produces a read activation signal RREN, read word line enable signals RWLENA and RWLENB, and main port selection signal PRMXM according to operational processing instruction OPLOG. The operation of the portion related to the data read is performed in a selected operator cell sub-array block in response to those signals. Operation starting timing of read word control circuit 76 is set after write activation signal WREN is activated in write control circuit 74. The circuits such as a read word line decode circuit are activated according to the activation of read activation signal RREN.

Data read control circuit 78 activates a sense amplifier activation signal SAEN (/SOP and SON), main amplifier activation signal MAEN, and a read gate selection timing signal CLEN according to read activation signal RREN from read word control circuit 76 and operational processing instruction OPLOG. Read gate selection timing signal CLEN provides read gate path connection timing at which the sense amplifier and the corresponding global read data lines are connected.

The signals that are produced by write control circuit 74, write word control circuit 76 and data write control circuit 78 are applied to row selection driving circuit (22) that is provided for each operator cell sub-array block. The activation of the read word line and write word line and dummy cell selection, the connection of the bit line and the sense amplifier, the transfer of the output signal of the sense amplifier to the main amplifier are performed in each addressed operator cell sub-array block.

Figure 17:
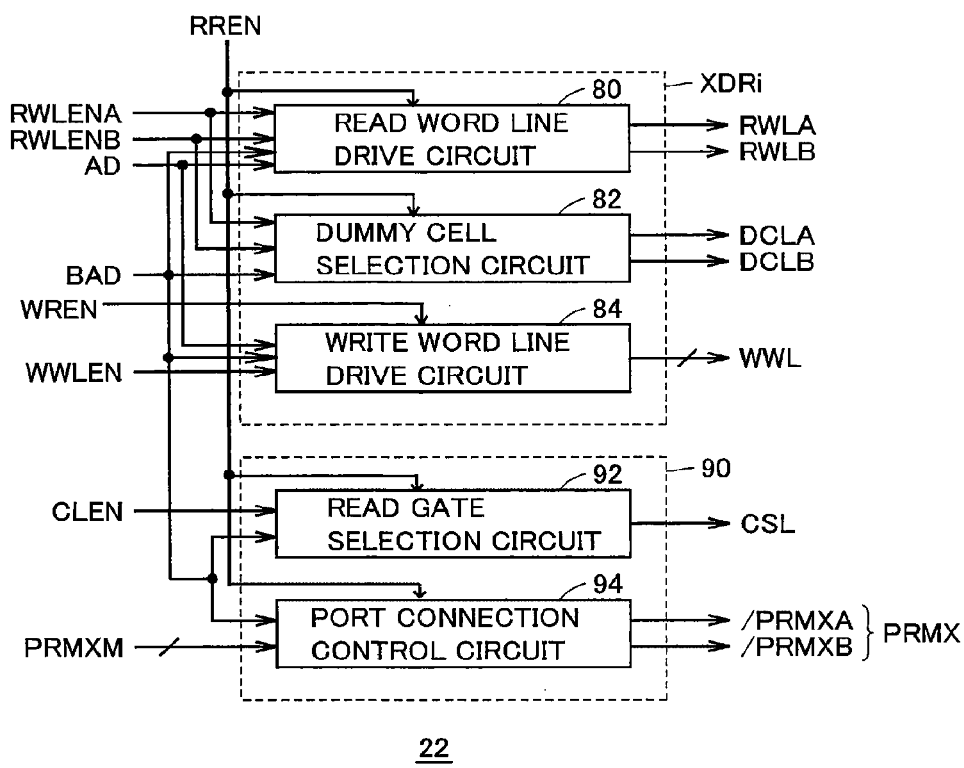
FIG. 17 schematically shows a configuration of a row selection driving circuit of FIG. 4.

FIG. 17 schematically shows a configuration of row drive circuit XDRi of FIG. 4 along with the selection circuit of the operator cell sub-array block. Row drive circuit XDRi (i=0 to 31) and a block selection circuit 90 are disposed for each operator cell sub-array block in row selection driving circuit 22 of FIG. 4.

Row drive circuit XDRi includes a read word line drive circuit 80 that drives a read word line, a dummy cell selection circuit 82 that selects the dummy cell, and a write word line drive circuit 84 that selects a write word line.

Read word line drive circuit 80 is enabled by read activation signal RREN, and drives read word lines RWLA and RWLB arranged for an addressed unit operator cell row to the selected state according to read word line enable signals RWLENA and RWLENB from read word control circuit 76, an address signal AD, and a block address BAD for specifying an operator cell sub-array block. In read word line drive circuit 80, the selection mode of read word lines RWLA and RWLB is set by read word line enable signals RWLENA and RWLENB, thereby performing the setting in which data is read through which one of read ports RPRTA and RPRTB.

Dummy cell selection circuit 82 is enabled by read activation signal RREN, and drives dummy cell selection signals DCLA and DCLB to the selected state according to block address signal BAD for specifying an operator cell sub-array block and read word line enable signals RWLENA and RWLENB. The selection mode of dummy cell selection signals DCLA and DCLB is set according to the selection mode of read word line enable signals RWLENA and RWLENB. When both read word line enable signals RWLENA and RWLENB are activated, dummy cell selection signal DCLB is driven to the selected state. When read word line enable signal RWLEN is in the active state while read word line enable signal RWLENB is in the inactive state, dummy cell selection signal DCLA is driven to the selected state.

Write word line drive circuit 84 is enabled by write activation signal WREN and block address signal BAD, and drives the write word line arranged for the unit operator cell row specified by address signal AD to the selected state in response to write word line enable signal WWLEN.

Block selection circuit 90 includes a read gate selection circuit 92 that selects the read gate and a port connection control circuit 94 that controls a read bit line connection path. Read gate selection circuit 92 drives read gate selection signal CSL to the selected state in response to read gate selection timing signal CLEN when block address signal BAD specifies the corresponding operator cell sub-array block in activation of read activation signal RREN. Here, for the selection mode of the read gate (CSG), it is assumed that all the columns are concurrently selected in a selected operator sub-array block. Where the sense amplifier group including a predetermined number of sense amplifiers is selected in the sub-array block, the read column selection signal is produced in response to the address signal, and is combined with read gate selection signal CSL.

Port connection control circuit 94 selectively inactivates port selection signals /PRMXA and /PRMXB in response to main port selection signal PRMXM when block address signal BAD specifies a corresponding operator cell sub-array block in the activation of read activation signal RREN. Port selection signals /PRMXA and /PRMXB correspond to port selection signal PRMX. Main port selection signal PRMXM includes port specifying information, and port connection control circuit 94 connects read bit line (RBLA/RBLB) corresponding to the port specified by main port selection signal PRMXM to sense read bit line RBL. In a standby state, port connection control circuit 94 maintains port selection signals /PRMXA and /PRMXB in the active state to connect sense read bit line RBL to read bit lines RBLA and RBLB, which in turn are pre-charged and equalized to a predetermined potential (VPC) level by the bit line pre-charge/equalize circuit of FIG. 6.

Figure 18:
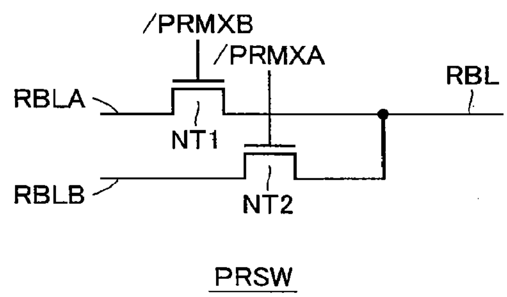
FIG. 18 schematically shows an example of a configuration of a read port selection circuit of FIG. 6.

FIG. 18 schematically shows a configuration of port connection circuit PRSW of FIG. 6. Referring to FIG. 18, port connection circuit PRSW includes two N-channel SOI transistors NT1 and NT2. Transistors NT1 and NT2 may be formed by a bulk transistor (transistor formed at the surface of the well region).

Transistors NT1 and NT2 are made non-conductive when port selection signals /PRMXB and /PRMXA are activated at the L level. That is, port selection signals /PRMXA and /PRMXB are set at the L level of the active state when read ports RPRTA and RPRTB are specified, respectively. Accordingly, when read port RPRTA is specified, port selection signal /PRMXA becomes the L level, transistor NT2 is put into the non-conductive state, and transistor NT1 is put into the conductive state. When read port RPRTB is specified, port selection signal /PRMXA becomes the inactive state of the H level, and port selection signal /PRMXB becomes the L level of the active state. Accordingly, transistor NT2 connects B-port read bit line RBLB to sense read bit line RBL.

A transmission gate may be used instead of transistors NT1 and NT2.

A specific operation processing mode of the semiconductor signal processing device of the first embodiment of the present invention will be described below.

(NOT Operation)

Figure 19:
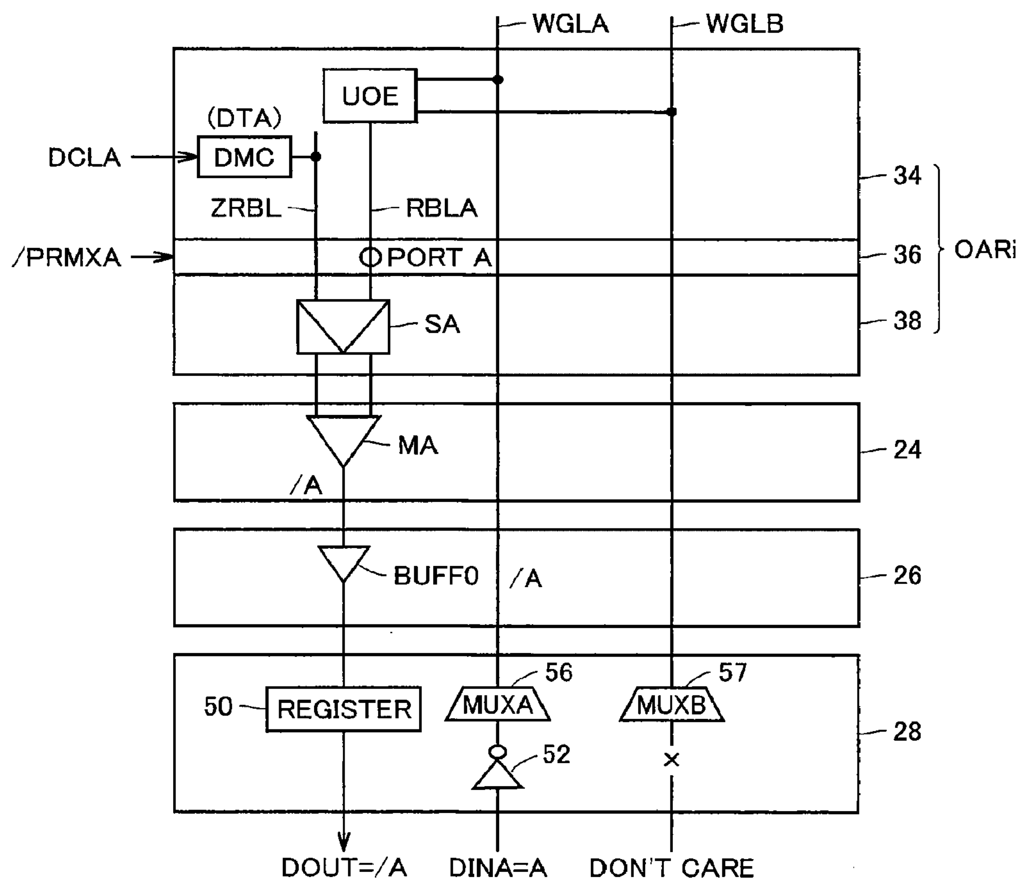
FIG. 19 schematically shows a data propagation path in performing NOT operation of the semiconductor signal processing device according to the first embodiment of the present invention.

FIG. 19 schematically shows the connection manner of a data propagation path of data path 28 and combination logic operational circuit 26 when NOT operation is performed in the semiconductor signal processing device of the first embodiment of the present invention. Referring to FIG. 19, for the NOT operation, in data path 28, multiplexer (MUXA) 56 selects the output signal of inverter 52 that receives input data DINA (=A) externally applied, and transmits the output signal onto global write data line WGLA through a global write driver (not shown). Accordingly, inverted data /A is transmitted onto global write data line WGLA, and is written in unit operator cell UOE. In this case, the input selection manner of multiplexer (MUXB) 57 is in a "don't-care" state, and valid write data is not transmitted to global write data line WGLB. Accordingly, in unit operator cell UOE, inverted data /A is stored in the body region (storage node SNA) of SOI transistor NQ1.

Dummy cell selection signal DCLA is applied to (activate) dummy cell DMC to bring dummy transistor DTA into the conductive state. In read port selection circuit 36, port connection circuit (PRSW) is set in the state in which read port RPRTA (hereinafter arbitrarily referred to as port A or A port) is selected, and read bit line RBLA is connected to sense amplifier SA.

Accordingly, the output data of sense amplifier SA is inverted data /A of data A stored in unit operator cell UOE, and inverted data /A is transmitted from corresponding main amplifier MA in main amplifier circuit 24.

In combination logic operational circuit 26, because buffer BUFF0 is selected, data DOUT supplied externally through register 50 is inverted data /A. Therefore, the NOT operation can be performed.

Alternatively, input data A may be selected, and written into and read from unit operator cell UOE in data path 28, and inverter (INV0) may be selected to produce external data DOUT through register 50 in combination logic operational circuit 26. In this case, non-inverted data A is supplied from sense amplifier SA and is then inverted, and similarly, the NOT operational result is obtained for the input data.

(AND Operation)

Figure 20:
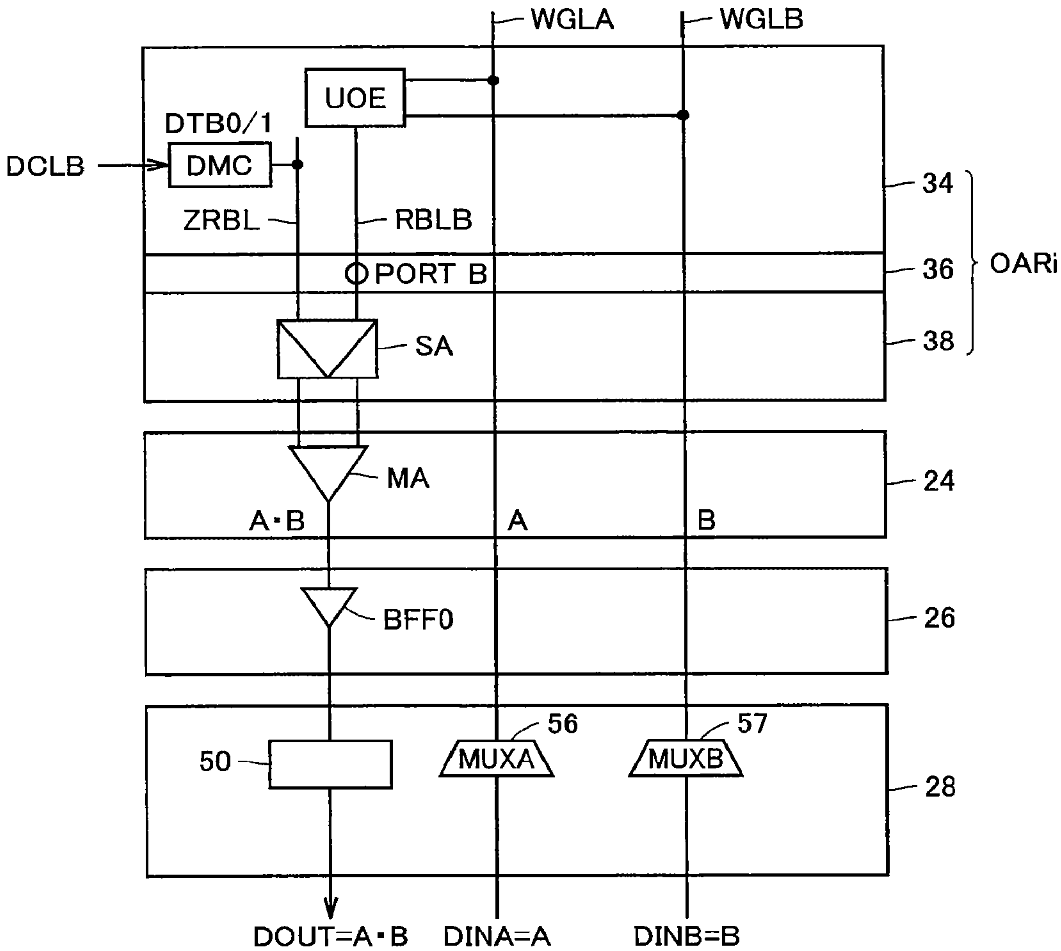
FIG. 20 schematically shows a data propagation path in performing AND operation of the semiconductor signal processing device according to the first embodiment of the present invention.

FIG. 20 schematically shows a connection manner of a data propagation path in performing AND operation in the semiconductor signal processing device of the first embodiment of the present invention. Referring to FIG. 20, in data path 28, multiplexers 56 and 57 select external input data DINA (=A) and DINB (=B). Accordingly, write data A and B are transmitted onto global write data lines WGLA and WGLB through global write drivers (not shown). In unit operator cell UOE, write data A and B are stored in the body regions of SOI transistors NQ1 and NQ2, respectively.

In read port selection circuit 36, read port RPRTB (hereinafter arbitrarily referred to as port B or B port) is selected and read bit line RBLB is connected to sense amplifier SA. In dummy cell DMC, dummy transistor DTB0/1 (DTB0 and DTB1) are selected in response to dummy cell selection signal DCLB. Accordingly, as shown in FIG. 12, the output data of sense amplifier SA indicates the AND operational result of data A and B, and the AND operational result A·B is supplied from corresponding main amplifier MA of main amplifier circuit 24.

In combination logic operational circuit 26, buffer BFF0 is selected in response to the logical path instruction signal. Accordingly, output data DOUT transmitted from buffer BFF0 through register 50 is data A·B. Therefore, the logical product operational result (AND operation result) can be obtained for input data A and B.

(OR Operation)

Figure 21:
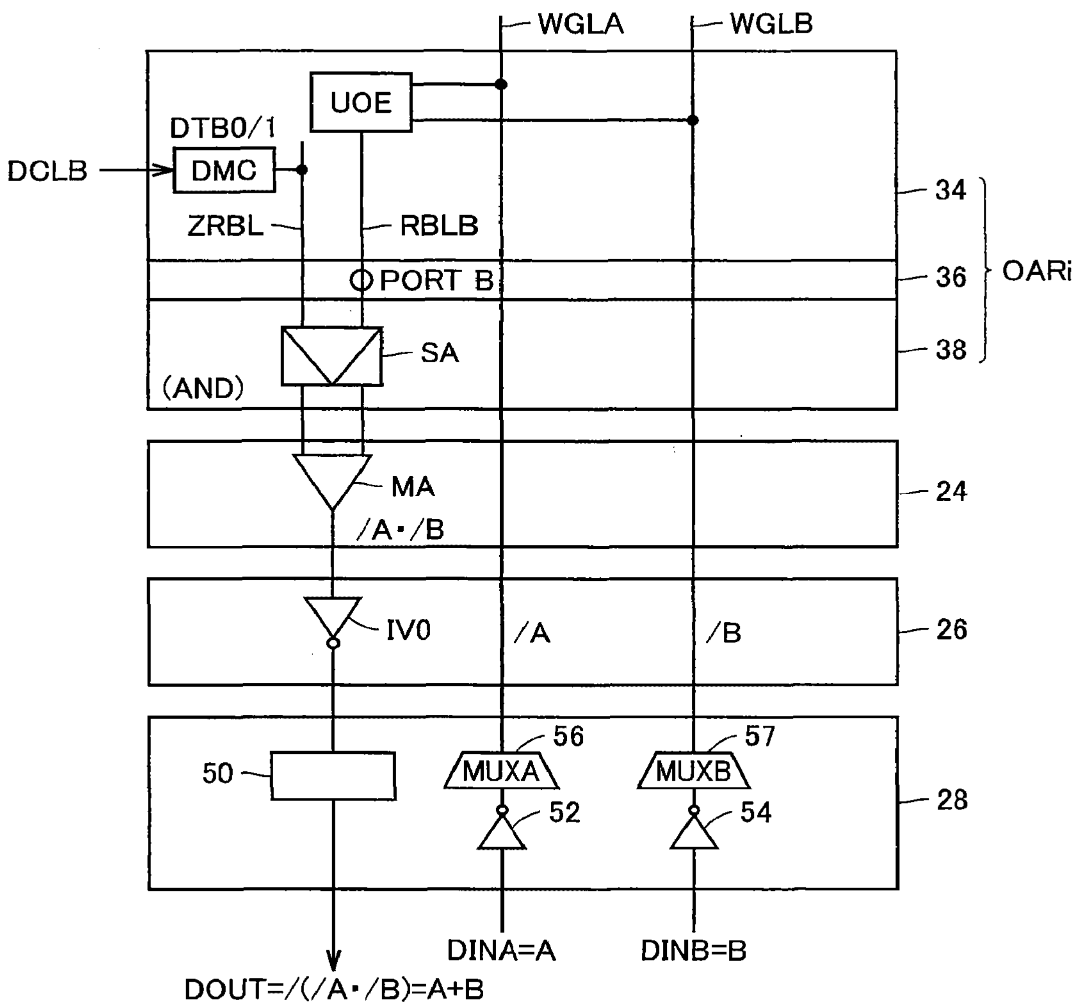
FIG. 21 schematically shows a data propagation path in performing OR operation of the semiconductor signal processing device according to the first embodiment of the present invention.

FIG. 21 schematically shows a connection manner of a data propagation path in performing OR operation in the semiconductor signal processing device of the first embodiment of the present invention. In performing the OR operation, in data path 28, multiplexers 56 and 57 selects the inverted values of input data DINA (=A) and DINB (=B) that are applied through inverters 52 and 54. Accordingly, data /A and /B are transmitted onto global write data lines WGLA and WGLB through global write drivers (not shown) and stored in a corresponding unit operator cell UOE, respectively.

In read port selection circuit 36, port B (read port RPRTB) is selected and read bit line RBLB is connected to sense amplifier SA. Dummy cell selection signal DCLB is applied to dummy cell DMC to select dummy transistors DTB0 and DTB1. Accordingly, because sense amplifier SA performs the AND operation, the output data of corresponding main amplifier MA in main amplifier circuit 24 becomes data /A·/B.

In combination logic operational circuit 26, inverter IV0 is selected to invert the output data of main amplifier MA. Accordingly, data DOUT supplied through register 50 becomes data /(/A·/B) that is equivalent to data (A+B), thereby obtaining the OR (logical addition) operational result of input data A and B.

(XOR Operation)

Figure 22:
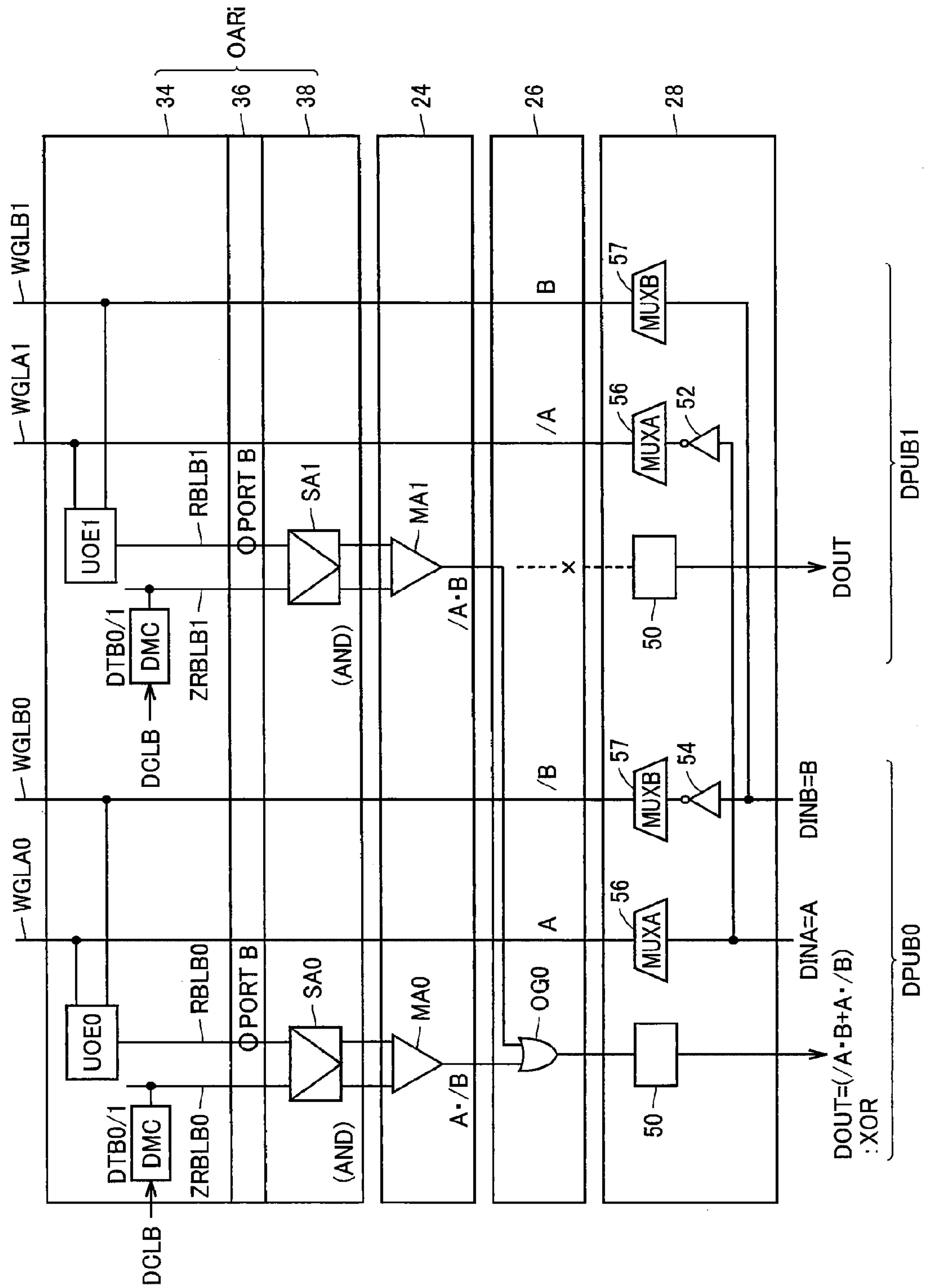
FIG. 22 schematically shows a data propagation path in performing XOR operation of the semiconductor signal processing device according to the first embodiment of the present invention.

FIG. 22 schematically shows a connection manner of a data propagation path in performing XOR operation in the semiconductor signal processing device of the first embodiment of the present invention. As shown in FIG. 22, data path unit blocks DPUB0 and DPUB1 included in one data path operation unit group are used when the XOR operation is performed. In data path unit block DPUB0, multiplexer (MUXA) 56 selects input data DINA (=A), and multiplexer 57 selects the inverted value of input data DINB (=B). The inverted value of input data DINB (=B) is supplied from inverter 54. Accordingly, data A and /B are transmitted onto corresponding global write data lines WGLA0 and WGLB0 and stored in corresponding unit operator cell UOE0.

In data path unit block DPUB1, multiplexer 56 selects the inverted value of the input data A, and multiplexer 57 selects input data B. The inverted value of the input data A is supplied from inverter 52. Accordingly, data /A and B are transmitted onto corresponding global write data lines WGLA1 and WGLB1, respectively and stored in corresponding a unit operator cell UOE1.

In operator cell sub-array block OARi, dummy cell selection signal DCLB is applied to dummy cell DMC for selecting two series-connected dummy transistors DTB0 and DTB1. In read port selection circuit 36, port B (read port RPRTB) is selected, and therefore read bit lines RBLB0 and RBLB1 are connected to corresponding sense amplifiers SA0 and SA1. In the connection manner of the dummy cell and unit operator cell, sense amplifiers SA0 and SA1 each supply the AND operational results. Accordingly, main amplifier MAO of main amplifier circuit 24 supplies data A·/B, and main amplifier MA1 produces data /A·B.

In combination logic operational circuit 26, two-input OR gate OG0 is selected to perform the logical addition of the output signals of main amplifiers MA0 and MA1. Accordingly, register 50 supplies output data DOUT of (/A·B+A·/B), and the XOR operational result of input data A and B can be obtained as the output data DOUT.

(XNOR Operation)

Figure 23:
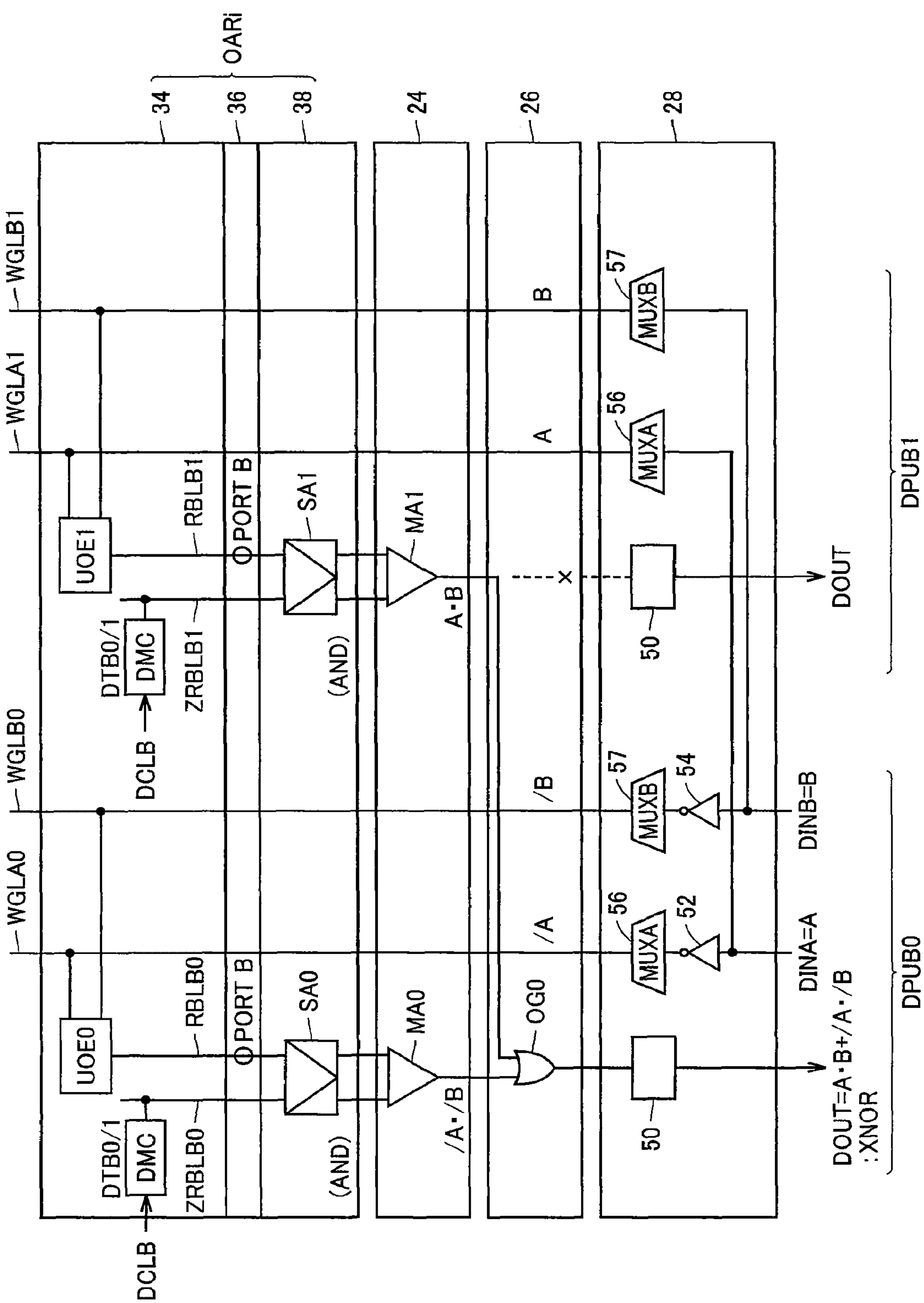
FIG. 23 schematically shows a data propagation path in performing XNOR operation of the semiconductor signal processing device according to the first embodiment of the present invention.

FIG. 23 schematically shows a connection manner of a data propagation path in performing XNOR operation in the semiconductor signal processing device of the first embodiment of the present invention. Referring to FIG. 23, two data path unit blocks DPUB0 and DPUB1 are also used when the XNOR operation is performed. In data path unit block DPUB0, multiplexer (MUXA) 56 selects the inverted value of input data DINA (=A), and multiplexer (MUXB) 57 selects the inverted value of input data DINB (=B). The inverted value of input data DINA (=A) is supplied from inverter 52, and the inverted value of input data DINB (=B) is supplied from inverter 54. Accordingly, data /A and /B are transmitted onto corresponding global write data lines WGLA0 and WGLB0 and stored in corresponding unit operator cell UOE0.

In data path unit block DPUB1, multiplexers 56 and 57 select input data A and B. Accordingly, data A and B are transmitted onto corresponding global write data lines WGLA1 and WGLB1 and stored in corresponding unit operator cell UOE1. In memory cell array 34, dummy cell selection signal DCLB is applied to dummy cell DMC for selecting series-connected dummy transistors DTB0 and DTB1. In read port selection circuit 36, port B (read port RPTRB) is selected. Accordingly, read bit lines RBLB0 and RBLB1 are connected to corresponding sense amplifiers SA0 and SA1, respectively.

In this connection manner, each of sense amplifiers SA0 and SA1 perform the AND operation of storage data of unit operator cell UOE0 and of unit operator cell UOE1 to transmit the data indicating the AND operational result to corresponding main amplifies MA0 and MA1 included in main amplifier circuit 20. Accordingly, main amplifier MAO produces data /A·/B, and main amplifier MA1 produces data A·B.

In combination logic operational circuit 26, two-input OR gate OG0 is selected. Two-input OR gate OG0 receives output data of main amplifiers MA0 and MA1. Accordingly, data DOUT supplied from OR gate OG0 through register 50 becomes data A·B+/A·/B that is equal to the XNOR operational result of input data A and B.

Thus, the data transfer paths in data path 28 and combination logic operational circuit 26 are set according to the operational contents, so that the operational results for input data can be obtained in one clock cycle.

Figure 24:
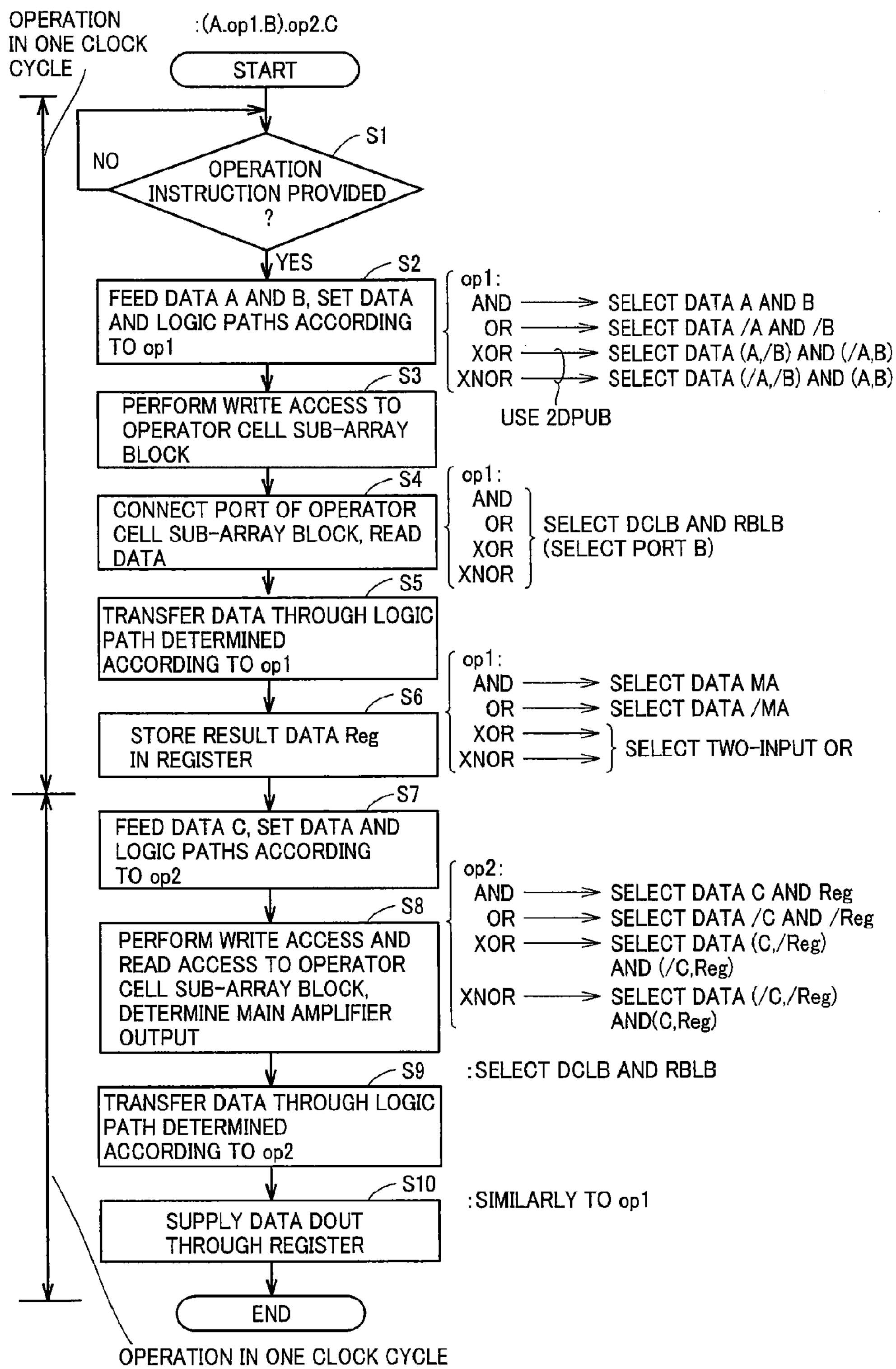
FIG. 24 is a flowchart representing an operational processing operation of the semiconductor signal processing device according to the first embodiment of the present invention.

FIG. 24 is a flowchart representing an operation sequence of a composite operation in which two logic operations are successively performed. FIG. 24 represents the operation in processing a composite operation (A.op1.B).op2.C. Referring to FIG. 24, a composite operational processing sequence will be described below. Each of the operations of operators op1 and op2 is performed in one clock cycle.

The device waits for an external operation instruction (Step S1). When the operation instruction is supplied, data A and B are supplied, the paths of the data path and logical path are set according to operator op1 based on the operational contents (specified by OPLOG) instructed by the operation instruction (Step S2). Here, the logical path indicates the combination logic operational circuit. In this case, in data path unit block (DPUB), data A and B are selected when operator op1 is the AND operation. Data /A and /B are selected when operator op1 is the OR operation. A set of data (A,/B) and (/A,B) is selected when operator op1 is the XOR operation. Data (/A,/B) and (A,B) are selected when operator op1 is the XNOR operation. That is, as described above, in the case of the XOR operation and XNOR operation, the operation is performed using two data path unit blocks DPUB.

When the data propagation path of the data path is set (at this time point, the path of the logical path is also set), write access to the operator cell sub-array block is made, and the set data is written in the unit operator cell(s) (Step S3).

The data is read from the operator cell sub-array block at the same time as the data is written in the operator cell sub-array block (Step S4). At this time, for example, port B is selected in the case where operator op1 is any one of the AND operation, OR operation, XOR operation, and XNOR operation. That is, dummy cell selection signal DCLB is driven to the selected state, and read word lines RWLA and RWLB are driven to the selected state, to implement the selection manner of the dummy cells and ports for the data connection paths of FIGS. 19 to 23. Read bit lines RBLB and ZRBLB are connected to the corresponding sense amplifier to perform the sensing operation. The output signals of the sense amplifiers are transmitted to the corresponding main amplifiers.

When the data is read from the operator cell sub-array block and the output data of main amplifier MA turns definite, the data is transferred through the path of the logical path (combination logic operational circuit) that is determined according to operator op1 (Step S5). At this point, in the logical path (combination logic operational circuit), an output signal MA of the main amplifier and an inverted signal /MA of the output signal MA are selected when operator op1 is one of the AND operation and OR operation, and two-input OR gate (OG0) is selected when operator op1 is one of the XOR operation and XNOR operation. The data transferred through the route in the logical path is stored in register (50) in the data path. Therefore, the operational result (A.op1.B) is stored as data Reg (Step S6). One clock cycle is consumed for the data write and read to complete one operation cycle in which the operation is performed for operator op1.

Here, it is assumed that the AND operation and OR operation are performed by the use of the outputs of the sense amplifiers. The NAND operation and NOR operation can be performed in a similar manner. The term of logical product operation is used to refer to both the AND operation and NAND operation, and the term of logical sum operation will is used to refer to both the NOR operation and OR operation in the following description.

Then, the operation sequence enters the next operation cycle, data C is supplied, and the routes of the data path and logic path are set according to operator op2 (Step S7). In data path (DPUB), external data C and data Reg stored in register (50) in the data path are selected when operator op2 is the AND operation. Inverted data /C of the external data and inverted value /Reg of the data stored in the register are selected when operator op2 is the OR operation. A set of data of (C, /Reg) and (/C, Reg) is selected when operator op2 is the XOR operation. A set of data of (/C, /Reg) and (C, Reg) is selected when operator op2 is the XNOR operation.

Then, similarly to Steps S2 to S4, the write access and the read access to the operator cell sub-array block are made. In this case, port B is also selected, and dummy transistors (DTB0 and DTB1) for selection of port B are selected as dummy cell DMC. Then, the output of the main amplifier is decided according to the output of the sense amplifier (Step S8).

The sense amplifier output in the definite state is transferred through the logic path route that is determined according to operator op2 in the combination logic operational circuit (Step S9). The data path setting manner of the combination logic operational circuit is similar to that in the case of operator op1.

The operational result data is obtained from the data transferred through the data propagation route set in the combination logic circuit in Step S9, and final operational result data DOUT is supplied through the register (Step S10). The second operation cycle is completed.

In the composite operation, it is necessary to perform the operational processing after the result of operation (A.op1.B) is decided, and it is necessary to sequentially make the access to the operator cell sub-array twice. That is, the data write and read are performed in one clock cycle for operator op1, and the data write and read are also performed in one clock cycle for operator op2. Accordingly, the operation can be performed in the total of two clock cycles for the operators op1 and op2.

In the processing sequence, operator op2 is issued along with data C to perform the operational processing after one clock cycle elapses since operator op1 is issued along with data A and B. Therefore, the composite operational processing can easily be implemented only by switching the data transfer paths of the internal configuration.

The write cycle for data C can be started when the output signal of the internal main amplifier, that is, the value stored in the register of the data path is settled. Accordingly, the write access timing can internally be set at a faster timing for data C (the write data is supplied in the continuous clock cycle and timing of the write driver for data C is adjusted to data decided timing of the register in the data path).

In accordance with the first embodiment of the present invention, in the unit operator cell, the two SOI transistors are used to store the data according to the accumulated charge amount in the body regions of the SOI transistors, the SOI transistors are/is selected according to the operational contents, and the write data and read data are set according to the operational contents.

Accordingly, for the unit operator cell, magnitude of the amount of current flowing through the bit line is sensed to read the storage data, so that the read operation r can be performed at high speed unlike the data read that is performed through the charge movement using a capacitor or the like. The large change in current amount can be generated, and the data can securely be sensed even under the low power supply voltage. Further, the data is not read externally for performing an operational processing by a separately provided logic gate, so that the operational processing can be performed at high speed. Additionally, the unit operator cell is formed by the four SOI transistors, so that the layout area can be reduced to prevent the increase in area of the memory cell array.

[Second Embodiment]

Figure 25:
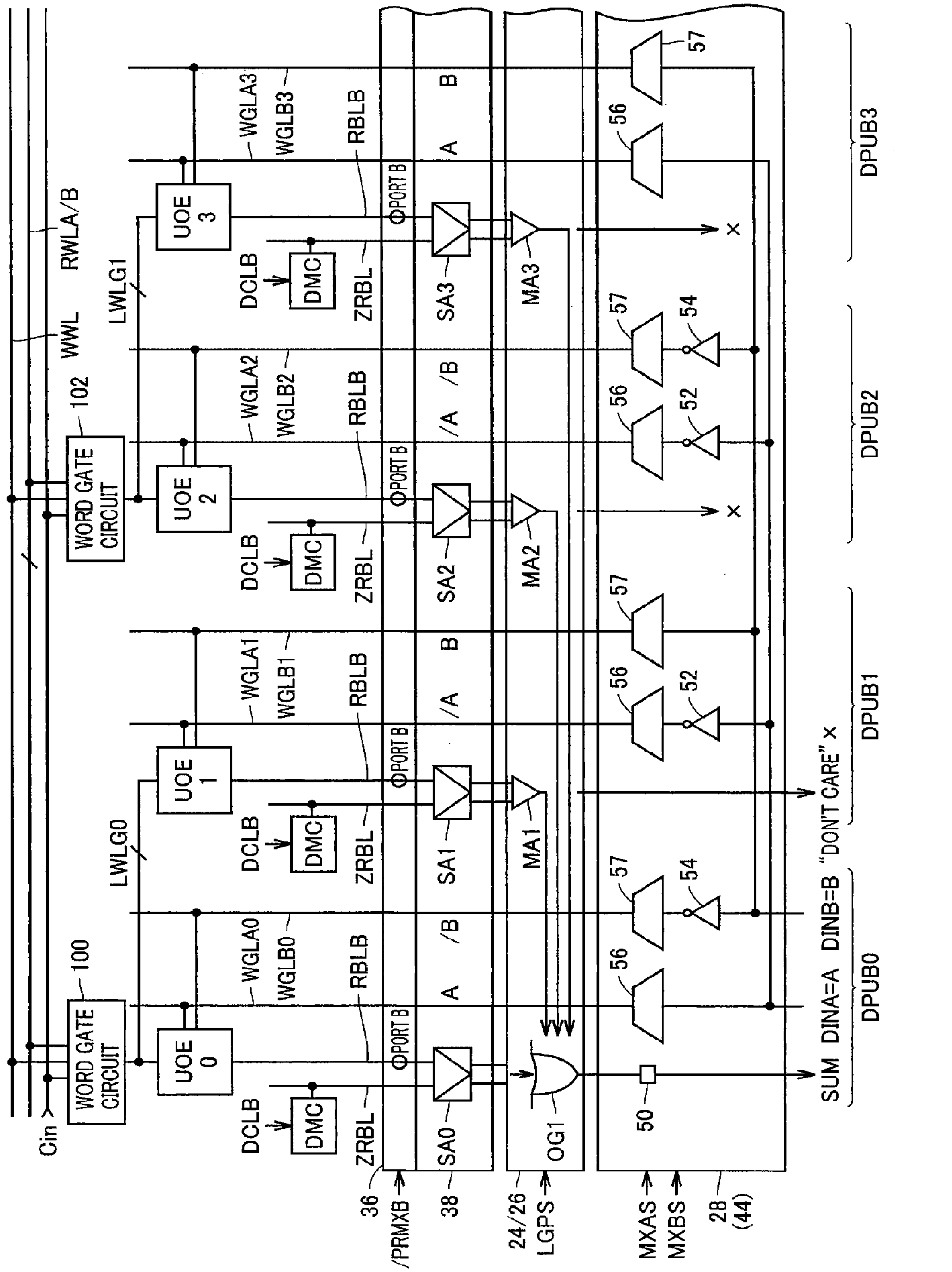
FIG. 25 schematically shows configurations of a data path, a combination logic operational circuit, and an operator cell sub-array in performing addition of a semiconductor signal processing device according to a second embodiment of the present invention.

FIG. 25 schematically shows a configuration of a one-bit adder in a semiconductor signal processing device according to a second embodiment of the present invention. FIG. 25 shows the configuration of data path unit blocks DPUB0 to DPUB3 included in data path operation unit group (44). In the configuration of FIG. 25, a word gate circuit 100 is provided for unit operator cells UOE0 and UOE1, and a word gate circuit 102 is provided for unit operator cells UOE2 and UOE3. Unit operator cells UOE0 to UOE3 are arranged corresponding to data path unit blocks DPUB0 to DPUB3.

When an input carry Cin is “0”, word gate circuit 100 transmits the signals on write word line WWL and read word line pair RWLA/B of to a local word line group LWLG0. When input carry Cin is “1”, word gate circuit 100 maintains local word line group LWLG0 in the non-selected state.

Read word line pair RWLA/B includes read word lines RWLA and RWLB. Local word line group LWLG0 includes a local write word line LWWL0 and local read word lines LRWLA0 and LRWLB0. In the configuration of FIG. 25, local write/read word line group LWLG indicates the write/read word lines disposed for the set of two unit operator cells UOE0 and UOE1 or unit operator cells UOE2 and UOE3.

In the case of input carry Cin being “1”, word gate circuit 102 transmits the signal potential on write word line WWL and the signal potential on read word line pair RWLA/B to a corresponding local word line group LWLG1. In the case of input carry Cin being “0”, word gate circuit 102 maintains corresponding local word line group LWLG1 in the non-selected state.

Accordingly, unit operator cells UOE0 and UOE1 are set in the non-selected state in the case of input carry Cin being “1”, and unit operator cells UOE2 and UOE3 are set in the non-selected state in the case of input carry Cin being “0”. That is, the data is selectively written in and read from the unit operator cell according to the logical value of input carry Cin.

In the one-bit addition, dummy cell selection signal DCLB is supplied to dummy cell DMC to select two series-connected dummy transistors (DTB0 and DTB1). In read port selection circuit 36, port B (read port RPRTB) is selected to connect read bit lines RBLB to corresponding sense amplifiers SA0 to SA3. Sense amplifiers SA0 to SA3 supply AND operational results for data stored in corresponding unit operator cells UOE0 to UOE3 (when the unit operator cell is in the selected state), respectively.

In the addition operation, the following route setting is performed in data path operation unit group 44. In data path unit block DPUB0, multiplexer 56 selects input data DINA (=A), multiplexer 57 selects the inverted value of input data DINB (=B). The inverted value of input data DINB (=B) is supplied from inverter 54. Accordingly, data A and /B are transmitted to corresponding global write data lines WGLA0 and WGLB0 through global write drivers (not shown), respectively.

In data path unit block DPUB1, multiplexer 56 selects the inverted value of input data A, which is supplied from inverter 52. Multiplexer 57 selects input data B. Accordingly, data /A and B are transmitted to corresponding global write data lines WGLA1 and WGLB1, respectively.

In data path unit block DPUB2, multiplexers 56 and 57 select the inverted values of input data A and B, which are supplied from inverters 52 and 54. Accordingly, data /A and /B are transmitted to corresponding global write data lines WGLA2 and WGLB2, respectively.

In data path unit block DPUB3, multiplexers 56 and 57 select input data A and B, and data A and B are transmitted to global write data lines WGLA3 and WGLB3 through not shown write drivers, respectively.

For dummy cell DMC, two series-connected dummy transistors (DTB0 and DTB1) are selected according to dummy cell selection signal DCLB.

In combination logic operational circuit 26, four-input OR gate OG1 that receives outputs of main amplifiers MAO (not shown) to MA3 included in main amplifier circuit 24 is selected according to logical passage instruction signal LGPS. In read port selection circuit 36, combination logic operational circuit 26, and data path 28, routes are set in response to control signals /PRMXB, LGPS, MXAS, and MXBS.

Figures 26, 27:
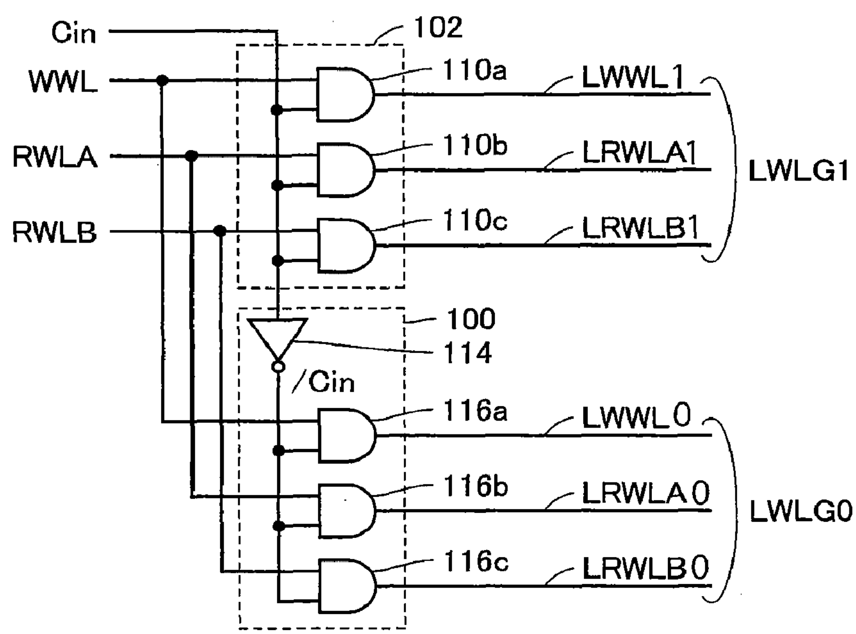
FIG. 26 shows a list of a correlation between input data and output sum in an arrangement of FIG. 25.
FIG. 27 schematically shows an example of a word gate circuit of FIG. 25.

FIG. 26 shows, in a list form, relationship among a sum SUM, input data A and B, and an input carry Cin in the one-bit adder of FIG. 25. In FIG. 26, in the case of input carry Cin being “0”, sum SUM becomes “1” when data (A,B) is data (0,1) and (1,0). That is, in the case of input carry Cin being“0”, sum SUM becomes “1” when one of operational results /A·B and A·/B is “1”.

On the other hand, in the case of input carry Cin being “1”, sum SUM becomes “1” when data (A,B) is data (0,0) or (1,1). That is, sum SUM becomes “1” when one of operational results /A·/B and A·B is “1”.

The selection/non-selection of the word line (including write word line and read word line) is set according to input carry Cin, by utilizing the relationship of FIG. 26.

FIG. 27 schematically shows a configuration of word gate circuits 100 and 102 of FIG. 24. Referring to FIG. 27, word gate circuit 102 includes AND gates 110*a* to 110*c* that are provided corresponding to write word line WWL and read word lines RWLA and RWLB. In the case of input carry Cin being “1” (H level), AND gates 110*a* to 110*c* transmit the signals on corresponding word lines WWL, RWLA, and RWLB to corresponding local write word line LWWL1 and local read word lines LRWLA1 and LRWLB1. In the case of input carry Cin being “0” (L level), word gate circuit 102 maintains all the local word lines of local word line group LWLG1 at the L level of the non-selected state.

Word gate circuit 100 includes an inverter 114 that inverts input carry Cin and AND gates 116*a* to 116*c* that are provided corresponding to local word lines LWWL0, LRWLA0, and LRWLB0. Inverted input carry /Cin is commonly imparted from inverter 114 to AND gates 116*a* to 116*c*. In the case of input carry Cin being “1”, AND gates 116*a* to 116*c* set all corresponding local word lines LWWL0, LRWLA0, and LRWLB0 at the L level of the non-selected state. In the case of input carry Cin being "0", AND gates 116*a* to 116*c* transmit the signals on corresponding word lines WWL, RWLA, and RWLB to corresponding local word lines LWWL0, LRWLA0, and LRWLB0.

Referring to FIGS. 26 and 27, the addition operation performed by the one-bit adder of FIG. 25 will be described. As described below, port B is selected as the read port, and series-connected dummy transistors (DTB0 and DTB1) are selected as the dummy cell. Sense amplifiers SA0 to SA3 selectively supply the AND operational results of data stored in corresponding unit operator cells UOE0 to UOE3 according to the logical value of input carry Cin.

(1) In the Case of Input Carry Cin being "0":

Word gate circuit 100 drives local word line group LWLG0 in response to the signals of write word line WWL and read word lines RWLA and RWLB. Therefore, in data writing, data (A,/B) and (/A,B) are stored in unit operator cells UOE0 and UOE1, respectively. In data reading, data (A·/B) is supplied from sense amplifier SA0, and data (/A·B) is supplied from sense amplifier SA1.

Because word gate circuit 102 maintains unit operator cells UOE2 and UOE3 in the non-selected state, no current flows through corresponding read bit line RBLB. The dummy cell DMC is selected, and the amount of current flowing through complementary read bit line ZRBL is larger than the amount of current flowing through corresponding read bit line RBLB. Accordingly, irrespective of the logical value of the data stored in unit operator cells UOE2 and UOE3, it is determined that unit operator cells UOE2 and UOE3 are equivalently in the state of storing data "0", and the output signals of sense amplifiers SA2 and SA3 becomes "0" (L level).

Output data of sense amplifiers SA0 to SA3 are transmitted to four-input OR gate OG1 through corresponding main amplifiers MAO (not shown) and MA1 to MA3. When one of the output data, that is, (A·/B) and (/A·B) is at the H level, the output signal of four-input OR gate OG1 attains H level ("1"). When both data (A·/B) and (/A·B) are at the L level, the output signal of four-input OR gate OG1 attains the L level ("0"). The output signal of four-input OR gate OG1 satisfies the logical value table of FIG. 26, in which sum SUM is produced according to the logical value of data (A·/B) and (/A·B) in the case of input carry Cin being "0". Accordingly, sum SUM can correctly be produced in the case of input carry Cin being "0".

(II) In the Case of Input Carry Cin being "1":

In the case of input carry Cin being "1", word gate circuit 100 maintains unit operator cells UOE0 and UOE1 in the non-selected state, and sense amplifiers SA0 and SA1 produce the output signals at the L level. Word gate circuit 102 drives corresponding local word line group LWLG1 into the selected state in response to the signals on write word line WWL and read word lines RWLA and RWLB. Accordingly, data (/A,/B) and (A,B) are stored in unit operator cells UOE2 and UOE3 and read therefrom. In the data reading, the output signals of sense amplifiers SA2 and SA3 assume AND operational results (/A·/B) and (A·B) of storage data, respectively. Accordingly, OR gate OG1 supplies the signal of the H level ("1") when data /A·/B or A·B are "1", and therefore sum SUM from register 50 is set to "1".

When both data /A·/B and A·B are "0" (L level), four-input OR gate OG1 supplies the signal of the L level. Accordingly, sum SUM from register 50 is set to "0".

As shown in a logical value table of FIG. 26, in the case of input carry Cin being "1", sum SUM is produced according to the logical value of data /A·/B and A·B that is of the logical product operational result, and sum SUM can correctly be produced in the case of input carry Cin being "1".

Therefore, the input and output relationship shown in the logical value table of FIG. 26 can be satisfied by the one-bit adder configuration of FIG. 25, and therefore one-bit addition result of input data A and B can be produced.

In the configuration of FIG. 25, word gate circuits 100 and 102 are provided for each one data path operation unit group (44). Alternatively, in the one-bit adder, word gate circuits 100 and 102 may be provided for each unit operator cell.

In the case where word gate circuits 100 and 102 are used, in performing the operations except the addition, that is, in performing the AND, OR, XOR, or XNOR operation, the configuration for setting both input carries Cin and /Cin to H level is used. For example, for inverter 114, a NAND gate is used to receive input carry Cin and the control signal. The control signal is set at the L level in performing the operational processing except the addition operation, and the control signal is set at the H level in performing the addition processing. Other configurations other than such configuration may be utilized. Gate word circuits 100 and 102 have no adverse effect on the word line selection, so that various kinds of logic operational processing specified as described above can be performed.

[Configuration of Carry Producing Unit]

Figure 28:
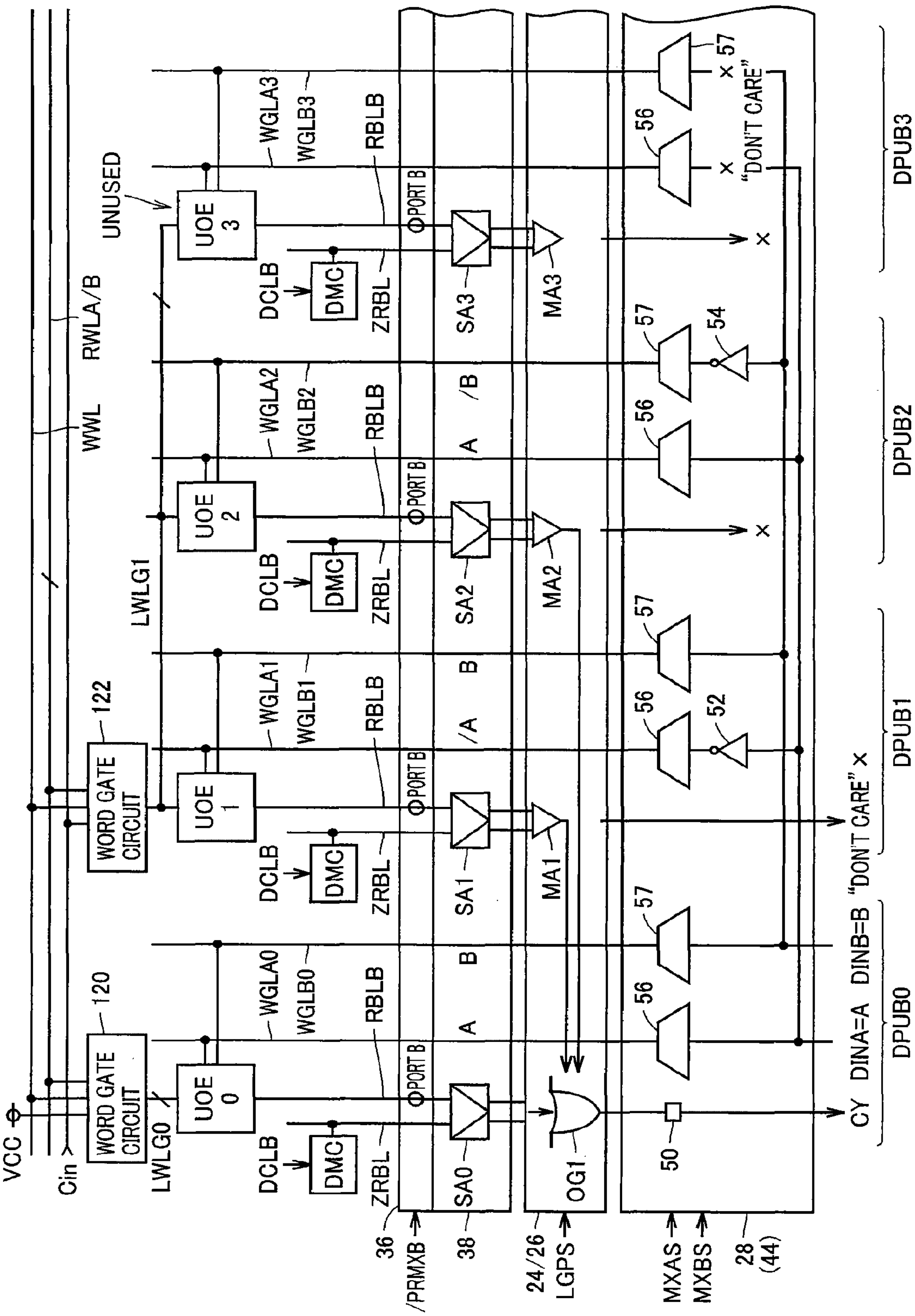
FIG. 28 schematically shows a configuration of a carry producing section of the semiconductor signal processing device according to the second embodiment of the present invention.

FIG. 28 schematically shows a configuration of a carry producing section where one-bit full adder is implemented using the one-bit adder of FIG. 25. Four data path unit blocks DPUB0 to DPUB3 in data path operation unit group (44) are also used in the carry producing section of FIG. 28.

Following setting of the data propagation path is performed in the carry producing section of FIG. 28. In data path unit block DPUB0, multiplexers 56 and 57 select input data DINA (=A) and DINB (=B), respectively. Accordingly, data A and B are transmitted to corresponding global write data lines WGLA0 and WGLB0.

In data path unit block DPUB1, multiplexer 56 selects the inverted value of input data A supplied from inverter 52, and multiplexer 57 selects input data B. Accordingly, data /A and B are transmitted to corresponding global write data lines WGLA1 and WGLB1.

In data path unit block DPUB2, multiplexer 56 selects input data A, and multiplexer 57 selects the inverted value of input data B supplied from inverter 54. Accordingly, data A and /B are transmitted to corresponding global write data lines WGLA2 and WGLB2.

Data path unit block DPUB3 is set in the input selection manner of "don't care," and corresponding unit operator cell UOE3 is not used for the carry production.

In operator cell sub-array block, a word gate circuit 120 is provided for unit operator cell UOE0, and a word gate circuit 122 is provided for unit operator cells UOE1 to UOE3. Word gate circuit 120 receives power supply voltage VCC as the input carry, and transmits the signals on write word line WWL and read word line group RWLA/B to local word line group LWLG0 on corresponding unit operator cells UOE0 irrespective of the logical value of input carry Cin. The configurations of read word line pair RWLA/B and local word line group LWLG are similar to those of FIG. 25.

According to the logical value of input carry Cin, word gate circuit 122 selectively transmits the signal potentials on write word line WWL and read word line pair RWLA/B to local word line group LWLG1 disposed for unit operator cells UOE1 to UOE3. That is, word gate circuit 122 maintains all unit operator cells UOE1 to UOE3 in the non-selected state in the case of input carry Cin being "0". In the case of input carry Cin being "1", word gate circuit 122 transmits the signal potentials on write word line WWL and read word line pair RWLA/B to local word line group LWLG1.

Dummy cell selection signal DCLB is applied to dummy cell DMC to select the series-connected dummy transistors. In read port selection circuit 36, port B is selected to connect read bit lines RBLB to corresponding sense amplifiers SA0 to SA3.

In combination logic operational circuit 26, three-input OR gate OG1 is selected to receive main amplifiers MA1 and MA2 included in main amplifier circuit 24 and the output signal (not shown) of main amplifier MAO. OR gate OG1 supplies a carry CY through register 50.

Figures 29, 30:
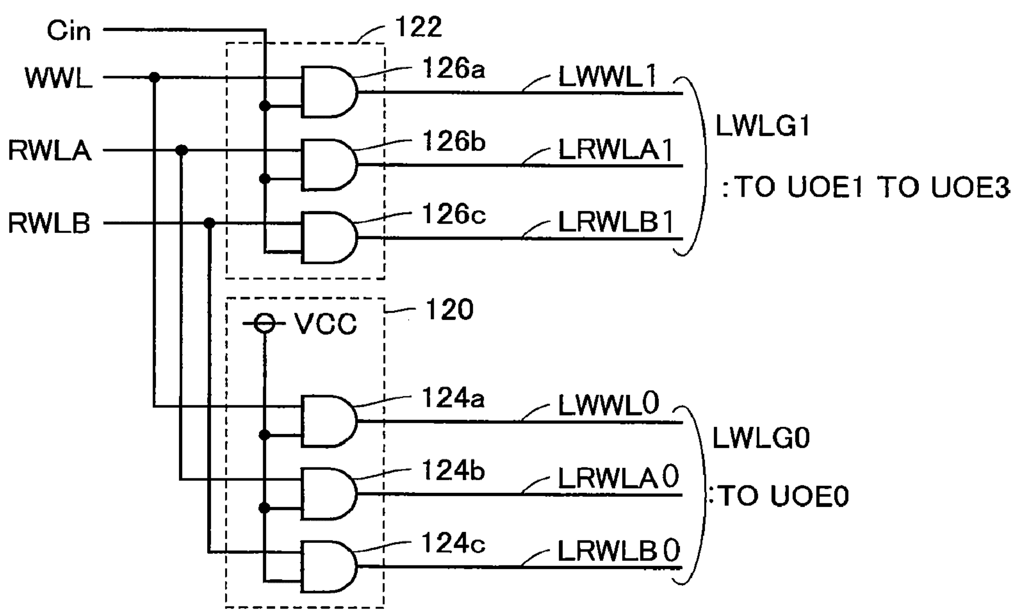
FIG. 29 schematically shows a correlation between input and output data and a logical value of output carry in the carry producing section of FIG. 28.
FIG. 30 schematically shows an example of a configuration of a word gate circuit of FIG. 28.

FIG. 29 shows, in a list form, correlations among input carry Cin, output carry CY, and logical values of input data A and B.

Referring to FIG. 29, in the case of input carry Cin being "0", output carry CY becomes "1" when data A and B are both "1". In the case of input carry Cin being "1", output carry CY becomes "1" when data (A,B) is (0,1), (1,0), or (1,1). That is, in the case where input carry Cin is any of "0" and "1", output carry CY becomes "1" when data A and B are both "1". Accordingly, as shown in FIG. 28, a combination of three kinds of data, that is, combination logic operational circuit 26 performs an operation on three kinds of output data of sense amplifiers SA0 to SA3.

FIG. 30 schematically shows configurations of word gate circuits 120 and 122 of FIG. 28. Referring to FIG. 30, word gate circuit 120 includes AND gates 124*a* to 124*c* that are provided corresponding to local write word line LWWL0 and local read word lines LRWLA0 and LRWLB0. Power supply voltage VCC is supplied to a first input of each of AND gates 124*a* to 124*c*, and the signals on write word line WWL and read word lines RWLA and RWLB are applied to second inputs of AND gates 124*a* to 124*c*. The output signal supplied from word gate circuit 120 is transmitted to local write word line LWWL0 and local read word lines LRWLA0 and LRWLB0 that are disposed for unit operator cell UOE0.

Word gate circuit 122 includes AND gates 126*a* to 126*c* that are provided corresponding to local write word line LWWL1 and local read word lines LRWLA1 and LRWLB1. Input carry Cin is commonly applied to the first inputs of AND gates 126*a* to 126*c*, and the signals on write word line WWL and read word lines RWLA and RWLB are applied to the second inputs of AND gates 126*a* to 126*c*. The output signals of word gate circuits 122 are applied to unit operator cells UOE1 to UOE3 of FIG. 28 through local word line group LWLG1. Local word line group LWLG1 includes local write word line LWWL1 and local read word lines LRWLA1 and LRWLB1.

Accordingly, as is clear from the configurations of word gate circuits 120 and 122 of FIG. 30, the potentials according to write word line WWL and read word lines RWLA and RWLB are transmitted to corresponding local write word line LWWL0 and local read word line LRWLA0 and LRWLB0, as for unit operator cell UOE0. Unit operator cells UOE1 to UOE3 are set in the non-selected state in the case of input carry Cin being "0", and are driven to the selected state according to write word line WWL and read word lines RWLA and RWLB in the case of input carry Cin being "1".

Referring to FIGS. 29 and 30, the operation performed by the carry producing section of FIG. 28 will be described below.

Word gate circuit 120 drives corresponding unit operator cell UOE0 to the selected state according to the signal of write word line WWL irrespective of the logical value of input carry Cin, and data A and B transferred to global write data lines WGLA0 and WGLB0 are written in unit operator cell UOE0. In the data reading, word gate circuit 120 drives local read word lines LRWLA0 and LRWLB0 of corresponding unit operator cell UOE0 in response to the signals on read word lines RWLA and RWLB, and the current flows through read bit line RBLB according to the logical values of data A and B. Two series-connected dummy transistors (DTB0 and DTB1) of dummy cell DMC are connected to complementary read bit line ZRBL, and the current flows through complementary read bit line ZRBL according to the voltage level of reference voltage Vref. Accordingly, the output data of sense amplifier SA0 is the AND operation result of the data stored in unit operator cell UOE0, sense amplifier SA0 produces data A·B, and the data A·B is transmitted to three-input OR gate OG1 through the corresponding main amplifier (not shown).

On the other hand, word gate circuit 122 selectively drives unit operator cells UOE1 to UOE3 to the selected state according to the logical value of input carry Cin. In the case of input carry Cin being "0", unit operator cells UOE1 to UOE3 are in the non-selected state, and the data write and read are not performed. Accordingly, the amount of current flowing through complementary read bit line ZRBL is larger than the amount of current flowing through corresponding read bit line RBLB, and the output signals of sense amplifiers SA1 to SA3 attain "0". That is, in the case of input carry Cin being "0", the output signal of three-input OR gate OG1 becomes the voltage level corresponding to output data A·B of sense amplifier SA0, and carry CY outputted from register 50 becomes the logical value corresponding to the logical value of data A·B. Accordingly, as shown in FIG. 29, the conditions in the case of input carry Cin being "0" that carry CY supplied from register 50 becomes "1" when both data A and B are "1" and carry CY becomes "0" in other cases are satisfied.

In the case of input carry Cin of "1", the data writing and reading are also performed on unit operator cells UOE1 to UOE3. Data /A and B transmitted to corresponding global write data lines WGLA1 and WGLB1 are stored in unit operator cell UOE1, and data A and /B transmitted to corresponding global write data lines WGLA2 and WGLB2 are stored in unit operator cell UOE2.

Port B is selected, and sense amplifiers SA1 and SA2 output the AND operation results of data stored in corresponding unit operator cells UOE1 and UOE2, or data /A·B and A·/B. The output signals of sense amplifiers SA0 to SA2 are applied to three-input OR gate OG1 through corresponding main amplifiers MA0 to MA2. Thus, three-input OR gate OG1 outputs data (A·B+A·/B+A·/B). As is clear from the logical value table of FIG. 29, output carry CY becomes "1" when one of data /A·B, A·B, and A·/B is "1". In other cases, that is, in the case where both data A and B are "0", output carry CY becomes "0". Therefore, output carry CY satisfying the relationship among the logical values of FIG. 29 can be produced.

Thus, the one-bit full addition operation can be performed in one clock cycle by concurrently operating the adder and carry producing section of FIGS. 25 and 28. In data path 28 and combination logic operational circuit 26, the data propagation route is set, and input carry Cin is combined with the signal on the word line, so that the arithmetic operation can be performed in addition to the combination logic operation without changing the internal configuration.

(Configuration of One-Bit Subtracter)

FIG. 31 shows, in a list, correlations among logical values of input data A and B, an input borrow BRin, and a subtraction value DIFF in a one-bit subtracter. In FIG. 31, when input borrow BRin is "0", subtraction value DIFF becomes "1" if data (A,B) is (0,1) and (1,0). Accordingly, if the configuration in which subtraction value DIFF becomes "1" when one of operational results /A·B and A·/B is "1" is realized, subtraction value DIFF can be produced in the case of input borrow BRin being "0".

In the case of input borrow BRin being "1", subtraction value DIFF becomes "1" when data (A,B) is (0,0) or (1,1). Accordingly, if the configuration in which output value becomes "1" when one of operational results /A·/B and A·B is "1" is realized, subtraction value DIFF can be produced in the case of input borrow BRin being "1". The one-bit subtracter is implemented by establishing the set of data selected according to the logical value of input borrow BRin in data path 28.

Figure 32:
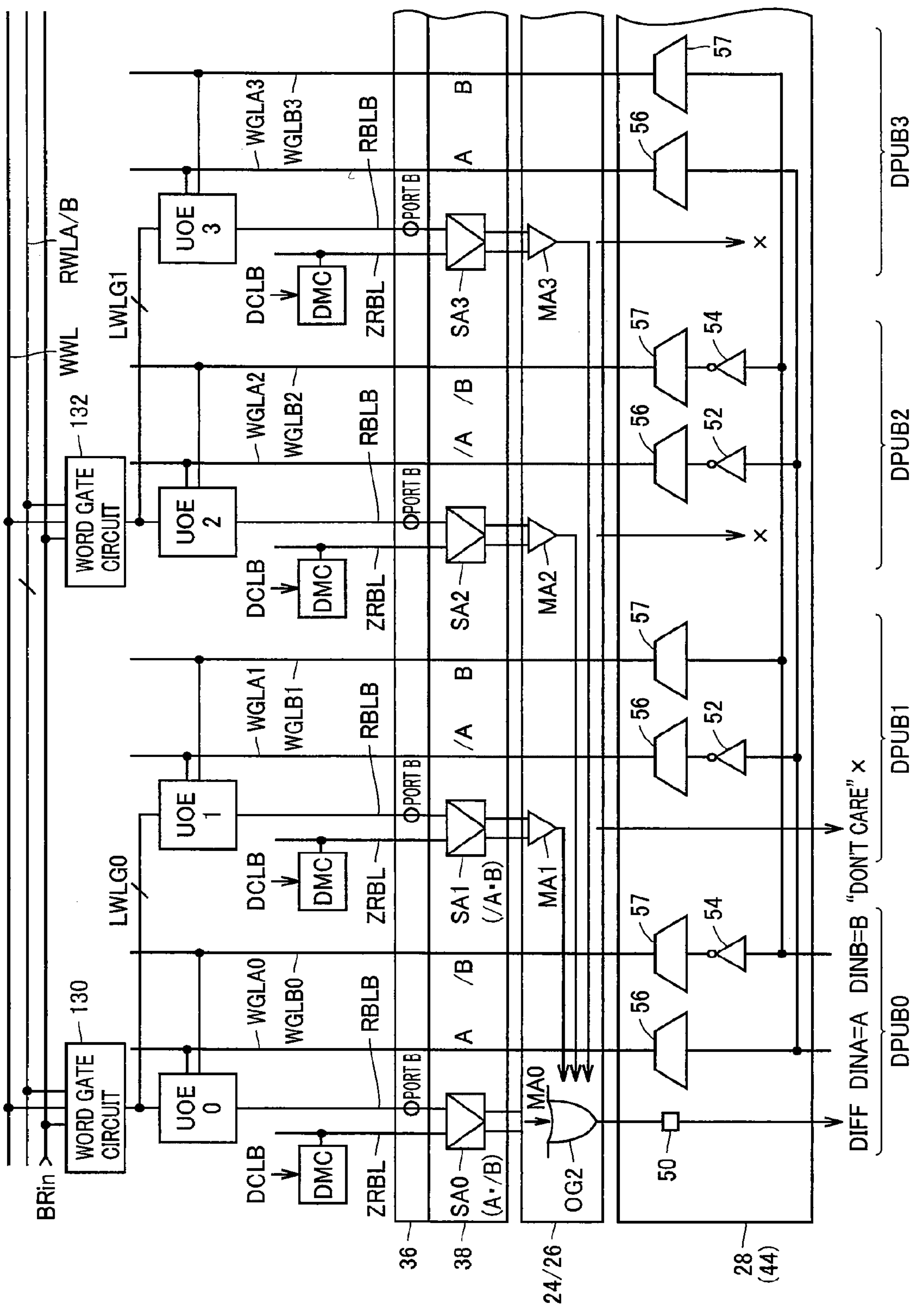
FIG. 32 schematically shows a configuration of a subtraction value producing section according to the second embodiment of the present invention.

FIG. 32 schematically shows a configuration of the one-bit subtracter of the semiconductor signal processing device of the second embodiment of the present invention. Four data path unit blocks DPUB0 to DPUB3 included in data path operation unit group 44 are also utilized in the configuration of the one-bit subtracter of FIG. 32. In the operator cell sub-array block, unit operator cells UOE0 to UOE3 are disposed for data unit blocks DPUB0 to DPUB3. A word gate circuit 130 is provided for unit operator cells UOE0 and UOE1, and a word gate circuit 132 is provided for unit operator cells UOE2 and UOE3.

In the case of input borrow BRin of "1", word gate circuit 130 maintains unit operator cells UOE0 and UOE1 in the non-selected state. On the other hand, in the case of input borrow BRin being "1", word gate circuit 130 transmits signal potentials on write word line WWL and read word line pair RWLA/B to corresponding local word line group LWLG0. Similarly to the configuration of FIG. 25, local word line group LWLG includes local write word line LWWL and local read word lines LRWLA and LRWLB. Read word line pair RWLA/B includes read word lines RWLA and RWLB.

In the case of input borrow BRin being "1", word gate circuit 132 drives local word line group LWLG1 to the selected state according to the signal potentials on write word line WWL and read word lines RWLA and RWLB. Local word line group LWLG1 is arranged for unit operator cells UOE2 and UOE3. In the case of input borrow BRin being "0", word gate circuit 132 maintains local word line group LWG1 for unit operator cells UOE2 and UOE3 in the non-selected state to prohibit the data from being written in and read from unit operator cells UOE2 and UOE3.

For example, word gate circuits 130 and 132 can be implemented by utilizing the configurations of word gate circuits 100 and 102 of FIG. 27 to supply input borrow BRin instead of input carry Cin (the configurations will be described later).

Dummy cell selection signal DCLB is applied to dummy cell DMC to select two series-connected dummy transistors (DTB0 and DTB1) in dummy cell DMC.

In read port selection circuit 36, port B (read port RPRTB) is selected to connect read bit lines RBLB to corresponding sense amplifiers SA0 to SA3.

In combination logic operational circuit 26, four-input OR gate OG2 is selected, and the output signals of main amplifiers MA0 to MA3 included in main amplifier circuit 24 are applied to four-input OR gate OG2. The output signal of four-input OR gate OG2 is outputted as subtraction value DIFF externally through register 50.

Figures 33, 34:
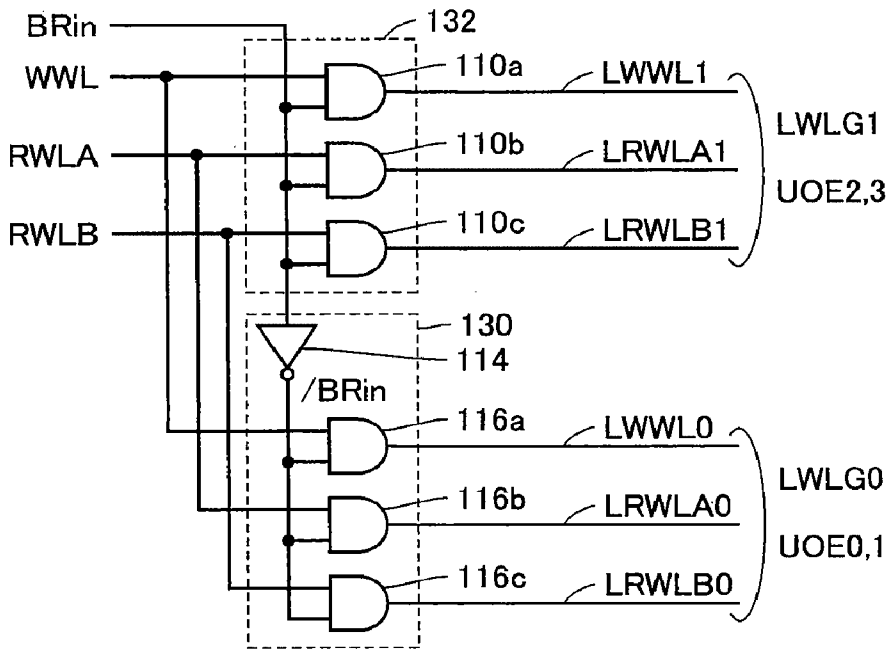
FIG. 33 schematically shows an example of a configuration of a word gate circuit of FIG. 32.
FIG. 34 schematically shows a correlation between input data and a logical value of output borrow of the semiconductor signal processing device according to the second embodiment of the present invention.

FIG. 33 schematically shows configurations of word gate circuits 130 and 132 of FIG. 32. Referring to FIG. 33, the configuration of word gate circuits 130 and 132 is similar to that of word gate circuits 100 and 102 of FIG. 27 except for that input borrow BRin is applied instead of input carry Cin. Accordingly, in word gate circuits 130 and 132, counterparts to those in word gate circuits 100 and 102 are designated by the same reference numerals, and the detailed description will not be repeated.

As shown in FIG. 33, in the case of input borrow BRin being "0", unit operator cells UOE2 and UOE3 are maintained in the non-selected state to make the data write/read access to unit operator cells UOE0 and UOE1. On the other hand, in the case of input borrow BRin being "1", unit operator cells UOE0 and UOE1 are maintained in the non-selected state to make the data write/read access to unit operator cells UOE2 and UOE3.

Referring appropriately to FIGS. 31 and 33, the operation of the one-bit subtracter shown in FIG. 32 will be described below. (A−B) is performed as the subtraction.

In the case of input borrow BRin being "0", word gate circuit 132 maintains unit operator cells UOE2 and UOE3 in the non-selected state, and make the data write/read access to unit operator cells UOE0 and UOE1. Accordingly, data A and /B on global write data lines WGLA0 and WGLB0 are stored into and read from unit operator cell UOE0. Similarly, data /A and B on global write data lines WGLA1 and WGLB1 are written in and read from unit operator cell UOE1.

Dummy cell selection signal DCLB is applied to dummy memory cell DMC, and port B is selected. Accordingly, sense amplifiers SA0 and SA1 output AND operation results A·/B and /A·B of data stored in corresponding unit operator cells UOE0 and UOE1.

In sense amplifiers SA2 and SA3, unit operator cells UOE2 and UOE3 are in the non-selected state, substantially no current flows through read bit line RBLB, and dummy cell DMC supplies the current to complementary read bit line ZRBL. In this state, sense amplifiers SA2 and SA3 thus output the data "0". Sense amplifiers SA0 to SA3 supply the data to four-input OR gate OG1 through corresponding main amplifiers MA0 to MA3. Accordingly, the data (A·/B)+(/A·B) is generated through register 50. As shown in the logical value table of FIG. 31, the output data satisfying the condition that subtraction value DIFF becomes "1" when one of data A and B is "1" and the other is "0" can be produced in the case of input borrow BRin being "0".

In the case of input borrow BRin being "1", word gate circuit 130 maintains unit operator cells UOE0 and UOE1 in the non-selected state. Word gate circuit 132 drives local word line group LWG1 of unit operator cells UOE2 and UOE3 to the selected state according to the signal potentials on write word line WWL and read word lines RWLA and RWLB, and the data write/read access is made. Accordingly, data /A and /B on corresponding global write data lines WGLA2 and WGLB2 are stored in and read from unit operator cell UOE2, and data A and B on corresponding global write data lines WGLA3 and WGLB3 are stored in and read from unit operator cell UOE3.

Port B is selected, two series-connected dummy transistors are selected in dummy cell DMC in response to dummy cell selection signal DCLB, sense amplifiers SA2 and SA3 produce AND operation results (/A·/B) and (A·B) of data stored in unit operator cells UOE2 and UOE3. Main amplifiers MA0 and MA1 output data "0" received from sense amplifiers SA0 and SA1. Accordingly, OR gate OG2 supplies data (/A·/B+A·B) through register 50.

As can be seen from the logic table of FIG. 31, in the case of input borrow BRin being "1", the output data satisfies the condition that subtraction value GIFF becomes "1" when data A and B are both "1" or both "0". Accordingly, in the case where input borrow BRin is either "1" or "0", subtraction value DIFF of input data A and B can correctly be produced by the configuration of FIG. 32. Therefore, similarly to the case in which the combination logic operation is performed, the one-bit subtraction can be performed in one clock cycle for data A and B.

(Configuration of Borrow Producing Section)

FIG. 34 shows, in a list, correlations among logical values of input data A and B, input borrow BRin, and an output borrow BRout in the one-bit subtracter. In FIG. 34, in the case of input borrow BRin being "0", because output borrow BRout becomes "1" only when data (A,B) is (0,1), output borrow BRout becomes "1" when data /A·B is "1". That is, output borrow BRout is applied by data /A·B when input borrow BRin is "0".

In the case of input borrow BRin being "1", output borrow BRout becomes "1" when data (A,B) is (0,0), (0,1), or (1,1). Accordingly, in the case of input borrow BRin being "1", output borrow BRout becomes "1" when data (/A·/B+/A·B+A·B) is "1". In this case, output borrow BRout becomes "1" irrespective the value of input borrow BRin when AND operation result /A·B is "1". Accordingly, similarly to the case in which output carry CY is produced, output borrow BRout can be produced using the set of three kinds of data also in the portion in which output borrow BRout is produced.

Figure 35:
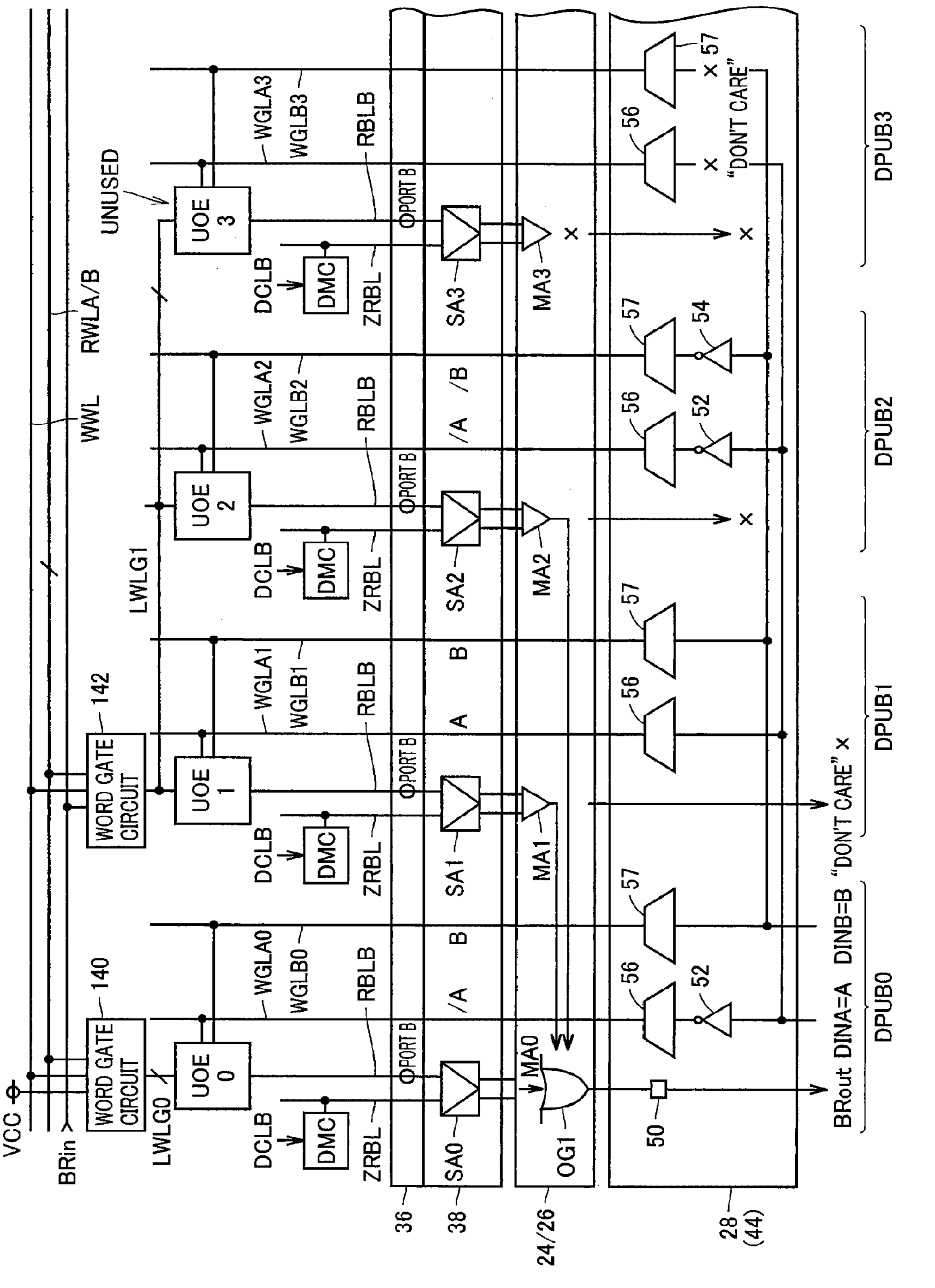
FIG. 35 schematically shows a configuration of a borrow producing section in a subtractor according to the second embodiment of the present invention.

FIG. 35 schematically shows a configuration of a borrow producing section in the one-bit subtracter of the second embodiment of the present invention. In the borrow producing unit, four data path unit blocks DPUB0 to DPUB3 included in data path operation unit group 44 are also used in data path 28. However, data path unit block DPUB3 is not actually used, and corresponding multiplexers 56 and 57 have an arbitrary input selection manner (don't care) set.

In data path unit block DPUB0, multiplexer 56 selects the inverted value of input data DINA (=A) received from inverter 52, and multiplexer 57 selects input data INB (=B). Accordingly, data /A and B are transmitted to corresponding global write data lines WGLA0 and WGLB0.

In data path unit block DPUB1, multiplexers 56 and 57 select pieces of input data A and B, respectively. Accordingly, pieces of data A and B are transmitted to global write data lines WGLA1 and WGLB1.

In data path unit block DPUB2, multiplexers 56 and 57 select inverted values /A and /B of input data A and B received from inverters 52 and 54, respectively. Accordingly, data /A and /B are transmitted to corresponding global write data lines WGLA2 and WGLB2.

A word gate circuit 140 is provided for unit operator cell UOE0 that is arranged for data path unit block DPUB0, and a word gate circuit 142 is commonly provided for unit operator cells UOE1 to UOE3 that are arranged for data path unit blocks DPUB1 to DPUB3. Word gate circuit 140 transmits the signals on write word line WWL and read word line pair RWLA/B to write local word line group LWLG0 of unit operator cell UOE0 irrespective of the logical value of input borrow BRin. Word gate circuit 142 selectively transmits the signal potentials on write word line WWL and read word line pair RWLA/B to local word line group LWLG1 according to the logical value of input borrow BRin. The configurations of local word line group LWLG and read word line pair are identical to that of the carry producing section of the one-bit adder.

Figure 36:
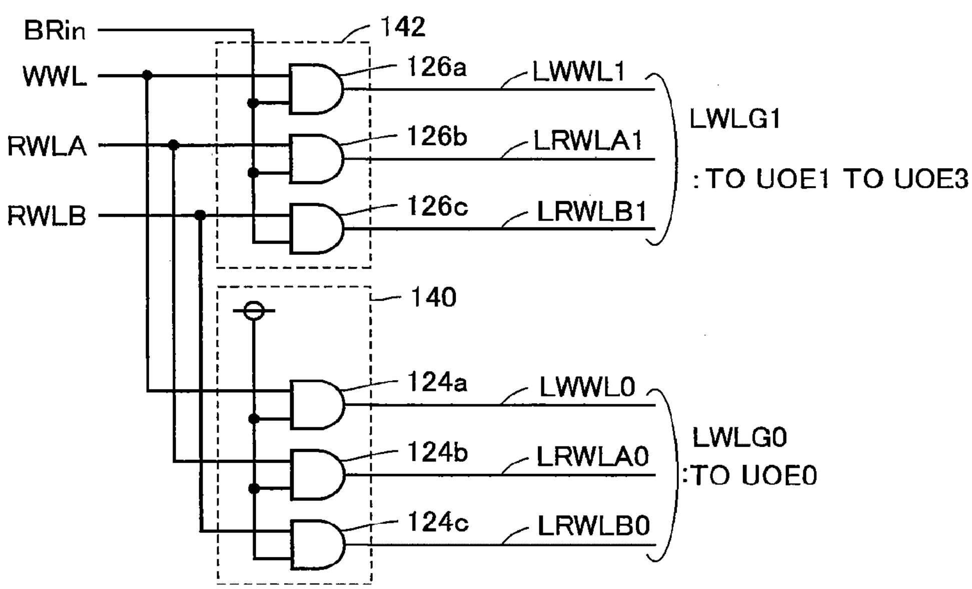
FIG. 36 schematically shows an example of a configuration of a word gate circuit of FIG. 35.

FIG. 36 schematically shows configurations of word gate circuits 140 and 142. The configuration of word gate circuits 140 and 142 shown in FIG. 36 is similar to that of word gate circuits 120 and 122 shown in FIG. 30 except for that input borrow BRin is applied instead of input carry Cin. Accordingly, in FIG. 36, counterparts to those in word gate circuits 120 and 122 of FIG. 30 are designated by the same reference numerals, and the detailed description is not repeated.

In the configurations of word gate circuits 140 and 142 shown in FIG. 36, in the case of input borrow BRin being "0", unit operator cells UOE1 to UOE3 are maintained in the non-selected state. On the other hand, in the case of input borrow BRin being "1", local write word line LWWL1 and local read word lines LRWLA1 and LRWLB1 for unit operator cells UOE1 to UOE3 are driven to the selected state according to the signal potentials on write word line WWL and read word lines RWLA and RWLB, and data writing and reading are performed to unit operator cells UOE1 to UOE3.

In unit operator cell UOE0, corresponding local write word line LWWL0 and local read word lines LRWLA0 and LRWLB0 are driven to the selected state according to the signal potentials on write word line WWL and read word lines RWLA and RWLB irrespective of the value of input borrow BRin, and data writing and reading are performed. Referring to the logical value table of FIG. 34 and the configuration of the word gate circuit of FIG. 36, the operation performed by the borrow producing section of FIG. 35 will be described below.

As described above, in the case of input borrow BRin being "0", word gate circuit 142 maintains all unit operator cells UOE1 to UOE3 in the non-selected state. In this case, data /A and B transmitted to global write data lines WGLA0 and WGLB0 are stored in and read from unit operator cell UOE0. Port B is selected, and the series-connected dummy transistors are selected in dummy cell DMC in response to dummy cell selection signal DCLB. Accordingly, sense amplifier SA0 supplies AND operation result /A·B of the transferred data. Sense amplifiers SA1 to SA3 supply the data "0" because all unit operator cells UOE1 to UOE3 are in the non-selected state.

The output signals (data) of sense amplifiers SA0 to SA2 are applied to three-input OR gate OG1 through corresponding main amplifiers MA0 to MA2. Accordingly, OR gate OG1 supplies the data corresponding to the output data of sense amplifier SA0, and the output data from register 50 becomes equal to data /A·B. The data satisfies the logical value relationship in the case of input borrow BRin being "0" in the logical value table of FIG. 34, so that output borrow BRout can be obtained in the case of input borrow BRin being "0".

In the case of input borrow BRin being "0", word gate circuit 142 drives local word line group LWLG1 arranged for unit operator cells UOE1 to UOE3 to the selected state according to the signal potential on write word line WWL and read word line pair RWLA/B. Accordingly, data A and B on global write data lines WGLA1 and WGLB1 are written in and read from unit operator cell UOE1, and data /A and /B are written in and read from unit operator cell UOE2. Unit operator cell UOE3 is not used. Corresponding sense amplifiers SA1 and SA2 produce data A·B and /A·/B, respectively.

Because data /A–B, A–B, and /A·/B supplied from sense amplifiers SA0 to SA2 are applied to three-input OR gate OG1, OR gate OG1 supplies data (/A·B+A·B+/A·/B) through register 50. The data satisfies the logical value relationship of FIG. 34 between the input data and the output borrow in the input borrow BRin being "0", so that output borrow BRout can be produced in the case of input borrow BRin being "0".

Accordingly, irrespective of the logical value of input borrow BRin, the output data satisfying the logical value relationship of FIG. 34 can be produced, and output borrow BRout can correctly be produced.

The one-bit subtracter can be implemented by concurrently operating the one-bit subtracter of FIG. 32 and the borrow producing section of FIG. 35 to the common input data, and the subtracter that performs the subtraction on the input data in one clock cycle can be implemented.

In the subtraction operation, similarly to the combination logic operation, only the connection manner of the internal data propagation route is changed, and the arithmetic operation of the subtraction can be performed without changing the internal configuration.

Even in the subtracter, the port connection, the gate selection in the input of the combination logic operational circuit, and the selection of the data propagation route in the data path are set based on specified operational processing contents in response to the corresponding control signals. For the control signals, in the data path, it is necessary to produce four individual sets of system switching control signals for the four data path unit blocks of the carry/borrow producing section and four individual sets of switching control signals for the four data path unit blocks of the addition/subtraction unit. The same holds for the logical path instruction signal in the combination logic operational circuit.

(First Modification)

Figure 37:
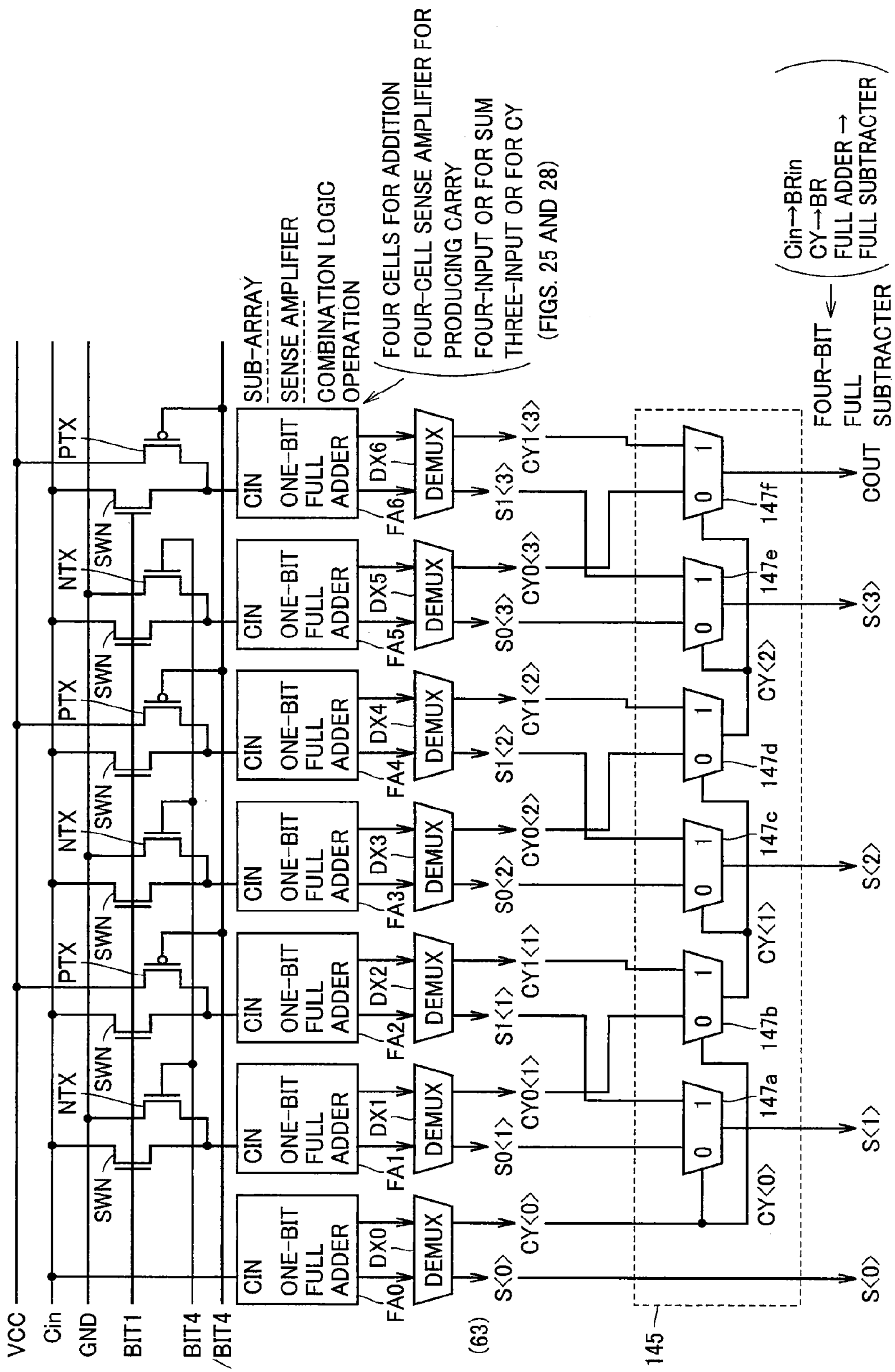
FIG. 37 schematically shows a configuration of a modification of the second embodiment of the present invention.

FIG. 37 schematically shows a configuration of a four-bit full addition circuit of a modification in the semiconductor signal processing device of the second embodiment of the present invention. A four-bit full addition circuit of FIG. 37 may be formed by four-bit addition/subtraction processing circuit 64 of FIG. 9, or may be separately provided. An eight-bit main amplifier output G<4(k+7):4k> is used in four-bit addition/subtraction circuit processing circuit 64 of FIG. 9. The four-bit addition circuit of FIG. 37 can be implemented by utilizing data bits G<4k> and G<4(k+1)> as sum and carry outputs. One data path operation unit group (44) corresponds to each of carry producing section and addition section of one-bit full adder. Accordingly, the addition and subtraction may be performed with the output data bits of eight data path operation unit groups as bits G<4(k+7):4k> of FIG. 9. However, in the following description, it is assumed that the four-bit full addition circuit of the second embodiment is provided independently of four-bit addition/subtraction processing circuit 64 of FIG. 9.

Referring to FIG. 37, one-bit full adders FA0 to FA6 are provided. Each of one-bit full adders FA0 to FA6 includes the one-bit addition circuit of FIG. 25 and the carry producing section of FIG. 28. Accordingly, each of one-bit full adders FA0 to FA6 is arranged for eight data path unit blocks (DPUB), and includes four unit operator cells for the addition, four unit operator cells for producing the carry, a word gate circuit for combining the carry, corresponding sense amplifiers, a four-input OR gate for producing sum SUM, and three-input OR gate for producing carry CY. As shown in FIGS. 25 and 28, these sections of the one-bit full adder correspond to the configuration of the carry producing section and addition section, and the data transfer path of the data path and the data transfer path of the unit operation block of the combination logic operational circuit are set in each data path operation unit group according to the processing to be performed.

A carry input CIN of one-bit full adder FA0 receives input carry Cin. For each of one-bit full adders FA1, FA3, and FA5, switching elements SWN and NTX are arranged in parallel with each other for carry input CIN. For each of one-bit full adders FA2, FA4, and FA6, switching elements SWN and PTX are arranged in parallel with each other for carry input CIN.

Switching elements SWN are made conductive when a one-bit addition operation instruction BIT1 is set (turns H level), and transmit input carry Cin to carry inputs CIN of corresponding one-bit full adders FA1 to FA6. Switching elements NTX are made conductive when a four-bit addition operation instruction BIT4 is activated (set to H level), and transmit ground voltage GND to carry inputs CIN of one-bit full adders FA1, FA3, and FA5. Switching elements PTX are made conductive when an inverted four-bit addition operation instruction /BIT4 is activated (set to L level), and transmit power supply voltage VCC to carry inputs CIN of corresponding one-bit full adders FA2, FA4, and FA6. That is, switching element NTX forcedly sets input carry Cin at "0" when made conductive, and switching element PTX forcedly sets input carry Cin at "1" when made conductive.

Carry input CIN is connected to a node that receives input carry Cin for each respective word gate circuit. The selection/non-selection of the unit operator cell of the word gate circuit included in each of one-bit full adders FA0 to FA6 is set by forcedly setting the input carry. Input carries Cin are forcedly set to one-bit full adders FA0 to FA6, whereby the addition operations are concurrently performed in one-bit full adders FA1 to FA6 for the case where the input carry supplied from the one-bit preceding full adder is "0" and for the case of the input carry being "1".

Demultiplexers (DEMUX) DX0 to DX6 are provided for one-bit full adders FA0 to FA6 in the data path. Demultiplexers DX0 to DX6 correspond to demultiplexers 63 of FIG. 9, and select the output data (OG1 of FIG. 25) of the four-input OR gates for producing the sum of the respective one-bit full adders FA0 to FA6 or the output data of the three-input OR gates (OG1 of FIG. 28) for producing the carries.

Demultiplexer DX0 produces sum S<0> and carry CY<0> of the least significant bit. Demultiplexers DX1, DX3, and DX5 supply sums S0<1> to S0<3> and carries CY0<1> to CY0<3> when input-carry CY from a preceding stage is "0". Demultiplexers DX2, DX4, and DX6 supply sums S1<1> to S1<3> and carries CY1<1> to CY1<3> when the output carry of one-bit full adder of each respective preceding stage is "1".

A four-bit addition processing circuit 145 is arranged in combination logic operational circuit 26, and includes multiplexers 147*a* to 147*f* that are provided for demultiplexers DX1 to DX6. Demultiplexer DX0 produces sum S<0> as least significant addition bit S<0>. Multiplexer 147*a* selects one of sums S0<1> and S1<1> according to intermediate carry bit CY<0> to produce addition bit S<1>. Multiplexer 147*b* selects one of carries CY0<1> and CY1<1> according to intermediate carry bit CY<0> to produce intermediate carry bit CY<1>.

Multiplexer 147*c* selects one of sums S0<2> and S1<2> according to intermediate carry bit CY<1> to produce addition bit S<2>. Multiplexer 147*d* selects one of intermediate carry bits CY0<2> and CY1<2> according to intermediate carry bit CY<1> to produce intermediate carry bit CY<2>. Multiplexer 147*e* selects one of sums S0<3> and S1<3> according to intermediate carry bit CY<2> to produce most significant addition bit S<3>. Multiplexer 147*f* selects one of intermediate carry bits CY0<3> and CY1<3> according to intermediate carry bit CY<2> to produce output carry COUT.

That is, the carries and sums are produced in parallel for the cases of "0" and "1" of the input carry in advance, and multiplexers 147*a* to 147*f* select the final sum and carry according to the actually produced intermediate carry bits CY<0> to CY<2> in four-bit addition processing circuit 145.

In performing the four-bit addition operation, the four-bit addition instructions BIT4 and BIT4 are set in the active state, and the four-bit addition processing can be performed in one clock cycle by activating the four-bit addition operational processing. In each of one-bit full adders FA0 to FA6, one-bit full addition is performed. When the addition result is to be produced, the one-bit addition instruction BIT1 is activated, and input carry Cin is coupled to carry input CIN. In this case, input carry Cin is individually set to each of one-bit full adders FA0 to FA6 (transmission bus of input carry Cin of FIG. 37 has a seven-bit width corresponding to one-bit full adders FA0 to FA6, and potentials at carry transmission lines on the bus are individually set).

In cases where the full addition is performed in bit serial and data parallel in each of one-bit full adders FA0 to FA6, produced carry is fed back to carry input CIN of corresponding one-bit full adder. Here, the term "bit serial and data parallel" 1 means a fashion in which an operation is concurrently performed to plural multi-bit data while performed on each data in a bit-by-bit manner.

In the configuration of the four-bit full adder shown in FIG. 37, when carry Cin is replaced with input borrow BRin and carries CY<0> to CY1<3> are replaced with borrows BR<0> to BR<3>, four-bit subtracter can be implemented. In this case, the configurations of FIGS. 32 and 35 are used as the configuration of the one-bit subtracter.

Four-bit addition processing circuit 145 of FIG. 37 may be used for four-bit addition subtraction processing circuit 64 of FIG. 9.

(Second Modification of Four-Bit Adder)

Figure 38:
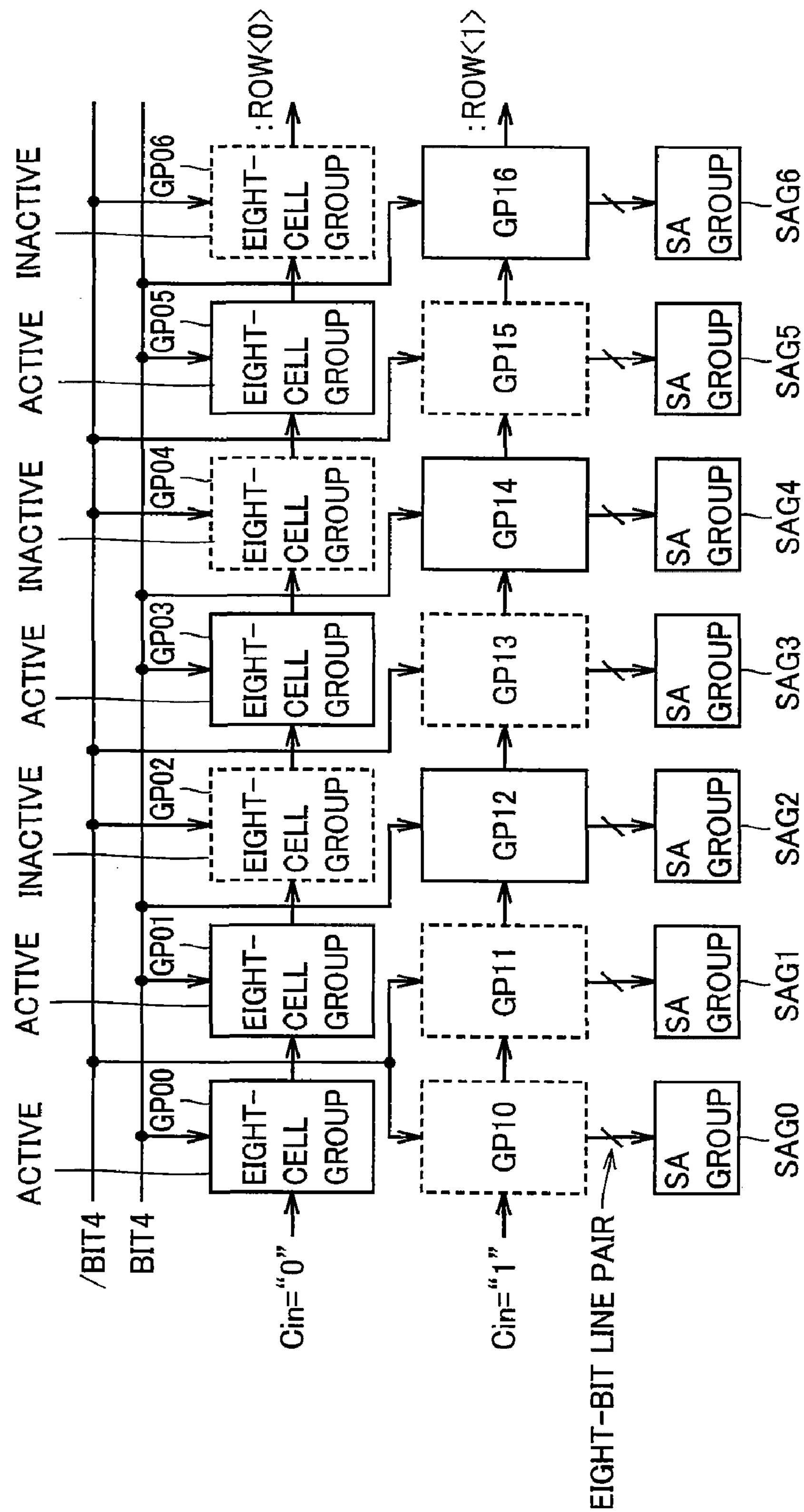
FIG. 38 schematically shows a configuration of another modification of the second embodiment of the present invention.

FIG. 38 schematically shows an arrangement of an operator cell sub-array block of another modification in the four-bit full adder of the second embodiment of the present invention. Referring to FIG. 38, eight-cell groups GP00 to GP06 are disposed in a row ROW<0> of the operator cell sub-array block, and eight-cell groups GP10 to GP16 are disposed in a row ROW<1>. Each of eight-cell groups GP00 to GP06 and GP10 to GP16 aligned in 2 rows by 8 columns includes eight unit operator cells, four unit operator cells for producing sum SUM, and four unit operator cells for producing the carry. The arrangement of the unit operator cells in the eight-cell groups is identical to those of FIGS. 25 and 28, a word gate circuit is arranged in a carry and a sum producing section, and each word gate circuit selectively sets the unit operator cells in the selected state/non-selected state according to input carry Cin.

Input carry Cin is fixed to "0" and is transmitted to eight-cell groups GP00 to GP06, and input carry Cin is fixed to "1" and is transmitted to eight-cell groups GP10 to GP16. Compared with the configuration in which different input carries Cin are transmitted to the unit operator cells aligned in one row, the value of input carry Cin is fixed in each unit operator cell row, thereby facilitating the layout of the transmission lines of input carry Cin.

In row ROW<0>, four-bit addition instruction BIT4 is applied to eight-cell groups GP00, GP01, GP03, and GP05, and complementary four-bit addition instruction /BIT4 is applied to eight-cell groups GP02, GP04, and GP06.

In row ROW<1>, four-bit addition instruction /BIT4 is applied to eight-cell groups GP10, GP11, GP13, and GP15, and four-bit addition instruction BIT4 is applied to eight-cell groups GP12, GP14, and GP16.

In each of eight-cell group GP00 to GP06 and GP10 to GP16, word gate circuits (100 and 102) are provided as shown in FIGS. 25 and 28, four-bit addition instruction BIT4 is set at "H", and the gating processing is performed according to input carry Cin when the instruction of the four-bit addition operation is supplied. In performing the four-bit addition, the outputs of all the word gate circuits of FIG. 28 are fixed to the L level when complementary four-bit addition operation instruction /BIT4 is set at "L". Therefore, eight-cell groups that receive complementary four-bit addition operation instruction /BIT4 are always set in the non-selected state, and write access and read access are performed to eight-cell groups that receive four-bit addition operation instruction BIT4 according to the value of input carry Cin.

Sense amplifier (SA) groups SAG0 to SAG6 are provided for eight cell groups GP00 to GP06 and GP10 to GP16. Each of sense amplifier groups SAG0 to SAG6 includes eight sense amplifiers, and output data of sense amplifier groups SAG0 to SAG6 are applied to combination logic operational circuit through main amplifiers. In the combination logic operational circuit, as shown in FIGS. 25 and 28, the four-input OR gate processing is performed on the sum, and the three-input OR gate processing is performed on the carry. Then, in four-bit addition processing circuit 145 of FIG. 37, the final addition processing (selection processing) is performed to produce the four-bit addition result.

In the configuration of FIG. 38, one of the eight-cell groups (for example, GP00 and GP10) arranged in the same column is set in the enable state by four-bit addition operation instructions BIT4 and/BIT4, and the other is set in the disable state by four-bit addition operation instructions BIT4 and/BIT4. Therefore, even if word lines (write word lines or read word lines) of two rows are selected to concurrently drive rows ROW<0> and ROW<1> to the selected state, the collision of the currents is avoided on corresponding read bit line, and the currents of the selected eight-cell groups (indicated by the solid-line block of FIG. 38) are transmitted to the corresponding sense amplifier group. In the write data, the erroneous write is avoided for non-selected eight-cell groups.

The configuration in which rows ROW<0> and ROW<1> are concurrently driven to the selected state can easily be realized by simply setting the least significant bit of the word line address in a degenerated state (don't care state) according to four-bit addition operation instruction BIT4.

Similarly, the four-bit addition processing can be realized in one clock cycle in the bit parallel fashion by utilizing the configuration of FIG. 38. That is, the data write is performed in one clock cycle on the eight-cell groups shown by the solid-line of FIG. 38, the data read is performed in the next clock cycle to the eight-cell groups shown by the solid-line, and the four-bit addition processing can be realized in the bit parallel fashion in the total of two clock cycles.

One of the eight-cell groups in the same column is in the active state while the other is in the inactive state (unit operator cell is in the non-selected state), so that the collision of the write data and read data is not caused. Even in the addition operation processing, the data is read from one operator cell sub-array block while the data is written in another operator cell sub-array block, so that the four-bit addition processing can be performed in a pipeline manner and the four-bit addition processing can be performed in one clock cycle quivalently.

Rows ROW<0> and ROW<1> may be unit operator cell rows included in different operator cell sub-array blocks. The data writing path differs from the data reading path in the unit operator cell in which the SOI transistors are used. Accordingly, when the data is read to perform the addition on a unit operator cell group, the data may concurrently be written in another unit operator cell group.

In the arrangement of FIG. 38, the four-bit subtraction processing can also be performed in bit parallel and data serial by utilizing input borrow BRin instead of input carry Cin. Here, the term "bit parallel and data serial" means a fashion in which each data is sequentially processed while all the bits of one multi-bit data are concurrently processed.

Thus, according to the second embodiment of the present invention, in the combination logic operational circuit, the combination logic operation processing is performed to the values stored in the unit operator cells, so that the arithmetic operations of the addition and subtraction can be performed at high speed without changing the internal configuration.

The addition/subtraction result is preliminarily obtained while the value of carry/borrow is fixed, and one of the preliminary addition/subtraction results is selected according to the actual carry/borrow output of the preceding-stage circuit in the final stage, so that the addition/subtraction processing of the plural bits can be performed at high speed in the bit parallel fashion.

[Third Embodiment]

Figure 39:
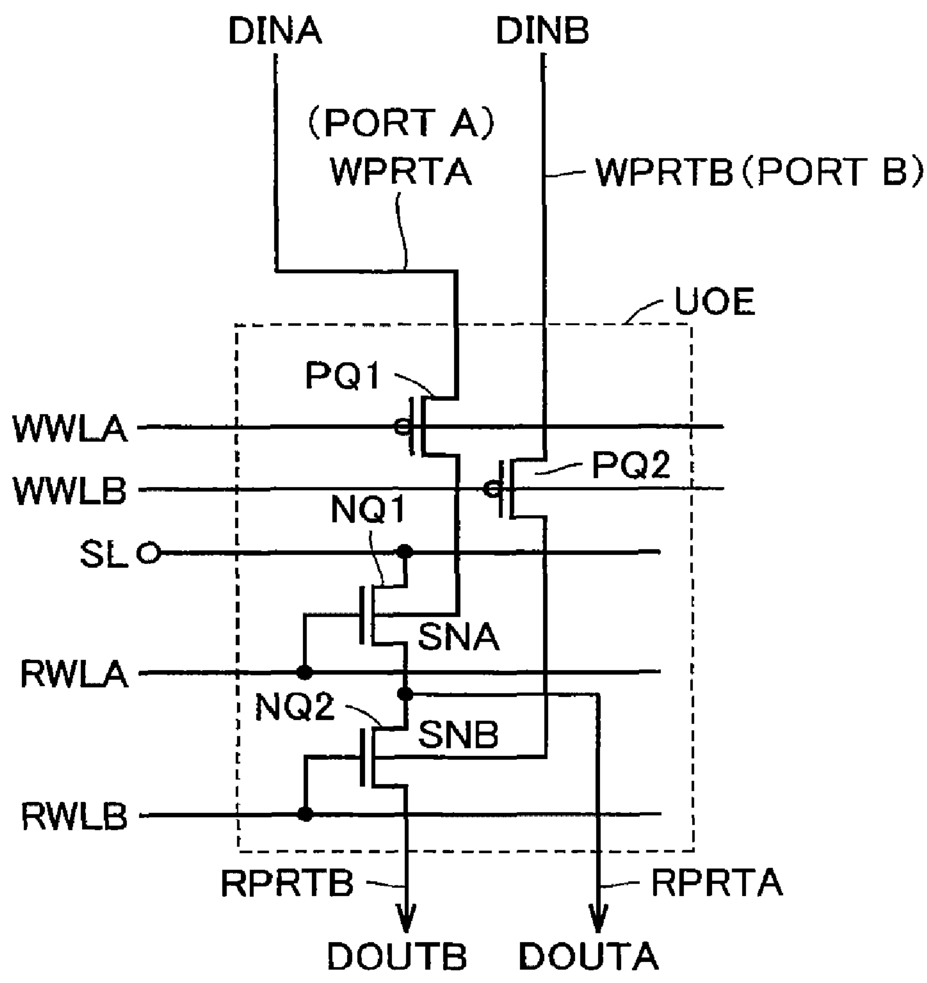
FIG. 39 schematically shows an electrically equivalent circuit of a unit operator cell according to a third embodiment of the present invention.

FIG. 39 shows an electrically equivalent circuit of a unit operator cell according to a third embodiment of the present invention. Unit operator cell UOE shown in FIG. 39 differs from the unit operator cell shown in FIG. 1 in that different write word lines WWLA and WWLB are provided for P-channel SOI transistors PQ1 and PQ2. In FIG. 39, because other configuration of unit operator cell UOE are similar to that of the unit operator cell shown in FIG. 1, counterparts to the unit operator cell shown in FIG. 1 are designated by the same symbols, and the detailed description is not repeated.

Where unit operator cell UOE shown in FIG. 39 is used, write word lines WWLA and WWLB can alternately be driven to the selected state, and data can be individually written in storage nodes SNA and SNB. Accordingly, with data being retained in storage node SNA, search data can be written in storage node SNB, and match/mismatch can be determined between the search data and the data stored in each entry (including unit operator cells of one row).

Figure 40:
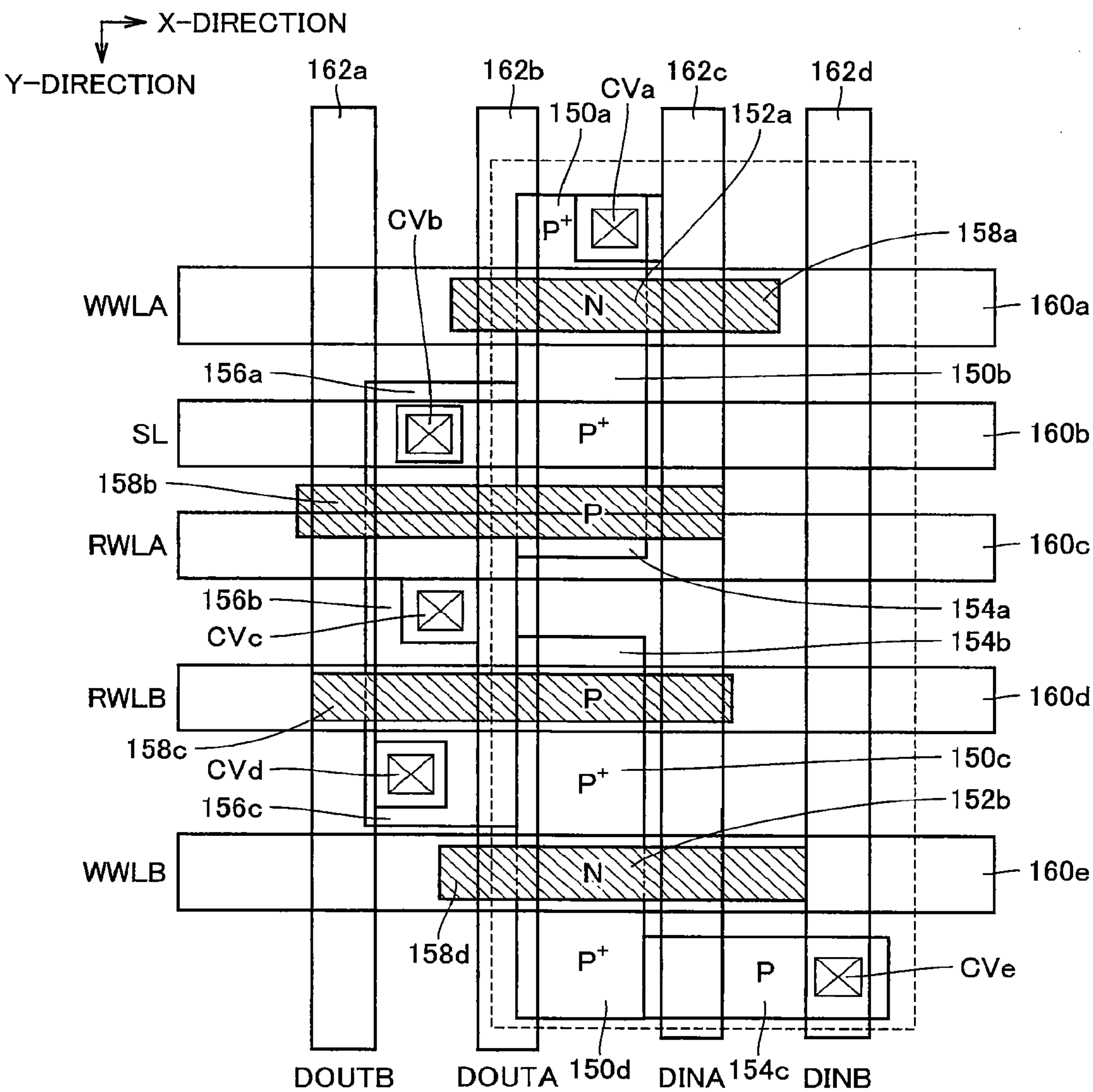
FIG. 40 schematically shows a planar layout of the unit operator cell of FIG. 39.

FIG. 40 schematically shows a planar layout of unit operator cell UOE shown in FIG. 39. In FIG. 40, a P-channel SOI transistor is formed in a region indicated by a broken-line block. In the P-channel SOI transistor forming region, high-concentration P-type regions 150*a* and 150*b* are arranged in alignment in the Y-direction. An N-type region 152*a* is disposed between high-concentration P-type regions 150*a* and 150*b*. N-type region 152*a* serves as the body region of SOI transistor PQ1.

A P-type region 154*a* is disposed adjacent to P-type region 150*b* in the Y-direction. A P-type region 154*b* is disposed in alignment with P-type region 154*a* in the Y-direction, and P-type region 154*b* and P-type region 154*a* are separated from each other. A high-concentration P-type region 150*c* is disposed in alignment with and in contact with P-type region 154*b* in the Y-direction. A high-concentration P-type region 150*d* is disposed in alignment with P-type region 150*c* in the Y-direction. An N-type region 152*b* is disposed between P-type regions 150*c* and 150*d*. N-type region 152*b* constitutes the body region of SOI transistor PQ2. A P-type region 154*c* is disposed extending in the X-direction, and is in contact with P-type region 150*d*.

A high-concentration N-type region 156*a* is disposed adjacent to P-type region 150*h* and outside the P-channel SOI transistor forming region. High-concentration N-type regions 156*b* and 156*c* are disposed in alignment with N-type region 156*a* in the Y-direction, and are separated from each other. P-type region 154*a* is disposed extending in the X-direction between N-type regions 156*a* and 156*b*, and P-type region 154*b* is disposed extending in the X-direction between N-type regions 156*b* and 156*c*.

A gate electrode interconnection line 158*a* is disposed continuously extending in the X-direction on N-type region 152*a*. A gate electrode interconnection line 158*b* is continuously provided on P-type region 154*a* along the X-direction so as to traverse a region between N-type regions 156*a* and 156*b*. A gate electrode interconnection line 158*c* is continuously provided on P-type region 154*b* along the X-direction so as to traverse a region between N-type regions 156*b* and 156*c*.

Second metal interconnection lines 160*a* to 160*e* are provided continuously extending in the X-direction, and are separated from each other. A second metal interconnection line 162*a* is disposed in alignment with gate electrode interconnection line 158*a*, and is electrically connected to gate electrode interconnection line 158*a* (contact portion is not shown) to constitute write word line WWLA. Second metal interconnection line 160*b* is electrically connected to N-type region 156*a* through a contact/via CVb and intermediate interconnection line to constitute source line SL. Second metal interconnection line 160*c* is provided in parallel with gate electrode interconnection line 158*b* provided in a lower layer thereof, and is electrically connected to gate electrode interconnection line 158*b* (contact portion is not shown) to constitute read word line RWLA. Second metal interconnection line 160*d* is disposed in alignment with gate electrode interconnection line 158*c*, and is electrically connected to gate electrode interconnection line 158*c* to constitute read word line RWLB. Second metal interconnection line 160*e* is disposed in alignment with gate electrode interconnection line 158*d*, and is electrically connected to gate electrode interconnection line 158*d* to constitute write word line WWLB.

First metal interconnection lines 162*a* to 162*d* are disposed continuously extending along the Y-direction, and are separated from one another. The first metal interconnection line is located below the second metal interconnection line.

First metal interconnection line 162*a* is electrically connected to N-type region 156*c* through a contact/via CVd. First metal interconnection line 162*b* is electrically connected to N-type region 156*b* through a contact/via CVb. First metal interconnection line 162*c* is electrically connected to P-type region 150*a* through a contact/via CVa. First metal interconnection line 162*d* is electrically connected to P-type region 150*c* through a contact/via CVe.

First metal interconnection lines 162*a* and 162*b* constitute read bit lines that transmit data DOUTB and DOUTA through port B and port A, respectively. First metal interconnection lines 162*c* and 162*d* each constitute a write port and a global write data line for transmitting input data DINA and DINB.

Write word lines WWL and WWLB are disposed sandwiching read word lines RWLA and RWLB in between, so that the gates of SOI transistors PQ1 and PQ2 are electrically connected to different write word lines WWLA and WWLB without largely changing the layout of unit operator cell UOE shown in FIG. 1.

Figure 41:
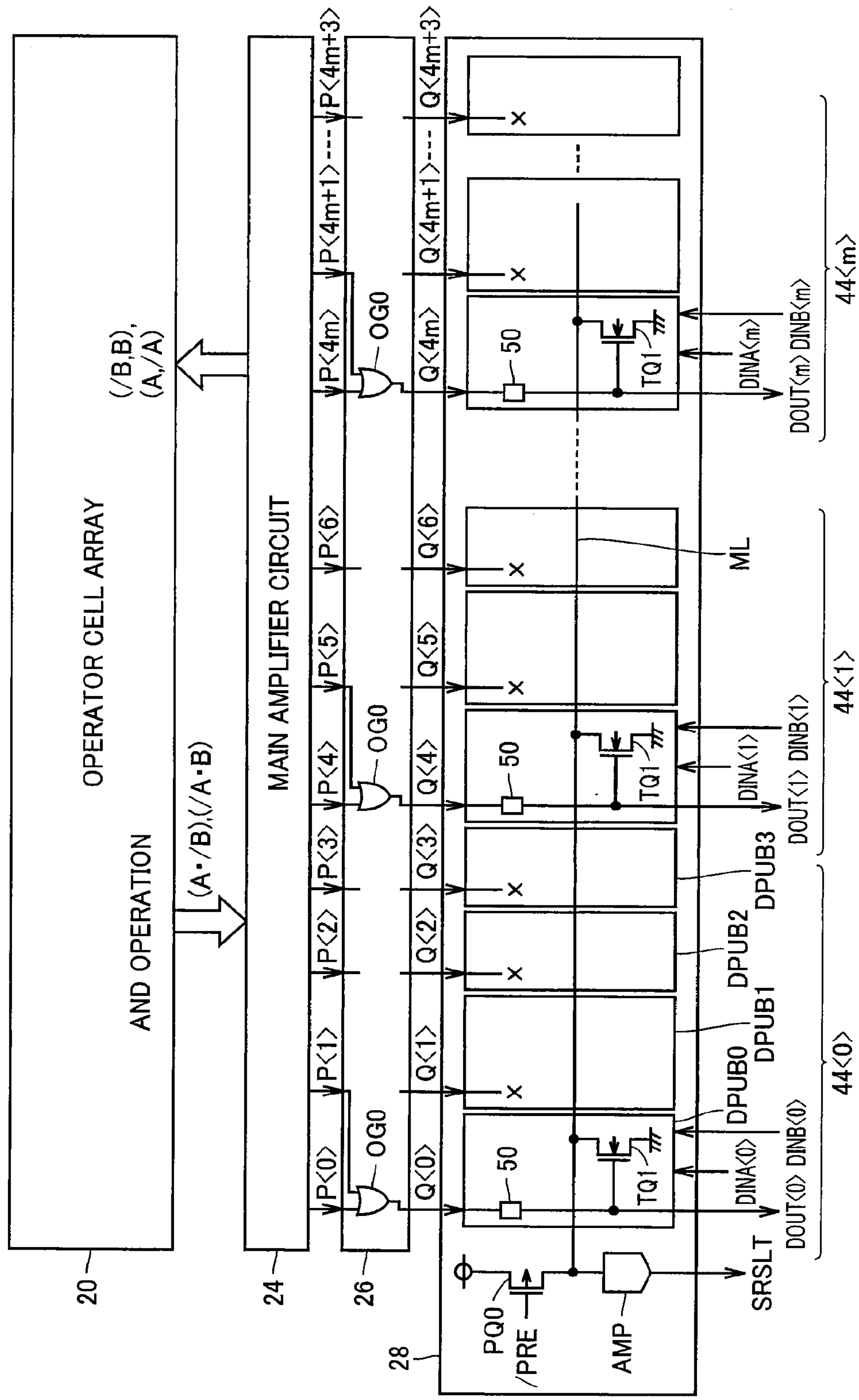
FIG. 41 schematically shows a configuration of a main part of the semiconductor signal processing device according to the third embodiment of the present invention.

FIG. 41 schematically shows a connection manner of a data path and a data propagation route of a combination logic operational circuit in the semiconductor signal processing device according to the third embodiment of the present invention. Referring to FIG. 41, two-input OR gate OG0 is selected in combination logic operational circuit 26. Two-input OR gate OG0 receives output signals P<4i> and P<4i+1> of the main amplifier included in main amplifier circuit 24.

In data path 28, a match line ML is disposed commonly to data path operational unit blocks 44<0> to 40<m>. In each of data path operational unit groups 44<0> to 44<m>, a discharging transistor TQ1 is provided for data path unit block DPUB0. Discharging transistor TQ1 is formed by an N-channel MOS or SOI transistor, is connected to match line ML, and discharges match line ML in response to the output signal of the corresponding two-input OR gate. A P-channel pre-charging transistor PQ0 and an amplifying circuit AMP are provided for match line ML. P-channel pre-charging transistor PQ0 charges match line ML to a power supply voltage level in response to a pre-charge instruction signal /PRE. Amplifying circuit AMP amplifies a signal potential on match line ML.

In operator cell array 20, input data B and inverted data /B are stored as entry data in storage nodes SNB of the unit operator cells that are disposed for data path unit blocks DPUB0 and DPUB1.

After the search is started, in data path unit blocks DPUB0 and DPUB1, inverted data /A of data A and non-inverted data A are selected and stored in and then read out from storage nodes SNA of the corresponding unit operator cells. The data (/A,B) and (A,/B) are read in the corresponding unit operator cells.

The sense amplifiers of operator cell array 20 produces AND operational results A·/B and /A·B to two-input OR gate OG0 through the corresponding main amplifiers. In the case where data A and B are matched with each other, AND operational results A·/B and /A·B become "0" and the output signal of OR gate OG0 becomes "0". On the other hand, in the case where data A and B are not matched with each other, one of data A·/B and /A·B becomes "1" and the output signal of corresponding OR gate OG0 becomes "1".

Accordingly, the output signal of OR gate OG0 that detects the mismatch becomes "1", and a corresponding discharging transistor TQ1 turns on to discharge match line ML. The voltage level of match line ML becomes a voltage level pre-charged by pre-charging transistor PQ0 in the case where data A and B are matched with each other, and voltage level of match line ML becomes lower than a pre-charge voltage through discharging by discharging transistor TQ1 in the case where data A and B are not matched with each other. The voltage level of match line ML is amplified by amplifying circuit AMP, whereby the voltage level of match line ML can be determined according to a logic level of an output signal SRSLT, and therefore the match/mismatch between search data A and previously stored search target data (entry data) B can be determined.

Figure 42:
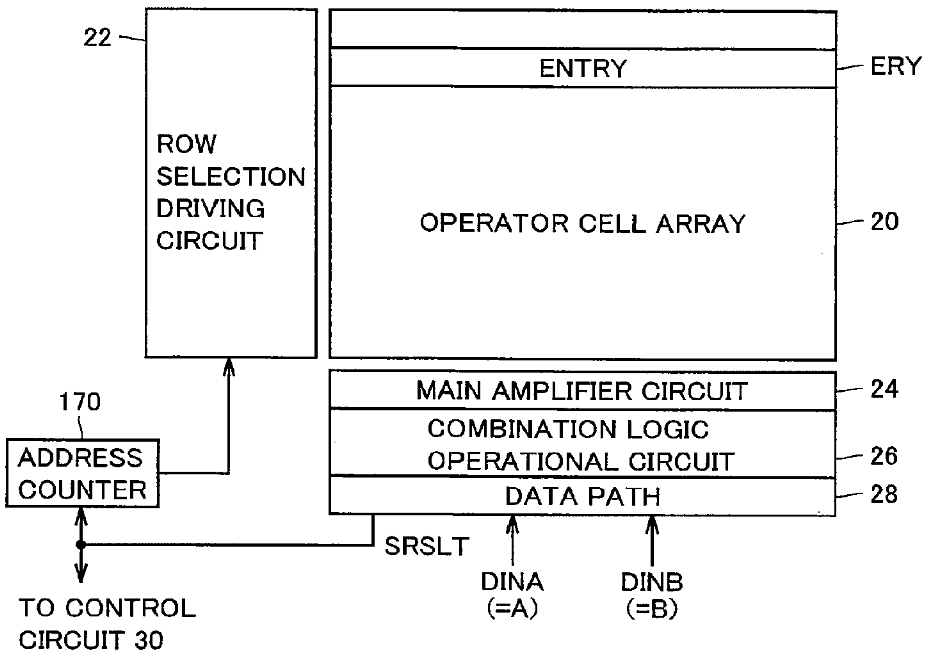
FIG. 42 schematically shows an entire configuration of the semiconductor signal processing device according to the third embodiment of the present invention.

FIG. 42 schematically shows an entire configuration of the semiconductor signal processing device according to the third embodiment of the present invention where the semiconductor signal processing device is used as a CAM (Content Addressable Memory). An address counter 170 is provided in the semiconductor signal processing device shown in FIG. 42. Count up and count stop of address counter 170 are controlled by output data SRSLT of amplifying circuit AMP included in data path 28. Row selection driving circuit 22 sequentially selects an entry ERY in operator cell array 20 to perform a searching operation with the count value of address counter 170 being used as the address signal.

Figure 43:
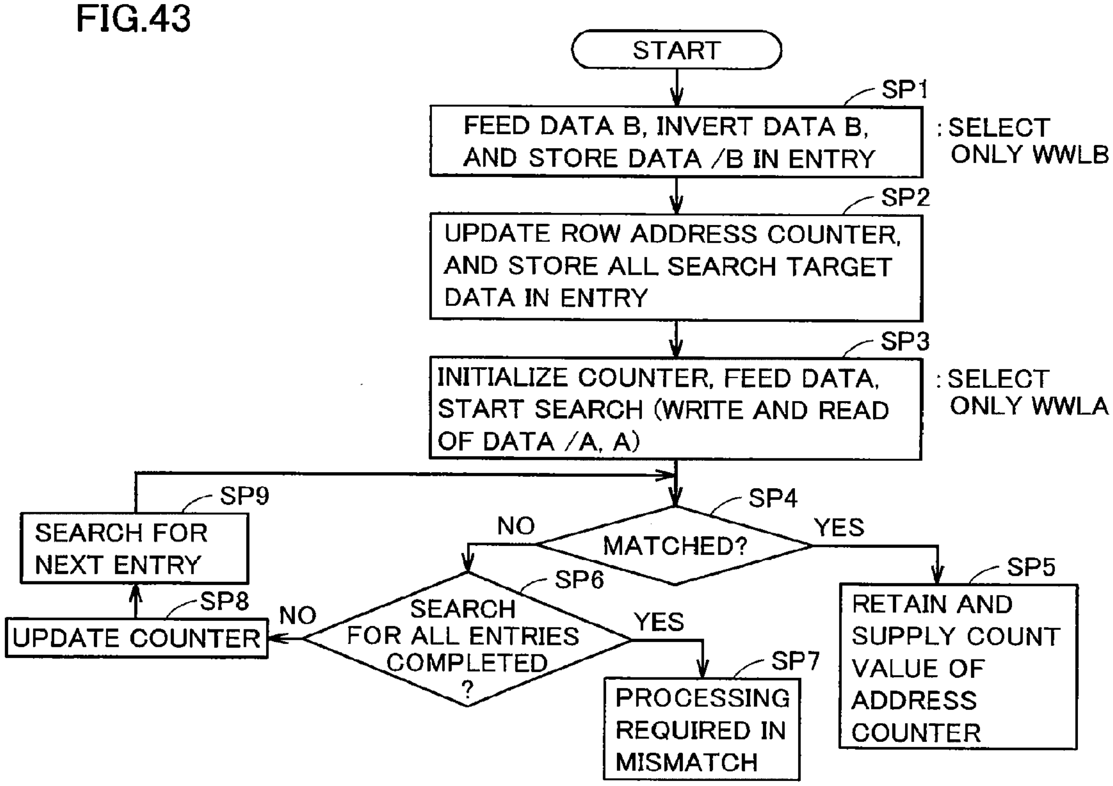
FIG. 43 is a flowchart showing a searching operation of the semiconductor signal processing device according to the third embodiment of the present invention.

FIG. 43 is a flowchart representing an operation of the semiconductor signal processing device according to the third embodiment of the present invention. Referring to the flowchart shown in FIG. 43, the searching operation of the semiconductor signal processing devices shown in FIGS. 39 to 43 will be described below.

Data B is supplied as the search target data, and data B and inverted data /B are stored in unit operator cells (UOE0 and UOE1) of entry ERY by path selection processing in data path 28 (Step SP1). In such operation, only write word line WWLB is selected to store the data in the body region of SOI transistor NQ2 shown in FIG. 39, that is, storage node SNB in the unit operator cell. Address counter 170 is set at an initial value. Row selection driving circuit 22 selects a corresponding entry according to the count value of address counter 170 to write data B and /B in the selected entry.

Then address counter 170 is sequentially updated in response to a clock signal (not shown), and the entry of operator cell array 20 is sequentially updated to store the search target data (Step SP2).

After all the search target data necessary for operator cell array 20 are stored, the searching operation is started for data A (Step SP3). In starting the searching operation, address counter 170 is reset to the initial value. In data path 28, using input data (search data) A, inverted data /A and data A are produced for data path unit blocks DPUB0 and DPUB1 and transmitted to the corresponding unit operator cells. In writing the search data, write word line WWLB is maintained in the non-selected state, and only write word line WWLA is driven to the selected state. Then row selection driving circuit 22 concurrently selects read word lines RWLA and RWLB of the selected entry to read the data through port B.

Sense amplifiers SA produce data A·/B and A·/B to corresponding two-input OR gate OG0 through the corresponding main amplifiers. Discharging transistor TQ1 selectively discharges match line ML in response to the output signal of two-input OR gate OG0. The control circuit (30, not shown) determines whether the match is generated in response to output signal SRSLT of amplifying circuit AMP that amplifies the voltage on match line ML (Step SP4).

When the match is detected, address counter 170 stops the counting operation, and retains and supplies the current count value (Step SP5). Processing, which is appropriately defined depending on the application of the semiconductor signal processing device, is performed using the count value of address counter 170 as an address index.

When the data stored in the selected entry is not matched with search data A, a determination whether the search is completed for all the entries is made (Step SP6). When the search is not completed for all the entries, the address counter 170 has the count value updated (Step SP8), and row selection driving circuit 22 selects the next entry to perform the searching (Step SP9).

On the other hand, when a determination that the search is completed for all the entries is made in Step SP6, because the search target data stored in operator cell array 20 are not matched with search data A, necessary processing in generation of the mismatch is performed (Step SP7).

In searching processing, each entry is sequentially selected to perform the search. Accordingly, although the processing speed becomes slower than that of a usual parallel searching operation as done in a TCAM (Three-value CAM), the layout area of the unit operator cell can largely be reduced, compared with TCAM in which the usual SRAM cell is used.

In the TCAM, usually an XOR circuit that determines the match/mismatch is arranged in each cell, a match line is disposed for each entry, and each match line is discharged by the corresponding XOR circuit. Accordingly, there is caused a problem that current dissipation is increased due to the charging and discharging of the match line.

In the third embodiment, because data path 28 and combination logic operational circuit 26 are commonly provided for a plurality of entries, the charging and discharging current of the match line is largely reduced, and the layout area of the portion for providing the components that determine the match/mismatch can largely be reduced.

Figure 44:
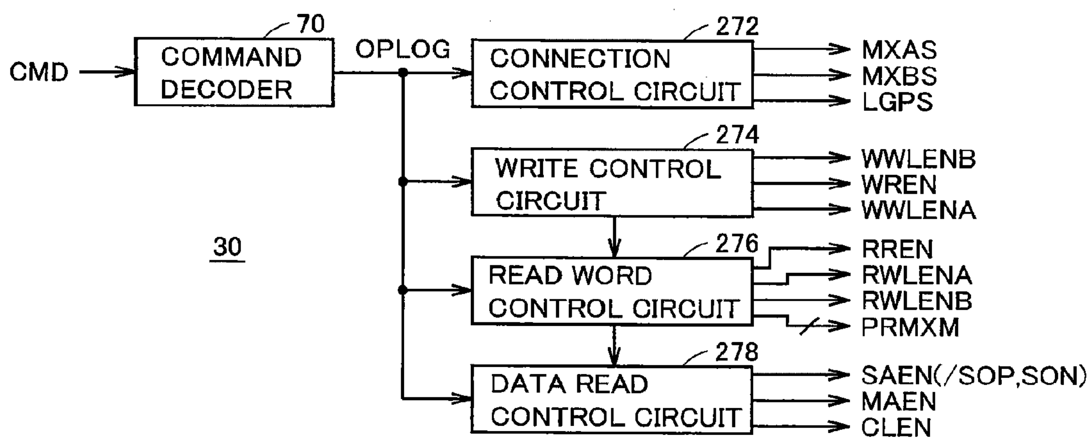
FIG. 44 schematically shows an example of a configuration of a control circuit in the semiconductor signal processing device according to the third embodiment of the present invention.

FIG. 44 schematically shows a configuration of the control circuit (30) in the semiconductor signal processing device according to the third embodiment of the present invention. Referring to FIG. 44, control circuit 30 includes a command decoder 70 for decoding an externally applied command, a connection control circuit 272, and a write control circuit 274, a read word control circuit 276 and a data read control circuit

278 each of which operates in accordance with an operation processing instruction OPLOG from command decoder 70.

When command decoder 70 provides operation processing instruction OPLOG to write the search target data in each entry, similarly to the XOR operation, connection control circuit 272 sets switching control signals MXAS and MXBS to the states of forming the connection path through which the adjacent data path unit blocks generate the complementary data, and sets logical path instruction signal LGPS to the state of selecting the two-input OR gate.

When command decoder 70 supplies operation processing instruction OPLOG instructing the writing of search target data in each entry, write control circuit 274 activates a write word line enable signal WWLENB and write activation signal WREN while maintaining a write word line enable signal WWLENA in the inactive state. When operation processing instruction OPLOG instructs the start of searching, write control circuit 274 sets write word line enable signal WWLENB to the inactive state while driving write activation signal WREN and write word line enable signal WWLENA to the active state.

When operation processing instruction OPLOG instructs the writing of search target data, read word control circuit 276 sets read activation signal RREN and read word line enable signals RWLENA and RLENB at the inactive state and sets main port selection signal PRMXM to the inactive state. When operation processing instruction OPLOG instructs the start of searching, read word control circuit 276 activates write word line enable signal WWLENA, and then drives read activation signal RREN and read word line enable signals RWLENA and RWLENB to the active state at a predetermined timing.

When operation processing instruction OPLOG instructs the writing of the search target data, data read control circuit 278 maintains sense amplifier activation signal SAEN, main amplifier activation signal MAEN, and read block selection activation signal CLEN in the inactive state. When operation processing instruction OPLOG instructs the starting of search, before the read word line is activated, read word control circuit 276 sets main port selection signal PRMXM to the state of selecting port B (read port RPTB), drives sense amplifier activation signals SAEN (/SOP and SON) to the active state according to read word line selection timing of read word control circuit 276, and activates main amplifier activation signal MAEN. In this operation, read gate selection timing signal CLEN is activated before or after the sense amplifier is activated.

Figure 45:
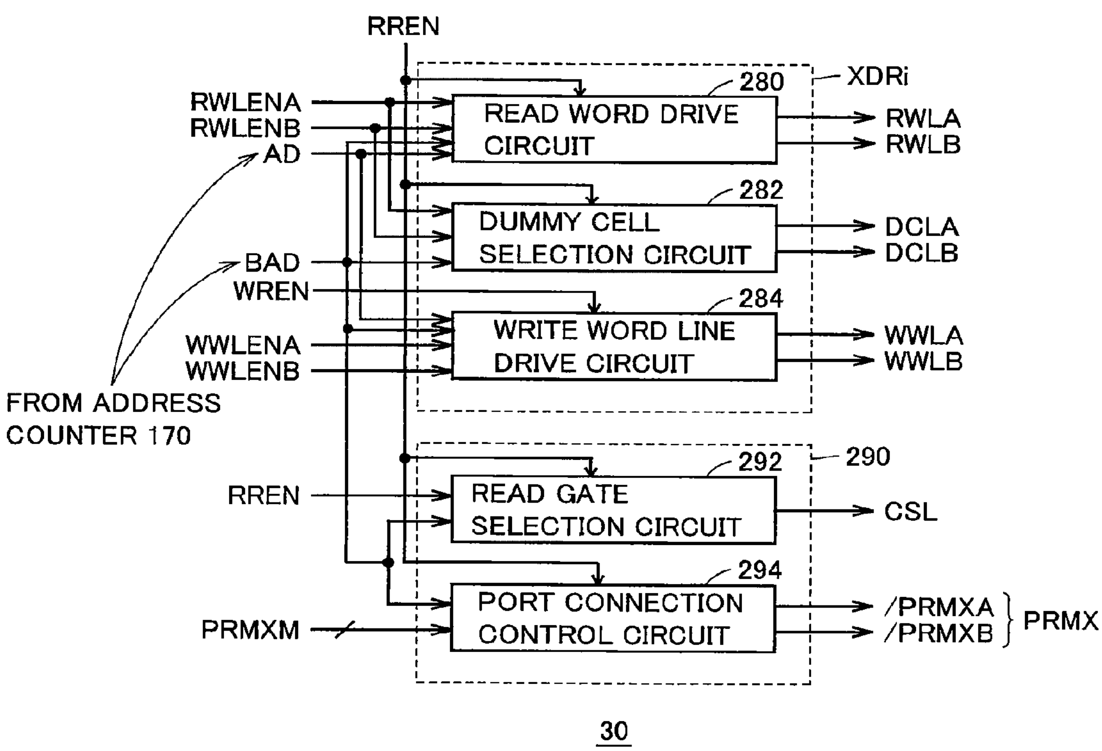
FIG. 45 schematically shows an example of a configuration of a row selection driving circuit in the semiconductor signal processing device according to the third embodiment of the present invention.

FIG. 45 schematically shows a configuration of row drive circuit XDRi that is included in the row selection driving circuit in the semiconductor signal processing device according to the third embodiment of the present invention. FIG. 45 also shows configurations of the read cell sub-array block port connection section and sub-array block selection section that are included in row selection driving circuit 22.

Row drive circuit XDRi includes a read word line drive circuit 280 that drives a read word line, a dummy cell selection circuit 282 that selects a dummy cell, and a write word line drive circuit 284 that drives a write word line.

Read word line drive circuit 280 is enabled in activation of read activation signal RREN, receives and decodes the count value from address counter (170) as address signal AD and block address signal BAD, and drives read word lines RWLA and RWLB that are arranged for the specified entry to the selected state at timing defined by read word line enable signals RWLENA and RWLENB.

Dummy cell selection circuit 282 is enabled in activation of read activation signal RREN, receives and decodes block address signal BAD from address counter 170, and drives one of dummy cell selection signals DCLA and DCLB to the selected state in response to read word line enable signals RWLENA and RWLENB. Dummy cell selection circuit 282 drives dummy cell selection signal DCLA to the selected state when only read word line enable signal RWLENA is activated, and dummy cell selection circuit 282 drives dummy cell selection signal DCLB to the selected state when both read word line enable signals RWLENA and RWEANB are activated.

Write word line drive circuit 284 is enabled in activation of write activation signal WREN, decodes address signals AD and BAD from address counter 170, and drives write word lines WWLA and WWLB to the selected state at activation timing of write word line enable signals WWLENA and WWLENB.

A sub-array selection driving circuit 290 includes a read gate selection circuit 292 that selects a read gate and a port connection control circuit 294 that performs the port connection control. Read gate selection circuit 292 is enabled in activated read activation signal RREN, decodes block address signal BAD from address counter 170, and drives read gate selection signal CSL for the corresponding operator sub-array block to the selected state at activation timing of read gate selection timing signal CLEN according to the decoding result.

Port connection control circuit 294 is enabled in activation of read active signal RREN, and sets port selection signals /PRMXA and /PRMXB to the state of setting the port connection of the corresponding operator cell sub-array block in accordance with main port selection signals PRMXM and block address signals BAD. Port selection signals /PRMXA and /PRMXB correspond to previously-described port selection signal PRMX. In the searching operation, port connection control circuit 294 drives port-B selection signal /PRMXB of port selection signals /PRMXA and /PRMXB to the L level such that port B is selected.

Using the control circuit and row selection driving circuit shown in FIGS. 44 and 45, the search target data can be stored in the entry and the search can be performed in each entry with the search data, even if the semiconductor signal processing device behaves as a CAM.

In the case where block address BAD and address AD are produced with address counter 170 in the configurations shown in FIGS. 44 and 45, when block address BAD is produced such that the different operator cell sub-array is specified, the access to the different operator cell sub-array blocks can be made in a pipeline manner, so that the data can be read in one operator cell sub-array block while the data is written in another operator cell sub-array block. Therefore, the operation processing can be performed in the pipeline manner by concurrently performing the data writing and reading in each clock cycle in the different operator cell sub-array blocks.

The following configuration can be utilized to implement the data processing in the pipeline manner by way of example. Address signals BAD and AD are applied to read word line drive circuit 280, dummy cell selection circuit 282, and port connection control circuit 290 while being delayed by one clock cycle later than the application of these address signals to write word line drive circuit 284. Therefore, the data read access can be made in the next cycle to the operator cell sub-array block in which the data is written. In data path 28, because the data writing path differs from the data reading path, there is caused no problem even if the data transfer path in the data write and the data transfer path in the data read are set in parallel. This enables the high-speed processing to be performed in the pipeline manner.

In the same operator cell sub-array block, the data can concurrently be written and read to the different entries. In this behavior, the application of the word line address in the data write is delayed by one clock cycle behind that in the data read. The data read is performed in the next cycle to the entry in which the data is written. This configuration can also be implemented using the configurations shown in FIGS. 44 and 45.

Thus, in semiconductor signal processing device according to the third embodiment of the present invention, the match/mismatch determination section is provided commonly to a plurality of entries, the search target data is stored in each entry, and then the complementary data are produced through the data path according to the search data for writing and reading data. Accordingly, the searching operation can be performed in one clock cycle for one entry, and the layout area of the memory cell array and the consumed current can be reduced.

[Fourth Embodiment]

Figure 46:
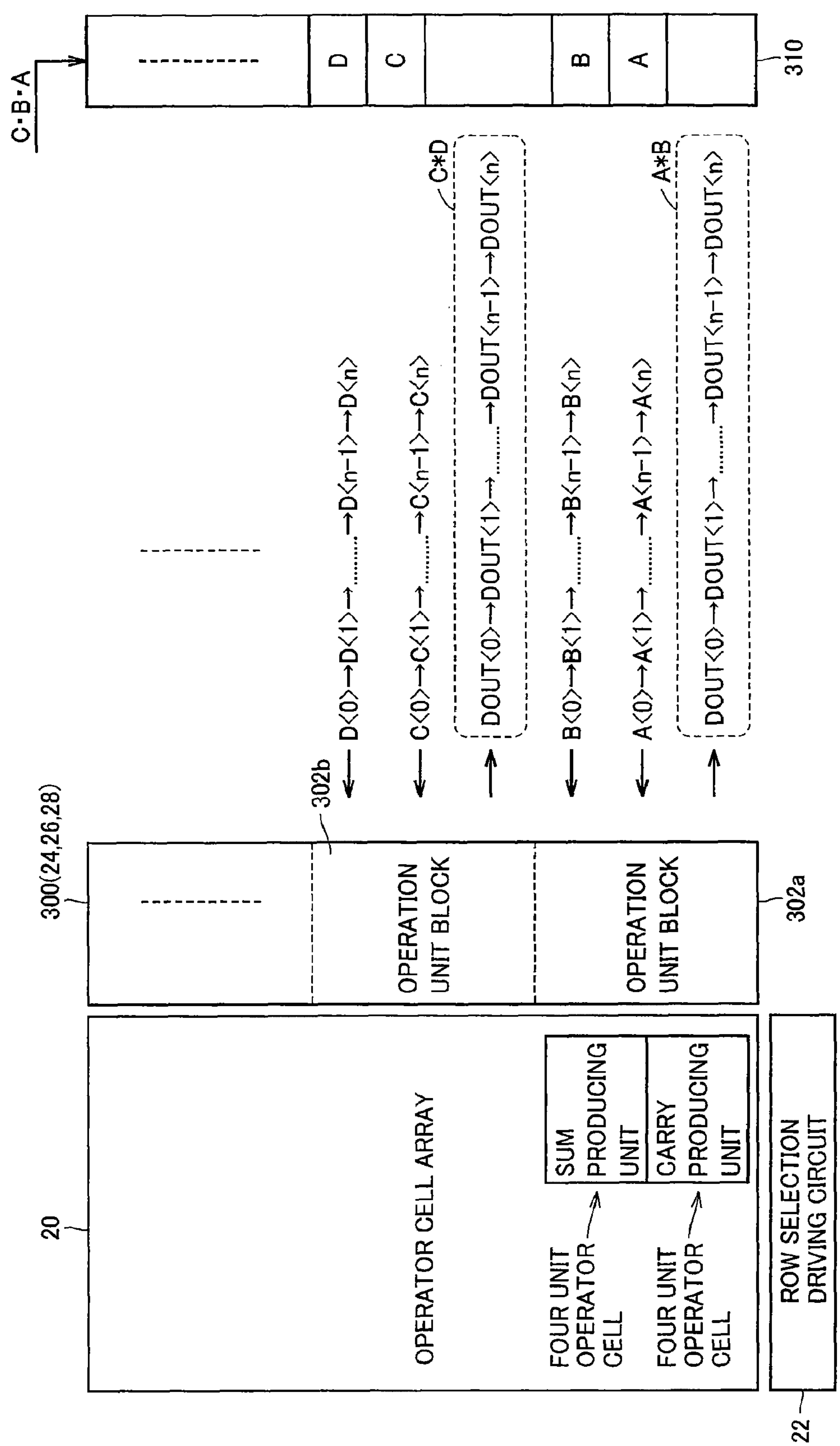
FIG. 46 schematically shows an entire configuration of a semiconductor signal processing device according to a fourth embodiment of the present invention.

FIG. 46 schematically shows an arrangement of operational data in a semiconductor signal processing device according to a fourth embodiment of the present invention. Referring to FIG. 46, an operation data input and output processing circuit 300 is provided for operator cell array 20. Operation data input and output processing circuit 300 includes main amplifier circuit 24, combination logic operational circuit 26, and data path 28.

Operation data input and output processing circuit 300 is divided into operation unit blocks 302*a*, 302*b*, . . . . Each of operation unit blocks 302*a*, 302*b*, . . . includes unit operation block (UCL) and data path operation unit group (44) of the combination logic operational circuit.

Data words A, B, C, and D are supplied to operation data input and output processing circuit 300 in a bit serial fashion, and resultant data DOUT of operational processing (*) of the data is supplied externally in the bit serial manner. FIG. 46 shows an example of a bit-serial transfer manner in which each of data words A, B, C, and D has a bit width of (n+1) bits and output data DOUT has a bit width of (n+1) bits.

In the bit serial and data word parallel manner, a data string conversion circuit 310 applies the data string. Data words A, B, C, . . . applied in bit parallel and data serial are sequentially stored in data string conversion circuit 310, and data string conversion circuit 310 transfers the storage data in the bit serial and data word parallel manner.

Here, "bit serial and data word parallel" transfer means a manner, in which bits constituting a data word are sequentially transferred and the data words are transferred in parallel. "Bit parallel and data word serial" transfer means a manner, in which the data words are transferred in serial and a plurality of bits constituting a data word are transferred in parallel.

The configuration of data string conversion circuit 310 can easily be implemented using a usual orthogonal transformation circuit. Although data string conversion circuit 310 is provided outside the semiconductor signal processing device in FIG. 46, data string conversion circuit 310 may be provided inside the semiconductor signal processing device, for example, in data path 28.

Row selection driving circuit 22 selects an entry, and the specified operation processing is performed in the bit serial and data word parallel manner.

FIG. 46 representatively shows a sum producing unit and carry producing unit which are provided for the operation unit block 302*a* in operator cell array 20. Each of the sum producing unit and carry producing unit includes four unit operator cells. The four unit operator cells perform a one-bit addition/subtraction, described in the second embodiment, to the data transferred from a corresponding operation unit block 302*a*. The sum and carry producing units are similarly arranged for other operation unit blocks 302*b*, . . . . The configuration of the unit operator cell is similar to that of the first embodiment.

Figure 47:
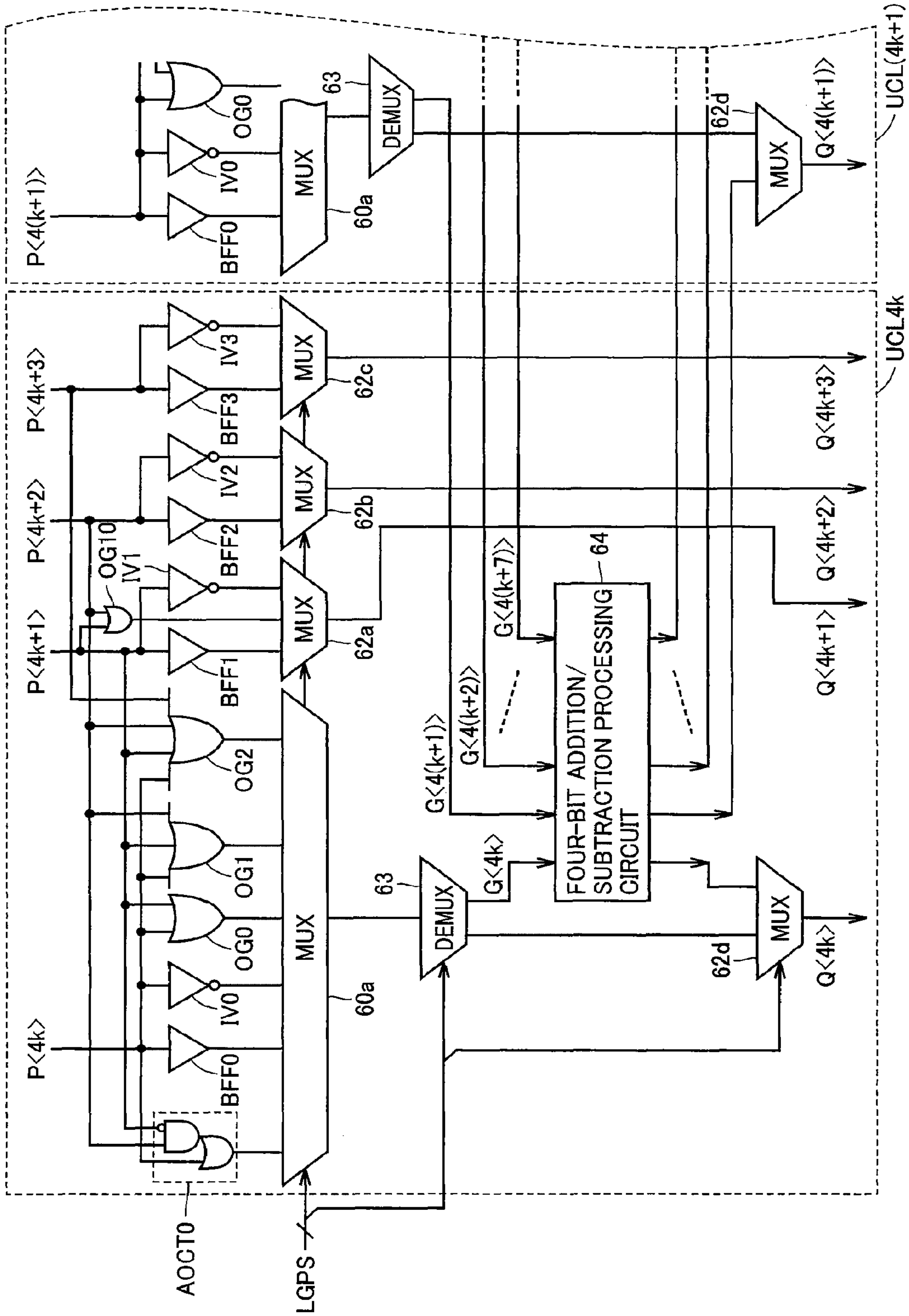
FIG. 47 schematically shows a configuration of a unit operation block in the semiconductor signal processing device of FIG. 46.

FIG. 47 schematically shows a configuration of the processing section (unit operation block UCL) of combination logic operational circuit 26 included in operation data input and output processing circuit 300 shown in FIG. 46. FIG. 47 representatively shows a configuration of a unit operation block UCL4*k* of one processing unit. Unit operation block UCL4*k* shown in FIG. 47 differs from the unit operation block shown in FIG. 9 in that an AND/OR composite gate AOCT0 is further provided for multiplexer (MUX) 60*a*. AND/OR composite gate AOCT0 receives output data bits P<4k>, P<4k+1>, and P<4k+2> of the main amplifiers that are provided for the corresponding unit operation block. AND/OR composite gate AOCT0 produces the H-level signal, when bit P<4k+2> is the H level and bit P<4k+1> is the L level or bit P<4k> is the H level. The carry in the addition is produced in the bit serial manner by using AND/OR composite gate AOCT0.

A two-input OR gate OG10 that receives output bits P<4k+1> and <4k+2> of the corresponding main amplifiers is also provided for multiplexer 62*a*. Two-input OR gate OG10 produces a sum SUM in the bit serial manner.

Other configuration of unit operation block UCL4*k* shown in FIG. 47 is identical to that of the unit operation block shown in FIG. 9, and corresponding components to those in the unit operation block shown in FIG. 9 are designated by the same reference numerals, and the detailed description is not repeated. FIG. 47 also shows a configuration of an adjacent unit operation block UCL<4k+1>. Although the configuration of AND/OR composite gate AOCT0 is not shown in block UCL<4k+1>, unit operation blocks UCL4*k*, UCL(4k+1), . . . have the same configuration.

Figure 48:
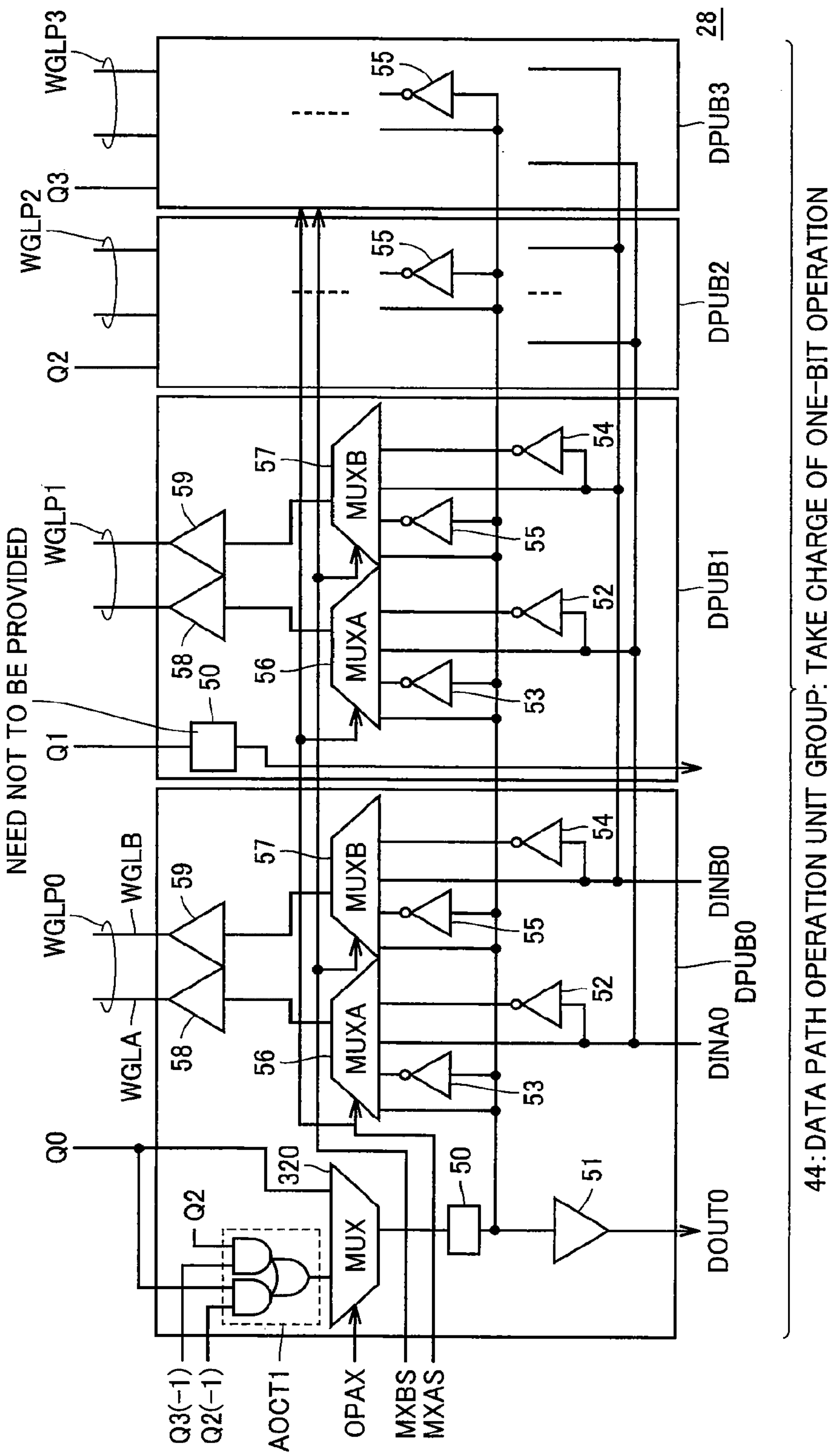
FIG. 48 schematically shows a configuration of a data path of the semiconductor signal processing device according to the fourth embodiment of the present invention.

FIG. 48 schematically shows the configuration of data path 28 included in operation data input and output processing circuit 300 shown in FIG. 46. Data path 28 shown in FIG. 46 differs from data path 28 shown in FIG. 7 in that an AND/OR composite gate AOCT1 and a multiplexer (MUX) 320 are provided in data path unit block DPUB0. AND/OR composite gate AOCT1 receives bits Q0 and Q2 from the unit operation block of the corresponding combination logic operational circuit and bits Q2(−1) and Q3(−1) which are applied to the data path unit block included in the data path operation unit group (arranged for the corresponding carry producing unit shown in FIG. 46) arranged adjacent to this data path. AND/OR composite gate AOCT1 includes a first AND gate, a second AND gate, and a two-input OR gate. The first AND gate equivalently receives bit Q2 and bit Q3(−1)(=/CY_old) from the data path operation unit group arranged adjacently. The second AND gate receives bit Q0 applied to corresponding data path unit block DPUB0 and bit Q2(−1)(=CY_old) applied to the data path operation unit group that is arranged adjacently. The two-input OR gate receives the output signal of the first and second AND gates. Here, CY_old indicates a carry produced in the preceding addition cycle. The sum in the addition or the difference in the subtraction is produced using AND/OR composite gate AOCT1.

Multiplexer 320 selects one of bits Q0 from AND/OR complex gate AOCT1 and the corresponding unit operation block in response to an operation switching signal OPAX, and supplies the output signal to register 50. The output signal of register 50 is supplied as external data DOUT<0> through buffer 51, and is also fed back to data path unit blocks DPUB0 to DPUB3 in the same data path operation unit group.

Because the configuration of the data path unit block shown in FIG. 48, that is, other configuration of data path operation unit group 44 is identical to that of the data path operation unit group shown in FIG. 7, corresponding components to those in the data path operation unit group 44 are designated by the same reference numerals, and the detailed description is not repeated.

Even in the case where the bit-serial addition or subtraction is performed, the one-bit addition or subtraction is also performed using the carry producing unit and the sum producing unit that are arranged for each data path operation unit group (44).

For the selections of the read word line and write word line for the unit operator cell, the word gate circuit that selectively transmits the signal according to the carry/borrow value is not used in the addition/subtraction processing in the bit serial manner. Similarly to the execution of the XOR operation or XNOR operation, the selection of the unit operator cell and the write/read access to the unit operator cell are executed.

Figure 49:
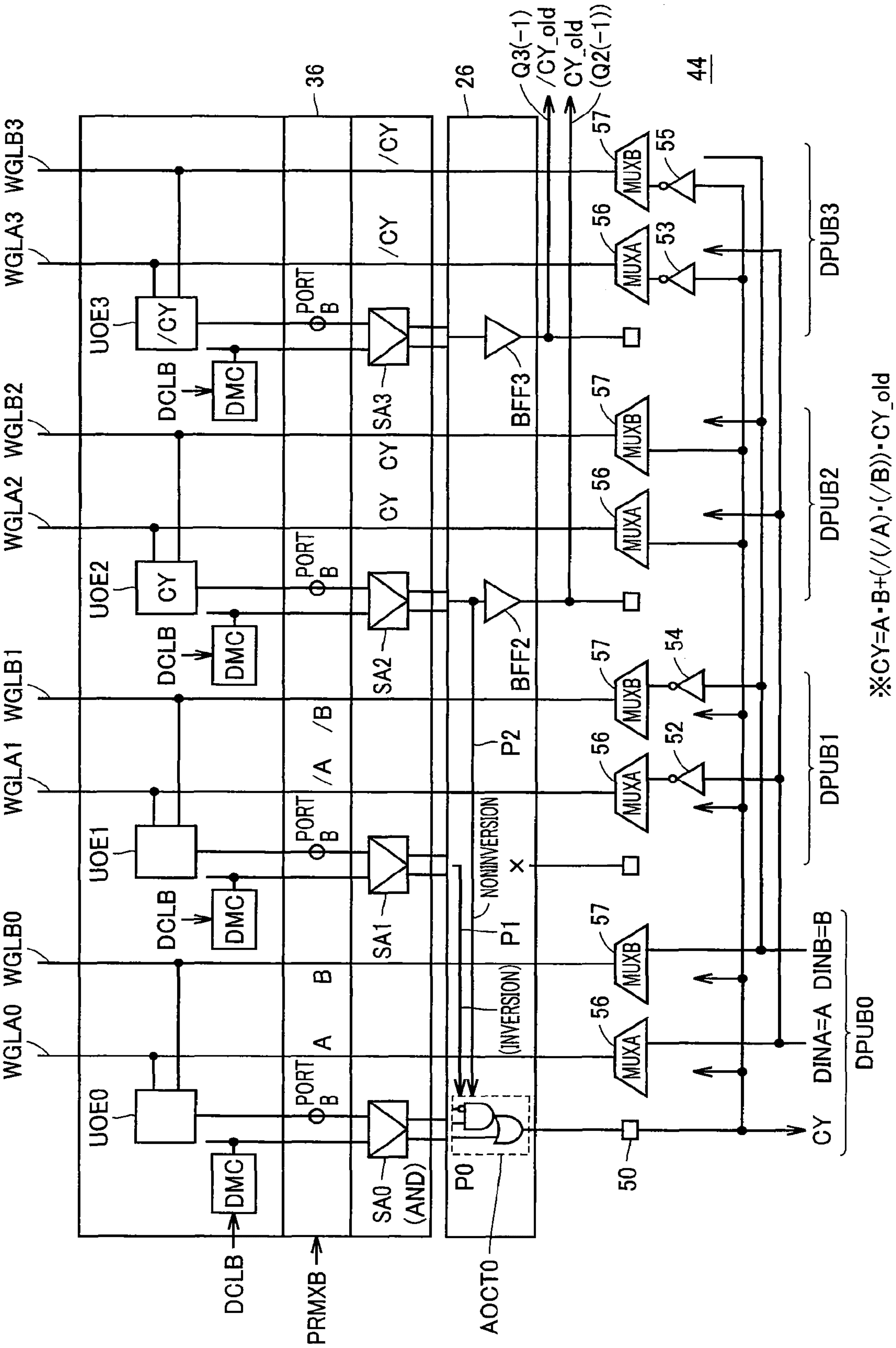
FIG. 49 schematically shows a configuration of a carry producing section in the semiconductor signal processing device according to the fourth embodiment of the present invention.

FIG. 49 schematically shows connection of a data routing of the portion (corresponding to the carry producing unit shown in FIG. 46) in which carry CY is produced in performing the bit-serial addition operation. In FIG. 49, in data path operation unit group 44 of data path (28), multiplexers 56 and 57 of data path unit block DPUB0 select input data DINA (=A) and DINB (=B), respectively. Accordingly, the data A and B are transferred to corresponding global data lines WGLA0 and WGLB0 and stored in corresponding unit operator cell UOE0.

In data path unit block DPUB1, multiplexer 56 selects inverted value /A of input data A, and multiplexer 57 selects inverted value /B of input data B. Inverted value /A is supplied from inverter 52, and inverted value /B is supplied from inverter 54. Data /A and /B are transferred through corresponding global write data line pair WGLA1 and WGLB1 and stored in corresponding unit operator cell UOE1.

In data path unit block DPUB2, multiplexers 56 and 57 select carry CY transferred from register 50. Accordingly, data CY is transferred through corresponding global write data line pair WGLA2 and WGLB2 and stored in corresponding unit operator cell UOE2.

In data path unit block DPUB3, multiplexers 56 and 57 select inverted value /CY of carry CY transferred from register 50. Inverted value /CY of carry CY is supplied from inverters 53 and 55. Accordingly, data CY is transferred through corresponding global write data line pair WGLA3 and WGLB3 and stored in corresponding unit operator cell UOE3.

Carry CY transmitted from register 50 is a carry that is produced by performing the operational processing in the preceding cycle and based on the one-bit lower-order addition result, and is equivalent to input carry Cin in the current cycle. Carry CY is written in and read from the unit operator cell again, whereby a new carry can be produced with the carry produced in the preceding cycle used as input carry Cin (=CY_old).

In the operator cell array, dummy cell selection signal DCLB is applied to dummy cell DMC, and two series-connected dummy transistors (DTB0 and DTB1) are selected. The arrangement of the read and write word lines for unit operator cells UOE0 to UOE3 is similar to that of the first embodiment, the data transmitted to corresponding global write data lines WGLA and WGLB are written in and read from unit operator cells UOE0 to UOE3.

In read port selection circuit 36, port switching signal PRMXB is set in the state of selecting port B, and the output signals of sense amplifiers SA0 to SA3 indicate the AND operational results of data stored in corresponding unit operator cells UOE0 to UOE3. That is, sense amplifier SA0 produces data A·B, and sense amplifier SA1 produces data (/A·/B). Sense amplifier SA2 supplies data CY·CY=CY, and sense amplifier SA3 produces data (/CY·/CY)=/CY.

That is, sense amplifiers SA2 and SA3 produce the values according to the intermediate carry CY produced in the preceding cycle. The output bits of sense amplifiers SA2 and SA3 are applied through buffers BFF2 and BFF3 to a sum producing data path operation unit group arranged adjacently, and the sum producing data path operation unit group produces the sum with the carry produced in the preceding cycle, that is, the carry produced through the operation on the one-bit lower-order bits being used as input carry Cin (=CY_old).

Output bits P0 and P2 are applied to AND/OR composite gate AOCT0 from the main amplifiers (not shown) that are disposed for sense amplifiers SA0 to SA2.

Accordingly, carry CY expressed by the following equation is produced from AND/OR composite gate AOCT0:

$$\begin{aligned} CY &= A\cdot B+(/(/A)\cdot(/B))\cdot \mathrm{CY\_old} \\ &= A\cdot B+(A+B)\cdot \mathrm{CY\_old}, \end{aligned}$$

wherein carry CY_old is an intermediate carry produced in the preceding cycle and becomes input carry (Cin) in the current cycle.

As is clear from the logic table shown in FIG. 29, in the case of input carry CY_old beig "0", output carry CY becomes "1" when data A·B is "1". In the case of input carry CY_old being "1", output carry CY becomes "0" when both the data A and B are "0". Accordingly, as shown in FIG. 49, AND/OR composite gate AOCT0 performs composite operational processing, so that carry CY satisfying the logical value relationship shown in FIG. 29 can be generated, and intermediate carry CY can be produced in each clock cycle.

Figure 50:
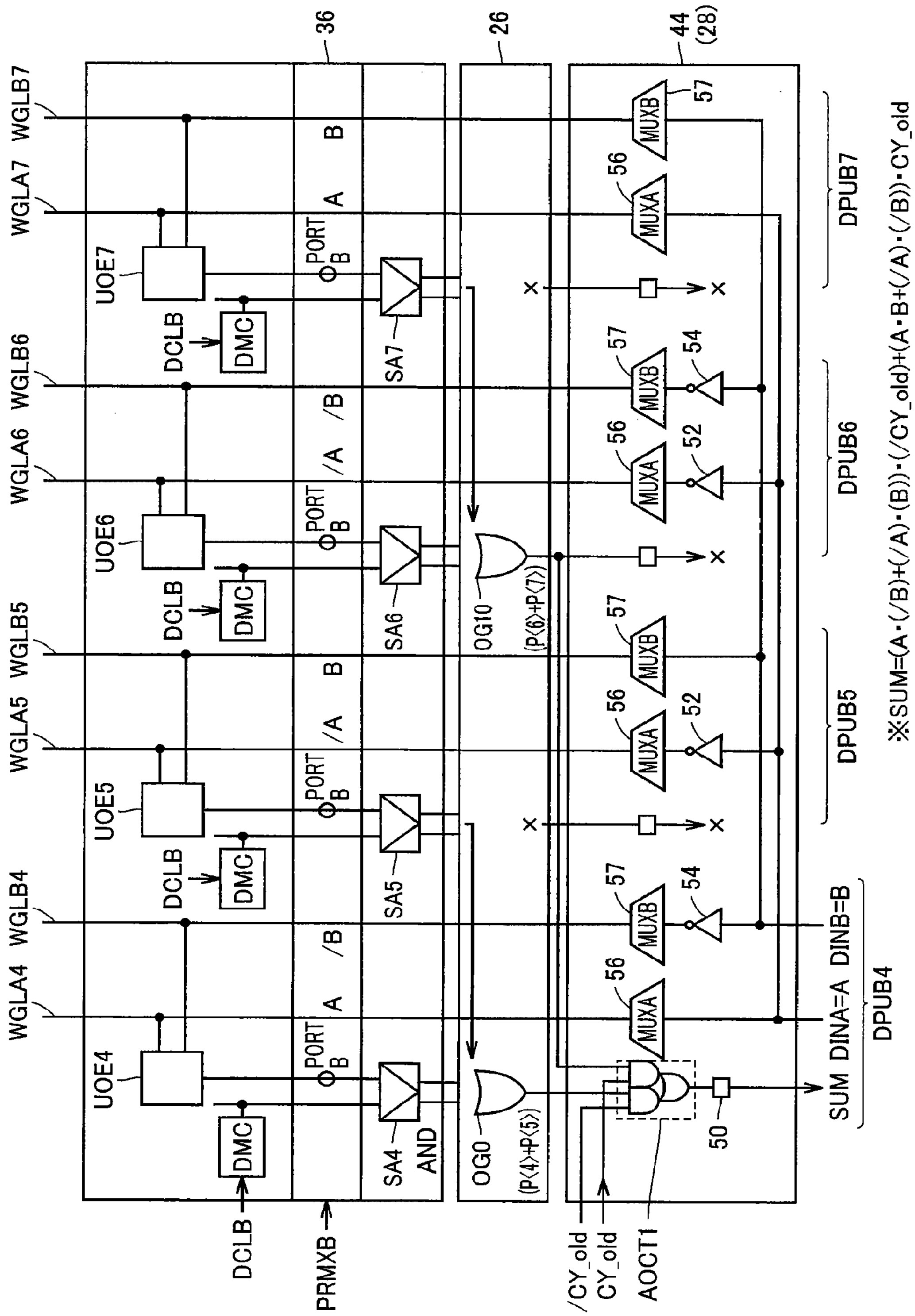
FIG. 50 schematically shows a configuration of a sum producing section in the semiconductor signal processing device according to the fourth embodiment of the present invention.

FIG. 50 schematically shows a configuration of a portion in which the one-bit addition is performed in the bit serial manner. The one-bit serial addition section corresponds to the sum producing unit that is arranged adjacent to the carry producing unit shown in FIG. 46. Accordingly, data path unit blocks DPUB4 to DPUB7 of the data path operation unit group are used as the data path operation unit group adjacent to the data path operation unit group constituting the carry producing unit.

In the operator cell array, dummy cell selection signal DCLB is applied to dummy cell DMC to select the series-connected dummy transistors. Similarly to the first embodiment, for unit operator cells UOE4 to UOE7, the read word lines and write word lines are sequentially selected to perform the data write and read to two storage nodes (SNA and SNB).

In data path unit block DPLTB4 of data path operation unit group 44, multiplexer (MUXA) 56 selects input data DINA (=A), and multiplexer (MUXB) 57 selects inverted value /B of input data DINB (=B). Inverted value /B is produced from inverter 54. Accordingly, data A and /B are transmitted to corresponding global write data lines WGLA4 and WGLB4 and stored in corresponding unit operator cell UOE4.

In data path unit block DPUB5, multiplexer 56 selects inverted value /A of input data A, and multiplexer 57 selects input data B. Inverted value /A is supplied from inverter 52. Accordingly, data /A and B are transmitted to corresponding global write data lines WGLA5 and WGLB5 and stored in corresponding unit operator cell UOE5.

In data path unit block DPUB6, multiplexers 56 and 57 select inverted values /A and /B of input data A and B, respectively, which are applied from inverters 52 and 54. Accordingly, data /A and /B are transmitted to corresponding global write data lines WGLA6 and WGLB6 and stored in corresponding unit operator cell UOE6.

In data path unit block DPUB7, multiplexers 56 and 57 select input data A and B. Accordingly, the data on corresponding global write data lines WGLA7 and WGLB7 are data A and B and are stored in corresponding unit operator cell UOE7.

In the data reading, in read port selection circuit 36, port B is selected and the read bit line (RBLB) of port B is selected. Accordingly, sense amplifiers SA4 to SA7 produce the AND operation result of two data stored in the corresponding unit operator cells, respectively. The output data of sense amplifiers SA4 to SA7 are transmitted through the main amplifiers (not shown) to combination logic operational circuit 26.

In combination logic operational circuit 26, two-input OR gates OG0 and OG10 are selected. Two-input OR gate OG0 produces the logical sum operational result of output signals P<4> and P<5> of the main amplifiers arranged for sense amplifiers SA4 and SA5. Two-input OR gate OG10 produces the logical sum operation result of output signals P<6> and P<7> of the main amplifiers provided for sense amplifiers SA6 and SA7. The output bits of two-input OR gates OG0 and OG10 and intermediate carries CY_old and /CY_old produced in the preceding cycle from the corresponding carry producing unit are applied to AND/OR composite gate AOCT1 arranged in the data path, and the output data of AND/OR composite gate AOCT1 is supplied through register 50 and the buffer (not shown). The output from buffer (51) is equal to sum SUM, and sum SUM is expressed by the following equation.

$$SUM=(A\cdot(/B)+(/A)\cdot(B))\cdot(/CY\_old)+(A\cdot B+(/A)\cdot(/B))\cdot CY\_old$$

Referring to the logical value table of sum SUM shown in FIG. 26, in the case of input carry CY_old being "1", sum SUM becomes "1" when one of data A·B and /A·/B is "1". In the case of input carry CY_old being "0", sum SUM becomes "1" when the logical values of data A and B are not matched with each other. Because one of data A·/B and /A·B becomes "1" when the data A and B are not matched with each other, the value satisfying the logical relationship for sum SUM shown in FIG. 26 is produced from buffer (51).

As described above, in the case where the one-bit serial addition is performed, the operational processing is performed with the carry produced by the carry producing unit being used as the input carry, which allows sum SUM to be produced as in the XOR operation (or XNOR operation).

In the case where the data bit is written and read, a time delay until decision of carry bit CY is caused because carry bit CY produced in the preceding cycle is used as input carry bit CY_old. However, if carry bit CY is made definite in a half clock cycle, the addition processing can be performed in the pipeline manner in the bit serial manner with the time delay of the half clock cycle.

The four unit operator cells are used to produce carry CY, and the four unit operator cells are used to produce sum SUM. Accordingly, 128 pairs of data can concurrently be processed when the entry has the bit width of 1024 bits, and 128 data words can be processed in 2·m cycles when the data word has the bit width of m bit (one clock cycle is required to perform each of the data writing and reading). In the case where m-bit addition is performed in one clock cycle with an m-bit adder of a usual hardware, 128 clock cycles are required to process the 128 data. In the fourth embodiment, when the data has the bit width of 32 bits, the addition processing can be performed at higher speed. The number of sets of data processed in parallel can be increased by increasing the bit width of the entry, and the addition processing can be performed at higher speed.

(Configuration of Bit Serial Subtracter)

Figure 51:
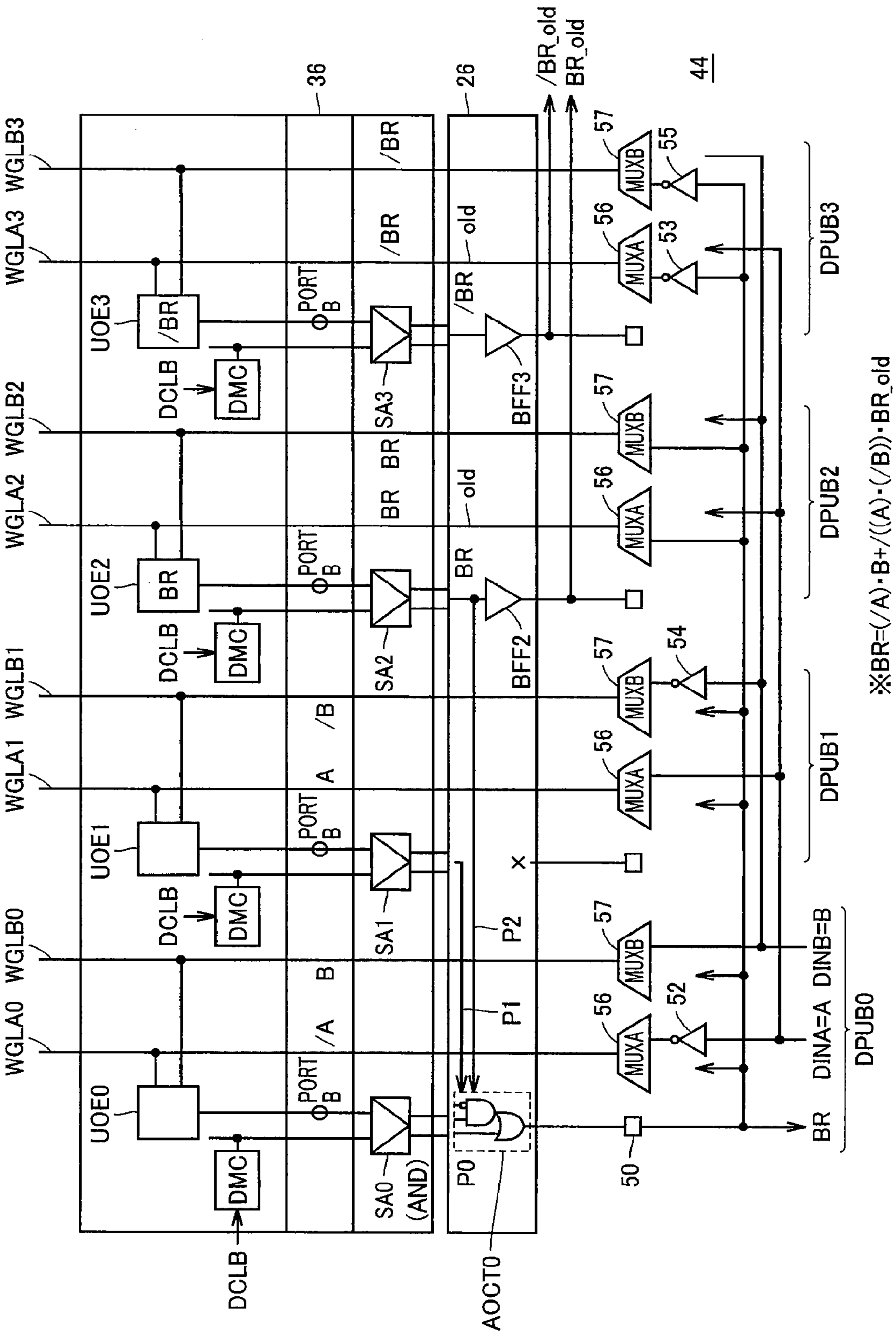
FIG. 51 schematically shows a configuration of a borrow producing section in the semiconductor signal processing device according to the fourth embodiment of the present invention.

FIG. 51 specifically shows a configuration of a portion in which a borrow BR of the bit serial subtracter according to the fourth embodiment of the present invention is produced. Referring to FIG. 51, in the borrow producing section, data path unit blocks DPUB0 to DPUB3 included in data path operation unit group 44 are also used in data path 28. In the operator cell array, unit operator cells UOE0 to UOE3 are arranged for data path unit blocks DPUB0 to DPUB3. The configuration of unit operator cells UOE0 to UOE3 are similar to that of the first embodiment, and the data writing and reading are performed to unit operator cells UOE0 to UOE3 as in first embodiment. Dummy cell selection signal DCLB is applied to dummy cell DMC, and port B is selected in read port selection circuit 36. Output data of corresponding sense amplifiers SA0 to SA3 are the AND operation results for unit operator cells UOE0 to UOE3 .

In data path unit block DPUB0, multiplexer (MUXA) 56 selects inverted value /A supplied from inverter 52 receiving input data DINA (=A), and multiplexer (MUXB) 57 selects input data DINB (=B). Accordingly, data /A and B are transmitted to corresponding global write data lines WGLA0 and WGLB0 and stored in corresponding unit operator cell UOE0.

In data path unit block DPUB1, multiplexer 56 selects input data A, and multiplexer 57 selects inverted value /B of input data B supplied from inverter 54. Accordingly, data A and /B are transmitted to corresponding global write data lines WGLA1 and WGLB1 and are stored in corresponding unit operator cell UOE1.

In data path unit block DPUB2, multiplexers 56 and 57 select the data transmitted from register 50. Because register 50 transfers borrow BR in the preceding cycle, borrows BR (=BR_old) and BR are transmitted to corresponding global write data lines WGLA2 and WGLB2 and stored in corresponding unit operator cell UOE2.

In data path unit block DPUB3, multiplexers 56 and 57 select the inverted value, supplied from inverters 53 and 55, of the value stored in corresponding registers 50. Accordingly, inverted values /BR (=BR_old) and /BR of borrow BR are transmitted to corresponding global write data lines WGLA3 and WGLB3 and stored in corresponding unit operator cell UOE3.

In combination logic operational circuit 26, AND/OR composite gate AOCT0 is selected and buffers BFF2 and BFF3 are selected. In AND/OR composite gate AOCT0, output bit P<1> of the main amplifier that is provided for sense amplifier SA1 is applied to a negative input of the AND gate, and output bit P<2> of the main amplifier that is provided for sense amplifier SA2 is applied to a non-inverting input of the AND gate. The logical sum operation is performed on the output bit of the AND gate and output bit P<0> of the main amplifier that is provided for sense amplifier SA0. Accordingly, the data supplied from composite gate AOCT0 through register 50 is expressed as follows:

$$(/A\cdot B)+/((A)\cdot(/B))\cdot BR\_old$$

As can be seen from the logical value relationship of output borrow BRout shown in FIG. 34, in the case of input borrow BRin (=BR_old) being “0”, output borrow BR (=BRout) becomes “1” when data /A·B is “1”. In the case of input borrow BR_old being “1”, output borrow BR becomes “0” when data A is “1” while data B is “0”, and output borrow BR (BRout) becomes “1” in the other cases.

Accordingly, data BR supplied from register 50 shown in FIG. 51 satisfies the logical value relationship of the borrow shown in FIG. 34. In one-bit serial subtraction, the output borrow (intermediate borrow) can correctly be produced in each cycle with borrow BR produced in the previous cycle, that is, the borrow that is produced for the one-bit low-order operation being used as input borrow BR_old.

Borrows BR·BR=BR and /BR·/BR=/BR from buffers BFF2 and BFF3 are transmitted as the borrow of the preceding cycle, that is, input borrows BR_old and /BR_old to adjacent data path operation unit group constituting the subtracter.

(Configuration of One-Bit Serial Subtracter)

Figure 52:
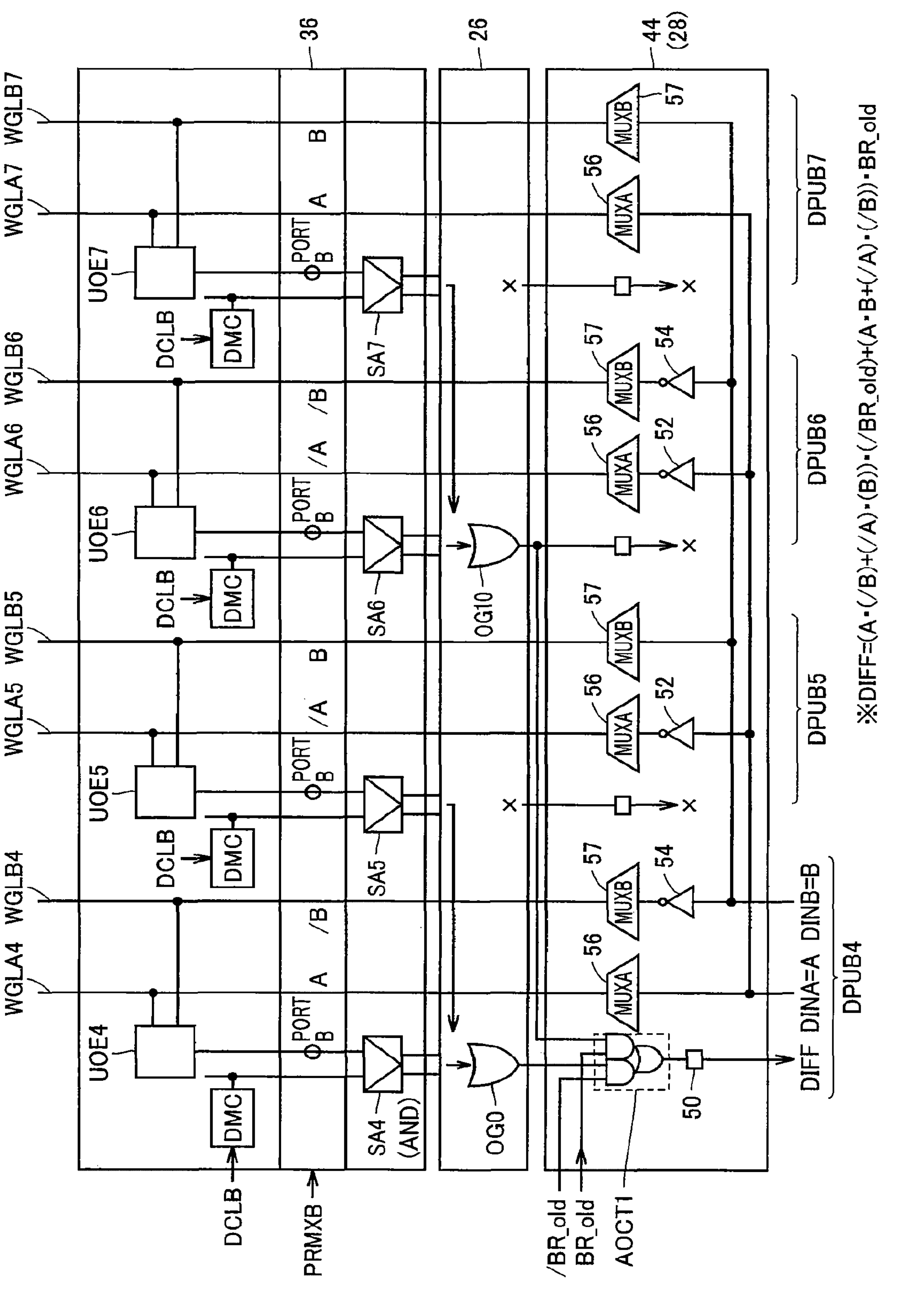
FIG. 52 schematically shows a configuration of a subtraction value producing section in the semiconductor signal processing device according to the fourth embodiment of the present invention.

FIG. 52 schematically shows a configuration of a one-bit serial subtracter. The one-bit serial subtracter is disposed adjacent to the one-bit serial borrow producing unit shown in FIG. 51. Accordingly, in data path 28, data path unit blocks DPUB4 to DPUB7 included in adjacent data path operation unit group 44 are used for the one-bit serial subtraction. Dummy cell selection signal DCLB is applied to dummy cell DMC to select two series-connected dummy transistors. In read port selection circuit 36, port B is selected to connect read bit lines (RBLB) of port B to corresponding sense amplifiers SA4 to SA7.

The configurations of unit operator cells UOE4 to UOE7 are similar to those of the first embodiment, the data on the corresponding global write data lines are written in parallel in two storage nodes (SNA and SNB), and the data stored in series-connected storage nodes SNA and SNB are read. Accordingly, in performing the subtraction, the output signal of each sense amplifier is the AND operation result of the data stored in the corresponding unit operator cell.

In data path unit block DPUB4 of data path operation unit block 44, multiplexer (MUXA) 56 selects input data DINA (=A), and multiplexer (MUXB) 57 selects inverted value /B of input data DINB (=B), supplied from inverter 54. Accordingly, data A and /B are transmitted to corresponding global write data lines WGLA4 and WGLB4 and stored in corresponding unit operator cell UOE4.

In data path unit block DPUB5, multiplexer 56 selects inverted value /A of input data A supplied from inverter 52, and multiplexer 57 selects input data B. Accordingly, data /A and B are transmitted to corresponding global write data lines WGLA5 and WGLB5 and stored in corresponding unit operator cell UOE5.

In data path unit block DPUB6, multiplexers 56 and 57 select inverted values /A and /B of input data A and B, which are supplied from inverters 52 and 54, respectively. Accordingly, data /A and /B are transmitted to corresponding global write data lines WGLA6 and WGLB6 and stored in corresponding unit operator cell UOE6.

In data path unit block DPUB7, multiplexers 56 and 57 select input data A and B, and data A and B are transmitted to corresponding global write data lines WGLA7 and WGLA7 and stored in corresponding unit operator cell UOE7.

In combination logic operational circuit 28, two-input OR gates OG0 and OG10 are selected. Two-input OR gate OG0 receives the output signals of the main amplifiers arranged for sense amplifiers SA4 and SA5. Two-input OR gate OG10 receives the output signals of the main amplifiers arranged for sense amplifiers SA6 and SA7.

The output signals of sense amplifiers SA4 to SA7 indicate the AND operation result of the values stored in corresponding unit operator cells UOE4 to UOE7, and two-input OR gate OG0 produces data (A·/B)+(/A·B), and two-input OR gate OG10 produces data (/A·/B)+(A·B).

In the reading path of the data path, AND/OR composite gate AOCT1 is selected and the output signals of two-input OR gates OG0 and OG10 are applied to AND/OR composite gate AOCT1. AND/OR composite gate AOCT1 receives input borrows BR_old and /BR_old corresponding to bits P<2> and P<3> from the borrow producing section shown in FIG. 51. Accordingly, AND/OR composite gate AOCT1 produces the data represented by the following expression through register 50 and buffer (51):

$$(A\cdot(/B)+(/A)\cdot(B))\cdot/BR\_old+((A\cdot B)+(/A)\cdot(/B)\cdot BR\_old.$$

Referring to the logical value table of subtraction value DIFF shown in FIG. 31, in the case of input borrow BRin (=BR_old) being “0”, subtraction value DIFF becomes “1” when one of data /A·B and A·/B is “1”. In the case of input borrow BR_old being “0”, the first term of the above-shown expression satisfies the relationship in which subtraction value DIFF becomes “1” when data A and B are not matched with each other.

In the case of input borrow BRin (=BR_old) being “1”, as is clear from the logical value table shown in FIG. 31, subtraction value DIFF becomes “1” when one of data /A·/B and A·B is “1”. That is, subtraction value DIFF becomes “1” when data A and B are equal to each other. This is satisfied by the second term of the above-shown expression. Therefore, subtraction value DIFF satisfying the logical value table of the subtraction values shown in FIG. 31 can be produced in each clock cycle through the use of the one-bit serial subtracter shown in FIG. 52.

In performing the subtraction in the one-bit serial manner, borrow BR_old produced in the preceding cycle is transferred with delay by one clock cycle through the unit operator cell, so that the subtraction processing can be performed with the borrow produced in the preceding cycle being used as input borrow.

In performing the bit serial addition/subtraction, the input carry is set at “0” when the operation is performed on the least significant bit. This is implemented by resetting the value stored in register 50 to “0”. Although the time until the borrow is made definite is required, the subtraction processing can be performed in the pipeline manner in the bit serial fashion as in the addition.

In the fourth embodiment, the addition and subtraction can be performed in the bit serial manner. In the case where one entry includes 512 bit line pairs, the addition and subtraction can be performed in the bit serial manner and in data parallel for 64 data. When the data has the bit width of 32 bits, the addition and subtraction can be performed on the set of 64 data in 32 clock cycles. Accordingly, the processing time can be greatly shortened compared with the 64 clock cycles that is necessary for sequentially performing the addition processing and subtraction processing on the set of data to in data serial and in bit parallel. It is only necessary to internally write and read the data in and from the unit operator cells, so that the addition and subtraction can be implemented at high speed.

(Modification)

Figure 53:
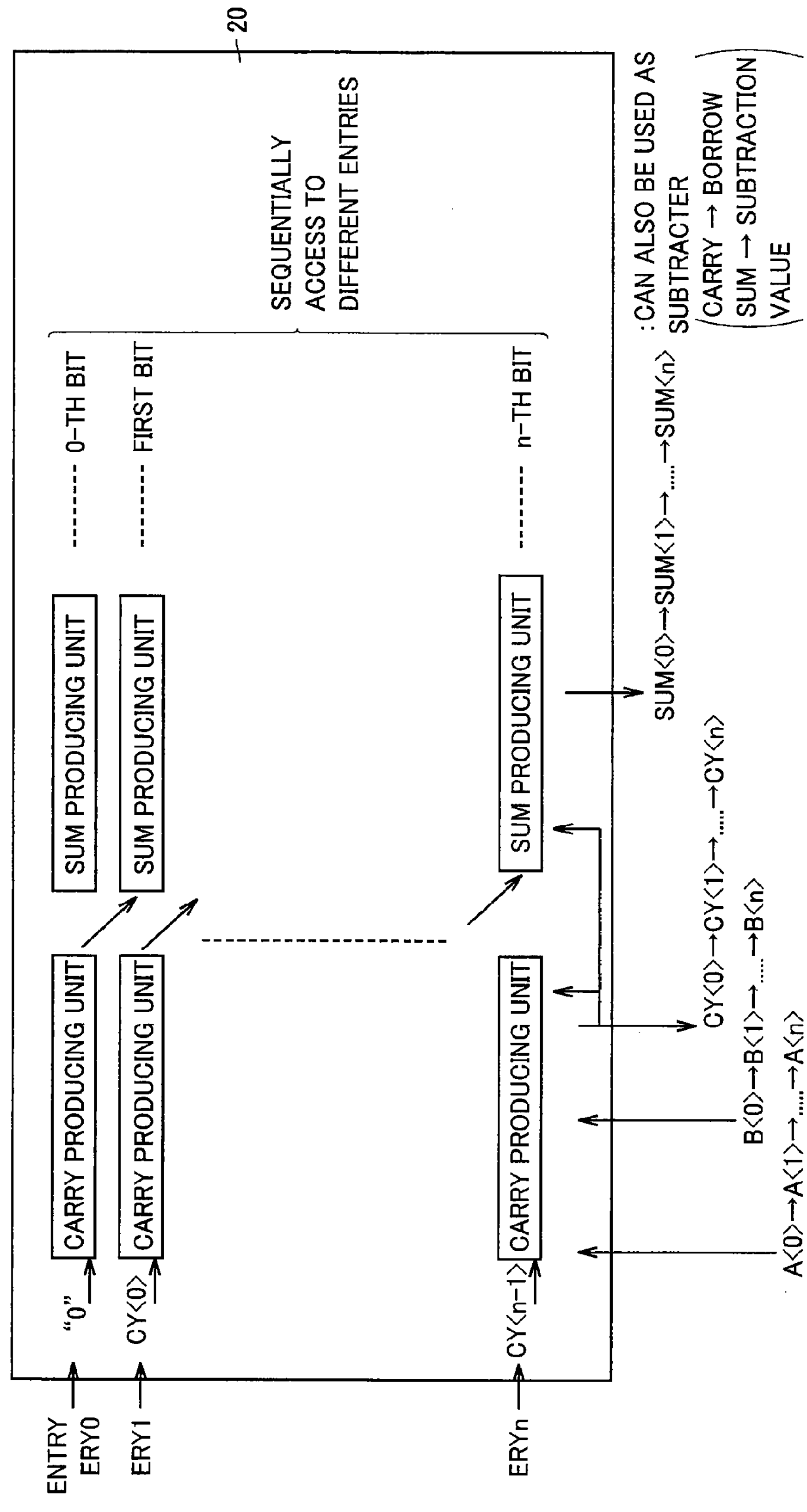
FIG. 53 schematically shows a configuration of a modification of the fourth embodiment of the present invention.

FIG. 53 schematically shows a configuration of a main part in a modification of the fourth embodiment of the present invention. The configuration of operator cell array 20 is schematically shown in FIG. 53. In operator cell array 20, the carry producing unit and the sum producing unit are provided in each of a plurality of entries ERY0 to ERYn. The carry producing unit includes four unit operator cells for producing the carry, and the sum producing unit includes four unit operator cells for producing the sum.

The combination logic operational circuit and the data path (not shown) are arranged outside operator cell array 20. The configurations of the data path and combination logic operational circuit are identical to those shown in FIGS. 47 and 48.

In performing the bit serial addition, the connections of the data propagation routes of the data path and the combination logic operational circuit are established as the manner shown in FIGS. 49 and 50 for the carry producing unit and the sum producing unit. In performing the serial addition, register 50 is reset, input carry is set at "0", and least significant bits A<0> and B<0> are written in entry ERY0 and then read therefrom. Thus, first sum SUM<0> and carry CY<0> are produced.

In the data path, the carry (input carry) stored in the carry producing register is written in next entry ERY1 along with next upper data bits A<1> and B<1> and then read therefrom. Then the bit serial addition described with reference to FIGS. 49 and 50 are sequentially performed using different entries.

Therefore, the one-bit addition can be performed at high speed in the bit serial manner. The malfunction or defect caused by the continuous use of the local region can be avoided because the regions used for the operation are disposed being dispersed in the operator cell array.

It is merely required to arrange the carry producing unit and the sum producing unit in the operator cell array in correspondence to the sets of data. Entries ERY0 to ERYn may be arranged being dispersed over the different operator cell subarray blocks.

In the configuration shown in FIG. 53, with the carry producing unit and the sum producing unit be replaced with the borrow producing unit and the subtraction value producing unit respectively, the subtracter can be implemented in the bit slice manner.

The entire configuration of the semiconductor signal processing device according to the fourth embodiment and configuration of the control circuit can be formed similar to that of the first embodiment.

According to the fourth embodiment of the present invention, the data propagation routes of the operator cell array, combination logic operational circuit and data path are switched to perform the bit slice operation, and the addition processing and subtraction processing is internally performed to perform the high-speed bit slice operational processing, so that the bit slice operation cycle can be largely reduced. In the case where the bit width of the operation target data is changed, it is merely required to change the operation cycle according to the data bit width. Thus, the semiconductor signal processing device according to the fourth embodiment can deal with a plurality of kinds of data bit widths without changing the internal configuration.

[Fifth Embodiment]

Figure 54:
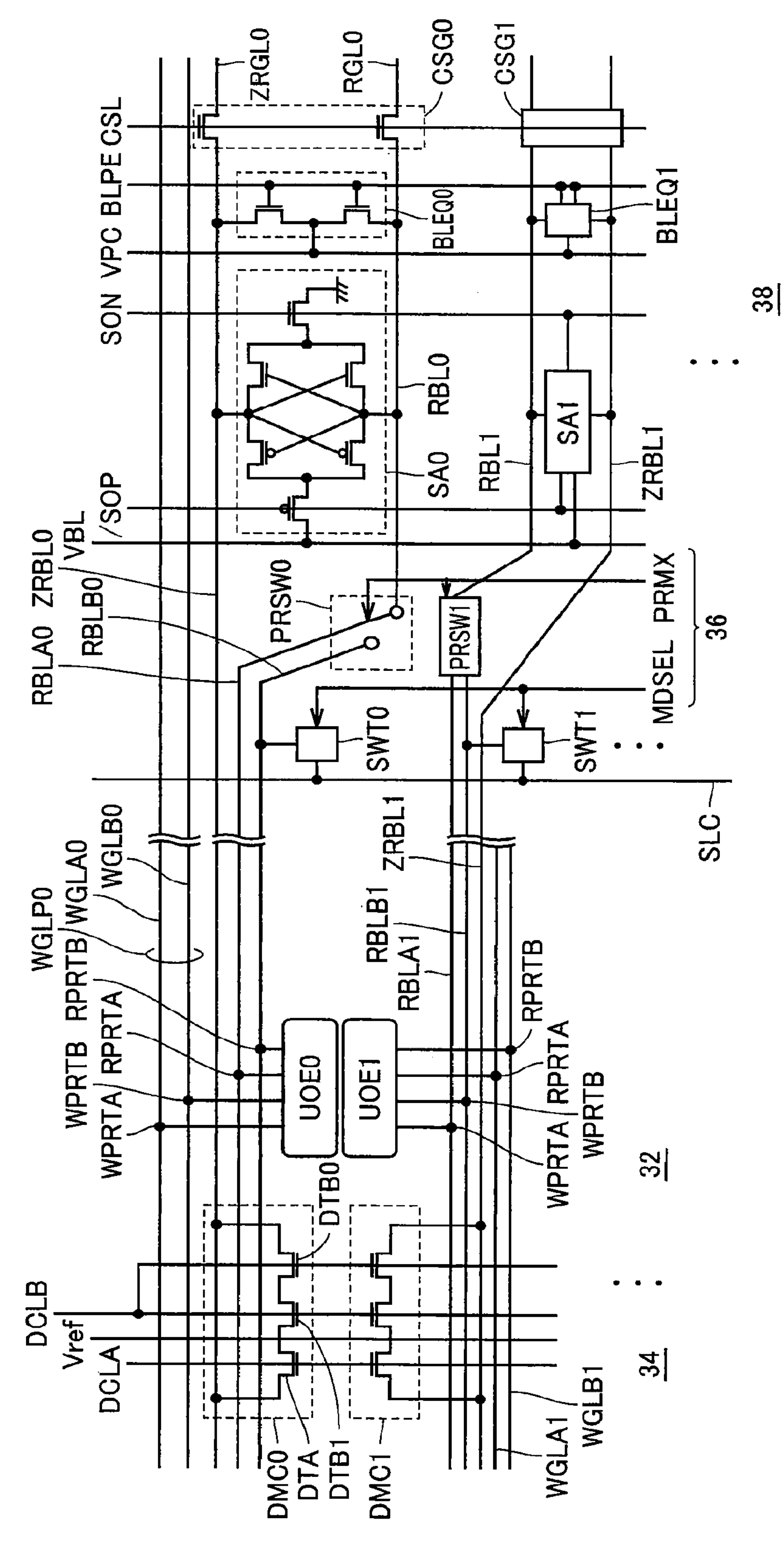
FIG. 54 schematically shows a configuration of a main part of a semiconductor signal processing device according to a fifth embodiment of the present invention.

FIG. 54 schematically shows a configuration of a main portion of a semiconductor signal processing device according to a fifth embodiment of the present invention. A subarray block of the semiconductor signal processing device shown in FIG. 54 differs from that of semiconductor signal processing device shown in FIG. 6 in that a common source line SLC is provided independently of source lines SL for unit operator cells UOE0, UOE1, . . . . Common source line SLC is shown being commonly arranged for bit line pairs in a direction orthogonal to the bit lines in FIG. 54. However, the source line SL that is individually arranged for each column may be used as common source line SLC because source lines SL are arranged in parallel with the read word lines.

For common source line SLC, switching circuits SWT0, SWT1, . . . are provided corresponding to B-port read bit lines RBLB0 and RBLB1, respectively. Switching circuits SWT0, SWT1, . . . selectively connect corresponding B-port read bit lines RBLB0 and RBLB1 to common source line SLC in response to a mode setting signal MDSEL. In this operation, in response to port selection signal PRMX, port connection circuits PRSW0 and PRSW1 connect A-port bit lines RBLA0, RBLA1, to read bit lines RBL0, RBL1, . . . for corresponding sense amplifiers SA0, SA1, . . . .

In FIG. 54, because other configuration of semiconductor signal processing device is similar to that of the semiconductor signal processing device shown in FIG. 6, corresponding components to those in the semiconductor signal processing device shown in FIG. 6 are designated by the same reference numerals, and the detailed description is not repeated.

Figure 55:
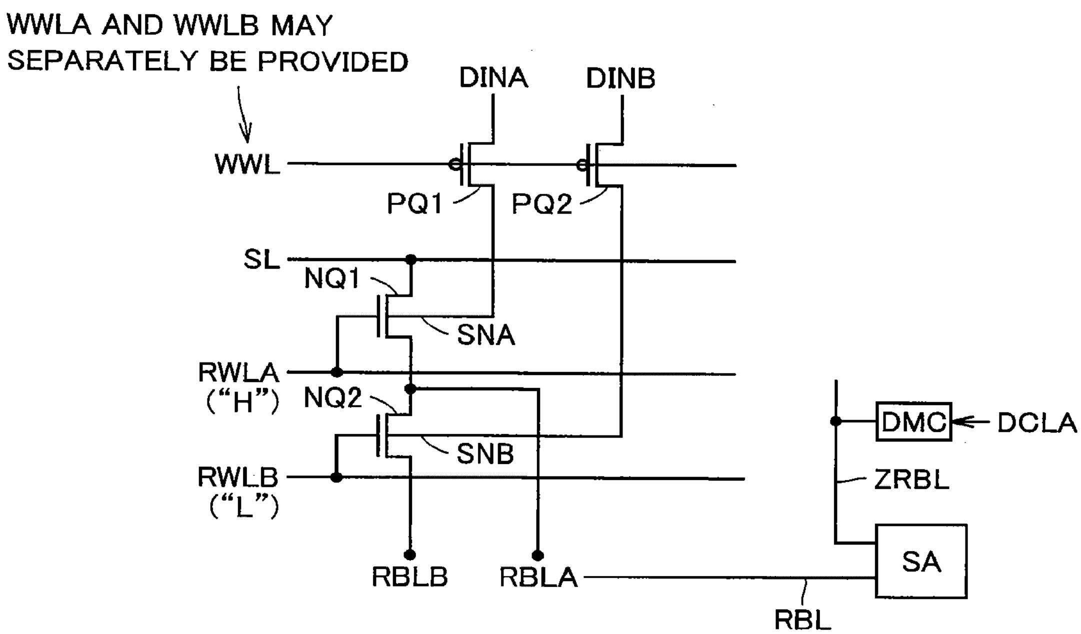
FIG. 55 schematically shows a configuration of a unit operator cell of FIG. 54.

FIG. 55 shows a connection manner of switching circuit SWT (SWT0 and SWT1) and the port selection circuit shown in FIG. 54. In the arrangement shown in FIG. 55, in the data read, read word line RWLA is driven to the selected state (H level), while read word line RWLB is maintained in the non-selected state of the L level. A-port read bit line RBLA is connected to sense read bit line RBL through port selection circuit PRSW (PRSW0 and PRSW1). Dummy cell selection signal DCLA is applied to dummy cell DMC connected to complementary read bit line ZRBL. Accordingly, in dummy cell DMC, one dummy transistor (DTA) is set into the conductive state.

In the voltage applying manner shown in FIG. 55, a current flows to sense read bit line RBL from source line SL through SOI transistor NQ1 according to the storage data. Similarly, a reference current flows to complementary read bit line ZRBL from dummy cell DMC. Accordingly, the data corresponding to the data stored in storage node SNA can be obtained by sense amplifier SA, and the NOT operational result of the data stored in the body region (storage node SNA) of SOI transistor NQ1 can be read outside by selecting the inverter in the combination logic operational circuit.

Here, the connection manner between B-port read bit line RBLB and the common source line is arbitrary in FIG. 55. B-port read word line RWLB is in the non-selected state, and therefore, SOI transistor NQ2 exerts no adverse influence on reading the data stored in storage node SNA.

Figure 56:
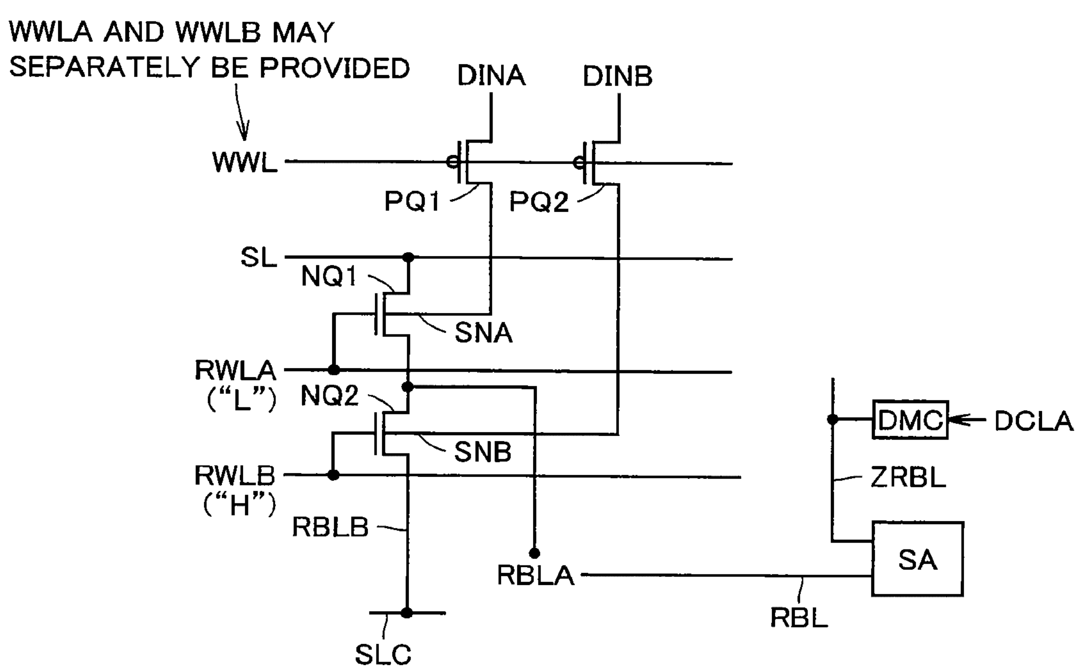
FIG. 56 schematically shows another connection manner during read of the unit operator cell of FIG. 54.

FIG. 56 schematically shows another voltage applying manner in the arrangement shown in FIG. 54. In the voltage applying manner shown in FIG. 56, similarly to the configuration shown in FIG. 55, A-port read bit line RBLA is connected to sense read bit line RBL. Dummy cell selection signal DCLA is applied to dummy cell DMC, and one dummy transistor (DTA) is selected in dummy cell DMC.

A-port read word line RWLA is maintained in the L level of the non-selected state, while B-port read word line RWLB is driven to the H level of the selected state. B-port read bit line RBLB is connected to common source line SLC through switching circuit (SWT). A voltage at the same level is applied to common source line SLC and to source line SL. Accordingly, in the voltage applying manner shown in FIG. 56, SOI transistor NQ2 transmits the current corresponding to the data stored in storage node NSB to sense read bit line RBL from common source line SLC through A-port read bit line RBLA, so that the data stored in storage node SNB can be read by sense amplifier SA.

As shown in FIGS. 55 and 56, in writing data, the data can be written in storage nodes SNA and SNB through SOI transistors PQ1 and PQ2 by setting write word line WWL at the selected state (L level). In reading data, one of read word lines RWLA and RWLB are set at the selected state and the other is set at the non-selected state, which allows the data stored in storage nodes SNA and SNB to be selectively read onto A port. Accordingly, the unit operator cell can equivalently behave as two-port memory cell having the separate write and read ports.

In FIGS. 55 and 56, the signal potential at write word line WWL is commonly applied to SOI transistors PQ1 and PQ2. Alternatively, similarly to the third embodiment, write word lines WWLA and WWLB may separately be provided for SOI transistors PQ1 and PQ2.

Figure 57:
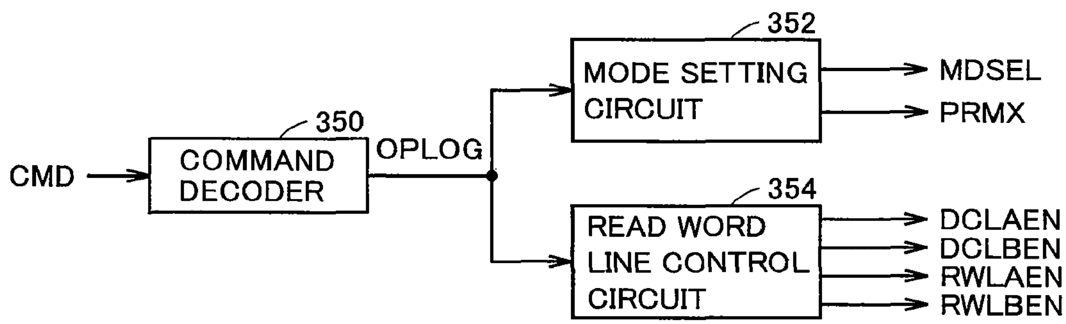
FIG. 57 schematically shows an example of a configuration of a control circuit in the semiconductor signal processing device according to the fifth embodiment of the present invention.

FIG. 57 schematically shows a configuration of a main portion of the control circuit in the semiconductor signal processing device according to the fifth embodiment of the present invention. Referring to FIG. 57, control circuit (30) includes a command decoder 350 that decodes external command CMD, a mode setting circuit 352 that sets the connection between a read bit line and a sense amplifier, and a read word line control circuit 354 that selectively activates a read word line.

Mode setting circuit 352 sets mode setting signal MDSEL and port selection signal PRMX at the specified state according to operational processing instruction OPLOG applied from command decoder 350. That is, in the case where operation manipulation instruction OPLOG instructs execution of the one-bit read, mode setting circuit 352 sets port selection signal PRMX at the state of connecting port A, that is, read bit line RBLA to the sense amplifier. Mode setting circuit 352 sets mode setting signal MDSEL at the mode of connecting common source line SLC and B-port bit line RBLB with each other.

In the case where operational processing instruction OPLOG instructs a normal operational processing, mode setting circuit 352 sets port selection signal PRMX according to the specified operational processing such that one of port A and port B is connected to the sense amplifier, and mode setting circuit 352 maintains mode selection signal MDSEL in the non-selected state (B port is selected during the operational processing except for the NOT operation).

Read word line control circuit 354 produces dummy cell selection enable signals DCLAEN and DCLBEN and read word line enable signals RWLAEN and RWLBEN according to operational processing instruction OPLOG. In the case where one-bit data read is specified according to processing contents instructed by operational processing instruction OPLOG, read word line control circuit 354 activates dummy cell selection enable signal DCLAEN to maintain dummy cell selection enable signal DCLBEN in the inactive state. Read word line control circuit 354 drives one of read word line enable signals RWLAEN and RWLBEN to the selected state according to port indication information included in operational processing instruction OPLOG. Therefore, one-bit read mode is specified, and the connection manner can be set when operational processing instruction OPLOG instructs the mode in which each bit of each two-bit information included in the unit operator cells is read to the outside. In the one-bit read mode, the combination logic circuit and the data path perform inversion or non-inversion processing on the output signal of the sense amplifier and output the inverted or non-inverted signal.

In the case where a normal operational processing is performed, according to operational contents specified by operational processing instruction OPLOG, read word line control circuit 354 activates read word line enable signal RWLAEN and read word line enable signals RWLAEN and RWLBEN and selectively activates dummy cell selection enable signals DCLAEN and DCLBEN. Therefore, in performing a combination logic operation or an arithmetic operation, B port can be selected to perform the operation of the two data stored in the unit operator cell.

The entire configuration of the semiconductor signal processing device according to the fifth embodiment is similar to that of the first embodiment shown in FIG. 4, and the configurations of the combination logic operational circuit and data path are similar to those of the above-described embodiments.

According to the fifth embodiment of the present invention, data of the storage nodes of the SOI transistors constituting the unit operator cell are individually read out, so that the semiconductor signal processing device can be used as a memory device, in addition to the combination logic operation and arithmetic operation functions.

[Sixth Embodiment]

Figure 58:
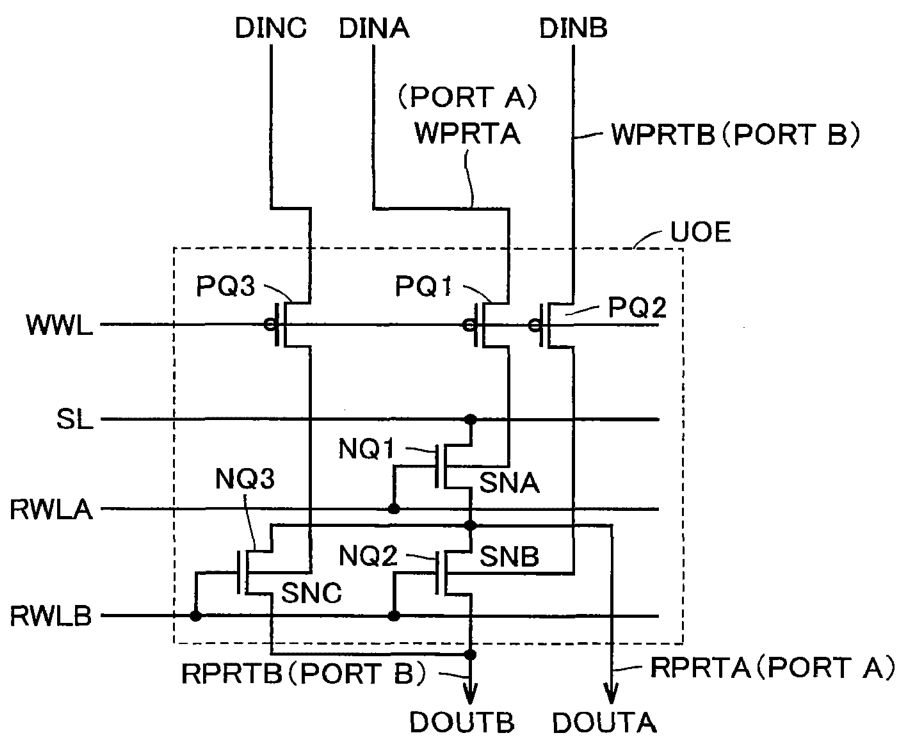
FIG. 58 schematically shows an electrically equivalent circuit of a unit operator cell in a semiconductor signal processing device according to a sixth embodiment of the present invention.

FIG. 58 shows an electrically equivalent circuit of a unit operator cell in a semiconductor signal processing device according to a sixth embodiment of the present invention. Unit operator cell UOE shown in FIG. 58 differs from the unit operator cell shown in FIG. 1 in that an N-channel SOI transistor NQ3 is provided in parallel with SOI transistor NQ2 between SOI transistor NQ1 and read port RPRTB (port B). A P-channel SOI transistor PQ3 is also provided to transmit write data DINC to storage node (body region) SNC of SOI transistor NQ3 according to the signal potential on write word line WWL.

Other configuration of the unit operator cell shown in FIG. 58 is similar to that of the unit operator cell shown in FIG. 1, corresponding parts to those in the unit operator cell shown in FIG. 58 are designated by the same reference numerals, and the detailed description is not repeated.

In the configuration of the unit operator cell shown in FIG. 58, SOI transistors NQ2 and NQ3 are connected in parallel, and a current is supplied to read port RPRTB (port B) according to the OR operation result of the data stored in SOI transistors NQ2 and NQ3. Accordingly, the operation of A·(B+C) can be implemented by three SOI transistors NQ1 to NQ3.

Figure 59:
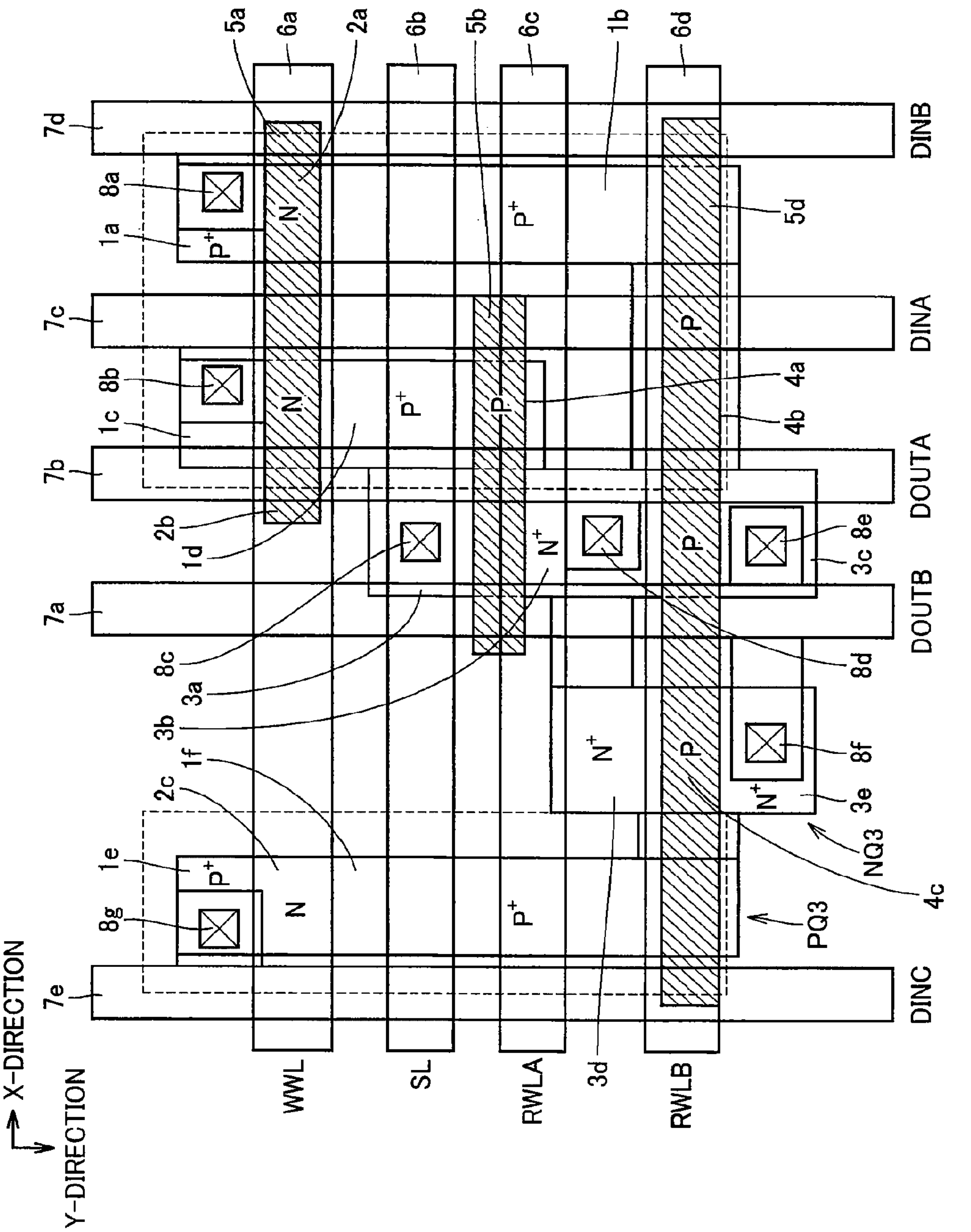
FIG. 59 schematically shows a planar layout of the unit operator cell of FIG. 58.

FIG. 59 schematically shows a planar layout of the unit operator cell shown in FIG. 58. The planar layout shown in FIG. 59 differs from the planar layout shown in FIG. 2 in that high-concentration P-type regions 1*e* and 1*f* are arranged along the Y-direction in the P-type transistor forming region shown by a broken-line block on the left side shown in FIG. 59 in order to form SOI transistor PQ3. An N-type region 2*c* is provided between P-type regions 1*e* and 1*f*.

Outside the P-type transistor forming region, high-concentration N-type regions 3*d* and 3*e* are arranged in alignment along the Y-direction, and a P-type region 4*c* is arranged between N-type regions 3*d* and 3*e*. P-type region 4*c* is electrically connected to P-type region 1*f*. N-type region 3*d* is electrically connected to N-type region 3*b* through the N-type region extending in the X-direction, and is electrically connected to first metal interconnection line 7*b* through an intermediate interconnect and a contact/via 8*d*.

N-type region 3*e* is electrically connected to first metal interconnection line 7*a* through a contact/via 8*f* and an intermediate interconnect. P-type region 1*e* is electrically connected through a contact/via 8*g* and an intermediate interconnect to a first metal interconnection line 7*e* that continuously extends in the Y-direction. SOI transistor PQ3 is formed by P-type regions 1*e* and if and N-type region 2*c*, and SOI transistor NQ3 is formed by N-type regions 3*d* and 3*e* and P-type region 4*c*. A source/drain node of SOI transistor PQ3 is connected to the body region (P-type region 4*c*) of SOI transistor NQ3 by P-type regions 1*f* and 4*c*. Input data DINC is transmitted through first layer metal interconnection line 7*e*.

In FIG. 59, the layout of SOI transistors PQ1, PQ2, NQ1, and NQ2 is similar to that of the unit operator cell shown in FIG. 2, corresponding parts to those of the unit operator cell shown in FIG. 2 are designated by the same reference numeral, and the detailed description is not repeated.

Figure 60:
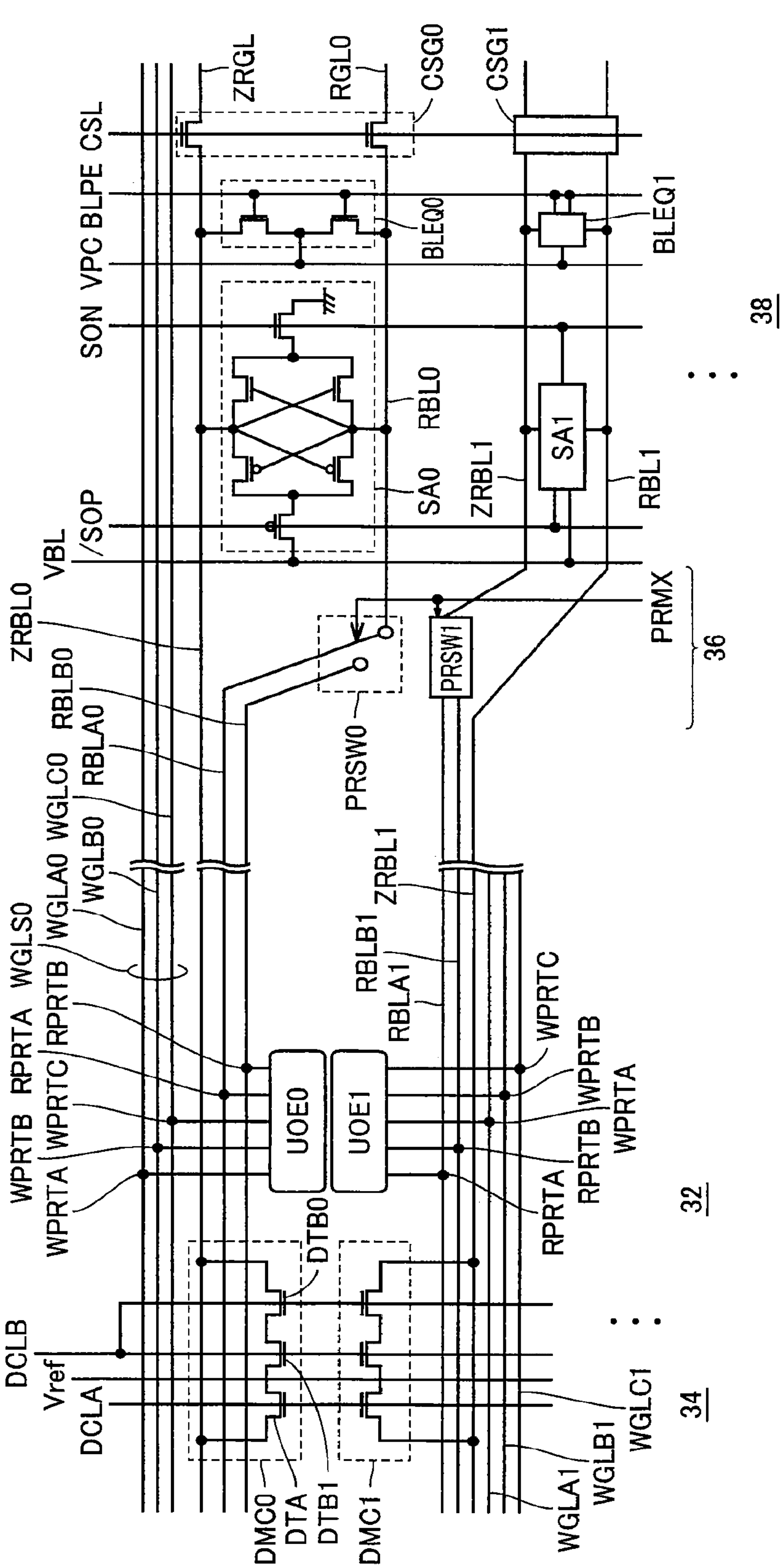
FIG. 60 schematically shows a configuration of a unit operator sub-array block in the semiconductor signal processing device according to the sixth embodiment of the present invention.

FIG. 60 schematically shows a configuration of a memory cell array portion in the semiconductor signal processing device according to the sixth embodiment of the present invention. The configuration of the array portion shown in FIG. 60 differs from that of the memory cell array portion of the first embodiment shown in FIG. 6 in that global write data lines WGLC0, WGLC1, . . . are arranged as the write port in correspondence with the columns of unit operator cells UOE (UOE0, UOE1, . . . ). Global write data lines WGLC0, WGLC1, . . . are connected to SOI transistor PQ3 shown in FIG. 58 through write ports WPRTC of unit operator cells UOE (UOE0 and UOEI) of the corresponding columns. In FIG. 60, other configuration of the memory cell array portion is similar to that of the memory cell array portion shown in FIG. 6, and corresponding parts to those in the memory cell array portion shown in FIG. 6 are designated by the reference numerals, and the detailed description is not repeated.

As shown in FIG. 60, the global write data lines are arranged corresponding to the unit operator cell columns, and three data can concurrently be transferred through global write data line sets WGLC0, . . . . Here, a global write data line set WGLS means a set of global write data lines WGLA, WGLB, and WGLC.

Figure 61:
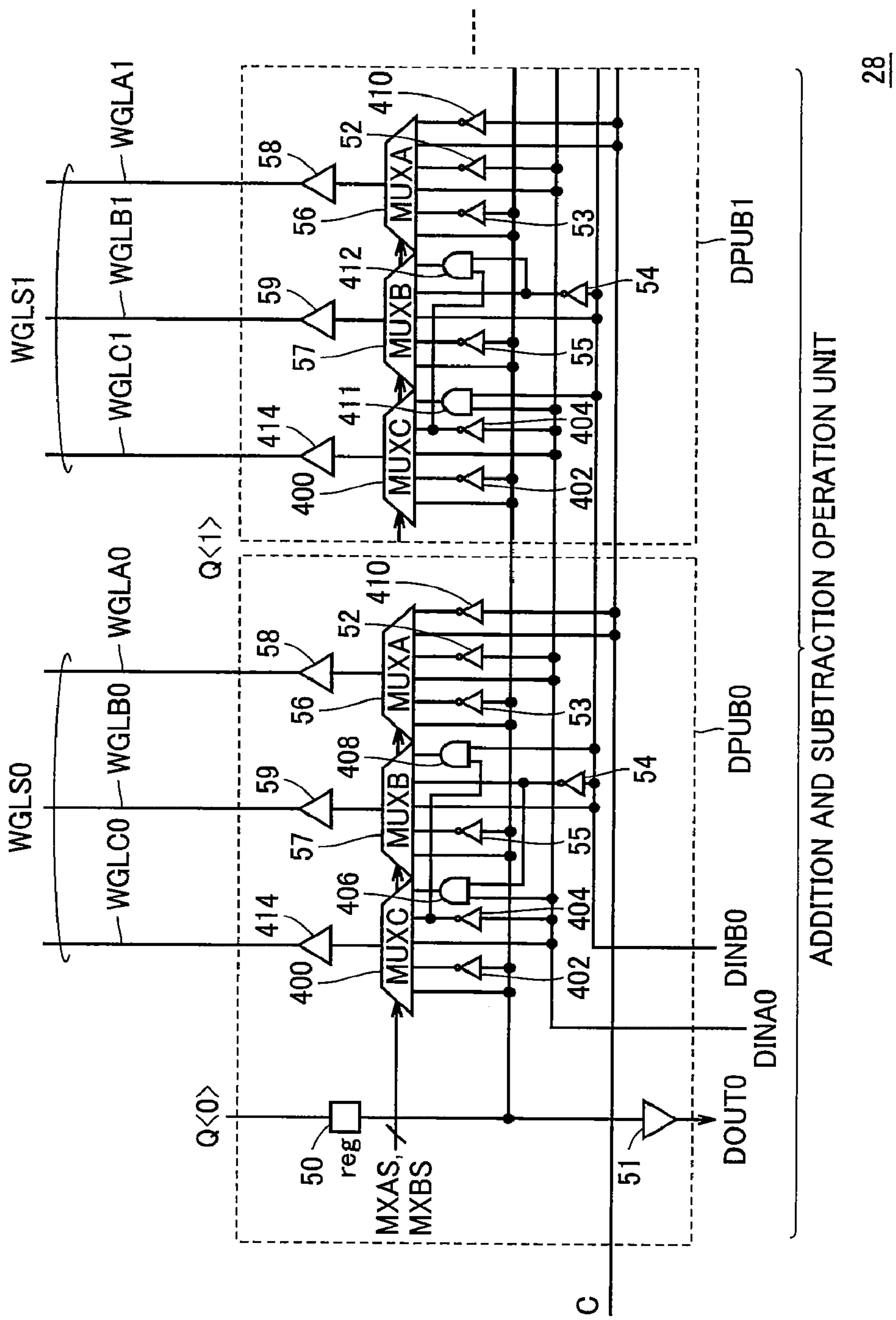
FIG. 61 schematically shows a configuration of a data path of the semiconductor signal processing device according to the sixth embodiment of the present invention.

FIG. 61 schematically shows a configuration of data path 28 of the semiconductor signal processing device according to the sixth embodiment of the present invention. In data path 28, two data path unit blocks DPUB0 and DPUB1 perform operational processing on one-bit data. In the sixth embodiment, a multiplexer (MUXC) 400 is provided in each data path unit block in order to process the three data. An inverter 402, an inverter 404, and an AND gate 406 are provided for multiplexer 400. Inverter 402 inverts the data supplied from register 50. Inverter 404 inverts external input data bit DINA<0>. AND gate 406 receives external data bit DINA<0> and inverted data bit /DINB<0> supplied from inverter 54. The signal selected by multiplexer 400 is transmitted to global write data line WGLC0 through a global write driver 414.

An AND gate 408 is provided for multiplexer 57 and receives the output signal of inverter 404 and external input data bit DINB<0>. An inverter 410 is provided for multiplexer 56 and inverts data C (corresponding to carry/borrow). The connection paths of multiplexers 56, 57, and 400 are set in accordance with switching control signals MXAS and MXBS. Other configuration of data path unit block BPUB0 is similar to that of data path unit block BPUB0 in the data path shown in FIG. 7, corresponding parts to those in data path unit block BPUB0 in the data path shown in FIG. 7 are designated by the same reference numeral, and the detailed description is not repeated.

The configuration similar to that of data path unit block DPUB0 is provided in data path unit block DPUB1, but register 50 is not provided in data path unit block DPUB1.

Data path unit blocks DPUB0 and DPUB1 produce internal write data to drive global write data line sets WGLS0 and WGLS1, and a specified operational processing is performed.

The configuration of the combination logic operational circuit is similar to that of the first embodiment (see FIG. 9), the configuration of the combination logic operational circuit is not repeatedly described.

Figure 62:
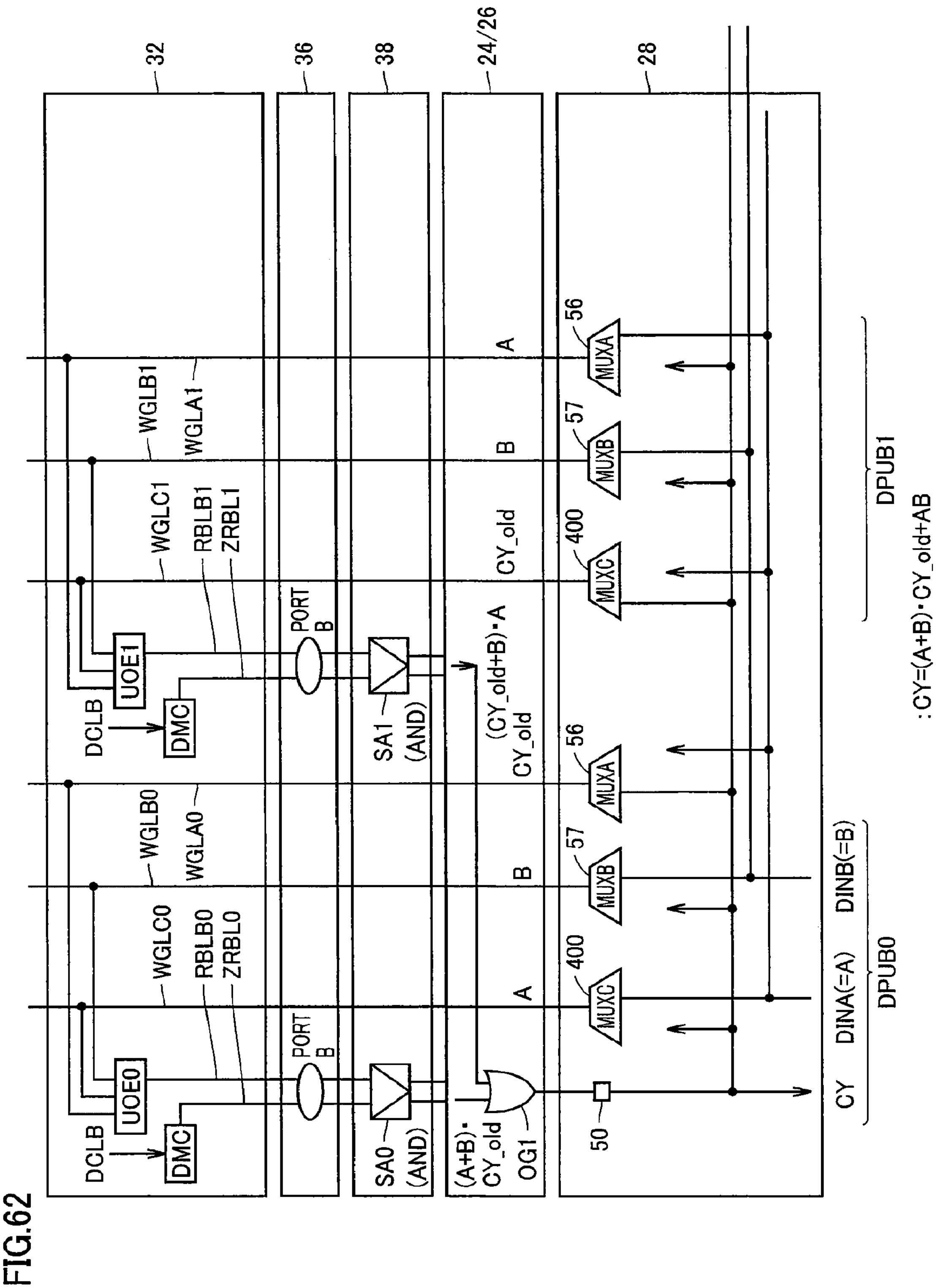
FIG. 62 schematically shows a configuration of a carry producing section in the semiconductor signal processing device according to the sixth embodiment of the present invention.

FIG. 62 schematically shows a connection manner of the data propagation route for producing the carry when the one-bit addition operation is performed in the semiconductor signal processing device according to the sixth embodiment of the present invention.

Referring to FIG. 62, two data path unit blocks DPUB0 and DPUB 1 are used in data path 28. In data path unit block DPUB0, multiplexer (MUXC) 400 selects input data DINA (=A), and multiplexer (MUXB) 57 selects input data DINB (=B). Multiplexer (MUXA) 56 selects output carry CY transmitted from register 50. Accordingly, the data A and B and carry CY_old are transmitted to corresponding global write data lines WGLC0, WGLB0 and WGLA0 and stored in storage nodes SNC, SNB and SNA of corresponding unit operator cell UOE0. In this operation, as in the fourth embodiment, carry CY_old is the carry produced in the operational processing of the preceding cycle, and carry CY_old corresponds to the input carry.

In data path unit block DPUB1, multiplexer 400 selects carry CY supplied from register 50, and multiplexer 57 selects input data DINB. Multiplexer 56 selects input data A. Accordingly, the data CY_old, B and A are transferred to corresponding global write data lines WGLC1, WGLB1 and WGLA1 and stored in storage nodes SNC, SNB, and SNA of corresponding unit operator cell UOE1.

In memory cell array 32, dummy cell selection signal DCLB is applied to dummy cell DMC, and two series-connected dummy cell transistors (DTB0 and DTB1) are connected to complementary read bit lines ZRBL0 and ZRBL1.

In read port selection circuit 36, port B is selected, and read bit lines RBLB0 and RBLB1 are connected to corresponding sense amplifiers SA0 and SA1 of sense amplifier band 38.

In combination logic operational circuit 26, there is selected two-input OR gate OG1 receiving the output signals of the main amplifiers provided for sense amplifiers SA0 and SA1 in main amplifier circuit 24. Sense amplifiers SA0 and SA1 produce operation results of (SNB+SNC)·SNA, respectively. Here, the storage node and the data stored therein are designated by the same reference symbol.

Accordingly, carry CY transmitted from two-input OR gate OG1 through register 50 is represented by (A+B)·CY_old+(CY_old+B)·A.

According to a formula of Boolean algebra, the above-described expression can be transformed into the following equation because of A+A=A:

$$CY=(A+B)\cdot CY\_\mathrm{old}+A\cdot B$$

As can be seen from the logical value table of carry CY shown in FIG. 29, output carry CY becomes “1” when data A·B is “1” or when one of data A and B is “1” while input carry CM (=CY_old) is “1”. Accordingly, the above-described equation satisfies the logical value relationship shown in FIG. 29, and carry CY can be obtained in one clock cycle in the addition of input data A and B by using the data propagation path shown in FIG. 62.

Figure 63:
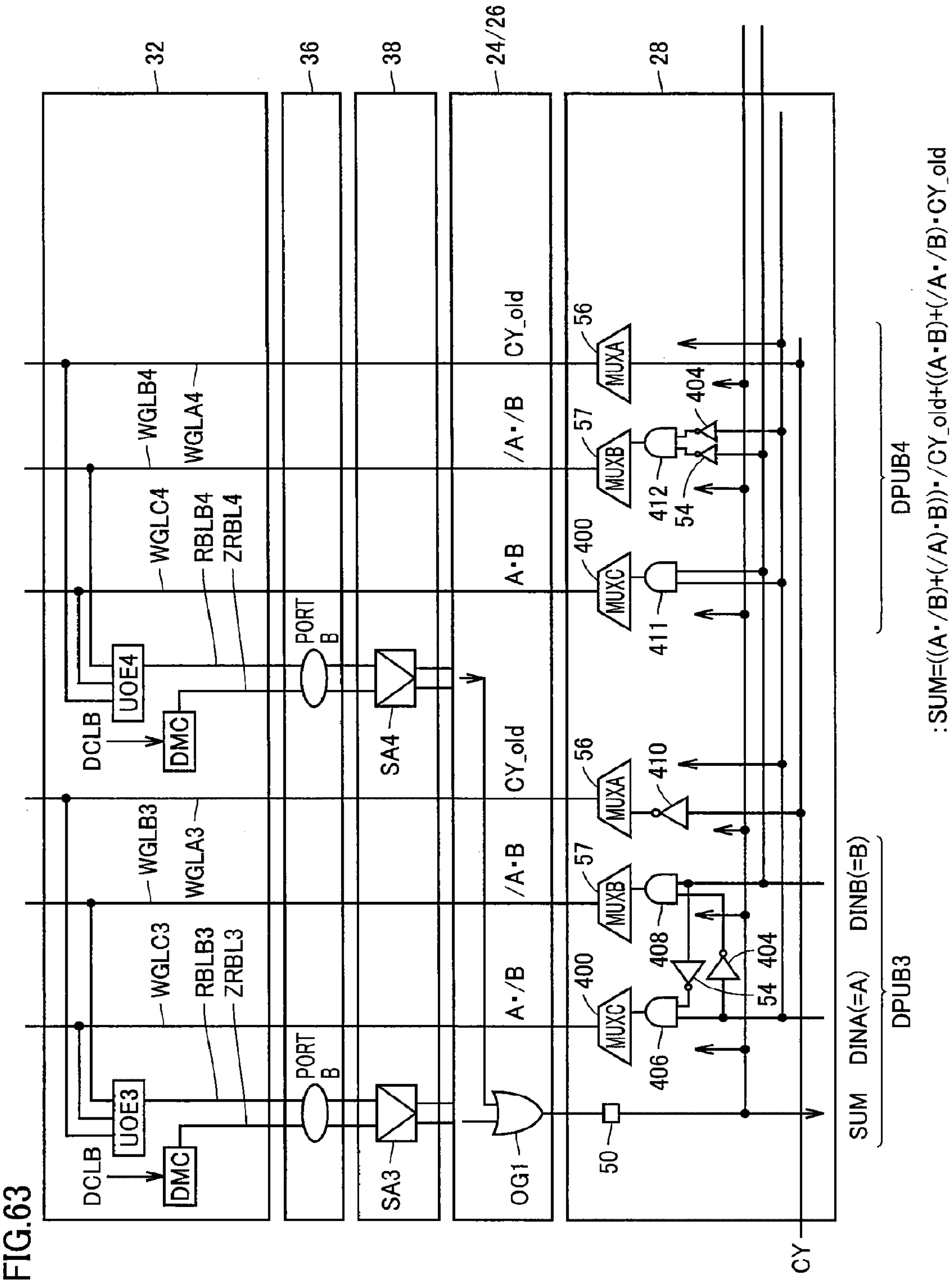
FIG. 63 schematically shows a configuration of a sum producing section in the semiconductor signal processing device according to the sixth embodiment of the present invention.

FIG. 63 schematically shows a connection manner of the data propagation route of the portion producing the sum (SUM) in the one-bit full adder in the semiconductor signal processing device according to the sixth embodiment of the present invention. Referring to FIG. 63, in the case where sum SUM is generated, similarly to the production of the carry, two data path unit blocks DPUB3 and DPUB4 are used in data path 28. Carry CY is transmitted as data C shown in FIG. 61 to data path unit blocks DPUB3 and DPUB4 from the adjacently arranged carry producing section.

In data path unit block DPUB3, multiplexer (MUXC) 400 selects the output signal of AND gate 406. AND gate 406 receives input data A and inverted value /B of input data B supplied from inverter 54. Multiplexer 57 receives the output signal of AND gate 408 receiving inverted value /A of input data A received from inverter 404 and input data B. Multiplexer (MUXA) 56 receives inverted value /CY of carry CY supplied from inverter 410. Accordingly, data A·/B, /A·B, and /CY_old are transmitted to global write data lines WGLC3, WGLB3, and WGLA3 and stored in storage nodes SNC, SNB, and SNA of unit operator cell UOE3.

In data path unit block DPUB4, multiplexer 400 selects the output signal of AND gate 411 receiving input data A and B. Multiplexer (MUXB) 57 selects the output signal of AND gate 412 receiving inverted value /B of input data B from inverter 54 and inverted value /CY of carry CY from inverter 404. Multiplexer (MUXA) 56 selects carry CY. Accordingly, data A·B, /A·B, and CY_old are transmitted to corresponding global write data lines WGLC4, WGLB4, and WGLA4 and stored in storage nodes SNC, SNB, and SNA of corresponding unit operator cell UOE4.

Similarly to the production of the carry, dummy cell selection signal DCLB is applied to dummy cell DMC. In read port selection circuit 36, port B is selected, and read bit lines RBLB3 and RBLB4 are connected to corresponding sense amplifiers SA3 and SA4 in sense amplifier band 38. Accordingly, sense amplifier SA3 produces data (A·/B+/A·B)·/CY_old according to the data stored in unit operator cell UOE3, and sense amplifier SA4 produces data (A·B+/A·/B)·CY_old.

Sense amplifiers SA3 and SA4 apply OR/AND operation results to two-input OR gate OG1 of combination logic operational circuit 26 through the corresponding main amplifiers included in main amplifier circuit 24. Data SUM supplied to the outside of the device through register 50 from two-input OR gate OG1 is expressed as follows:

$$SUM=((A\cdot/B)+(/A\cdot B))\cdot/CY\_old+((A\cdot B)+(/A\cdot/B))\cdot CY\_old$$

The above-described equation of sum SUM is identical to the equation of sum SUM shown in FIG. 50 produced by the one-bit adder, so that sum SUM can be produced in one clock cycle in the one-bit addition operation by using two data path unit blocks.

Using the configuration of the adder shown in FIGS. 60 to 63, the addition operation can be performed in the bit serial manner, and the addition result can be obtained in the number of clock cycles corresponding to the data bit width.

As shown in FIGS. 51 and 52, for the subtraction result, carry CY is replaced with borrow BRout, and input carry CY_old is replaced with input borrow BR_old, which allows the subtraction processing to be performed (however, it is necessary to replace data A with inverted value /A in the subtraction).

(Modification)

Figure 64:
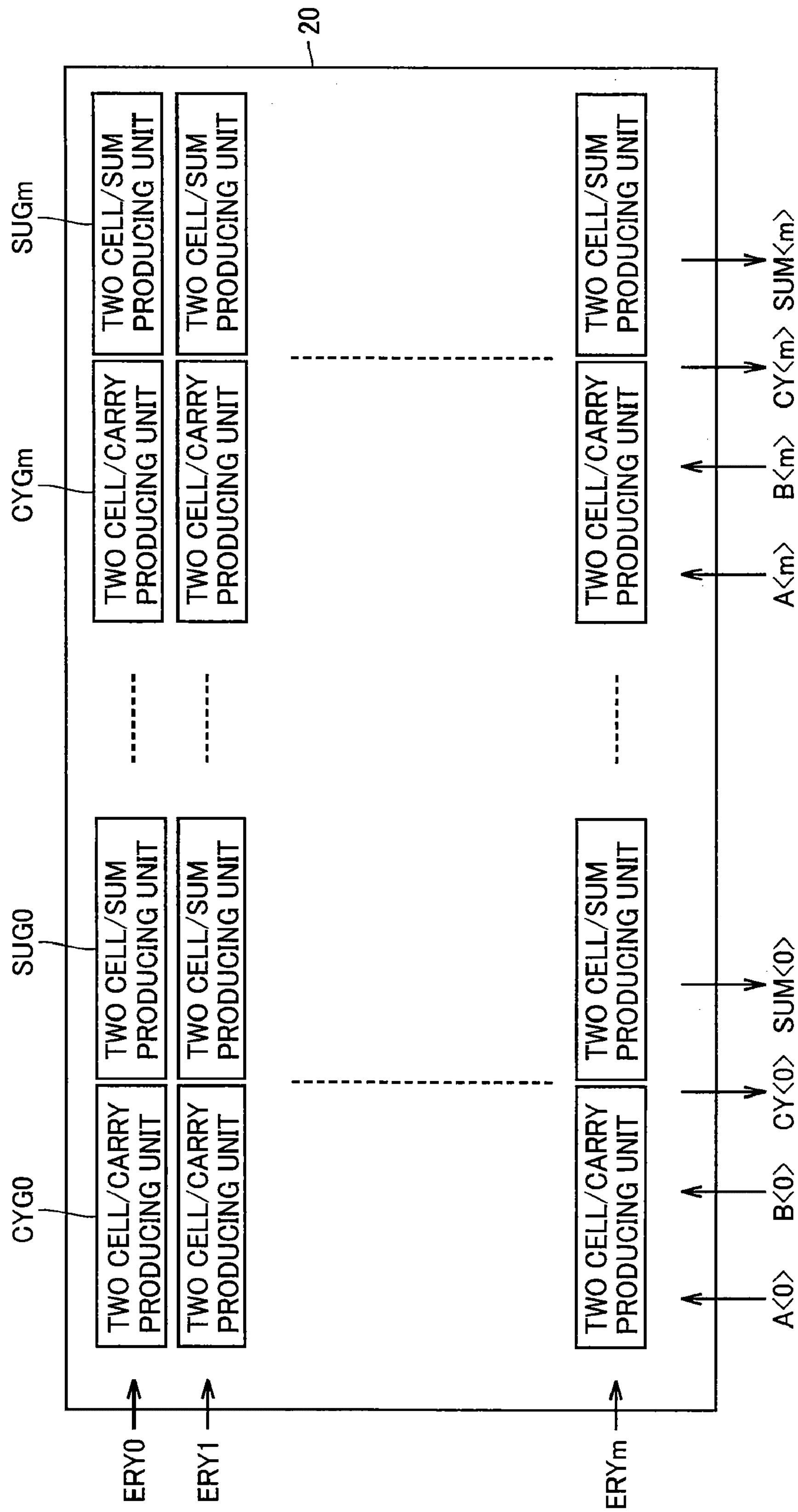
FIG. 64 schematically shows a configuration of a modification of the semiconductor signal processing device according to the sixth embodiment of the present invention.

FIG. 64 schematically shows a configuration of a main part of a modification in the semiconductor signal processing device according to the sixth embodiment of the present invention. Referring to FIG. 64, a plurality of entries ERY0 to ERYn are provided in operator cell array 20. Two-cell/carry producing units CYG0 to CYGm and two-cell/sum producing units SUG0 to SUGm are arranged in each of entries ERY0 to ERYn in pairs and in alignment. Each of two-cell/carry producing units CYG0 to CYGm includes two unit operator cells used to produce the carry (see FIG. 62). Each of two-cell/sum producing units SUG0 to SUGm includes two unit operator cells used to produce sum SUM. The full addition operation is performed on one-bit data A<i> and B<i> by two-cell/carry producing unit CYGi and two-cell/sum producing unit SUGi. Accordingly, the addition operation is performed in bit parallel in one entry.

The configurations of the read port selection circuit, sense amplifier band, and main amplifier circuit that are provided for operator cell array 20 are similar to those in the first embodiment, and the configuration of data path 28 is similar to that shown in FIG. 61. The configuration of combination logic operational circuit (26) is similar to that of the first embodiment, and two-input OR gate (OG1) is used in the combination logic operational circuit when the carry and sum are produced.

In the configuration shown in FIG. 64, the full addition processing is performed on (m+1)-bit data A and B having data bits A<0> to A<m> and B<0> to B<m>, respectively.

Figure 65:
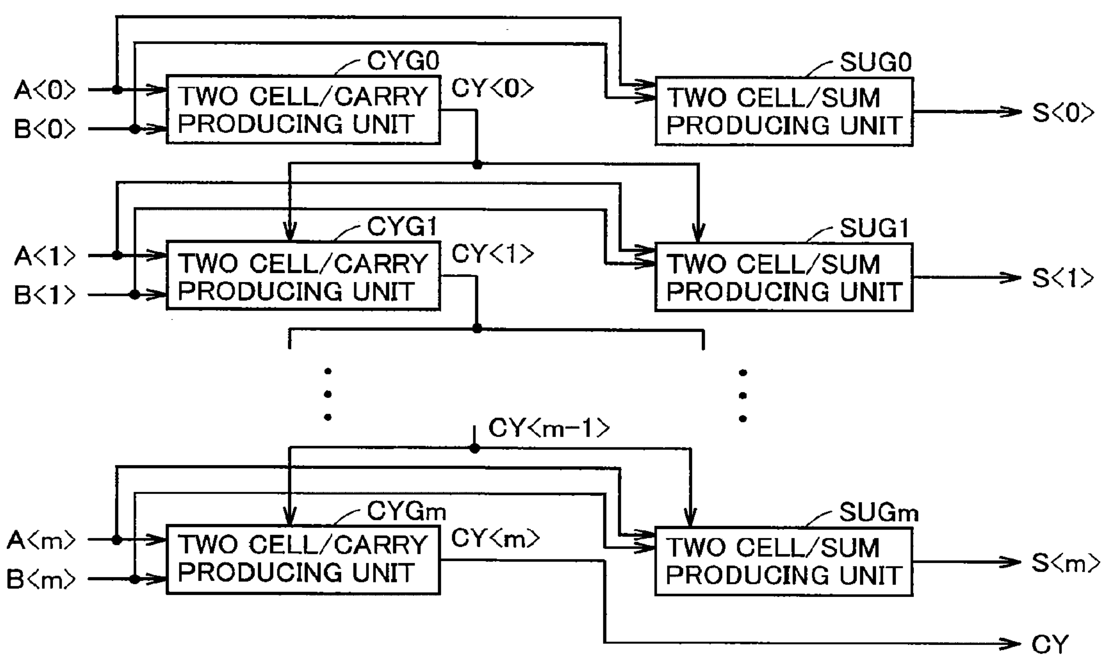
FIG. 65 schematically shows a specific connection manner of an arrangement of FIG. 64.

FIG. 65 schematically shows an arrangement of the two-cell/carry producing units and two-cell/sum producing units having the configuration of bit parallel addition in which the operator cell array shown in FIG. 64 is used. In the arrangement shown in FIG. 65, unit operation block (UCL) of the combination logic operational circuit and unit operation block (DPUB) of the data path are provided correspondingly in two-cell/carry producing units CYG0 to CYGm and two-cell/sum producing units SUG0 to SUGm. Referring to FIG. 65, carries CY<0> to CY<m−1> produced from two-cell/carry producing units CYG0 to CYGm are transmitted to upper two-cell/carry producing units CYG1 to CYGm. Two-cell/carry producing units CYG1 to CYGm each select the carry from the carry producing unit at the preceding stage, that is, one-bit lower-order side (produced by register 50) to produce a corresponding carry.

Similarly, carries CY<0> to CY<m−1> are applied together with input data A<0>, B<0> to A<m>, and B<m> to two-cell/sum producing units SUG1 to SUGm from two-cell/carry producing units CYG0 to CYG(m−1) at the one-bit lower-order sides. Sum bits S<0> to S<m> are produced from two-cell/sum producing units SUG0 to SUGm, and carry CY is supplied from final-stage two-cell/carry producing unit CYGm.

The input carry is set at "0" for two-cell/carry producing unit CYG0 and two-cell/sum producing unit SUG0 each at the least significant bit location.

Figure 66:
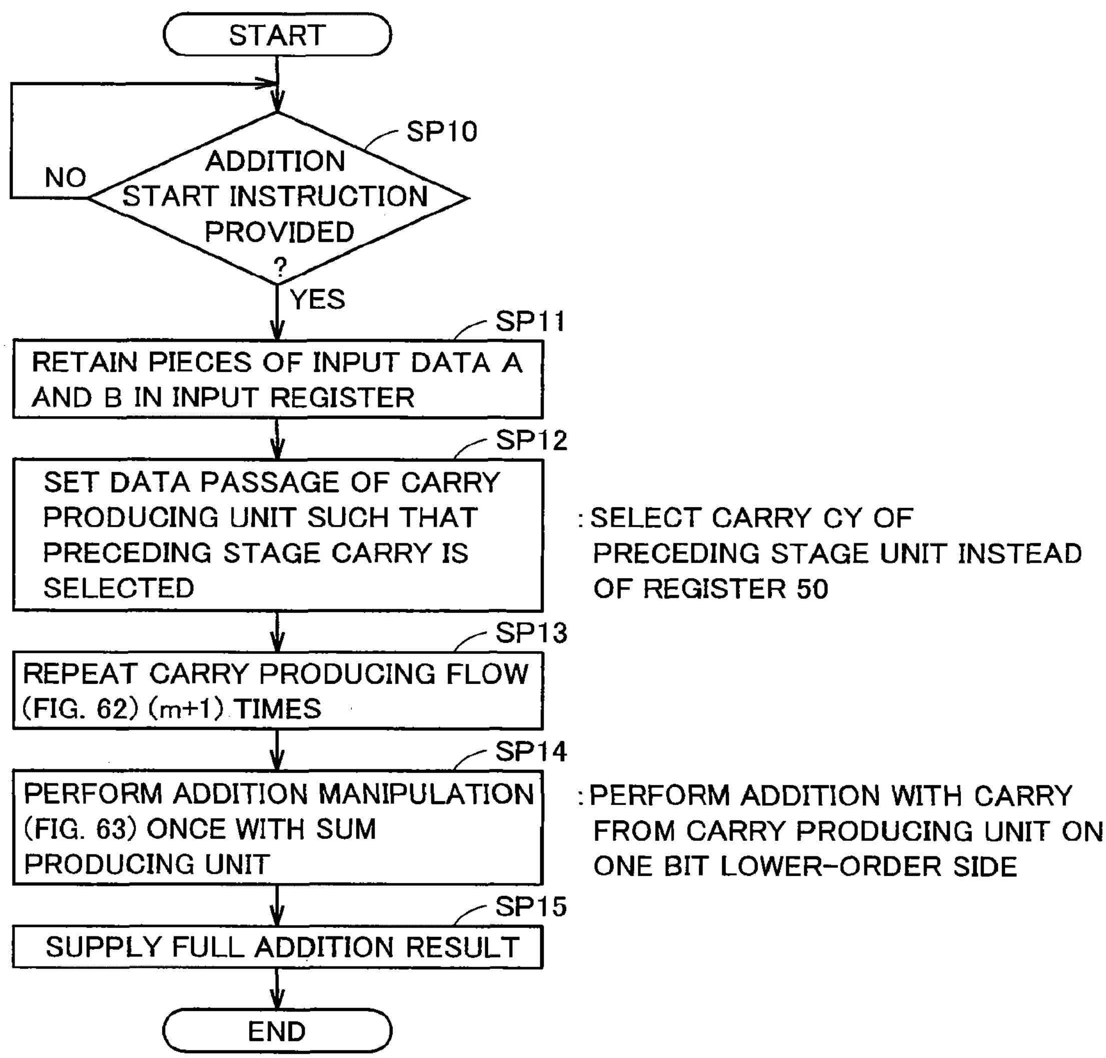
FIG. 66 is a flowchart showing an addition processing operation in the configurations of FIGS. 64 and 65.

FIG. 66 is a flowchart showing an addition operational processing of the bit parallel adder shown in FIGS. 64 and 65. Referring to FIG. 66, the operation of the bit parallel adder shown in FIGS. 64 and 65 will be described below.

When an addition start instruction is supplied (Step SP10), the control circuit retains input data A and B of the operation target in the input register (not shown) such that input data A and B are supplied in bit parallel to the data path as needed (Step SP11).

In the data path provided for two-cell/carry producing units CYG0 to CYGm, the path is set according to the addition start instruction such that the output carry from the preceding-stage (one-bit lower-order side) is selected (Step SP12). In the arrangement shown in FIG. 62, the carry that is produced by data path unit block (DPUB0) provided for the two-cell/carry producing unit at the preceding stage is selected as data C instead of the output of register 50. In the corresponding data path unit block, the data propagation paths shown in FIG. 62 are set as the internal write data propagation paths by setting the selecting manner of the multiplexers. In this operation, the operational processing is repeated (m+1) times with the data propagation paths shown in FIG. 62 (Step SP13).

In the addition operation, carry CY<0> of two-cell/carry producing unit CYG0 provided for the least significant bit is made definite according to input data bits A<0> and B<0>. In the next access cycle, two-cell/carry producing unit CYG1 produces corresponding carry CY<1> according to produced and decided carry CY<0> and data bits A<1> and B<1>. Carry CY<1> produced by two-cell/carry producing unit CYG1 is stored in the corresponding register. The carry sequentially becomes the definite state starting from the lower-order bit side. All carries CY<0> to CY<m> are set at the definite state by repeating the carry producing operation (m+1) times, and definite carries CY<0> to CY<m> are stored in corresponding registers (50).

After the carry producing manipulation is repeated (m+1) times, two-cell/sum producing units SUG0 to SUGm perform the sum producing processing according to the carries applied from the one-bit lower-order sides and input data bits A<0>, B<0> to A<m>, and B<m> (FIG. 63). During the addition operational processing, the data propagation paths shown in FIG. 63 are set in data path unit blocks DPUB3 and DPUB4 of the corresponding data paths, and the two-input OR gate is selected in the combination logic operational circuit.

In the addition operational processing, all the carries from the lower-order bit sides are definite, the one-bit addition is concurrently performed on bits A<0>, B<0> to A<m>, and B<m>, and sum bits S<0> to S<m> indicating the addition result are produced along with final carry CY (Step SP14). Then, the addition result is output (Step SP15).

The full addition can be performed on the (m+1)-bit data by repeating the addition operation (m+2) times to one entry. The value of sum bit SUM<i> is decided in each clock cycle for sum SUM from the lower-order bit side by concurrently operating sum producing units SUG and carry producing units CYG, highest-order sum bit SUM<m> can concurrently be produced in producing final carry CY, and the addition result can be obtained in (m+1) cycles Even if the bit parallel addition is performed in a unit of entry in the operator cell array, the bit parallel addition can be performed only by switching the data bus connection routes. The addition is performed while switching the entries, so that the localized access concentration can be avoided to prevent the malfunction.

In the configuration shown in FIGS. 64 and 65, the bit parallel subtracter can also be implemented by replacing the carry producing unit and the sum producing unit with the borrow producing unit and the subtraction value producing unit.

Thus, according to the sixth embodiment of the present invention, three storage transistors are arranged in one unit operator cell, the OR and AND composite operation can be performed on the storage data, and the addition and subtraction operational processing can be performed at high speed using the small number of unit operator cells.

[Seventh Embodiment]

Figure 67:
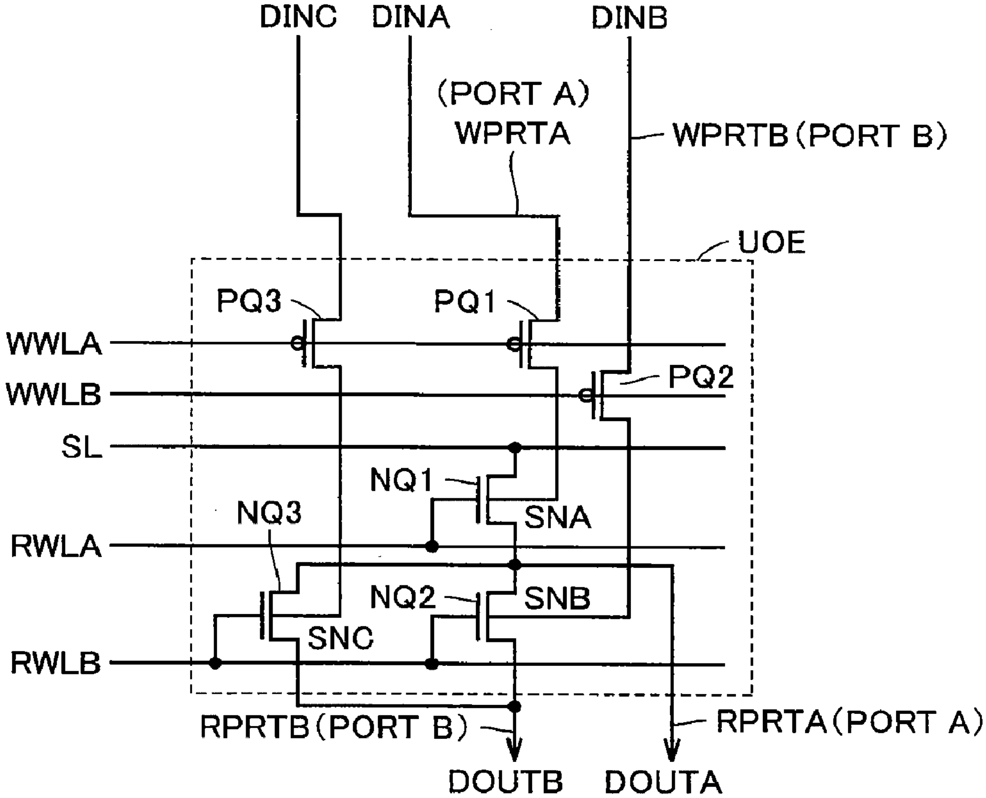
FIG. 67 shows a power supply equivalent circuit of a unit operator cell in a semiconductor signal processing device according to a seventh embodiment of the present invention.

FIG. 67 shows an electrically equivalent circuit of a unit operator cell in a semiconductor signal processing device according to a seventh embodiment of the present invention. The unit operator cell shown in FIG. 67 differs from the unit operator cell shown in FIG. 58 of the sixth embodiment in that SOI transistor PQ2 is driven to the selected state according to write word line WWLB while SOI transistors PQ1 and PQ3 are driven to the selected state in response to the signal on write word line WWLA. In FIG. 67, other configuration of the unit operator cell is similar to that of the unit operator cell shown in FIG. 59, c corresponding parts to those in the unit operator cell shown in FIG. 59 are designated by the same reference numerals, and the detailed description is not repeated.

Figure 68:
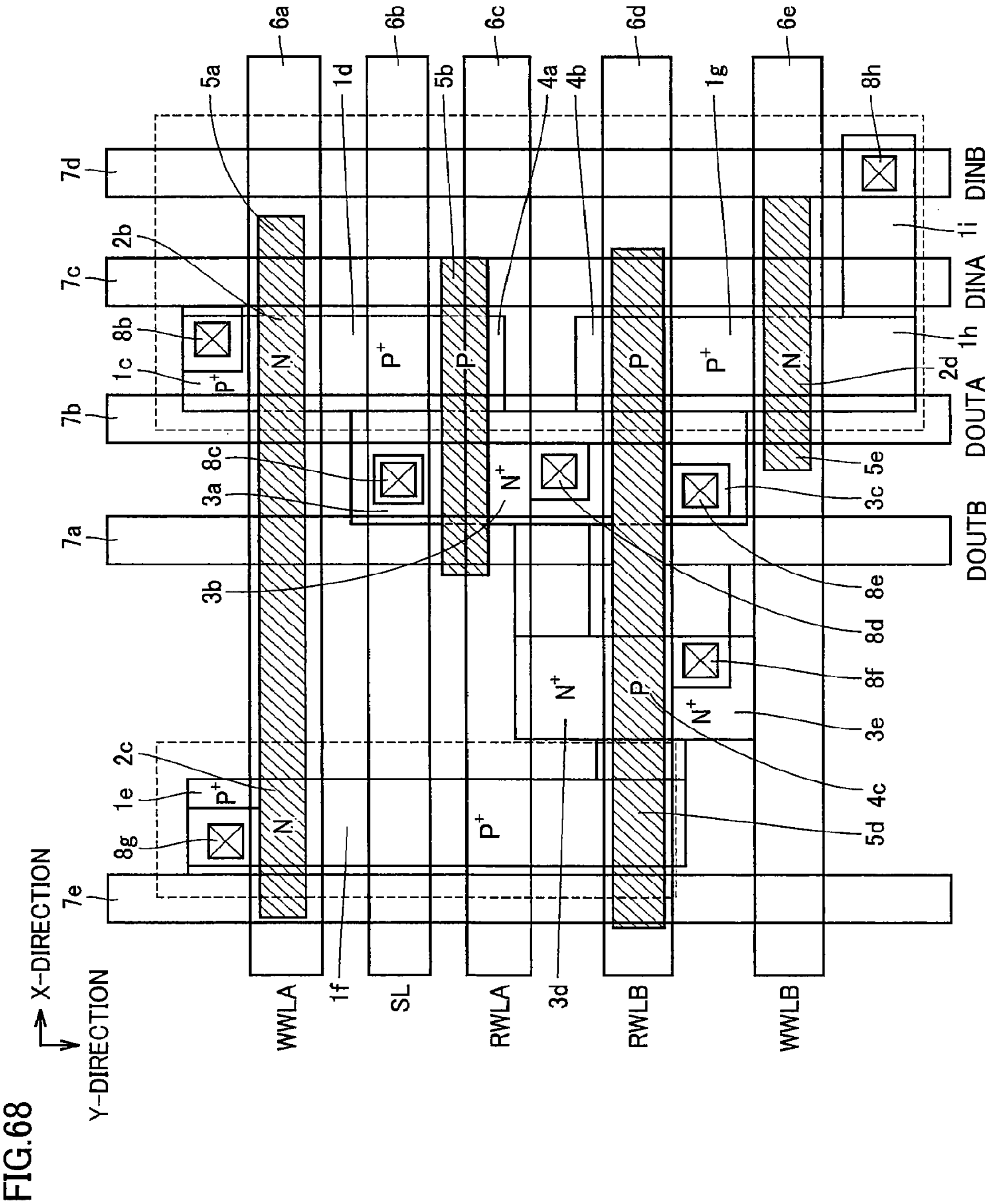
FIG. 68 schematically shows a planar layout of the unit operator cell of FIG. 67.

FIG. 68 schematically shows a planar layout of a unit operator cell UE shown in FIG. 67. The planar layout shown in FIG. 68 differs from the planar layout shown in FIG. 59 in that first metal interconnection line 6*a* is used as write word line WWLA and a first metal interconnection line 6*e* constituting write word line WWLB is further provided in a lower layer portion shown in FIG. 68 in parallel with first metal interconnection line 6*d* constituting B-port read word line RWLB.

In order to select SOI transistor PQ2 by using write word line WWLB, high-concentration P-type regions 1*g* and 1*h* are arranged in alignment with P-type region 4*b* in the Y-direction. An N-type region 2*d* is disposed between P-type regions 1*g* and 1*h*. A gate electrode interconnection line 5*e* extending in the X-direction is provided on N-type region 2*d*. Gate electrode interconnection line 5*e* is electrically connected to first metal interconnection line 6*e* of an upper layer (contact portion is not shown).

A high-concentration P-type region 1*i* extending in the X-direction is provided adjacent to P-type region 1*h*, and is electrically connected to upper-layer second metal interconnection line 7*d* through a contact/via 8*h*. That is, unlike the layout shown in FIG. 59, the active region constituting SOI transistor PQ2 is disposed in alignment with P-type regions 1*g* and 1*d* constituting SOI transistor PQ1 in the Y-direction.

Other arrangement of the planar layout shown in FIG. 68 is similar to that of the planar layout shown in FIG. 59, corresponding parts to those in the planar layout shown in FIG. 59 are designated by the same reference numerals, and the detailed description is not repeated. In FIG. 68, the region shown by the broken line is the region into which the P-type impurities are injected (an element isolation region is provided between active regions where the transistor are formed).

In the case where three data storage SOI transistors are arranged in unit operator cell UOE, the data write can be performed separately to storage node SNB and storage nodes SNA and SNC without largely changing the layout.

In the case where unit operator cell shown in FIGS. 67 and 68 is used, the arrangement of the operator cell array is similar to that shown in FIG. 60 except that two write word lines WWLA and WWLB are arranged as the write word line. Accordingly, the arrangement of the operator cell array is not particularly described in the seventh embodiment of the present invention.

Figure 69:
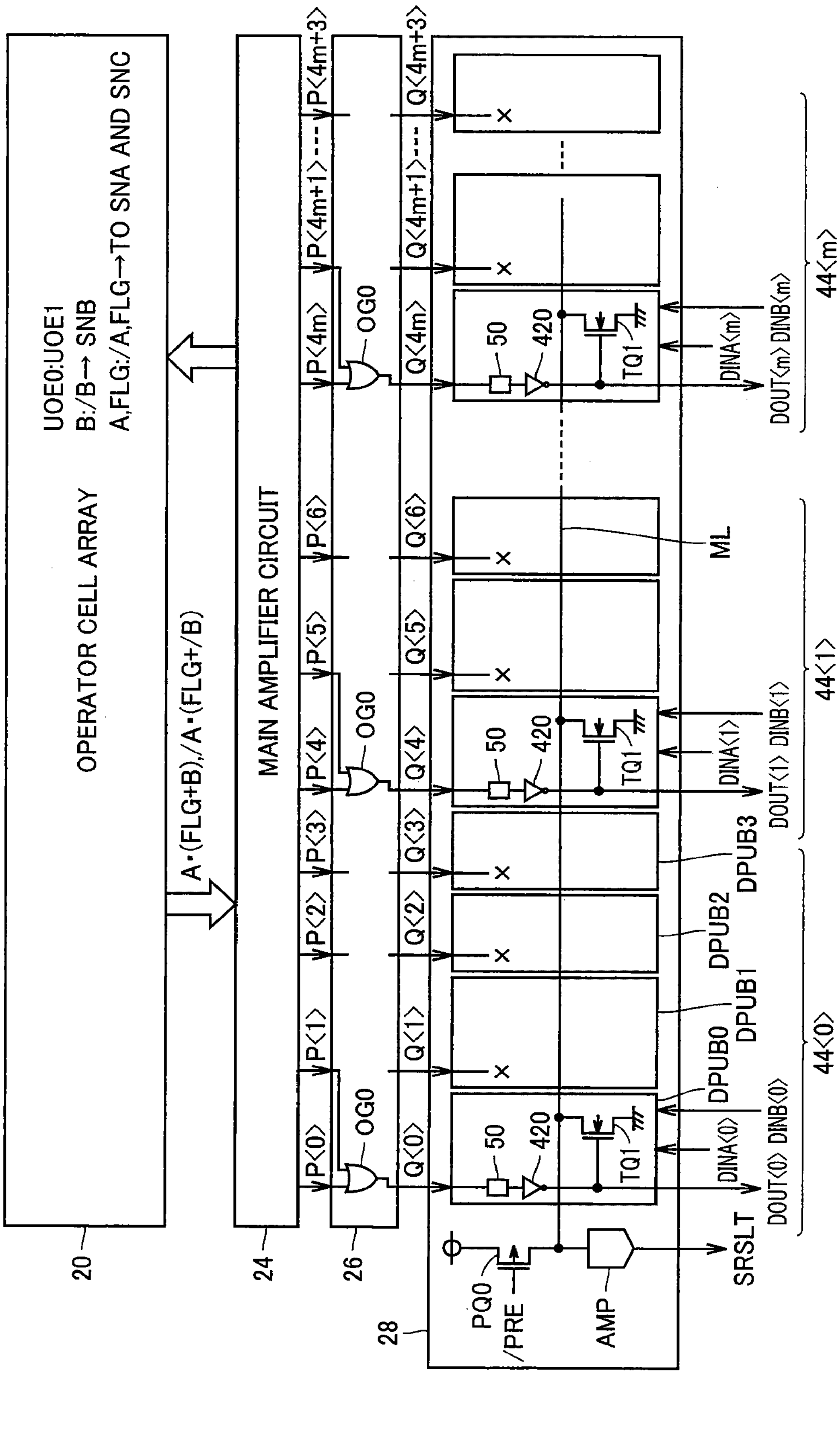
FIG. 69 schematically shows a configuration of a main part of the semiconductor signal processing device according to the seventh embodiment of the present invention.

FIG. 69 schematically shows a connection manner of the data propagation routes in data path 28 and combination logic operational circuit 26 in the semiconductor signal processing device according to the seventh embodiment of the present invention. In the semiconductor signal processing device shown in FIG. 69, similarly to the third embodiment, discharging transistor TQ1 that discharges match line ML is provided in data path unit block DPUB0 of each of data path operation unit groups 44<0> to 44<m>. In combination logic operational circuit 26, two-input OR gate OG0 is selected in each of data path operation unit groups 44<0> to 44<m>, and an inverter 420 is selected to invert the output signal of two-input OR gate OG0 in data path unit block DPUB0. Corresponding discharging transistor TQ1 selectively turns into the on-state in response to the output signal of inverter 420.

Similarly to the third embodiment, pre-charging transistor PQ0 and amplifying circuit AMP that amplifies the search result are provided for match line ML. The configurations of data path 28 and combination logic operational circuit 26 are similar to those shown in FIG. 41 in the third embodiment.

However, the configuration of the fourth or sixth embodiment may be used as the configurations of the data path and combination logic operational circuit.

In the seventh embodiment, in operator cell array 20, data can be individually written in storage nodes SNA and SNB of the unit operator cell in response to the signals on write word lines WWLA and WWLB. For example, in performing the searching operation, data bit A can be set at the "don't-care" state by storing flag FLG in storage node SNC. When flag FLG is set at "1", operational result data A·(B+FLG) and /A·(/B+FLG) supplied from the sense amplifiers assume A and /A, and the output signal of two-input OR gate OG0 assumes "1 (=A+/A)". When flag FLG is set at "0", output data of sense amplifiers SA0 and SA1 assume data A·B and /A·/B, the output signal of two-input OR gate OG0 becomes data (A·B+/A·/B) to indicate the match result of data A and B. Accordingly, the search can be performed while data bit A is masked with flag FLG. The searching operation will specifically be described.

Figure 70:
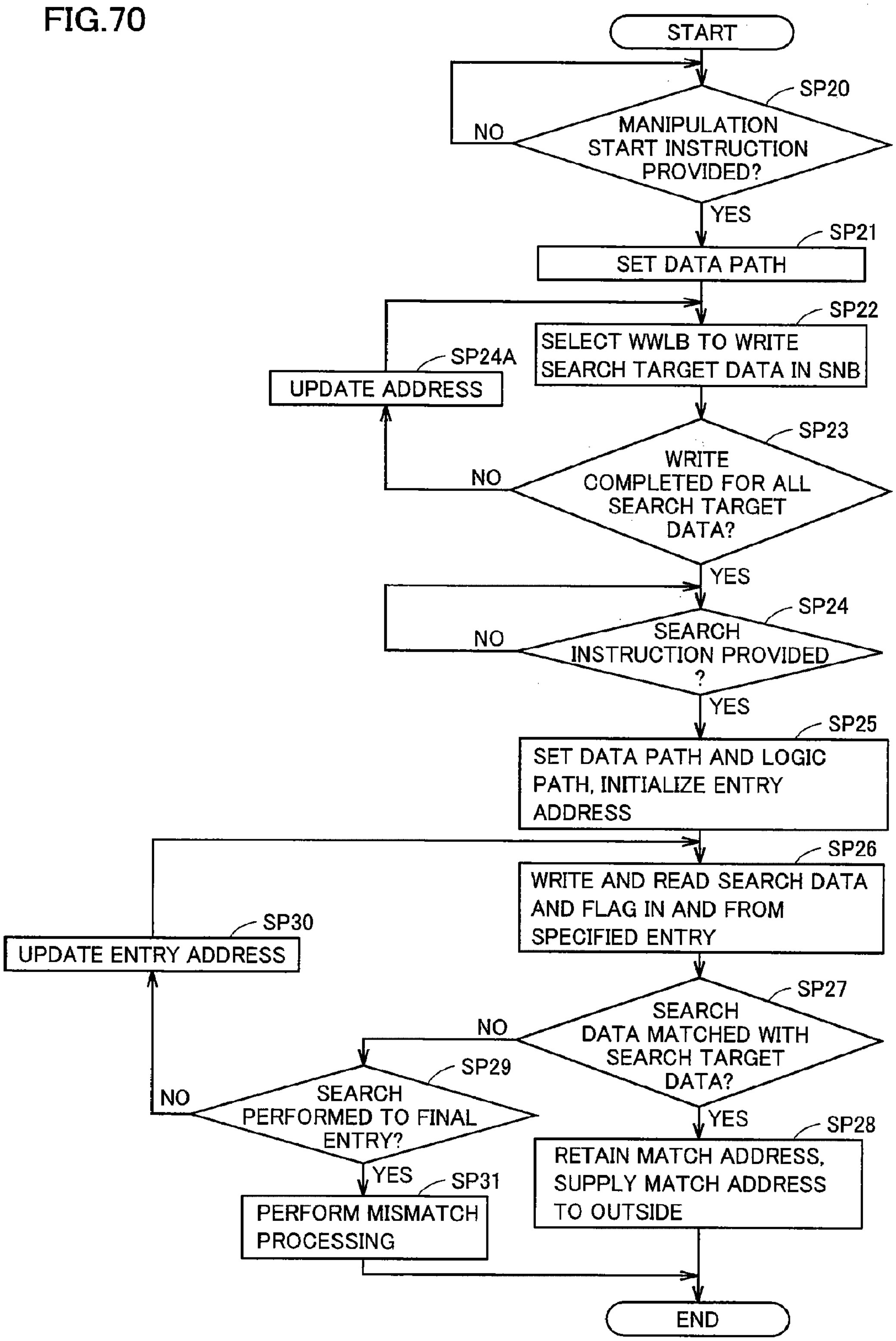
FIG. 70 is a flowchart representing a searching operation of the semiconductor signal processing device according to the seventh embodiment of the present invention.

FIG. 70 is a flowchart representing a searching operation of the semiconductor signal processing device according to the seventh embodiment of the present invention. Referring to FIG. 70, the searching operation performed by the semiconductor signal processing devices shown in FIGS. 67 and 69 will be described below.

An instruction to store the search target data in the operator cell array is supplied according to an operation start instruction (Step SP20). The data path is set according to the search target data storage instruction (Step SP21). Inverted value /B of data B is selected in data path unit block DPUB0, and the path is set so as to select data B (=DINB) in data path unit block DPUB 1. After the setting of the propagation path, write word line WWLB is selected, and the search target data is written in storage nodes (body region) SNB of SOI transistors NQ2 of corresponding unit operator cells UOE0 and UOE1 (Step SP22).

Then, a determination whether all the search target data are written is made (Step SP23). When all the search target data are not written yet, the entry address is updated (Step SP24), and write word line WWLB of selected entry is selected to write the next search target data.

When a determination that all the search target data are written is made in Step SP23, the semiconductor signal processing device waits for a search instruction supplied externally (Step SP24).

When the search instruction is supplied, the data path and the logical path (the data propagation path of the combination logic operational circuit) are set, and the entry address is initialized (Step SP25).

In the data path, the transfer paths are set for search data A (=DINA) and flag FLG. The propagation path is set for data A such that non-inverted data A is transferred to unit operator cell (UOE0) in which data B is stored while inverted data /A is transferred to unit operator cell (UOE1) in which data /B is stored. The propagation path is set for flag FLG such that the non-inverted value of flag FLG is transferred to storage node SNC.

The search data and flag are written in and read from the specified entry (Step SP26). Write word line WWLA is driven to the selected state to write the data and flag in storage nodes SNA and SNC. Accordingly, to unit operator cell UE0 in which data B is stored, data A is stored at storage node SNA and flag FLG is stored at storage node SNC. For unit operator cell UE1 in which inverted data /B is stored, data A is written in storage node SNA and flag FLG is stored at storage node SNC. Then, read word lines RWLA and WRLB are concurrently driven to the selected state to read the data stored in unit operator cells UE0 and UE1. In the read port selection circuit (not shown), B port is selected, and sense amplifiers produce data A·(FLG+B) and /A·(FLG+/B), which in turn are transmitted to corresponding two-input OR gate OG0 through the corresponding main amplifiers.

When flag FLG is "1", the output data of two-input OR gate OG0 becomes A+/A="1", and the output signal (data bit) of two-input OR gate OG0 is inverted by inverter 420, and the output signal of inverter 420 becomes "0" indicating the match state. On the other hand, when flag FLG is "0", the output data of two-input OR gate OG0 becomes A·B+/A·/B. In the case where data A and B are equal to each other, the output signal of two-input OR gate OG0 becomes "1" (H level), and accordingly, the output signal of inverter 420 becomes "0" (L level). Accordingly, the search data (bit) for which flag FLG is set at "1" has no influence on the potential at match line ML. In the case where data A and B are not matched with each other, the output signal of two-input OR gate becomes "0", the output signal of inverter 420 becomes "1", and corresponding discharging transistor TQ1 turns into the on-state to discharge match line ML. Accordingly, match line ML is discharged when any bit of search data A (DINA<m:0>) is not matched with that of search target data B(DINB<m:0>).

Therefore, the match state is indicated when match line ML is maintained at the pre-charged state, and the mismatch state is indicated when match line ML is discharged. The potential at match line ML is amplified by amplifying circuit AMP, and search result indication SRSLT is set at "0" or "1", whereby the match/mismatch between search data A and search target data B is identified (Step SP27).

A determination whether the search is made to the final entry according to the address counter when the mismatch is detected (Step SP29). When the final entry is not searched yet, the entry address is updated (Step SP30), and the search data and flag are written and read in Step SP26.

When a determination that the final entry has been searched and match is not detected is made, necessary processing for mismatch is performed (Step SP31). The processing for the generated mismatch is appropriately defined depending on an application of the semiconductor integrated device. When match is detected in Step SP27, the matching address (entry address) at that time is retained and supplied externally (Step SP28). Here, the entry address (address index) is supplied externally, and the necessary information may be read according to the externally supplied entry address, or predetermined processing may be performed irrespective of the value of the entry address when the match is detected.

As shown in FIG. 67, the write word lines are separately provided for storage node SNB and for storage nodes SNA and SNC, which allows the searching operation to be implemented while the mask is used in the searching operation.

The entire configuration of the semiconductor signal processing device according to the seventh embodiment of the present invention is similar to that of the third embodiment, and the ternary CAM behavior can be implemented with address counter 170 shown in FIG. 42 as the entry address generating circuit when three storage nodes SNA, SNB, and SNC of the seventh embodiment are provided in the unit operator cell.

Figure 71:
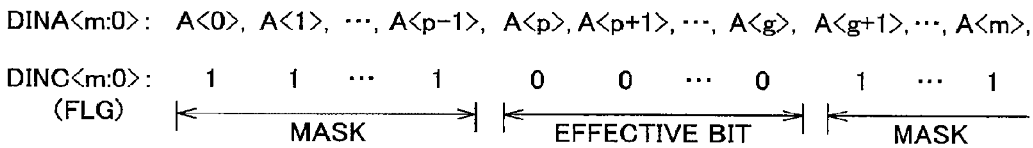
FIG. 71 schematically shows a correlation between input data (search data) and a mask bit, used in the seventh embodiment of the present invention.

FIG. 71 shows configurations of the search data and flag. Search data DINA<m:0> are constituted from data A<m:0>, and flag (bit) FLG is constituted from mask data DINC<m:0>. Bits (FLG) of corresponding mask data DINC are set at "1" for search data bits A<0> to A<p−1>, and bits (FLG) of corresponding mask data DINC are set at "0" for search data bits A<p> to A<q>. The corresponding bits of mask data DINC are set at “1” for remaining bits A<q+1> to A<m> of the search data.

Referring to FIG. 71, in the case of the bit arrangement of the mask data for the search data, the search is performed on bits A<p> to A<q> of the search data, and remaining bits A<0> to A<c−1> and A<q+1> to A<m> are in the “don't care” state. Accordingly, the value of bit (flag FLG) of mask data DINC is set, and the searching operation can be performed while setting the effective bit width of the search data appropriately.

For example, the semiconductor signal processing device according to the seventh embodiment can be applied to a next-address search for a data packet of an IP address (Internet Protocol address) in data communication, and character string search can be performed in a pay load.

[Eighth Embodiment]

Figure 72:
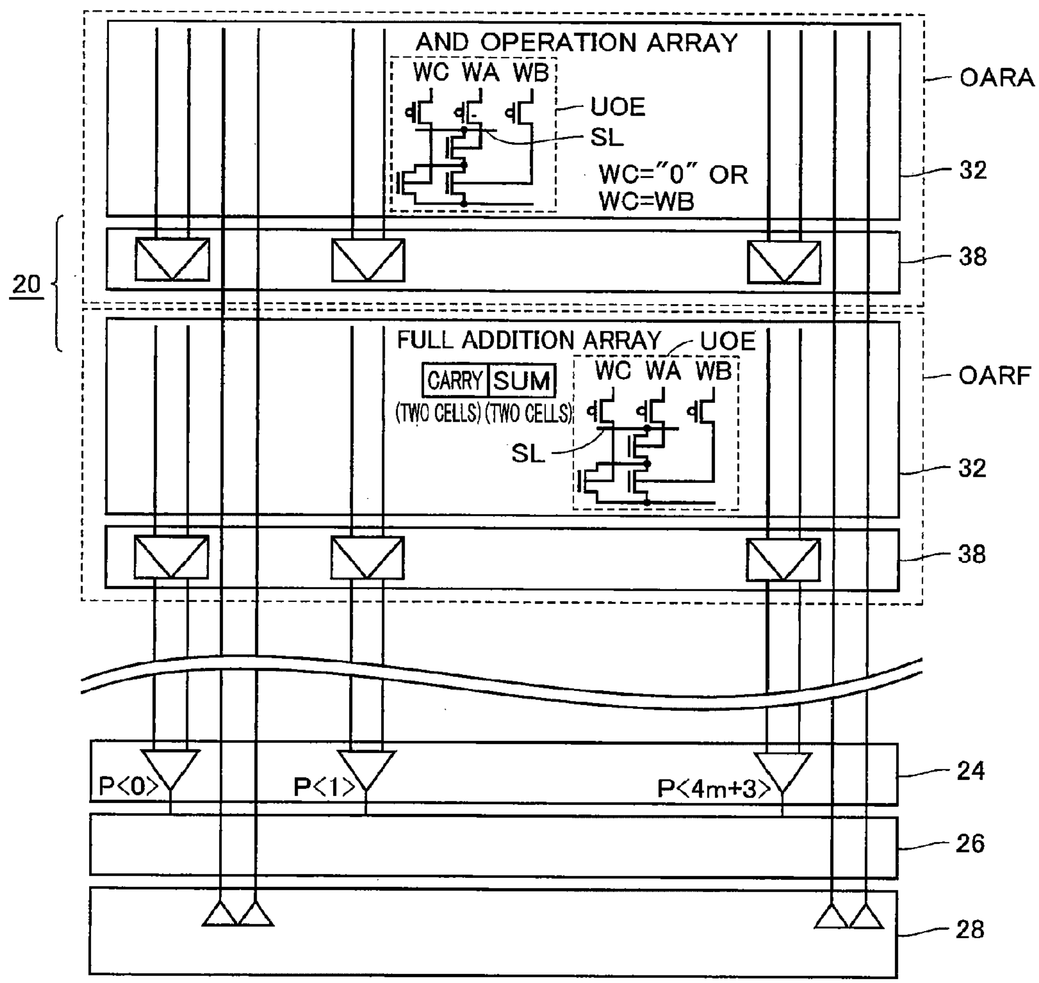
FIG. 72 schematically shows an entire configuration of a semiconductor signal processing device according to an eighth embodiment of the present invention.

FIG. 72 schematically shows a configuration of a main part of a semiconductor signal processing device according to an eighth embodiment of the present invention. AND operation array OARA that performs the AND operation and full addition array OARF that performs the full addition are separately provided in operator cell array 20 of the semiconductor signal processing device shown in FIG. 72. Main amplifier circuit 24, combination logic operational circuit 26, and data path 28 are shared by AND operation array OARA and full addition array OARF.

Unit operator cell UOE having three storage nodes SNA, SNB, and SNC of the fifth embodiment is used in AND operation array OARA. Write ports WA, WB, and WC may concurrently be driven to the selected state, or write port WB may be driven to the selected state independently of write ports WA and WC as in the seventh embodiment. Write ports WA, WB, and WC are write port WPRT that is connected to storage nodes SNA, SNB, and SNC. In the AND operation array, data bit “0” is always transmitted to one of write ports WB and WC or the same data is transmitted to write ports WC and WB.

In sense amplifier band 38 of AND operation array OARA, sense amplifier is provided for each bit line pair of memory cell array 32. In AND operation array OARA, because the operating manner in the AND operational processing is similar to that of the first embodiment, read port B (RPRPB) is selected, and the logical product operation (for example, A·B) is performed to the data bits stored in the unit operator cells.

On the other hand, in full addition array OARF, the carry producing unit (shown as the carry in FIG. 72) including the two unit operator cells and the sum producing unit (shown as sum in FIG. 72) including the two unit operator cells are used as one one-bit full addition operation unit. In full addition array OARF, the configuration of unit operator cell UOE is also similar to that of unit operator cell UOE of the AND operation array except that the operation processing data are individually stored through write ports WA, WB, and WC. The configuration of the data path differs from the data path shown in FIG. 61 of the sixth embodiment in order to perform the full addition in full addition array OARF, and in order to enable the shifting operation of the partial product during the multiplication in data path 28. On the other hand, similarly to the sixth embodiment, the configuration of combination logic operational circuit 26 is similar to that shown in FIG. 61.

Figure 73:
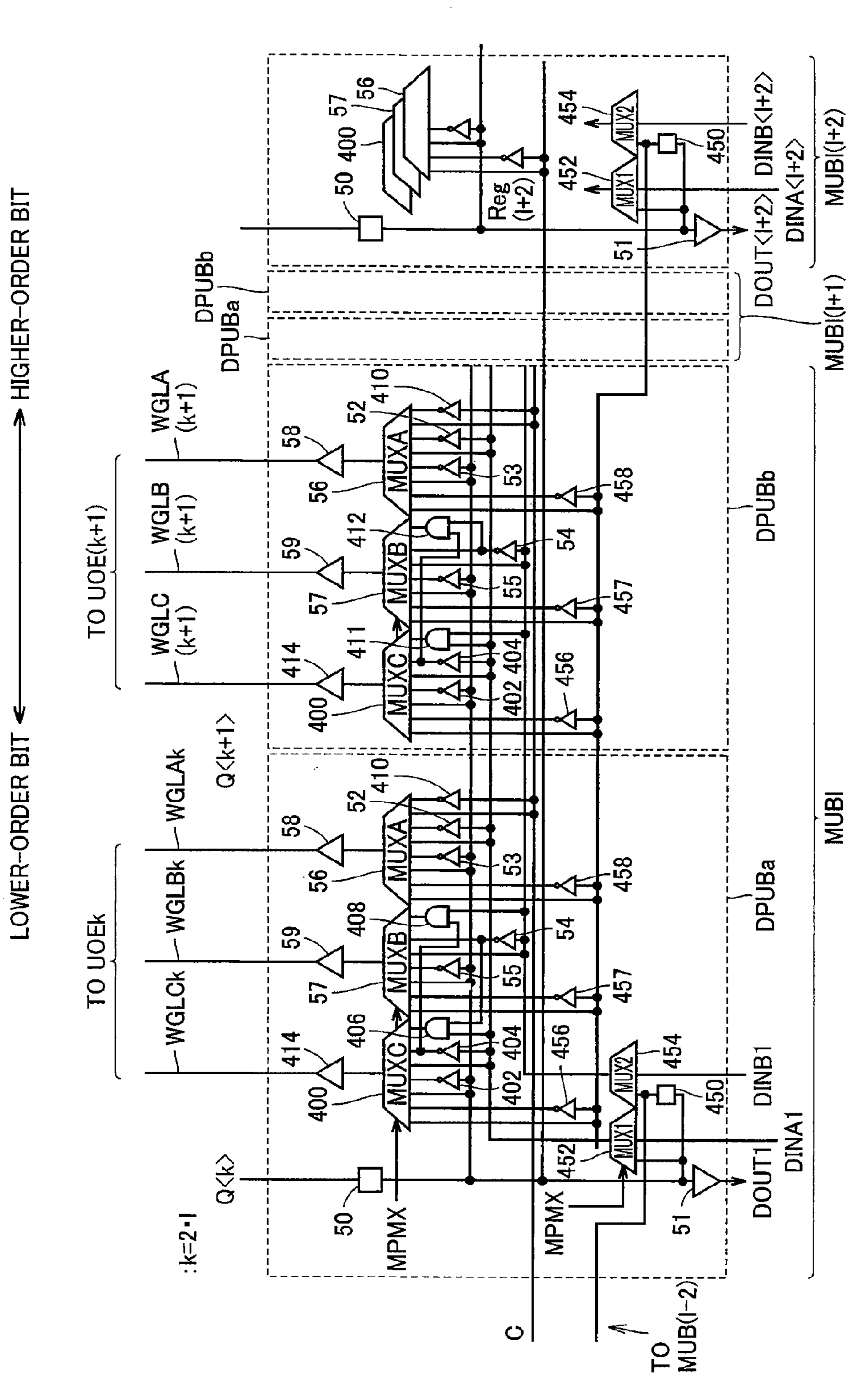
FIG. 73 schematically shows a configuration of a data path of the semiconductor signal processing device according to the eighth embodiment of the present invention.

FIG. 73 schematically shows a configuration of data path 28 in the semiconductor signal processing device according to the eighth embodiment of the present invention. Referring to FIG. 73, full addition operation unit block includes two data path unit blocks DPUBa and DPUBb. One full addition operation unit MUB constitutes the carry producing section or the sum producing section. Accordingly, one-bit full adder is formed by two full addition operation units.

Unit operator cells UOEk and UOE(k+1) are arranged each for producing the sum in each of two data path unit blocks DPUBa and DPUBb included in one full addition operation unit MUB1. Data path unit blocks DPUBa and DPUBb in an adjacent full addition operation unit MUB(1+1) produce the carry for the sum producing section constituted by upper-bit full addition operation unit MUB(1+2). Carry C for full addition operation unit MUB1 is transferred from the lower-bit location (not shown), and the output carry is produced according to input data bits DINA<1> and DINB<1>.

Data path unit blocks DPUBa and DPUBb shown in FIG. 73 differs from the data path shown in FIG. 61 in that a temporary register 450 and a multiplexer (MUX2) 454 are provided. Temporary register 450 transfers the output data bit of register 50 arranged in data path unit block DPUBa (DPUB0) in response to the clock signal (not shown). Multiplexer (MUX2) 454 receives the value stored in temporary register 450 and external data bit DINB<1>. The output value of temporary register 450 is transferred (shifted down) to full addition operation unit MUB(1−2) for producing the sum on the lower-order bit side.

In each of write data path unit blocks DPUBa and DPUBb, inverters 456, 457, and 458 are provided for the output value of temporary register 450 of upper-bit full addition operation unit MUB(1+2). The output data bits of inverters 456, 457, and 458 are applied to multiplexers 400, 57, and 56, respectively. Accordingly, the shifted-down data bit can be transferred from temporary register 450 to corresponding bit operator cells UOEk and/or UOE(k+1) by using full addition operation unit MUB1.

Because other configurations of data path unit blocks DPUBa and DPUBb are similar to those of the data path unit block shown in FIG. 61, corresponding parts to those in the data path unit block shown in FIG. 61 are designated by the same reference numerals, and the detailed description is not repeated.

Using the full addition operation unit in the data bus shown in FIG. 73, the AND operation and the full addition operation are performed, the partial products are produced in the multiplication operation, and the addition of the partial products is performed to produce the final product result.

FIG. 74 shows an example of the multiplication operation in the semiconductor signal processing device according to the eighth embodiment of the present invention. FIG. 74 shows the case in which the multiplication of four-bit multiplicand X<3:0> and four-bit multiplier Y<3:0> is performed by way of example. In the multiplication operation, the multiplication is performed on multiplicand X<3:0> and each of bits Y<0> to Y<3> of multiplier Y<3:0> (the AND operation is performed) to produce partial products PP0 to PP3. After partial products PP0 to PP3 are produced, partial products PP0 to PP3 are added in each bit position to produce eight-bit final product P<7:0>.

In a normal parallel multiplier, a multiplication cell array is provided to produce each partial product, and such operational processing is implemented using AND operation array OARA and full addition array OARF shown in FIG. 72. That is, the data propagation route of the data path is set according to the access to the AND operation array and full addition array, and the production of the partial products and the addition of the partial products are sequentially performed. Referring to FIGS. 75A to 75C, 76A and 76B, and 77A and 77B, the four-bit multiplication operation shown in FIG. 74 will be described below.

Figures 75A, 75B, 75C:
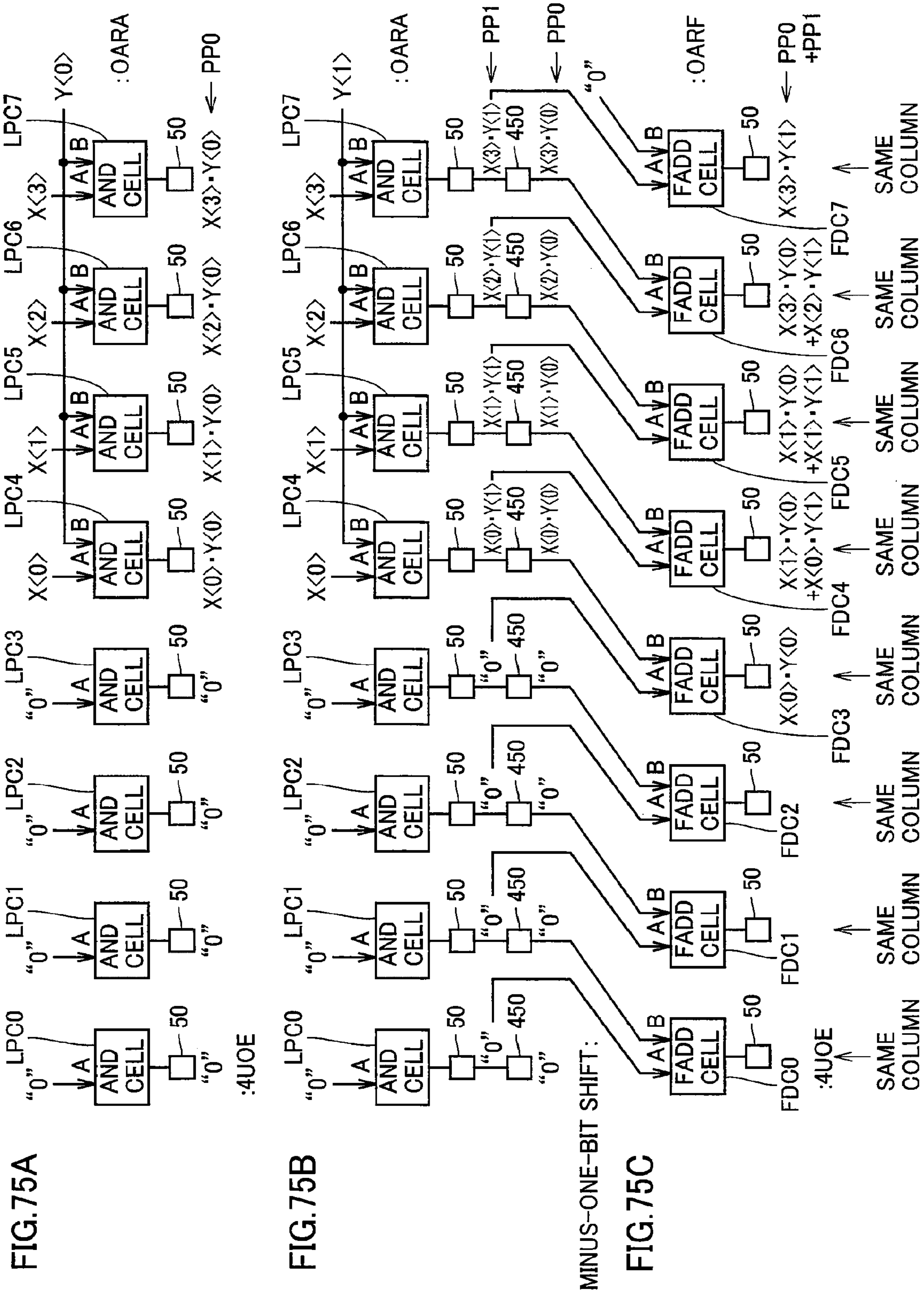
FIGS. 75A to 75C schematically show a data propagation path during the multiplication of the semiconductor signal processing device according to the eighth embodiment of the present invention.

As shown in FIG. 75A, AND cells LPC0 to LPC7 are used in AND operation array OARA. AND cell LPC0 is provided in redundant manner in order to make identical the path switching control for AND cells LPC1 to LPC7. Two unit operator cells UOE0 and UOE1 are provided similarly in the carry producing unit and in the sum producing unit in each of AND cells LPC0 to LPC7. Each of AND cells LPC0 to LPC7 includes the total of four unit operator cells UOE. Using one unit operator cell UOE0, the AND operation is performed on the input data stored in storage nodes SNA and SNB (B port is selected as the read port in the read port selection circuit). Data "0" or data B is stored in storage node SNC.

For the AND operation, the non-inverted data of the input data A and B are selected such that the AND operation is performed in the full addition operation unit in a corresponding data path (not shown). Multiplicand bits X<0> to X<3> are applied as input data A to AND cells LPC4 to LPC7, respectively. Multiplier bit Y<0> is applied as write data B to AND cells LPC4 to LPC7. Data "0" is applied as data A to AND cells LPC0 to LPC3. Data "0" may be applied as external write data B to AND cells LPC0 to LPC3.

In each of AND cells LPC4 to LPC7, the AND operational result of multiplicand bits X<0> to X<3> and multiplier bit Y<0> is produced by the corresponding sense amplifier and stored in register 50 of the corresponding data path unit block. On the other hand, the AND operational result becomes "0" in each of AND cells LPC0 to LPC3, and data "0" is stored in corresponding register 50. Thus, each bit of partial product PP1 is produced as shown in FIG. 74.

Then, as shown in FIG. 75B, the multiplier bit is switched to bit Y<1> while multiplicand bits X<0> to X<3> are maintained, and bit Y<1> is applied to AND cells LPC4 to LPC7. The data applied to AND cells LPC0 to LPC3 are similar to that shown in FIG. 75A. Accordingly, AND cells LPC4 to LPC7 produce the AND operation results of multiplier bit Y<1> and multiplicand bits X<0> to X<3>, and the AND operation results are stored in corresponding registers 50. On the other hand, the AND operation results (shown in FIG. 75A) produced in the preceding cycle are stored in temporary registers 450. Therefore, each bit of partial products PP0 and PP1 shown in FIG. 74 is produced, so that the addition of the partial products PP0 and PP1 is performed with the bit location being aligned with each other. That is, the bits stored in temporary registers 450 corresponding to AND cells LPC4 to LPC7 are shifted down toward one bit lower location and are transmitted as write data B (using data supplied from upper-bit temporary register 450 shown in FIG. 73). The data stored in register 50 is used as write data A.

Similarly to the AND cell, full addition (FADD) cells FDC0 to FDC7 are used in full addition array OARF. Full addition cell FADD includes the carry producing unit operator cell and the sum producing unit operator cell in order to perform the one-bit full addition. In full addition cell FADD, addition operation unit MUB shown in FIG. 73 is provided for each full addition cell in order to produce the carry and sum. The unit block of the data path is shared by the AND cell and the full addition cell, and therefore, AND cells LPC0 to LPC7 and full addition (FADD) cells FDC0 to FDC7 are arranged in alignment in the column direction.

For FADD cells FDC0 to FDC7, the data stored in one-bit upper side temporary register 450 is selected as write data B, and the output data of register 50 included in the corresponding data path unit block is selected as write data A. The shift down to the one-bit lower side direction realizes the bit location alignment in addition of the partial products.

Then, in full addition array OARF, the access to FADD (full addition) cells FDC0 to FDC7 is made to produce the carry and sum of the full addition (see sixth embodiment). Therefore, as shown in FIG. 75C, the addition result of partial products PP0 and PP1 is stored in registers 50 corresponding to FADD cells FDC3 to FDC7. In the addition, the data "0" is applied as write data B to highest-bit FADD cell FDC7.

Figures 76A, 76B:
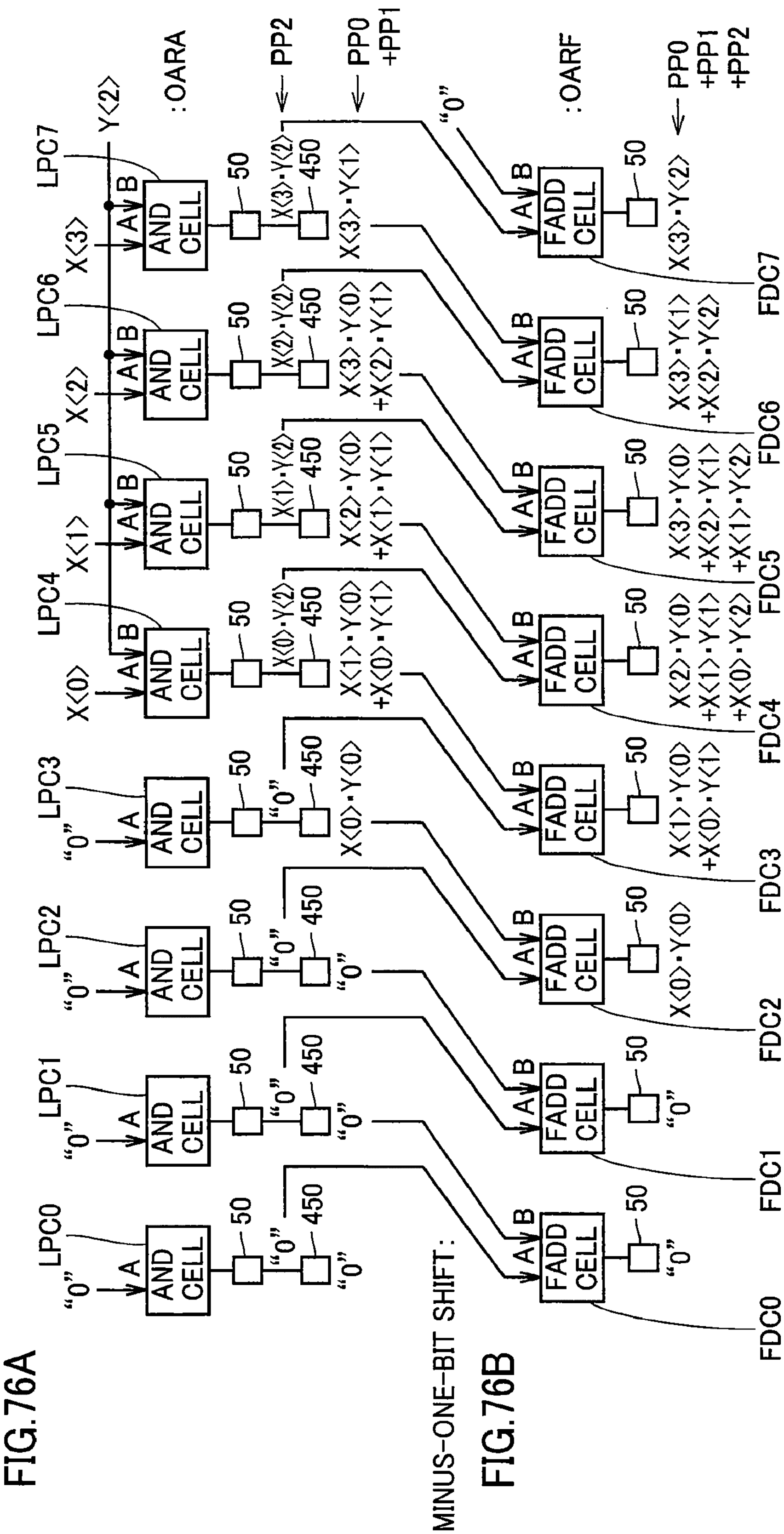
FIGS. 76A and 76B schematically show a data propagation path during multiplication of a multiplier according to the eighth embodiment of the present invention.

Then, as shown in FIG. 76A, multiplicand bits X<0> to X<3> are selected as input data A, multiplier bit Y<2> is applied as write data B, and the access to AND operation array OARA is made (the path is changed in the data path such that the AND operation is performed). Therefore, AND cells LPC4 to LPC7 produce the AND operation results of multiplicand bits X<0> to X<3> and multiplier bit Y<2>, and the AND operation results are stored in corresponding registers 50. Therefore, the bits of partial product PP2 are stored in registers 50 corresponding to AND cells LPC4 to LPC7. The bits of the addition result of partial products PP0 and PP1 shown in FIG. 75C are stored in temporary registers 450.

In AND cells LPC0 to LPC3, input data A is "0", and the data "0" is stored in corresponding register 50.

Then, as shown in FIG. 76B, in order to perform the addition of the partial products, one-bit down-shift (one-bit shift toward the lower-bit side) is performed by temporary registers 450, and the shifted data are selected as write data B. The data stored in registers 50 of the corresponding data path unit block are selected as write data A. Here, the access to full addition array OARF is performed, and the full addition operation is performed by FADD cells FDC0 to FDC7 (the carry and sum are produced). FADD cells FDC2 to FDC7 produce the addition result of partial products PP0 to PP2, and the addition result of partial products PP0 to PP2 is stored in corresponding registers 50. Data "0" is stored in registers 50 corresponding to FADD cells FDC1 and FDC0.

As the stored data of registers are shown in FIG. 76B, the addition result for each bit location of partial products PP0 to PP2 shown in FIG. 74 is correctly stored in the corresponding registers 50 of FADD cells FDC2 to FDC7.

Figures 77A, 77B:
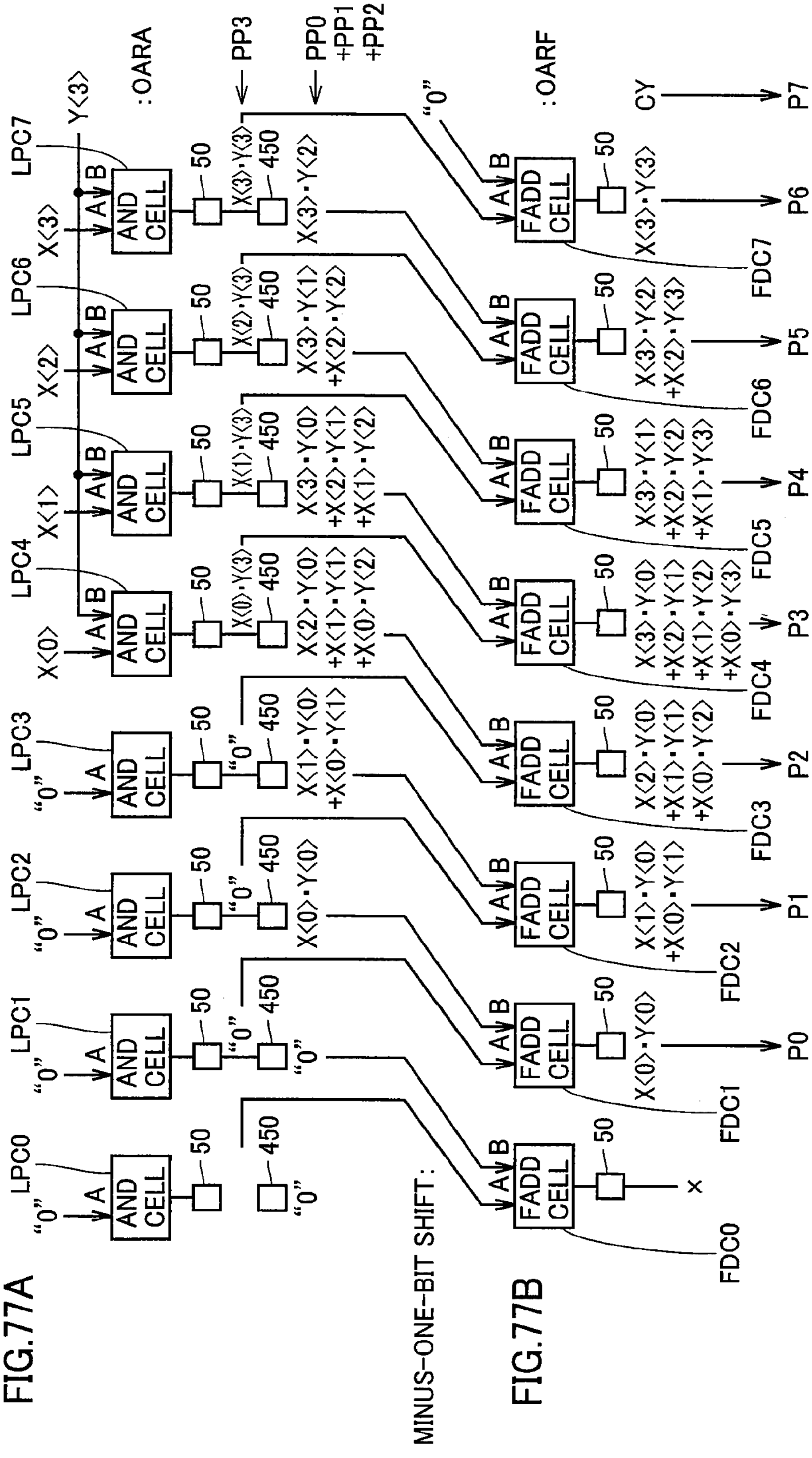
FIGS. 77A and 77B schematically show a data flow in performing multiplication of the semiconductor signal processing device according to the eighth embodiment of the present invention.

Then, as shown in FIG. 77A, in the data path, multiplicand bits X<0> to X<3> are selected as write data A to AND cells LPC4 to LPC7, and multiplier bit Y<3> is selected as write data B to AND cells LPC4 to LPC7. Data "0" is applied as write data A to AND cells LPC0 to LPC3. The access to AND operation array OARA is made to perform the AND operation of multiplicand bits X<0> to X<3> and multiplier bit Y<3>. Therefore, the AND operation results of multiplicand X<3:0> and multiplier bit Y<3> are stored in registers 50 corresponding to AND cells LPC4 to LPC7, partial product PP3 is produced, and the bits of partial product PP3 are stored in corresponding registers 50. The addition value of partial products PP0 to PP2 shown in FIG. 76B is stored in temporary register 450.

Then, as shown in FIG. 77B, in the data path, the one-bit shift-down operation is performed again, and the data stored in temporary register 450 is shifted to the one-bit lower-side full addition operation unit for producing the sum. Therefore, write data B is produced in each operation unit. The data stored in corresponding register 50 is selected as write data A.

The access to full addition array OARF is made again, and the full addition operation is performed in FADD cells FDC0 to FDC7 (the carry and sum are generated). As a result, the final addition result of partial products PP0 to PP3 is stored in registers 50 corresponding to FADD cells FDC1 to FDC7. Multiplication bits P<0> to P<7> of the multiplication result of data A and B can be produced by taking out the output data externally from registers 50 of FADD cells FDC1 to FDC7 through the buffers. The data stored in register 50 corresponding to FADD cell FDC0 is not used as the external product bit. Therefore, the four-bit multiplication can be performed in five clock cycles.

The three-input unit operator cell is used in the operator cell array, and four unit operator cells are provided in each of AND cells and FADD cells FDC0 to FDC7. It is not necessary to provide the multiplication cell that performs the AND operation and addition and the carry shift in each bit of each partial product, and the multiplication of the multi-bit data can be performed with the small occupation area.

Figure 78:
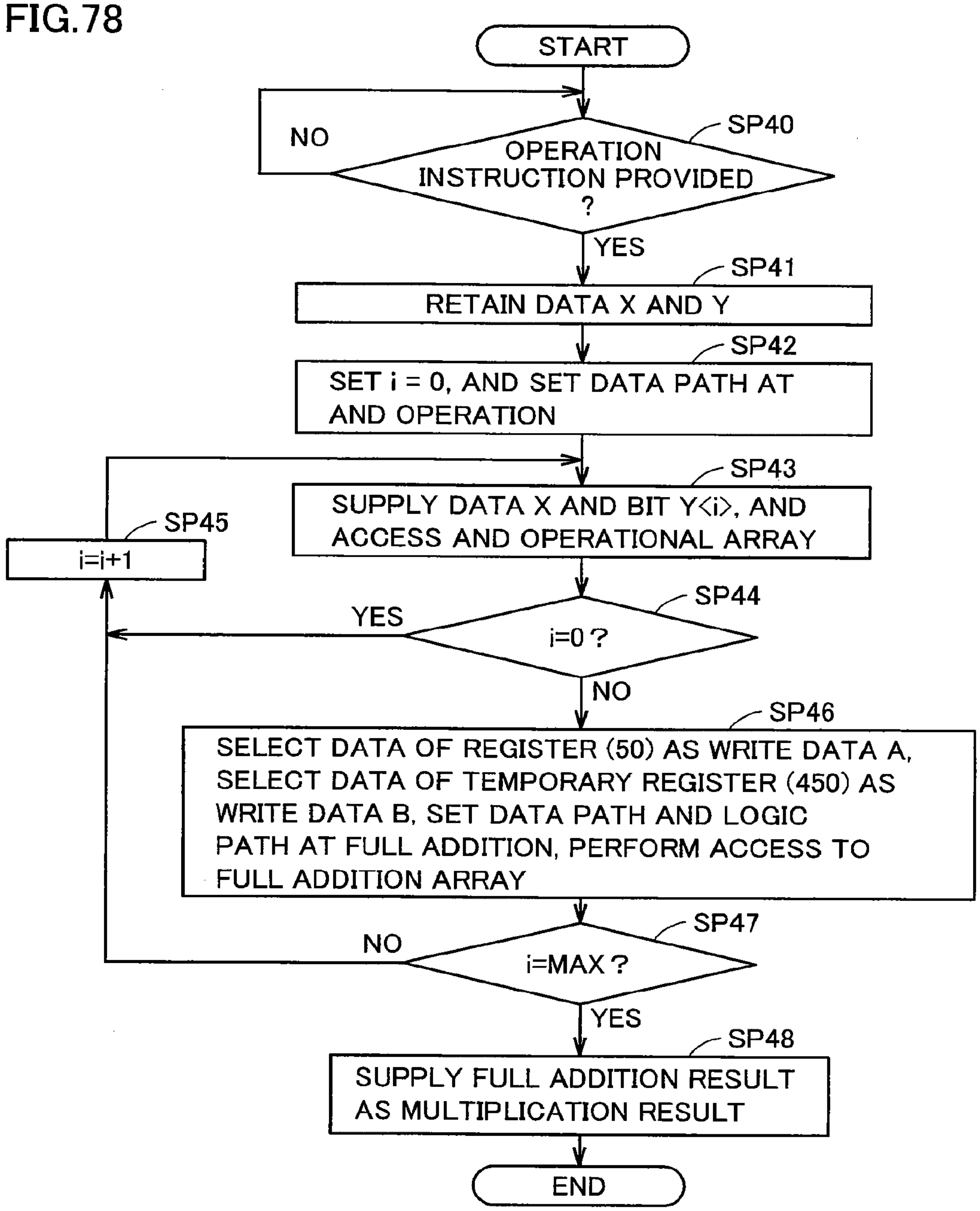
FIG. 78 is a flowchart showing the multiplication sequence of the semiconductor signal processing device according to the eighth embodiment of the present invention.

FIG. 78 is a flowchart showing a multiplication operation of the semiconductor signal processing device according to the eighth embodiment of the present invention. Referring to FIG. 78, the multiplication operation performed by the semiconductor signal processing device according to the eighth embodiment of the present invention will be described below.

The semiconductor signal processing device waits for the multiplication instruction (Step SP40). When the multiplication is instructed, the multiplication data X and Y are retained (Step SP41).

Then, a count value i of the counter is set to zero, and the setting is performed in data path (28) such that the AND operation is performed. In such case, multiplexers 56 and 57 shown in FIG. 73 are set so as to select the input data DINA and DINB applied through multiplexers 452 and 454 (Step SP42).

Multiplicand data X and multiplier bit Y<i> are supplied, the access to the AND operation array is made to produce the AND operation result (Step SP43).

A determination whether the count value i of the counter is zero is made (Step SP44). When the count value i of the counter is zero, because only the first partial product is formed, the count value i of the counter is incremented by one (Step SP45), and the processing is performed from Step SP43.

When the count value i of the counter is not zero in Step SP44, at least the two partial products are produced, and the full addition operation is performed. In this case, in each data path unit block, multiplexers 452 and 56 select the data stored in register (50) as write data A, and the bit value from upper-bit side temporary register (450) is selected as write data B (by multiplexer 57). When the path of the data path and logical path (combination logic operational circuit) is set for the purpose of the full addition, the access to the full addition array is made, and the full addition operation is performed to produce the carry and the sum (Step SP46).

A determination whether the count value i of the counter reaches a maximum value MAX is made after the full addition operation is completed (Step SP47). When the count value i of the counter reaches maximum value MAX, the full addition of the partial products is performed to the most significant bit Y<MAX> of multiplier Y, and the full addition result is output as the multiplication result (Step SP48).

When the count value i of the counter does not reach maximum value MAX, the process returns to Step SP45, the count value i of the counter is incremented by one, and the operational processing is performed again from Step SP43.

Accordingly, the two partial products are produced first, the full addition of the partial products is performed, and then the AND operation and full addition operation are repeatedly performed. In the case where the multiplication is performed on the data of the N-bit width, the multiplication result can be obtained in (2·N+1) clock cycles.

Figure 79:
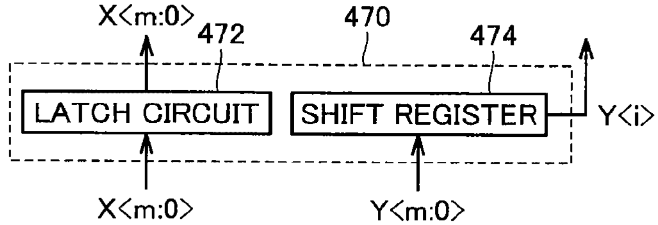
FIG. 79 schematically shows a configuration of an input data producing section in the semiconductor signal processing device according to the eighth embodiment of the present invention.

FIG. 79 schematically shows a configuration of an input interface that produces the write data for the semiconductor signal processing device according to the eighth embodiment. Referring to FIG. 79, an input interface 470 includes a latch circuit 472 that latches external multiplicand data X<m:0> and a shift register 474 that receives and store external multiplier data Y<m:0>. The multiplicand data X<m:0> latched by latch circuit 472 are applied in parallel to the data path. On the other hand, for multiplier data Y<m:0> has one bit Y<i> shifted out from shift register 474 in a bit-by-bit basis to be applied to the write target port (port into which write data B is supplied) of the data path.

Thus, to the data path, latch circuit 472 always supplies multiplicand data X<m:0> to the write target operation unit, and the multiplicand data can be supplied through bit-by-bit shifting out.

In the multiplication, control circuit 30 shown in FIG. 4 performs the operation control. Each control signal is produced such that the AND array access and the full addition array access are repeatedly performed according to the multiplication instruction (command). In the AND array and full addition array, when the AND operation and full addition operation are performed using the entries in the same row, the block address for specifying an array is switched while the word line address is fixed, so that the access is sequentially made to the AND array and full addition array alternately. Accordingly, the control circuit used in the first and sixth embodiments can be used for the configuration of the control circuit.

Thus, according to the eighth embodiment of the present invention, the operator cell array is divided into the AND operation array (operator cell sub-array block) that performs the AND operation and the full addition array (operator cell sub-array block) that performs the full addition operation, and the data path and the data propagation route of the combination logic operational circuit are switched according to the operational contents to perform the full addition and the AND operation. Therefore, the multiplication of the multi-bit data can be performed using the small-area array.

[Ninth Embodiment]

Figure 80:
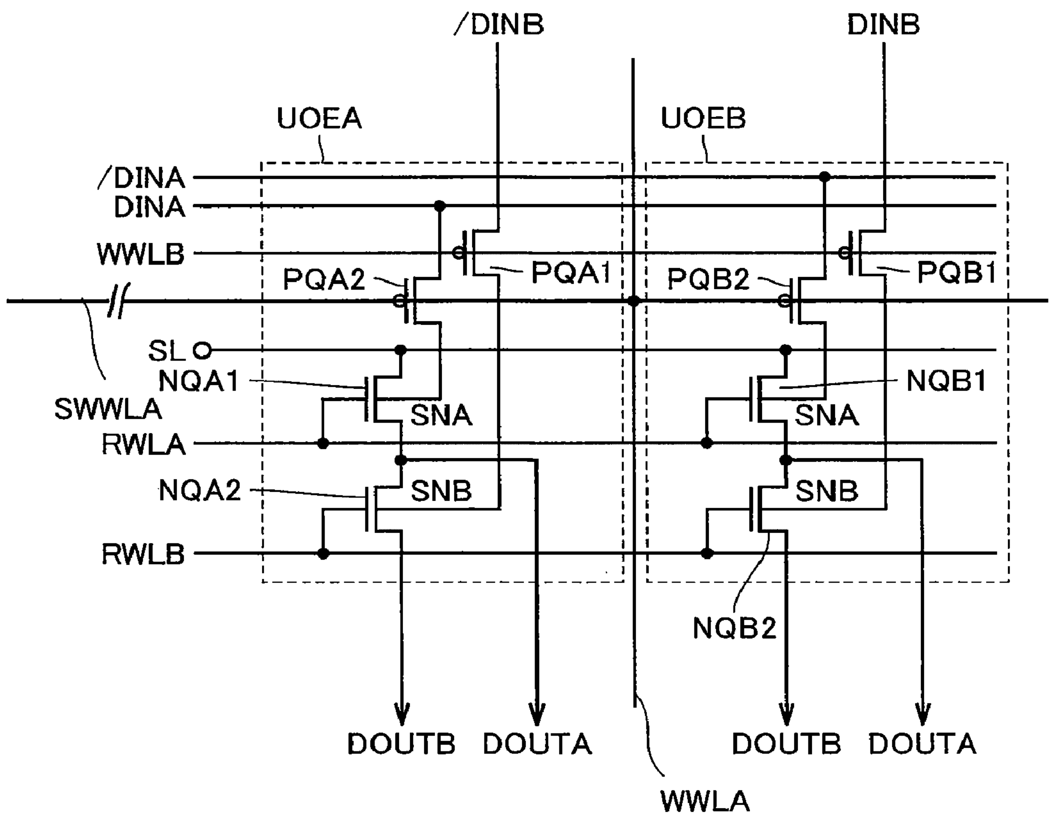
FIG. 80 shows an electrically equivalent circuit of a unit operator cell in a semiconductor signal processing device according to a ninth embodiment of the present invention.

FIG. 80 schematically shows a configuration of an electrically equivalent circuit in a unit operator cell in a semiconductor signal processing device according to a ninth embodiment of the present invention. Referring to FIG. 80, two unit operator cells UOEA and UOEB are provided. Unit operator cells UOEA and UOEB are provided for different data path unit blocks and disposed for one data path operation unit group.

Unit operator cell UOEA includes P-channel SOI transistors PQA1 and PQA2 and N-channel SOI transistors NQA1 and NQA2, and unit operator cell UOEB includes P-channel SOI transistors PQB1 and PQB2 and N-channel SOI transistors NQB1 and NQB2.

P-channel SOI transistors PQA1 and PQB1 transmit data /DINB and DINB on global write data lines to body regions (storage node) SNB of N-channel SOI transistors NQA2 and NQB2 according to the signal potential on write word line WWLB. P-channel SOI transistors PQA2 and PQB2 transmit data DINA and /DINA on the write data lines to the body regions (storage node SNA) of SOI transistors NQA1 and NQB2 in response to the signal potential on local write word lines WWLA and SWWLA.

First local write word line WWLA is arranged in the direction orthogonal to write word line WWLB. Second local write word line SWWLA is arranged in the direction orthogonal to first local write word line WWLA, and is electrically connected to first local write word line WWLA. Second local write word line SWWLA is electrically connected to the gates of MOS transistors PQA2 and PQB2 in unit operator cells UOEA and UOEB that are arranged in alignment in the row direction. Local write word lines WWLA and SWWLA are arranged extending within the corresponding operator cell sub-array block. A hierarchical architecture of the local write word lines will be described later.

The sources of SOI transistors NQA1 and NQB1 are connected to source line SL. In unit operator cells UOEA and UOEB, the connection manner of the SOI transistors of the reading section is similar to that of the unit operator cell shown in FIG. 1. Accordingly, in the configuration of the read sections of unit operator cells UOEA and UOEB, corresponding parts to those in the unit operator cell shown in FIG. 1 are designated by the same numerals, and the detailed description is not repeated.

In response to the signal potential at read word line RWLA, SOI transistors NQA1 and NQB1 are selectively put into the conductive state according to the storage data on read word line RWLA. In response to the signal potential on read word line RWLB, SOI transistors NQA2 and NQB2 are selectively put into the conductive state according to the storage data.

In each of unit operator cells UOEA and UOEB, data DOUTA is used in the case where the NOT operation is performed, and data DOUTB is used in the case where the AND operation result is outputted. The different read bit lines are connected to unit operator cells UOEA and UOEB, respectively. Accordingly, the data read is performed in parallel for unit operator cells UOEA and UOEB.

Figure 81:
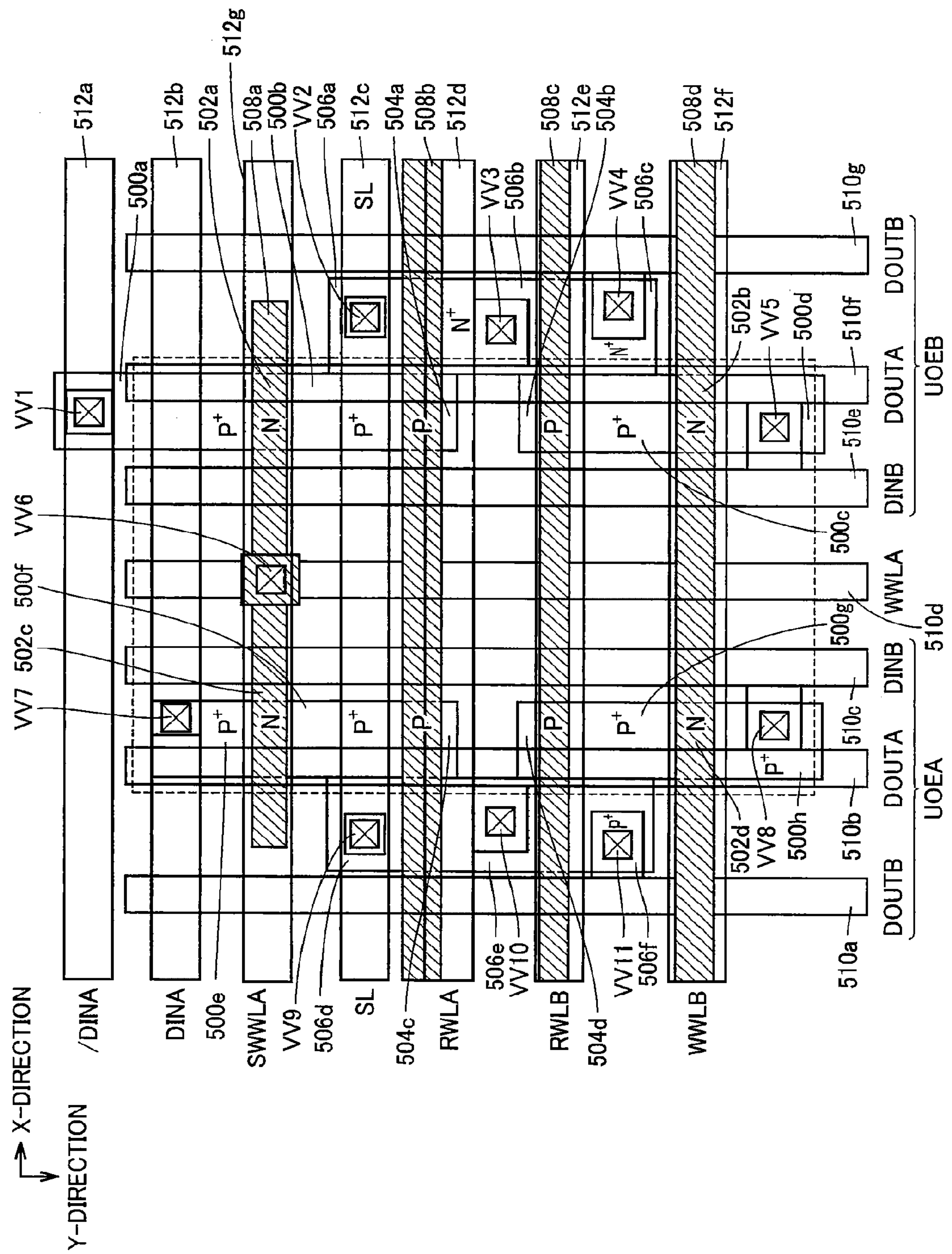
FIG. 81 schematically shows a planar layout of the unit operator cell of FIG. 80.

FIG. 81 schematically shows a planar layout of the unit operator cells UOEA and UOEB shown in FIG. 80. Referring to FIG. 81, unit operator cells UOEA and UOEB are symmetrically disposed with respect to the P-type transistor forming region shown by the central broken-line block.

In P-type transistor forming region, high-concentration P-type regions 500*a* and 500*b* are arranged in alignment in the Y-direction. An N-type region 502*a* is arranged between P-type regions 500*a* and 500*b*. A P-type region 504*a* is disposed adjacent to P-type region 500*b* in alignment with P-type region 500*b* in the Y-direction.

P-type region 504*b* and high-concentration P-type regions 500*c* and 500*d* are disposed in alignment with P-type regions 500*a*, 500*b*, and 504*a* in the Y-direction. An N-type region 502*b* is disposed between P-type regions 500*c* and 500*d*.

Outside the P-type transistor forming region, an N-type region 506*a* is disposed adjacent to P-type region 500*b*, and high-concentration N-type regions 506*b* and 506*c* are disposed in alignment with N-type region 506*a* in the Y-direction. P-type region 504*a* is disposed, between N-type regions 506*a* and 506*b*, continuously extending in the X-direction. A P-type region 504*b* is disposed, between N-type regions 506*b* and 506*c*, continuously extending in the X-direction.

In the P-type transistor forming region, high-concentration P-type regions 500*e* and 500*f* are arranged in the Y-direction. An N-type region c is disposed between P-type regions 500*e* and 500*f*. A P-type region 504*c* is disposed adjacent to P-type region 500*f* and in alignment with P-type region 500*f* in the Y-direction.

P-type region 504*d* and high-concentration P-type regions 500*g* and 500*h* are disposed in alignment with P-type regions 500*e*, 500*f*, and 504*e* in the Y-direction. N-type region 502*d* is disposed between high-concentration P-type regions 500*g* and 500*h*.

Outside the P-type transistor forming region, a high-concentration N-type region 506*d* is disposed adjacent to P-type region 500*f*, and high-concentration N-type regions 506*e* and 506*f* are disposed in alignment with N-type region 506*d* in the Y-direction. P-type region 504*c* is disposed, between N-type regions 506*d* and 506*e*, continuously extending in the X-direction from the P-type transistor forming region. P-type region 504*d* is disposed, between N-type regions 506*e* and 506*f*, continuously extending in the X-direction from the P-type transistor forming region.

A gate electrode interconnection line 508*a* is continuously extending in the X-direction, and is disposed so as to overlap with N-type regions 502*a* and 502*c*. A gate electrode interconnection line 508*b* continuously extends in the X-direction, so as to overlap with P-type regions 504*a* and 504*c*. A gate electrode interconnection line 508*c* continuously extends in the X-direction, so as to overlap with P-type regions 504*b* and 504*d*. A gate electrode interconnection line 508*d* continuously extends in the X-direction, so as to overlap with N-type regions 502*b* and 502*d*.

First metal interconnection lines 510*a* to 510*g* continuously extending in the Y-direction are disposed being separated from one another. First metal interconnection line 510*a* is electrically connected to N-type region 506*f* through a contact/via VV11. First metal interconnection line 510*b* is electrically connected to N-type region 506*e* through a contact/via VV10. First metal interconnection line 510*c* is electrically connected to N-type region 506*h* through a contact/via VV8.

First metal interconnection line 510*d* is electrically connected to a second metal interconnection line 512*g* through a contact/via VV6. Second metal interconnection line 512*g* is disposed extending in the X-direction. Second metal interconnection line 512*g* is electrically connected to gate electrode interconnection line 508*a* in a not shown region. Gate electrode interconnection line 508*a* is disposed in the lower layer in parallel with second metal interconnection line 512*g*. In FIG. 81, gate electrode interconnection line 502*a*, first metal interconnection line 510*d*, and second metal interconnection line 512*g* are shown being electrically connected to one another through a common contact/via VV6 at the same position, in order to emphasize the electric connection of these interconnection lines. In the case where local write word line WWLA is connected to the memory cells located in another row, in this region, first metal interconnection line 510*d* constituting local write word line WWLA and second metal interconnection line 512*g* constituting second local write word line SWWLA are arranged so as to simply intersect each other, and a contact/via VV6 is not provided in this region.

First metal interconnection line 510*e* is electrically connected to P-type region 500*d* through a contact/via VV5. First metal interconnection line 510*f* is electrically connected to N-type region 506*b* through a contact/via VV3. First intermediate interconnection line 510*g* is electrically connected to N-type region 506*c* through a contact/via VV.

First metal interconnection lines 510*a* and 510*b* constitute the B-port and A-port bit lines, respectively. First metal interconnection line 510*c* constitutes the write port through which write data DINB is transmitted. First metal interconnection line 501*d* constitutes local write word line WWLA, and first metal interconnection line 510*e* transmits write data DINB. First metal interconnection line 510*f* constitutes the A-port read bit line, and transmits data DOUTA. First metal interconnection line 510*g* constitutes the B-port read bit line, and transmits data DOUTB.

Second metal interconnection lines 512*a* to 512*g* continuously extending in the X-direction are disposed being separated from one another. Second metal interconnection line 512*a* is electrically connected to P-type region 500*a* through a contact/via VV1 and an intermediate interconnect. Second metal interconnection 512*b* is electrically connected to P-type region 500*e* through a contact/via VV7 and an intermediate interconnect. Second metal interconnection line 512*c* is electrically connected to N-type region 506*d* through a contact/via VV9 and an intermediate interconnect, and is electrically connected to N-type region 506*a* through a contact/via VV2. Second metal interconnection line 512*d* is disposed in parallel with gate electrode interconnection line 508*b* continuously extending in the X-direction, and is electrically connected to gate electrode interconnection line 508*b* in a not shown portion.

Second metal interconnection line 512*e* is disposed so as to overlap with gate electrode interconnection line 508*c*, and is electrically connected to gate electrode interconnection line 508*c* in a not shown portion. Second metal interconnection line 512*f* is disposed so as to overlap with gate electrode interconnection line 508*d*, and is electrically connected to gate electrode interconnection line 508*d* in a not shown portion.

Second metal interconnection lines 512*a* and 512*b* transmit input data /DINA and DINA, respectively. Second metal interconnection line 512*c* constitutes source line SL, and second metal interconnection line 512*d* constitutes read word line RWLA along with lower-layer gate electrode interconnection line 508*b*. Second metal interconnection line 512*e* constitutes read word line RWLB along with lower-layer gate electrode interconnection line 508*c*. Second metal interconnection line 512*f* constitutes write word line WWLB along with lower-layer gate electrode interconnection line 508*d*. Second metal interconnection line 512*g* constitutes second local write word line SWWLA.

A-port local write word line WWLA is arranged continuously extending in the Y-direction, and second local write word line SWWLA is arranged extending in the X-direction and is connected to the gate electrode interconnection line in the corresponding memory cell row of each operator cell sub-array block. Thus, in the searching operation, the same rows are concurrently selected in the operator cell sub-array blocks selected in a plurality of operator cell sub-array blocks, and the searching operation is performed. As described later, the reason why local write word lines WWLA and SWWLA are used is that, in the searching operation, a row in the sub-array blocks is specified by the global write word line and to adjust the number of selected operator cell sub-array blocks according to the search data bit width.

Figure 82:
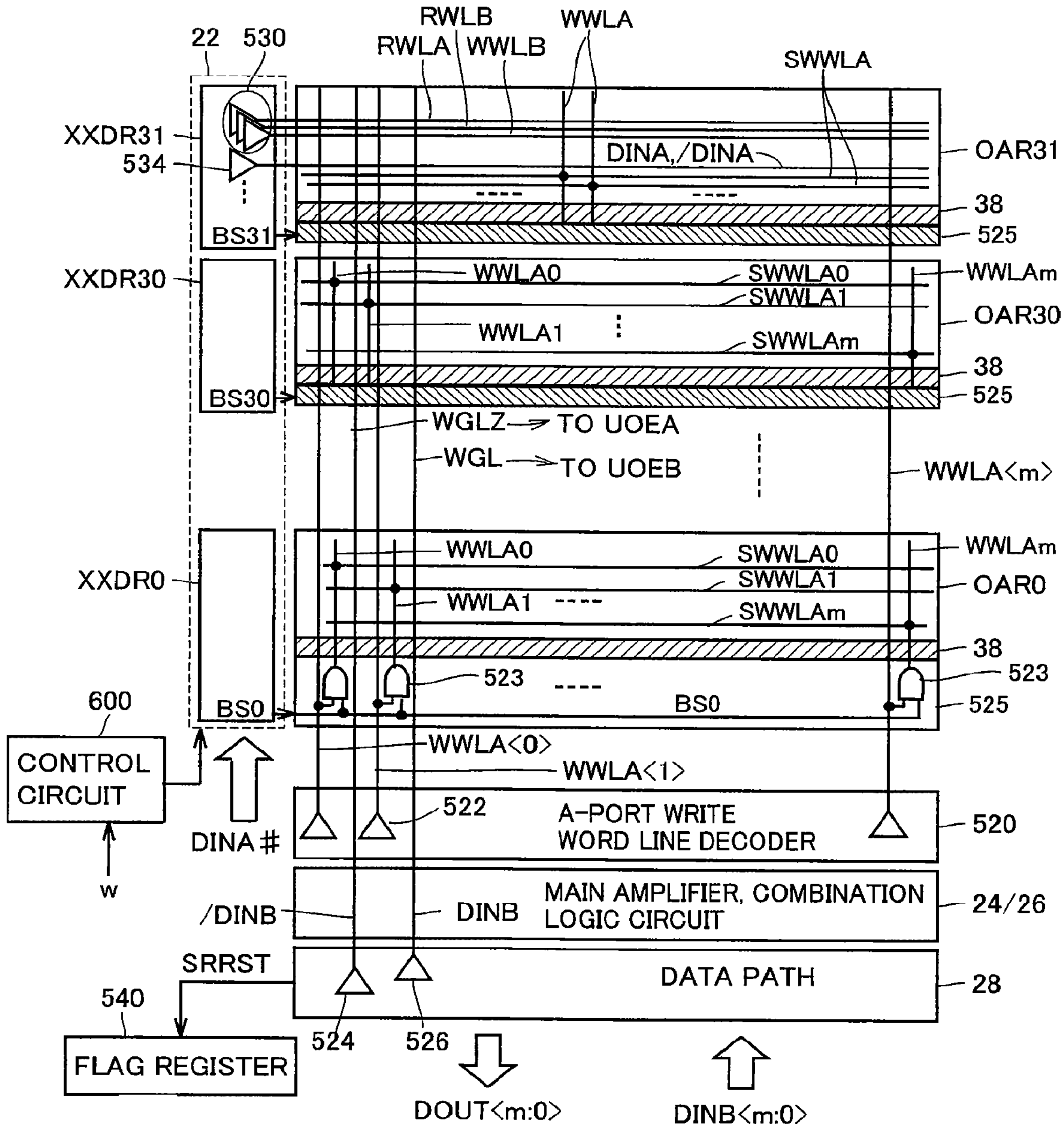
FIG. 82 schematically shows an entire configuration of the semiconductor signal processing device according to the ninth embodiment of the present invention.

FIG. 82 schematically shows an entire configuration of the semiconductor signal processing device according to the ninth embodiment of the present invention. Referring to FIG. 82, similarly to the first embodiment, the operator cell array is divided into a plurality of operator cell sub-array blocks OAR0 to OAR31. In each of operator cell sub-array blocks OAR0 to OAR31, the unit operator cells are arranged in rows and columns, and the dummy cell is disposed for each unit operator cell column. Write word line WWLB, and read word lines RWLA and RWLB are disposed for each unit operator cell row, and second local write word lines SWWLA0 to SWWLAm are arranged corresponding to the unit operator cell rows. Second local write word lines SWWLA0 to SWWLAm are connected to corresponding local write word lines WWLA0 to WWLAm, respectively.

In sense amplifier band 38, the sense amplifier circuit is provided for the unit operator cell column. Although the arrangement of the port selecting switching circuit and the read gate is similar to that of the previously-described embodiments, the output portion of the sense amplifier circuit differs from that of the previously-described embodiments in that the global read data line is driven such that the current is selectively supplied in the one-way direction to the global read data line according to the sense data (the output portion is described later).

An A-port write word line decoder 520 is shared by operator cell sub-array blocks OAR0 to OAR31. A-port write word line decoder 520 includes an A-port write word line driver 522 for driving an addressed global write word line WWLA<0>, WWLA<1>, . . . according to an A-port word line address for reading the data. In the searching operation, the selected global word line is sequentially updated in each search cycle.

A sub-decoder band 525 is provided for each of operator cell sub-array blocks OAR0 to OAR31. In sub-decoder band 525, a sub-decoder 523 is provided corresponding to each of global write word lines WWLA<0> to WLLA<m>. Sub-decoder 523 drives corresponding local write word line WWLAi to the selected state in response to the signal on the corresponding global write word line WWLA<i> and block selection signal BSk supplied from row selection driving circuit 22, and sub-decoder 523 drives the unit operator cells of one row to the selected state. The unit operator cells of one row are connected to a corresponding second local write word line SWWLAi.

Second local write word lines SWWLA in the same row are driven to the selected state in the operator cell sub-array blocks that are selected in operator cell sub-array blocks OAR0 to OAR31 in response to block selection signal BS. A-port write word line is formed into a hierarchical structure of the global and local word lines, and the match detection can be performed while selecting the search target data pattern according to the search data bit width even if the search data bit width is changed in each clock cycle.

Main amplifier circuit 24, combination logic circuit 26, and data path 28 are similar to those of the first to fourth embodiments. In data path 28, the non-inverted data of external data DINB is produced. Data path 28 includes global write drivers 524 and 526 that transmit data /DINB and DINE to global write data lines WGLZ and WGL, respectively. Data DINB<m:0> and output data DOUT<m:0> each having the (m+1)-bit width are transferred through data path 28.

In row selection driving circuit 22, row/data line selection driving circuits XXDR0 to XXDR31 are provided corresponding to operator cell sub-array blocks OAR0 to OAR31. The bit-width variable search data DINA#x are applied to row/data line selection driving circuits XXDR0 to DDXR31.

A bit width w of bit-width variable search data DINA#x (x is a number of the search data) is described in a packet header in the use of data communication application, and bit width w of search data DINA<1:0> is detected by analyzing the header in each search cycle. The search data bits are transferred to operator cell sub-array blocks OAR31 to OAR(31−1) in a distributed manner. Block selection signal BS that is driven to the selected state by control circuit 600 is determined according to information w on the detected search data bit width, and the one-row unit operator cells are selected based on the number of operator cell sub-arrays according to the search data bit width, and the match searching is performed.

Each of row/data line selection driving circuit XXDR0 to XXDR31 includes a word line drive circuit 530 and a data line drive circuit 534. Word line drive circuit 530 drives read word lines RWLA and RWLB and write word line WWLB to the selected state in response to an address signal (not shown). Data line drive circuit 534 produces complementary data DINA and /DINA according to corresponding bit DINAx<i> of the received search data.

Word line drive circuit 530 is arranged for each unit operator cell row of the corresponding operator cell sub-array block. In operator cell sub-array blocks OAR0 to OAR31, read word lines RWLA and RWLB and write word line WWLB can individually and concurrently be driven to the selected state.

A flag register 540 is provided corresponding to data path 28. As will be described later, in data path 28, a match detecting circuit is provided, and the match detecting result is stored in the registers of flag register 540 in each searching operation.

Figure 83:
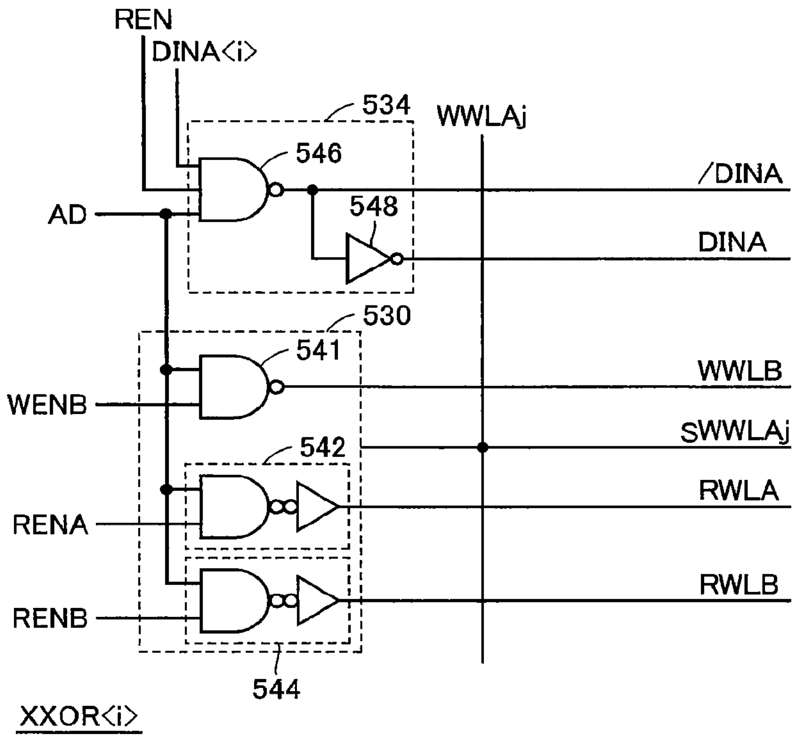
FIG. 83 schematically shows an example of a configuration of a row/data line selection driving circuit of FIG. 82.

FIG. 83 schematically shows an example of a configuration of a row/data line selection driving circuit shown in FIG. 82. Referring to FIG. 83, word line drive circuit 530 includes a write word line driving circuit 541 that drives write word line WWLB, an A-port read word line driving circuit 542 that drives read word line RWLA to the selected state, and a B-port read word line driving circuit 544 that drives B-port read word line RWLB to the selected state. Write word line driving circuit 541 receives an address signal AD and a B-port write enable signal WENB to drive write word line WWLB. A-port read word line driving circuit 542 receives address signal AD and an A-port read enable signal RENA to drive read word line RWLA to the selected state. B-port read word line driving circuit 544 receives address signal AD and a B-port read enable signal RENB to drive B-port read word line RWLB to the selected state. Address signal AD specifies a row in each of operator sub-array blocks OAR0 to OAR31.

When the corresponding enable signals are activated, driving circuits 541, 542, and 544 are enabled to decode address signal AD, and drive corresponding word lines WWLB, RWLA, and RWLB to the selected state according to the decoding results.

Data line drive circuit 534 includes a gate circuit 546 for receiving data bit DINA<i>, read enable signal REN and address signal AD to produce inverted data bit /DINA, and an inverter 548 for inverting an output signal of gate circuit 546 to produce data bit DINA.

Read enable signal REN is activated when both A-port read enable signal RENA and B port read enable signal RENB are in the active state. Gate circuit 546 is a NAND-type decode circuit and is enabled to decode address signal AD when read enable signal REN is activated, and acts as the inverter to invert data bit DINA<i> when the corresponding row is selected.

A first local write word line WWLAj is arranged in the direction orthogonal to B-port write word line WWLB and read word lines RWLA and RWLB, and first local write word line WWLAj transmits the A-port write word line selection signal supplied from sub-decoder 523 of sub-decoder band 525 shown in FIG. 82. The write word line selection signal on first local write word line WWLAj is transmitted to a second A-port local write word line SWWLAj provided in parallel with local write word line WWLB. Accordingly, write word line selection signal WWLA<j> transmitted through the global A-port write word line shown in FIG. 82 is transmitted to a second local write word line SWWLAj arranged in the row direction in the operator cell sub-array block selected through sub-decoder band 525.

By forming the A-port write word line into the hierarchical structure, second local write word lines SWWLA in the same row are concurrently driven to the selected state in each of the operator cell sub-array blocks that are selected according to the search data bit width in operator cell sub-array block OAR0 to OAR31.

The configuration shown in FIG. 83 is arranged for each row in each of operator cell sub-array blocks OAR0 to OAR31.

Figure 84:
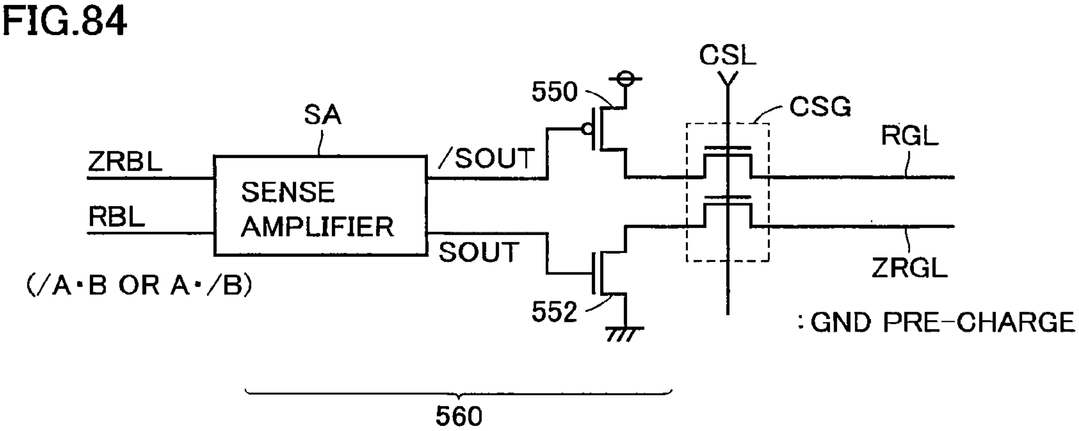
FIG. 84 schematically shows a configuration of a sense amplifier band of FIG. 82.

FIG. 84 shows configuration of the sense amplifier and read gate that are included in sense amplifier band 38 shown in FIG. 82. Referring to FIG. 84, a P-channel transistor 550 and an N-channel transistor 552 are provided between sense amplifier SA and read gate CSG. Transistors 550 and 552 may be formed by an SOI transistor or may be formed by a bulk transistor. Transistors 550 and 552 are formed by the transistors having the same structure as the components of sense amplifier SA. Sense amplifier SA has the configuration similar to that in the first embodiment. Sense amplifier SA and transistors 550 and 552 constitute a sense amplifier circuit 560.

P-channel transistor 550 is selectively put into the conductive state in response to an output signal /SOUT of sense amplifier SA, and transmits a power supply voltage when made conductive. N-channel transistor 552 is put into the conductive state in response to an output signal SOUT of sense amplifier SA, and transmits a ground voltage when in the conductive state. Global read data lines RGL and ZRGL are pre-charged to the ground voltage, for example, In such case, in the conductive state, transistor 552 simply maintains corresponding global read data line ZRGL at a pre-charge voltage level. In this state, transistor 550 is put into the conductive state to supply the current to global read data line RGL, complementary global read data line ZRGL acts as a shielding line for global read data line RGL. However, global read data lines RGL and ZRGL may be pre-charged at an intermediate voltage level, and the main amplifier may produce the signal corresponding to the output signal voltage level of sense amplifier SA according to voltage levels of global read data lines RGL and ZRGL.

Sense amplifier SA drives output signal SOUT to the H level ("1") when data /A·B or A·/B from the corresponding unit operator cell is "1", that is, when data A and B are not matched with each other. In such case, transistors 550 and 552 are turned conductive and the current is supplied through read gate CSG to global read data line RGL to raise the voltage level of global read data line RGL.

When data A·/B and /A·B is "0", that is, when data A and B are matched with each other, output signals SOUT and /SOUT of sense amplifier SA become the L level and H level, respectively, and transistors 550 and 552 are in the off-state. Accordingly, sense amplifier SA equivalently enters an output high-impedance state, and has no influence on the potentials at global read data lines RGL and ZRGL.

The search target data pattern are disposed in line, and the match detecting result for each bit is read on corresponding global read data line RGL. Accordingly, when the data pattern matched with applied search data is stored, corresponding sense amplifier circuits 560 in all the operator cell array blocks enter the output high-impedance state, and corresponding global read data lines RGL are maintained at the pre-charge voltage level. On the other hand, the potential at corresponding global read data line RGL attains the H level when any bit of the search data is not matched with that of the corresponding search target data.

Figure 85:
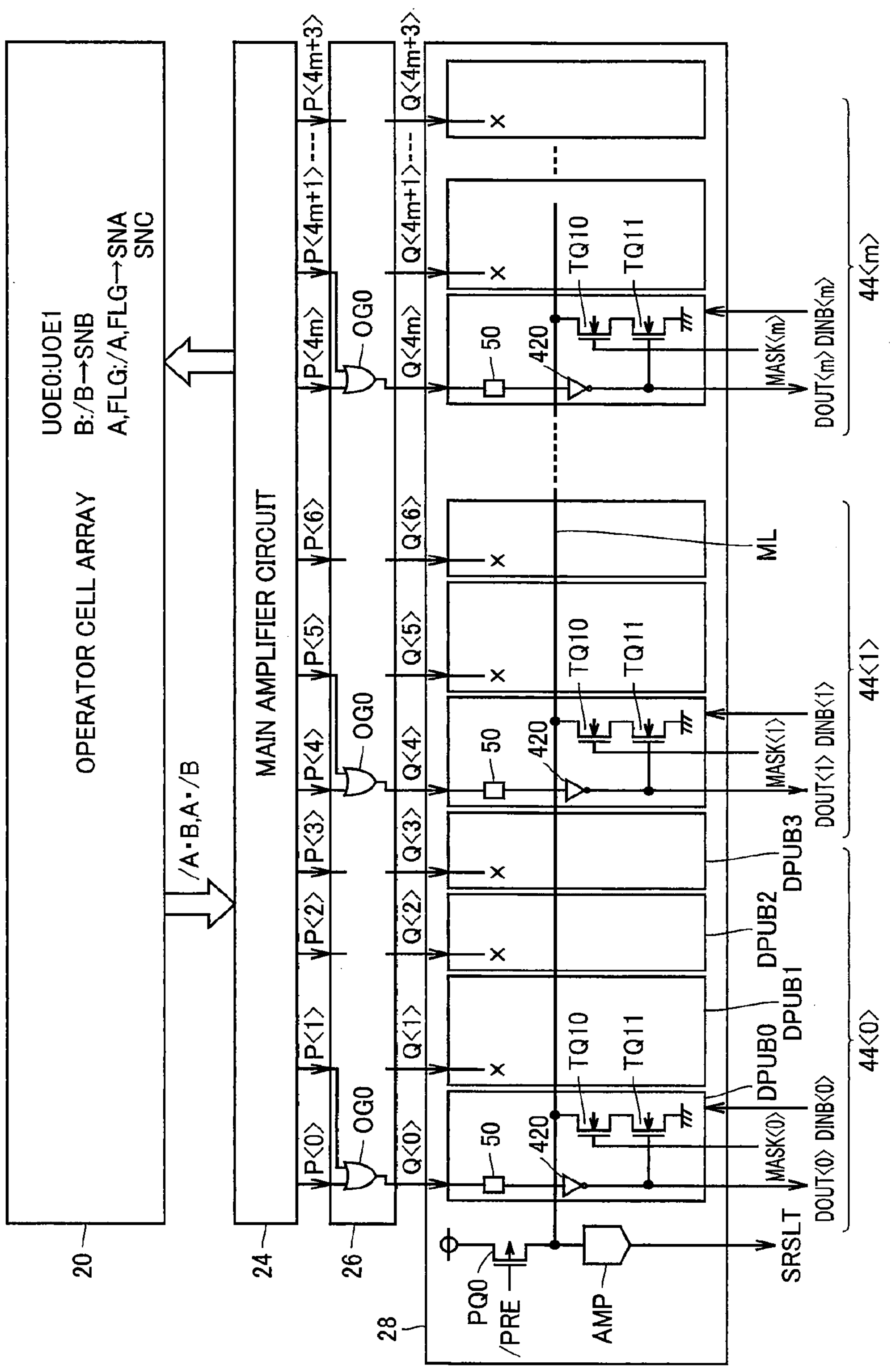
FIG. 85 schematically shows a configuration of a main part of the semiconductor signal processing device according to the ninth embodiment of the present invention, along with a data flow.

FIG. 85 schematically shows a configuration of the match detection portion in data path 28 shown in FIG. 82. Referring to FIG. 85, N-channel transistors TQ10 and TQ11 are connected in series between match line ML and the ground node in data path unit block DPUB0 of each of data bus operation unit groups 44<0> to 44<m>. Mask bits MASK<0> to MASK<m> are applied to the gates of transistors TQ10 in data path operation unit groups 44<0> to 44<m>, respectively. Transistor TQ11 receives the inverted signal of the output signal of corresponding register 50 through inverter 420.

In combination logic operational circuit 26, two-input OR gate is selected to perform the logical sum operation of output signals P<4i> and P<4i+1> of the main amplifiers. Accordingly, when corresponding mask bit MASK<i> is "1" while one of output signals P<4i> and P<4i+1> of the corresponding main amplifiers is "1", that is, when data A and B are not matched with each other, the output signal of inverter 420 attains the L level, and match line ML is not discharged. When both output signals P<4i> and P<4i+1> of the main amplifiers are "0", that is, when the patterns of data A and B are matched with each other, the output signal of inverter 420 attains the H level and match line ML is discharged. When mask bit MASK<i> is "0", transistor TQ10 is in the off-state, and the match determination is masked to exert no influence on the voltage level of match line ML.

In FIG. 85, other configuration of data path 28 is similar to that of the data path shown in FIG. 69, corresponding parts to those in the data path shown in FIG. 69 are designated by the same reference numerals, and the detailed description is not repeated.

Figure 86:
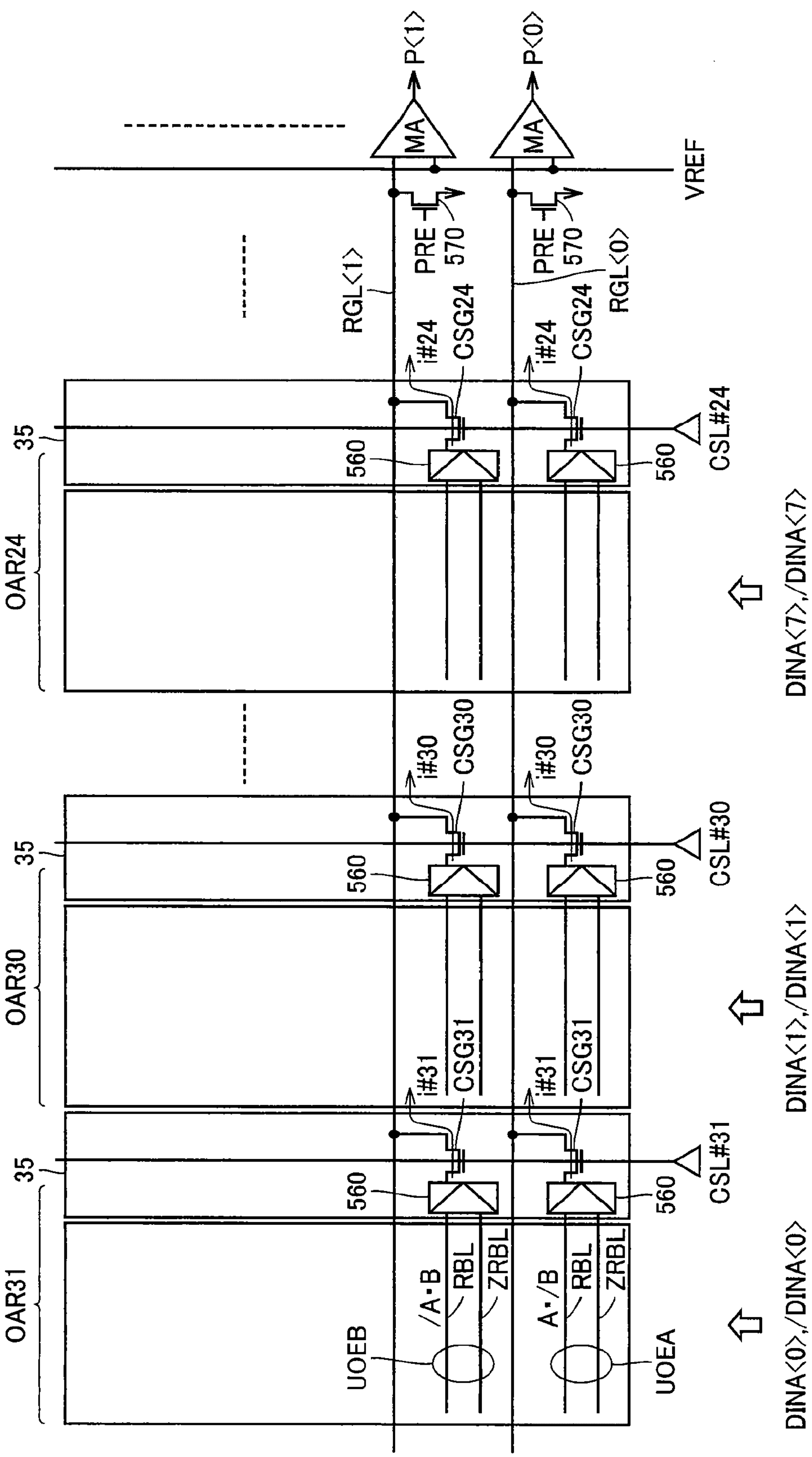
FIG. 86 schematically shows a connection manner during searching operation of the semiconductor signal processing device according to the ninth embodiment of the present invention.

FIG. 86 schematically shows a configuration of the data read section unit in operator cell sub-array block OAR31 to OAR0 during the match searching operation. FIG. 86 shows eight operator cell sub-array blocks OAR31, OAR30, . . . , and OARA24 that are selected and used when search data DINA<1:0> is eight-bit data DINA<7:0>. The bits of eight-bit search data DINA<7:0> are distributed into operator cell sub-array blocks OAR31, OAR30, . . . , OARA24.

The main amplifiers that produce data bits P<0> and P<1> are also shown as main amplifier MA included in the main amplifier circuit. Each of main amplifiers MA compares a reference voltage VREF to the potential at corresponding global read data line RGL (RGL<0>, RGL<1>, . . . ). Because complementary global read data line ZRGL is not used in the main amplifier MA, complementary global read data line ZRGL is not shown in the main amplifier MA shown in FIG. 86. Discharging transistor 570 discharges global read data line RGL (and ZRGL) to the ground voltage level in response to a pre-charge instruction signal PRE.

Sense amplifier circuit 560 in each of operator cell sub-array blocks OAR31 to OAR24 includes sense amplifier SA and transistors 550 and 552 shown in FIG. 84. The operation performed by the data read section shown in FIG. 86 will be described below.

The search target data pattern is stored in operator cell sub-array blocks OAR31 to OAR0 in advance before the searching operation. Complementary data bits (DINB and /DINB) of one-bit search target data B are stored in unit operator cells UOEA and UOEB, respectively. One search target data pattern is formed by unit operator cell pairs at the same position (same row and same column) of operator cell sub-array blocks OAR31 to OAR24.

In the searching operation, global write data line WWLA<i> is driven to the selected state, and eight operator cell sub-arrays OAR31 to OAR24 are selected by block selection signals BS31 to BS24 according to the bit width of search data DINA<7:0>. Data bits DINA<0> to DINA<7> and /DINA<7> are transmitted to the selected rows (selected by local word lines WWLA and WWLA) of selected operator cell sub-arrays OAR31 to OAR24 by data line drive circuit 534, and data transmitted to the selected unit operator cells are written by the corresponding second local sub-word lines. After the search data is written, in operator cell sub-array blocks OAR31, and OAR24, read word lines RWLA and RWLB concurrently drive unit operator cells UOEA and UOEB in the same row to the selected state to read the data stored in the unit operator cells in the selected row.

Read port selection circuit (36) selects B port. Data A is written in unit operator cell UOEA and data A and /B are read out, while data /A is written in unit operator cell UOEB and data A and B are read out. The corresponding sense amplifiers supply AND operational result data A·/B and /A·B through the write and read access to unit operator cells UOEA and UOEB (in FIG. 86, similarly to the embodiments, the dummy cell is provided and the sense amplifier circuit performs the sensing operation with the dummy cell current as the reference current).

All read gate selection signals CSL#31 to CSL#24 are driven to the selected state for read gates CSG31 to CSG24 of operator cell sub-array blocks OAR31 to OAR24.

When data A and B are not matched with each other, one of data A·/B and /A·B attains "1", output signal /SOUT of corresponding sense amplifier SA attains the L level, and currents (i#31 to i#24) are transmitted to corresponding global read data line RGL from sense amplifier circuit 560 arranged for the one of unit operator cells UOEA and UOEB (through transistor 550 shown in FIG. 84). Global read data line RGL is pre-charged to the ground voltage level, and the potential at corresponding global read data line RGL<j> is raised from the ground voltage level by sense amplifier circuit 560 of the mismatching operator cell array sub-block.

In main amplifier MA, when the voltage level of corresponding global read data line RGL<j> is higher than reference voltage VREF, corresponding output bit P<j> is driven to the H level. Accordingly, an output signal Q of two-input OR gate OG0 shown in FIG. 85 attains the H level, the output signal of inverter 420 attains the L level, and pre-charging transistor PQ0 maintains match line ML at the voltage level pre-charged by pre-charge transistor PQ0.

On the other hand, when data A and B are matched with each other, both the data A·/B and /A·B attain "0", sense amplifier circuits 560 arranged to unit operator cells UOEA and UOEB do not supply the currents to corresponding global read data lines RGL<j> and RGL<j+1>, and global read data line RGL<j> is maintained at the ground voltage level. Accordingly, the output signal of main amplifier MA attains the L level, and thus the output signal of two-input OR gate OG0 attains the L level to put the output signal of inverter 420 into the H level. In this state, match line ML pre-charged by pre-charging transistor PQ0 is discharged when mask bit MSK<k> (j=0 to m) is at the H level ("1").

When mask bit MASK<j> is "0", match line ML is not discharged, and is maintained at the pre-charge voltage level.

Match line ML is discharged when one of the data patterns that are stored in unit operator cells UOEA and UOEB arranged for read data line pair RGL<j> and RGL<j+1> is matched with the pattern of input search data DINA<7:0>, and match line ML is not discharged when the data patterns stored in unit operator cells UOEA and UOEB are not matched with the pattern of input search data DINA<7:0>. Accordingly, in operator cell sub-array blocks OAR31 to OAR24, the determination can concurrently be made for the data patterns stored in the unit operator cells connected to read word lines RWLA and RWLB.

That is, the determination of the match/mismatch is concurrently made for the data bits stored in the one-row unit operator cells in each operator cell sub-array block, match line ML is discharged when at least one of the data patterns is matched with the search target data pattern, and match line ML is maintained at the pre-charge voltage level when the search data pattern is not matched with any of the search target data patterns. Accordingly, the searching operation can be performed in one cycle for a plurality of search target data patterns. The search result is amplified by amplifying circuit AMP shown in FIG. 85 and stored in flag register (540).

Figure 87:
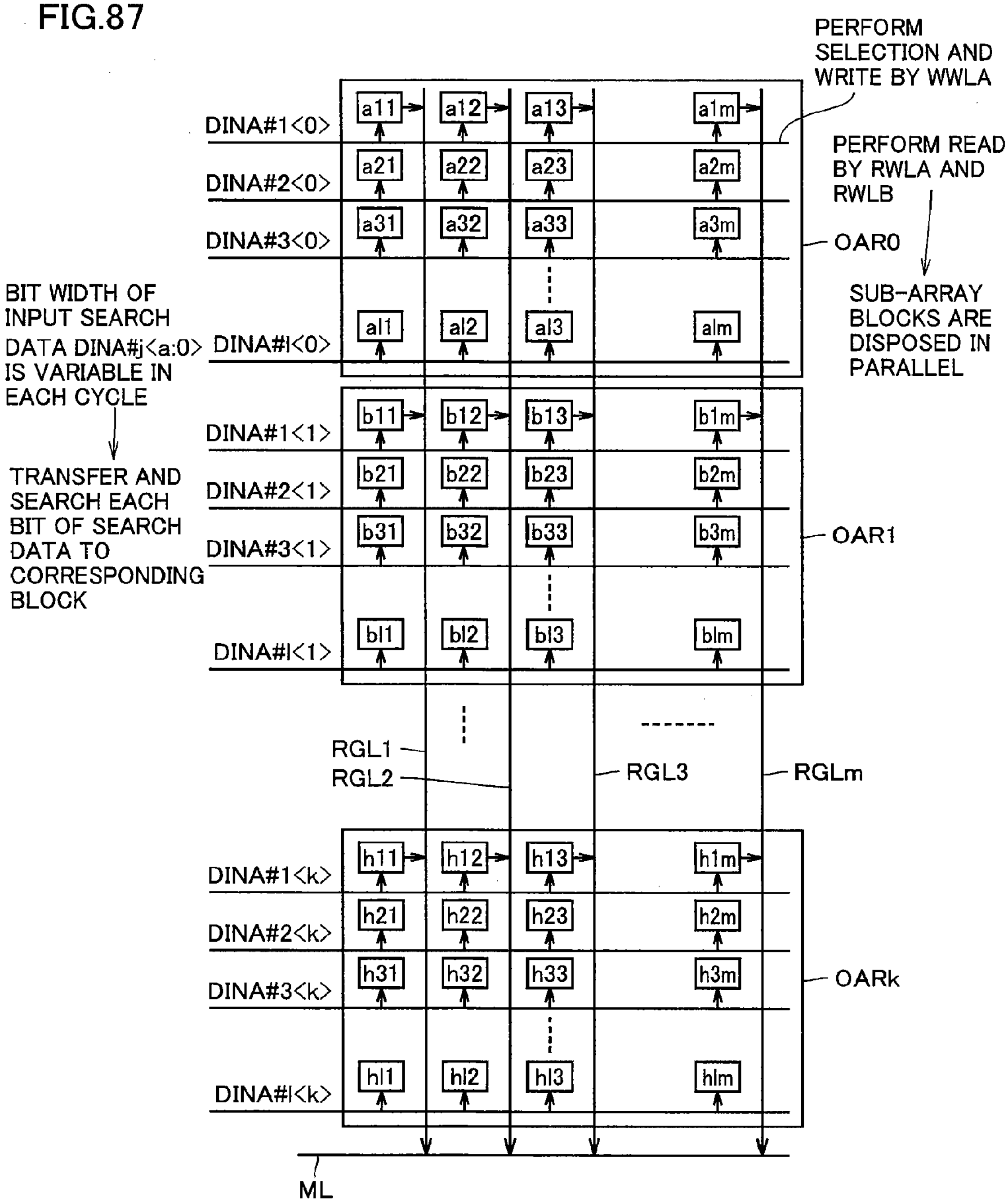
FIG. 87 schematically shows an example of the searching operation performed by the semiconductor signal processing device according to the ninth embodiment of the present invention.

FIG. 87 schematically shows the searching operation performed by the semiconductor signal processing device according to the ninth embodiment of the present invention. In FIG. 87, operator cell sub-array blocks OAR0 to OARk are used according to the search data bit width. The search target data is arranged in each bit in each row of operator cell sub-array blocks OAR0 to OARk. In the arrangement shown in FIG. 87, bits of one search target data are distributed in the same row and the same column of operator cell sub-array blocks OAR0 to OARk. For example, for search target data DINB#1<k:0>, corresponding bits a11, b11, . . . , and h11 are disposed in the first row and the first column of operator cell sub-array blocks OAR0 to OARk.

Two unit operator cells UOEA and UOEB are used for the data of one bit, and the complementary data bits are stored in the unit operator cells UOEA and UOEB. Accordingly, each of global read data lines RGL1 to RGLm shown in FIG. 87 corresponds to the pair of two global read data lines RGL<j> and RGL<j+1> shown in FIG. 86.

In the searching operation, the operator cell sub-arrays are selected in response to the block selection signal according to the bit width of search data DINA in operator cell sub-array blocks OAR0 to OARk, one-row unit operator cells are selected in each selected operator cell sub-array, and the search is performed on a plurality of search target data patterns.

FIG. 87 shows an example in which the search target data is stored supposing that data DINA#1 to DINA#1 are sequentially applied as the search data in one cycle. The data at the same bit position in the plurality of search target data are stored in one operator cell sub-array block. For example, on the assumption of the search data DINA#1 to DINA#1, the least significant bits DINA#1<0> to DINA#1<0> of search data are stored in the respective rows of operator cell sub-array OAR0. In a first search cycle, the least significant bit DINA#1<0> of the search data is compared to each bit of data bit string {a11, a12, . . . , a1m} on the first row of operator cell sub-array OAR0. In a second search cycle, the least significant bit DINA#2<1> of the search data is compared to each bit of data bit string {a21, a22, . . . , and a2m} on the second row of operator cell sub-array OAR0.

The bit width of transferred search data DINA is variable in each search cycle. When the operator cell sub-arrays are selected according to the bit width, the data bit string, for example, {a11, b11, . . . } that is disposed for the same global read line of the selected operator cell sub-arrays are selected as the search target data for input search data DINA and the match search is performed.

Figure 88:
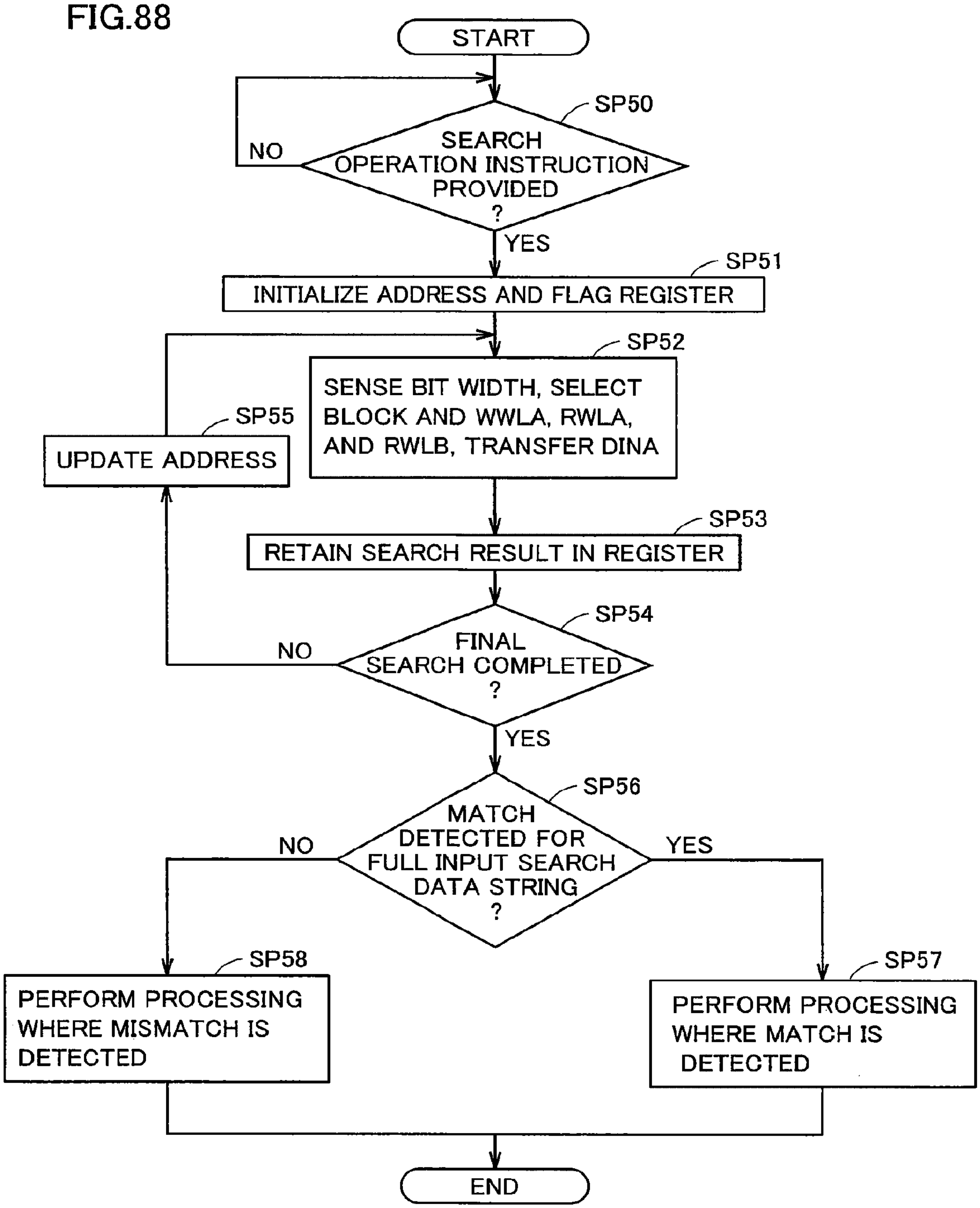
FIG. 88 is a flowchart representing the searching operation performed by the semiconductor signal processing device according to the ninth embodiment of the present invention.

FIG. 88 is a flowchart representing the searching operation performed by the semiconductor signal processing device according to the ninth embodiment of the present invention. Referring to FIG. 88, the searching operation performed on the search target data patterns shown in FIG. 87 will be described below.

The search target data bits are previously stored in the unit operator cells, respectively. First, a searching operation instruction is supplied (Step SP50). The searching operation instruction may be a command, or the searching operation instruction may be produced by analytical result of the data packet header in the data communication application. In the description below, the search data is not limited to, but by way of example, is described as the data pattern used to discriminate between access permission and access rejection included in the packet transferred in a communication network.

The address (word line address) and flag register are initialized according to the searching operation instruction (Step SP51). The route is set in the data path and the combination logic operational circuit, and the selected port is set to B port in the memory (operator) cell array.

When the searching operation is started, the bit width (w1+1) of the search data is identified in the first cycle through the header analysis, and the first search data string DINA#1<w1:0> is transferred along with bit width information w indicating the bit width (w1+1). Here, the numeral (w1+1) is a bit width in the first search cycle, and the bit width indicated by bit width information w is variable for each search cycle. In the configuration shown in FIG. 87, the bit width indicated by bit width information w of the search data ranges from 1 to (k+1). The block selection signal is set such that the (w1+1) operator cell sub-arrays are selected according to the search data bit width.

In the selected operator cell sub-array blocks OAR0 to OARw1, write word lines WWLA and SWWLA are driven to the selected state, the complementary bits are produced from each bit of search data string DINA#1<w1:0> and transferred to unit operator cells (UOEA and UOEB) of the selected row of the corresponding operator cell sub-array blocks, and the data are written and read (Step SP52). Therefore, the unit operator cells at the same position (first row) of operator cell sub-array blocks OAR0 to OARw1 are concurrently selected, and the data are written and read.

In response to the output signals of the sense amplifier circuits, the current selectively flows through each of global read data lines RGL1 to RGLm according to the results of pattern matching determination of input search data string DINA#1<w1:0> to (w1+1)-bit data patterns <a11, b11, . . . >, <a12, b12, . . . >, . . . , <a1m, b1m, . . . >, the voltage levels of global read data lines RGL1 to RGLm are raised higher than the reference voltage (in mismatching) or maintained at the pre-charged ground voltage level (in matching).

When one of global read data lines RGL1 to RGLm is at the L level of the pre-charge voltage level, one of the search target data patterns is matched with the pattern of input search data string DINA#1<x:0>. In this state, match line ML is discharged from the pre-charge voltage of the power supply voltage level by two-input OR gate OG0, register 50 and inverter 420. That the data pattern matched with search data string DINA#1<w1:0> is stored in operator cell sub-array blocks OAR0 to OARw1 is indicated by flag SRSLT at L level, for example, supplied from amplifying circuit AMP that amplifies the voltage on match line ML.

When each of global read data lines RGL1 to RGLm is not lower than the reference voltage level, every search target data pattern is not matched with the pattern of input search data string DINA#1<w1:0>, and the output signal of the two-input OR gate OG0 attains the H level. Accordingly, the output signal of inverter 420 attains the L level, and the match line is maintained at the power supply voltage level of the pre-charge voltage. Output flag SRSLT of amplifying circuit AMP is, for example, at the H level that is different from that in the match, and output flag SRSLT indicates the mismatch.

When mask bit MASK<1> is "0", for the corresponding search target data pattern, the searching operation is stopped and removed from a search candidate. The pattern of the search target candidate, that is, the searching range can be set by mask bit MASK<m:0>.

In the case where the match is detected in the current cycle, a match flag is set in flag register 540 according to search result flag SRSLT from amplifying circuit AMP (Step SP53).

Then, it is determined whether the search is completed for the final search data (Step SP54). When the search is not completed for the final search data, the word line address is updated (Step SP55), and the searching operation is repeated from Step SP52. Because the final search is not completed, when the another search data string DINA#2<w2:0> is transferred along with bit width information w in the next clock cycle, write word line WWLA and read word lines RWLA and RWLB of the next row are selected in the selected (w2+1) operator cell sub-arrays, and the pattern search is performed to (w2+1)-bit search target data patterns {a21, b21, . . . }, . . . , {a2m, . . . }.

The operation is repeatedly performed, and the match flag is set in flag register 540 shown in FIG. 82 when match line ML is in the state indicating the match in each search cycle. When the match is indicated in each search cycle, the match flags are set in the different registers allocated to the search cycles in flag register 540.

When it is determined that the search is completed for all the input search data in Step SP54, that is when the pattern search is completed for search data patterns {a11, b11, . . . }, . . . , {a1m, b1m, . . . } in the first search cycle, the determination of the state of the match flags of flag register 540 is made (Step SP56). When the match is detected for all the input search data strings while all the match flags allocated to the search cycles of flag register (540) are in the set state (for example, "1"), all transferred search data strings DINA#1<w1:0> to DINA1<w1:0> are matched with search target data patterns stored in operator cell sub-array blocks OAR0 to OARk. According to the match/mismatch detection result, the necessary action is performed depending on the system to which the semiconductor signal processing device is applied (Steps SP57 and SP58).

In such case, for example, an identification whether the data string for which the access is prohibited is transferred can be made in an NIDS (Network Intrusion Detection System).

In the ninth embodiment, the bit width of the data pattern string of the search target is variable for each search cycle. Alternatively, search data DINA may be the data having a fixed bit width. In this case, the bit width may appropriately be defined according to the application of the device. The configuration of control circuit 600 shown in FIG. 82 may be formed by a state machine, a sequence controller, or a hardware such that the operation flowchart shown in FIG. 88 is achieved. Thus, according to the ninth embodiment of the present invention, the bits of the search data are disposed being dispersed in the operator cell array blocks, the search result for the same search target data is connected to the common global read data line, and the determination of the pattern match/mismatch is made between the applied search data and the search target data according to the potential at the global data lines. Therefore, the searching operation can be performed at high speed.

[Tenth Embodiment]

Figure 89:
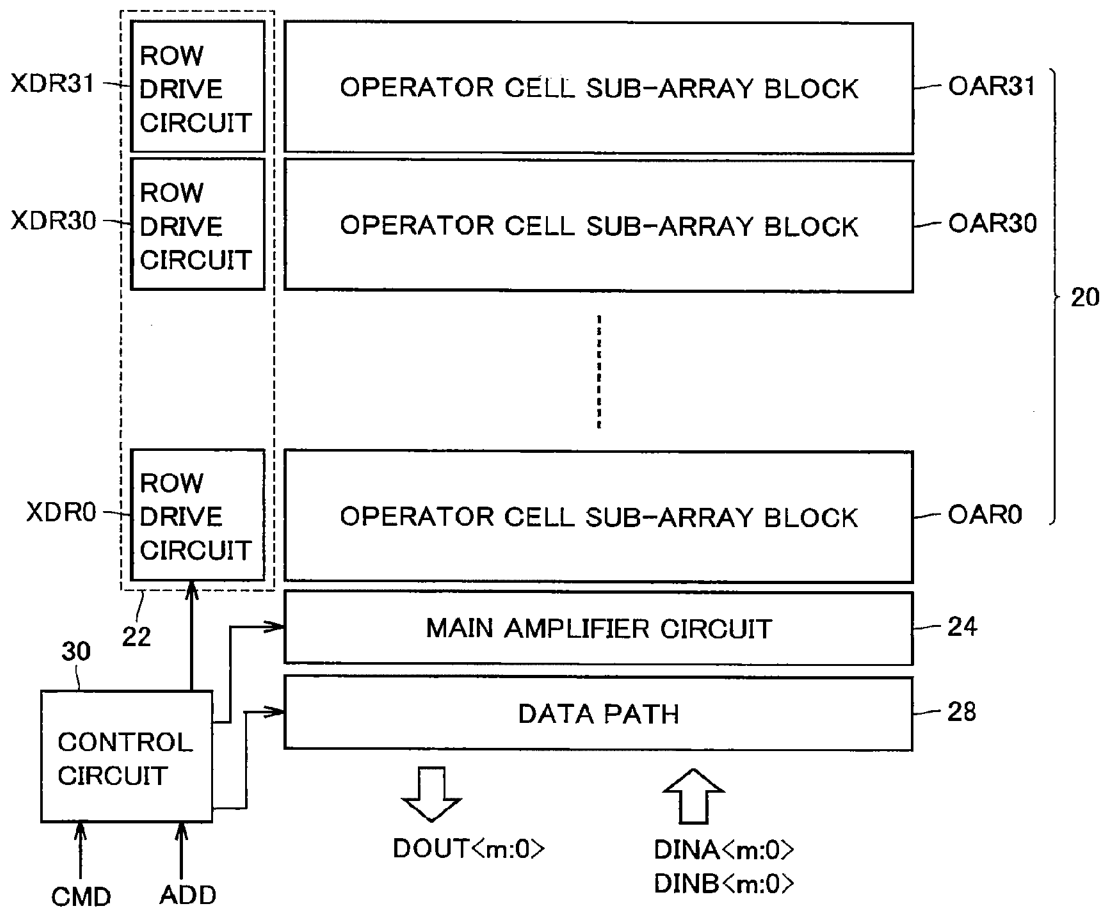
FIG. 89 schematically shows an entire configuration of a semiconductor signal processing device according to a tenth embodiment of the present invention.

FIG. 89 schematically shows an entire configuration of a semiconductor signal processing device according to a tenth embodiment of the present invention. The semiconductor signal processing device shown in FIG. 89 differs from the semiconductor signal processing device according to the first embodiment shown in FIG. 4 in that the function of combination logic circuit 26 arranged between main amplifier circuit 24 and data path 28 is not utilized. Only the buffer (BFF) of combination logic circuit 26 is used, and combination logic circuit (26) is not shown in FIG. 89. In FIG. 89, other configuration of the semiconductor signal processing device is the same as that of the semiconductor signal processing device shown in FIG. 4, and corresponding parts to those in the semiconductor signal processing device shown in FIG. 4 are designated by the same reference numerals, and the detailed description is not repeated.

The configuration of the unit operator cell shown in FIGS. 1 to 3 is used as the configuration of unit operator cell UOE. Accordingly, although the configuration of unit operator cell UOE is not shown, unit operator cell UOE includes two P-channel SOI transistors PQ1 and PQ2 and two N-channel SOI transistors NQ1 and NQ2, and the body regions of the SOI transistors are used as the storage nodes.

Control circuit 30 performs a specified operational processing and a predetermined control operation to operator cell sub-array according to a command CMD and an address ADD. Address ADD includes a block address for specifying an operator cell sub-array block and a row address AD for specifying a row of the unit operator cells.

Figure 90:
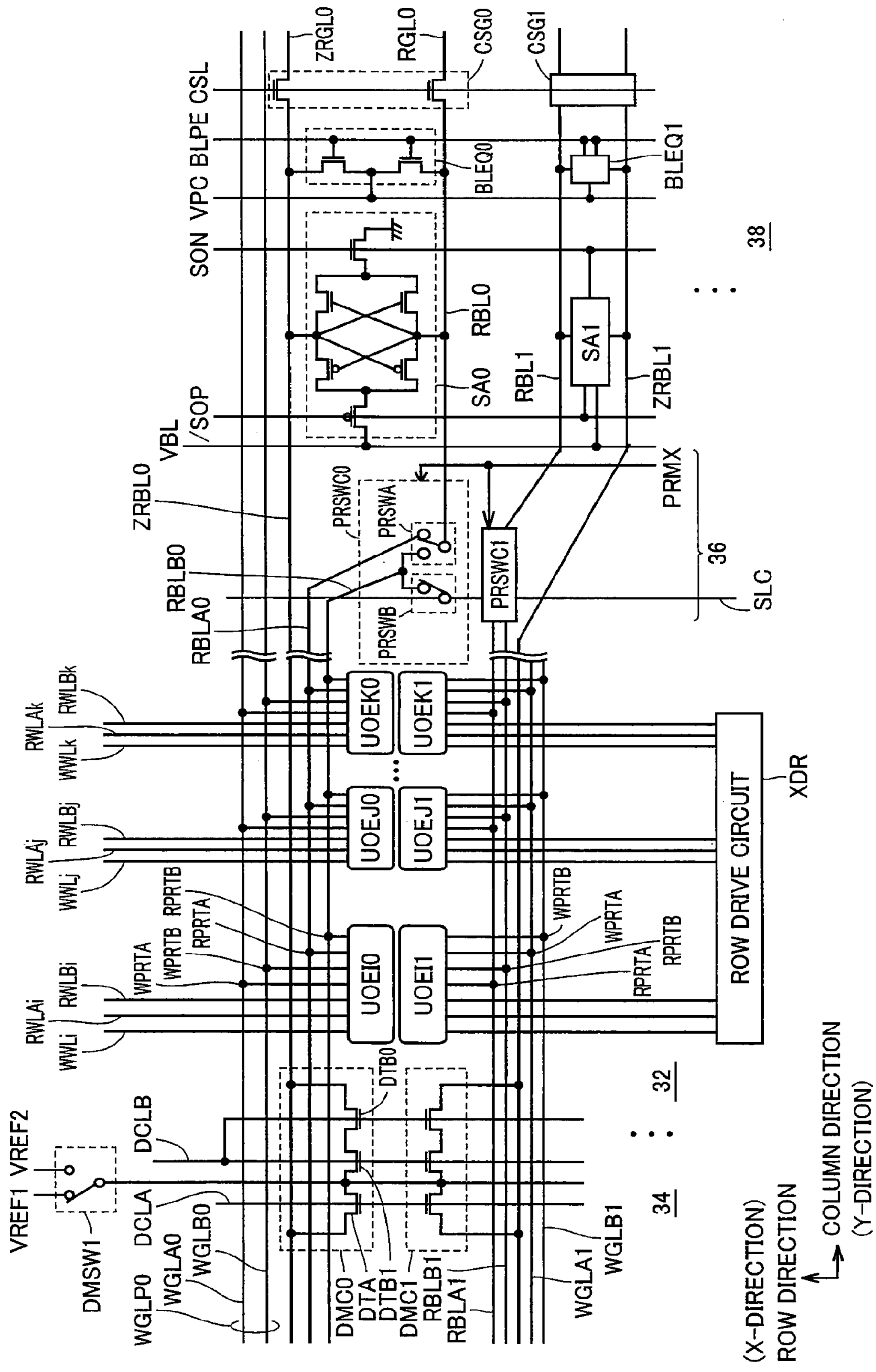
FIG. 90 shows an example of a specific configuration of an operator cell sub-array block OARI according to the tenth embodiment of the present invention.

FIG. 90 schematically shows a configuration of the operator cell sub-array block of the semiconductor signal processing device according to the tenth embodiment of the present invention. A configuration of a portion related to unit operator cells UOEI0 and UOEI1 belonging to unit operator cell row <i>, unit operator cells UOEJ0 and UOEJ1 belonging to unit operator cell row <j>, and unit operator cells UOEK0 and UOEK1 belonging to unit operator cell row <k> is representatively shown in FIG. 90.

Referring to FIG. 90, a read word line RWLAi, a read word line RWLBi, and a write word line WWLi are provided corresponding to unit operator cells UOEI0 and UOEI1. A read word line RWLAj, a read word line RWLBj, and a write word line WWLj are provided for unit operator cells UOEJ0 and UOEJ1. A read word line RWLAk, a read word line RWLBk, and a write word line WWLk are provided for unit operator cells UOEK0 and UOEK1.

Bit lines RBLA0 and RBLB0 and global write data lines WGLA0 and WGLB0 are provided for unit operator cells UOEI0, UOEJ0, and UOEK0, or unit operator cell column <0>. Global write data lines WGLA0 and WGLB0 are connected to write ports WPRTA and WPRTB of each of unit operator cells UOEI0, UOEJ0, and UOEK0. Bit lines RBLA0 and RBLB0 are connected to read ports RPRTA and RPRTB of each of unit operator cells UOEI0, UOEJ0, and UOEK0.

Dummy cells DMC0 and DMC1 are provided for each unit operator cell column. The configuration of dummy cells DMC0 and DMC1 is the same as that of the first embodiment shown in FIG. 6, an corresponding parts to those in the first embodiment shown in FIG. 6 are designated by the same reference numerals, and the detailed description is not repeated.

A switch DMSW1 is provided to transmit the reference voltage to dummy cells DMC0 and DMC1. Switch DMSW1 supplies one of reference voltage VREF1 from a reference voltage source VREF1 (the power supply and the supply voltage are designated by the same reference symbol) and a reference voltage VREF2 from a reference voltage source VREF2 to dummy cells DMC0 and DMC1 according to an operation mode.

Reference voltage source VREF1 supplies the current of an amount intermediate the current amounts that are supplied from SOI transistors NQ1 and NQ2 included in unit operator cell UOEI0 when in the high threshold voltage and low threshold voltage. For example, reference voltage VREF1 is set lower than a half of power supply voltage VCC. Reference voltage VREF2 supplies the current that is larger than the current supplied to the bit line when one of series transistors NQ1 and NQ2 of the unit operator cell is in the high threshold voltage and that is smaller than the current amount supplied to the bit line when both series transistors NQ1 and NQ2 are in the low threshold voltage.

Read port selection circuit 36 includes a plurality of switch circuits PRSWC that are provided corresponding to the unit operator cell rows. For example, a switch circuit PRSWC0 is provided for bit lines RBLA0 and RBLB0. Switching circuit PRSWC0 includes switches PRSWA and PRSWB. Switch PRSWA connects one of bit lines RBLA0 and RBLB0 to sense bit line RBL0 in response to a port selection signal PRMX. Complementary bit line ZRBL0 connected to the dummy cell is connected to sense amplifier SA0.

Switch PRSWB selectively connects bit line RBLB0 and common source line SLC in response to a port selection signal PRMX. Therefore, in unit operator cell UOE, the data stored in SOI transistor NQ1, the data stored in SOI transistor NQ2, and the logic-operation result of data stored in SOI transistors NQ1 and NQ2 can selectively be read as described later.

Dummy cells DMC1 and switching circuits PRSWC1 are also provided corresponding to unit operator cells UOEI1, UOEJ1, and UOEK1, or unit operator cell column <1>, and the similar connection control is performed.

Port selection signal PRMX is a multi-bit signal, the connection of port selection signal PRMX can be set for each bit line pair.

The configuration of sense amplifier band 38 is similar to that of the first embodiment shown in FIG. 6, and corresponding parts to those in the first embodiment shown in FIG. 6 are designated by the same reference numerals, and the detailed description is not repeated.

Row drive circuit XDR concurrently drives one or a plurality of unit operator cell rows to the selected state. Row drive circuit XDR also concurrently drives a plurality of dummy cells DMC corresponding to one or a plurality of concurrently-selected unit operator cell rows. One or a plurality of selected dummy cells DMC supply one of the two kinds of reference currents to corresponding complementary bit lines ZRBL in response to which is selected between dummy cell selection signals DCLA and DCLB. Accordingly, in memory (operator) cell array MLA, the data stored in the plurality of unit operator cells UOE corresponding to one or a plurality of entries are concurrently read and written.

FIG. 91 schematically shows a connection manner of the transistors to the sense amplifier when the two N-channel SOI transistors are selected in the unit operator cell. The connection manner of the unit operator cell to sense amplifier SA shown in FIG. 91 is similar to that of SOI transistors NQ1, NQ2, DTB0 and DTB1 to sense amplifier SA shown in FIG. 10. Switching circuit DMSW1 selects reference voltage VREF1 as reference voltage VREF. In port selection circuit 36, switching circuit PRSWC (PRSWC0 and PRSWC1) connects B port bit line RBLB and sense bit line RBL. Other configuration is similar to that shown in FIG. 10, corresponding parts to those in the configuration shown in FIG. 10 are designated by the same reference symbols, and the detailed description is not repeated.

In the data read, the operation waveform is similar to that shown in FIG. 11, the amount of currents flowing through bit lines RBL and ZRBL depends on the states of SOI transistors NQ1 and NQ2, and the output signal of sense amplifier SA differs accordingly. The operation is similar to that of the first embodiment shown in FIG. 11. In the following description, in SOI transistors NQ1 and NQ2, a high-threshold voltage state is correlated to the state of storing data "0", and a low-threshold voltage state is correlated with the state of storing data "1".

FIG. 92 shows, in a list form, a relationship between storage data and a logical value of the output signal of the sense amplifier in a connection manner of the unit operator cell and dummy cell shown in FIG. 91. As shown in FIG. 92, there are four states as a combination of the data stored in SOI transistors NQ1 and NQ2. In a state S(0,0), both the data stored in SOI transistors NQ1 and NQ2 are the data "0". In a state S(1,0), the data stored in SOI transistors NQ1 and NQ2 are the data "1" and data "0", respectively. In a state S(0,1), the data stored in SOI transistors NQ1 and NQ2 are the data "0" and data "1", respectively. In a state S(1,1), both the data stored in SOI transistors NQ1 and NQ2 are the data "1".

FIG. 93 shows a relationship between a read potential and a current flowing through bit lines RBL and ZRBL during the data read. In FIG. 93, a vertical axis indicates potentials at bit lines RBL and ZRBL, and a horizontal axis indicates time.

Switching circuit DMSW selects reference voltage VREF1. reference voltage VREF1 is at a level between the voltage (power supply voltage VCC level) supplied to source line SL and bit line pre-charge voltage VPC.

For example, source line SL is at the voltage level of power supply voltage VCC level, and the voltage at source line SL is higher than reference voltage VREF1 supplied to dummy cell DMC.

When the data "0" is stored in at least one of SOI transistors NQ1 and NQ2 (state S(1,0), state S(0,1), and state S(0,0)), because the at least one SOI transistor is in the high threshold voltage, the amount of current flowing through the unit operator cell is smaller than the amount of current flowing through dummy cell DMC.

On the other hand, when the data "1" is stored in SOI transistors NQ1 and NQ2 (state S(1,1)), because both SOI transistors NQ1 and NQ2 is in the low threshold voltage, the amount of current flowing to the bit line through the unit operator cell is larger than the amount of current flowing through dummy cell DMC.

Sense amplifier activation signals /SOP and SON are set at a logical low level (L level) and a logical high level (H level) to activate sense amplifier SA. The data (potential or current amount) are read onto bit lines RBL and ZRBL and sense amplifier SA differentially amplifies the data.

Then, read gate CSG shown in FIG. 90 is selected in accordance with read gate selection signal CSL and transmits the output signal of sense amplifier SA to corresponding main amplifier MA.

Accordingly, as shown in FIG. 92, similarly to the first embodiment, output signal SOUT of the sense amplifier attains "1" in unit operator cell UOE only in state S(1,1), that is, only when the data "1" is stored in SOI transistors NQ1 and NQ2. On the other hand, output signal SOUT of sense amplifier SA attains "0" in the states S(1,0), S(0,1) and S(0,0), that is, when the data "1" is stored in at least one of SOI transistors NQ1 and NQ2. Thus, output signal SOUT of sense amplifier SA indicates the AND operational result of the data stored in SOI transistors NQ1 and NQ2. When output signal SOUT of sense amplifier SA is inverted, the NAND operational result of the data stored in the two unit operator cells is obtained.

FIG. 94 schematically shows another connection manner when the SOI transistor is connected to the sense amplifier. Referring to FIG. 94, one SOI transistor NQ1 is connected between source line SL and bit line RBL. In dummy cell DMC, dummy cell selection signal DCLA is activated, and dummy transistor DTA is connected between reference voltage source VREF and complementary bit line ZRBL.

In such case, in FIG. 90, switching circuit PRSWC0 connects bit line RBLA0 and bit line RBL0. Row drive circuit XDR drives read word line RWLA and dummy transistor selection line DCLA to the selected state.

FIG. 95 shows, in a list form, the relationships between the storage data and the logical value of the output signal of the sense amplifier in the connection manner of the unit operator cell and dummy cell shown in FIG. 94. Reference voltage VREF1 is selected as the reference voltage.

In FIG. 95, when the data "0" is stored in SOI transistor NQ1 (state S(0)), the amount of current flowing from dummy transistor DTA to complementary bit line ZRBL is larger than the amount of current flowing from source line SL through SOI transistor NQ1 to bit line RBL through read port RPRTA. Accordingly, output signal SOUT of sense amplifier SA attains logical low level ("0"). On the other hand, when the data "1" is stored in SOI transistor NQ1 (state S(1)), the amount of current flowing from SOI transistor NQ1 to bit line RBL through read port RPRTA is larger than the amount of current flowing through dummy transistor DTA. Accordingly, output signal SOUT of sense amplifier SA attains logical high level ("1").

Accordingly, the output signal of sense amplifier SA assumes the data of the same logical value as that of the data stored in SOI transistor NQ1. When the output signal of sense amplifier SA is inverted, or when the inverted value of the write data is stored in SOI transistor NQ1 and read therefrom, the NOT operational result of the write data can be obtained as the output of sense amplifier SA.

FIG. 96 schematically shows a connection manner of the transistor to the sense amplifier when one SOI transistor is selected in the unit operator cell. Referring to FIG. 96, one SOI transistor NQ2 is connected between source line SLEX and bit line RBL in selecting SOI transistor NQ2. In dummy cell DMC, dummy cell selection signal DCLA is activated, and dummy transistor DTA is connected between reference voltage source VREF and complementary bit line ZRBL. Switching circuit PRSWC (for example, PRSWC0) shown in FIG. 90 connects bit line RBLA (for example, bit line RBLA0) and sense bit line RBL (for example, RBL0) and connects bit line RBLB0 and common source line SLC. Row drive circuit XDR drives read word line RWLA and dummy transistor selection line DCLA to the selected state.

Figures 97, 98, 99:
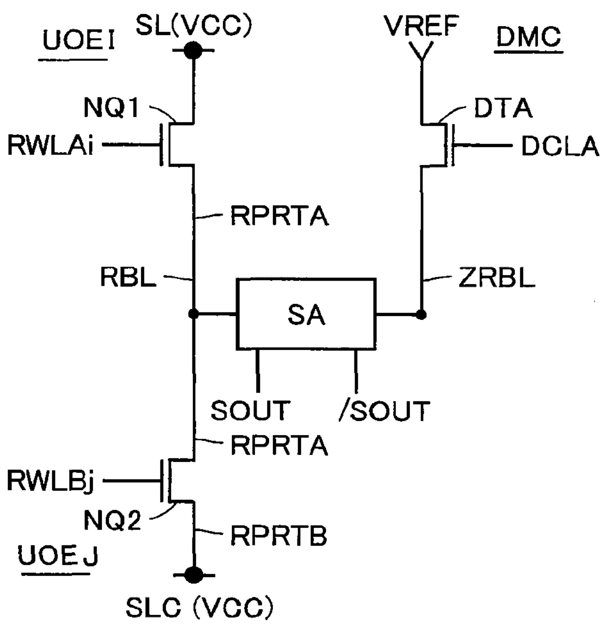
FIG. 97 shows, in a list form, the relationship between the storage data and the logical value of the output signal of the sense amplifier in a connection manner of the unit operator cell and dummy cell of FIG. 96.
FIG. 98 schematically shows a manner in which the SOI transistor and the sense amplifier are connected when two unit operator cells are selected.
FIG. 99 shows, in a list form, the relationship between the storage data and the logical value of the output signal of the sense amplifier in the connection manner of FIG. 98.

FIG. 97 shows, in a list form, the relationships between the storage data and the logical value of the output signal of the sense amplifier in a connection manner of the unit operator cell and dummy cell shown in FIG. 96. Switching circuit DMSW selects reference voltage VREF1 as the reference voltage VREF. Common source line SLC is at the voltage level of power supply voltage VCC.

Therefore, similarly to the manner when SOI transistor NQ1 shown in FIG. 94 is selected, the current is supplied to sense amplifier SA, the output signal of sense amplifier SA is at the logical low level ("0") when the data "0" is stored in SOI transistor NQ2, that is, SOI transistor NQ2 is in state S(0). On the other hand, the output signal of sense amplifier SA attains the logical high level ("1") when the data "1" is stored in SOI transistor NQ2, that is, SOI transistor NQ2 is in state S(1).

In the connection manner, the output signal of sense amplifier SA also becomes the data of the same logical value as that of the data stored in SOI transistor NQ2. When the output signal of sense amplifier SA is inverted, or when the inverted value of the write data is stored in SOT transistor NQ2 and read therefrom, the NOT operational result of the write data can be obtained as the output of sense amplifier SA. Accordingly, in the SOI transistor selection manner shown in FIGS. 94 and 96, the data stored in SOI transistors NQ1 and NQ2 of the unit operator cell can be read and the unit operator cell can be used as the memory element.

The read operation in the case where two unit operator cell rows <i> and <j> are selected in semiconductor signal processing device 101 will be described below.

FIG. 98 schematically shows a connection manner in which the SOI transistor and the sense amplifier are connected when unit operator cells UOEi and UOEj of unit operator cell rows <i> and <j> are selected. Unit operator cells UOEI and UOEJ are located in the same column and connected to sense amplifier SA through bit line RBL.

In unit operator cell UOEI, SOI transistor NQ1 is selected through read word line RWLi and connected to sense bit line RBL through port RPRTA. In unit operator cell UOEJ, SOI transistor NQ2 is selected through read word line RWLBj. Switch PRSWB of corresponding switching circuit PRSWC connects common source line SLC to bit line RBLB. SOI transistor NQ2 connects sense amplifier SA through port RPRTA. That is, SOI transistors NQ1 and NQ2 are connected in parallel with each other to sense bit line RBL.

For dummy cell DMC, dummy transistor DTA or series dummy transistors DTB0 and DTB1 are selected according to an operation mode. In FIG. 98, the state in which dummy transistor DTA is selected in dummy cell DMC is shown by way of example.

FIG. 99 shows, in a list form, the relationship between the storage data and the logical value of the output signal of the sense amplifier in the SOI transistor selection manner shown in FIG. 98. One SOI transistor is selected in each of two unit operator cells UOEI and UOEJ disposed in the same unit operator cell column on unit operator cell rows <i> and <j>. That is, N-channel SOI transistor NQ1 (hereinafter sometimes referred to as N-channel SOI transistor NQ1 (UOEI)) of unit operator cell UOEI on unit operator cell row <i> and N-channel SOI transistor NQ2 (hereinafter sometimes referred to as N-channel SOI transistor NQ2 (UOEJ)) of unit operator cell UOEJ on unit operator cell row <j> are selected as shown in FIG. 98. Selected SOI transistors NQ1 and NQ2 belong to the same unit operator cell column, and SOI transistors NQ1 and NQ2 are connected to sense amplifier SA through sense bit line RBL.

As shown in FIG. 99, there are four states as a combination of data stored in SOI transistors NQ1 (UOEI) and NQ2 (UOEJ). In a state S(0,0), both the data stored in SOI transistors NQ1 (UOEI) and NQ2 (UOEJ) are the data "0". In a state S(1,0), the data stored in SOI transistors NQ1 (UOEI) and NQ2 (UOEJ) are the data "1" and data "0", respectively. In a state S(0,1), the data stored in SOI transistors NQ1 (UOEI) and NQ2 (UOEJ) are the data "0" and data "1", respectively. In a state S(1,1), both the data stored in SOI transistors NQ1 (UOEI) and NQ2 (UOEJ) are the data "1".

In writing the data, a plurality of unit operator cells UOEI corresponding to unit operator cell row <i> and a plurality of unit operator cells UOEJ corresponding to unit operator cell row <j> are individually selected, the threshold voltages of SOI transistors NQ1 and NQ2 are set in the plurality of selected unit operator cells UOE. That is, in writing the data, write word lines WWL<i> and WWL<1> are sequentially selected, and the voltages are applied to global write data line pair WGLP according to the write data using the write drivers (not shown).

In reading the data, the plurality of unit operator cells UOEI corresponding to unit operator cell row <i> and the plurality of unit operator cells UOEJ corresponding to unit operator cell row <j> are selected in parallel, and SOI transistors NQ are concurrently connected to bit lines RBL in the plurality of selected unit operator cells UOE. Accordingly, in reading the data, the currents passed through SOI transistors NQ connected to the same bit line RBL are combined to flow through each bit line RBL.

For example, A-port read word line RWLA is selected for the odd-numbered row read word line, and B-port read word line RWLB is driven to the selected state for the even-numbered row read word line.

Alternatively, SOI transistor NQ1 may be selected in unit operator cells UOEI and UOEJ. It is only necessary to select one SOI transistor in each of two unit operator cells and connect the selected SOI transistors in parallel to the sense amplifier.

In dummy cell DMC of each unit operator cell column, one of dummy transistor DTA and series dummy transistors DTB0 and DTB1 is selected in reading the data. That is, one of dummy cell selection signals DCLA and DCLB is driven to the selected state. The amount of current passed through dummy cell DMC is adjusted by selecting one of reference voltages VREF1 and VREF2. The case will be described, in which dummy cell selection signal DCLA is driven to the selected state to select dummy transistor DTA and dummy transistor DTA is connected to reference voltage source VREF1 as shown in FIG. 98.

FIG. 100 shows a relationship between the read potential and the currents flowing through bit lines RBL and ZRBL during data read in the connection and arrangement shown in FIG. 98. In FIG. 100, a vertical axis indicates potentials at bit lines RBL and ZRBL and a horizontal axis indicates time.

In FIG. 100, when SOI transistors NQ1 (UOEI) and NQ2 (UOEJ) are in the state S(0,0), because SOI transistors NQ1 and NQ2 have the high threshold voltage, the amount of current flowing through read bit line RBL becomes the minimum.

On the other hand, in the state S(1,1), because SOI transistors NQ1 (UOEI) and NQ2 (UOEJ) have the low threshold voltage, the amount of current flowing from unit operator cells UOEI and UOEJ to sense amplifier SA through sense bit line RBL becomes the maximum.

In the states S(1,0) and S(0,1), the low threshold voltage and the high threshold voltage are combined, and the current intermediate between the bit line currents of states S(0,0) and S(1,1) flows. Accordingly, in the cases of the states S(1,0) and S(0,1), the bit line attains the read potential between bit line read potentials at the states S(0,0) and S(1,1).

Reference voltage VREF1 is selected as reference voltage VREF, and reference voltage VREF1 is set at voltage level that is lower than a half of power supply voltage VCC. In this state, the current flowing through dummy transistor DTA can be set larger than the current flowing through bit line RBL in state S(0,0) and smaller than the current flowing through bit line RBL in states S(0,1) and S(1,0). Accordingly, in selecting dummy transistor DTA, the potential at complementary bit line ZRBL can be set between the potential in state S(0,0) and the potentials in states S(1,0) and S(0,1). In such case, current Id1 flowing through dummy transistor DTA can be expressed as follows.

$$I1>Id1>1h,$$

$$2\times Ih<Id1<Ih+I1$$

Here, Ih is a current flowing through SOI transistor NQ in the high threshold voltage state and I1 is a current flowing through SOI transistor NQ in the low threshold voltage state.

The operation in the case where reference voltage VREF2 is selected as reference voltage VREF in the connection and arrangement shown in FIG. 98 will be described below.

Reference voltage VREF2 is higher than reference voltage VREF1 by a predetermined value. In the condition of reference voltage VREF2, the current that is smaller than the current flowing through read bit line RBL when two SOI transistors NQ1 and NQ2 has the low threshold voltages and larger than the current flowing through unit operator cell UOE when one SOI transistor NQ has the low threshold voltage can be passed to complementary bit line ZRBL. Accordingly, in selecting dummy transistor DTA, the potential at complementary bit line ZRBL can be set between the potential in states S(1,0) and S(0,1) and the potential in state S(1,1). In such case, current Id2 flowing through dummy transistor DTA can be expressed as follows.

$$I1<Id2,$$

$$2\times I1>Id2>1h+I1.$$

Sense amplifier SA differentially amplifies the potentials or currents of bit line RBL and ZRBL to read the data stored in unit operator cells UOEI and UOEJ. In sense amplifier SA, binary determination of the bit line potential or bit line current is made using the potential at dummy cell DMC or the current passed through dummy cell DMC as the reference value. Accordingly, the output of sense amplifier SA indicates one of two classifications into which the combination of the one-bit data stored in each of unit operator cells UOEI and UOEJ is classified on the basis of the voltage level of reference voltage VREF, so that the logic operation can be performed to the data stored in unit operator cells UOEI and UOEJ by sense amplifier SA.

As shown in FIG. 99, in state S(0,0), both SOI transistors NQ1 (UOEI) and NQ2 (UOEJ) are in the high threshold voltage state, and the data “0” is stored in SOI transistors NQ1 (UOEI) and NQ2 (UOEJ). In this case, even if any of reference voltage VREF1 and reference voltage VREF2 is selected, as shown in FIG. 100, the current flowing through bit line RBL is smaller than the current flowing through complementary bit line ZRBL, and the potential at bit line RBL is lower than the potential at complementary bit line ZRBL. Therefore, the output signal of the sense amplifier attains “0”.

In the state S(1,0) and the state S(0,1), one of SOI transistors NQ1 (UOEI) and NQ2 (UOEJ) is in the high threshold voltage state and the other is in the low threshold voltage state. Accordingly, in the case where the reference voltage VREF1 is selected, the current flowing through bit line RBL is larger than the current flowing through complementary bit line ZRBL, and the potential at bit line RBL is higher than the potential at complementary bit line ZRBL. Therefore, the output signal of the sense amplifier attains “1”. In the case where reference voltage VREF2 is selected, the current flowing through bit line RBL is smaller than the current flowing through complementary bit line ZRBL, and the potential at bit line RBL is lower than the potential at complementary bit line ZRBL. Therefore, the output signal of the sense amplifier attains “0”.

In the state S(1,1), both SOI transistors NQ1 (UOEI) and NQ2 (UOEJ) are in the low threshold voltage state, and the data “1” is stored in SOI transistors NQ1 (UOEI) and NQ2 (UOEJ). In this condition, even if any of reference voltage VREF1 and reference voltage VREF2 is selected, as shown in FIG. 100, the current flowing through bit line RBL is larger than the current flowing through complementary bit line ZRBL, and the potential at bit line RBL is higher than the potential at complementary bit line ZRBL. Therefore, the output signal of the sense amplifier attains “1”.

As shown in FIG. 99, in the case where reference voltage VREF1 is selected, the sense amplifier supplies the OR operational result of the data stored in unit operator cells UOEI and UOEJ. On the other hand, in the case where reference voltage VREF2 is selected, the sense amplifier supplies the AND operational result of the data stored in unit operator cells UOEI and UOEJ.

Preferably, the current sensing type sense amplifier is used as the sense amplifier, because current sensing type sense amplifier has the sensing operation faster than that of the voltage sensing type sense amplifier. As described later, a current-mirror type sense amplifier is used as sense amplifier SA instead of the cross-coupled latch type sense amplifier shown in FIG. 90, and the sensing operation is performed at high speed according to the bit line current.

(First Modification)

FIG. 101 shows a correlation between the selection manner of the unit operator cells and the output signal of the sense amplifier in a modification of the tenth embodiment of the present invention. In FIG. 101, three unit operator cell rows <i>, <j>, and <k> are concurrently selected.

One SOI transistor is selected in each of the three unit operator cells on unit operator cell rows <i>, <j>, and <k> and on the same unit operator cell column.

N-channel SOI transistor NQ1 (UOEI), N-channel SOI transistor NQ1 (UOEJ), and N-channel SOI transistor NQ1 (UOEK) are selected in FIG. 101. The SOI transistors belong to the same unit operator cell column, four SOI transistors NQ1 are connected in parallel with each other to sense bit line RBL.

As shown in FIG. 101, there are eight states as a combination of the data stored in SOT transistors NQ1 (UOEI), NQ1 (UOEJ), and NQ1 (UOEK). Similarly to the tenth embodiment, in the expression of state S(A,B,C), the letter A designates a threshold voltage state of SOI transistor NQ1(UOEI), the letter B designates a threshold voltage state of SOI transistor NQ1(UOEJ), and the letter C designates a threshold voltage state of SOI transistor NQ1 (UOEK). For example, in a state S(0,0,0), the data stored in SOI transistors NQ1 (UOEI), NQ1 (UOEJ), and NQ1 (UOEK) are the data "0". In a state S(1,1,1), the data stored in SOI transistors NQ1 (UOEI), NQ1 (UOEJ), and NQ1 (UOEK) are the data "1".

In writing the data, a plurality of unit operator cells UOEI corresponding to unit operator cell row <i>, a plurality of unit operator cells UOEJ corresponding to unit operator cell row <j>, and a plurality unit operator cells UOEK corresponding to unit operator cell row <k> are individually selected, and the threshold voltage of SOI transistor NQ1 (and NQ2) is (are) set in the plurality of selected unit operator cells UOE. That is, in writing the data, write word lines WWL<i>, WWL<j>, and WWL<k> are sequentially selected, and the write driver (not shown) applies the voltage to each global write data line pair WGLP according to the write data.

In reading the data, the plurality of unit operator cells UOEI corresponding to unit operator cell row <i>, the plurality of unit operator cells UOEJ corresponding to unit operator cell row <j>, and the plurality of unit operator cells UOEK corresponding to unit operator cell row <k> are selected in parallel, and SOI transistors NQ1 are connected in parallel with each other to sense bit lines RBL in the plurality of selected unit operator cells UOE. Accordingly, in reading the data, the currents flowing through SOI transistors NQ1 connected to the same bit line RBL are combined and flow through each bit line RBL.

The following configuration can be used as the configuration for concurrently driving read word lines RWLi, RWLj, and RWLk to the selected state. That is, a latch circuit is provided at an output portion of the read word line driver. For example, the read word line address is produced by a counter, and the three read word lines are sequentially specified in the activated period of time of read word line enable signal RWLEN. When read word line enable signal RWLEN is inactivated, the latch circuit of the output portion of the read word line driver is reset, and the read word line in the selected state is driven to the non-selected state. Therefore, the three read word lines can concurrently be set at the selected state starting at an arbitrary address without utilizing a complicated circuit configuration.

In dummy cell DMC of each unit operator cell column, either of dummy transistor DTA and dummy transistors DTB0 and DTB1 is selected in reading the data. That is, one of dummy cell selection signals DCLA and DCLB is selected. The amount of current flowing through dummy cell DMC is adjusted by selecting one of reference voltages VREF1 and VREF2. The case will be described, in which dummy cell selection signal DCLA is driven to the selected state to select dummy transistor DTA and reference voltage VREF1 is selected as reference voltage VREF.

FIG. 102 shows a relationship between the read potential and the currents flowing through bit lines RBL and ZRBL in data reading. In FIG. 102, a vertical axis indicates potentials at bit lines RBL and ZRBL and a horizontal axis indicates time.

As shown in FIG. 102, when SOI transistors NQ1 (UOEI), NQ1 (UOEJ), and NQ1 (UOEK) are in state S(0,0,0), because SOI transistors NQ1 have the high threshold voltage, the amount of current flowing through sense bit line RBL becomes the minimum.

On the other hand, in a state S(1,1,1), because SOI transistors NQ1 (UOEI), NQ1 (UOEJ), and NQ1 (UOEK) have the low threshold voltage, the amount of current flowing through sense bit line RBL becomes the maximum.

In states S(1,0,0), S(0,1,0), and S(0,0,1), two of SOI transistors NQ1 (UOEI), NQ1 (UOEJ), and NQ1 (UOEK) have the high threshold voltages and the other one of SOI transistors NQ1 (UOEI), NQ1 (UOEJ), and NQ1 (UOEK) has the low threshold voltage. In this state, the current flows in an amount between the bit line currents in the states S(0,0,0) and S(1,1,1). Accordingly, in states S(1,0,0), S(0,1,0), and S(0,0,1), the bit line read potential is located between those in the states S(0,0,0) and S(1,1,1).

In states S(1,1,0), S(1,0,1), and S(0,1,1), two of SOI transistors NQ1 (UOEI), NQ1 (UOEJ), and NQ1 (UOEK) have the low threshold voltages and the other one of SOI transistors NQ1 (UOEI), NQ1 (UOEJ), and NQ1 (UOEK) has the high threshold voltage. In this state, the current flows in an amount between the bit line currents flowing in the states S(0,0,0) and S(1,1,1), and the bit line current becomes larger than those in the states S(1,0,0), S(0,1,0), and S(0,0,1). Accordingly, in states S(1,1,0), S(1,0,1), and S(0,1,1), the bit line read potential is located between those in the states S(1,0,0), (0,1,0), and S(0,0,1) and state S(1,1,1).

Reference voltage VREF1 is selected as reference voltage VREF, and reference voltage VREF1 is set at voltage level that is lower than half a power supply voltage VCC. In this state, the current flowing through dummy transistor DTA can be set larger than the current flowing through bit line RBL in state S(0,0,0) and smaller than the current flowing through bit line RBL in states S(1,0,0), S(0,1,0), and S(0,0,1). Accordingly, in selecting dummy transistor DTA, the potential at complementary bit line ZRBL can be set to a level between the potential in state S(0,0,0) and the potentials in states S(1,0,0), S(0,1,0), and S(0,0,1). In such case, current Id1 flowing through dummy transistor DTA can be expressed as follows.

$$I1 > Id1 > Ih,$$

$$3 \times 1h < Id1 < 2Ih + I1.$$

Here, Ih is a current flowing through SOI transistor NQ in the high threshold voltage state and I1 is a current flowing through SOI transistor NQ in the low threshold voltage state.

When reference voltage source VREF2 is selected as reference voltage VREF and dummy cell selection signal DCLA is driven to the selected state to select dummy transistor DTA, the output signal of the sense amplifier becomes the states shown in the column of reference voltage source VREF2 shown in FIG. 101.

Reference voltage VREF2 is higher than reference voltage VREF1 by a predetermined value. With the use of reference voltage VREF2, when one SOI transistor NQ is selected in unit operator cell UOE and the SOI transistor NQ has the low threshold voltage, the current that is larger than the current flowing through unit operator cell UOE can be passed through complementary bit line ZRBL. Accordingly, in selecting dummy transistor DTA, the potential at complementary bit line ZRBL can be set at a level between the potentials in states S(1,1,0), S(1,0,1), and S(0,1,1) and the potential in state S(1, 1,1). In such case, current Id2 flowing through dummy transistor DTA can be expressed as follows.

$$I1<Id2,$$

$$3\times 1h>Id2>Ih+2\times I1.$$

Sense amplifier SA differentially amplifies the potentials or currents of bit lines RBL and ZRBL to read the data stored in unit operator cells UOEI, UOEJ, and UOEK. In sense amplifier SA, the binary determination of the bit line potential or bit line current is made using the potential at dummy cell DMC or the current passed through dummy cell DMC as the standard value. Accordingly, the output of sense amplifier SA indicates one of two classifications into which the combination of the one-bit data stored in each of unit operator cells UOEI, UOEJ, and UOEK is bi-classified according to the voltage level of reference voltage VREF, so that the logic operation can be performed to the data stored in three unit operator cells UOEI, UOEJ, and UOEK by sense amplifier SA.

As shown in FIG. 101, in state S(0,0,0), SOI transistors NQ1 (UOEI), NQ1 (UOEJ), and NQ1 (UOEK) are in the high threshold voltage state, and the data "0" is stored in SOI transistors NQ1 (UOEI), NQ1 (UOEJ), and NQ1 (UOEK). In this state, even if any of reference voltage VREF1 and reference voltage VREF2 is selected, as shown in FIG. 102, the current flowing through bit line RBL is smaller than the current flowing through complementary bit line ZRBL, and the potential at bit line RBL is lower than the potential at complementary bit line ZRBL. Therefore, the output signal of the sense amplifier attains "0".

In the states S(1,0,0), S(0,1,0), S(0,0,1), S(1,1,0), S(1,0,1), and S(0,1,1), at least one of SOI transistors NQ1 (UOEI), NQ1 (UOEJ), and NQ1 (UOEK) is in the low threshold voltage state. Accordingly, in the case where reference voltage VREF1 is selected, the current flowing through bit line RBL is larger than the current flowing through complementary bit line ZRBL, and the potential at bit line RBL is higher than the potential at complementary bit line ZRBL. Therefore, the output signal of the sense amplifier attains "1". In the case where reference voltage VREF2 is selected, the current flowing through bit line RBL is smaller than the current flowing through complementary bit line ZRBL, and the potential at bit line RBL is lower than the potential at complementary bit line ZRBL. Therefore, the output signal of the sense amplifier attains "0".

In state S(1,1,1), SOI transistors NQ1 (UOEI), NQ1 (UOEJ), and NQ1 (UOEK) are in the low threshold voltage state, and the data "1" is stored in SOI transistors NQ1 (UOEI), NQ1 (UOEJ), and NQ1 (UOEK). In this state, even if any of reference voltage VREF1 and reference voltage VREF2 is selected, as shown in FIG. 19, the current flowing through bit line RBL is larger than the current flowing through complementary bit line ZRBL, and the potential at bit line RBL is higher than the potential at complementary bit line ZRBL. Therefore, the output signal of the sense amplifier attains "1".

Accordingly, as shown in FIG. 102, the sense amplifier produces the OR operational result of the data stored in unit operator cells UOEI, UOEJ, and UOEK in the case where reference voltage VREF1 is selected, and the sense amplifier supplies the AND operational result of the data stored in unit operator cells UOEI, UOEJ, and UOEK in the case where reference voltage VREF2 is selected.

(Modification of Sense Amplifier)

Figure 103:
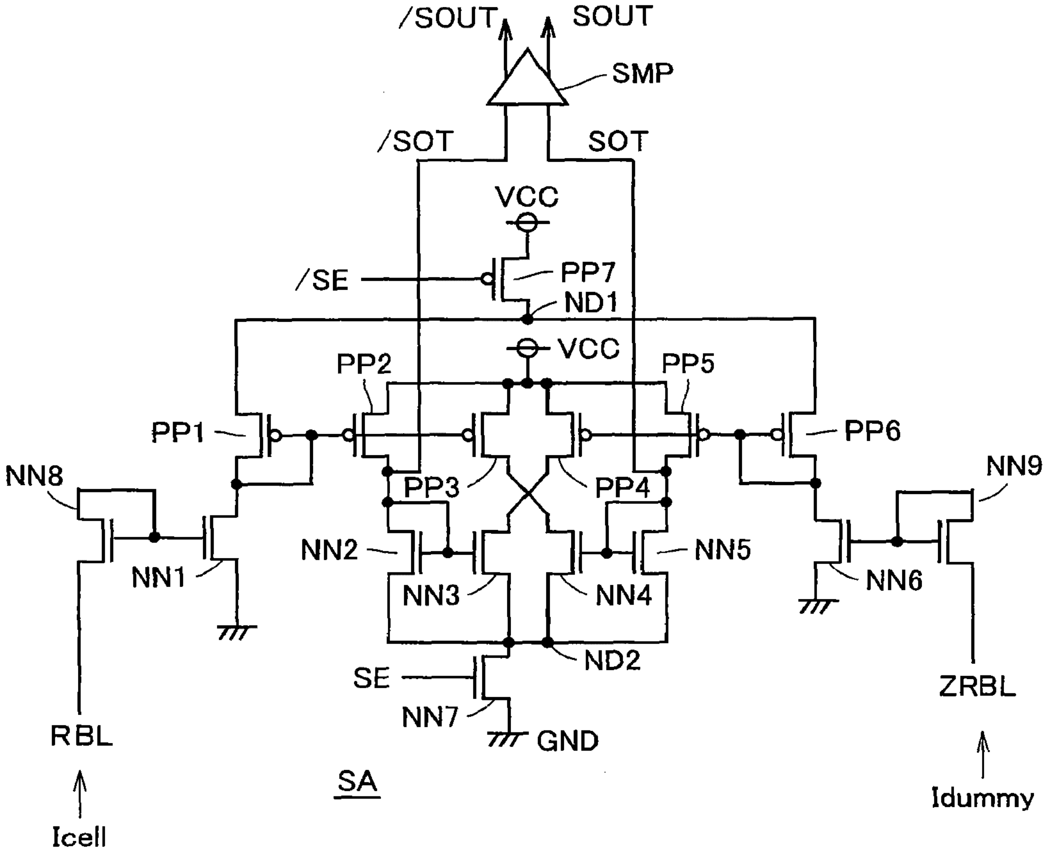
FIG. 103 shows an example of a configuration of a current sensing type sense amplifier according to the tenth embodiment of the present invention.

FIG. 103 shows an example of a configuration of a current sensing type sense amplifier in a modification of sense amplifier SA according to the tenth embodiment of the present invention. Referring to FIG. 103, sense amplifier SA includes P-channel MOS transistors (insulated gate field effect transistor) PP1 to PP3 constituting a current-mirror stage, P-channel MOS transistors PP4 to PP6 constituting another current-mirror stage, N-channel MOS transistors NN1 and NN8 that produce a mirror current of cell current Icell supplied from read bit line RBL, and N-channel MOS transistors NN6 and NN9 that produce a mirror current of dummy cell current Idummy supplied through complementary read bit line ZRBL.

MOS transistors PP1 to PP6 and N-channel MOS transistors NN1 to NN9 are each formed by the SOI transistor. Alternatively, MOS transistors PP1 to PP6 and N-channel MOS transistors NN1 to NN9 may be each formed by a bulk transistor at periphery of the operator cell array.

MOS transistor NN8 has the gate and the drain interconnected together to convert cell current Icell supplied through read bit line RBL into the voltage. MOS transistor NN1 has a source connected to the ground node and a gate connected to a gate and drain of MOS transistor NN8. MOS transistor NN1 and MOS transistor NN8 constitute the current-mirror stage to extract the mirror current of cell current Icell from MOS transistor PP1 in operation of the sense amplifier. MOS transistor PP1 is connected between a node ND 1 and MOS transistor NN1.

MOS transistor PP1 has a gate and a drain interconnected together to serve as a master of the current-mirror stage. MOS transistor PP1 passes the mirror current of cell current Icell during the sensing operation.

MOS transistor NN9 has a gate and drain interconnected together to convert dummy cell current Idummy supplied through complementary read bit line ZRBL into the voltage. MOS transistor NN6 has a gate connected to a gate and drain of MOS transistor NN9. MOS transistor NN6 and MOS transistor NN9 constitute the current-mirror stage to pass the mirror current of dummy cell current Idummy during the sensing operation.

MOS transistors PP6 and NN6 are connected in series between node ND1 and ground node. MOS transistor PP6 has a gate and a drain interconnected together to act as a master of the current-mirror stage. MOS transistor PP6 passes the mirror current of dummy cell current Idummy during the sensing operation. MOS transistors PP2 to PP5 each has a source node connected to the power supply node.

Sense amplifier SA further includes N-channel MOS transistors NN2 and NN3 constituting a current-mirror stage and N-channel MOS transistors NN4 and NN5 constituting another current-mirror stage.

MOS transistor NN2 is connected between MOS transistor PP2 and node ND, and has a gate and drain interconnected to each other. MOS transistor NN3 is connected between MOS transistor PP4 and node ND2, and has a gate connected to the gate of MOS transistor NN2. MOS transistor NN4 is connected between MOS transistor PP3 and node ND2, and has a gate connected to a gate of MOS transistor NN5. MOS transistor NN5 is connected between MOS transistor PP5 and node ND2, and has a gate and drain interconnected to each other.

The signals current/voltage-converted by MOS transistors NN2 and NN5 are produced as intermediate sense signals SOT and /SOT.

Sense amplifier SA further includes a P-channel MOS transistor PP7 and an N-channel MOS transistor NN7. When sense amplifier activation signal /SE is activated, P-channel MOS transistor PP7 is put into a conductive state to connect node ND1 to the power supply node. When sense amplifier activation signal SE is activated, N-channel MOS transistor NN7 turns conductive to connect node ND2 to ground node GND. Sense amplifier activation signals /SE and SE are set at the L level and H level in the active state, respectively.

Sense amplifier SA furthermore includes a final amplifying circuit SMP. Final amplifying circuit SMP amplifies intermediate sense output signals SOT and/SOT current-voltage converted by MOS transistors NN2 and NN5, to produce final sense output signals SOUT and /SOUT. Final amplifying circuit SMP is in the output high-impedance state when sense amplifier activation signal /SE is inactivated. The operation of sense amplifier SA shown in FIG. 103 will be described.

MOS transistors PP7 and NN7 are in the off-state when sense amplifier activation signals /SE and SE are inactive. In this state, MOS transistors PP2 and PP5 maintain intermediate sense output signals SOT and /SOT at the level of power supply voltage VCC. MOS transistors PP1, NN1, PP6, and NN1 in combination maintain node ND1 at the ground voltage level. Final sense output signals SOUT and /SOUT are also maintained at the pre-charge level (for example, H level) of the output high-impedance state.

In the sensing operation, before the read word line selection, sense amplifier activation signal /SE is activated to set MOS transistors PP7 and NN7 into the on-state. Accordingly, node ND1 is connected to the power supply node and MOS transistors PP1 and PP6 are made operative to establish the state of capable of sensing the currents on bit lines RBL and ZRBL. In such case, sense amplifier activation signal SE may be activated in parallel. The activation of sense amplifier activation signal SE may be delayed until the sensing operation is started. Read word line RWL is still in the non-selected state, and bit lines RBL and ZRBL are pre-charged to a predetermined voltage level by a bit line equalize circuit (BLEQ).

When the bit line pre-charging operation is completed, the read word line is driven to the selected state. Sense amplifier activation signal SE is activated before the read word line is driven to the selected state. Therefore, cell current Icell is supplied through the selected unit operator cell and bit line RBL according to the storage data. On the other hand, dummy cell current Idummy flows through complementary bit line ZRBL from the dummy cell.

MOS transistors NN1 and NN8 produce the mirror current of cell current Icell, and MOS transistors NN6 and NN9 produce the mirror current of dummy cell current Idummy. The mirror currents of currents Icell and Idummy flow through MOS transistors PP1 and PP6. The mirror current of the current flowing through MOS transistor PP1 flows through MOS transistors PP2 and PP3, and the mirror current of the current passed through MOS transistor PP6 flows through MOS transistors PP4 and PP5. Accordingly, the mirror currents of cell currents Icell and dummy cell current Idummy, flowing through bit lines RBL and ZRBL, flow through MOS transistors NN2 and NN5.

Through the current-voltage conversion operation by MOS transistors NN2 and NN5, when cell current Icell is larger than dummy cell current Idummy, intermediate sense output signal /SOT attains the voltage level higher than that of intermediate sense output signal SOT. In the case where cell current Icell is smaller than dummy cell current Idummy, intermediate sense output signal /SOT attains the voltage level lower than that of intermediate sense output signal SOT. Final amplifying circuit SMP in the subsequent stage further amplifies intermediate sense output signals SOT and /SOT to produce final sense output signals SOUT and /SOUT at the power supply voltage level and ground voltage level.

MOS transistors NN3 and NN4 behave as follows. MOS transistor NN2 discharges the current supplied from MOS transistor PP2, and MOS transistor NN3 discharges the mirror current of MOS transistor NN2. Similarly, the mirror current of the current flowing through MOS transistor PP5 flows through MOS transistor NN5, and MOS transistor NN4 can discharge the mirror current of the current supplied through MOS transistor NN5.

Accordingly, the smaller one of cell current Icell and dummy cell current Idummy flows through MOS transistors PP3 and NN4, and also the smaller one of cell current Icell and dummy cell current Idummy passes through MOS transistors PP4 and NN3. The sum of the combined current of cell current Icell and dummy cell current Idummy and the current that is double the smaller one of cell current Icell and dummy cell current Idummy always passes through MOS transistor NN7. In the case where the one-bit cell data is read to make the binary determination, MOS transistors PP3, PP4, NN3, and NN4 have the function of keeping the amount of current flowing through MOS transistor NN7 constant in order to stabilize the sensing operation.

However, MOS transistors PP3, NN4, NN3, and NN4 need not to be particularly provided. Alternatively, sense output signals SOUT and /SOUT may be extracted from the connection node of MOS transistors PP3 and NN4 and the connection node of MOS transistors PP4 and NN3.

As described above, sense amplifier SA produces the signals indicating the OR operational result and AND operational result of the data stored in a plurality of unit operator cells. In the case where the logical value of the data stored in the unit operator cell is inverted and read, and in the case where the sense amplifier produces the NOR operational result and NAND operational result, it is sufficient for main amplifier circuit 14 or data path 28 to invert the sense output signal shown in FIG. 103.

Through adjustment of a current level of dummy cell current Idummy by reference voltages VREF1 and VREF2, the OR operation and AND operation can be selectively performed. That is, the connection path of switching circuit DMSW is set according to the performing operational contents, which allows the logic operations to be selectively performed. The data read and the operation can be performed at high speed with a low power supply voltage using the current sensing type sense amplifier.

Figure 104:
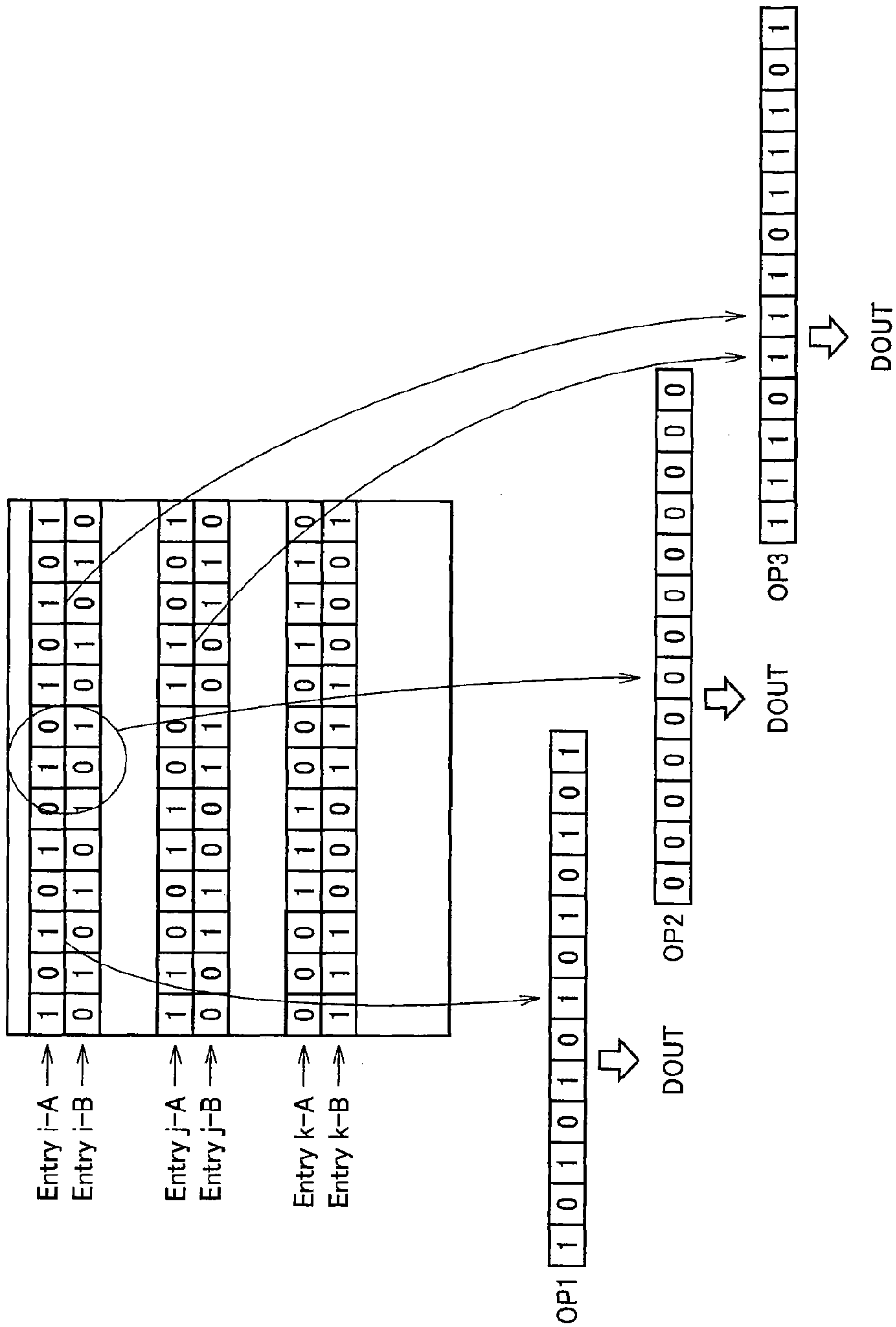
FIG. 104 shows an example of LUT operation performed in the semiconductor signal processing device according to the tenth embodiment of the present invention.

FIG. 104 shows an LUT operation performed by the semiconductor signal processing device according to the tenth embodiment of the present invention. The LUT operation indicates the operation for reading the contents of a corresponding entry according to the address specifying an entry of operator cell array 20 to perform the next processing according to the read entry contents. For example, the LUT operation is used in the address conversion, in converting the operational result into another value, or in referring to a certain region.

In FIG. 104, each row of the operator cell array is used as entry (Entry). The post-fixed letters A and B of entry (Entry) correspond to read word lines RWLA and RWLB of unit operator cell UOE, an array of the data stored in storage nodes SNA (body regions of SOI transistors NQ1) of the unit operator cells are shown in the field of entry (Entry)-A, and an array of the data stored in storage nodes SNB (body regions of SOI transistors NQ2) of the unit operator cells are shown in the field of entry (Entry)-B.

In FIG. 104, the storage data string of SOI transistors NQ1 of the unit operator cells is "1010101010101" in entry (Entry) i-A, that is, in unit operator cell row <i>, and the storage data string of SOI transistors NQ2 of the unit operator cells is "0101010101010" in entry (Entry) i-B, that is, in unit operator cell row <i>.

The storage data string of SOI transistors NQ1 of the unit operator cells is "1100110011001" in entry (Entry) j-A, that is, in unit operator cell row <j>, and the storage data string of SOI transistors NQ2 of the unit operator cells is "0011001100110" in entry (Entry) j-B, that is, in unit operator cell row <j>.

The storage data string of SOI transistors NQ1 of the unit operator cells is "0001110001110" in entry k-A, that is, in unit operator cell row <k>, and the storage data string of SOI transistors NQ2 of the unit operator cells is "1110001110001" in entry k-B, that is, in unit operator cell row <k>.

When entry i-A is selected to perform buffering processing as the operational processing, output data DOUT becomes "1010101010101" (OP1). When entries i-A and i-B are select to perform the AND operation, data DOUT becomes "0000000000000" (OP2). When entries i-A and j-A are selected to perform the OR operation, data DOUT becomes "1110111011101" (OP3).

Assuming that m is the number of operator cell sub-array blocks OAR in operator cell array 20 and n is the number of entries in each operator cell sub-array block OAR, the number of produced data strings is obtained as follows:

$$m \times n \times 2 + m \times n \times (n-1) \div 2 \times 2 + m \times n \times (n-1) \times (n-2) \div (3 \times 2) \times 2.$$

In the above expression, the first term is the number of combinations in the case where one entry is selected from the n entries in one operator cell sub-array block OAR and one of SOI transistors NQ1 and NQ2 is selected. The second term is the number of combinations in the case where two entries are selected from the n entries and one of SOI transistors NQ1 and NQ2 is selected to perform the AND or OR operation on the selected entries. The third term is the number of combinations in the case where three entries are selected from the n entries and one of SOI transistors NQ1 and NQ2 is selected to perform the AND or OR operation on the selected entries.

A main usage example of the semiconductor signal processing device according to the tenth embodiment of the present invention is as follows. Although the data stored in the unit operator cells of operator cell array 20 are changed depending on the system into which the semiconductor signal processing device is incorporated, the data stored in the unit operator cells are not dynamically changed. In the system, the different address signals and operation flags are successively applied to the semiconductor signal processing device externally, and the operational processing result is received from the semiconductor signal processing device. The entry is specified by the address signal, and the operation contents to be performed, the entry and SOI transistor to be concurrently selected are specified by the operation flag. Accordingly, for the processing results, the number of reference results that is greater than the number of internal operational results and the number of entries (unit operator cell rows) prepared in operator cell array 20 can be produced, and the number of entries can equivalently be increased to implement the high-density LUT.

Thus, in the semiconductor signal processing device according to the tenth embodiment of the present invention, row selection driving circuit 22 concurrently selects a plurality of unit operator cells UOE and a plurality of dummy cells DMC corresponding to one or the plurality of rows of unit operator cells based on the received address signal. Sense amplifier SA compares the current flowing through corresponding read bit line RBL and the current flowing through corresponding complementary read bit line ZRBL to supply the signal indicating the comparison result. Therefore, the storage data string of the selected unit operator cell row (entry) can directly be read out to the outside of the semiconductor signal processing device. A plurality of unit operator cell rows are concurrently selected to perform the addition of the currents based on the data stored in unit operator cell rows. Therefore, the sense amplifier performs the logic operation of the storage data strings of the unit operator cell rows, and the operational result can be read from the outside of semiconductor signal processing device 101.

By performing a logic operation of the data strings stored in the unit operator cell rows, a virtual entry space can be created which is larger than the real entry space made of physical true-value data strings from the true-value data strings stored in operator cell array 20. That is, the LUT calculating unit in which a further higher-density logic information is stored can be implemented compared with the conventional LUT calculating unit. Thus, the LUT calculating unit having a small occupying area and high density can be implemented by the semiconductor signal processing device according to the tenth embodiment of the present invention.

In the semiconductor signal processing device according to the tenth embodiment of the present invention, the transistor having the SOI structure is used as the memory element in unit operator cell UOE. Therefore, the data stored in the unit operator cell can be read without destructing the storage data, an operation can be performed while the data stored in the unit operator cell is repeatedly used.

The unit operator cell includes the four SOI transistors, the layout area is reduced, and the increase in area can be prevented in the memory cell array.

In the semiconductor signal processing device according to the tenth embodiment of the present invention, as shown in FIG. 103, the current sensing type sense amplifier is used as sense amplifier SA. That is, the amplifying circuit senses the current, and the amplifying operation can be performed at high speed to produce the operational result data. Because the current amount is sensed, the sufficiently large current difference can be produced to sense and amplify the data in the low power supply voltage required for mobile equipment. Accordingly, similarly to the above-described embodiments, the operational processing can surely be performed in the low power supply voltage condition.

In operator cell array 20, unit operator cell row <i>, unit operator cell row <j>, and unit operator cell row <k> may be provided being adjacent to each other, or unit operator cell row <i>, unit operator cell row <j>, and unit operator cell row <k> may be provided such that at least one unit operator cell row is located between any two of unit operator cell row <i>, unit operator cell row <j>, and unit operator cell row <k>.

[Eleventh Embodiment]

Figure 105:
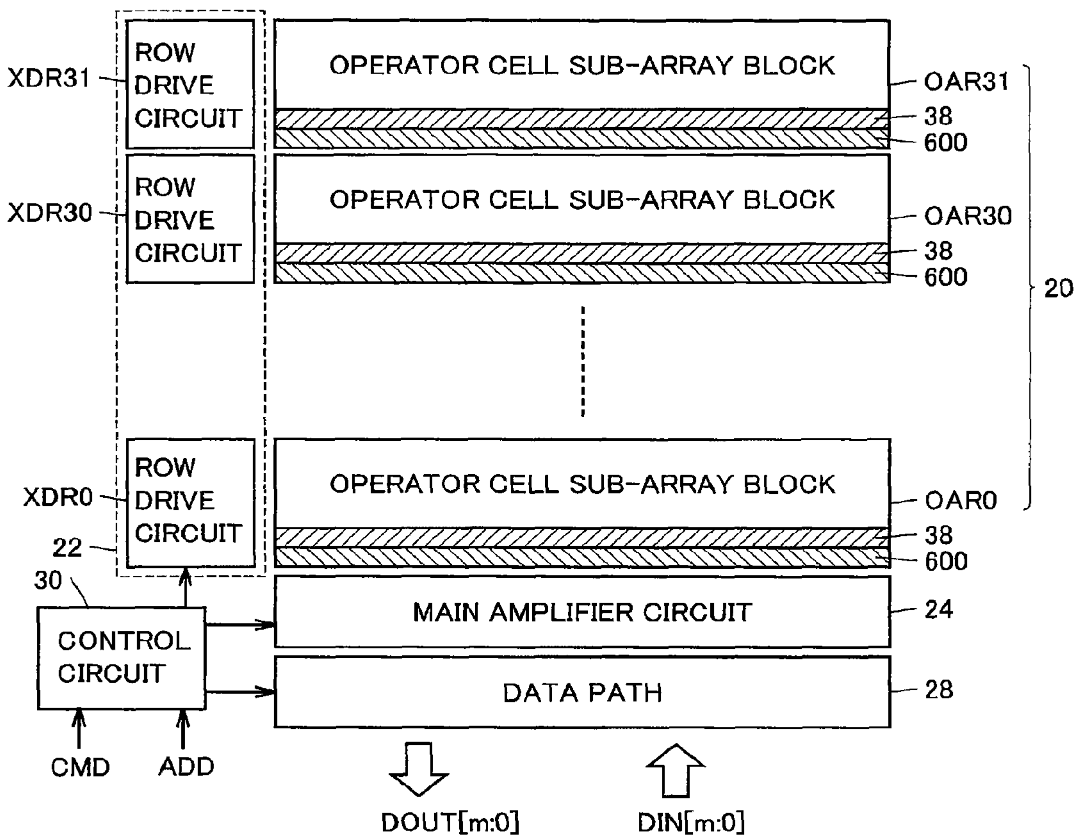
FIG. 105 schematically shows an entire configuration of a semiconductor signal processing device according to an eleventh embodiment of the present invention.

FIG. 105 schematically shows an entire configuration of a semiconductor signal processing device according to an eleventh embodiment of the present invention. The semiconductor signal processing device shown in FIG. 105 differs from the semiconductor signal processing device shown in FIG. 84 in that each of operator cell sub-array blocks OAR0 to OAR31 further includes a combination logic operational circuit 600. Combination logic operational circuit 600 is arranged adjacent to sense amplifier band 38.

Combination logic operational circuit 600 performs a specified logic operation or arithmetic operation processing to the data stored in the unit operator cells, and combination logic operational circuit 600 produces different operational processing result such as the XOR operational processing result from the OR operational result or AND operational result that is the sense amplifier output. The data stored in the unit operator cells are transferred from sense amplifier band 38. Combination logic operational circuit 600 can also invert the logic level of an output signal of a sense amplifier in sense amplifier band 38 to supply the inverted output signal to main amplifier circuit 24.

In FIG. 105, other configuration of the semiconductor signal processing device is similar to that of the semiconductor signal processing device shown in FIG. 89, corresponding parts to those in the semiconductor signal processing device shown in FIG. 89 are designated by the same reference numerals, and the detailed description is not repeated.

Figure 106:
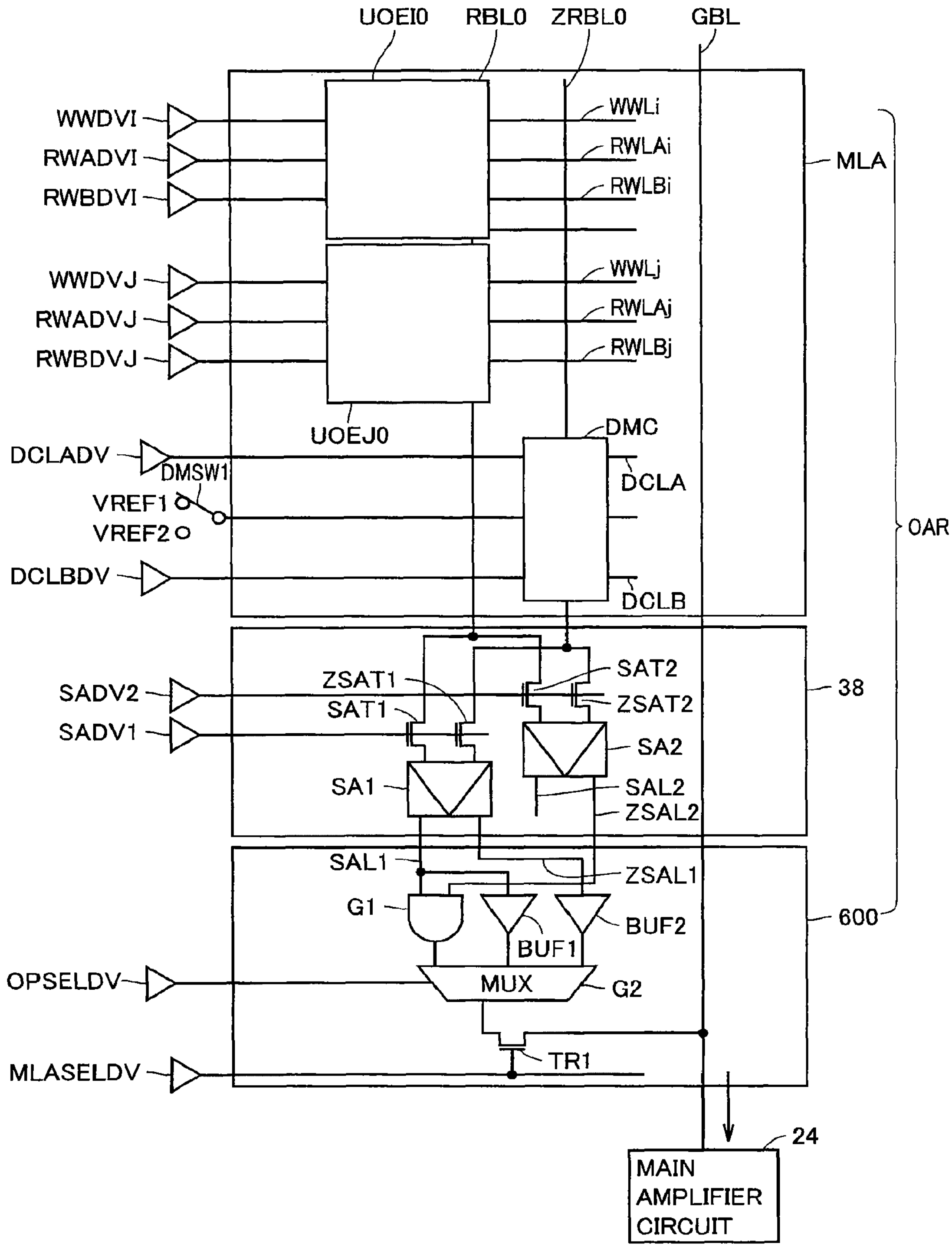
FIG. 106 schematically shows a configuration of an operator cell sub-array block in the semiconductor signal processing device according to the eleventh embodiment of the present invention.

FIG. 106 schematically shows a configuration of operator cell sub-array block OAR shown in FIG. 105. FIG. 105 representatively shows the circuitry corresponding to one unit operator cell column in unit operator cell rows <i> and <j> included in memory cell array MLA.

The configurations and arrangements of unit operator cell UOE and dummy cell DMC in memory cell array MLA are similar to those of the cells shown in FIG. 90.

Referring to FIG. 106, sense amplifier band 38 includes sense amplifiers SA1 and SA2 and transistors SAT1, ZSAT1, SAT2, and ZSAT2. Row drive circuit XDR includes sense amplifier selection drivers SADV1 and SADV2 and sub-array block selection driver MLASELDV.

Transistor SAT1 transfers the data stored in the unit operator cell and dummy cell to sense amplifier SA1 in response to the output signal of sense amplifier selection driver SADV1. Transistor SAT2 transfers the data stored in the unit operator cell and dummy cell to sense amplifier SA2 in response to the output signal of sense amplifier selection driver SADV2. Sense amplifier selection drivers SADV1 and SADV2 are selectively activated in response to sense amplifier activation signal SAEN and a control signal specifying the operational contents.

Combination logic operational circuit 600 includes an AND gate G1, a multiplexer G2, buffers BUF1 and BUF2, and a transistor TR1.

Buffer BUF1 receives and buffers the signal from sense amplifier SA1 through signal line SAL1, and supplies the buffered signal to multiplexer G2. Buffer BUF2 receives and buffers the signal from sense amplifier SA1 through signal line ZSAL1, and supplies the buffered signal to multiplexer G2.

Multiplexer G2 selects one of the output signal of AND gate G1, the output signal of buffer BUF1 and the output signal of buffer BUF2, based on the control signal applied from operation selection driver OPSELDV in control circuit 30. Transistor TR1 is selectively turned conductive in response to an output signal of sub-array block selection driver MLASELDV, and transistor TR1 transfers the output signal of multiplexer G2 to main amplifier circuit 24 through global bit line GBL when made conductive.

The operation will be described below by way of example, in the case where the exclusive logical product (XOR) operation of the data stored in unit operator cells UOEI and UOEJ in the semiconductor signal processing device according to the eleventh embodiment of the present invention.

Reference voltage source VREF1 and dummy cell selection signal DCLA are selected by switch DMSW1. In dummy cell DMC, dummy transistor DTA passes the current from reference voltage source VREF1 to complementary bit line ZRBL. One transistor (NQ1) is selected in each of unit operator cells UOEI and UOEJ, and the current that is combined according to the data stored in unit operator cells UOEI and UOEJ flows through read bit line RBL.

Sense amplifier selection driver SADV1 is selected to activate sense amplifier SA1. Transistors SATA1 and ZSAT1 connect sense amplifier SA1 to read bit lines RBL and ZRBL, the current flowing through bit line RBL and the current flowing through complementary bit line ZRBL are differentially amplified, and the amplified signals are maintained and supplied to signal lines SAL1 and ZSAL1.

After sense amplifier SA1 amplifies and maintains the current difference, sense amplifier selection driver SADV1 is driven to the inactive state. In this state, sense amplifier SA1 is separated from read bit lines RBL and ZRBL, and retains the logical sum (OR operation) result of the data stored in unit operator cells UOEI and UOEJ.

Then, the connection path of switch DMSW1 is switched to select reference voltage source VREF2 and in addition, dummy cell selection signal DCLA is selected. In dummy cell DMC, one dummy transistor DTA is selected, and dummy transistor DTA passes the current from reference voltage source VREF2 to complementary bit line ZRBL. In each of unit operator cells UOEI and UOEJ, one SOI transistor is selected, the combined current of the currents corresponding to the data stored in the unit operator cells flows through read bit line RBL.

Sense amplifier selection driver SADV2 is selected according to the path switching of switch DMSW1 to put transistors SAT2 and ZSAT2 into the conductive state, thereby connecting read bit lines RBL and ZRBL to sense amplifier SA2.

Sense amplifier SA2 is activated after the data is read. Accordingly, sense amplifier SA2 amplifies the difference between the current flowing through bit line RBL and the current flowing through complementary bit line ZRBL, and sense amplifier SA2 retains the amplified signals and supplies the amplified signals to signal lines SAL2 and ZSAL2.

Sense amplifier selection driver SADV2 is turned off after sense amplifier SA2 amplifies and retains the current difference. In this state, sense amplifier SA2 retains the logical product (AND operation) result of the data stored in unit operator cells UOEI and UOEJ.

AND gate G1 supplies the signal indicating the logical product of the signal received through signal line SAL1 and the signal received through signal line ZSAL2. The signal indicating the logical sum operational result of the data stored in unit operator cells UOEI and UOEJ is transmitted from signal line SAL1, and the signal indicating the inverted value of the logical product operation, that is, the NAND operational result of the data stored in unit operator cells UOEI and UOEJ is transmitted from signal line ZSAL2.

Then, sub-array block selection driver MLASELDV is activated to turn on transistor TR1. Multiplexer G2 selects the output signal of AND gate G1 on the basis of the control signal received from operation selection driver OPSELDV, and multiplexer G2 transfers the selected signal to main amplifier circuit 24 through transistor TR1 and global bit line GBL. Main amplifier circuit 24 further amplifies the signal and supplies the amplified signal externally through the data path.

FIG. 107 shows, in a list form, the correlations between the output signals of sense amplifiers SA1 and SA2, the output signal of AND gate G1, and the storage states of unit operator cells UOEI and UOEJ in the semiconductor signal processing device according to the eleventh embodiment of the present invention.

Referring to FIG. 107, the OR operational result of the data stored in unit operator cells UOEI and UOEJ is supplied to signal line SAL1, and the NAND operational result of the data stored in unit operator cells UOEI and UOEJ is supplied to signal line ZSAL2. Accordingly, the output signal of AND gate G1 indicates the exclusive logical sum (XOR operation) result of the data stored in unit operator cells UOEI and UOEJ.

As for the operation control, when the XOR operation is specified as the operational processing, the activation switching between sense amplifier selection drivers SADV1 and SADV2 is performed according to the path switching of switch DMSW1 while read word lines RWLi and RWLj are maintained in the selected state. Accordingly, the active timing of row drive circuit XDR of row selection driving circuit 22 and the activation timing of sense amplifier SA are set in the same way as in the tenth embodiment.

In the case where buffer BUF1 is selected, the LUT operation can be performed in the same way as in the tenth embodiment. In the case where buffer BUF2 is selected, the inverted value of the output data of sense amplifier SA1 can be produced. Accordingly, the NOT operation, the NOR operation, and the NAND operation can be achieved as the executable operational processing in addition to the OR operation, the AND operation, and the XOR operation. Control circuit 30 that receives command CMD and address ADD performs the operation control for these logical or arithmetic operations.

Figure 108:
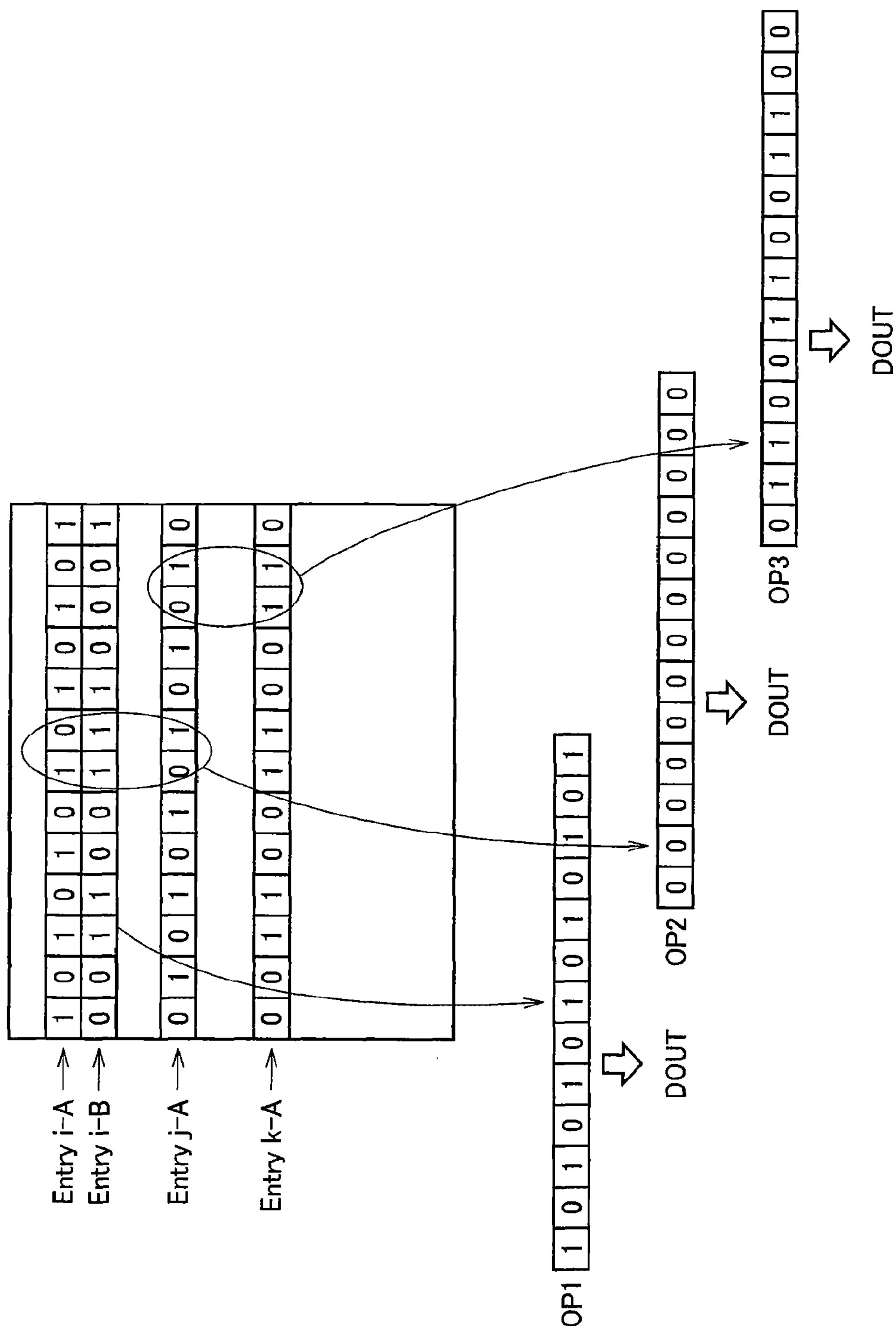
FIG. 108 shows an example of LUT operation performed in the semiconductor signal processing device according to the eleventh embodiment of the present invention.

FIG. 108 schematically shows an example of the LUT operation performed by the semiconductor signal processing device according to the eleventh embodiment of the present invention.

Referring to FIG. 108, the storage data string of storage nodes SNA of unit operator cells is "1010101010101" in entry (Entry) i, that is, in unit operator cell row <i>, and the storage data string of storage nodes SNB is "0011001110001". The storage data string of storage nodes SNA of unit operator cells is "0101010101010" in entry (Entry) j, that is, in unit operator cell row <j>. The storage data string of storage nodes SNA of unit operator cells is "0011001100110" in entry (Entry) k, that is, in unit operator cell row <k>.

In the case where one storage node SNA in entry i is selected, that is, in the case where the output signal of buffer BUF1 shown in FIG. 106 is selected, output data DOUT becomes "1010101010101" (OP1). In the case where storage nodes SNA of entries i and j are selected to perform the AND operation, output data DOUT becomes "0000000000000" (OP2). In the case where storage nodes SNA of entries j and k are selected to perform the XOR operation, output data DOUT becomes "0110011001100" (OP3).

Assuming that m is the number of operator cell sub-array blocks OAR in operator cell array 10 and n is the number of entries in each operator cell sub-array block OAR in the semiconductor signal processing device, the number of produced data strings is obtained as follows:

$$m\times n\times 2+m\times n\times(n-1)\div 2\times 3+m\times n\times(n-1)\times(n-2)\div(3\times 2)\times 3.$$

In the above expression, the first term is the number of combinations in the case where one entry is selected from the n entries in one operator cell sub-array block OAR. The second term is the number of combinations including the selection of the AND operation, OR operation and XOR operation in the case where two entries are selected from the n entries (storage node SNA is selected). The third term is the number of combinations including the selection of the AND operation, OR operation and XOR operation in the case where three entries are selected from the n entries (storage node SNA is selected).

According to the eleventh embodiment, combination logic operational circuit is provided corresponding to each operator sub-array block, and the additional logic operation processing is selectively performed on the output signals of the sense amplifiers. Accordingly, the virtual entry space can further be extended, in addition to the effect of the tenth embodiment.

[Twelfth Embodiment]

Figure 109:
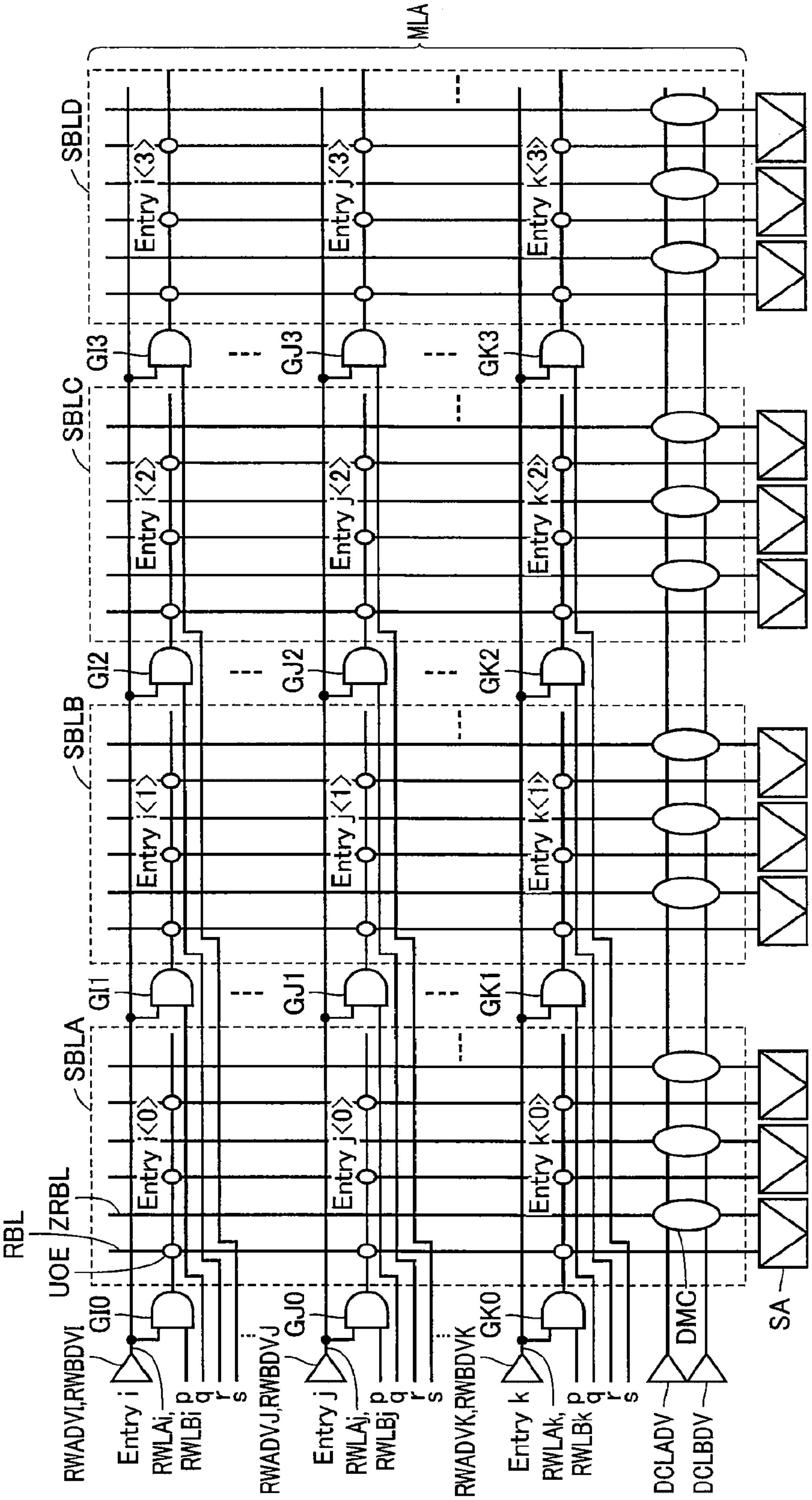
FIG. 109 schematically shows a configuration of a semiconductor signal processing device according to a twelfth embodiment of the present invention.

FIG. 109 schematically shows a configuration of a semiconductor signal processing device according to a twelfth embodiment of the present invention. In the semiconductor signal processing device shown in FIG. 109, sub-memory array MLA is divided into four sub-blocks SBLA, SBLB, SBLC, and SBLD along a word line extending direction (word line direction). That is, one unit operator cell row is divided into four sub unit operator cells rows. FIG. 109 representatively shows the circuit portion corresponding to entries i, j, and k.

In the semiconductor signal processing device according to the twelfth embodiment, a hierarchical word line scheme is applied and any sub-block can be selected by the AND operation of the signals on read word lines RWLA<i>, RWLB<i>, RWLA<1>, RWLB<j>, RWLA<k>, and RWLB<k> and sub-block selection control signals p, q, r, and s.

Particularly, the semiconductor signal processing device shown in FIG. 109 differs from the semiconductor signal processing device according to the tenth embodiment shown in FIG. 104 in that row selection driving circuit 22 further includes a plurality of AND gates that are provided corresponding to sets of the entries and sub-blocks in sub-memory array MLA.

AND gates G10 to G13, GJ0 to GJ3, and GK0 to GK3 are provided corresponding to entries (Entry) i, j, and k, respectively. The AND gates supply the logical product operational results of the signal on read word line RWLA and the signal on read word line RWLB and sub-block selection control signals p, q, r, and s.

Row selection driving circuit 22 activates read driver RWDV (RWADV and RWBDV) corresponding to the entry to be selected, and row selection driving circuit 22 drives the sub-block selection control signal corresponding to the sub-block to be selected in sub-block selection control signals p, q, r, and s to the H level of the selected state, thereby selecting unit operator cells UOE corresponding to the entry in the sub-block to be selected. Accordingly, the entries of the different sub-blocks can be selected in the four entries (Entry<0> to Entry<3>).

The entire configuration of the semiconductor signal processing device shown in FIG. 109 is similar to that of the semiconductor signal processing device according to the tenth embodiment shown in FIG. 89. The configurations of unit operator cell UOE and sense amplifier SA are also similar to those described in the tenth embodiment.

Figure 110:
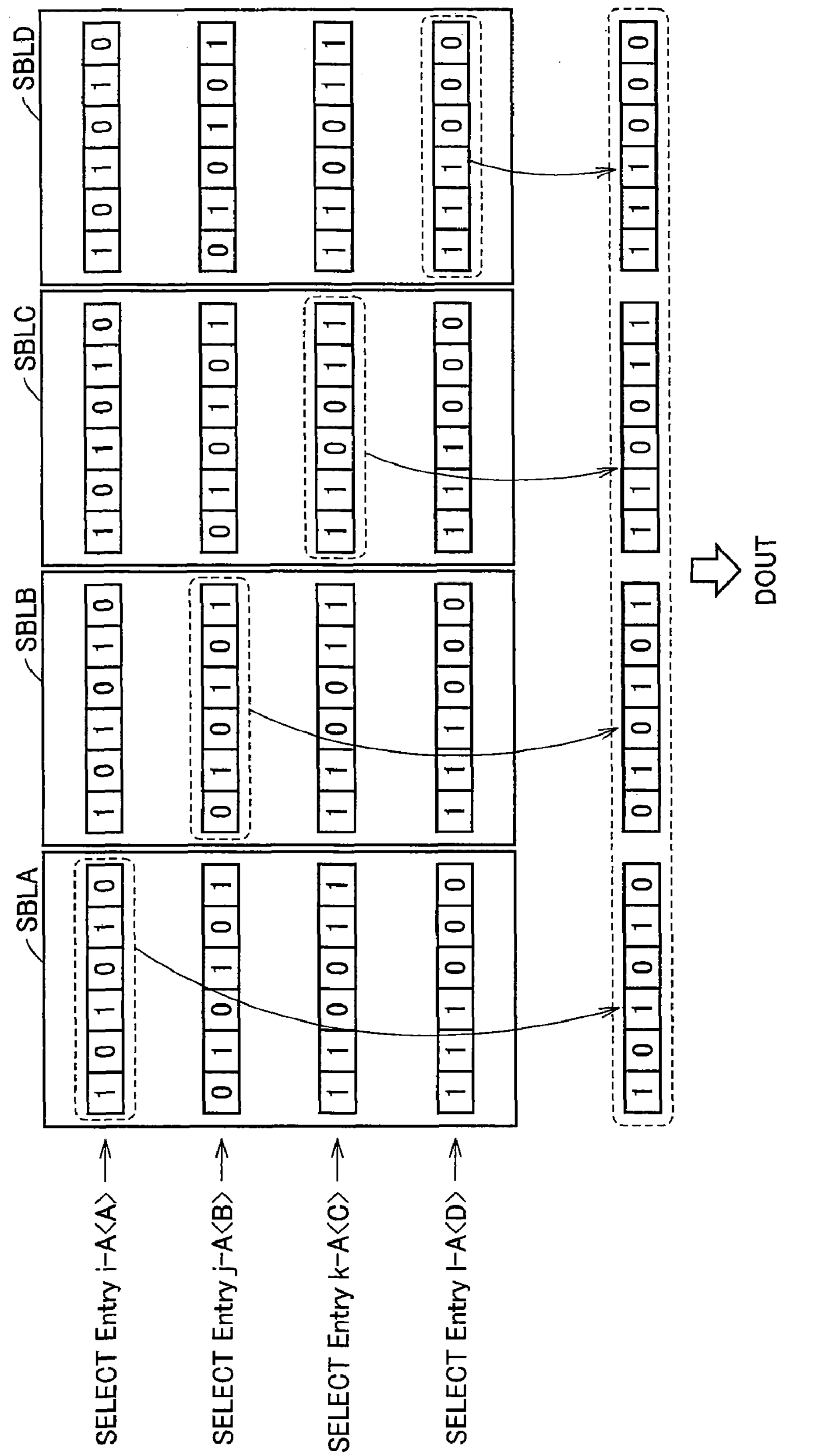
FIG. 110 represents LUT operation performed in the semiconductor signal processing device according to the twelfth embodiment of the present invention.

FIG. 110 shows an example of the LUT operation performed by the semiconductor signal processing device according to the twelfth embodiment of the present invention.

In FIG. 110, entry (Entry) A designates storage nodes SNA and the letter in the parenthesis < > designates the sub-block.

Referring to FIG. 110, the storage data string of unit operator cells corresponding to entry i is "101010" in each of sub-blocks SBLA to SBLD. The storage data string of the respective unit operator cells corresponding to entry j is "010101" in each of sub-blocks SBLA to SBLD. The storage data string of the respective unit operator cells corresponding to entry k is "110011" in each of sub-blocks SBLA to SBLD. The storage data string of the respective unit operator cells corresponding to entry 1 is "111000" in each of sub-blocks SBLA to SBLD.

Output data DOUT becomes "101010010101110011111000" in the case where entry i (Entry i-A<A>) in sub-block SBLA, entry j (Entry j-A<B>) in sub-block SBLB, entry k (Entry k-A<C>) in sub-block SBLC, and entry l (Entry l-A<D>) in sub-block SBLD are selected.

In the semiconductor signal processing device, it is now assumed that m is the number of operator cell sub-array blocks OAR in operator cell array 10, that n is the number of entries in each operator cell sub-array block OAR, and that the number of sub-blocks is set at four in each operator cell sub-array block OAR. In this condition, the number of produced data string becomes m×n×n×n×n even if the type of the operation such as the AND operation and OR operation is not considered.

For the configuration for selecting unit operator cells for each sub-block to read data from each entry in parallel, the following configuration may be utilized, for example. A latch unit (half latch) for latching the output signal of the H level is provided at the output portion of each of AND gates G10 to G13, GJ0 to GJ3, and GK0 to GK3. For example, the AND gate is formed by the series-connection of an NAND gate and an inverter, and the switching transistor of the input portion of the inverter is put into the on-state to hold the inverter input portion at the L level of the ground voltage (the H-level outputting transistor of the NAND gate is forcedly maintained in the off-state during the latching period) when the output signal of the inverter attains the H level. After the data is read, the input portion of the inverter is forcedly connected to the power supply node in response to a reset signal, the selected row is driven to the non-selected state, and the switching transistor is driven to the off-state.

Sub-block selection signals p, q, r, and s are sequentially activated for a predetermined period of time. During the sub-block activation period, the corresponding read word line is specified in response to the address signal. A sub-entry Entry <i> of the entry specified in each sub-block during the sub-block specified period is maintained in the selected state by the latching function of the sub-block selecting AND gate. Sense amplifiers SA may be driven in parallel to the active state in sub-blocks SBLA to SBLD, or sense amplifiers SA may sequentially be activated in each sub-block specifying period of time. The data of sub-blocks SBLA to SBLD can be supplied in parallel externally by concurrently activating the main amplifiers in the main amplifier circuits. The latching function of sub-block selecting AND gate is reset when the read period is ended. Thus, different unit operator cell rows can be selected for each sub-block.

The case in which the semiconductor signal processing device according to the twelfth embodiment is applied to LUT-based PWM (Pulse Width Modulation) will be described below.

Figure 111:
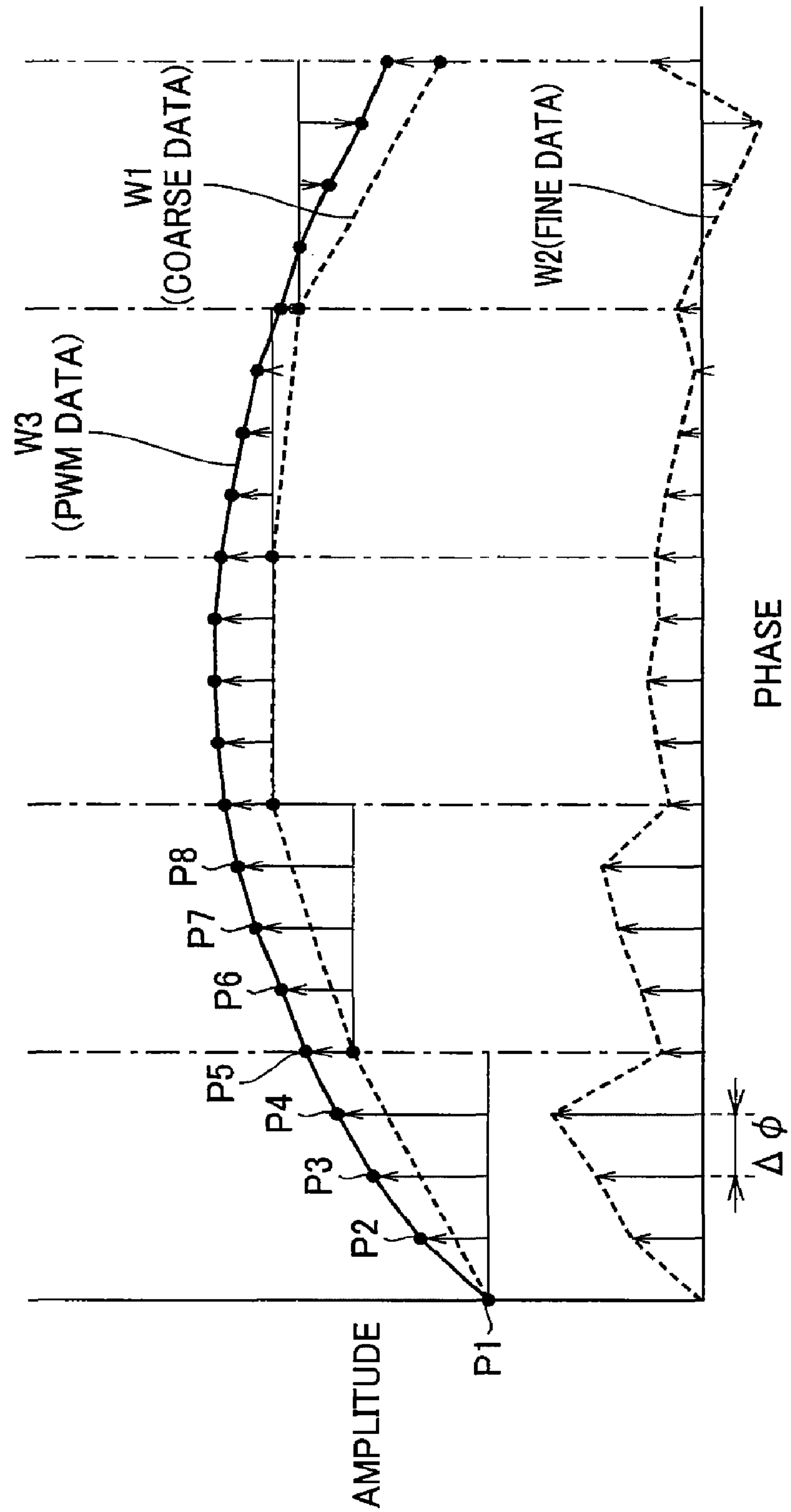
FIG. 111 shows operation principle along which the semiconductor signal processing device of the twelfth embodiment produces PWM waveform data.

FIG. 111 shows operation principle in which the semiconductor signal processing device according to the twelfth embodiment produces the PWM waveform data. In FIG. 111, a vertical axis indicates amplitude (pulse width) and a horizontal axis indicates a phase.

A waveform W2 indicates fine data given by the table having discrete data of a minimum phase pitch Δϕ. A waveform W1 indicates coarse data given by the table having discrete data of an appropriate integer multiple of a minimum phase pitch Δϕ. In FIG. 111, the coarse data has a pitch between alternate long and short dash lines. Each value indicates the pulse width.

The target PWM waveform data (waveform W3) can be produced by performing the addition of the fine data and the coarse data. The addition processing is performed outside the device. Accordingly, when the data stored in the entry (sub-block) is signed data, the addition and subtraction can externally be performed according to the sign bit.

Figure 112:
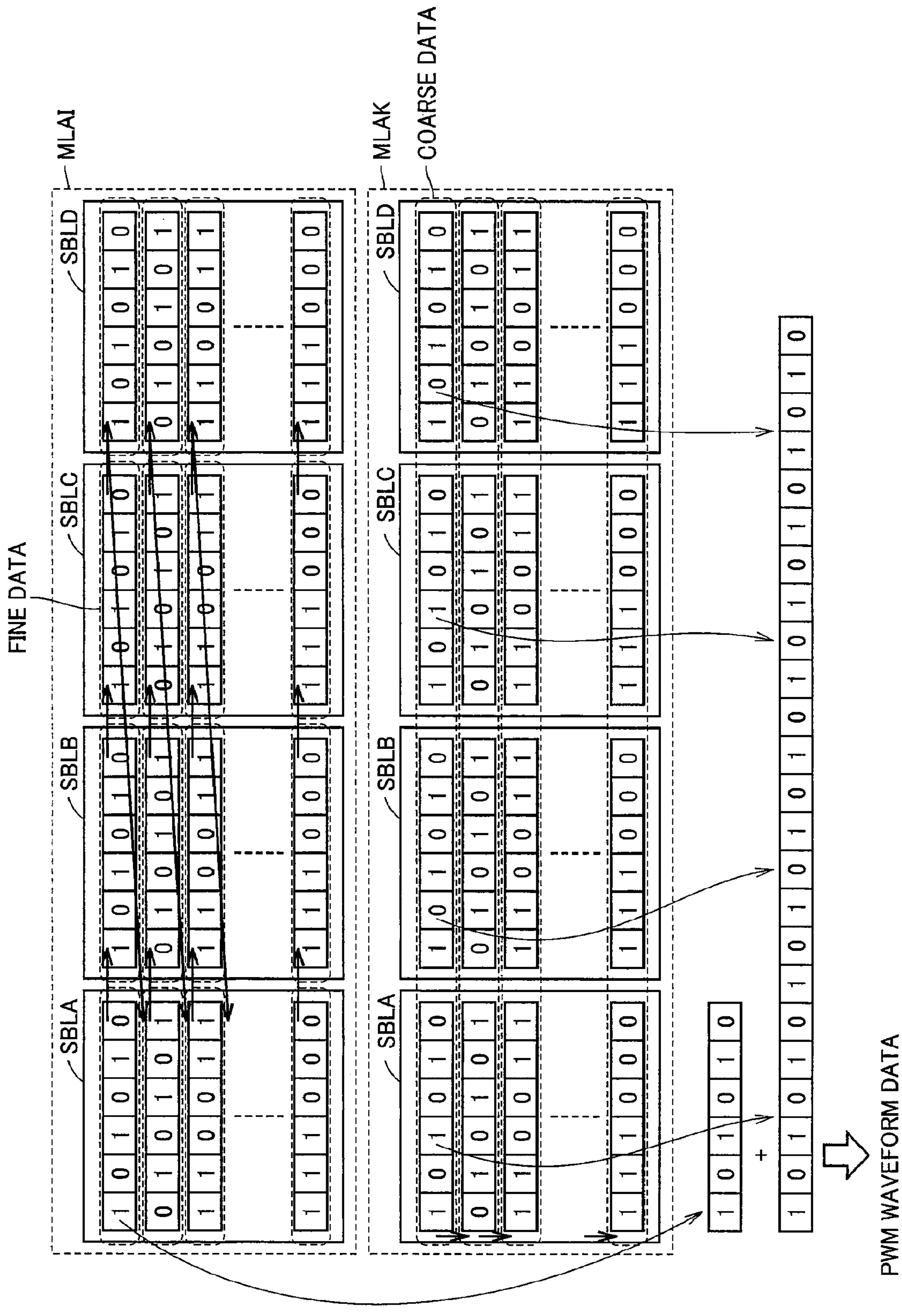
FIG. 112 shows an LUT data storage scheme when the semiconductor signal processing device of the twelfth embodiment produces the PWM waveform data.

FIG. 112 shows an LUT data storage scheme when the semiconductor signal processing device according to the third embodiment of the present invention produces the PWM waveform data. Referring to FIG. 112, the fine data are stored in a sub-memory array MLAI, and the coarse data are stored in a sub-memory array MLAK. The access to the entries of sub-memory array MLAI is made for each sub-bloc to sequentially read out the data string, thereby obtaining the fine data. The access to the entries of sub-memory array MLAK is made at once to read out the data string, thereby obtaining the coarse data. In the read sequence, it is not necessary that the sub-block selecting AND gate have the output latching function. Referring to FIG. 112, the PWM modulation operation shown in FIG. 111 will be described below.

The data strings stored in the first entries in sub-blocks SBLA, SBLB, SBLC, and SBLD of sub-memory array MLAI are read in this order and sequentially supplied as data DOUT1. At the same time, the data strings stored in the first entries in sub-blocks SBLA, SBLB, SBLC, and SBLD of sub-memory array MLAK are read at the same time and are supplied as data DOUT2. The data DOUT1 and DOUT2 are added inside or outside the semiconductor signal processing device to produce data P1 to P4 of waveform W3 that is of the PWM waveform.

During reading data DOUT1 in units of sub-blocks, in the non-selected sub-block, the corresponding read word line is in the non-selected state and the data "0" is read. Accordingly, the bit width of the data supplied in each sub-block selection is equal to that of data DOUT2. Alternatively, only in the selected sub-block, sense amplifiers SA and the main amplifiers are activated, and the output data bit positions may be located at the positions corresponding to the selected sub-block.

Then, the data strings stored in the second entries in sub-blocks SBLA, SBLB, SBLC, and SBLD of sub-memory array MLAI are read in this order and sequentially supplied as data DOUT1. At the same time, the data strings stored in the second entries in sub-blocks SBLA, SBLB, SBLC, and SBLD of sub-memory array MLAK are read at the same time and supplied as data DOUT2. The data DOUT1 and DOUT2 are added inside or outside semiconductor signal processing device 103 to produce data P5 to P8 of waveform W3 that is of the PWM waveform.

For the entries equal and subsequent to the third entry, similarly the storage data string is sequentially taken out to complete the PWM waveform data.

The fine data can sequentially be read by sequentially reading the data in units of sub-blocks using an address counter.

Thus, according to the twelfth embodiment of the present invention, the data is selected in units of sub-blocks in the operator cell array, so that the number of virtual entries can be increased. All the bits of the multi-bit PWM data can be produced at each minimum sampling period (Δϕ) without increasing the storage capacity.

[Thirteenth Embodiment]

Figure 113:
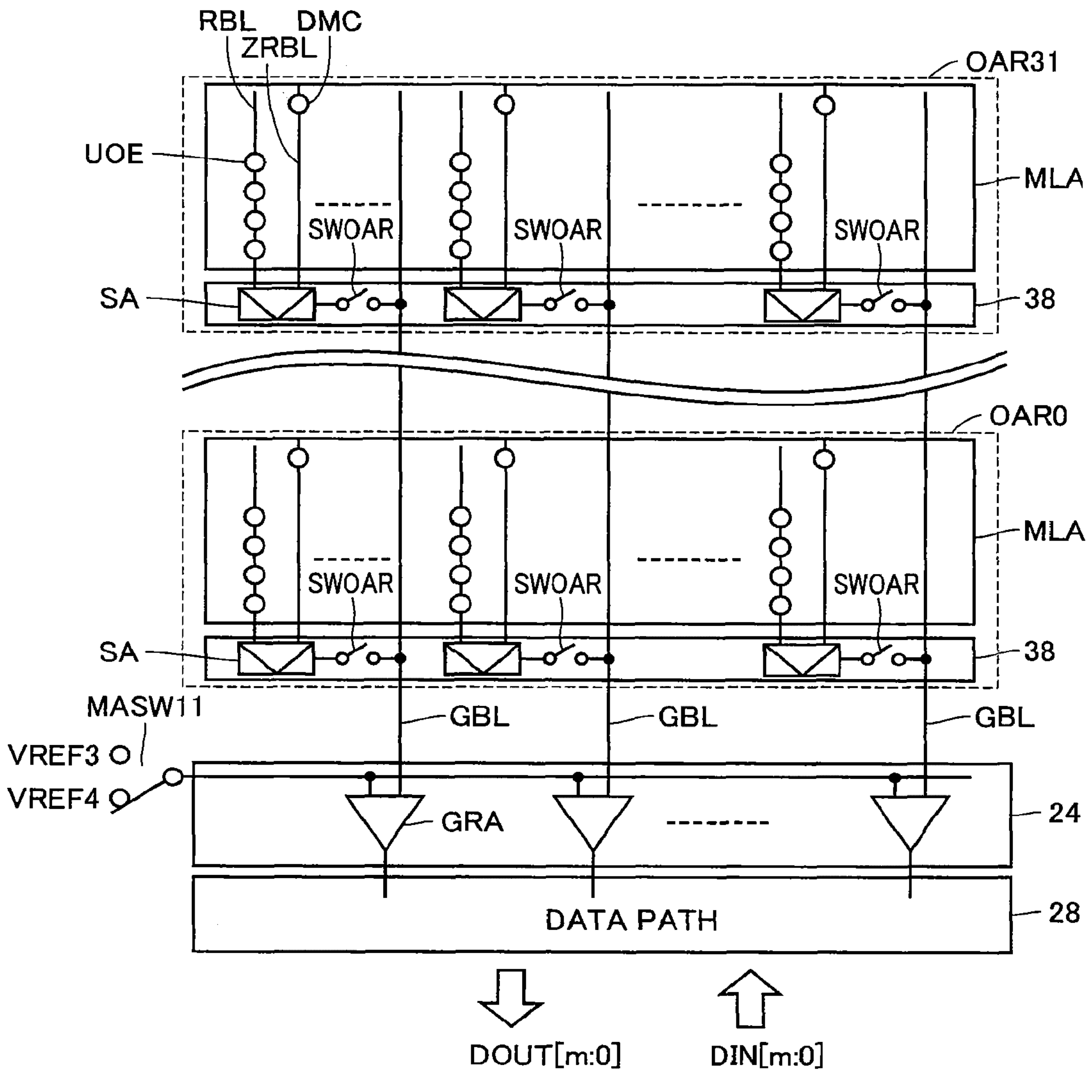
FIG. 113 schematically shows a configuration of a semiconductor signal processing device according to a thirteenth embodiment of the present invention.

FIG. 113 schematically shows a configuration of a semiconductor signal processing device according to a thirteenth embodiment of the present invention. The semiconductor signal processing device shown in FIG. 113 differs from the semiconductor signal processing device of the tenth embodiment shown in FIG. 69 in the following point.

The semiconductor signal processing device shown in FIG. 113 further includes a switch MASW11 provided for main amplifier circuit 24 and a plurality of global bit lines GBL. Main amplifier circuit 24 includes a plurality of comparison and amplification circuits (global read circuit) GRA that are provided corresponding to the respective global bit lines GBL. Sense amplifier band 38 includes a plurality of sense amplifiers SA and switches SWOAR.

In operator cell sub-array blocks OAR0 to OAR31, a plurality of sense amplifiers SA are arranged in rows and columns as a whole. In sense amplifier band 38, sense amplifier SA is disposed corresponding to bit line pair RBL and ZRBL of a corresponding operator cell sub-array block OAR.

Global bit line GBL is shared by operator cell sub-arrays OAR0 to OAR31, that is, global bit line GBL is provided corresponding to a sense amplifier column, and global bit line GBL is connected to the outputs of sense amplifiers SA of the corresponding column through switches SWOAR. That is, global bit line GBL is provided corresponding to each set of bit line RBL and complementary bit line ZRBL in operator cell sub-array blocks OAR0 to OAR31, and global bit line GBL is connected to the outputs of the plurality of sense amplifiers SA through switches SWOAR in operator cell sub-array blocks OAR0 to OAR31. Each sense amplifier SA is connected to corresponding bit line RBL and to corresponding complementary bit line ZRBL.

In reading the data, switch SWOAR is selectively put into the conductive state in response to the sub-array selection signal. When in the conductive state, switch SWOAR transmits the output signal of corresponding sense amplifier SA to corresponding global bit line RBL. The configuration shown in FIG. 84 is used as the configuration of sense amplifier SA, and switch SWOAR corresponds to switches 550 and 552 and block read gate CSG. Accordingly, sense amplifier SA supplies the current in the case of the data "1", and sense amplifier SA has no influence on the potential at global bit line GBL in the case of the data "0".

Sense amplifier SA compares the current flowing through corresponding bit line RBL and the current flowing through corresponding complementary bit line ZRBL, and supplies the current to corresponding global bit line GBL through switch SWOAR on the basis of the comparison result.

Comparison and amplification circuit GRA senses the current flowing through corresponding global bit line GBL, and produces the signal based on the sensed current amount. That is, comparison and amplification circuit GRA compares the potential at global bit line GBL and a reference voltage VREF3 or VREF4 applied through switch MASW11, to produce the signal to data path 28 based on the comparison result.

In FIG. 113, other configurations of the semiconductor signal processing device are similar to those of the semiconductor signal processing device shown in FIG. 89, and corresponding parts to those in the semiconductor signal processing device shown in FIG. 89 are designated by the same reference numerals, and the detailed description is not repeated.

The reading operation in the case where one operator cell sub-array block OAR0 is selected in the semiconductor signal processing device will be described.

FIG. 114 shows a state in which one operator cell sub-array block OAR0 is selected. In FIG. 114, switch SWOAR is put into the on-state in operator cell sub-array block OAR0, switches SWOAR are set at the off-state in operator cell sub-array blocks OAR1 to OAR31. In this state, reference voltage VREF3 is supplied to comparison and amplification circuit GRA through switch MASW11. The sub-array block address specifying an operator cell sub-array block is used to perform the on/off control of switch SWOAR.

FIG. 115 shows, in a list form, combinations of output signals of sense amplifier SA connected to global bit line GBL in the connection state shown in FIG. 114, and FIG. 116 shows a relationship between the read potential and the current passed through global bit line GBL during the data read. In FIG. 116, a vertical axis indicates the potential at global bit line GBL and a horizontal axis indicates time.

Referring to FIGS. 115 and 116, in the case where sense amplifier SA produce the output signal of "1" in operator cell sub-array block OAR0 (state ST1), the current flowing through global bit line GBL is increased, and the potential at global bit line GBL becomes higher than reference voltage VREF3. In this state, comparison and amplification circuit GRA outputs the data "1".

On the other hand, in the case where sense amplifier SA produce the output signal of "0" in operator cell sub-array block OAR0 (state ST2), the current flowing through global bit line GBL is decreased, and the potential at global bit line GBL becomes lower than reference voltage VREF3. In this state, comparison and amplification circuit GRA supplies the data "0". Accordingly, when one operator cell sub-array is selected, the binary signal is produced according to the output signal of sense amplifier SA.

The reading operation in the case where two operator cell sub-array blocks OAR0 and OAR31 are selected in the semiconductor signal processing device will be described.

FIG. 117 shows a state in which two operator cell sub-array blocks OAR0 and OAR31 are selected. In FIG. 117, switches SWOAR are set at the on-state in operator cell sub-array blocks OAR0 and OAR31, and switches SWOAR are set at the off-state in operator cell sub-array blocks OAR1 to OAR30. In this state, reference voltage VREF3 or VREF4 is supplied to comparison and amplification circuit GRA through switch MASW11.

FIG. 118 shows, in a list form, combinations of the output signals of sense amplifier SA connected to global bit line GBL, and FIG. 119 shows a relationship between the read potential and the current passed through the global bit line GBL during data read in the thirteenth embodiment. In FIG. 119, a vertical axis indicates the potential at global bit line GBL and a horizontal axis indicates time.

Referring to FIGS. 118 and 119, in the case where sense amplifier SA supplies the output signal of "1" in both operator cell sub-array blocks OAR0 and OAR31 (state ST1), a current I0+I1 flowing through global bit line GBL becomes the maximum.

In the case where sense amplifier SA supplies the output signal of "0" in both operator cell sub-array blocks OAR0 and OAR31 (state ST4), current I0+I1 flowing through global bit line GBL becomes the minimum.

In the case where sense amplifier SA supplies the output signal of "0" in one of operator cell sub-array blocks OAR0 and OAR31 while sense amplifier SA supplies the output signal of "1" in the other of operator cell sub-array blocks OAR0 and OAR31 (states ST2 and ST3), the current intermediate between the amount of current flowing through global bit line GBL in state ST1 and the amount of current flowing through global bit line GBL in state ST4 flows through global bit line GBL. Therefore, the potential at global bit line GBL is an intermediate level between the states ST1 and ST4.

Reference voltage VREF3 is set to a level between the potential at global bit line GBL in state ST1 and the potential at global bit line GBL in states ST2 and ST3, and switch MASW11 supplies reference voltage VREF3 to comparison and amplification circuit GRA.

In the state in which reference voltage VREF3 is selected, comparison and amplification circuit GRA supplies the data "1" for state ST1, and comparison and amplification circuit GRA supplies the data "0" for states ST2 to ST4. That is, comparison and amplification circuit GRA produces the AND operational result of the operational results in operator cell sub-array blocks OAR0 and OAR31.

On the other hand, reference voltage VREF4 is set between the potential at global bit line GBL in state ST4 and the potential at global bit line GBL in states ST2 and ST3, and switch MASW11 supplies reference voltage VREF4 to comparison and amplification circuit GRA.

In the state in which reference voltage VREF4 is selected, comparison and amplification circuit GRA produces the data "1" for state ST3, and comparison and amplification circuit GRA outputs the data "0" for state ST3. That is, comparison and amplification circuit GRA produces the OR operational result of the operational results in operator cell sub-array blocks OAR0 and OAR31.

Thus, in the semiconductor signal processing device of the thirteenth embodiment, the OR operation and the AND operation can be performed to the operational results in a plurality of operator cell sub-array blocks.

Figure 120:
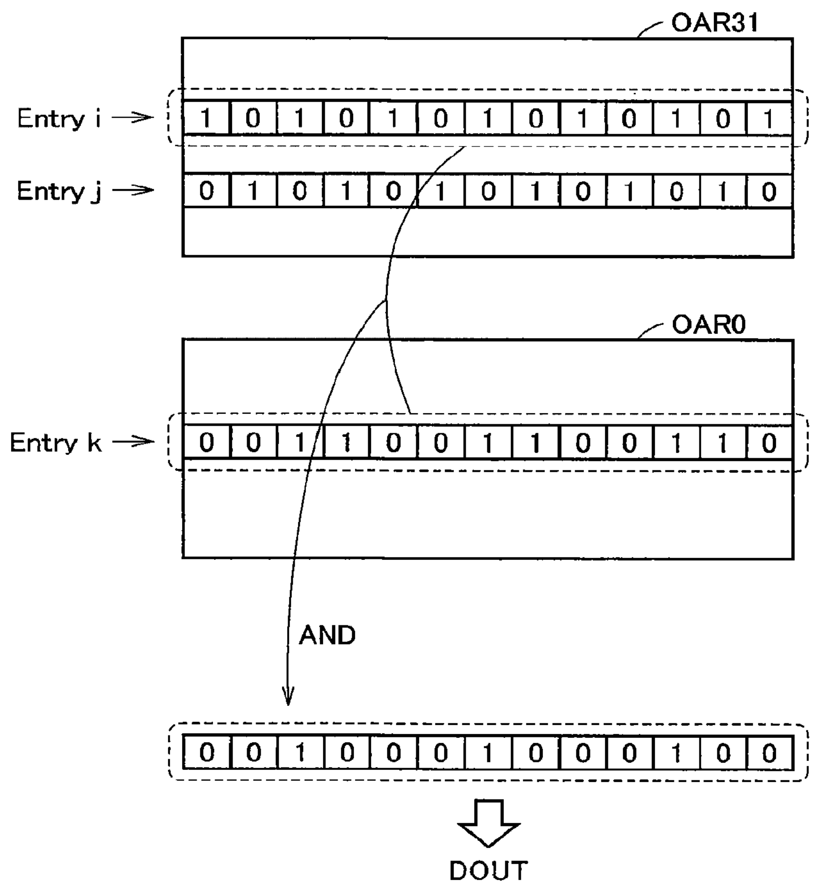

FIG. 120 shows an example of the LUT operation performed by the semiconductor signal processing device of the thirteenth embodiment. Referring to FIG. 120, in operator cell sub-array block OAR31, the storage data string of unit operator cells is "1010101010101" in entry (Entry) i of sub-memory array MLA, and the storage data string of unit operator cells is "0101010101010" in entry (Entry) j. In operator cell sub-array block OAR0, the storage data string of unit operator cells is "0011001100110" in entry (Entry) k of sub-memory array MLA.

Entry i in operator cell sub-array block OAR31 and entry k in operator cell sub-array block OAR0 are selected, and reference voltage VREF4 is selected as the reference voltage to perform the AND operation. In such case, data DOUT becomes "0010001000100".

In the semiconductor signal processing device, assuming that m is the number of operator cell sub-array blocks OAR in operator cell array 10 and n is the number of entries in each operator cell sub-array block OAR, the number of produced data string becomes $m \times n \times 2 + m \times n \times 2 \times (m-1) \times n \times 2 \div 2 \times 2$ (one SOI transistor is selected in one unit operator cell UOE).

In the above expression, the first term is the number of combinations, in the case where one operator cell sub-array block OAR is selected from m operator cell sub-array blocks OAR, one entry is selected from the n entries in the selected operator cell sub-array block OAR, and one of SOI transistors NQ1 and NQ2 is selected. The second term is the number of combinations, in the case where two operator cell sub-array blocks OAR are selected from m operator cell sub-array blocks OAR, one entry is selected from the n entries in each of the selected two operator cell sub-array blocks OAR, one of SOI transistors NQ1 and NQ2 is selected, and the AND operation and OR operation on the selected operator cell sub-array blocks are to be selected.

According to the semiconductor signal processing device of the thirteenth embodiment, the combination logic operation can be performed by the potential at the global bit line and the reference voltage without providing the combination logic operational circuit. Therefore, similarly to the twelfth embodiment, the virtual entry space can be expanded without increasing the array area.

Control circuit 30 selects one of reference voltages VREF3 and VREF4 according to the operational contents specified by a command CMD. For the configuration in which the two operator cell sub-array blocks are driven to the selected state , the following configuration may be utilized, by way of example. That is, the least significant bit of the sub-array block address is set at a degenerated state, which allows the adjacent operator sub-array blocks to be concurrently driven to the selected state. In order to concurrently select any operator cell sub-array blocks, a latch circuit is provided for each sub-array block OAR, for latching an operator cell sub-array block selection signal received from a sub-array block decoder when the sub-array block selection signal is in the selected state. Sub-array block addresses are supplied at successive timings and are statically decoded by the sub-array block decoder. The configuration similar to a so-called bank configuration of a bank selection circuit of a memory is used.

[Fourteenth Embodiment]

Figure 121:
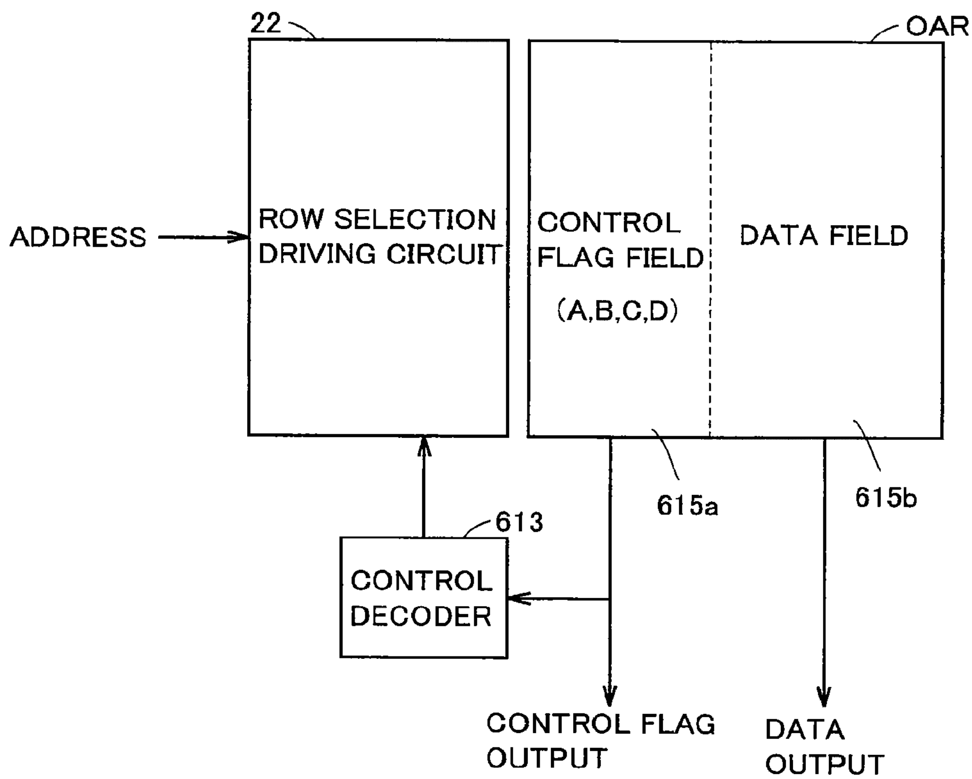

FIG. 121 shows a configuration of a semiconductor signal processing device according to a fourteenth embodiment of the present invention. Referring to FIG. 121, operator cell sub-array block OAR includes a control flag field 615*a* and a data field 615*b*. FIG. 121 representatively shows one operator cell sub-array block OAR. In the semiconductor signal processing device shown in FIG. 121, control field 615*a* and data field 615*b* are provided in a predetermined number of operator cell sub-array blocks of sub-memory array (MLA). Control flags (A to D) and data are stored in a plurality of unit operator cells UOE corresponding to each entry of sub-memory array (MLA). The unit operator cell storing the control flag and the unit operator cell storing the data are disposed for the fields in one entry.

Operator cell sub-array block OAR that is divided into control field 615*a* and data field 615*b* may be disposed at a particular position in operator cell array (20), or all the sub-array blocks may be divided into control field 615*a* and data field 615*b*. The configuration of control field 615*a* and data field 61*b* can appropriately be defined depending on the application of the device.

The semiconductor signal processing device shown in FIG. 121 includes a controlling decoder 613, instead of control circuit 30 of the semiconductor signal processing device shown in FIG. 89. Controlling decoder 613 receives and decodes control flags (A to D) read from control field 615*a* of operator cell sub-array block OAR, and supplies the decoding result to row selection driving circuit 22.

Row selection driving circuit 22 selects an entry corresponding to the address signal to read the control flags and data in the selected entry. Based on the decoding result received from controlling decoder 613, row selection driving circuit 22 selectively performs the decoding operation to select one or a plurality of entries in operator cell sub-array block OAR. The operational processing is controlled by utilizing the control flags stored in control field 615*a*, thereby achieving the high-degree or complicated operational processing.

Other configuration of the semiconductor signal processing device of the fourteenth embodiment is similar to that of the semiconductor signal processing device shown in FIG. 89, corresponding parts to those in the semiconductor signal processing device shown in FIG. 89 are designated by the same reference numerals, and the detailed description is not repeated. That is, the unit operator cell has the configuration shown in FIGS. 1 to 3, and the sense amplifier, the main amplifier circuit, and the data path are arranged in the semiconductor signal processing device of the fourteenth embodiment.

Figures 122, 123:
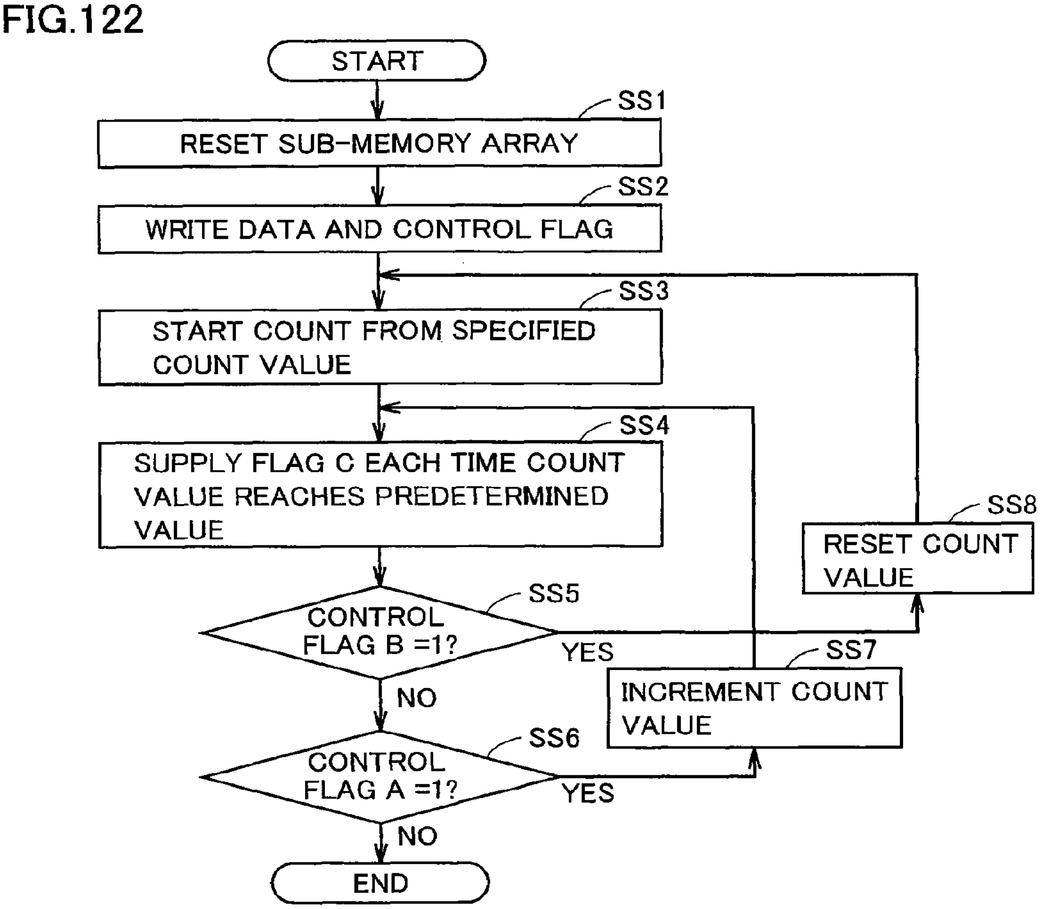

FIG. 122 is a flowchart representing an operation procedure when the semiconductor signal processing device of the fourteenth embodiment acts as a counter.

Referring to FIG. 122, the counter behavior of the semiconductor signal processing device shown in FIG. 121 will be described below.

Referring to FIG. 122, sub-memory array MLA of each operator cell sub-array block OAR is reset (Step SS1). In resetting sub-memory array MLA, the data "0" is written in all unit operator cells UOE.

The data having a predetermined pattern and control flags are written in sub-memory array MLA of each operator cell sub-array block OAR (Step SS2). A count value is supplied as the data, and a code for controlling a next behavior performed in the case of a predetermined count value is stored as the control flag. Control flag A specifies a successive counting operation (count-up) in the case of the data "1". Control flag B specifies repetition of the counting operation from an initial value in the case of the data "1". Control flag C indicates that the count value reaches a predetermined value. Control flag D is prepared for the counter expansion.

Then, the counting is started from a specified count value. That is, the entry corresponding to an initial address specified by the address signal is selected, and the data and control flag are read from the selected entry (Step SS3). The read data corresponds to the count value.

In the case where the read data reaches the predetermined count value, the corresponding control flag C is set at "1", the data indicating that read control flag C is set at "1" is supplied to CPU (Central Processing Unit, not shown) (Step SS4) or the like. The external processing unit such as CPU receives control flag C to detect that the count value reaches the predetermined value. In the case where the read data does not reach the predetermined count value, the external processing unit is not informed of control flag C, but the next processing of Step SS5 is performed.

In Step SS5, a determination of the value of control flag B is made. That is, when control flag B in the currently selected entry is set at "0" (NO in Step SS5) and when control flag A is set at "1" (YES in Step SS6), the counter is incremented (Step SS7). The address is updated to select the entry next to the currently selected entry is selected.

When control flag B in the currently selected entry is set at "1" (YES in Step SS5), the count value is reset irrespective of the value of control flag A (Step SS8), and the flow returns to Step SS3 to perform the counting behavior again. The address is reset to the initial value, and the entry corresponding to the initial address is selected to repeat the counting operation.

On the other hand, when control flag B in the currently selected entry is set at "0" (NO in Step SS5), the value of control flag A is referred to (Step SS6). When control flag A is set at "0" (NO in Step SS6), the counting operation is ended.

Accordingly, the count range and counting time duration can be set by the value of the control flag, and the processing such as the monitoring of the number of clock cycles can internally be achieved. In the counting operation, controlling decoder 613 shown in FIG. 121 decodes control flags A to D, and the address control such as the reset and increment is performed according to the decoding result.

FIG. 123 shows flags and data stored in a control field and a data field when the semiconductor signal processing device of the fourteenth embodiment behaves as an eight-bit counter. Referring to FIG. 123, the counter behavior shown in FIG. 122 will specifically be described below.

After the reset (Step SS1), the data and control flag shown in FIG. 123 are written in sub-memory array MLA of each operator cell sub-array block OAR (Step SS2). That is, eight-bit count value <7:0> is incremented for each entry and stored in the data field, and control flags A to D corresponding to each count value are stored in the associated control field of each entry.

Then, the counting is started from a specified count value. That is, row selection driving circuit 22 selects an entry corresponding to the specified initial address 0, and the information is read from the data field and control field of the selected entry (Step SS3). In the data string of the entry at the address 0, the data field is "00000001", control flag A is set at "1", control flag B is set at "0", control flag C is set at "0", and control flag D is set at "0". For example, control flag D is used as a counting start trigger when an counter is added at the next stage.

Control flag B is set at "0" in the entry corresponding to the currently selected address 0 (NO in Step SS5), and control flag A is set at "1" (YES in Step SS6). Therefore, the count value is incremented (Step SS7). That is, the address corresponding to the address 1 next to the currently selected address 0 is selected to read corresponding contents.

The values of control flags A and B are set at "1" and "0" up to the address 253, and the count value is repeatedly incremented up to the address 254 (Steps SS3 to SS8). The data string is read from the entry specified by the address 254. In reading from the entry corresponding to the address 254, the data field is "11111111", control flag A is set at "1", control flag B is set at "1", control flag C is set at "1", and control flag D is set at "0".

The count value is "11111111" that is the predetermined value, and control flag C is set at 1 in the currently selected entry. Therefore, the data indicating that the control flag C is set at 1 is supplied to CPU (not shown) (Step SS4).

Because control flag B is set at "1" in the currently selected entry (YES in Step SS5), the count value is reset (Step SS8). That is, the entry corresponding to the initial address 0 is selected again.

When control flag C is supplied to CPU (not shown) and a predetermined processing is completed in CPU, the address is set at the address 255 to stop the counting operation according to a command supplied from CPU. Entry contents of the address 255 are read. The counting operation is stopped according to the values "0" of control flags A and B in the entry of the address 255. Accordingly, the counting operation can repeatedly be performed to ensure flexibility of the processing according to the processing contents.

In the case where the processing sequence and processing time are determined in advance, control flags A and B of an entry at a certain count value (for example, address 254) are set at "0", and control flag C is set at "1". Therefore, the count value reaches the certain value (for example, address 254), the counting operation is stopped and control flag C is applied to inform the external CPU that the predetermined time period elapses. Such counter can be used as a watchdog timer.

Thus, in the semiconductor signal processing device of the fourteenth embodiment, the processing procedure (continuous counting operation and repetition and stop of counting operation) is stored in the LUT calculating unit, and the data reading operation is looped in the LUT calculating unit according to the processing procedure, so that a complicated operation function can be achieved by the counter behavior. Alternatively, when an access to a particular entry is made not through not the counter operation but according to the external address, subsequent processing operation may be stopped.

[Fifteenth Embodiment]

FIG. 124 shows an electrically equivalent circuit of a unit operator cell used in a semiconductor signal processing device according to a fifteenth embodiment of the present invention. Unit operator cell UOE shown in FIG. 124 differs from unit operator cell UOE of the first embodiment in that the gates of SOI transistors PQ1 and PQ2 are connected to write word lines WWLA and WWLB, respectively.

Write word line WWLA is provided corresponding to the unit operator cell column, and write word line WWLA is arranged extending in the Y-direction, that is, write word line WWLA is disposed in parallel to read bit line RBL. Write word line WWLB is provided corresponding to the unit operator cell row, and write word line WWLB is arranged extending in the X-direction, that is, write word line WWLB is arranged orthogonally to read bit line RBL.

In the case where the data is written through write port WPRTA, that is, in the case where the threshold voltage of SOI transistor NQ1 is set, write word line WWLA is driven to the selected state to put SOI transistor PQ1 into the conductive state. In the case where the data is written through write port WPRTB, that is, in the case where the threshold voltage of SOI transistor NQ2 is set, write word line WWLB is driven to the selected state to put SOI transistor PQ2 into the conductive state.

In FIG. 124, other configuration of unit operator cell UOE is the same as that of the unit operator cell shown in FIG. 1, corresponding parts to those in the unit operator cell shown in FIG. 1 are designated by the same reference symbols, and the detailed description is not repeated. The configuration of the unit operator cell shown in FIG. 124 is similar to that of the unit operator cell shown in FIG. 80 except that the arrangement of write word line WWLA differs from that of the unit operator cell shown in FIG. 80.

FIG. 125 schematically shows a planar layout of the unit operator cell shown in FIG. 124. Referring to FIG. 125, the P-type transistor is formed in the region surrounded by the broken line. In the P-type transistor forming region, high-concentration P-type regions 651*a* and 651*b* are arranged in alignment along the Y-direction. An N-type region 652*a* is arranged between P-type regions 651*a* and 651*b*. A P-type region 654*a* is arranged in alignment with P-type region 651*b* in the Y-direction.

High-concentration P-type regions 651*c* and 651*d* are arranged in alignment in the Y-direction. An N-type region 652*b* is arranged between P-type regions 651*c* and 651*d*. A P-type region 654*b* is arranged in alignment with P-type region 651*c* in the Y-direction.

High-concentration N-type regions 653*a*, 653*b*, and 653*c* are arranged outside the P-type transistor forming region and adjacent to P-type regions 651*b*, 654*a*, 654*b*, and 651*c*. P-type region 654*a* is arranged, between N-type regions 653*a* and 653*b*, extending from the P-type transistor forming region, and P-type region 654*b* is arranged, between N-type regions 653*b* and 653*c*, extending from the P-type transistor forming region.

A gate electrode interconnection line 655*a* is arranged, on N-type region 652*a*, extending in the X-direction, and a gate electrode interconnection line 655*b* is arranged on P-type region 654*a*. A gate electrode interconnection 655*d* is arranged, on N-type region 652*b*, extending in the X-direction, and a gate electrode interconnection line 655*c* is arranged on P-type region 654*b*. In FIG. 125, gate electrode interconnection lines 655*a*, 655*b*, 655*c*, and 655*d* are shown extending only within unit operator cell UOE. However, gate electrode interconnection lines 655*a*, 655*b*, 655*c*, and 655*d* are arranged continuously extending along the X-direction.

A first metal interconnection line 656*a* is arranged continuously extending in the X-direction. A first metal interconnection line 656*b* is arranged continuously extending in the X-direction, and first metal interconnection line 656*b* is arranged adjacent to first metal interconnection line 656*a* and being separated from first metal interconnection line 656*a*. A first metal interconnection line 656*c* is arranged continuously extending in the X-direction, and first metal interconnection line 656*c* is arranged adjacent to first metal interconnection line 656*b* and being separated from first metal interconnection line 656*b*. A first metal interconnection line 656*d* is arranged continuously extending in the X-direction, first metal interconnection line 656*d* is arranged adjacent to first metal interconnection line 656*c* and being separated from first metal interconnection line 656*c*, and first metal interconnection 656*d* is arranged being aligned with gate electrode interconnection line 655*c*. A first metal interconnection line 656*e* is arranged continuously extending in the X-direction, first metal interconnection line 656*e* is arranged adjacent to first metal interconnection line 656*d* and being separated from first metal interconnection line 656*d*, and first metal interconnection line 656*e* is arranged being aligned with gate electrode interconnection line 655*d*.

First metal interconnection line 656*a* is connected to P-type region 651*a* through a via/contact 658*b* and an intermediate first interconnect. First metal interconnection line 656*b* is electrically connected to lower-layer N-type region 653*a* through a via/contact 658*c* to constitute source line SL. First metal interconnection line 656*c* arranged adjacent to gate electrode interconnection line 655*b* is electrically connected to gate electrode interconnection line 655*b* in a not shown region to constitute read word line RWLA. First metal interconnection line 656*d* is electrically connected to gate electrode interconnection line 655*c* in a not shown region to constitute read word line RWLB. First metal interconnection line 656*e* is electrically connected to gate electrode interconnection line 655*d* in a not shown region to constitute write word line WWLB.

Second metal interconnection lines 657*a* to 657*d* are arranged in a boundary region of each active region (region where a transistor is formed) and continuously extending along the Y-direction. Second metal interconnection line 657*a* is electrically connected to N-type region 653*c* through a via/contact 658*e* and the intermediate first metal interconnect. Second metal interconnection line 657*b* is electrically connected to N-type region 653*b* through a via/contact 658*d* and the intermediate first interconnect. Second metal interconnection line 657*c* is connected to P-type region 651*d* through a via/contact 658*f* and the intermediate first interconnect. Second metal interconnection line 657*d* is electrically connected to gate electrode interconnection line 655*a* through via/contact 658*a* and the intermediate first interconnect to constitute write word line WWLA.

Second metal interconnection lines 657*a* and 657*b* transmit the output data DOUTB and DOUTA through the read ports, respectively. First metal interconnection line 656*a* and second metal interconnection line 657*c* transmit input data DINA and DINB through the write ports, respectively. That is, second metal interconnection lines 657_a_ and 657_b_ constitute read ports RPRTB and RPRTA shown in FIG. 124 respectively, and first metal interconnection line 656_a_ and second metal interconnection line 657_c_ constitute write ports WPRTA and WPRTB shown in FIG. 124 respectively.

In the planar layout shown in FIG. 125, P-type regions 651_a_ and 651_b_, N-type region 652_a_, and gate electrode interconnection line 655_a_ constitute P-channel SOI transistor PQ1. P-type regions 651_c_ and 651_d_, N-type region 652_b_, and gate electrode interconnection line 655_d_ constitute P-channel SOI transistor PQ2. N-type regions 653_a_ and 653_b_, P-type region 654_a_, and gate electrode interconnection line 655_b_ constitute N-channel SOI transistor NQ1. N-type regions 653_b_ and 653_c_, P-type region 654_b_, and gate electrode interconnection line 655_c_ constitute N-channel SOI transistor NQ2.

That is, P-type region 651_c_ is connected to write port WPRTA, N-type region 653_a_ is connected to source line SL, and N-type region 653_b_ is connected to read port RPRTA. P-type region 654_a_ placed between N-type regions 653_a_ and 653_b_ constitutes the body region of SOI transistor NQ1. P-type region 654_a_ is arranged adjacent to high-concentration P-type region 651_b_, and P-type regions 651_b_ and 654_a_ are electrically connected to each other. N-type region 652_a_ constitutes the body region of SOI transistor PQ1.

In SOI transistor PQ1, a channel is formed at a surface of body region (N-type region) 652_a_, whereby charges transmitted from write port WPRTA are transmitted through P-type region 651_b_ to and accumulated in P-type region 654_a_. The voltage at the body region of SOI transistor NQ1 is set at a voltage level corresponding to the write data, and the threshold voltage of SOI transistor NQ1 is set at a level corresponding to the storage data. N-type region 653_b_ constitutes the pre-charge node, and N-type region 653_b_ is maintained at the voltage level at which the PN junction between regions 654_a_ and 653_b_ is kept non-conductive irrespective of the voltage level of P-type region 654_a_. Source line SL is usually maintained at the level of power supply voltage VCC to prevent the PN junction between the body region and the source line from being conductive.

In reading the data, the logical high level voltage is applied to the gate electrode interconnection line formed above the body region of SOI transistor NQ1. The voltage applied to the gate electrode selectively forms the channel at the surface of P-type region 654_a_ according to the storage data, and the current flows from source line SL to read port RPRTA according to storage data. The data is read by sensing the current. The charges accumulated in body region (P-type region) 654_a_ are still retained, and the data can be stored in the nonvolatile manner.

It is merely required to sense the amount of current supplied from source line SL according to the threshold voltages of SOI transistors NQ1 and NQ2, so that the data can be read at high speed.

FIG. 126 schematically shows an entire configuration of the semiconductor signal processing device of the fifteenth embodiment. Referring to FIG. 126, the semiconductor signal processing device of the fifteenth embodiment differs from the semiconductor signal processing device of the first embodiment in that a column selection driving circuit 670 is provided between operator cell sub-array block OAR0 and main amplifier circuit 24. Column selection driving circuit 670 includes a plurality of write drivers WWADV provided corresponding to the unit operator cell columns. Data path 28 includes a plurality of write data drivers WDATBDV provided corresponding to the unit operator cell columns. Row drive circuit XDR includes a plurality of write drivers WWBDV, a plurality of read drivers RWADV, a plurality of read drivers RWBDV, and a plurality of write data drivers WDATADV, which are provided corresponding to the unit operator cell rows.

Write driver WWADV drives, to the selected state, a global write word line WWLA<i> corresponding to the column to which unit operator cells UOE to be selected belongs. Write word line driver WWBDV drives, to the selected state, write word line WWLB corresponding to the row to which unit operator cell UOE to be selected belongs. Read driver RWADV and read driver RWBDV drive, to the selected state, read word lines RWLA and RWLB corresponding to the unit operator cell row to be selected.

Global write word line WWLA<i> is arranged for each unit operator cell column and being shared by operator cell sub-array OAR0 to OAR31. As described later, the sub-block selection circuit is arranged for operator cell sub-array OAR, and the data write is performed in the selected sub-array block.

FIG. 127 specifically shows a configuration of operator cell sub-array block OAR shown in FIG. 126. FIG. 127 representatively shows operator cell sub-array blocks OAR0 and OAR1 included in operator cell array 20.

In FIG. 127, each of operator cell sub-array blocks OAR0 and OAR1 includes a sub-write word line driver band 675 that is arranged adjacent to sense amplifier band 38. Sub-write word line driver band 675 includes a plurality of AND gates GBS provided corresponding to the unit operator cell columns. Each of operator cell sub-array blocks OAR0 and OAR1 includes a plurality of local write word lines LCWWLA provided corresponding to the unit operator cell columns. Local write word line LCWWLA corresponds to write word line WWLA shown in FIGS. 124 and 125. Row selection driving circuit 22 includes a plurality of sub-array block selection drivers BSDV provided corresponding to operator cell sub-array block OAR.

AND gate GBS supplies the signal indicating a logical product operational result of the signal on write word line WWLA and the output signal on the sub-array block selection driver BSDV, to local write word line LCWWLA.

Row selection driving circuit 22 enables sub-array block selection driver BSDV corresponding to operator cell sub-array block OAR to be selected, and row selection driving circuit 22 drives local write word line LCWWLA to the selected state in operator cell sub-array block OAR to be selected. Therefore, any operator cell sub-array block can be selected.

FIG. 128 conceptually shows a data flow in an operation of the semiconductor signal processing device of the fifteenth embodiment. Referring to FIG. 128, the operation performed by the semiconductor signal processing device of the fifteenth embodiment will be described below.

In FIG. 128, data DINB[m:0] is written as the mask bit data in operator cell array 20 using B-port write word line WWLB and B-port data line DINB. For example, a data string "11111111" is written in a plurality of SOI transistors NQ2 in unit operator cell row <0> of operator cell sub-array block OAR31, a data string "10101010" is written in a plurality of SOI transistors NQ2 in unit operator cell row <1>, and a data string "11110000" is written in a plurality of SOI transistors NQ2 in unit operator cell row <2>. In writing the mask bit data, write word line WWLB<i> arranged for the unit operator cell row of the write target is driven to the selected state, transistors PQ2 of unit operator cells UOE of the corresponding row are concurrently set at the on-state to write the data in the body regions of transistors NQ2.

Data DINB[n:0] is written as the word parallel data in operator cell array 10 using write word line WWLA and data line DINA. The word parallel data is data formed of the bits located at the same bit position of a plurality of words. Using global write word line WWLA and block selection signal, data DINA[n:0] is transferred to data lines DINA, and the data bits are concurrently written in transistors NQ1 of unit operator cells UOE that are aligned in the Y-direction (column direction) in selected sub-array block OARi. Accordingly, write word lines WWLA are sequentially driven to the selected state to write all the data DINA[n: 0], the bits of data word <0> are stored in unit operator cell row <0>, and the bits of data word <1> are stored in unit operator cell row <1>. For example, any data word <0> are written in bit serial manner in SOI transistors NQ1 in unit operator cell row <0> of operator cell sub-array block OAR31.

Read word lines RWLA<0> and RWLB<0> are driven to the selected state, SOI transistors NQ1 and NQ2 in unit operator cell row <0> of operator cell sub-array block OAR31 are selected as the read target, and the AND operation is also selected. In the storage state shown in FIG. 128, all the mask data bits of unit operator cell row <0> are set at “1”, and the data string of data word <0> written in the plurality of SOI transistors NQ1 in unit operator cell row <0> is read as data DOUT[m:0] through data bus DOUTB.

SOI transistors NQ1 and NQ2 in unit operator cell row <1> of operator cell sub-array block OAR31 are selected as the read target, and the AND operation is also selected. Therefore, the data string is read as data DOUT[m:0], while odd bits (the unit operator cells in which the mask data bit “0” is written) out of the data string written in the plurality of SOI transistors NQ1 in unit operator cell row <1> are masked.

Selected read word lines RWLA and RWLB are updated, SOI transistors NQ1 and NQ2 in unit operator cell row <2> of operator cell sub-array block OAR31 is selected as the read target, and the AND operation is also selected. The data string written in the plurality of SOI transistors NQ1 in unit operator cell row <2> b is read as data DOUT[m:0] with the upper four bits being masked by the mask bit “0”.

Thus, in the semiconductor signal processing device of the fifteenth embodiment, when the mask bit data string is supplied into the semiconductor signal processing device from the Y-direction while word-parallel data string (DINA[n:0]) is fed into the semiconductor signal processing device from the X-direction, bit-parallel data string (DOUTB[m:0]) is supplied with desired bits being masked in a word serial manner. Thus, in the semiconductor integrated circuit device, a predetermined bit can be masked while the orthogonal transform of the data string is performed.

[Sixteenth Embodiment]

FIG. 129 schematically shows a sectional structure of a memory cell used in a semiconductor signal processing device according to a sixteenth embodiment of the present invention. As shown in FIG. 129, an MRAM (magnetic random access memory) cell is used in the sixteenth embodiment. FIG. 129 shows structures of memory cells MCI, MCJ, and MCK arranged on i-th memory cell row <i>, first memory cell row <j>, and k-th memory cell row <k> in a plurality of memory cells that are disposed in rows and columns in operator cell array 20. In the sixteenth embodiment, the three memory cell rows are selected in parallel at a maximum. Memory cells MCI, MCJ, and MCK are the MRAM cell formed of one transistor and one MTJ element. Referring to FIG. 129, high-concentration N-type impurity regions 702I, 704I, 702J, 704J, 702K, and 704K are disposed being separated from one another at a surface of a semiconductor substrate region 700. A gate electrode 705I is formed above a channel forming region 703I between impurity regions 702I and 704I with a gate insulating film (not shown) interposed in between. Similarly, a gate electrode 705J is formed above a channel forming region 703J between impurity regions 702J and 704J with a gate insulating film (not shown) interposed in between. A gate electrode 705K is formed above a channel forming region 703K between impurity regions 702K and 704K with a gate insulating film (not shown) interposed in between.

An access transistor of memory cell MCI is formed by impurity regions 702I and 704I and gate electrode 705I. Gate electrode 705I constitutes read word line RWLi. In memory cell MCI, a variable magnetoresistive element (MTJ element) MTJI is provided as a variable resistive element corresponding to and in an upper layer of an access transistor.

Variable magnetoresistive element MTJI includes a fixed layer FXL in which a magnetization direction is fixed, a free layer FRL in which the magnetization direction is changed according to the storage data, and a tunnel burlier layer TBL that is located between fixed layer FXL and free layer FRL. Free layer FRL is connected to bit line BL through an upper electrode UELR. Fixed layer FXL is connected to a local interconnect LII through a lower electrode (not shown). Local interconnect LII is electrically connected to impurity region 702I by plugs 706I and 707I and an intermediate layer interconnect 708I. Below variable magneto-resistive element MTJI, a conductive line 709I is arranged in the same interconnection layer as intermediate layer interconnect 708I. Conductive line 709I constitutes write word line WWLi.

In memory cell MCJ, the access transistor is formed by impurity regions 702J and 704J and gate electrode 705J. Gate electrode 705J constitutes another read word line RWLj.

A variable magnetoresistive element MTJJ is provided above the access transistor forming region of memory cell MCJ. Because variable magnetoresistive element MTJJ has the same configuration as variable magnetoresistive element MTJI, the reference numerals are not allotted. Variable magnetoresistive element MTJJ is electrically connected to impurity region 702J through a local interconnect LIJ, plugs 706J and 707J, and an intermediate layer interconnect 708J.

Below variable magnetoresistive element MTJJ, a conductive line 709J is arranged in the same interconnection layer as an intermediate layer interconnect 708J. Conductive line 709J constitutes write word line WWLj.

In memory cell MCK, the access transistor is formed by impurity regions 702K and 704K and gate electrode 705K. Gate electrode 705K constitutes another read word line RWLk.

A variable magnetoresistive element MTJK is provided above the access transistor forming region of memory cell MCK. Because variable magnetoresistive element MTJK has the same configuration as variable magnetoresistive element MTJI, the reference numerals are not allotted. Variable magnetoresistive element MTJK is electrically connected to impurity region 702K through a local interconnect LIK, plugs 706K and 707K, and an intermediate layer interconnect 708K.

Below variable magnetoresistive element MTJK, a conductive line 709K is arranged in the same interconnection layer as intermediate layer interconnect 708K. Conductive line 709K constitutes write word line WWLk.

FIG. 130 shows electrically equivalent circuits of memory cells MCI, MCJ, and MCK shown in FIG. 129. Referring to FIG. 130, memory cell MCI includes an access transistor ATI and variable magnetoresistive element MTJI, which are connected in series between bit line BL and source line SLI. Memory cell MCJ includes access transistor ATJ and variable magnetoresistive element MTJJ, which are connected in series between bit line BL and source line SLJ. Memory cell MCK includes access transistor ATK and variable magnetoresistive element MTJK, which are connected in series between bit line BL and source line SLK. In FIG. 130, source lines SLI, SLJ, and SLK are disposed in a direction orthogonal to bit line BL. Alternatively, source lines SLI, SLJ, and SLK may be disposed in parallel with bit line BL. Source lines SLI, SLJ, and SLK are connected to the ground node.

Access transistors ATI, ATJ, and ATK are selectively put into the on-state in response to the potentials on read word lines RWLi, RWLj, and RWLk, respectively. Write word lines WWLi, WWLj, and WWLk are physically separated from but magnetically connected to variable magnetoresistive elements MTJI, MTJJ, and MTJK variable magnetoresistive elements MTJI, MTJJ, and MTJK.

The magnetization directions in free layers FRL of variable magnetoresistive elements MTJI, MTJJ, and MTJK are set according to magnetic fields induced by the currents flowing through bit line BL and write word lines WWLi, WWL1, and WWLk.

FIGS. 131A and 131B schematically show a relationship between magnetization directions of a free layer and a fixed layer and resistance value of the variable magnetoresistive element. In FIGS. 131A and 131B, the magnetization direction is indicated by an arrow. As shown in FIG. 131A, in the case where the magnetization directions of fixed layer FXL and free layer FRL differ from each other (antiparallel), an electrical resistance is high against the current flowing through the variable magnetoresistive element due to the magneto-resistance effect. In this state, the variable magnetoresistive element becomes a high-resistance state against the current, and the variable magnetoresistive element has a resistance value Rmax.

On the other hand, as shown in FIG. 131B, when the magnetization directions of fixed layer FXL and free layer FRL are matched with each other, that is, when the magnetization directions thereof are parallel to each other, the variable magnetoresistive element becomes a low-resistance state against the current, and the variable magnetoresistive element has a resistance value Rmin.

When access transistor AT (ATI, ATJ, and ATK) is in the on-state, the amount of current flowing through bit line BL and source line SL (SLI and SLJ) depends on the resistance values of variable magnetoresistive element MTJ (MTJI, MTJJ, and MTJK). The sense amplifier (not shown) senses the current amount, thereby reading the data stored in memory cell MC (MCI, MCJ, and MCK). For example, the high-resistance state of resistance value Rmax is correlated with the data "0", and the low-resistance state of resistance value Rmin is correlated with the data "1".

In writing the data, access transistors ATI, ATJ, and ATK shown in FIG. 130 are maintained in the off-state. The current flows through write word line WWL (WWLi, WWLj or WWLk) in a predetermined direction to induce a magnetic field. The current flows through bit line BL in the direction according to the write data. The magnetization direction in free layer FRL of variable magnetoresistive element MTJ is set at a parallel state or an antiparallel state with respect to the magnetization direction of fixed layer FXL by a combined magnetic field. The combined magnetic field is formed by the magnetic field that is induced by the current flowing through bit line BL and the magnetic field that is induced by the current flowing through write word line WWL. The resistance state of variable magnetoresistive element MTJ is set by the magnetization direction of the free layer and the data is written.

The data of memory cell MC is set by the magnetization direction in the free layer of the variable magnetoresistive element. The magnetization direction in the free layer is not changed unless a factor inverting the magnetization direction in the free layer is applied externally. Accordingly, the data can be stored in memory cell MC in a nonvolatile manner. The magnetization direction in the free layer FRL is determined by the magnetic field induced by the bit line current and the write word line current, and the current does not flow through a tunnel insulating film or the like in writing the data unlike a flash memory. Accordingly, the problem such as the deterioration of the interlayer insulating film can be avoided, and the number of rewriting times substantially can be made infinite in the variable magnetoresistive element.

The magnetization direction in the free layer of the variable magnetoresistive element depends on the currents flowing through bit line BL and write word line WWL, so that the data can be written at high speed. The data is read according to the amount of current flowing through bit line BL, so that the data can be read at high speed. The data is read according to magnitude of the currents flowing through variable magnetoresistive elements MTJI, MTJJ, and MTJK, and the magnetization directions in the free layers of variable magnetoresistive elements MTJI, MTJJ, and MTJK are not inverted by the read currents. Accordingly, the data is read in a nondestructive manner, the restoring operation is eliminated unlike the DRAM cell and the ferroelectric capacitor, and a data read cycle can be shortened.

In the sixteenth embodiment, the characteristic feature of the MRAM cell is utilized to perform the operational processing using the data stored in the memory cells and the amplifying operation of a sense amplifier (not shown).

FIG. 132 schematically shows an arrangement of memory cells in an array in the semiconductor signal processing device of the sixteenth embodiment. FIG. 132 representatively shows circuitry corresponding to two memory cell columns.

Read word line RWLi and write word line WWLi are provided corresponding to memory cells MCI1 and MCI2, read word line RWLj and write word line WWL1 are provided corresponding to memory cells MCJ1 and MCJ2, and read word line RWLk and write word line WWLk are provided corresponding to memory cells MCK1 and MCK2. A source line SLi extending in a row direction is provided for memory cells MCI1 and MCI2. A source line SLI extending in the row direction is provided corresponding to memory cells MCJ1 and MCJ2. A source line SLk extending in the row direction is provided corresponding to memory cells MCK1 and MCK2. Source lines SLi, SLj, and SLk are connected to the ground node through a common source line SLCM.

Bit line BL is arranged corresponding to a memory cell column, and two dummy cells DMCA and DMCB are provided corresponding to each memory cell column. That is, bit line BL1 is arranged for memory cells MCI1, MCJ1, and MCK1, and dummy cells DMCA1 and DMCB1 are connected to bit line ZBL1 paired with bit line BL1. Bit line BL2 is arranged for memory cells MCI2, MCJ2, and MCK2, and dummy cells DMCA2 and DMCB2 are connected to bit line ZBL2 paired with bit line BL2.

A dummy read word line DRWL1, a dummy write word line DWWL1, and a dummy source line DSL1 are provided corresponding to dummy cells DMCA1 and DMCA2. A dummy read word line DRWL2, a dummy write word line DWWL2, and a dummy source line DSL2 are provided corresponding to dummy cells DMCB1 and DMCB2

Dummy source line DSL1 for dummy cells DMCA1 and DMCA2 is connected through switch MSW1 to reference voltage node VREF1 to which reference voltage VREF1 is supplied or reference voltage node VREF3 to which reference voltage VREF3 is supplied.

Dummy source line DSL2 for dummy cells DMCB1 and DMCB2 is connected through switch MSW2 to reference voltage node VREF2 to which reference voltage VREF2 is supplied or reference voltage node VREF4 to which reference voltage VREF4 is supplied. Dummy cells DMCA1, DMCA2, DMCB1, and DMCB2 are set at the low-resistance state, and dummy cells DMCA1, DMCA2, DMCB1, and DMCB2 have the resistance value Rmin.

A determination on which of reference voltage nodes VREF1 and VREF3 is connected to dummy source line DSL1 and a determination on which of reference voltage nodes VREF2 and VREF4 is connected to dummy source line DSL2 are made based on the type of an operation to be performed on the data read from memory cell MC as described later. Because the MRAM cell is used as the memory cell, reference voltages VREF1 to VREF4 are set at voltage levels that are different from the reference voltage level of the unit operator cell in which a TTRAM cell is used. The voltage levels of reference voltages VREF1 to VREF4 in the sixteenth embodiment is described later along with a specific operation.

Bit lines BL and ZBL are provided corresponding to the column of dummy cells DMC and the column of memory cells MC. Memory cells MCI1, MCJ1, and MCK1 are connected to bit line BL1 in parallel, and dummy cells DMCA 1 and DMCB1 are connected to complementary bit line ZBL1. Memory cells MCI2, MCJ2, and MCK2 are connected to bit line BL2 in parallel, and dummy cells DMCA2 and DMCB2 are connected to complementary bit line ZBL2.

Read drivers RWDVI, RWDVJ, and RWDVK are provided at first ends of read word lines RWLi, RWLj, and RWLk, respectively. Read drivers DRWDV1 and DRWDV2 are provided at first ends of dummy word lines DRWL1 and DRWL2, respectively. Write drivers WWDVI, WWDVJ, and WWDVK are provided at first ends of write word lines WWLi, WWLj, and WWLk, respectively. Write drivers DWWDV1 and DWWDV2 are provided at first ends of dummy write word lines DWWL1 and DWWL2.

In reading data, read drivers RWDVI, RWDVJ, RWDVK, DRWDV1, and DRWDV2 drive the corresponding read word lines to the selected state. In writing data, write drivers WWDVI, WWDVJ, WWDVK, DWWDV1, and DWWDV2 drive the corresponding write word lines to the selected state.

Sense amplifier SA1 is provided at first ends of bit lines BL1 and ZBL1. Write drivers WDVA1 and WDVA2 are provided at both (first and second) ends of bit line BL1, and write drivers DWDVA1 and DWDVA2 are provided at first and second ends of complementary bit line ZBL1. In writing data, write drivers WDVA1 and WDVA2 bi-directionally pass the currents through bit line BL1 according to complementary data D and /D. Similarly, write drivers DWDVA1 and DWDVA2 bi-directionally pass the currents through complementary bit line ZBL1 according to complementary data DD and /DD. Write drivers WDVA1, WDVA2, DWDVA1, and DWDVA2 are each formed by a bi-directional driver, so that the currents can bi-directionally pass through bit lines BL1 and ZBL1 according to the write data, to write data in memory cells MCI1, MCJ1, and MCK1.

Similarly, sense amplifier SA2 is provided at first end of bit lines BL2 and ZBL2. Write drivers WDVB1 and WDVB2 are provided at first and second opposite ends of bit line BL2, and write drivers DWDVB1 and DWDVB2 are provided at first and second opposite ends of complementary bit line ZBL2. In data writing, write drivers WDVB1 and WDVB2 bi-directionally pass the currents through bit line BL2 according to complementary data D and /D. Similarly, write drivers DWDVB1 and DWDVB2 bi-directionally pass the currents through complementary bit line ZBL2 according to complementary data DD and /DD. Write drivers WDVA1, WDVA2, DWDVA1, and DWDVA2 are each formed by a bi-directional driver, so that the currents can bi-directionally flow through bit lines BL2 and ZBL2 according to the write data, to write data in memory cells MCI2, MCJ2, and MCK2.

However, because dummy cell DMC is set at the low-resistance state, the supplying direction of the current is fixed in write drivers DWDVA1, DWDVA2, DWDVB1, and DWDVB2 that are provided corresponding to complementary bit line ZBL, and it is not particularly required for write drivers DWDVA1, DWDVA2, DWDVB1, and DWDVB2 to bi-directionally supply the currents.

Sense amplifier SA, pair of write drivers WDV, and pair of write drivers DWDV are provided for each bit line pair. It is sufficient to use a write driver in a general MRAM as the write driver WDV. In the case where data are written for each memory cell row, it is not necessary to apply the column selection signal to the write drivers. In the case where data are sequentially written in each bit line, the write driver of the selected column is enabled by the column selection signal.

The reason why dummy source lines DSL1 and DSL2 of dummy cells DMCA1, DMCA2, DMCB1, and DMCB2 are connected to reference voltage nodes VREF1 to VREF4, not to the ground node will be described below. In data reading, in the case where the voltages VREF1 to VREF4 at the reference voltage nodes are set at desired values, the amounts of currents flowing through dummy cells DMCA1, DMCA2, DMCB1, and DMCB2 can be set to an intermediate value among the currents flowing through memory cells MCI, MCJ, and MCK or to a higher value than those.

During the operational processing, as described in detail later, memory cells MCI, MCJ, and MCK are concurrently selected, and the currents corresponding to the data stored in memory cells MCI, MCJ, and MCK flow through bit line BL. The voltage levels of reference voltages VREF1 to VREF4 are adjusted with respect to the combined current on bit line BL, to adjust the dummy cell current flowing through complementary bit line ZBL, for performing a necessary operation.

In writing data, memory cells MCI, MCJ, and MCK are sequentially selected, and the data is written by pair of write drivers WDV. In reading data, read word lines RWLi, RWLj, and RWLk are concurrently driven to the selected state, and variable magnetoresistive elements MTJI, MTJJ, and MTJK of memory cells MCI, MCJ, and MCK are concurrently connected to bit line BL.

The data reading operation in the case where one memory cell row <i> is selected in the semiconductor signal processing device shown in FIG. 132 will be described below.

FIG. 133 shows, in a list form, combinations of data stored in memory cell MCI. As shown in FIG. 133, there are two states as a combination of resistance states of variable magnetoresistive element MTJI of memory cell MCI. In a state S(0), variable magnetoresistive element MTJI of memory cell MCI is in a high-resistance state H (Rmax). In a state S(1), variable magnetoresistive element MTJI is in a low-resistance state L (Rmin). Here, the high-resistance state is correlated with data "0", and the low-resistance state is correlated with data "1".

In writing data, a plurality of memory cells MCI corresponding to memory cell row <i> are concurrently selected to set the resistance state of each variable magnetoresistive element MTJI. That is, in writing the data, write word line WWL<i> is selected, and the current is supplied in the direction corresponding to the write data through bit line BL of a selected column using a pair of write drivers WDV arranged at both ends of bit line BL of the selected column. In this operation, the current is passed in a constant direction in write word line WWLI irrespective of the logical value of the write data, and write word line WWLI is physically separated from memory cell. Therefore, data may concurrently be written in the memory cells of the selected row <i>.

In reading data, the plurality of memory cells MCI on memory cell row <i> are selected, and variable magnetoresistive elements MTJI are concurrently connected to corresponding bit lines BL. Sense amplifier SA supplies the current to each bit line. Accordingly, in reading the data, the read current of sense amplifier SA flows from bit line BL to source line SL through each variable magnetoresistive element MTJI according to the data stored in the memory cell.

In dummy cells DMCA and DMCB on each memory cell column, one dummy cell is selected in the data reading. That is, one of dummy read word lines DRWL1 and DRWL2 is selected. Dummy cells DMCA and DMCB are in the low-resistance state L (Rmin), and dummy cells DMCA and DMCB have the resistance value Rmin. The amount of current flowing through dummy cells DMCA and DMCB is adjusted by selecting the voltage levels of reference voltages VREF1 to VREF4. The case will be described below, in which dummy read word line DRWL1 is selected, dummy cell DMCA is selected, and dummy cell DMCA is connected to reference voltage node VREF1 by switch MSW.

FIG. 134 shows a relationship between the read potential and currents flowing through bit lines BL and ZBL in data read. In FIG. 134, a vertical axis indicates potentials at bit lines BL and ZBL and a horizontal axis indicates time. Before the data is read, bit lines BL and ZBL are pre-charged to a predetermined voltage level (read voltage level) by the sense amplifier.

When memory cell MCI is in state S(0), memory cell MCI (variable magnetoresistive element MTJI) is in the high-resistance state in which the current flowing through memory cell MCI becomes the minimum. In such case, the decreasing speed in potential at bit line BL is the slowest.

In state S(1), memory cell MCI (variable magnetoresistive element MTJI) is in the low-resistance state in which a large amount of current flows from bit line BL to source line SL. Accordingly, the potential at the bit line largely lowers at the fastest speed.

Dummy cell DMCA is in the low-resistance state L (Rmin), and the source line of memory cell MCI is maintained at the ground voltage level. Reference voltage VREF1 is set at the voltage level not lower than the ground voltage, whereby the current passing through dummy cell DMCA is larger than the current passing through bit line BL in state S(0) and smaller than the current passing through bit line BL in state S(1). Accordingly, in selecting dummy cell DMCA, the potential at complementary bit line ZBL can be set at the state between state S(0) and state S(1). In this state, current Id1 passing through dummy cell DMCA can be expressed as follows.

$$I1>Id1>Ih.$$

Here, Ih is a current passing through memory cell MC in the high-resistance state and I1 is a current passing through memory cell MC in the low-resistance state.

Sense amplifier SA differentially amplifies the currents of bit lines RBL and ZRBL to read the data stored in memory cells MCI. In sense amplifier SA, the binary determination of the bit line current is made with the current passing through dummy cell DMC being the reference value. Accordingly, the output of sense amplifier SA indicates the logical value of one-bit data stored in memory cells MCI.

FIG. 135 shows, a list form, correlations between the output signal of sense amplifier SA and the storage state of memory cell MCI in the semiconductor signal processing device of the sixteenth embodiment.

As shown in FIG. 135, in a state S(0), variable magnetoresistive element MTJI is in high-resistance state H (Rmax), and data "0" is stored in variable magnetoresistive element MTJI. As shown in FIG. 134, the current passing through bit line BL is smaller than the current passing through complementary bit line ZBL, and the potential at bit line BL is higher than the potential at complementary bit line ZBL. In this state, the output signal of the sense amplifier attains "1".

In a state S(1), memory cell MCI is in low-resistance state L (Rmin), and the data "1" is stored in memory cell MCI. As shown in FIG. 134, the current passing through bit line BL is larger than the current passing through complementary bit line ZBL, and the potential at bit line BL is lower than the potential at complementary bit line ZBL. In this state, the output signal of the sense amplifier attains "0".

Accordingly, the sense amplifier outputs the NOT operational result of the data stored in memory cells MCI.

The read operation in the case where two memory cell rows <i> and <1> are selected concurrently in semiconductor signal processing device 101 will be described below.

FIG. 136 shows, in a list form, combinations of data stored in memory cells MCI and MCJ on rows <i> and <j>. As shown in FIG. 136, there are four states as a combination of resistance states of variable magnetoresistive elements MTJI and MTJJ of memory cells MCI and MCJ. In a state S(0,0), both variable magnetoresistive elements MTJI and MTJJ of memory cells MCI and MCJ are in high-resistance state H (Rmax). In a state S(1,0), variable magnetoresistive elements MTJI and MTJJ are in low-resistance state L (Rmin) and high-resistance state H (Rmax), respectively. In this state, the high-resistance state is correlated with data "0", and the low-resistance state is correlated with data "1".

In a state S(0,1), variable magnetoresistive elements MTJI and MTJJ are in high-resistance state H (Rmax) and low-resistance state L (Rmin), respectively. In a state S(1,1), both variable magnetoresistive elements MTJI and MTJJ are in low-resistance state L (Rmin).

In writing data, a plurality of memory cells MCI on memory cell row <i> and a plurality of memory cells MCJ corresponding to memory cell row <j> are separately selected to set the resistance state of each variable magnetoresistive element MTJI and the resistance state of each variable magnetoresistive element MTJJ. That is, in writing the data, write word lines WWL<i> and WWL<j> are sequentially selected, and the current is supplied through bit line BL in the direction corresponding to the write data using a pair of write drivers WDV arranged at both ends of each bit line BL shown in FIG. 132.

In reading data, the plurality of memory cells MCI corresponding to memory cell row <i> and the plurality of memory cells MCJ corresponding to memory cell row <j> are concurrently selected, and a set of variable magnetoresistive elements MTJI and a set of variable magnetoresistive element MTJJ are concurrently connected to corresponding bit lines BL. Accordingly, in reading the data, combined currents of the current passing through the set of variable magnetoresistive element MTJI and the current passing through the set of variable magnetoresistive element MTJJ pass through the respective bit lines BL.

In dummy cells DMCA and DMCB of a memory cell column, one dummy cell is selected during the data reading.

That is, one of dummy read word lines DRWL1 and DRWL2 is selected. Dummy cells DMCA and DMCB are in low-resistance state L (Rmin), and therefore have resistance value Rmin. The amounts of currents passing through dummy cells DMCA and DMCB are adjusted by selecting the voltage levels of reference voltages VREF1 to VREF4.

FIG. 137 shows a manner in which a variable magnetoresistive element is connected to a bit line and a complementary bit line in data reading. In FIG. 137, memory cells MCI and MCJ are connected in parallel. In reading the data, access transistors ATI and ATJ are concurrently selected, and variable magnetoresistive elements MTJI and MTJJ concurrently pass currents II and IJ between bit line BL and the ground node according to the storage data. Dummy cell DMC (DMCA or DMCB) passes current ID through complementary bit line ZBL according to the voltage level of reference voltage VREF (one of VREF1 to VREF4). The data is read based on the comparison between the bit-line combined current II+IJ and dummy cell current ID passing through complementary bit line ZBL.

FIG. 138 shows a relationship between the read potential and the currents passed through bit lines BL and ZBL during data read. In FIG. 138, a vertical axis indicates potential at bit lines BL and ZBL and a horizontal axis indicates time.

When memory cells MCI and MCJ are in a state S(0,0), both memory cells MCI and MCJ are in the high-resistance state, and the currents passing through memory cells MCI and MCJ become the minimum. In such case, the decreasing speed in potential at bit line BL becomes the slowest. In reading data, bit lines BL and ZBL are pre-charged to a predetermined voltage level (read voltage level) by the sense amplifier.

In a state S(1,1), both memory cells MCI and MTJJ are in the low-resistance state in which a large amount of current flows from bit line BL to source line SL. Accordingly, the potential at the bit line is largely decreased at the fastest speed.

States S(1,0) and S(0,1) are a combination of the high-resistance state and the low-resistance state, and the current intermediate between the currents passing through the bit line in states S(0,0) and S(1,1) flows. Accordingly, in states S(1,0) and S(0,1), the bit-line read potential lies between the potentials in states S(0,0) and S(1,1).

Both dummy cells DMCA and DMCB are in the low-resistance state L (Rmin), and the source lines of memory cells MCI and MCJ are maintained at the ground voltage level. Reference voltage VREF1 is selected as reference voltage VREF, and reference voltage VREF1 is set at the voltage level not lower than the ground voltage. Dummy cell DMCA is selected as the dummy cell. Therefore, the current passing through dummy cell DMCA is larger than the current passing through bit line BL in state S(0,0) and smaller than the current passing through bit line BL in states S(0,1) and S(1,0). Accordingly, in selecting dummy cell DMCA, the potential at complementary bit line ZBL can be set at a level between those in state S(0,0) and states S(0,1) and S(1,0). In this state, current Id1 passing through dummy cell DMCA can be expressed as follows.

$$I1>Id1>Ih,$$

$$2\times Ih<Id1<Ih+I1$$

Where Ih is a current passing through memory cell MC in the high-resistance state and I1 is a current passing through memory cell MC in the low-resistance state.

The case will be described below, in which dummy read word line DRWL2 is selected, dummy cell DMCB is selected, and dummy cell DMCB is connected to reference voltage node VREF2 through switch MSW2.

In the case where dummy cell DMCB is selected and reference voltage VREF2 is set at a negative voltage, the current that is larger than the current passing through one memory cell MC in the low-resistance state can be caused to flow through complementary bit line ZBL. Accordingly, in selecting dummy cell DMCB, the potential at complementary bit line ZBL can be set at a level between those in states S(1,0) and S(0,1) and state S(1,1). In this state, current Id2 passing through dummy cell DMCB can be expressed as follows.

$$I1<Id2,$$

$$2\times IL>Id2>Ih+I1$$

Sense amplifier SA differentially amplifies the currents of bit lines RBL and ZRBL to read the data stored in memory cells MCI and MCJ. In sense amplifier SA, the binary determination on the bit line current is made with the current passing through dummy cell DMC being the reference value. Accordingly, the output of sense amplifier SA indicates one of two classifications into which the combination of data of two bits stored in memory cells MCI and MCJ is bi-classified on the basis of the reference voltage, so that the logic operation can be performed on the data stored in memory cells MCI and MCJ by sense amplifier SA.

FIG. 139 shows, in a list form, correlations between the output signal of the sense amplifier and the storage states of memory cells MCI and MCJ in the semiconductor signal processing device according to the sixteenth embodiment.

As shown in FIG. 139, in state S(0,0), both variable magnetoresistive elements MTJI and MTJJ are in high-resistance state H (Rmax), and the data "0" is stored in variable magnetoresistive elements MTJI and MTJJ. In this state, even if any of dummy cells DMCA (reference voltage VREF1) and DMCB (reference voltage VREF2) is selected, as shown in FIG. 138, the current passing through bit line BL is smaller than the current passing through complementary bit line ZBL, and the potential at bit line BL is higher than the potential at complementary bit line ZBL. Therefore, the output signal of the sense amplifier attains "1".

In state S(1,0) and state S(0,1), one of memory cells MCI and MCJ is in high-resistance state H (Rmax) while the other is in low-resistance state L (Rmin). Accordingly, in the case where the reference voltage VREF1 is selected, the current passing through bit line BL is larger than the current passing through complementary bit line ZBL, and the potential at bit line BL is lower than the potential at complementary bit line ZBL. Therefore, the output signal of the sense amplifier attains "0". In the case where reference voltage VREF2 is selected, the current passing through bit line BL is smaller than the current passing through complementary bit line BL, and the potential at bit line BL is higher than the potential at complementary bit line ZBL. Therefore, the output signal of the sense amplifier attains "1".

In a state S(1,1), both memory cells MCI and MCJ are in low-resistance state L (Rmin), and the data "1" is stored in memory cells MCI and MCJ. In this state, even if any of reference voltage VREF1 and reference voltage VREF2 is selected, as shown in FIG. 138, the current passing through bit line BL is larger than the current passing through complementary bit line ZBL, and potential at bit line BL is lower than the potential at complementary bit line ZBL. Therefore, the output signal of the sense amplifier attains "0".

As shown in FIG. 139, in the case where reference voltage VREF1 is selected, the sense amplifier produces the NOR operational result of the data stored in memory cells MCI and MCJ. In the case where reference voltage VREF2 is selected, the sense amplifier produces the NAND operational result of the data stored in memory cells MCI and MCJ.

The cross-coupled latch sense amplifier may be used as the sense amplifier. However, the cross-coupled latch sense amplifier is a voltage sensing type sense amplifier, which amplifies the difference in potential between bit lines BL and ZBL. Accordingly, it is preferable to use the current sensing type sense amplifier as the sense amplifier in order to perform the sensing operation at high speed.

FIG. 140 shows a configuration of the current sensing type sense amplifier used in the semiconductor signal processing device according to the sixteenth embodiment. Sense amplifier SA shown in FIG. 140 differs from sense amplifier SA shown in FIG. 103 in that resistive-connected N-channel MOS transistors NN8 and NN9 are not provided. N-channel MOS transistors NN1 and NN6 supply cell current Icell and dummy cell current Idummy to bit lines BL and ZBL, respectively. The gates of N-channel MOS transistors NN1 and NN6 receive a sense reference voltage Vrefs. Sense reference voltage Vrefs prevents the occurrence of the situation in which a large current flows through a bit line in reading data, and the data stored in memory cells is destructed due to a magnetic field caused by such large bit line current.

The behavior of sense amplifier SA shown in FIG. 140 will briefly be described. When sense amplifier activation signals /SE and SE are inactivated, MOS transistors PP7 and NN7 are in the off-state. In such case, MOS transistors PP2 and PP5 maintain intermediate sense output signals SOT and /SOT at the level of power supply voltage VDD. MOS transistors PP1, NN1, PP6, and NN1 maintain node ND1 at the potential level similar to those of bit lines BL and ZBL. Final sense output signals SOUT and /SOUT are also maintained at the precharge level (for example, logical high level) of the output high-impedance state.

During the sensing operation, before a read word line is selected, sense amplifier activation signal /SE is activated to set MOS transistors PP7 and NN7 at the on-state. Accordingly, node ND1 is connected to the power supply node to make MOS transistors PP1 and PP6 operative, and bit lines BL and ZBL are charged. In this operation, sense amplifier activation signal SE may concurrently be activated. The activation of sense amplifier activation signal SE may be delayed until the sensing operation is started. Read word line RWL is still in the non-selected state, and bit lines BL and ZBL are pre-charged to a predetermined voltage level according to the currents supplied from MOS transistors NN1 and NN6.

When the pre-charging operation is completed, the read word line is driven to the selected state. In this state, sense amplifier activation signal SE is already activated. Therefore, cell current Icell corresponding to the storage data passes from bit line BL to the source line through the selected memory cell. Dummy cell current Idummy is passed through complementary bit line ZBL by the dummy cell. Currents Icell and Idummy are supplied by MOS transistors PP1 and PP6, respectively, the mirror current of the current passing through MOS transistor PP1 passes through MOS transistors PP2 and PP3, and the mirror current of the current passing through MOS transistor PP6 passes through MOS transistors PP4 and PP5. Accordingly, the mirror currents of cell current Icell and dummy cell current Idummy passing through the bit lines flow through MOS transistors NN2 and NN5, respectively.

In the case where cell current Icell is larger than dummy cell current Idummy, intermediate sense output signal /SOT attains the logical high level (intermediate voltage level) while intermediate sense output signal SOT attains logical low level (intermediate voltage level) through the current-voltage conversion operation of MOS transistors NN2 and NN5. On the contrary, in the case where cell current Icell is smaller than dummy cell current Idummy, intermediate sense output signal /SOT attains the logical low level while intermediate sense output signal SOT attains the logical high level. Subsequent-stage final amplifying circuit SMP further amplifies the intermediate sense output signals SOT and /SOT to produce final sense output signals SOUT and /SOUT at the power supply voltage level and ground voltage level.

The smaller current between cell current Icell and dummy cell current Idummy flows through MOS transistors PP3 and NN4, and the smaller current between dummy cell current Idummy and cell current Icell also passes through MOS transistors PP4 and NN3. The sum of the total current of the cell current Icell and dummy cell current Idummy and the current that is double the smaller current between dummy cell current Idummy and cell current Icell always passes through MOS transistor NN7. Accordingly, in cases where one-bit cell data is read to make the binary determination, MOS transistors PP3, PP4, NN3, and NN4 have a function of keeping the current passing through MOS transistor NN7 constant in order to stabilize the sensing operation.

However, similarly to the configuration shown in FIG. 103, it is not necessary to particularly provide transistors PP3, NN4, NN3, and NNT4. Alternatively, sense output signals SOUT and /SOUT may be taken out from the connection node of MOS transistors PP3 and NN4 and the connection node of MOS transistors PP4 and NN3.

As described above, sense amplifier SA produces the signals indicating the NOR operational result and NAND operational result of the data stored in a plurality of memory cells. In the case where the data stored in the memory cell is read without changing the logical value of the data, and in the case where the sense amplifier produces the OR operational result and AND operational result, main amplifier circuit 24 or data path 28 may invert the sense output signal shown in FIG. 140.

The level of dummy cell current Idummy is adjusted using reference voltages VREF1 to VREF4, which allows the NOR operation and NAND operation of two data to be selectively performed.

The reading operation in the case where three memory cell rows <i>, <j>, and <k> are selected in semiconductor signal processing device 101 will be described below.

FIG. 141 shows, in a list form, combinations of data stored in three memory cells MCI, MCJ, and MCK. As shown in FIG. 141, there are eight states as a combination of resistance states of variable magnetoresistive elements MTJI, MTJJ, and MTJK of memory cells MCI, MCJ, and MCK. In the expression of a state S(A,B,C), the letter A designates a resistance state of memory cell MCI, the letter B designates a resistance state of memory cell MCJ, and the letter C designates a resistance state of memory cell MCK. For example, a state S(0,0,0) indicates that variable magnetoresistive elements MTJI, MTJJ, and MTJK of memory cells MCI, MCJ, and MCK are in high-resistance state H (Rmax). A state S(1,1,1) indicates that variable magnetoresistive elements MTJI, MTJJ, and MTJK are in low-resistance state L (Rmin). Similarly, the high-resistance state is correlated with data “0”, and the low-resistance state is correlated with data “1”.

In writing data, a plurality of memory cells MCI corresponding to memory cell row <i>, a plurality of memory cells MCJ corresponding to memory cell row <j>, and a plurality of memory cells MCK corresponding to memory cell row <k> are separately selected in units of rows or memory cells to set the resistance states of each variable magnetoresistive element MTJI, the resistance state of each variable magnetoresistive element MTJJ, and each variable magnetoresistive element MTJK. That is, in writing the data, write word lines WWL<i>, WWL<j>, and WWL<k> are sequentially selected, and the current is supplied through each bit line BL in the direction corresponding to the write data using a pair of write drivers WDV arranged at both ends of bit line BL shown in FIG. 132.

In reading the data, the plurality of memory cells MCI corresponding to memory cell row <i>, the plurality of memory cells MCJ corresponding to memory cell row <j>, and the plurality of memory cells MCK corresponding to memory cell row <k> are concurrently selected, and sets of variable magnetoresistive elements MTJI, variable magnetoresistive element MTJJ, and variable magnetoresistive element MTJK are concurrently connected to the respective bit lines BL. Accordingly, in reading the data, a combined current of the currents passing through the set of variable magnetoresistive element MTJI, variable magnetoresistive element MTJJ and variable magnetoresistive element MTJK passes through a corresponding bit line BL.

In dummy cells DMCA and DMCB of the memory cell column, one dummy cell is selected during the data reading. That is, one of dummy read word lines DRWL1 and DRWL2 is selected. Dummy cells DMCA and DMCB are in low-resistance state L (Rmin), and dummy cells DMCA and DMCB have resistance value Rmin. The amounts of currents passing through dummy cells DMCA and DMCB are adjusted by selecting the voltage levels of reference voltages VREF1 to VREF4. The case will be described below, in which dummy read word line DRWL1 is select to select dummy cell DMCA connected to reference voltage node VREF3 through switch MSW1.

FIG. 142 shows a relationship between the read potential and the currents passing through bit lines BL and ZBL in data reading. In FIG. 142, a vertical axis indicates potentials at bit lined BL and ZBL and a horizontal axis indicates time.

When memory cells MCI, MCJ, and MCK are in state S(0,0,0), variable magnetoresistive elements MCI, MCJ, and MCK are in high-resistance state, and the currents passing through memory cells MCI, MCJ, and MCK each become the minimum. In such case, the decreasing speed in potential at bit line BL becomes the slowest. In reading the data, bit lines BL and ZBL are pre-charged to a predetermined voltage level (read voltage level) by the sense amplifier.

In a state S(1,1,1), memory cells MCI, MCJ, and MCK are in the low-resistance state in which a large amount of current flows from bit line BL to source line SL. Accordingly, the potential at the bit line largely lowers at the fastest speed.

In states S(1,0,0), S(0,1,0), and S(0,0,1), two of memory cells MCI, MCJ, and MCK are in the high-resistance state and the other is in the low-resistance state. In such case, the current intermediate between the currents passing through the bit line in states S(0,0,0) and S(1,1,1) flows. Accordingly, in states S(1,0,0), S(0,1,0), and S(0,0,1), the bit-line read potential lies between the potentials in states S(0,0,0) and S(1,1,1).

In states S(1,1,0), S(1,0,1), and S(0,1,1), two of memory cells MCI, MCJ, and MCK are in the low-resistance state , and the other one is in the high-resistance state. In such case, the current intermediate between the currents passing through the bit line in states S(0,0,0) and S(1,1,1) flows, and the bit line current becomes larger than that in states S(1,0,0), S(0, 1,0), and S(0,0,1). Accordingly, in states S(1,0,0), S(0,1,0), and S(0,0,1), the bit-line read potential lies between the potentials in states S(1,0,0), S(0,1,0), and S(0,0,1) and the potential in state S(1,1,1).

Both dummy cells DMCA and DMCB are in the low-resistance state L (Rmin), and the source lines of memory cells MCI, MCJ, and MCK are maintained at the ground voltage level. Reference voltage VREF1 is selected as reference voltage VREF, and is set at the voltage level not lower than the ground voltage. Because reference voltage VREF1 is at the voltage level not lower than the ground voltage, the current passing through dummy cell DMCA is larger than the current passing through bit line BL in state S(0,0,0) and smaller than the current passing through bit line BL in states S(1,0,0), S(0,1,0), and S(0,0,1). Accordingly, in selecting dummy cell DMCA, the potential at complementary bit line ZBL can be set at a level between those in state S(0,0,0) and states S(1,0,0), S(0,1,0) and S(0,0,1). In this state, current Id1 passing through dummy cell DMCA can be expressed as follows.

$$I1>Id1>Ih,$$

$$3\times Ih<Id1<2\times Ih+I1$$

Where Ih is a current passed through memory cell MC in the high-resistance state and I1 is a current passing through memory cell MC in the low-resistance state.

The case will be described below, in which dummy read word line DRWL2 is selected, dummy cell DMCB is selected, and dummy cell DMCB is connected to reference voltage node VREF4 through switch MSW2.

In the case where dummy cell DMCB is selected and reference voltage VREF4 is set at a negative voltage, the current that is larger than the current passing through one memory cell MC in the low-resistance state can be caused to flow through complementary bit line ZBL. Accordingly, in selecting dummy cell DMCB, the potential at complementary bit line ZBL can be set at a level between those in states S(1,1,0), S(1,0,1) and S(0,1,1) and state S(1,1,1). In this state, current Id2 passing through dummy cell DMCB can be expressed as follows.

$$I1<Id2,$$

$$3\times I1>Id2>Ih+2\times I1.$$

Sense amplifier SA differentially amplifies the currents of bit lines RBL and ZRBL to read the data stored in memory cells MCI, MCJ, and MCK. In sense amplifier SA, the binary determination of the bit line current is made with the current passing through dummy cell DMC being the reference value. Accordingly, the output of sense amplifier SA indicates one of two classifications into which the combination of data of three bits stored in memory cells MCI, MCJ, and MCK is classified on the basis of the reference voltage, so that the logic operation can be performed on the data stored in memory cells MCI, MCJ, and MCK by sense amplifier SA.

FIG. 143 shows, in a list form, correlations between the output signal of the sense amplifier and storage states of the memory cells MCI, MCJ, and MCK in the semiconductor signal processing device of the sixteenth embodiment.

As shown in FIG. 143, in a state S(0,0,0), variable magnetoresistive elements MTJI, MTJJ, and MTJK are in high-resistance state H (Rmax), and the data "0" is stored in variable magnetoresistive elements MTJI, MTJJ, and MTJK. In this state, even if any of dummy cells DMCA (reference voltage VREF3) and DMCB (reference voltage VREF4) is selected, as shown in FIG. 142, the current passing through bit line BL is smaller than the current passing through complementary bit line ZBL, and the potential at bit line BL is higher than the potential at complementary bit line ZBL. Therefore, the output signal of the sense amplifier attains "1".

In states S(1,0,0), S(0,1,0), S(0,0,1), S(1,1,0), S(1,0,1), and S(0,1,1), at least one of memory cells MTJI, MTJJ, and MTJK is in low-resistance state L (Rmin). Accordingly, in the case where the reference voltage VREF3 is selected, the current passing through bit line BL is larger than the current passing through complementary bit line ZBL, and the potential at bit line BL is lower than the potential at complementary bit line ZBL. Therefore, the output signal of the sense amplifier attains “0”. In the case where reference voltage VREF4 is selected, the current passing through bit line BL is smaller than the current passing through complementary bit line BL, and the potential at bit line BL is higher than the potential at complementary bit line ZBL. Therefore, the output signal of the sense amplifier attains “1”.

In a state S(1,1,1), memory cells MTJI, MTJJ, and MTJK are in low-resistance state L (Rmin), and the data “1” is stored in memory cells MTJI, MTJJ, and MTJK. In this state, even if any of reference voltages VREF3 and reference voltage VREF4 is selected, as shown in FIG. 142, the current passing through bit line BL is larger than the current passing through complementary bit line ZBL, and potential at bit line BL is lower than the potential at complementary bit line ZBL. Therefore, the output signal of the sense amplifier attains “0”.

As shown in FIG. 143, in the case where reference voltage VREF3 is selected, the sense amplifier produces the NOR operational result of the data stored in memory cells MTJI, MTJJ, and MTJK. In the case where reference voltage VREF4 is selected, the sense amplifier produces the NAND operational result of the data stored in memory cells MTJI, MTJJ, and MTJK.

In the semiconductor signal processing device of the sixteenth embodiment, two dummy cells DMC are described to be provided in each memory cell column. However, the present invention is not limited to such arrangement. Alternatively, one dummy cell DMC may be provided in each memory cell column, and switch MSW connected to dummy cell DMC may selectively connect one of reference voltage nodes VREF1 to VREF4 to dummy cell DMC.

Thus, the operation similar to the LUT operation of the tenth to fifteenth embodiments can be performed using the MRAM cells. The entire configuration of the semiconductor signal processing device of the tenth to fifteenth embodiments can be used for the semiconductor signal processing device of the sixteenth embodiment by replacing unit operator cell UOE with memory cell MC.

FIG. 144 shows an example of the LUT operation performed by the semiconductor signal processing device of the sixteenth embodiment. Referring to FIG. 144, a plurality of entries (Entry) are disposed in the memory sub-array. The entry corresponds to the memory cell row. FIG. 144 shows storage data strings of memory cells of the entries i, j, and k, by way of example. A data string “1010101010101” is stored in entry i, a data string “0101010101010” is stored in entry j, and a data string “00111001100110” is stored in entry k.

When the processing for reading the inverted signal of output signal SOUT of sense amplifier SA is performed on the data string of entry i using the operation shown in FIG. 135 (operation OP1), the data string of entry i is intactly supplied as the data string “1010101010101”.

When the NAND operational processing shown in FIG. 139 is performed on the data strings stored in entries i and j and the inverted signals of the NAND operational result (operation OP2) are produced, a data string “0000000000000” is obtained, that is, the data string of the AND operational result is obtained.

When the NAND operational processing shown in FIG. 143 is performed on the data strings stored in entries j and k and the inverted signals of the NAND operational result (operation OP3) is produced, a data string “0001000100010” is obtained, that is, the data string of the AND operational result of the data strings stored in entries j and k is obtained.

Accordingly, when the operations are selectively performed, the number of entries disposed in the memory cell sub-array can equivalently be increased, and the virtual entry space can be expanded as in the tenth embodiment. The operation to be performed can be specified by a control command that is supplied along with the address or a particular address bit.

The MRAM cell used in the sixteenth embodiment can be applied to the configurations of the first embodiment to ninth embodiments (MRAM memory cell is used instead of unit operator cell UOE).

[Seventeenth Embodiment]

FIG. 145 schematically shows an entire configuration of a semiconductor signal processing device according to a seventeenth embodiment of the present invention. Referring to FIG. 145, a memory cell array 810 is divided into a plurality of sub-array blocks BK0 to BKs. In each of sub-array blocks BK0 to BKs, unit operator cells UOE are arranged in rows and columns, write word line WWL, A-port read word line RWL, and B-port read word line RWLB are arranged corresponding to a unit operator cell row, and bit line BL (and complementary bit line ZBL) is arranged corresponding to a unit operator cell column.

The unit operator cell has the configuration similar to that of unit operator cell UOE shown in FIGS. 1 to 3 formed by the SOI transistors. One unit operator cell includes two P-channel SOI transistors PQ1 and PQ2 and N-channel SOI transistors NQ1 and NQ2.

The semiconductor signal processing device includes an ADC band 812, a data path 814, and a cell selection driving circuit 816. ADC zone 812 converts the data (current) read from a selected sub-array block into a digital signal. Data path 814 performs the data inputting and outputting. Cell selection driving circuit 816 drives the memory cells of sub-array blocks BK0 to BKs to the selected state, and cell selection driving circuit 816 controls the data writing and reading.

Each sub-array blocks BK0 to BKs is divided into a plurality of operation unit blocks. In each operation unit block, ADC band 812 includes an analog/digital converter (A/D converter: ADC) for converting an analog signal into a digital signal. ADC performs an addition of current information according to the storage data read from memory cells in an analog manner, and converts the added current value into a digital signal.

In reading data, data path 814 transfers the digital information produced by ADC band 812 to an outside of the device. In writing data, data path 814 produces internal write data such that each data bit of applied multi-bit numerical data is transferred to unit operator cells corresponding in number to a weight of each bit position.

Cell selection driving circuit 816 concurrently selects the unit operator cells of a plurality of columns in the selected sub-array block, and cell selection driving circuit 816 performs data writing and reading (write word line WWL and read word lines RWLA and RWLB are driven to the selected state). In the semiconductor signal processing device, control circuit 818 performs an internal operation control.

As shown in FIG. 145, ADC band 812 is provided to perform the addition of the currents according to the information stored in the unit operator cells. Therefore, in the case where the addition is performed to the digital data stored in the unit operator cells, the operational processing result can be obtained at high speed without producing a carry or borrow. The operational processing is performed only by reading the data stored in the memory cells within the device, so that the high-speed operational processing can be achieved.

As described in detail later, the information stored in the unit operator cells is read in the form of the current, so that the data can be read at high speed even under the low power supply voltage.

FIG. 146 schematically shows a configuration of one sub-array block BKi among sub-array blocks BK0 to BKs shown in FIG. 145. Referring to FIG. 146, sub-array block BKi includes cell sub-array 820 in which unit operator cells UOE are arranged in rows and columns. A-port read bit line RBLA and B-port read bit line RBLB are arranged corresponding to each row. A-port read bit line RBLA and B-port read bit line RBLB are connected to read ports RPRTA and RPRTB of unit operator cell UOE of a corresponding column, respectively.

Cell sub-array 820 further includes a dummy cell area 821. In dummy cell area 821, dummy cell DMC is arranged corresponding to each unit operator cell column, and is connected to a complementary bit line ZBL on a corresponding column. Read word lines RWLA and RWLB and write word line WWL are arranged corresponding to each row of unit operator cells UOE. Although the read word line and the write word line are also arranged for dummy cell DMC, these read word line and the write word line are not shown in FIG. 146.

Sub-array block BKi includes a sense amplifier band 822, a port connection circuit 823, and a read gate circuit 824. Sense amplifier band 822 reads the data stored in the selected memory cells. Port connection circuit 823 establishes the connection state between A- and B-read ports of the unit operator cell and sense amplifier band 822. Read gate circuit 824 transfers the data current read by sense amplifier band 822 to ADC band 812 shown in FIG. 145.

In sense amplifier band 822, the sense amplifier circuit is provided corresponding to each pair of bit lines BL (RBLA and RBLB) and ZBL, and the sense amplifier circuit produces the internal read data by differentially amplifying the currents passing through read bit line RBLA or RGLB and the complementary read bit line ZBL. Although the sense amplifier circuit will be described in detail later, the sense amplifier circuit has the configuration similar to that of the sense amplifier circuit shown in FIG. 84, and the sense amplifier circuit supplies the current when the sensed data is "1", and is set to the output high-impedance state when the sensed data is "0". The state in which the current passing through read bit line RBLA or RBLB is larger than the current passing through complementary read bit line ZRBL corresponds to the data "1", and the state in which the current passing through read bit line RBLA or RBLB is smaller than the current passing through complementary read bit line ZRBL corresponds to the data "0".

Port connection circuit 823 includes a connection switch that is provided corresponding to each set of read bit lines RBLA and RBLB, and connects one of A-port read bit line RBLA and B-port read bit line BLB to the corresponding sense amplifier circuit of sense amplifier band 822 in response to a port specification signal (not shown).

Read gate circuit 824 includes a read gate that is provided corresponding to each sense amplifier circuit in sense amplifier zone 822, and transfers the current information produced by sense amplifier band 822 to ADC band 812 shown in FIG. 145 through a global read data line (not shown).

FIG. 147 schematically shows an example of a specific configuration of sub-array block 820 shown in FIG. 146. In FIG. 147, unit operator cells UOE are arranged in (k+1) rows by 2 columns. As described above, the unit operator cell UOE has the configuration similar to that of the unit operator cell shown in FIGS. 1 to 3.

In FIG. 147, read bit lines RBLA0 and RBLB0 and global write data lines WGLB0 and WGLA0 are provided corresponding to unit operator cells UOE00, . . . , and UOEk0 aligned in the column direction. Global write data lines WGLA0 and WGLB0 are connected to write ports WPRTA and WPRTB of each of unit operator cells UOE00, . . . , and UOEk0, respectively. Read ports RPRTA and RPRTB of each of unit operator cells UOE00, . . . , and UOEk0 are connected to read bit lines RBLA0 and RBLB0, respectively.

Read bit lines RBLA1 and RBLB1 and global write data lines WGLB1 and WGLA1 are provided corresponding to unit operator cells UOE01, . . . , UOEk1. Global write data lines WGLA1 and WGLB1 are connected to write ports WPRTA and WPRTB of each of unit operator cells UOE01, . . . , and UOEk1, respectively. Read ports RPRTA and RPRTB of each of unit operator cells UOE01, . . . , and UOEk1 are connected to read bit lines RBLA1 and RBLB1, respectively.

Write word line WWL0 and read word lines RWLA0 and RWLB0 are provided corresponding to unit operator cells UOE00 and UOE01, and write word line WWLk and read word lines RWLAk and RWLBk are provided corresponding to unit operator cells UOEk0 and UOEk1.

Dummy cell DMC0 is arranged for unit operator cells UOE00 and UOEk0, and dummy cell DMC1 is arranged for unit operator cells UOE01, . . . , UOEk1. In FIG. 147, the configurations of dummy cells DMC0 and DMC1 are similar to that of dummy cell DMC in the first embodiment shown in FIG. 6, corresponding parts to those in the configuration shown in FIG. 6 are designated by the same reference numerals, and the detailed description is not repeated.

Reference voltage Vref supplied from reference voltage source Vref (power source and supply voltage are designated by the same reference symbol) supplies a current intermediate the currents which SOI transistors NQ1 and NQ2 included in unit operator cell UOE00 supply when in a high threshold voltage state and when in the low threshold voltage state.

In port connection circuit 823, similarly to the configuration shown in FIG. 6, port connection switch PRSW0 is provided corresponding to read bit lines RBLA0 and RBLB0. Port connection switch PRSW0 connects one of read bit lines RBLA0 and RBLB0 to sense read bit line RBL0 in response to a port selection signal PRMX. Complementary read bit line ZRBL0 is connected to sense amplifier circuit SAK.

Port connection switch PPSW1 is provided corresponding to read bit lines RBLA1 and RBLB1, and connects the read bit line of a specified port to a corresponding sense amplifier circuit SAK1 through sense read bit line RBL1 in response to port selection signal PRMX.

Port selection signal PRMX is a multi-bit selection signal and therefore, the connection path can be established for each group of a predetermined number of bit line pairs.

Port connection switches PRSW1 and PRSW2 have the configuration similar to that of the port connection switch shown in FIG. 18, and each of port connection switches PRSW1 and PRSW2 includes two N-channel switching transistors. These switching transistors (NT2 and NT3) may be each formed by the SOI transistor or bulk transistor (transistor formed at the surface of the well region), or the switching transistors (NT2 and NT3) may be formed by a transmission gate.

Switching transistors (NT2 and NT3) are put into the non-conductive state when port selection signals /PRMXB and /PRMXA are activated (at the L level), respectively. That is, a specified read port RPRTA or RPRTB is connected to sense amplifier circuit SAK in response to port selection signals /PRMXA and /PRMXB corresponding to port selection signal PRMX, respectively. When read port RPRTA is specified, A-port read bit line RBLA is connected to sense read bit line RBL in response to port selection signal /PRMXA. When read port RPRTB is specified, port selection signal /PRMXA is inactivated, port selection signal /PRMXB is activated, and B-port read bit line RBLB is connected to sense read bit line RBL.

In read gate circuit 822, read gates CSG0 and CSG1 are provided corresponding to sense amplifier circuits SAK0 and SAK1, and read gates CSG0 and CSG1 supply the currents corresponding to the sense data supplied by sense amplifier circuits SAK0 and SAK1 to corresponding global read data lines RGL0 and RGL1 in response to read selection signal CSL. Global read data lines RGL (RGL0 and RGL1) are shared by sub-array blocks BK0 to BKs shown in FIG. 145, and global read data lines RGL transmit the read currents to ADC band 12 shown in FIG. 145.

In FIG. 147, the complementary data are transferred to global read data lines from read gate CSG of read gate circuit 22. However, in the seventeenth embodiment, the operational processing is performed using the current supplied to global read data line RGL. In order to equalize loads on sense nodes of sense amplifier circuits SAK, the selection transistors are provided for complementary sense nodes in read gates CSG.

As shown in FIG. 147, in cell sub-array 820, unit operator cells UOE00, . . . , UOE01, . . . are concurrently driven to the selected state. For dummy cells DMC0, DMC1, . . . , the reference current is selectively supplied to corresponding complementary read bit lines ZRBL0 and ZRBL1 in response to one of dummy cell selection signals DCLA and DCLB. Accordingly, in cell sub-array 820, the data stored in one-entry (one-row) unit operator cells UOE are concurrently read and written.

FIG. 148 shows an example of a configuration of a sense amplifier circuit SAK (SAK0 and SAK1) shown in FIG. 147. FIG. 148 also shows a configuration of bit line pre-charge/equalize circuit BLEQ that is arranged in bit line peripheral circuitry. The sense amplifier circuits provided for read bit lines have the same configuration, and FIG. 148 representatively shows the configuration of sense amplifier circuit SAK0 that is provided corresponding to sense read bit lines RBL0 and ZRBL0.

Sense amplifier circuit SAK0 includes sense amplifier SA0 and a current source circuit 826<0>. Sense amplifier SA0 includes cross-coupled N-channel SOI transistors, cross-coupled P-channel SOI transistors, a sense activating P-channel SOI transistor, and a sense activating N-channel SOI transistor. The sense activating P-channel SOI transistor and the sense activating N-channel SOI transistor are selectively put into the conductive state in response to sense amplifier activation signals /SOP and SON. In the conductive state of the sense activating SOI transistors, sense power supply voltage VBL and the ground voltage are supplied to sense power supply nodes (power source nodes to which the cross-coupled SOI transistors are connected). Sense power supply voltage VBL may be the level of power supply voltage VCC or an intermediate voltage level. It is sufficient for sense power supply voltage VBL to be at a voltage level of a read word line in the selected state.

Similarly to sense amplifier SA shown in FIG. 6, sense amplifier SA0 is a cross-coupled type sense amplifier and differentially amplifies the potential difference between sense read bit lines RBL0 and ZRBL0 when in the active state. Sense amplifier SA0 may be formed by the SOI transistors each having a gate and body region connected to each other. A current sensing type sense amplifier in which the current-mirror behavior is utilized may be used as sense amplifier SA. The mirror currents of the currents passing through sense read bit lines RBL and ZRBL are produced through the current-mirror behavior.

Current source circuit 826<0> includes inverter buffers 827*a* and 827*b*, P-channel transistor PT1, and N-channel transistor NT1. Inverter buffers 827*a* and 827*b* invert the potentials at sense read bit lines RBL0 and ZRBL0, respectively. P-channel transistor PT1 is selectively put into the conductive state in response to the output signal of inverter buffer 827*a*. N-channel transistor NT1 is selectively put into the conductive state in response to the output signal of inverter buffer 827*b*. For example, transistors PT1 and NT1 are each formed by the SOI transistor having the same structure as the transistor constituting sense amplifier SA0.

A high-side power supply voltage of sense read bit lines RBL and ZRBL is the voltage VBL, and inverter buffers 827*a* and 827*b* are provided for converting the voltage VBL into the level of power supply voltage VCC to reliably put a charging transistor PT1 for supplying the current into non-conductive state and to reliably put discharging transistor NT1 into conductive state. Accordingly, inverter buffers 827*a* and 827*b* are formed by an inverter buffer having a level conversion function.

As described above with reference to FIG. 147, complementary global read data lines are not used.

Inverter buffer 827*b* is used to equalize the sense nodes of sense amplifier SA0, that is, the loads on sense read bit lines RBL and ZRBL. Inverter buffer 827*b* may normally be maintained in the inactive state so as to be arranged only as a dummy for equalizing the load on the sense amplifier.

When the potential at sense read bit line ZRBL0 is at the H level, charging transistor PT1 for supplying the current is put into the conductive state in response to the output signal of inverter buffer 827*a*, to supply the current having a certain magnitude from the power supply node through internal output node 828*a*. When the potential at complementary sense read bit line RBL0 is at the L level, discharging transistor NT1 is put into the conductive state in response to the output signal of inverter buffer 827*b* to discharge internal output node 828*b* to the ground voltage level.

In read gate CSG0, internal output node 828*b* is shown being connected to the global read data line. However, the current from internal output node 828*b* is not used in an operation. In performing the operation, the complementary global read data line is fixed to the ground voltage and used as a shielding line to global read data line RGL. The complementary global read data line of the seventeenth embodiment is not used in an operation, the selection gate may be arranged only for global read data line RGL in read gate CSG.

In current source circuit 826<0>, when the potentials at sense read bit lines ZRBL0 and RBL are at the H level (voltage VBL level) and the L level (ground voltage level) respectively, transistors PT1 and NT1 enter the off-state in response to the output signals of inverter buffers 827*a* and 827*b*, and current source circuit 826<0> enters the output high-impedance state.

Although the sensing operation is described in detail later, when the current supplied from the dummy cell is larger than the current supplied from the unit operator cell, the potential at complementary sense read bit line ZRBL0 attains the H level, and current source circuit 826<0> stops the current supplying. When the current supplied from the dummy cell is smaller than the current supplied from the unit operator cell, the potential at complementary sense read bit line ZRBL0 attains the L level, and current source circuit 826<0> acts as the charge and discharge current supplying source.

Similarly to the configuration shown in FIG. 6, bit line pre-charge/equalize circuit BLEQ0 supplies bit line precharge voltage VPC to sense read bit lines ZRBL0 and RBL0 in response to bit line pre-charge instruction signal BLPE. Bit line pre-charge voltage VPC is a voltage level at which the PN junction between the read port and the body region of the N-channel SOI transistor (NQ1 and NQ2) in unit operator cell UOE is maintained in the non-conductive state irrespective of the body region voltage level.

Read gate CSG0 has the configuration similar to that shown in FIG. 147, and read gate CSG0 connects internal output node 828*a* to global read data line RGL0 in response to read selection signal (operator cell sub-array block selection signal) CSL. Alternatively, internal output node 828*b* is connected to complementary global read data line, and complementary global read data line may be used as a shielding line in performing an operation. Because sense nodes (sense read bit line) of sense amplifier SA are isolated from charge and discharge transistors PT1 and NT1, the selection gate in read gate CSG particularly need not be provided for internal output node 828*b*.

The transistors constituting sense amplifier SA0, bit line pre-charge/equalize circuit BLEQ0, and read gate CSG0 that are included in constitute sense amplifier band 822 may be formed by a general bulk MOS transistor formed at the surface of a semiconductor substrate, not the SOI transistor.

Similarly sense amplifier SA1, current source circuit 826<1>, bit line pre-charge/equalize circuit BLEQ1, and read gate CSG1 are provided corresponding to sense read bit lines ZRBL1 and RBL1. Sense amplifiers SA0 and SA1 are commonly and selectively activated in response to sense amplifier activation signals /SOP and SON. Bit line pre-charge/equalize circuits BLEQ0 and BLEQ1 are activated when bit line pre-charge instruction signal BLPE is activated. Read gates CSG0 and CSG1 are also put into the conductive state in response to read selection signal CSL.

FIG. 149 schematically shows a connection manner of the unit operator cell and the sense amplifier circuit when port A is selected. In selection of port A, one SOI transistor (NQ1) is connected between source line SL and sense read bit line RBL. In dummy cell DMC, dummy transistor DTA is connected between the reference voltage source and complementary read bit line ZRBL in response to dummy cell selection signal DCLA.

As for the change in potential of bit lines RBL and ZRBL in reading the data stored in unit operator cell UOE, similarly to the first embodiment, the change in bit line potential shown in FIG. 11 appears according to the data stored in the unit operator cell. In the following description, the state in which SOI transistors NQ1 and NQ2 have the high threshold voltage is correlated with the state of storing the data "0", and the state in which SOI transistors NQ1 and NQ2 have the low threshold voltage is correlated with the state of storing the data "1".

For example, the voltage at source line SL is at the level of power supply voltage VCC, and is higher than reference voltage Vref supplied to dummy cell DMC. That is, reference voltage Vref (voltage source and the voltage at the voltage source are designated by the same reference symbol) is at a voltage level between the voltage (power supply voltage VCC level) supplied to source line SL and bit line pre-charge voltage VPC. In the case where the data "0" is stored in SOI transistor NQ1, SOI transistor NQ1 has the high threshold voltage and passes a smaller amount of current. On the other hand, in the case where the data "1" is stored in SOI transistor NQ1, SOI transistor NQ1 has the low threshold voltage and passes a larger amount of current.

Accordingly, in the cases where the data "1" is stored in SOI transistor NQ1, the amount of current supplied from unit operator cell UOE is larger than the amount of current supplied from dummy cell DMC, and the potential at sense read bit line RBL is higher than the potential at complementary sense read bit line ZRBL.

On the other hand, in the case where the data "0" is stored in SOI transistor NQ1, the amount of current supplied from dummy cell DMC to complementary sense read bit line ZRBL is larger than the amount of current supplied from unit operator cell UOE, and the potential at complementary bit line ZRBL is higher than the potential at bit line RBL.

In this state, sense amplifier activation signals /SOP and SON are set at the L level and the H level to activate sense amplifier SA. The read out data (potential or current amount) on sense read bit lines RBL and ZRBL are differentially amplified by sense amplifier SA.

Similarly to the sensing operation in the first embodiment, even if the voltage having the level of high-side power supply voltage VBC of sense amplifier SA is transmitted to one of sense read bit lines RBL and ZRBL, the PN junction at the body region of each of SOI transistors NQ1 and NQ2 and the dummy transistor is prevented from being forward-biased to cause the charges to flow into the body region, so that the sensing operation can correctly be performed without causing destruction of the storage data.

Current source circuit 826 receives the output signal of sense amplifier SA, and transistors PT1 and NT1 selectively enter the on-state according to the output signals of sense amplifier SA, that is, the potentials at sense read bit lines RBL and ZRBL. Alternatively, transistor NT1 may always be maintained in the non-conductive state and inverter buffer 827*b* may always be maintained in the inactive state.

Then, read gate CSG shown in FIG. 147 is selected by read selection signal CSL and the current is supplied to corresponding global read data line RGL in response to the output signal of sense amplifier SA.

Similarly to the first embodiment, the data is read in the nondestructive manner and the restoring period in which the storage data is rewritten is not required. Accordingly, read word line RWLA may be driven to the non-selected state before operation of the sense amplifier, and the read cycle can be shortened by eliminating the restoring period.

FIG. 150 shows, in a list form, a relation between the states of the sense read bit line and current source circuit in selecting port A of the unit operator cell. As shown in FIG. 150, when A port is selected, when the data stored in storage node SNA is "0" and "1", the potential of sense read bit line RBL amplified by sense amplifier SA attains "0" and "1", respectively. When the data stored in storage node SNA is "1", the current source circuit enters the on-state to supply the current to the corresponding global read data line. When the data stored in storage node SNA is "0", the current source circuit maintains the off-state to stop the current supplying. Accordingly, the current can be supplied to the corresponding global read data line according to the data stored in the storage node SNA of the unit operator cell. In the seventeenth embodiment, the addition processing is performed by adding the currents of the global read data line RGL.

FIG. 151 schematically shows a configuration of ADC band 812 shown in FIG. 145. FIG. 151 also shows the arrangement of memory cell array 810. Memory cell array 810 is divided into the plurality of operation unit blocks OUBa to OUBn. Global read data buses RGBa to RGBn are provided for each of operation unit blocks OUBa to OUBn. Each of global read data buses RGBa to RGBn is shared by sub-array blocks (BK0 to BKn) included in a corresponding one of operation unit blocks OUBa to OUBn. Each of global data buses RGBa to RGBn includes global read data lines RGL0 to RGLk. The operation is performed in each of operation unit blocks OUBa to OUBn.

In ADC band 812, current summing lines VMa to VMn are provided corresponding to global read data buses RGBa to RGBn, respectively. Each of current summing lines VMa to VMn is commonly connected to global read data lines RGL0 to RGLk of the corresponding global read data bus. The complementary global read data line is not used in the seventeenth embodiment.

Accordingly, the currents read onto global read data lines RGL0 to RGLk of each of global read data buses RGBa to RGBn are added by current summing lines VMa to VMn, and the voltage level of current summing line VM is changed according to the added current value.

In ADC band 812, M-bit ADCs (analog-digital converter) 835*a* to 835*n* are provided corresponding to global read data buses RGBa to RGBD. M-bit ADCs 835*a* to 835*n* convert the analog voltages corresponding to the current values added on current summing lines VMa to VMn into the M-bit digital signals.

In the configuration shown in FIG. 151, the operational processing is concurrently performed to the data stored in the memory cells in operation unit blocks OUBa to OUBn, the operational results are produced on current summing lines VMa to VMn, and M-bit ADCs 835*a* to 835*n* concurrently produce the M-bit digital data Da to Dn.

In the case where the addition/subtraction processing is performed during an operational processing, the need to produce the carry/borrow is eliminated, so that the operational processing can be performed at high speed.

FIG. 152 shows an example of a configuration of M-bit ADCs 835*a* to 835*n* shown in FIG. 151. Because M-bit ADCs 835*a* to 835*n* have the same configuration, FIG. 152 shows ADC 835 as a representative of M-bit ADCs 835*a* to 835*n*.

Referring to FIG. 152, ADC 835 includes resistive elements 841*a* to 841*u*, comparators 842*a* to 842*u*, gate circuits 843*a* to 843*t*, and an encoder 844. Resistive elements 841*a* to 841*u* are connected in series between a reference power supply node 840 and the ground node. Comparators 842*a* to 842*u* are provided corresponding to the resistive elements, respectively. Each of gate circuits 843*a* to 843*t* receives the output signals of adjacent two comparators. Encoder 844 encodes the output signals of gate circuits 843*a* to 843*t* to produce final M-bit digital data Q<M−1:0>.

A tunable voltage generating circuit 845 generates a conversion reference voltage VREFADC used for the A/D conversion (analog-digital conversion) to reference power supply node 840. Each of resistive elements 841*a* and 841*u* has a resistance values R12, and each of resistive elements 841*b* to 841*t* has a resistance value R. The resistance value of each of resistive elements 841*a* and 841*u* is set smaller than the resistance value of each of other resistive elements 841*b* to 841*t*, thereby bringing the voltage value applied on current summing line VM corresponding to the maximum digital converted value close to a conversion reference voltage VREF_ADC as much as possible and bringing the minimum voltage value corresponding to the minimum digital conversed value close to the ground voltage level as much as possible.

Comparators 842*a* to 842*u* receive the potentials at the lower-potential-side nodes of corresponding resistive elements 841*a* to 841*u* at the respective positive inputs, and the voltage at current summing line VM at the respective negative inputs.

Each of gate circuits 843*a* to 843*t* receives the output signal of one of comparators 842*a* to 842*t*, which is located on the one-step upper side of the voltage steps produced by resistive elements 841*a* to 841*u*, and the output signal of corresponding one of comparators 842*b* to 842*u*. Each of gate circuits 843*a* to 843*t* produces an L-level signal when the output signal of the comparator located on the one-step upper side attains the H level while the output signal of the corresponding comparator attains the L level. For example, gate circuit 843*a* produces the L-level signal when the output signal of comparator 842*a* attains the H level while the output signal of comparator 842*b* attains the L level. Accordingly, gate circuits 843*a* to 843*t* detects a changing point of "0" to "1" in the output signal string of comparators 842*a* to 842*u*.

Encoder 844 produces M-bit digital data Q<M−1:0> corresponding to the detected changing point according to the output signal string of gate circuits 843*a* to 843*t*.

FIG. 153 shows a specific configuration of the resistance network of ADC 835 shown in FIG. 152. FIG. 153 shows the resistance network in the case where ADC 835 is a four-bit ADC, as an example. In FIG. 153, resistive elements ZZ15 to ZZ0 are connected in series between reference power supply node 840 and the ground node. Resistive elements ZZ15 to ZZ0 correspond to resistive elements 841*a* to 841*u* shown in FIG. 152.

Reference voltages VVREF0 to VVREF14 are produced from higher-potential-side connection nodes of the respective resistive elements ZZ0 to ZZ14. Comparators 842*a* to 842*u* shown in FIG. 152 concurrently compare reference voltages VVREF0 to VVREF14 and the voltage at current summing line VM. Reference voltages VVREF0 to VVREF14 define upper limit voltage levels of the respective digital values (0000) to (1110). Comparators 842*a* to 842*u* each produce the L-level signal when the voltage at current summing line VM is higher than corresponding reference voltage VVREFi (i=0 to 14).

For example, it is assumed that the voltage at current summing line VM is at a level between reference voltages VVREF10 and VVREF11. As shown in FIG. 153, the output signals of comparators 842 whose positive inputs receive reference voltages VVREF14 to VVREF11 attain "1" (H level). On the other hand, in comparators 842 that receive reference voltages VVREF10 to VVREF0, the output signals attain "0" (L level). Accordingly, the output signal attains "0" in gate circuit 843 that receives the output signal of the comparator provided corresponding to reference voltages VVREF11 and VVREF10, and the output signals of other gate circuits attain "1". Encoder 844 determines the gate circuit that produces "0" in gate circuits 843*a* to 843*t*. Therefore, it is possible to determine that the voltage at current summing line VM lies between reference voltages VVREF11 and VVREF10, and data (1011) is produced.

In ADC 835 shown in FIG. 152, the position of the resistive element corresponding to the reference voltage range where the voltage on current summing line VM exists is identified by gate circuits 843*a* to 843*t*, and encoder 844 produces the digital value corresponding to the position of the identified resistive element.

Comparators 842*a* to 842*u* are activated in response to conversion activation signal ADCEN to start the comparing operation. A pre-charge transistor 847 that is put into the conductive state in response to a pre-charge instruction signal PRG pre-charges current summing line VM to the ground voltage level before the converting operation.

For example, a register file may be used for implementing encoder 844, to have the contents of the register corresponding to the bit "0" read out. In FIG. 152, the parallel conversion type (flash type) ADC is used. Alternatively, a pipeline type ADC may be used. In the pipeline type ADC, one unit conversion circuit is arranged for each one bit of the output data, and the unit conversion circuits are cascaded.

FIG. 154 schematically shows a configuration of data path 814 shown in FIG. 145. FIG. 154 shows the configuration of the data path for one operation unit block OUB. In the seventeenth embodiment, global write data line WGLB is not used and the global write data line WGLB is in the "don't care" state, and the arrangement of the B-port global write data line is not shown.

Referring to FIG. 154, in data path 814, write drivers WDR corresponding in number to bit position in the input data are provided for each write data bit. That is, one global write driver WDR00 is provided corresponding to least significant data bit D<0>, and two global write drivers WDR10 and WDR11 are provided corresponding to data bit D<1>. Four global write drivers WDR20 to WDR23 are provided corresponding to data bit D<2>, and eight global write drivers WDR30 to WDR37 are provided corresponding to data bit <3>. Global write drivers WDR of n-th power of are provided corresponding to data bit D<n>.

Global write drivers WDR drive the corresponding global write data lines WGLA. Global write driver WDR00 drives global write data line WGLA00 constituting global write data bus WGB0, global write drivers WDR10 and WDR11 drive global write data lines WGLA10 and WGLA11 constituting global write data bus WGB1, and global write drivers WDR20 to WDR23 drive global write data lines WGLA20 to WGLA23 constituting global write data bus WGB2. Global write drivers WDR30 to WDR37 drive global write data lines WGLA30 to WGLA37 constituting global write data bus WGB3.

Global write data line WGLA is shared by a plurality of cell sub-array blocks. FIG. 154 representatively shows cell sub-array 820 of one sub-array block. Global write data lines WGLA are connected to write port (WPRTA) of the unit operator cells arranged in the corresponding column.

In writing data, the write data bits each are transferred through global write data lines corresponding in number to the weight of the bit location and written in the corresponding memory cells.

In reading the data, the data stored in unit operator cells are concurrently read, whereby the global read data line(s) corresponding to the bit position of the write data is/are driven in one operation unit block OUB, and sense current (Is) weighted according to the bit location is supplied. Accordingly, in operation unit block OUB, the data of different entries (entry is formed by the memory cells aligned in the row direction) are concurrently read an the total current of the data stored in the memory cells of the concurrently read entries flows through the global read data line, and the analog current addition value is produced on the current summing line. Therefore, the addition result, for example, can be obtained at high speed without waiting for the carry decision time.

FIG. 155 shows a specific example of addition operational processing in the semiconductor signal processing device of the seventeenth embodiment. In FIG. 155, four-bit input data DIN#0 to DIN#m are added. ADC of the ADC band converts the addition result into M-bit data for outputting. In the addition processing, the bit value "1" has the significance in the operation. The current is supplied to the corresponding global read data line when the data stored in the unit operator cell is the bit "1", and the current is not supplied to the corresponding global read data line when the storage data is the bit "0". Accordingly, the current amount corresponding to the addition value of the addition target data is obtained by performing the addition of the currents of the global read data lines, and the voltage value corresponding to the total current is obtained on the current summing line.

FIG. 156 schematically shows a current flow in the data read when the addition operation shown in FIG. 155 is performed. As shown in FIG. 156, the data DIN#0 to DIN#m of the operation target are written in operation unit blocks OUBa of sub-array blocks BK0 to BKm, respectively. In writing the data, for each of the input data DIN#0 to DIN#m, the data are written in storage nodes SNA of the unit operator cells through global write data lines WGLA of the number weighted according to the bit, using the data path shown in FIG. 154.

After the input data DIN#0 to DIN#m are written in sub-array blocks BK0 to BKm, the data are read from sub-array blocks BK0 to BKm. That is, in cell sub-array 820 of sub-array blocks BK0 to BKm, A port is selected by the port connection circuit, the port-A read bit line is connected to the corresponding sense amplifier, and the data are read the data at the storage nodes SNA of the unit operator cells in which the data DIN#0 to DIN#m are stored. Sense amplifier circuit SAK included in sense amplifier band 822/read gate circuit 824 selectively supplies the current according to the current supplied to complementary read bit line ZRBL from dummy cell and to the current supplied to sense read bit line RBL, and the sense current corresponding to the read data from sense amplifier circuit SAK is supplied to corresponding global read data line RGL through read gate CSG of read gate circuit 824.

The timing of reading data of memory cell data and of activation of sense amplifier circuit SAK in sub-array blocks BK0 to BKm may sequentially be shifted or may be set to be concurrently performed.

Then, all read selection signals CSL<0> to CSL<m> for sub-array blocks BK0 to BKm are driven to the selected state. Therefore, all read gates CSG included in sense amplifier band 822/read gate circuit 824 are put into the conductive state in sub-array blocks BK0 to BKm, and corresponding sense amplifier circuit SAK selectively supplies the sense current to global read data lines RGL0 to RGL3, . . . .

That is, sense currents Is00 to Is03, . . . are read from sub-array block BK0 onto global read data lines RGL0 to RGL3, . . . , and sense read current Is10 to Is13 are read from sub-array block BK1 onto global read data lines RGL0 to RGL3. Similarly, sense currents Ism0 to Ism3 are selectively supplied from in sub-array block BKm onto global read data lines RGL0 to RGL3.

In one operation unit block OUBa, global read data line RGL is connected to a common current summing line VM0. Accordingly, the currents read on global read data lines RGL (RGL0 to RGL3, . . . ) are added in current summing line VM0. In the current addition, a weight corresponding to the data bit position is allotted to the number of selected memory cells. Before the reading operation, the discharge transistor (not shown, pre-charge transistor 847 shown in FIG. 152) pre-charges current summing line VM0 to the ground voltage level, and the voltage level is raised by the sense currents. Accordingly, in the case where the addition shown in FIG. 155 is performed, the total current of the currents applied to current summing line VM0 is expressed by the following expression:

$$\Sigma Isij \cdot 2^k,$$

i=0 to m, j=0 to 15, k=0 to 3

Because the four-bit data addition is performed, the total of 15 global read data lines are used as global read data lines RGL. That is, the 15 global read data lines include one global read data line of least significant bit <0>, two global read data lines of first bit <1>, four global read data lines of second bit <2>, and eight global read data lines of the most significant bit <3>.

Then, the analog-digital conversion is performed with ADC 835 of ADC band 812, thereby obtaining the digital data in which the analog current value appearing on current summing line VM (VM0, VM1, . . . ) is expressed by M bits In FIG. 156, the addition operation is concurrently performed in operation unit blocks OUBa, OUBb, . . . of sub-array blocks BK0 to BKm, so that a plurality of addition operations can concurrently be performed to obtain the addition results at high speed.

The operation target data is not limited to the four bits, but data of any bit width may be used for addition.

FIG. 157 is a flowchart representing the control operation performed by control circuit (818) in the semiconductor signal processing device of the seventeenth embodiment. Referring to FIG. 157, the operation of the control circuit will be described below, in the case where the semiconductor signal processing device of the seventeenth embodiment performs the addition operation.

The semiconductor signal processing device waits for an addition command (Step SP0). When the addition command is issued, the block address is initialized to set the sub-array block to be first written. Then, the input data is taken in, the write data is transferred through global write driver WDR of the data path shown in FIG. 154, and write word line WWL is driven to the selected state to write the data in each unit operator cell in the specified sub-array block (Step SP1).

A determination on whether the write data is the final write data is made when the data writing is completed (Step SP2). When the remaining write data exists, the block address is updated to write the next data as in Step SP1 (Step SP3). Then, the process returns to Step SP2.

When the writing of final data is completed in Step SP2, in all the target sub-array blocks in which data are written, port A is selected, and the data of the unit operator cells in which the data are written are read an the sense amplifier circuits are activated (Step SP4). The sense amplifier circuits may concurrently be activated in all the target sub-array blocks or be sequentially activated with activation timing being shifted. In order to correctly add sense currents Is, it is necessary that timing at which current source circuit 826 shown in FIG. 148 is activated be set at the same time in all the target sub-array blocks.

Upon the activation of the sense amplifier circuit, or before the activation of read selection signal CSL, the pre-charging of current summing line VM to the ground voltage level is completed, and the read gates of all the target sub-array blocks are driven to the on-state (Step SP5). In order to put the read gate of the target sub-array block into the on-state, read selection signals CSL (CSL<0> to CSL<m>) shown in FIG. 156 are concurrently driven to the selected state. In this case, the write block flag is set in response to the output signal of the block address decoder in writing the data, and the write block flag set in writing the data is maintained even in reading the data, so that the data of the sub-array block in which the data writing is performed can be read by referring to the write block flag. The write block flag can be reset after one operation cycle is completed to produce the final addition result.

When the voltage level at current summing line VM is raised by the supplied currents, conversion activation signal ADCEN is activated at a predetermined timing, ADC is activated to perform the A/D conversion, and the conversion data is produced and supplied externally (Step SP6). The processes in Steps SP4 to SP6 are performed in one clock cycle.

When the number of data to be performed is predetermined in the addition processing, the write target blocks can concurrently be driven to the selected state in reading the data according to the predetermined number of the data (the read word line driving circuits are concurrently activated according to the number of input operation data).

Although the word line address (write word line and read word line address) is not particularly described, it is necessary to select the word lines at the same position in each sub-array block, and the write/read word line of the same row is selected in writing and reading the data.

FIG. 158 is a flowchart representing a tuning operation on voltage VREF_ADC produced by tunable voltage producing circuit 845 shown in FIG. 152. Referring to FIG. 158, a voltage level adjusting behavior of tunable voltage generating circuit 845 shown in FIG. 152 will be described below.

Tunable voltage generating circuit 845 waits for a tuning instruction in a test mode (Step SP20). When the tuning instruction is supplied, block address BA is set at initial value "0", and the input data is set at (1111). Here, it is assumed that eight-bit ADC is used as ADC. The data (1111) is written in the block specified by block address BA (Step SP22). A determination on whether block address BA reaches "16 (decimal notation)" is made when the first data write is completed for the cell array block (Step SP23). Because block address BA does not reach "16 (decimal notation)", block address BA is incremented by one (Step SP24). The process returns to Step SP22, the data (1111) is written in the sub-array block specified by the next block address.

When block address BA reaches "16 (decimal notation)" in Step SP23, the write of the data (1111) is completed for the final sub-array block. Then the data are concurrently read from the sub-array blocks specified by block addresses BA of 0 to 16, and ADC performs the AD conversion to produce the conversion result (Step SP25). In this operation, the addition of 17 data of (1111) is performed, and a determination on whether ADC produces the data (11111111) (=255 (decimal notation)) is made (Step SP26).

When ADC does not produce the data (11111111) in decimal notation, the conversion output value indicates the value lower than 255, the level of conversion reference voltage VREF_ADC is higher than a predetermined value. Accordingly, the level of conversion reference voltage VREF_ADC is lowered (Step SP27). The data is read in the nondestructive manner, and the write data are stored in the unit operator cells. After the processing in Step SP27, the process returns to Step SP25, the processing in Steps SP26 and SP27 is performed. That is, the data (1111) is read from the sub-array blocks specified by block addresses BA of 0 to 16, the AD conversion is performed on the read out data (1111), and the data outputting and determination are performed.

On the other hand, when ADC produces the data (11111111) in Step SP26, because there is a possibility that conversion reference voltage VREF_ADC is decreased lower than the predetermined value, the tuning is performed again with the next data. That is, a certain block address BA is set at the initial value "1" (Step SP28). Then, data (0001) is written in the sub-array block specified by block address BA (Step SP29).

Then, a determination on whether block address BA reaches "15 (decimal notation)" is made (Step SP30). Because block address BA does not reach "15 (decimal notation)", block address BA is incremented by one, and the process returns to Step SP29 to write the data (0001) (Step SP31). On the other hand, when block address BA reaches "15 (decimal notation)" in Step SP30, the data stored in the sub-array blocks specified by the block addresses BA in writing the data, that is, the sub-array blocks of block addresses BA of 1 to 15 are read out, the AD conversion is performed on the read out data, and the AD converted data is produced (Step SP32).

Then, a determination on whether the output data after the conversion is (00001111) is made (Step SP33). When the output data is not (00001111), the voltage level of the conversion reference voltage is excessively lowered, an the level of conversion reference voltage VREF_ADC is adjusted (voltage level is raised) (Step SP34). Then, the process returns to Step SP32, the data (0001) is read from the sub-array blocks specified by block addresses BA of 0 to 15, and the AD conversion and determination are performed.

When the output data after the conversion is (00001111) in Step SP33, the adjustment of conversion reference voltage VREF_ADC is completed. Alternatively, in Step SP33, the level of conversion reference voltage VREF_ADC is finely adjusted, and the data is read, and a margin may be adjusted to the AD conversion.

Alternatively, in the processing in Steps SP28 to SP33, initial block address is set at "0", the final block address is set at "15 (decimal notation)", and a determination on whether the conversion output value is (0001000) (=16 (decimal notation)) may be made.

The configuration of tunable voltage generating circuit 845 will be described below by way of example. In a resistance network circuit for converting the reference current into the voltage, the switching element is provided in parallel with each resistor, the voltage level is adjusted by adjusting the resistance value of the resistance network according to the on/off-state of the switching elements.

According to the semiconductor signal processing device of the seventeenth embodiment, the data stored in the memory cells (unit operator cells) are concurrently read from a plurality of sub-array blocks, the number of read data lines is set such that each read data line is weighted according to the associated data bit position, and the total operation processing is performed to the currents, so that the addition operation can be performed at high speed without producing the carry.

The addition operation is the current addition, so that the addition processing can be performed at high speed. Because the conversion reference voltage used in the ADC conversion is variable, the correct A/D conversion can be secured.

[Eighteenth Embodiment]

FIG. 159 schematically shows a connection manner of the unit operator cell and the sense amplifier circuit when B port of the unit operator cell is selected. Referring to FIG. 159, in unit operator cell UOE, N-channel SOI transistors NQ1 and NQ2 are connected in series between source line SL and sense read bit line RBL in selection of read B port RPRTB. Similarly, for dummy cell DMC, dummy transistors DTB0 and DTB1 are connected in series between the reference voltage source and complementary read bit line ZRBL. Sense read bit lines RBL and ZRBL are connected to sense amplifier SA, and sense amplifier SA amplifies the potential difference or current difference between sense read bit lines RBL and ZRBL. Current source circuit 826 selectively supplies the current to internal output nodes 828*a* and 828*b* in response to the output signal of sense amplifier SA.

FIG. 160 schematically a signal waveform representing a behavior in data reading in the connection manner of the unit operator cell and dummy cell shown in FIG. 159. Referring to FIG. 160, the reading operation performed on unit operator cell UOE and dummy cell DMC shown in FIG. 159 will be described below.

In the following description, the state in which SOI transistors NQ1 and NQ2 have the high threshold voltage is correlated with the state of storing data "0", and the state in which SOI transistors NQ1 and NQ2 have the low threshold voltage is correlated with the state of storing data "1".

During the pre-charge period, read bit line RBL and complementary read bit line ZRBL are pre-charged to the level of pre-charge voltage VPC by bit line pre-charge/equalize circuit BLEQ shown in FIG. 148.

When the read cycle is started, read word lines RWLA and RWLB and dummy cell selection signal DCLB are driven to selected state. For example, the voltage at source line SL is set at the level of power supply voltage VCC, and is higher than reference voltage Vref supplied to dummy cell DMC. For example, reference voltage Vref is set at the level of half a power supply voltage VCC. In the case where the data "0" is stored in one of SOI transistors NQ1 and NQ2, the SOI transistor storing data "0" has the high threshold voltage and passes a smaller current amount. On the other hand, in the case where the data "1" is stored in SOI transistors NQ1 and NQ2, SOI transistors NQ1 and NQ2 have the low threshold voltage, and the larger current flows through SOI transistors NQ1 and NQ2.

Accordingly, in the case where the data "1" is stored in both SOI transistors NQ1 and NQ2 (state S(1,1)), the larger current flows from source line SL to sense read bit line RBL through read port RPRTB. In dummy cell DMC, the current passes through from reference voltage source Vref to complementary sense read bit line ZRBL through dummy transistors DTB0 and DTB1. Reference voltage Vref (voltage source and the supplied voltage are designated by the same reference symbol) has the voltage level between the voltage (level of power supply voltage VCC) supplied to located source line SL and bit line pre-charge voltage VPC. In this state, the amount of current supplied from unit operator cell UOE is larger than the amount of current supplied from dummy cell DMC, and the potential at sense read bit line RBL is higher than the potential at complementary sense read bit line ZRBL.

On the other hand, in the case where the data "0" is stored in one of SOI transistors NQ1 and NQ2 (states S(0,1), S(1,0), and S(0,0)), the amount of current supplied from dummy cell DMC to complementary sense read bit line ZRBL is larger than the amount of current supplied from unit operator cell UOE. The potential at sense read bit line RBL is lower than the potential at complementary sense read bit line ZRBL due to the difference in current amount.

In this state, sense amplifier activation signal (/SOP and SON) is made active to activate sense amplifier SA. Sense amplifier SA differentially amplifies the data (potential or current amount) read on sense read bit lines RBL and ZRBL. The sensing operation performed by sense amplifier SA is similar to that shown in FIG. 149. Even if the voltage having the level of high-side power supply voltage VBC of sense amplifier SA is transmitted to one of sense read bit lines RBL and ZRBL, the PN junction at the body region of each of SOT transistors NQ1 and NQ2 and the dummy transistor is prevented from being forward-biased to cause the charges to flow in the body regions, so that the sensing operation can correctly be performed without generating the destruction of the storage data.

Current source circuit 826 supplies the current to internal output node 828*a* when sense amplifier SA produces the H-level output signal (potential at sense read bit line RBL), and current source circuit 826 enters the output high-impedance state when sense amplifier SA produces the L-level output signal.

Read gate CSG shown in FIG. 147 is selected by read selection signal CSL, and the current is supplied to corresponding ADC of the ADC band through the corresponding global read data line.

FIG. 161 shows, in a list form, correlations among the storage data, the logical value of the output signal of the sense amplifier, and the state of the current source circuit in the selection manner of the unit operator cell UOE and dummy cell DMC shown in FIG. 160.

As shown in FIG. 161, only in the case where the data "1" is stored in both SOI transistors NQ1 and NQ2 (state S(1,1)), the unit operator cell supplies the current larger than dummy cell DMC supplies, and the output signal of the sense amplifier and the potential at sense read bit line RBL attains "1". On the other hand, in the case where the data "0" is stored in at least one of SOI transistors NQ1 and NQ2 (states S(0,0), S(1,0), and S(0,1)), the output signal of sense amplifier SA attains "0".

The output signal of the sense amplifier SA indicates the AND operational result of the data stored in storage nodes SNA and SNB of SOI transistors NQ1 and NQ2. Current source circuit 826 enters the on-state to supply the current when sense amplifier SA produces the output signal of "1", and current source circuit 826 enters the off-state to stop the current supplying when sense amplifier SA produces the output signal of "0". Accordingly, the current is supplied to the corresponding global read data line according to the AND operational result of the data stored in storage nodes SNA and SNB of the unit operator cell.

Thus, the data are not read outside the device, but merely the data stored in the unit operator cell are internally read, whereby the logic operation can be performed on the storage data to obtain the operational result. In the seventeenth embodiment, the product-sum operation is performed to perform the multiplication in the fashion that is different from the fashion of the eighth embodiment.

FIG. 162 shows a specific example of the multiplication performed in the eighteenth embodiment. As shown in FIG. 162, the multiplication of four-bit multiplicand X<3:0> and four-bit multiplier Y<3:0> is performed by way of example. In performing the multiplication, bits of multiplicand X<3:0> are multiplied by each bit of multiplier Y<3:0> to produce partial products PP1 and PP4, and the addition of partial products PP1 to PP4 is performed while bit locations of partial products PP1 to PP4 are aligned with each other, thereby producing final product P<7:0>. Partial products PP1 to PP4 are produced by utilizing the AND operation shown in FIG. 161, and the addition of partial products PP1 to PP4 is performed to produce the final product by the current addition. The correlation between global write data lines WGLA and WGLB and the data bits is similar to that of seventeenth embodiment. The weighting is made according to each bit location of the numerical data, and the write data are transferred and stored in storage nodes SNA and SNB of the corresponding unit operator cells.

FIG. 163 schematically shows a configuration of data path 814 in the semiconductor signal processing device of the eighteenth embodiment. FIG. 163 shows the configuration in the case where an eight-bit ADC is used by way of example. Write global data buses WDB0 to WDB6 are provided in operation unit block OUB. Global write data bus WGB0 includes one global write data line pair WGLP, and global write data bus WGB1 includes two global write data line pairs WGLP. As shown in FIG. 147, global write data line pair WGLP includes A-port global write data line WGLA and B-port global write data line WGLB. Global write data bus WGBi includes global write data line pairs WGLP of two to the power of i. Where i is an integer of 2 to 6.

A global write driver WDRA/B is provided corresponding to each global write data line pair WGLP, and the applied data bits are transferred to corresponding global write data buses WGB0 to WGB6. Global write driver WDRA/B includes a global write driver WDRA provided corresponding to A-port global write data line WGLA and a global write driver WDRB provided corresponding to B-port global write data line WGLB.

Global write driver WDRA/B provided for global write data bus WGBk transfers data bit at a k-th bit location of the input data. Here, k is an integer of 0 to 6. Accordingly, the write data having write data bits weighed according to the corresponding bit positions is produced, and the write data is transferred through the corresponding global write data lines.

A switch box 852 and register circuits 850*a* to 850*d* and 851*a* to 851*d* are provided corresponding to global write data buses WGB0 to WGB6. Register circuits 850*a* to 850*d* retain applied input data bits DINA<0> to DINA<3>, respectively. Register circuits 851*a* to 851*d* retain applied input data bits DINB<0> to DINB<3>, respectively.

Switch box 852 has input nodes EA0 to EA3 and EA4 to EA7 that are disposed for register circuits 850*a* to 850*d*, input node EB0 to EB3 and EB4 to EB7 that are disposed for register circuits 851*a* to 851*d*, a ground line 855 that is disposed on the input side, and output nodes FA0 to FA6 and FB0 to FB6 provided corresponding to global write data buses WG0 to WGB6. For the sake of simplification, in FIG. 163, the set of input nodes EAi and EBi is shown as input node Ei and the set of output nodes FAi and FBi is shown as output node Fi.

In switch box 852, the data bit transfer paths are set for port A and port B by switch control signals SWCA and SWCB, respectively.

Switch box 852 switches the connection paths between output node F0 to F6 and input nodes E0 to E7 in response to data clock signal DCLK. Input data bits DINA<3:0> are transferred to the global write data bus while being sequentially shifted bit by bit in the upper bit direction by the switching operation of switch box 852, input data bits DINB<3:0> are sequentially selected bit by bit, and input data bits DINB<3:0> are sequentially selected bit by bit and the bit position of the selected bit of input data bits DINB<3:0> is shifted to be transferred.

As shown in FIG. 162, in the case where the multiplication of four-bit multiplicand X<3:0> and four-bit multiplier Y<3:0> is performed, the multiplication is performed according to the following procedure. In performing the multiplication, bits of multiplicand X<3:0> is multiplied by each bit of multipliers Y<3> to Y<0> to produce partial products PP1 to PP4, and the addition of partial products PP1 to PP4 is performed while locations of partial products PP1 to PP4 are aligned with each other, thereby producing final product P<7:0>. Partial products PP1 to PP4 are produced by utilizing the AND operation shown in FIG. 161, and the analog addition of partial products PP1 to PP4 is performed through the analog current addition to produce the final product. Referring to FIGS. 164 to 171, the operation data writing operation will specifically be described below. In FIGS. 164 to 171, for the sake of convenience, the data transfer path to port A and the data transfer path to port B are separately shown in different drawings.

In FIG. 164, multiplicand bits X<0> to X<3> are stored in register circuits 850*a* to 850*d* in response to data clock signal DCLK, respectively. Register circuits 850*a* to 850*d* retain the storage data until the next reset (not shown) instruction is supplied. Register circuits 850a to 850d are connected to input nodes EA0 to EA3 and EA4 to EA7 in switch box 852. Output nodes FA0 to FA3 of switch box 852 are connected to input nodes EA0 to EA3 in response to switch control signal SWCA. Output nodes FA4 to FA6 are connected to ground line 855. Global write drivers WDRA are activated to transfer the data, transferred through switch box 852, to global write data buses WGB0 to WGB6. Accordingly, multiplicand bits X<0> to X<3> are transferred to global write data buses WGB0 to WGB3. The data "0" is transferred to global write data buses WGB4 to WGB6.

On the other hand, as shown in FIG. 165, multiplier bits Y<0> to Y<3> are stored in register circuits 851a to 851d in response to data clock signal DCLK, respectively. Similarly to register circuits 850a to 850d, register circuits 851a to 851d retain the storage data until the next reset (not shown) instruction is supplied. Register circuits 851a to 851d are connected to input nodes EB0 to EB3 and input nodes EB4 to EB7 in switch box 852. Output nodes FB0 to FB3 of switch box 852 are connected to input nodes EB0 by switch control signal SWCB. Output nodes FB4 to FB6 are connected to ground line 855. Global write drivers WDRB are activated to transfer the data, transferred through switch box 852, to global write data buses WGB0 to WGB6. Accordingly, multiplier bit Y<0> is transferred to global write data buses WGB0 to WGB3, and data "0" is transferred to global write data buses WGB4 to WGB6.

When multiplicand data X<3:0> and multiplier data bit Y<0> are transferred through global write data buses WGB0 to WGB3, the write word line is activated in the starting sub-array block #0 of the write target, and the data are written in storage nodes SNA and SNB of the unit operator cells.

When the first write cycle is completed, for port. A, the connection path of switch box 852 is switched by switch control signal SWCA as shown in FIG. 166. In this state, input nodes EA0 to EA3 are connected to output nodes FA1 to FA4, and output nodes FA0, FA5, and FA6 are connected to ground line 855. The storage data bits of register circuits 850a to 850d are not changed. Accordingly, global write driver WDRA transfers multiplicand bits X<0> to X<3> to global write data buses WGB1 to WGB4, and global write drivers WDRA transfer the data "0" to global write data buses WGB0, WGB5, and WGB6.

On the other hand, for port B, the connection path of switch box 852 is switched by switch control signal SWCB as shown in FIG. 167. In this operation, input node EB1 is connected to output nodes FB1 to FB4, and input node EB5 is connected to output nodes FB3 and FB4. Both input nodes EB1 and EB5 are connected to register circuit 851b in which multiplier data bit Y<1> is stored. Output nodes FB0, FB5, and FB6 are connected to ground line 855. The storage data bits of register circuits 851a to 851d are not changed. Accordingly, global write drivers WDRB transfer multiplier bit Y<1> to global write data buses WGB1 to WGB4, and global write drivers WDRB transfer the data "0" to global write data buses WGB0, WGB5, and WGB6.

When the data X<3:0> and Y<1> are concurrently transferred through global write data buses WGB1 to WGB4, the write word line is driven to the selected state in sub-array block #1 of the next write target, and the transferred data are written in storage nodes SNA and SNB of the corresponding unit operator cells. Therefore, multiplicand data X<3:0> and multiplier data bit Y<1> are stored in sub-array block #1 after multiplicand data X<3:0> and multiplier data bit Y<1> are shifted by one bit toward the upper bit direction with respect to sub-array block #0.

For port A, as shown in FIG. 168, switch control signal SWCA is changed to switch the connection path of switch box 852. In this state, output nodes FA2 to FA5 are connected to input nodes EA4 to EA7 connected to register circuits 850a to 850d. Output nodes FA0, FA1, and FA6 are connected to ground line 855. For port global write data lines WGLA, the data bit "0" is transferred to global write data buses WGB0, WGB1, and WGB6, and multiplicand bits X<0> to X<3> are transferred to global write data buses WGB2 to WGB5.

For B port, the connection path of switch box 852 is switched by switch control signal SWCB as shown in FIG. 169, and output nodes FB2 to FB5 are connected to input nodes EB2 and EB6 connected to register circuit 851c. Output nodes FB0, FB1, and FB6 are connected to ground line 855. Accordingly, for B-port global write data lines WGLB, multiplier data bit Y<2> is transferred to global write data buses WGB2 to WGB5, and the data bit "0" is transferred to global write data buses WGB0, WGB1, and WGB6.

When multiplicand data X<3:0> and multiplier data bit Y<2> are transferred through global write data buses WGB2 to WGB5, the write word line is driven to the selected state in sub-array block #2 of the next write target, and the transferred data are written in storage nodes SNA and SNB of the corresponding unit operator cells. Therefore, the data are written in the positions shifted by one bit toward the upper bit direction with respect to the write cycle shown in FIGS. 166 and 167.

As shown in FIG. 170, for port A, the state of switch control signal SWCA is changed again after the data writing is completed, output nodes FA3 to FA6 of switch box 852 are connected to input nodes EA4 to EA7 connected to register circuits 850a to 850d, and output nodes FA0 to FA2 are connected to ground line 855. At this time, for port-A global write data line WGLA, the data bit "0" is transferred to global write data buses WGB0 to WGB2, and multiplicand bits X<0> to X<3> are transferred to global write data buses WGB3 to WGB6.

For port B, the data transfer path is switched by switch control signal SWCB in switch box 52 as shown in FIG. 171. That is, output nodes FB3 to FB6 are connected to input nodes EB3 and EB7 connected to register circuit 851d, and output nodes FB0 to FB2 are connected to ground line 855. At this time, for B port global write data line WGLB, the data bit "0" is transferred to global write data buses WGB0 to WGB2, and multiplier data bit Y<3> are transferred to global write data buses WGB3 to WGB6.

Multiplicand data X<3:0> and multiplier data bit Y<3> are concurrently transferred through global write data buses WGB3 to WGB6. When the data are transferred, the write word line is driven to the selected state in sub-array block #3 of the next write target, and the transferred data are written in the unit operator cells.

Multiplicand data X and multiplier data Y are concurrently written. Accordingly, four-time write access is required to write all the data bits.

When the four-time write access is completed to end the data writing of the multiplication target, similarly to the seventeenth embodiment, the data are read from the memory sub-array blocks.

FIG. 172 schematically shows a configuration of the data read portion in the semiconductor signal processing device of the eighteenth embodiment. Referring to FIG. 172, the configurations of sense amplifier circuit SAK and read gate CSG included in sense amplifier band 822 and read gate circuit 824 are similar to those in the seventeenth embodiment. As representatively shown in sub-array block BK0, in cell sub-array 820, unit operator cell UOE is connected to bit line BL, and transistors NQ1 and NQ2 constituting unit operator cell UOE are connected in series between source line SL and bit line BL. Dummy cell DMC is connected to complementary bit line ZBL.

Referring to FIG. 172, in one operation unit block OUB, multiplicand data X<3:0> is stored in sub-array blocks BK0 to BKm (m=3: #0 to #3 in the case of four-bit data) while the storage locations are shifted by one bit for each sub-array block. Multiplier data bits Y<0> to Y<3> are stored in sub-array blocks BK0 to BKm (#0 to #3 in the case of the four-bit data) while the storage locations are shifted by one bit for each sub-array block. The data of the operation target are stored while the bit positions are shifted, which allows the bit location alignment to be easily achieved during the addition of partial products.

In reading the data, similarly to the seventeenth embodiment, read selection signals CSL<0> to CSL<m> are concurrently driven to the connection (selected) state for sub-array blocks BK0 to BKm (m=3 in the case of the four-bit data) in which the multiplier data and multiplicand data are written. At this time, port B is selected in the port connection circuit. Sense amplifier circuit SAK supplies the current corresponding to the AND operational result of the data stored in corresponding unit operator cells UOE. Sense read currents Is0(0) to Is0(126) and Ism(0) to Ism(126) are concurrently supplied to 127 global read data lines RGL0 to RGL126 from memory sub-array blocks BK0 to BKm. Global read data lines RGL0 to RGL 126 are commonly connected to current summing line VM. ADC 835 converts the analog voltage corresponding to the total current on the current summing line VM into digital data.

FIG. 173 schematically shows the data bits stored in sub-array blocks #0 to #3 (=BK0 to BK3) when the multiplication is performed on four-bit data X<3:0> and Y<3:0>. Referring to FIG. 173, in sub-array block #0, multiplicand data bits X<0> to X<3> and multiplier bit Y<0> are stored in storage nodes SNA and SNB of unit operator cells UOE arranged for global write data buses WGB0 to WGB3. The data "0" is stored in storage nodes SNA and SNB of the unit operator cells arranged for global write data buses WGB4 to WGB6.

In sub-array block #1, multiplicand data bits X<0> to X<3> and multiplier data bit Y<1> are stored in storage nodes SNA and SNB of the unit operator cells arranged for global write data buses WGB1 to WGB4. The data "0" is stored in storage nodes SNA and SNB of the unit operator cells arranged for global write data buses WGB0, WGB5, and WGB6.

In sub-array block #2, multiplicand data bits X<0> to X<3> are stored in storage nodes SNA of the unit operator cells arranged for global write data buses WGB2 to WGB5, and multiplier data bit Y<2> is stored in storage node SNB. The data "0" is stored in storage nodes SNA and SNB of the unit operator cells arranged for global write data buses WGB0, WGB1, and WGB6.

In sub-array block #3, the data "0" is stored in storage nodes SNA and SNB of the unit operator cells arranged for global write data buses WGB0 to WGB2. Multiplicand data bits X<0> to X<3> and multiplier data bit Y<3> are stored in storage nodes SNA and SNB of the unit operator cells arranged for global write data buses WGB3 to WGB6.

In each of sub-array blocks #0 to #3, the data are written in unit operator cells UOE corresponding in number to the bit widths of global write data buses WGB0 to WGB6. Sense amplifier circuit SAK transfers the current to global read data line RGL according to the AND operational result of the data stored in storage nodes SNA and SNB of the unit operator cells UOE. Sub-array blocks #0 to #3 supply the currents corresponding to partial products PP1 to PP4 shown in FIG. 162 to global read data bus RGB0 to RGB6. Accordingly, the total current on current summing line VM, that is, the voltage indicates the multiplication result. ADC 835 performs the AD conversion to the voltage at current summing line VM, thereby obtaining eight-bit multiplication result P<7> to P<0> corresponding to the addition result of partial products PP1 to PP4.

FIG. 174 schematically shows a configuration of ADC band 812 of the semiconductor signal processing device of the eighteenth embodiment. Referring to FIG. 174, in ADC band 812, M-bit ADCs 835*a* to 835*k* are provided corresponding to operation unit blocks OUBa to OUBk. Current summing lines VMa to VMk are provided corresponding to ADCs 835*a* to 835*k*, and ADCs 835*a* to 835*k* convert the voltages at corresponding current summing lines VMa to VMk into M-bit digital data in a bit-by-bit basis using conversion reference voltages VREF_ADC#a to VREF_ADC#k, to produce M-bit data Qa<M−1:0> to Qk<M−1:0>, respectively.

Accordingly, analog multiplication results Xa·Ya, . . . , and Xk·Yk of multiplicand data Xa, Xb, . . . , and Xk and multiplier data Ya, Yb, . . . , and Yk are produced in operation unit blocks OUBa, OUBb, . . . , and OUBk, and M-bit ADCs 835*a* to 835*k* can concurrently perform the AD conversion to produce the M-bit digital data.

In operation unit blocks OUBa to OUBk, the unit operator cells of the same row are selected to perform the data write and read. Accordingly, in the multiplication, although the weighting of the transferred data bit is made to global write data line(s) and global read data line(s), it is only necessary to provide global write drivers of the number corresponding to the weight of each bit position. In the selected sub-array block, it is merely required to concurrently select the unit operator cells of one entry (formed by unit operator cells aligned in one row) to perform the data write and read, and it is not necessary to select the bit lines of the number corresponding to the position of an associated write/read data bit in each sub-array block.

(Modification)

FIG. 175 schematically shows the data write manner in a modification of the semiconductor signal processing device of the eighteenth embodiment. In FIG. 175, sub-array blocks BK0 to BK3 are used to perform multiplication X#1<3:0>×Y#1<3:0>, and sub-array blocks BK4 to BK7 are used to perform multiplication X#2<3:0>×Y#2<3:0>. In each of sub-array blocks BK#0 to BK3, multiplicand data X#1<3:0> is stored in storage nodes SNA of the unit operator cells with each storage location being weighted according to the bit position. Multiplier data bits Y#1<0> to Y#1<3> are stored in storage nodes SNA of the unit operator cells of sub-array blocks BK0 to BK3 with the storage locations being weighted according to each bit position.

In each of sub-array blocks BK#4 to BK7, multiplicand data X#2<3:0> is stored in storage nodes SNA of the unit operator cells with the weighting according to each bit position. Multiplier data bits Y#2<0> to Y#2<3> are stored in storage nodes SNA of the unit operator cells of sub-array blocks BK4 to BK7 with storage locations being weighted according to each bit position.

A set of operation data are stored by the procedure similar to that shown in FIGS. 164 to 171. The data are concurrently read from sub-array blocks BK0 to BK7. In this operation, the currents corresponding to partial products PPT1 to PPT4 of X#1<3:0>×Y#1<3:0> are transferred from sub-array blocks BK0 to BK3 to the current summing line through the global read data lines (not shown), and the currents corresponding to partial products of X#2<3:0>×Y#2<3:0> are transferred from sub-array blocks BK4 to BK7 to the corresponding global read data lines. Accordingly, the current corresponding to the addition value of multiplication X#1<3:0>×Y#1<3:0> and multiplication X#2<3:0>×Y#2<3:0> is supplied to the current summing line, and ADC produces digital data corresponding to the operational result of the multiplication and addition, so that the product-sum operation of multiple-bit numerical data can be performed at high speed.

FIG. 176 schematically shows a configuration of control circuit 818 in the semiconductor signal processing device of the eighteenth embodiment. The entire configuration of the semiconductor signal processing device of the eighteenth embodiment is similar to that of the seventeenth embodiment shown in FIG. 145.

Referring to FIG. 176, control circuit 818 includes a command decoder 860, a data latch control circuit 862, a switch control circuit 864, and a write control circuit 866. Command decoder 860 decodes command CMD. Data latch control circuit 862 controls the latching operation of register circuits 850*a* to 850*d* and 851*a* to 851*d* in the multiplication processing. Switch control circuit 864 controls the switching operation of switch box 852. Write control circuit 866 controls the writing operation.

Command decoder 860 takes in command CMD in synchronization with clock signal CLK, and command decoder 860 produces a signal for specifying operational processing contents specified by command CMD.

Data latch control circuit 862 produces data clock signal DCLK and data latch enable signal DEN when operational processing instruction (OPLOG) applied from command decoder 860 indicates multiplication processing. When the operation processing instruction received from command decoder 860 indicates the multiplication processing, switch control circuit 864 produces switch control signals SWCA and SWCB in a predetermined sequence in synchronization with clock signal CLK, and switch control circuit 864 switches the connection path of switch box 852 in each write cycle such that the write data transfer path is shifted by one bit toward the upper bit direction.

When the operational processing instruction received from command decoder 860 indicates a processing involving the data writing, write control circuit 866 activates write activation signal WREN and write word line enable signal WWLEN at predetermined timings. When the operational processing instruction received from command decoder 860 indicates the multiplication processing, write control circuit 866 produces a latch enable signal LATEN.

Control circuit 818 includes a read control circuit 868 that controls the reading operation, a word line address register 870 that produces the word line address in the multiplication processing, and a block address counter 872 that counts clock signal CLK to produce block address BRAD.

When the operational processing instruction supplied from command decoder 860 indicates a processing involving the data read, read control circuit 868 produces read activation (enable) signal REDEN, read word line enable signal RWLEN, sense amplifier enable (activation) signal SAEN, and AD conversion enable (activation) signal ADCEN at predetermined timings in a predetermined sequence. When the operational processing instruction supplied from command decoder 860 indicates the multiplication processing, a storage value of word line address register 870 is set at a predetermined value, and word line address register 870 retains word line address WLAD for specifying a word line (write word line and read word line) in the selected sub-array block in the multiplication processing.

When the operational processing instruction received from command decoder 860 indicates the multiplication processing, block address counter 872 counts clock signal CLK to produce the count value as block address BRAD for specifying a sub-array block. When the count value reaches a predetermined value, block address counter 872 produces a count-up signal CUP, and count-up signal CUP is applied to read control circuit 868 and write control circuit 866. In the case where the operational processing instruction indicates the multiplication processing, read control circuit 868 produces control signals SAEN, RWLEN, REDEN, and ADCEN to start the next read operation when block address counter 872 produces count-up signal CUP predetermined number of times. The number of count-up signals CUP corresponds to the number of sets of the operation target data. For example, in the case where the multiplication is performed on the set of multiplicand data X<3:0> and multiplier data Y<3:0>, a transition to the read operation is made when count-up signal CUP is asserted once.

Write control circuit 866 activates latch enable signal LATEN when block address counter 872 produces count-up signal CUP to write control circuit 866. The decoding result of the block address is latched into the local cell selection circuit provided corresponding to each sub-array block by the latch enable signal LATEN. Therefore, the sub-array blocks can concurrently be driven to the selected state during the multiplication processing and during the next reading operation after the write completion.

FIG. 177 schematically shows a configuration of local cell selection circuit 875 included in cell selection driving circuit 816 shown in FIG. 145. Referring to FIG. 177, a local cell selection circuit 875 includes a block decoder latch 880 and a write word line drive circuit 882 that drives the write word line to the selected state. Block decoder latch 880 decodes block address signal BRAD when write activation signal WEN and read activation signal RWDEN are activated, and block decoder latch 880 drives the decoded signal to the selected state when the corresponding sub-array block is specified. Block decoder latch 880 latches block address signal BRAD or the decoding result during activation of latch enable signal LATEN supplied from write control circuit 866 shown in FIG. 176.

Write word line drive circuit 882 is enabled when the output signal of block decoder latch 880 is in the selected state, to drive write word line WWL of the corresponding row to the selected state according to write word line enable signal WWLEN and word line address WLAD.

Local cell selection circuit 875 includes a read word line drive circuit 884 that drives the read word line to the selected state, a sense amplifier control circuit 886 that controls the operation of the sense amplifier circuit, and a read activation circuit 888 that reads the output signal of the sense amplifier circuit. Read word line drive circuit 884 is enabled when the decode signal supplied from block decoder latch 880 is in the selected state, to drive read word lines RWLA and RWLB corresponding to the row specified by word line address signal WLAD to the selected ion state in response to read word line enable signal RWLEN.

Sense amplifier control circuit 886 is enabled when the output signal of block decoder latch 880 is in the selected state, to activate sense amplifier activation signal SE (SON and /SOP) in response to sense amplifier enable signal SAEN. Read activation circuit 888 is enabled when the decoded signal of block decoder latch 880 is in the selected state, to drives read selection signal CSL to the selected state at activation timing of read activation signal REDEN.

The portion where dummy cell selection signals DCLA and DCLB are produced to select the dummy cell is not shown. It is sufficient to activate dummy cell selection signals DCLA and DCLB at the same timing as read word lines RWLA and RWLB in response to read word line enable signal RWLEN.

With reference to the configuration of switch box 852, it is sufficient to provide the switching transistors so as to establish the connection paths shown in FIGS. 164 to 171. Alternatively, instead of the switching transistor matrix configuration, the shift register may be provided corresponding to the data transferring path of A port, to logically shift the data latched in register circuits 850*a* to 850*d* by one bit toward the upper bit direction. In the data transferring path of B port, the connection of register circuits 851*a* to 851*d* and the connection of output nodes FB to FB6 may be shifted by one bit toward the upper bit direction for each clock cycle.

Thus, according to the semiconductor signal processing device of the eighteenth embodiment, the data are stored in the unit operator cells with the bit storage positions being weighted in each sub-array block, and the current corresponding to AND operational result of the data stored in unit operator cells are transmitted to global read data lines using the sense amplifier circuits. Therefore, the multiplication of the multi-bit data and the addition processing of the plurality of multiplication results can be performed at high speed.

In the above description of the multiplication, the multiplication result of the four-bit data is obtained using the eight-bit ADC. The bit width of the data used is not limited to the four bits, but the data having another bit width may be used.

[Nineteenth Embodiment]

FIG. 178 schematically shows an example of a configuration of a sense amplifier band and read gate circuit in a semiconductor signal processing device according to a nineteenth embodiment of the present invention. Similarly to the seventeenth embodiment, the unit operator cell has the configuration shown in FIGS. 1 and 2. In the nineteenth embodiment, port A is selected to drive the bit line current having the magnitude corresponding to the data stored in storage node SNA. Sense amplifier circuit SAK of sense amplifier band 822 includes sense amplifier SA and current source circuit 826 that supplies the current according to the sensed signal of sense amplifier SA, that is, the potentials at sense read bit lines RBL and ZRBL.

Similarly to the seventeenth embodiment, sense amplifier SA has the configuration similar to that shown in FIG. 148, and sense amplifier SA has the cross-coupled P-channel transistors and the cross-coupled N-channel transistors. In the nineteenth embodiment, the current-mirror type differential amplifying circuit may be used as sense amplifier SA.

Current source circuit 826 includes P-channel transistor PT10 that supplies the current from the power supply node in response to the output signal of inverter buffer 827*a* and discharging transistor NT10 that sinks the current in response to the output signal of inverter buffer 827*b*. Discharging transistor NT10, in the conductive state, discharges the current according to the voltage at low-side power supply node VNF that is not higher than the ground voltage.

Unlike the configuration of the seventeenth embodiment, read gate CSG of read gate circuit 824 includes two switching transistors NT11 and NT12 that are commonly connected to a corresponding global read data line RGL. Switching transistor NT11 is put into the conductive state in response to addition read selection signal CSLP, to connect charging transistor PT10 of current source circuit 826 to global read data line RGL in the conductive state. Switching transistor NT12 is selectively put into the conductive state in response to subtraction read selection signal CSLN, to connect discharge transistor NT10 to global read data line RGL during the conductive stte.

Accordingly, in current source circuit 826, the corresponding global read data line RGL can be charged and discharged by the configuration of the read gate.

When the data "1" is stored in storage node SNA of the corresponding unit operator cell, sense read bit lines RBL and ZRBL attain the H level and the L level respectively, inverter buffers 827*a* and 827*b* concurrently put transistors PT10 and NT10 into the conductive state, and global read data line RGL is charged or discharged in response to read selection signals CSLP and CSLN. When the data "0" is stored in storage node SNA of the corresponding unit operator cell, sense read bit lines RBL and ZRBL attain the H level and the L level respectively, both transistors PT10 and NT10 enter the off-state, and current source circuit 826 enters the output high-impedance state, Accordingly, when the data "0" is stored in storage node SNA, sense amplifier circuit has no influence on the current passing through global read data line RGL.

Charging transistor PT10 and discharging transistor NT10 act as a constant current source, and transistors PT10 and NT10 supply the constant current to global read data line RGL (the current sinking behavior is considered to supply a negative current). Accordingly, when the data "1" is stored in storage node SNA of the corresponding unit operator cell, by selectively activating read selection signals CSLP and CSLN in the read gate CSG, the constant current can be supplied to or pulled out from global read data line RGL, that is, the positive and negative currents can be supplied. Thus, the addition or subtraction can be performed. The current addition and current subtraction are set by read selection signals CSLP and CSLN.

FIG. 179 schematically shows a configuration of ADC 835 of the nineteenth embodiment. ADC 835 shown in FIG. 179 differs from ADC of the seventeenth embodiment shown in FIG. 152 in that conversion reference voltages VREF_ADC and −VREF_ADC are supplied to power supply nodes 840 and 900 for the network of resistances 841*a* to 841*u*. In FIG. 179, other configuration of ADC 835 is similar to that of the ADC 835 shown in FIG. 152, and corresponding parts to those in the ADC 835 shown in FIG. 152 are designated by the same reference numerals, and the detailed description is not repeated.

Even if the addition and subtraction result has a negative value, a negative current value can be produced by the use of positive and negative reference voltages VREF_ADC and to −VREF_ADC as the conversion reference voltage. In such case, encoder 844 produces a signed multi-bit data with a sign indicating the positive or negative through the encoding operation.

FIG. 180 schematically shows an example of the operational processing performed in the semiconductor signal processing device of the nineteenth embodiment.

Referring to FIG. 180, the addition and subtraction are performed to the four-bit input data DIN#1 to DIN#m, and the addition and subtraction results are supplied as signed M-bit data. In FIG. 180, the subtraction is performed for four-bit input data DIN#3 (=0010) and DIN#m (=1011), and the addition is performed for other four-bit input data DIN#1 (=1110), DIN#2 (=1010), and DIN#4 (=0110).

The four-bit input data DIN#1 to DIN#m are each a non-signed input data. Accordingly, the most significant bit of each of the four-bit input data DIN#1 to DIN#m does not indicate a sign.

FIG. 181 schematically shows a behavior when the semiconductor signal processing device of the nineteenth embodiment reads the data. The data path has the configuration similar to that of the seventeenth embodiment, global write word lines corresponding in number to the weight of each corresponding data bit location are selected to write the data in storage node(s) SNA of the corresponding unit operator cell(s).

In FIG. 181, the data write and read are performed to memory sub-array blocks BK0 to BKj. In each of memory sub-array blocks BK0 to BKj, sense amplifier circuit SAK performs the sensing operation on the current passing through corresponding memory cell MC with the current passing through dummy cell DMC being the reference current. In the read gate, the transistors NT11 and NT12 are selectively set into the on-state. In FIG. 181, for memory sub-array blocks BK0 and BK1, read selection signals CSLP<0> and CSLP<1> are set to the on-state (selected state), and read selection signals CSLN<0> and CSLN<1> are set to the off-state (non-selected state). Accordingly, in memory sub-array blocks BK0 and BK1, the transistor NT11 enters the on-state, and sense current Is0(0) to Is0(3), . . . , Is0($k$) and Is1(0) to Is1(3), . . . , and Is1($k$) are supplied to corresponding global read data lines RGL0 to RGL3, RGLk, when the data "1" is stored in memory cells MC.

In ADC band 812, ADCs (835) are provided corresponding to operation unit blocks OUBa and OUBb, respectively. ADC (835) performs the AD conversion on the voltage corresponding to the current supplied to corresponding current summing line VM with reference to the voltages produced through resistance-division of the conversion reference voltages VREF_ADC and –VREF_ADC. The A/D conversion behavior of ADC 835 is similar to that of the seventeenth embodiment except that the encoder supplies a signed output data.

Accordingly, from memory sub-array block BKj in which the data to be subtracted is stored, the sense amplifier circuit corresponding to the memory cell storing the data "1" subtracts the current from the global read data line. From memory sub-array block BKj in which the data to be added is stored, the current is supplied to the global read data line for the data "1". The addition and subtraction shown in FIG. 180 are concurrently performed by the current addition and current subtraction, so that the addition and subtraction result can be produced.

FIG. 182 specifically shows the addition and subtraction of four-bit input data. Referring to FIG. 182, the addition is performed to the four-bit input data DIN#1, DIN#2, and DIN#4, and the subtraction is performed to four-bit input data DIN#3. Here, input data DIN#1, DIN#2, DIN#3, and DIN#4 are (1110), (1010), (0010), and (0110), respectively. The addition and subtraction result becomes (011100) as shown in FIG. 182. The highest-order bit of the addition and subtraction result is a sign bit.

In the case where the addition and subtraction are performed, as shown in FIG. 183, the data write and read are performed to sub-array blocks BK0 to BK3. In such case, four-bit input data DIN#1 is written in sub-array block BK0, and read selection signal CSLP<0> is set at the selected state (on-state) to read the operation data. The data is written in and read from storage nodes SNA of the unit operator cells. For sub-array block BK1, four-bit input data DIN#2 is written in storage nodes SNA of the unit operator cells, read selection signal CSLP<1> is set at the selected state (on-state) to read the data stored in storage nodes SNA of the unit operator cells. For sub-array block BK3, input data DIN#4 is written, and read selection signal CSLP<3> is set at the selected state (on-state) to read the data. Accordingly, from sub-array blocks BK0, BK1, and BK3, the currents are supplied to corresponding global read data line in the case of the storage data bit being "1", and the current is not supplied in the case of the storage data bit being "0".

On the other hand, for sub-array block BK2, four-bit input data DIN#3 is written, and read selection signal CSLN is set at the selected state. In this stage, in sub-array block BK2, the current is extracted (pulled out) from the corresponding global read data line to perform the current subtraction in the case where the unit operator cell stores the data bit "1".

In the case where the addition and subtraction are performed, for a plurality of sub-array blocks, the block for storing addition data and the block for storing subtraction data may be fixed in advance. The configuration in which the addition data storage block and the subtraction data storage block are flexibly allocated to sub-array blocks BK0 to BKm will be described below, by way of example.

FIG. 184 schematically shows a configuration of local cell selection circuit 875 included in cell selection driving circuit 816 of the semiconductor signal processing device of the nineteenth embodiment. The local cell selection circuit shown in FIG. 184 differs from local cell selection circuit 875 shown in FIG. 177 in that an operation flag latch circuit 892 is provided to latch an addition and subtraction instruction flag ASF. During the activation of write activation signal WREN, operation flag latch circuit 892 latches addition and subtraction instruction flag ASF when the output signal of block decoder latch 880 specifies a corresponding sub-array block.

During the activation of read activation signal REDEN, read activation circuit 890 drives one of read selection signals CSLP and CSLN to the selected state according to the flag latched by operation flag latch circuit 892.

In FIG. 184, other configuration of the local cell selection circuit are similar to that of the d local cell selection circuit shown in FIG. 177, and corresponding parts to those in the local cell selection circuit shown in FIG. 177 are designated by the same reference numerals, and the detailed description is not repeated.

In the case where the addition and subtraction are performed to the input data, in writing the data in a corresponding sub-array block, the flag (for example, sign bit) indicating the addition or subtraction is used as addition and subtraction instruction flag ASF, and operation instructing contents are concurrently stored in operation flag latch circuit 892. Therefore, read selection signal CSLP and CSLN can selectively be driven to the on-state (selected state) according to the addition and subtraction of the write data in sub-array blocks.

Thus, according to the semiconductor signal processing device of the nineteenth embodiment, when the data "1" is stored in storage node SNA of the unit operator cell, the current source and sink (positive and negative current supplying) are selectively performed to the global read data line, so that the addition and subtraction can concurrently be performed.

Because only the current source and sink of the global read data line are performed according to the addition and subtraction, it is not necessary to convert the subtraction data into two's complement data to perform the addition, and the addition and subtraction processing is simplified. The same effect as the seventeenth embodiment can be also achieved.

[Twentieth Embodiment]

FIG. 185 schematically shows a configuration of an electrically equivalent circuit of a unit operator cell in a semiconductor signal processing device according to a twentieth embodiment of the present invention. FIG. 185 representatively shows two unit operator cells UOEA and UOEB. The data of different operation targets are stored in unit operator cells UOEA and UOEB, respectively.

Local write word lines WWL0 and WWL1 extending in the column direction are provided corresponding to unit operator cells UOEA and UOEB. Local write word lines WWL0 and WWL1 are arranged in parallel with the bit line, so that unit operator cells on one column can be selected by one local write word line WWL in one sub-array block.

Unit operator cell UOEA includes P-channel SOI transistors PQA1 and PQA2 and N-channel SOI transistors NQA1 and NQA2, and unit operator cell UOEB includes P-channel SOI transistors PQB1 and PQB2 and N-channel SOI transistors NQB1 and NQB2.

P-channel SOI transistors PQA1 and PQB1 are selectively put into the conductive state according to the potentials at write word lines WWL0 and WWL1, and P-channel SOI transistors PQA1 and PQB1 transmit write data DINA to body regions (storage node) SNA of N-channel SOI transistors NQA1 and NQB1, respectively. P-channel SOI transistors PQA2 and PQB2 are selectively put into the conductive state according to the potentials at write word lines WWL0 and WWL1, and P-channel SOI transistors PQA2 and PQB2 transmit write data DINB to body regions (storage node) SNB of N-channel SOI transistors NQA2 and NQB2, respectively.

Local write word lines WWL0 and WWL1 are arranged extending in the corresponding operator cell sub-array block. The hierarchical arrangement of the local write word line will be described later.

The sources of SOI transistors NQA1 and NQB1 are each connected to the source lines SL. In unit operator cells UOEA and UOEB, the connection manner between the SOI transistors of the read section is similar to that of the unit operator cell shown in FIG. 1.

SOI transistors NQA1 and NQB1 are selectively put into the conductive state according to the storage data in response to the signal potential at read word line RWLA, and SOI transistors NQA2 and NQB2 are selectively put into the conductive state according to the storage data in response to the signal potential at read word line RWLB.

FIG. 186 schematically shows a planar layout of unit operator cells UOEA and UOEB shown in FIG. 185. Referring to FIG. 186, unit operator cells UOEA and UOEB are symmetrically arranged with respect to the P-type transistor forming region shown by a broken-line block at the central portion. The unit operator cells having the same pattern may repeatedly be disposed in the X-direction.

In the P-type transistor forming region, high-concentration P-type regions 1200*a* and 1200*b* are arranged in alignment in the Y-direction. An N-type region 1202*a* is arranged between P-type regions 1200*a* and 1200*b*. A P-type region 1204*a* is arranged adjacent to and in alignment with P-type region 1200*b* in the Y-direction.

In alignment with P-type regions 1200*a*, 1200*b* and 1204*a* in the Y-direction, P-type regions 1204*b* and high-concentration P-type regions 1200*c* and 1200*d* are arranged. An N-type region 1202*b* is arranged between P-type regions 1200*c* and 1200*d*.

Outside the P-type transistor forming region, an N-type region 1206*a* is arranged adjacent to P-type region 1200*b*, and high-concentration N-type regions 1206*b* and 1206*c* are arranged being aligned with N-type region 1206*a* in the Y-direction. P-type region 1204*a* is arranged between N-type regions 1206*a* and 1206*b* and continuously extending in the X-direction. P-type region 1204*b* is arranged, between N-type regions 1206*b* and 1206*c*, continuously extending in the X-direction.

In the P-type transistor forming region, high-concentration P-type regions 1200*e* and 1200*f* are arranged in alignment in the Y-direction. An N-type region 1202*c* is arranged between P-type region 1200*e* and 1200*f*. A P-type region 1204*c* is arranged adjacent to and in alignment with P-type region 1200*f* in the Y-direction.

A P-type region 1204*d* and high-concentration P-type regions 1200*g* and 1200*h* are arranged aligning with P-type regions 1200*e*, 1200*f*, and 1204*e* in the Y-direction. An N-type region 1202*d* is arranged between high-concentration P-type regions 1200*g* and 1200*h*.

Outside the P-type transistor forming region, an N-type region 1206*d* is arranged adjacent to P-type region 1200*f*, and high-concentration N-type regions 1206*e* and 1206*f* are arranged aligning with N-type region 1206*d* in the Y-direction. P-type region 1204*c* is arranged, between N-type regions 1206*d* and 1206*e*, continuously extending in the X-direction. P-type region 1204*d* is arranged between N-type regions 1206*e* and 1206*f* and continuously extending in the X-direction.

Gate electrode interconnection lines 1208*a* and 1208*e* are arranged continuously extending in the X-direction, and gate electrode interconnection lines 1208*a* and 1208*e* are arranged overlapping N-type regions 1202*a* and 1202*c*. Gate electrode interconnection lines 1208*a* and 1208*e* are arranged being separated from each other.

Due to such separated structure of gate electrode interconnection lines 1208*a* and 1208*e*, unit operator cells UOEA and UOEB are individually driven to the selected state by different write word lines in writing data.

A gate electrode interconnection line 1208*b* is arranged continuously extending in the X-direction, and gate electrode interconnection line 1208*b* is arranged overlapping N-type regions 1204*a* and 1204*c*. A gate electrode interconnection line 1208*c* is arranged continuously extending in the X-direction, and gate electrode interconnection line 1208*c* is arranged overlapping N-type regions 1204*b* and 1204*d*. Gate electrode interconnection lines 1208*d* and 1208*f* are continuously arranged overlapping N-type regions 1202*b* and 1202*d*. Gate electrodes 1208*d* and 1208*f* are arranged being separated from each other, and are electrically connected to the different write word lines.

First metal interconnection lines 1210*a* to 1210*g* continuously extending in the X-direction are arranged being separated from one another. First metal interconnection line 1210*a* is electrically connected to N-type region 1206*f* through contact/via VV11. First metal interconnection line 1210*b* is electrically connected to N-type region 1206*e* through contact/via VV10. First metal interconnection line 1210*c* is electrically connected to gate electrodes 1208*f* and 1208*e* through contacts/vias VV13 and VV12.

First metal interconnection line 1210*e* is electrically connected to gate electrodes 1208*d* and 1208*a* through contacts/vias VV7 and VV6. First metal interconnection line 1210*f* is electrically connected to N-type region 1206*b* through contact/via VV3. First metal interconnection line 1210*g* is electrically connected to N-type region 1206*c* through contact/via VV4.

First metal interconnection lines 1210*a* and 1210*b* constitute B-port and A-port bit lines respectively, and first metal interconnection line 1210*c* constitutes local write word line WWL0. First metal interconnection line 1210*e* constitutes local write word line WWL1, and first metal interconnection line 1210*f* constitutes A-port read bit line to transmit data DOUTA. First metal interconnection line 1210*g* constitutes B-port read bit line to transmit data DOUTB.

Second metal interconnection lines 1212*b* to 1212*f* continuously extending in the X-direction are arranged being separated from one another. Second metal interconnection line 1212*b* is electrically connected to P-type region 1200*a* through contact/via VV1 and the intermediate interconnect. Second metal interconnection line 1212*c* is electrically connected to N-type region 1206*d* through contact/via VV9 and the intermediate interconnect, and second metal interconnection line 1212*c* is electrically connected to N-type region 1206*a* through contact/via VV2. Second metal interconnection line 1212*d* is disposed in parallel with gate electrode interconnection line 1208*b* continuously extending in the X-direction, and second metal interconnection line 1212*d* is electrically connected to gate electrode interconnection line 1208*b* in a not shown portion.

Second metal interconnection line 1212*e* is arranged overlapping gate electrode interconnection line 1208*c*, and second metal interconnection line 1212*e* is electrically connected to gate electrode interconnection line 1208*c* in a not shown portion. Second metal interconnection line 1212*f* is electrically connected to P-type region 1200*h* through via/contact VV8 and the intermediate interconnect, and second metal interconnection line 1212*f* is electrically connected to P-type region 1200*d* through via/contact VV5.

Second metal interconnection lines 1212*b* and 1212*f* transmit input data DINA and DINB, respectively. Second metal interconnection line 1212*c* constitutes source line SL, and second metal interconnection line 1212*d* constitutes read word line RWLA together with lower-layer gate electrode interconnection line 1208*b*. Second metal interconnection line 1212*e* constitutes read word line RWLB together with lower-layer gate electrode interconnection 1208*c*.

In performing an operation, input data DINA and DINB are set to the same data. Therefore, the effect that the data reading from port B is equivalent to data reading from port A can be achieved.

FIG. 187 schematically shows an entire configuration of the semiconductor signal processing device of the twentieth embodiment. Referring to FIG. 187, similarly to the seventeenth embodiment, the operator cell array is divided into a plurality of operator cell array blocks BK0 to BK31. In each of sub-array blocks BK0 to BK31, the unit operator cells are arranged in rows and columns, and the dummy cell is arranged corresponding to each unit operator cell column. Read word lines RWLA and RWLB are disposed for the unit operator cell row, and local write word line WWL is disposed for the unit operator cell column. In FIG. 187, local write word lines WWL0 to WW1Lm are provided in one operation sub-array block, by way of example.

Although not clearly shown in FIG. 187, read bit lines RBL and ZRBL are provided in parallel with local write word line WWL.

In sense amplifier band 822, the sense amplifier circuit is provided corresponding to the unit operator cell column. Similarly to the previously-described embodiments, a port connection switch for selecting a port and a read gate are provided. The configuration of the sense amplifier circuit differs from that of the previously-described embodiments in that the current corresponding to the magnitude of currents supplied from a plurality of unit operator cells onto a corresponding read bit line is supplied to a corresponding global read data line (the configuration of the output portion is described later).

A write word line decoder 1220 is provided being shared by sub-array blocks BK0 to BK31. Write word line decoder 1220 includes write word line drivers 1222 that are provided corresponding to the respective global write data lines WWL<0>, and WWL<m>. Write word line drivers 1222 drives an addressed global write word lines WWL<0>, WWL<1>, . . . according to a write word line address.

A sub-decoder band 1225 is provided corresponding to each of sub-array blocks BK0 to BK31. In sub-decoder band 1225, a sub-decoder 1223 is provided corresponding to each of global write word lines WWL<0> to WWL<m>. Similarly to the fifteenth embodiment, sub-decoder 1223 drives a corresponding local write word line WWLi to the selected state in response to the signal on corresponding global write word line WWL<i> and block selection signal BSk supplied from row selection driving circuit 816, and sub-decoder 1223 drives unit operator cells on one column to the selected state.

In sub-array blocks BK0 to BK31, local write word line WWL is driven to the selected state in response to block selection signal BS. The write word line is formed into the hierarchical structure of the global and local word lines, which allows input data DINA and DINB to be written in the selected sub-array block. The data of the operation target are written in the same column of the plurality of sub-array blocks, and the operational result can be obtained by sensing the current passing through global read data line RGL.

ADC band 812 has the configuration similar to that of one of the seventeenth to nineteenth embodiments. In data path 814, the global write data line is not arranged, and the global write driver is not provided. The (m+1)-bit digital data from ADC band 812 is externally supplied through buffering, for example. Row selection driving circuit (cell selection driving circuit) 816 transfers write data DINA and DINB through data lines (second metal interconnection lines 1212*b* and 1212*f* shown in FIG. 186) that are arranged orthogonal to local write word lines WWL.

In row selection driving circuit 816, row/data line selection driving circuits XXDR0 to XXDR31 are provided corresponding to each of sub-array blocks BK0 to BK31. The data DINA<m:0> and DINB<m:0> of the operation target are applied to row/data line selection driving circuits XXDR0 to DDXR31.

The data are transferred to a selected operator cell sub-array block in parallel. According to the write access cycle, a control circuit 1250 determines block selection signal BS to be driven to the selected state, to determine the sub-array block of the write target.

Each of row/data line selection driving circuits XXDR0 to XXDR31 includes a data line drive circuit 1234 and a word line drive circuit 1230. Data line drive circuit 1234 produces internal write data DINA and DINB according to corresponding bits DINA<i> and DINB<i> of applied input data DINA and DINB. Word line drive circuit 1230 drives read word lines RWLA and RWLB to the selected state in response to an address signal (not shown).

Word line drive circuit 1230 is arranged corresponding to each unit operator cell row of the corresponding operator cell sub-array block. In operator cell sub-array block BK0 to BK31, read word lines RWLA and RWLB can individually and concurrently be driven to the selected state.

In an operator cell sub-array block, the number of allocated read word lines is determined according to the bit position of the storage data. That is, one unit operator cell is allocated to the data of 0-th bit<0>, and two unit operator cells are allocated to the read word line for which first bit <1> is stored. The data of i-th bit <i> is stored in the unit operator cells of two to the power of i (i-ty power of 2). Accordingly, one sub-array block supplies the current having the magnitude corresponding to the value of the storage numerical data.

FIG. 188 shows a configuration of sense amplifier circuit SAK included in sense amplifier band 822 shown in FIG. 187. Referring to FIG. 188, sense amplifier circuit SAK includes sense amplifier SA and current source circuit 826. Sense amplifier SA includes P-channel SOI transistor QP1 and N-channel SOI transistors QN1 and QN2 in order to sense the current passing through sense read bit line RBL. During the activation of the sense amplifier, N-channel SOI transistor QN1 discharges the current supplied from sense read bit line RBL. N-channel SOI transistor QN2 constitutes a current-mirror stage with transistor QN1, to produce the mirror current of current Ic passing through sense read bit line RBL. Transistor QP1 supplies the current to transistor QN2.

N-channel SOI transistor QN3 is provided between node ND11 and the ground node, in order to activate sense amplifier SA. Transistor QN3 connects internal node ND11 to the ground node during the activation of sense amplifier activation signal SE.

Sense amplifier SA further includes P-channel SOI transistors QP2 and QP3 and N-channel SOI transistors QN4 to QN6 in order to sense the current passing through complementary sense read bit line ZRBL. Transistor QN4 discharges dummy cell current Id supplied from complementary sense read bit line ZRBL during the sensing operation. Transistor QN5 constitutes a current-mirror stage with transistor QN4, to produce the mirror current of current Id passing through complementary sense read bit line ZRBL.

Transistor QP3 supplies the current to transistor QN5. Transistor QP2 constitutes the current-mirror stage with transistor QP3, to produce the mirror current of the current passed through transistor QP3. Transistor QN6 discharges the current supplied from transistor QP5 during the sensing operation. Current source circuit 826 includes P-channel SOI transistors QP10 and QP11 that are connected in series between the power supply node and internal output node 828 and N-channel SOI transistors QN11 and QN10 that are connected in series between internal output node 828 and the ground node. The source of transistor QP10 is connected to the power supply node, and the gate of transistor QP10 is connected to the gate of transistor QP2. The gate of transistor QP11 receives current supply activation signal /ENA. The source of transistor QN10 is connected to the ground node, and the gate of transistor QN10 is connected to the gate of transistor QN6. The gate of transistor QN11 receives current supply activation signal ENA.

Read gate CSG connects internal output node 828 to global read data line RGL. In FIG. 188, read gate CSG is formed by one transfer gate. Alternatively, the read gate may be formed by a CMOS transmission gate (analog switch).

In the configuration of sense amplifier circuit SAK shown in FIG. 188, during standby, a pre-charge circuit (not shown, the configuration is similar to that of the seventeenth embodiment shown in FIG. 148) pre-charges and equalizes sense read bit lines RBL and ZRBL to a predetermined voltage level.

Before the sensing operation, read word line is driven to the selected state, and the unit operator cell and the dummy cell supply the currents to sense read bits line RBL and ZRBL. The dummy cell is set at the state of storing data "0". Accordingly, the dummy cell supplies the reference current corresponding to the data "0" to complementary sense read bit line ZRBL.

Current Ic corresponding to the data stored in the unit operator cell is supplied to sense read bit line RBL. When the supply currents are stabilized, sense amplifier activation signal SE is activated to perform the sensing operation. During the sensing operation, the mirror current of the current passing through sense read bit line RBL is passed through transistor QP1 by the current-mirror behavior of transistors QN1 and QN2.

Similarly, the mirror current of current Id passing through complementary sense read bit line ZRBL is passed through transistor QP3 by the current-mirror behavior of transistors QN4 and QN5. Transistors QP3 and QP2 constitute the current-minor stage, and the mirror current of dummy cell current Id is passed through transistor QP2. Therefore, the mirror current of dummy cell current Id supplied from transistor QP2 flows through transistor QN6.

When the currents passing through sense read bit lines RBL and ZRBL are stabilized, current supply activation signals ENA and /ENA are activated, and current source circuit 826 starts the current supplying. During the activation, in current source circuit 826, transistor QP10 constitutes a current-minor stage with transistor QP1, to supply the mirror current of current Ic passing through sense read bit line RBL. On the other hand, transistor QN10 constitutes a current-mirror stage with transistor QN6, to supply the mirror current of current Id passing through complementary sense read bit line ZRBL.

When the read selection signal is activated at a predetermined timing, read gate CSG passes a current $Ic \cdot K - Id \cdot K$ through global read data line RGL. Here, a coefficient K is a mirror ratio of the mirror currents supplied from transistors QP10 and QN10.

The data "0" is stored in the dummy cell, and the current on the basis of the data "0" passes through global read data line RGL, so that the current corresponding to the magnitude of the numerical data stored in the unit operator cell can be supplied to the global read data line. Accordingly, even if the currents are supplied from a plurality of unit operator cells to sense read bit line RBL, the current having the magnitude corresponding to the value of the numerical data can correctly be supplied.

FIG. 189 schematically shows a configuration of the row/data line selection driving circuit shown in FIG. 188. Referring to FIG. 187, a word line drive circuit 1230 includes an A-port read word line driver 1242 and a B-port read word line driver 1244. A-port read word line driver 1242 receives address signal AD and A-port read enable (activation) signal RENA to drive read word line RWLA to the selected state. B-port read word line driver 1244 receives address signal AD and B-port read enable (activation) signal RENB to drive B-port read word line RWLB to the selected state. Address signal AD specifies a row in each sub-array blocks BK0 to BK31.

Read word line drivers 1242 and 1244 are enabled to decode address signal AD when the corresponding enable or activation signals are activated, and read word line drivers 1242 and 1244 drive corresponding word lines WWLB, RWLA and RWLB to the selected state according to the decoding result. In this case, the block selection signal shown in FIG. 187 may be applied additionally to select the read word line in the sub-array block specified by block selection signal BS.

Data line drive circuit 1234 includes an A-port data line driver 1246 and a B-port data line driver 1248. A-port data line driver 1246 receives data bit DINA<i>, write enable (activation) signal WEN, and address signal AD to produce internal write data bit DINA. B-port data line driver 248 receives data bit DINB<i>, write enable (activation) signal WEN, and address signal AD to produce internal write data bit DINB.

During the activation of the write word line driver shown in FIG. 187, write enable signal WEN is activated , and internal write data DINA and DINB are produced according to applied data bits DINA<i> and DINB<i>.

In data line drive circuit 1234, the same configurations are provided in a duplicated manner according to bit position <i> of the allocated data bit. Accordingly, the same configurations of two to the power of i (=2^i) are provided for bit <i>, so that the same data bits can be arranged for unit operator cells of the number corresponding to the bit position.

For word line drive circuit 1230, during the data read, read word lines of the number corresponding to the number of data bits of the operation target are concurrently driven to the selected state. For example, in a four-bit data operation, 15 read word lines are concurrently driven to the selected state. The selection manner of read word lines RWLA and RWLB depends on the operation target to be performed. For example, when in one sub-array block, multiplication of input data DINA and DINB is performed and the multiplication result is added, B port is selected in the sub-array block of the operation target. A port is selected when the addition of input data DINA is performed.

FIG. 190 shows an example of an allocation of the write data in the semiconductor signal processing device of the twentieth embodiment. FIG. 190 shows the data storage manner in the case where the operation is performed on four-bit data, by way of example. FIG. 190 representatively shows the configurations of sub-array blocks BKa and BKb, and particularly FIG. 190 representatively shows the four-bit data storage manner of sub-array block BKa. In FIG. 190, cell sub-array 820 of sub-array block BKa includes a memory cell array 1250 and a dummy cell array 1252. Unit operator cells UOE are arranged in rows and columns in memory cell array 1250, and dummy cells DMC are arranged in rows and columns in dummy cell array 1252 correspondingly to the unit operator cell column. Similarly to the previously-described embodiments, dummy cell DMC is connected to complementary sense read bit line ZRBL, and unit operator cell UOE is connected to sense read bit line RBL. One read word line RWL (read word line RWLA and RWLB) and data driving line DIN (DINA and DINB) are allocated to least significant bit (0-th place)<0>. Two read word lines RWL and two data driving lines DIN are allocated to first bit <1>. Four read word lines RWL and four data driving lines DIN are allocated to second bit <2>, and eight read word lines RWL and eight data driving lines DIN are allocated to third bit <3>. Accordingly, the data bits of bit <0> are stored in one unit operator cell UO, and the data bits of bit<1> are stored in two unit operator cells UOE. The data bits of bit <2> are stored in four unit operator cells UOE, and the data bits of bit <3> are stored in eight unit operator cells UOE.

Unit operator cells of the number corresponding to the bit positions of read word lines RWL are activated by row/data line selection driving circuits XXDRa and XXDRb that are disposed for sub-blocks BKa and BKb. Row/data line selection driving circuits XXDRa and XXDRb have the configuration shown in FIG. 189, and the transfer data bits are previously allocated to the unit operator cell rows.

When the global write data line is activated in writing the data, local write word line WWL is driven to the selected state in the sub-array block specified by the block selection signal. Data line driving circuit 234 is activated, and the data is written in the unit operator cell that is located at an intersection portion of data driving line DIN and local write word line WWL.

In reading the data, the read word lines for which the operation target data is stored, that is, 15 read word lines RWL in the case of the four-bit data are concurrently driven to the selected state using read word line drive circuit 230 included in corresponding row/data line selection driving circuit XXDR (XXDRa and XXDRb). The selection manner of read word lines RWLA and RWLB depends on the operation to be performed.

In this case, the dummy cell is selected. Dummy cell DMC is set at the state of storing data "0". In the selection manner of the dummy cell, the reference current corresponding to the data "0" may be supplied to the sense read bit line, or similarly to the read word line, 15 dummy word lines DRWL may be concurrently driven to the selected state. 15 dummy cells DMC are connected to complementary sense read bit line ZRBL to supply the dummy cell currents corresponding to the data "0", and the current corresponding to the data stored in 15 unit operator cells is supplied to sense read bit line RBL.

In sense amplifier band 22, the total current of current I1 passing through the unit operator cell storing data "1" and of the low threshold voltage state and current Ih (<I1) passing through the unit operator cell storing data "0" and of the high threshold voltage state is supplied to sense amplifier circuit SAK. For simultaneously selected unit operator cells UOE, it is assumed that the number, a, of unit operator cells UOE output the data "1" and the number, b, of unit operator cells UOE output the data "0". In such case, the current passing through sense read bit line RBL attains a·I1+b·Ih. On the other hand, the current passing through complementary sense read bit line ZRBL becomes (a+b)·Ih even if the number of selected dummy cells DMC is equal to the number of unit operator cells.

In current source circuit 26 of sense amplifier circuit SAK, the mirror current of the current corresponding to the difference between the current passing through sense read bit line RBL and the current passing through complementary sense read bit line ZRBL, current K·b·(I1−Ih), is supplied to the corresponding global read data line. For example, data A<3:0> is (0001), and the data A is read from unit operator cells UOE. In case where the number of selected dummy cells is equal to the number of selected unit operator cells, current K.(I1−Ih) is supplied to the corresponding global read data line. On the other hand, in the case where data A<3:0> is (1010), the current of 10·K·(I1−Ih) is supplied to the corresponding global read data line.

In such case, because the supplying current of dummy cells DMC is subtracted as the reference current, it is not particularly necessary that the number of concurrently selected dummy cells be equal to the number of concurrently selected unit operator cells.

Accordingly, the current corresponding to the magnitude of an analog converted value of the data stored in sub-array block BKi passes through global read data line RGL. That is, in a plurality of cell sub-arrays 820, the read word lines and the dummy word lines can be driven to the selected state to supply the current corresponding to the addition value of the data stored in sub-array blocks BKi, BKa, to the corresponding ADC.

In sub-array block BK, in the case where port B is selected while the data A and B are stored as input data DINA and DINB in unit operator cells UOE, the analog current corresponding to the multiplication result of the data A and B is supplied to the corresponding global read data line.

The data writing is performed as follows. The sub-array block in which an operation target data is written is specified by block selection signal BS#. Write word line decoder (220) drives global write word line WWL<0> of the first column to the selected state. In the specified sub-array block, local write word line WWL is driven to the selected state, and data DINA and DINB are written (only data DINA may be written).

When the first-time data write is completed, the next sub-array block is specified by the block selection signal, the next data in the set of operation target data are written while the same global write word line is set at the selected state. When all the data in one set of operation target data are written, the next global write word line is driven to the selected state in order to write the data in the next set of operation target data, and the block selection signal is returned to the initial value to write the data in the next set of operation target data. Then, the similar procedure is repeated to write the data in all the sets of operation target data.

FIG. 191 schematically shows a configuration of a portion related to the data reading of the semiconductor signal processing device according to the twentieth embodiment. Referring to FIG. 191, sub-array blocks BK0 to BKi are provided. Different read selection signals CSL#<0> to CSL#<L> are supplied, in units of operation unit blocks OUBa and OUBb, to read gates CSG provided corresponding to sense amplifier circuits SAK. A number for specifying the block is suffixed after the code # of the signal. Read column selection signals CSL#j<0> to CSL#j<L> are applied to read gates CSG provided corresponding to global read data lines RGLa0 to RGLaL, respectively. Here, j is a numerical number (integer) of 0 to i.

In sub-array blocks BK0 to BKi, the set of operation target data is stored at the position corresponding to the same global read data line. In each of operation unit blocks OUBa and OUBb, the output of one sense amplifier circuit SAK is selected in each sub-array block and transferred to one global read data line RGL (RGLa and RGLb). Current summing lines VMa and VMb are provided in each of operation unit blocks OUBa and OUBb. Accordingly, in each of operation units OUBa and OUBb, the addition of the data stored in selected sub-array blocks is performed, and the corresponding ADC included in ADC band 812 performs the A/D conversion of the addition result.

FIG. 191 shows the case in which conversion reference voltages VREF_ADC and −VREF_ADC is applied to ADC band 812, by way of example. In ADC band 812, ADC sequentially performs the A/D conversion every time the data is read onto global read data line RGL, and ADC produces an A/D converted data. ADC band 812 performs the conversion operation similar to that of the seventeenth and eighteenth embodiments.

In performing an operation, read selection signals CSL#<0> to CSL#<L> are sequentially selected, the sets of operation target data corresponding to different write word lines are selected to sequentially produce the operational result, and then, A/D converted data is produced. In such case, when the pipeline type ADC is used in ADC band 812, the operational result can be produced in the pipeline manner after the digital conversion. In the pipeline type ADC, one-stage unit conversion circuit is arranged per one bit, and the unit conversion circuits are cascaded.

In the configuration shown in FIG. 191, the operational result data is sequentially read onto one global read data line in the operation unit block. However, in one sub-array block, the output signals of sense amplifier circuits SAK are concurrently read in each operation unit onto the corresponding global read data lines, whereby the addition operation can be performed on the data (for example, DIN#0 to DIN#L) stored in operation unit blocks OUB (OUBa and OUBb) of one sub-array block.

For example, the following configuration can be used for the configuration of the control circuit. Write word line address is sequentially updated and applied to the write decoder, and the block selection signal is produced so as to concurrently specify 16 sub-array blocks in the case where the number of p write target data, for example 16 four-bit data are transferred through the 64-bit data bus. In reading the data, read word lines of the number corresponding to the number of data bits are concurrently driven to the selected state such that the unit operator cells in which the data are already written are concurrently selected. Read selection signal CSL is sequentially updated for each read cycle. The sub-array block of the read target can be identified by setting the flag at the sub-array block in which the data are already written, and the data indicating the number of sub-array blocks concurrently driven to the selected state is stored in a register circuit, and the sub-array block can be driven to the selected state according to the value stored in the register circuit.

(Modification)

FIG. 192 schematically shows a configuration of a sense amplifier circuit in a modification of the twentieth embodiment. Sense amplifier SA shown in FIG. 192 differs from sense amplifier SA shown in FIG. 188 in that P-channel SOI transistor QP15 having a gate connected to a gate of transistor QP1 is provided in series with transistor QN6. Transistor QN6 and transistor QP3 are isolated from each other. In FIG. 192, other configuration of sense amplifier SA is similar to that of sense amplifier SA shown in FIG. 188, and corresponding parts to those in sense amplifier SA shown in FIG. 188 are designated by the same reference symbols, and the detailed description is not repeated.

In the configuration of sense amplifier SA shown in FIG. 192, transistors QP1 and QP15 constitute the current-mirror stage to supply the current of the same magnitude. Accordingly, the current of the same magnitude as the current supplied through sense read bit line RBL passes through transistor QP1, and therefore the current of the same magnitude as the current supplied through sense read bit line RBL also flows through transistor QN6.

A flag register 1255 is provided for current source circuit 826. Addition and subtraction instruction flag ASF is stored in flag register 1255, and the conduction and non-conduction of MOS transistors QP11 and QN11 are controlled in response to current addition instruction signal /POEN and current subtraction instruction signal SUEN. In the case where the bit "0" is stored in flag register 1255, the addition is instructed, current addition instruction signal /POEN is activated (set at the L level) at a predetermined timing, thereby putting the transistor QP11 into the conductive state. At this time, current subtraction instruction signal SUEN is maintained in the inactive state of the L level, and transistor QN11 is held at the off-state. Accordingly, transistors QP1 and QP10 constitute the current-mirror circuit, and current K·Ic, that is, k times sense read bit line current Ic is supplied to global read data line RGL through read gate CSG.

On the other hand, in the case where the bit "1" is stored in flag register 1255, the subtraction is instructed, current addition instruction signal /POEN is set at the inactive state of the H level, and current subtraction instruction signal SUEN is activated (set at the H level). Therefore, transistor PQ11 maintains the non-conduction state and transistor NQ11 turns into the conduction state. Transistor QN10 and transistor QN6 constitute the current-mirror circuit to pass the current that is k times current Ic passing through sense read bit line RBL. Accordingly, the current corresponding to current Ic passing through read bit line RBL is extracted from global read line RGL. That is, the negative current is supplied. In such case, the subtraction is performed on data stored in the corresponding unit operator cells.

In FIG. 192, the configuration of sense amplifier SA and other configuration of read gate 34 are similar to the configuration of sense amplifier circuit SAK shown in FIG. 188, and corresponding parts to those in sense amplifier circuit SAK shown in FIG. 188 are designated by the same reference symbols, and the detailed description is not repeated.

Using the sense amplifier circuit shown in FIG. 192, the addition and subtraction can be performed in units of sub-array blocks.

As for flag ASF stored in flag register 1255, when the input data is applied, the input data is transferred with a sign bit being attached at the highest-order bit location, and the highest-order bit is transferred to and latched in the flag register of the corresponding sub-array block, as addition and subtraction instruction flag ASF. Operation flag latch circuit 892 shown in FIG. 184 can be used as the flag register 1255.

Thus, according to the semiconductor signal processing device of the twentieth embodiment, in the same column of one sub-array block, the bits of the operation target data are stored in unit operator cells of the number according to the bit position and read onto the sense read bit lines corresponding to the storage data, and sense amplifier circuit supplies the current corresponding to the sense read bit line current to the global read data line (negative current is supplied in the subtraction). Accordingly, the analog current corresponding to the storage data can correctly be read onto the global read data line to perform the current addition with the dummy cell current being the reference current. Therefore, similarly to the seventeenth embodiment, the addition and subtraction can be performed at high speed without producing the carry/borrow even under the low power supply voltage.

[Twenty-First Embodiment]

FIG. 193 schematically shows a configuration of a main part of a semiconductor signal processing device according to a twenty-first embodiment of the present invention. Referring to FIG. 193, the bit positions of the write data are fixedly allocated to sub-array blocks BK0 to BKs included in memory cell array 810. In FIG. 193, the least significant bit (0-th bit)<0> is allocated to sub-array blocks BK0, BK4, . . . , and first bit <1> is allocated to sub-array blocks BK1, BK5, . . . . Second bit<2> is allocated to sub-array blocks BK2, BK6, . . . , and third bit <3> is allocated to sub-array blocks BK3, . . . , and BKs. The bit position of the write target data is fixedly determined to other not shown sub-array block according to the write data bit width.

The configuration of the memory sub-array of sub-array blocks BK0 to BKs is similar to that of the twentieth embodiment shown in FIG. 192. However, the data bit is stored in one unit operator cell, and the read word line drive circuit and data line drive circuit drive one read word line and data driving line. Because the memory sub-array block is weighted with the bit position of the numerical data, it is not necessary to weight the number of unit operator cells in which the data bit is stored.

The unit operator cell has the configuration shown in FIGS. 1 and 2. ADC band 812 has the configuration similar to that of the twentieth embodiment shown in FIG. 191.

Because the local write word lines are arranged in sub-array blocks BK0 to BKs, write word line decoder 1220 is commonly provided for the sub-array blocks of memory cell array 810 in order to drive the global write data lines.

The configuration of the twentieth embodiment shown in FIG. 188 or 192 is utilized for the configuration of the sense amplifier circuit of the sense amplifier band included in sub-array blocks BK0 to BKs. However, the current addition processing or the current addition and subtraction processing can only be performed.

In the configuration shown in FIG. 193, in each sub-array block, a corresponding bit of one operation target data is stored in one unit operator cell. In reading the data, the sense amplifier circuit of the sub-array block is connected to the global read data line for a time corresponding to the bit position. That is, the conduction (on-state) time of the read gate becomes time t0 for sub-array blocks BK0, BK4, . . . to which the bit position of 0-th bit <0> (hereinafter referred to as bit position <0>) is allocated. The conduction time of the read gate becomes time 2·t0 for sub-array blocks BK1, BK5, . . . to which the bit position <1> is allocated. The conduction time of the read gate becomes time 4·t0 for sub-array blocks BK2, BK6, . . . to which the bit position <2> is allocated. The conduction time of the read gate becomes time 8·t0 for sub-array blocks BK3, . . . , and BKs to which the bit position <3> is allocated. Generally, the conduction time of the read gate becomes tow to the power of i of the unit time t0 for sub-array block to which the bit position <i> is allocated.

That is, the read gate is kept conductive for a time period corresponding to the weight of the bit position, to supply the current from the current source circuit included in the sense amplifier circuit. Thus, the current weighted according to a bit position is transmitted to a corresponding read global data line.

FIG. 194 schematically shows a configuration of cell sub-array 820 of sub-array blocks BKa and BKb. Referring to FIG. 194, different data are transmitted to read word lines RWL (RWLA and RWLB). That is, in sub-array block BKa to which bit <0> is allocated, data line drive circuits 1234 included in row/data line selection driving circuit XXDRa transmits least significant bits A#0<0> to A#m<0> of the data A#0 to A#m and least significant bits B#0<0> to B#m<0> of the data B#0 to B#m through data driving lines DIN0 to DINm to unit operator cells UOE connected to read word lines RWL0 to RWLm.

In sub-array block BKb to which bit <1> is allocated, data line drive circuits 1234 included in corresponding row/data line selection driving circuit XXDRb transmit least significant bits A#0<1> to A#m<1> of data A#0 to A#m and least significant bits B#0<1> to B#m<1> of data B#0 to B#m through data driving lines DIN0 to DINm to unit operator cells UOE connected to read word lines RWL0 to RWLm. Similarly, the data bits of the allocated bit positions of the operation target data are transferred to and stored in other sub-array blocks.

In sub-array blocks BKa and BKb, local write word lines WWL are arranged as in the twentieth embodiment, and the local write word line WW1 is driven to the selected state. Therefore, similarly to the twentieth embodiment, sub-decoder band 1225 is arranged adjacent to sense amplifier band 822 in each sub-array block.

In response to a block selection signal (not shown), local write word lines are driven to the selected state according to the bit width of the operation target data, and the operation target data bits are stored.

The write sequence of the operation target data is similar to that of the twentieth embodiment, and the global write word lines are sequentially driven to the selected state to write the data.

The set of operation target data are arranged in the same column of memory array 810, and another set of operation target data are disposed in different column. The block selection signal and global write word line are sequentially updated to write the operation data until the writing of necessary operation data is completed.

In reading the data, read word line drive circuits 1230 concurrently drives read word lines RWL (RWLA and RWLB) connected to the unit operator cells in which the data is already written to the selected state. The current corresponding to the value of the data bit stored in unit operator cell UOE passes through corresponding sense read bit line RBL. Sense amplifier circuit SAK produces the current of the magnitude corresponding to the current passing through sense read bit line RBL with the current supplied from dummy cell DMC being used as the reference current, and sense amplifier circuit SAK transmits the produced current to the corresponding global read bit line.

In FIG. 194, dummy cells DMC are arranged in alignment in one row in each sub-array block. Alternatively, dummy cells DMC are arranged over a plurality of rows, and dummy cells the same in number as the unit operator cells concurrently driven to the selected state may be driven to the selected state in the corresponding sub-array block.

FIG. 195 schematically shows a configuration of the data read section in the semiconductor signal processing device of the twenty-first embodiment. FIG. 195 representatively shows sub-array blocks BK0, BK1, . . . , and BKs. In cell sub-array 820, the data of the corresponding bit is stored in one unit operator cell UOE, and sense amplifier circuit SAK produces the current corresponding to the current supplied from the selection unit operator cell.

Bit position <0> is allocated to sub-array block BK0, and bit position <1> is allocated to sub-array block BK1. Bit position <k> is allocated to sub-block BKs. Similarly to the twentieth embodiment, the data are written in units of rows. That is, one local write word line is driven to the selected state, and data line drive circuits 1234 write the data in the sub-array block specified by the block selection signal.

In reading the data, read selection signals CSL#0<0> to CSL#s<0> are set at the on-state for unit operation blocks OUBa, OUBb, . . . . In this state, for sub-array block BK0, read selection signal CSL#0<0> is set at the on-state for the time t0. For sub-array block BK1, read selection signal CSL#1<0> is set at the on-state for the time 2·t0. For sub-array block BKs, read selection signal CSL#s<0> is set at the on-state for the time $(2^k)$·t0. Accordingly, sense amplifier circuit SAK supplies the current to corresponding global read data line RGL for the time corresponding to the bit position allocated to each respective sub-array block.

In FIG. 195, other configurations of the read unit are similar to those of the data read unit shown in FIG. 191, and corresponding parts to those in the configuration shown in FIG. 191 are designated by the same reference symbols, and the detailed description is not repeated. The time during which the current supplied through read gate CSG from the current source circuit included in sense amplifier circuit SAK flows through the global read data line is set according to the data bit position. The time when the current of each bit is transferred to corresponding global read data line RGL is changed, and therefore the weighting is made on the current according to the bit position. Accordingly, the voltage increase weighted according to the bit position can be caused at current summing line VM (VMa and VMb).

The time during which read selection signal CSL# is kept in the selected state for the read section shown in FIG. 195 is set as follows. Because the bit position is previously allocated to each of sub-array blocks BK0 to BKs, it is sufficient to previously and individually set the time during which the read selection signal in a corresponding read activation circuit is maintained in the selected state. Accordingly, because a plurality of read word lines are concurrently driven to the selected state (one unit operation cell row is selected in one sub-array block) in reading the data, the configuration of the twentieth embodiment can be used as the configuration of the control circuit in the present embodiment. However, one of the configurations of the seventeenth to nineteenth embodiments should be used as the configuration of the word line driver.

In FIG. 195, one operational result is produced for one global read data line in one operation unit block OUB. However, the number of data of the addition operation target can be increased by concurrently supplying the data currents to a plurality of global read data lines in one operation unit block. The flag for specifying the addition and subtraction is set in units of columns to control the current supplying behavior of the current source circuit, whereby the addition and subtraction can be performed to the sets of operation target data in a plurality of columns. For example, the current corresponding to the read bit line current is supplied to a first global read data line, and the current corresponding to the read bit line current is extracted from a second global read data line. Therefore, the operational result obtained on the second global read data line can be subtracted from the operational result obtained on the first global read data line.

The sub-array blocks to which the same bit positions are allocated, that is, the number of sub-array blocks used can appropriately be determined according to the number of operation target data and operation contents.

Thus, according to the semiconductor signal processing device of the twenty-first embodiment, the operation data bit positions are previously allocated to memory sub-blocks, and the time during which the current supplied from the sense amplifier circuit passes through the global read data line is set according to the weight of each bit position. Thus, the addition can be performed at high speed. In each sub-array block, only one write word line and one read word line are driven to the selected state in writing and reading the data, respectively, so that the consumed current can be reduced.

In the above description, four-bit data is shown as the operation target data by way of example. However, any bit width of the operation target data may be used depending on the application.

In the above description, the SOI transistor is used as the unit operator cell. Alternatively, the present invention can be applied to the cell structure, such as an MRAM cell, in which the amount of current passing through the unit operator cell varies according to the storage data and therefore the current passing through the bit line changes.

For example, in the case where the MRAM cell is used, the sense amplifier shown in FIG. 140 can be used as sense amplifier SA to achieve the current addition and A/D conversion processing of the seventeenth to twenty-first embodiments. The configuration of the sixteenth embodiment can be used as the arrangement of the memory cell array. However, in the case where the MRAM cell is used, because bit line BL is commonly used for the data write and for data read, it is necessary to individually provide the write port and the read port by utilizing the following configuration. That is, the write current is passed through the write word line (digit line) that is physically separated from the variable magnetoresistive element in the direction corresponding to the write data, and the current is passed through the bit line that is electrically and magnetically connected to the variable magnetoresistive element in a constant direction during the data writing. Therefore, the different data can be written in the memory cells aligned on a column and connected to the common bit line.

The processing system in which the operation processing is performed at high speed with the low power consumption can be implemented by applying the semiconductor signal processing device of the present invention to the circuitry that performs the operational processing o various signals.

The first to fifteenth embodiments and the tenth to twenty-first embodiments can appropriately be combined.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor signal processing device comprising:

a plurality of unit operator cells arranged in rows and columns and being divided into operation unit blocks in a row direction, each for storing data in a nonvolatile manner and passing a current of a different amount according to the storage data;

a write circuit for expanding each bit of multi-bit numerical data to a number of bits corresponding to a bit position in the numerical data to produce internal write data in each operation unit block, for concurrently selecting unit operator cells in the operation unit block, and for concurrently writing bits of said internal write data corresponding to said multi-bit numerical data in corresponding unit operator cells in the operation unit block;

a plurality of global read data lines arranged corresponding to the columns of said plurality of unit operator cells;

a read circuit for concurrently selecting the unit operator cells of a plurality of rows in said plurality of unit operator cells in data reading, and for passing a current corresponding to data stored in each selected selection unit operator cell through a corresponding global read data line; and a conversion circuit for adding currents supplied through the global read data lines in an analog manner in each operation unit block, and converting a result of the adding into a digital signal.

2. The semiconductor signal processing device according to claim 1, wherein said write circuit includes:

a plurality of global write data lines arranged corresponding to the columns of the unit operator cells and extending in a column direction in each operation unit block, each for transferring said internal write data; and a plurality of global write drivers arranged corresponding to the global write data lines, for concurrently transferring corresponding bits of said multi-bit numerical data to corresponding global write data lines to produce internal write data, said plurality of global write drivers being provided such that each bit of said multi-bit numerical data are transferred to the global write data lines corresponding in number to a weight of a bit position of each respective bit in said multi-bit numerical data.

3. The semiconductor signal processing device according to claim 1, wherein each of said plurality of unit operator cell includes first and second SOI transistors connected in series with each other, each of said first and second SOI transistors being formed on an insulating layer and storing information according to charges accumulated in a body region thereof, and each passing a current of an amount set according to the storage information in each of said first and second SOI transistors, said write circuit writes first internal write data produced from first multi-bit numerical data in the first SOI transistor of a selected unit operator cell, and writes second internal write data produced from second multi-bit numerical data in the second SOI transistor of the selected unit operator cell, and writes said first internal write data and said second internal write data in different rows of the unit operator cells while sequentially shifting bit locations of said first internal write data and said second internal write data, and said read circuit passes a current through the corresponding global read data line according to an amount of current flowing through said first and second SOI transistors.

4. The semiconductor signal processing device according to claim 1, wherein said read circuit supplies or extracts the current to or from the corresponding global read data line according to an operation instruction instructing addition or subtraction of said multi-bit numerical data.

5. The semiconductor signal processing device according to claim 1, wherein said plurality of unit operator cells are divided into a plurality of sub-array blocks along a direction in which said global read data lines are extended, and said plurality of rows are selected one for each different sub-array block.

6. The semiconductor signal processing device according to claim 1, wherein said plurality of unit operator cells are divided into a plurality of sub-array blocks in a column direction, said write circuit includes:

a plurality of global write data lines provided commonly to each operation unit block, and arranged corresponding to the rows of the unit operator cells, for transferring the internal write data; and a plurality of global write drivers arranged corresponding to the respective global write data lines, for concurrently transferring corresponding bits of said multi-bit numerical data to corresponding global write data lines to produce internal write data, said plurality of global write drivers being arranged such that each bit of the multi-bit numerical data is transferred to the global write data lines of the number corresponding to a weight of a bit location of each bit in said multi-bit numerical data; and a write cell selection circuit arranged corresponding to the columns of the unit operator cells in each sub-array block, for concurrently selecting unit operator cells of corresponding columns of the unit operator cells to write the data on the global write data lines in corresponding unit operator cells, the global read data lines are arranged commonly to said plurality of sub-array blocks, and said read circuit selects unit operator cells in units of columns in a sub-array block in which operation target data is written, for passing currents through the global read data line arranged corresponding to a selected column according to the data stored in the unit operator cells of the selected column.

7. The semiconductor signal processing device according to claim 6, wherein the global read data lines are arranged corresponding to the columns of the unit operator cells in each operation unit block, said read circuit includes read gate circuits for sequentially selecting different columns of the unit operator cells, and said conversion circuit includes:

a current addition line arranged corresponding to each operation unit block and commonly to the global read data lines of a corresponding operation unit block; and an analog-digital converter arranged corresponding to each current addition line, for converting an analog voltage value of a corresponding current addition line into a digital signal, to produce a conversion result for each of the different unit operator cell columns.

8. A semiconductor signal processing device comprising:

a plurality of unit operator cells arranged in rows and columns, each for storing data in a nonvolatile manner, each unit operator cell including a storage element causing a current flow of an amount depending on storage data, said plurality of unit operator cells being divided into a plurality of operation unit blocks in a row direction and being divided into a plurality of sub-array blocks in a column direction, a bit position of multi-bit numerical data of an operation target being previously allocated to each of said plurality of sub-array blocks;

a write circuit for concurrently writing corresponding bits of said multi-bit numerical data in sub-array blocks previously allocated according to weights of bit positions of the corresponding bits in said multi-bit numerical data in said plurality of sub-array blocks, said write circuit writing data of an identical bit position in a set of plurality of operation target data in the unit operator cells being aligned in said column direction in one sub-array block;

a plurality of global read data lines arranged corresponding to the operation unit blocks of the unit operator cells and commonly to the sub-array blocks of each respective operation unit block;

a read circuit for passing a current through a corresponding global read line according to data stored in a selected unit operator cell in each sub-array block in which said set of operation target data is stored, said read circuit connecting the sub-array block and said corresponding global read data line for a time period being set according to said bit position allocated to each sub-array block; and a conversion circuit for adding the currents passed through the corresponding global read data line in the operation unit block in analog manner, to convert a result of the adding into a digital signal.

9. The semiconductor signal processing device according to claim 8, wherein said write circuit includes:

a write word line selection circuit for concurrently selecting unit operator cells aligned in the column direction in each sub-array block of write target of the numerical data;

a data line drive circuit provided corresponding to each sub-array block, for receiving data bits of the allocated bit position of different multi-bit numerical data, for concurrently writing corresponding bits of the different multi-bit numerical data into different unit operator cells selected by said write word line selection circuit.

10. The semiconductor signal processing device according to claim 8, wherein each sub-array block includes a plurality of bit lines arranged corresponding to the columns of the unit operator cells and each connecting to the unit operator cells of a corresponding column, and each unit operator cell includes:

first and second SOI transistors formed on an insulating layer, each for storing data according to charges accumulated in a body region thereof, said first and second SOI transistors being connected in series between a reference power supply and a corresponding bit line; and third and fourth SOI transistors arranged being separated from the bit line, for transferring write data to the body regions of said first and second SOI transistors in data writing, respectively.

* * * * *